US011641753B2

(12) United States Patent
Lee et al.

(10) Patent No.: US 11,641,753 B2
(45) Date of Patent: May 2, 2023

(54) ORGANIC LIGHT-EMITTING DEVICE

(71) Applicant: Samsung Electronics Co., Ltd., Suwon-si (KR)

(72) Inventors: Sunghun Lee, Hwaseong-si (KR); Sangdong Kim, Seoul (KR); Seungyeon Kwak, Suwon-si (KR); Hyun Koo, Seongnam-si (KR); Jungin Lee, Seoul (KR); Kyuyoung Hwang, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 1148 days.

(21) Appl. No.: 16/045,876

(22) Filed: Jul. 26, 2018

(65) Prior Publication Data

US 2019/0058144 A1 Feb. 21, 2019

(30) Foreign Application Priority Data

Jul. 31, 2017 (KR) ........................ 10-2017-0097132

(51) Int. Cl.
*H01L 51/50* (2006.01)
*C07F 15/00* (2006.01)
(Continued)

(52) U.S. Cl.
CPC ...... *H01L 51/5016* (2013.01); *C07F 15/0086* (2013.01); *C09K 11/06* (2013.01); *H01L 51/0087* (2013.01); *H01L 51/5004* (2013.01); *H01L 51/5044* (2013.01); *H01L 51/5056* (2013.01); *H01L 51/5072* (2013.01); *C09K 2211/1044* (2013.01); *C09K 2211/185* (2013.01); *H01L 51/0054* (2013.01);
(Continued)

(58) Field of Classification Search
None
See application file for complete search history.

(56) References Cited

U.S. PATENT DOCUMENTS 7,803,468 B2 9/2010 Nariyuki et al.
9,012,034 B2 4/2015 Kinoshita et al.
(Continued)

FOREIGN PATENT DOCUMENTS

CN 1825658 A 8/2006
CN 101156257 A 4/2008
(Continued)

OTHER PUBLICATIONS

Extended European Search Report issued by the European Patent Office dated Dec. 19, 2018, in the examination of the Europan Patent Application No. 18185787.1-1211.
(Continued)

*Primary Examiner* — Jay Yang
(74) *Attorney, Agent, or Firm* — Cantor Colburn LLP

(57) ABSTRACT

An organic light-emitting device including a first electrode, a second electrode facing the first electrode, and an organic layer disposed between the first electrode and the second electrode, wherein the organic layer includes an emission layer, wherein the emission layer includes an electron transport host, a hole transport host, and a dopant, wherein the dopant includes an organometallic compound, and wherein the organometallic compound does not comprise iridium, wherein the organic light-emitting device satisfies predetermined parameters described in the specification.

18 Claims, 4 Drawing Sheets

(51) Int. Cl.
*C09K 11/06* (2006.01)
*H01L 51/00* (2006.01)

(52) U.S. Cl.
CPC ...... *H01L 51/0067* (2013.01); *H01L 51/0072* (2013.01); *H01L 2251/5384* (2013.01); *H01L 2251/552* (2013.01)

(56) References Cited

U.S. PATENT DOCUMENTS

| | | | |
|---|---|---|---|
| 9,153,790 | B2 | 10/2015 | Kuma et al. |
| 9,385,335 | B2 | 7/2016 | Pflumm et al. |
| 9,520,567 | B2 | 12/2016 | Lee et al. |
| 9,735,369 | B2 | 5/2017 | Lee et al. |
| 10,381,579 | B2 | 8/2019 | Lin et al. |
| 2006/0115679 | A1 | 6/2006 | Chun et al. |
| 2006/0279204 | A1 | 12/2006 | Forrest et al. |
| 2013/0168656 | A1 | 7/2013 | Tsai et al. |
| 2013/0175508 | A1 | 7/2013 | Kwon et al. |
| 2015/0295197 | A1 | 10/2015 | Adamovich et al. |
| 2016/0126472 | A1 | 5/2016 | Oh et al. |
| 2017/0069864 | A1 | 3/2017 | Lee et al. |
| 2017/0141328 | A1 | 5/2017 | Hayer et al. |
| 2017/0179204 | A1 | 6/2017 | Lim et al. |
| 2017/0179416 | A1 | 6/2017 | Lim et al. |
| 2018/0006238 | A1 | 1/2018 | Lee et al. |
| 2019/0036055 | A1 | 1/2019 | Lin et al. |

FOREIGN PATENT DOCUMENTS

| | | | |
|---|---|---|---|
| CN | 103199197 | A | 7/2013 |
| CN | 106910832 | A | 6/2017 |
| CN | 106910835 | A | 6/2017 |
| EP | 3435438 | A2 | 1/2019 |
| JP | 2005203293 | A | 7/2005 |
| JP | 2006128636 | A | 5/2006 |
| JP | 4890402 | B2 | 3/2012 |
| KR | 1020090106566 | A | 10/2009 |
| KR | 1020120024624 | A | 3/2012 |
| KR | 1020140027218 | A | 3/2014 |
| KR | 1020140135524 | A | 11/2014 |
| KR | 1020140135525 | A | 11/2014 |
| KR | 1020150028579 | A | 3/2015 |
| KR | 1020160150000 | A | 12/2016 |
| KR | 1020170029708 | A | 3/2017 |
| WO | 2012-166101 | A1 | 12/2012 |
| WO | 2015-192941 | A1 | 12/2015 |

OTHER PUBLICATIONS

Office Action dated Nov. 5, 2021, issued in EP Patent Application No. 18185787.1.

English Translation of Office Action issued in corresponding CN Patent Application No. 201810842607.2, dated Mar. 3, 2022, 9 pp.

Office Action issued in corresponding CN Patent Application No. 201810842607.2, dated Mar. 3, 2022, 8 pp.

ORGANIC LIGHT-EMITTING DEVICE

CROSS-REFERENCE TO RELATED APPLICATION

This application claims priority to Korean Patent Application No. 10-2017-0097132, filed on Jul. 31, 2017, in the Korean Intellectual Property Office, and all the benefits accruing therefrom under 35 U.S.C. § 119, the content of which is incorporated herein in its entirety by reference.

BACKGROUND

1. Field

One or more embodiments relate to an organic light-emitting device.

2. Description of the Related Art

Organic light-emitting devices (OLEDs) are self-emission devices, which have superior characteristics in terms of a viewing angle, a response time, a luminescence, a driving voltage, and a response speed, and which produce full-color images.

In an example, an organic light-emitting device includes an anode, a cathode, and an organic layer that is disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Various types of organic light emitting devices are known. However, there still remains a need in OLEDs having low driving voltage, high efficiency, high brightness, and long lifespan.

SUMMARY

Aspects of the present disclosure provide an organic light-emitting device having low driving voltage, high emission efficiency and long lifespan, wherein the organic light-emitting device includes an iridium-free organometallic compound satisfying certain parameters.

Additional aspects will be set forth in part in the description which follows and, in part, will be apparent from the description, or may be learned by practice of the presented embodiments.

An aspect provides an organic light-emitting device including:

a first electrode, a second electrode facing the first electrode, and an organic layer disposed between the first electrode and the second electrode, wherein the organic layer includes an emission layer, the emission layer includes an electron transport host, a hole transport host, and a dopant, the dopant includes an organometallic compound, provided that the organometallic compound does not include iridium, and the organic light-emitting device satisfies a condition of LUMO(dopant)−LUMO(host-E)≥0.15 electron volts and LUMO(host-E)−HOMO(host-H)>T1(dopant), wherein LUMO(dopant) indicates a lowest unoccupied molecular orbital (LUMO) energy level (expressed in electron volts) of a dopant in the emission layer, LUMO(host-E) indicates a LUMO energy level (expressed in electron volts) of an electron transport host in the emission layer, HOMO (host-H) indicates a highest occupied molecular orbital (HOMO) energy level (expressed in electron volts) of a hole transport host in the emission layer, T1(dopant) indicates a triplet energy level (expressed in electron volts) of a dopant in the emission layer, and LUMO(dopant), LUMO(host-E), and HOMO(host-H) each indicate a negative value measured by differential pulse voltammetry using ferrocene as a reference material, and T1(dopant) indicates a value calculated from a peak wavelength of a phosphorescence spectrum of the dopant measured using a luminescence measuring device.

Another aspect provides an organic light-emitting device including:

a first electrode, a second electrode facing the first electrode;

light-emitting units in the number of m that are stacked between the first electrode and the second electrode and include at least one emission layer; and charge-generation layers in a number of m−1 that are disposed between two neighboring light-emitting units selected from the light-emitting units in the number of m and include an n-type charge-generation layer and a p-type charge-generation layer, wherein m is an integer of greater than or equal to 2, a maximum emission wavelength of light emitted by at least one of the light-emitting units in the number of m is different from a maximum emission wavelength of light emitted by at least one of the other light-emitting units, the emission layer includes an electron transport host, a hole transport host, and a dopant, the dopant includes an organometallic compound, provided that the organometallic compound does not include iridium, and the organic light-emitting device satisfies a condition of LUMO(dopant)−LUMO(host-E)≥0.15 electron volts and LUMO(host-E)−HOMO(host-H)>T1(dopant), wherein LUMO(dopant) indicates a LUMO energy level (expressed in electron volts) of a dopant in the emission layer, LUMO(host-E) indicates a LUMO energy level (expressed in electron volts) of an electron transport host in the emission layer, HOMO(host-H) indicates a HOMO energy level (expressed in electron volts) of a hole transport host in the emission layer, T1(dopant) indicates a triplet energy level (expressed in electron volts) of a dopant in the emission layer, LUMO(dopant), LUMO(host-E), and HOMO(host-H) each indicate a negative value measured by differential pulse voltammetry using ferrocene as a reference material, and T1(dopant) indicates a value calculated from a peak wavelength of a phosphorescence spectrum of the dopant measured using a luminescence measuring device.

Another aspect provides an organic light-emitting device including:

a first electrode, a second electrode facing the first electrode, and light-emitting units in a number of m that are stacked between the first electrode and the second electrode, wherein m is an integer of greater than or equal to 2, a maximum emission wavelength of light emitted by at least one of the light-emitting units in the number of m is different from a maximum emission wavelength of light emitted by at least one of the other light-emitting units, the emission layer includes an electron transport host, a hole transport host, and a dopant, the dopant includes an organometallic compound, provided that the organometallic compound does not include iridium, and the organic light-emitting device satisfies a condition of LUMO(dopant)−LUMO(host-E)≥0.15 electron volts and LUMO(host-E)−HOMO(host-H)>T1(dopant), wherein LUMO(dopant) indicates a LUMO energy level (expressed in electron volts) of a dopant in the emission layer, LUMO(host-E) indicates a LUMO energy level (expressed in electron volts) of an electron transport host in the emission layer, HOMO(host-H) indicates a HOMO energy level (expressed in electron volts) of a hole transport host in the emission layer, T1(dopant) indicates a triplet energy level (expressed in electron volts) of a dopant in the emission layer, LUMO(dopant), LUMO(host-E), and HOMO(host-H) each indicate a negative value measured by differential pulse voltammetry using ferrocene as a reference material, and T1(dopant) indicates a value calculated from a peak wavelength of a phosphorescence spectrum of the dopant measured using a luminescence measuring device.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
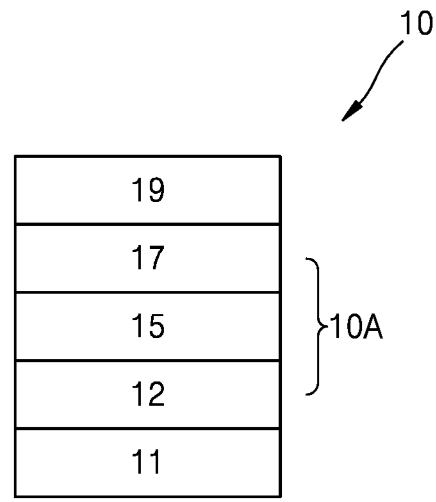
FIG. 1 is a schematic view of an organic light-emitting device 10 according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10%, 5% of the stated value.

Description of FIGS. 1 to 4

In FIG. 1, an organic light-emitting device 10 includes a first electrode 11, a second electrode 19 facing the first electrode 11, and an organic layer 10A disposed between the first electrode 11 and the second electrode 19.

In FIG. 1, the organic layer 10A includes an emission layer 15, a hole transport region 12 that is disposed between the first electrode 11 and an emission layer 15, and an electron transport region 17 that is disposed between the emission layer 15 and the second electrode 19.

In FIG. 1, a substrate may be additionally disposed under the first electrode 11 or above the second electrode 19. The substrate may be a glass substrate or a plastic substrate, each having excellent mechanical strength, thermal stability, transparency, surface smoothness, ease of handling, and water resistance.

First Electrode 11

The first electrode 11 may be formed by depositing or sputtering a material for forming the first electrode 11 on the substrate. When the first electrode 11 is an anode, the material for forming a first electrode may be selected from materials with a high work function to facilitate hole injection.

The first electrode 11 may be a reflective electrode, a semi-transmissive electrode, or a transmissive electrode. When the first electrode 11 is a transmissive electrode, a material for forming a first electrode may be selected from indium tin oxide (ITO), indium zinc oxide (IZO), tin oxide ($SnO_2$), zinc oxide (ZnO), and any combinations thereof, but embodiments of the present disclosure are not limited thereto. When the first electrode 11 is a semi-transmissive electrode or a reflective electrode, as a material for forming the first electrode 11, magnesium (Mg), silver (Ag), aluminum (Al), aluminum-lithium (Al—Li), calcium (Ca), magnesium-indium (Mg—In), magnesium-silver (Mg—Ag), or any combination thereof may be used. However, the material for forming the first electrode 11 is not limited thereto.

The first electrode 11 may have a single-layered structure, or a multi-layered structure including two or more layers.

Energy Level Relationship of Material Included in Emission Layer 15

The emission layer 15 may include an electron transport host, a hole transport host, and a dopant.

The dopant may be an organometallic compound, provided that the dopant does not include iridium. That is, the dopant may be an iridium-free organometallic compound.

The emission layer 15 may satisfy a condition of LUMO(dopant)−LUMO(host-E)≥0.15 electron volts (eV) and LUMO(host-E)−HOMO(host-H)>T1(dopant), wherein LUMO(dopant) indicates a lowest unoccupied molecular orbital (LUMO) energy level (expressed in eV) of the dopant in the emission layer 15, LUMO(host-E) indicates a LUMO energy level (eV) of the electron transport host in the emission layer 15, HOMO(host-H) indicates a highest occupied molecular orbital (HOMO) energy level (eV) of the hole transport host in the emission layer 15, and T1(dopant) indicates a triplet energy level (eV) of the dopant in the emission layer 15.

Here, LUMO(dopant), LUMO(host-E), and HOMO(host-H) each indicate a negative value measured by differential pulse voltammetry using ferrocene as a reference material, and T1(dopant) indicates a value calculated from a peak wavelength of a phosphorescence spectrum of the dopant measured using a luminescence measuring device.

When the condition of LUMO(dopant)−LUMO(host-E)≥0.15 eV and LUMO(host-E)−HOMO(host-H)>T1(dopant) is satisfied, the dopant in the emission layer 15 of the organic light-emitting device 10 may be less likely to be anionized. In addition, even if the dopant in the emission layer 15 of the organic light-emitting device 10 is cationized, the dopant may have sufficiently high decomposition energy, and accordingly, the dopant in the emission layer 15 of the organic light-emitting device 10 may be substantially prevented from being decomposed due to charges and/or excitons. In this regard, the organic light-emitting device 10 may be prevented from deterioration, resulting in high efficiency, high luminance, low roll-off ratios, and/or long lifespan.

In an embodiment, the organic light-emitting device 10 may satisfy a condition below:

$$\text{LUMO(dopant)}-\text{LUMO(host-}E)\geq 0.16\text{ eV},$$

$$0.15\text{ eV}\leq\text{LUMO(dopant)}-\text{LUMO(host-}E)\leq 0.6\text{ eV},$$

$$0.15\text{ eV}\leq\text{LUMO(dopant)}-\text{LUMO(host-}E)\leq 0.4\text{ eV, or}$$

$$0.16\text{ eV}\leq\text{LUMO(dopant)}-\text{LUMO(host-}E)\leq 0.3\text{ eV},$$

but embodiments of the present disclosure are not limited thereto.

In one or more embodiments, the organic light-emitting device 10 may satisfy a condition below:

$$0\text{ eV}<[\text{LUMO(host-}E)-\text{HOMO(host-}H)]-T1\text{(dopant)}\leq 0.5\text{ eV},$$

$$0.02\text{ eV}\leq[\text{LUMO(host-}E)-\text{HOMO(host-}H)]-T1\text{(dopant)}\leq 0.2\text{ eV, or}$$

$$0.05\text{ eV}\leq[\text{LUMO(host-}E)-\text{HOMO(host-}H)]-T1\text{(dopant)}\leq 0.18\text{ eV},$$

but embodiments of the present disclosure are not limited thereto.

Figure 2:
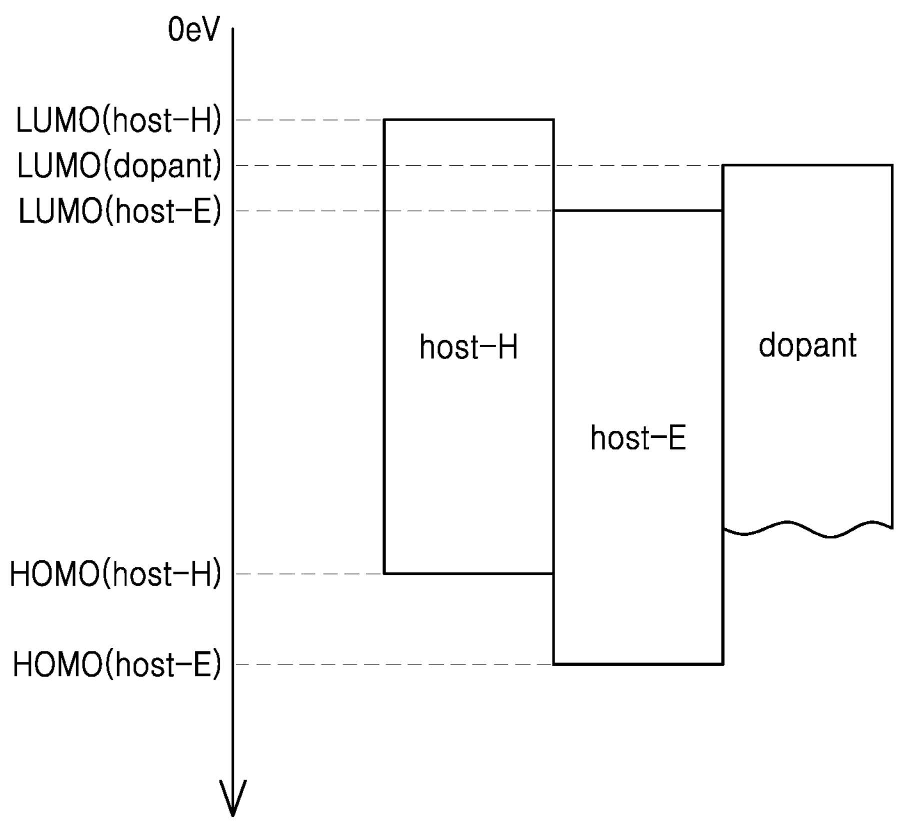
FIG. 2 is a diagram showing an organic light-emitting device according to an embodiment in terms of LUMO and/or HOMO energy levels with respect to the electron transport host, the hole transport host.

FIG. 2 is a diagram showing the organic light-emitting device 10 according to an embodiment in terms of LUMO and HOMO energy levels with respect to the electron transport host, the hole transport host, and the dopant included in the emission layer 15, i.e., LUMO(host-H), LUMO(dopant), LUMO(host-E), HOMO(host-H) and HOMO(host-E).

Referring to FIG. 2, the organic light-emitting device 10 may further satisfy at least one of the following conditions, in addition to the condition of LUMO(dopant)−LUMO(host-E)≥0.15 eV and LUMO(host-E)−HOMO(host-H)>T1(dopant):

$$\text{LUMO(dopant)}<\text{LUMO(host-}H)$$

$$\text{LUMO(host-}E)<\text{LUMO(host-}H)$$

$$\text{LUMO(host-}E)<\text{LUMO(dopant)}<\text{LUMO(host-}H)$$

$$\text{HOMO(host-}E)<\text{HOMO(host-}H),$$

wherein LUMO(host-H) indicates a LUMO energy level (eV) of the hole transport host in the emission layer 15, and HOMO(host-E) indicates a HOMO energy level (eV) of the electron transport host in the emission layer 15.

Although not shown in the figure, various modifications may be made, for example, the organic light-emitting device 10 may satisfy a condition of LUMO(host-E)<LUMO(host-H)<LUMO(dopant).

Hereinafter, referring to FIGS. 3 and 4, the mechanism by which the organic light-emitting device 10 may have high efficiency, high luminance, low roll-off ratios, and/or long lifespan will be described in more detail.

Figure 3:
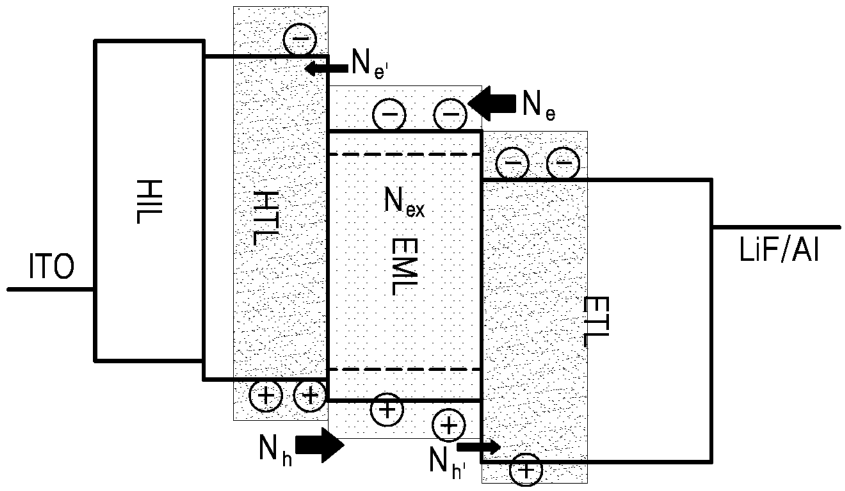
FIG. 3 is an energy level diagram of an organic light-emitting device in the related art, including an injection/leakage charge concentration and an exciton concentration in an emission region under a driving luminance.

FIG. 3 is an energy level diagram of an organic light-emitting device of the related art, including an injection/leakage charge concentration and an exciton concentration in an emission region under a driving luminance.

In FIG. 3, the upper energy level of each layer is a LUMO energy level of the respective layer, the lower energy level of each layer is a HOMO energy level of the respective layer, the solid line in the upper energy level of the emission layer is a LUMO energy level of the host included in the emission layer, the dotted line in the upper energy of the emission layer is a LUMO energy level of the dopant included in the emission layer, the solid line in the lower energy level of the emission layer is a HOMO energy level of the host included in the emission layer, the dotted line in the lower energy level of the emission layer is a HOMO energy level of the dopant included in the emission layer.

In the organic light-emitting device of the related art of FIG. 3, the feature that the host included in the emission layer includes the electron transport host and the hole transport host and the relationship among LUMO energy level of the electron transport host, HOMO energy level of the hole transport host, and LUMO energy level of the dopant are not disclosed or suggested at all.

In FIG. 3, $N_e$ indicates the concentration of electrons injected from an electron transport layer (ETL) to an emission layer (EML), $N_h$ indicates the concentration of holes injected from a hole transport layer (HTL) to the EML, $N_{ex}$ indicates the concentration of excitons formed by recombination of electrons and holes in the EML, $N_h'$ indicates the concentration of holes leaking from the EML to the ETL, and $N_e'$ indicates the concentration of electrons leaking from the EML to the HTL.

A chemical bond of an organic molecule used in an organic light-emitting device may decompose when the organic molecule receives exciton energy. The decomposition rate constant of the organic molecule may vary according to whether the organic molecule is in a cationic state, an anionic state, and/or a neutral state. The decomposition of the chemical bond in the organic molecule may lead to a change in the efficiency of the organic light-emitting device.

First, a quantum chemical theory related to the lifespan of an organic light-emitting device will be explained by referring to the following Equations:

$$\eta_{EQE}=\gamma\times\eta_{S/T}\times\phi_{PL}\times\eta_{out} \qquad \text{Equation 1}$$

According to Equation 1, the external quantum efficiency ($\eta_{EQE}$) can be calculated as the product of the charge balance factor ($\gamma$) multiplied by an emission-allowed exciton ratio ($\eta_{S/T}$), the luminous quantum efficiency of an EML ($\varphi_{PL}$), and the external light extraction efficiency ($\eta_{out}$). The lifespan (R) can be calculated as the rate of change of the external quantum efficiency at a target luminance (e.g., derivative of $\eta_{EQE}$ with respect to time), such that the rate of change of the external quantum efficiency depends on the rates of change of the charge balance factor and the luminous quantum efficiency of the EML (e.g., derivative of $\gamma\cdot\phi_{PL}$ with respect to time). As the change in the remaining two variables ($\eta_{S/T}$ and $\eta_{out}$) over time is negligible, the two variables may be regarded as a constant (C). The rate of change of the external quantum efficiency with respect to time is shown in Equation 2:

$$R=\frac{d\eta_{EQE}}{dt}=C\frac{\gamma\cdot d\phi_{PL}+\phi_{PL}\cdot d\gamma}{dt}. \qquad \text{Equation 2}$$

According to Equation 2, the performance of an organic light-emitting device may deteriorate due to decomposition of a material in an EML, and/or a change in the charge balance factor.

The decomposition rate related to the rate of change in the luminous quantum efficiency with respect to time ($r_{ex}$) caused by the decomposition of the material for an EML can be calculated according to Equation 3:

$$r_{ex}=\frac{d\phi_{PL}}{dt}=k_{deg,nu}\cdot N_{nu}\cdot N_{ex}+k_{deg,cation}\cdot N_{cation}\cdot N_{ex}+k_{deg,anion}\cdot N_{ex}\cdot N_{anion}\ \ldots\ . \qquad \text{Equation 3}$$

In Equation 3, $N_{nu}$, $N_{cation}$, and $N_{anion}$ respectively indicate the concentrations of the material for an EML when the material is in a neutral state, a cationic state, and an anionic state, $N_{ex}$ indicates the concentration of excitons in an EML, and $k_{deg,nu}$, $k_{deg,cation}$, and $k_{deg,anion}$ indicate the decomposition rate constants of the material for an EML when the material is in a neutral state, a cationic state, and an anionic state, respectively. The decomposition rate described by Equation 3 may also be applicable to other bonds of an organic molecule in the EML.

In addition, the decomposition rate related to a rate of change in the charge balance factor (used in Equation 2) with respect to time ($r_{bal}$) can be calculated according to Equation 4:

$$r_{bal}=\frac{d\gamma}{dt}=C_1r_{HT}+C_2r_{ET}+C_3r_{EM} \qquad \text{Equation 4}$$

$$r_{HT}=k_{deg,HT,an}\cdot N_{HT,ex}\cdot N_e+k_{deg,HT,ca}\cdot N_{HT,ex}\cdot N_h+k_{deg,HT,nu}\cdot N_{HT,nu}\cdot N_{HT,ex}\ldots$$

$$r_{ET}=k_{deg,ET,ca}\cdot N_{ET,ex}\cdot N_h+k_{deg,ET,an}\cdot N_{ET,ex}\cdot N_e+k_{deg,ET,nu}\cdot N_{ET,nu}\cdot N_{ET,ex}\ldots$$

$$r_{EM}=k_{deg,EM,ca}\cdot N_{EM,ex}\cdot N_h+k_{deg,EM,an}\cdot N_{EM,ex}\cdot N_e+k_{deg,ET,nu}\cdot N_{ET,nu}\cdot N_{ET,ex}\ \ldots\ .$$

In Equation 4, $r_{HT}$, $r_{ET}$, and $r_{EM}$ respectively indicate the decomposition rates of a hole transport layer, an electron transport layer, and an EML material, and $C_1$, $C_2$, and $C_3$ are constants. $N_{a,b}$ indicates the concentration of a material in the state of "b", the material being included in the "a" layer (for example, a HTL, an ETL, or an EML), and $k_{deg,a,b}$ indicates the decomposition rate constant of a molecule in the state of "b", the molecule being included in the "a" layer. The decomposition rate constants used in Equations 3 and 4 are bimolecular rate constants, and may be generalized in the form of Equation 5:

$$k_{deg} = A\exp\left(-\frac{E_a}{RT}\right).$$ Equation 5

In Equation 5, A is a value related to entropy (units of frequency per unit volume), $E_a$ is an activation energy, which is related to bond-decomposition energy, R is the Boltzmann constant, and T is the absolute temperature (e.g., in Kelvin). The decomposition energy of a molecule may vary depending on whether the molecule is in a cationic state, an anionic state, a neutral state, or an exciton state. While not wishing to be bound by a particular theory, it is understood that when the decomposition energy of the molecule in a cationic state, an anionic state, and/or a neutral state is smaller (e.g., lower) than the decomposition energy of the molecule in an exciton state, it is highly likely that the molecule in a cationic state, an anionic state, and/or a neutral state may decompose.

Although not limited to any particular theory, in generally, the hole transport host and the electron transport host may have relatively high decomposition energy in the neutral, cationic, and anionic states. In this regard, when driving the organic light-emitting device, holes move in the hole transport host of the emission layer (i.e., cations are formed only in the hole transport host), and electrons move in the transport host (i.e., anions are formed only in the electron transport host), so as to substantially minimize the deterioration of the host including the hole transport host and the electron transport host. However, while not wishing to be bound by a particular theory, it is understood that when the emission layer includes a phosphorescent dopant, the decomposition energy of a particular bond (for example, a C—N bond or the like) in the phosphorescent dopant in the anionic state may be typically smaller than the triplet energy of the phosphorescent dopant in emission layer. In this regard, the phosphorescent dopant in the emission layer may have a largest decomposition rate constant for a chemical bond in the anionic state. Therefore, Equation 3 may be abbreviated by Equation 6:

$$r_{ex} = \frac{d\phi_{PL}}{dt} \approx k_{deg,anion} \cdot N_{ex} \cdot N_{anion}.$$ Equation 6

That is, since the decomposition rate constant for a bond (e.g., a C—N bond or the like), which is the weakest bond of the phosphorescent dopant in the anionic state, is large, it is confirmed that the emission quantum efficiency of the organic light-emitting device may be reduced.

Figure 4:
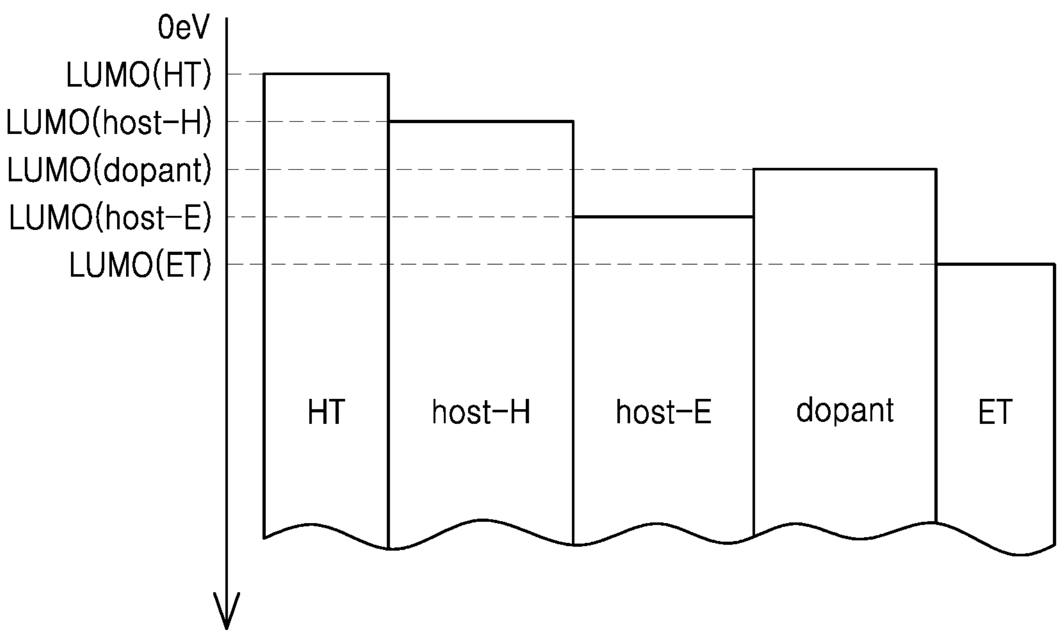
FIG. 4 is a diagram showing an organic light-emitting device 10 according to an embodiment in terms of LUMO (ET), LUMO(host-E), LUMO(dopant), LUMO(host-H), and LUMO(HT)

FIG. 4 is a diagram showing the organic light-emitting device 10 according to an embodiment in terms of LUMO energy levels of hole transport materials (LUMO(HT)) included in a hole transport region (HT, 12), LUMO(host-H), LUMO(dopant), LUMO(host-E), and LUMO energy levels of electron transport materials (LUMO(ET)) included in an electron transport region (ET, 17).

When a condition of LUMO(dopant)−LUMO(host-E)≥0.15 eV and LUMO(host-E)−HOMO(host-H)>T1(dopant) is satisfied, in the emission layer 15 including the hole transport host, the electron transport host and the dopant, the LUMO energy level of the dopant may be at a scatter position with respect to the electrons which is higher than the LUMO energy level of the electron transport host. Therefore, the electrons injected from the electron transport region 17 may fail to anionize the dopant included in the emission layer 15, resulting in a very low probability that the dopant may be present as an anion in the emission layer 15. In addition, when the condition described above is satisfied, even if the dopant in the emission layer 15 may be cationized, the dopant may have sufficiently high decomposition energy. In this regard, the decomposition rate ($r_{ex}$) related to the change in the emission quantum efficiency upon the deterioration of emission layer materials as shown in the first section of Equation 3 may be significantly small, resulting in a very low probability of the deterioration of the emission layer 15.

In an embodiment, the organic light-emitting device 10 may further at least one of the following conditions, in addition to the condition of LUMO(dopant)−LUMO(host-E)≥0.15 eV and LUMO(host-E)−HOMO(host-H)>T1(dopant):

LUMO(ET)<LUMO(host-*E*)<LUMO(dopant)<LUMO(host-*H*)<LUMO(HT)(see FIG. 4)

LUMO(ET)<LUMO(host-*E*)<LUMO(host-*H*)<LUMO(dopant)<LUMO(HT)(not shown)

Here, LUMO(ET) indicates a LUMO energy level of an electron transport material included in the electron transport region 17, and LUMO(HT) indicates a LUMO energy level of a hole transport material (for example, a hole transporting material (e.g., an amine-based material) other than a p-dopant described in the present specification) included in the hole transport region 12, provided that LUMO(ET) and HOMO(HT) may be measured using a measuring method used for LUMO(host-H).

Dopant in Emission Layer 15

The dopant in the emission layer 15 may be a phosphorescent compound. Thus, the organic light-emitting device 10 may be quite different from an organic light-emitting device that emits fluorescence through a fluorescence mechanism.

In an embodiment, the dopant may be an organometallic compound including platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), palladium (Pd), silver (Ag), or gold (Au). For example, the dopant may be an organometallic compound including platinum (Pt) or palladium (Pd), but embodiments of the present disclosure are not limited thereto.

In one or more embodiments, the dopant in the emission layer 15 may be an organometallic compound having a square-planar coordination structure.

In one or more embodiments, the dopant in the emission layer 15 may satisfy a condition of T1(dopant)≤$E_{gap}$(dopant)≤T1(dopant)+0.5 eV, for example, T1(dopant)≤$E_{gap}$(dopant)≤T1(dopant)+0.36 eV, but embodiments of the present disclosure are not limited thereto.

The $E_{gap}$(dopant) indicates a gap between HOMO(dopant) and LUMO(dopant) in the emission layer 15, and HOMO(dopant) indicates a HOMO energy level of the dopant in the emission layer 15, provided that a measuring method used for HOMO(host-H) is used.

When $E_{gap}$(dopant) within the condition above is satisfied, the dopant in the emission layer 15, for example, the organometallic compound having a square-planar coordination structure, may have a high radiative decay rate regardless of weak spin-orbital coupling (SOC) with the singlet energy level close to the triplet energy level.

In one or more embodiments, the dopant in the emission layer 15 may satisfy a condition of −2.8 eV≤LUMO(dopant)

≤−2.3 eV, −2.8 eV≤LUMO(dopant)≤−2.4 eV, −2.7 eV≤LUMO(dopant)≤−2.5 eV, or −2.7 eV≤LUMO (dopant)≤−2.61 eV.

In one or more embodiments, the dopant in the emission layer 15 may satisfy a condition of −6.0 eV≤HOMO (dopant)≤−4.5 eV, −5.7 eV≤HOMO(dopant)≤−5.1 eV, −5.6 eV≤HOMO(dopant)≤−5.2 eV or −5.6 eV≤HOMO (dopant)≤−5.25 eV.

In one or more embodiments, the dopant may include a metal M and an organic ligand, and the metal M and the organic ligand may form one, two, or three cyclometalated rings. The metal M may be platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), palladium (Pd), silver (Ag), or gold (Au).

In one or more embodiments, the dopant may include a metal M and a tetradentate organic ligand capable of forming three or four (for example, three) cyclometalated rings with the metal M. The metal M is the same as described above. The tetradentate organic ligand may include, for example, a benzimidazole group and a pyridine group, but embodiments of the present disclosure are not limited thereto.

In one or more embodiments, the dopant may include a metal M and at least one of ligands represented by Formulae 1-1 to 1-4:

Formula 1-1

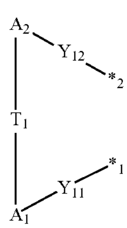

Formula 1-2

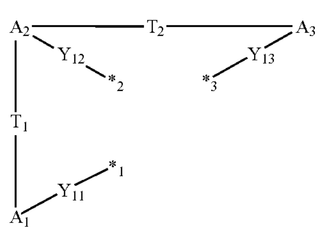

Formula 1-3

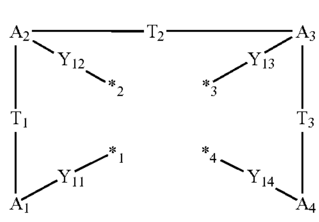

-continued

Formula 1-4

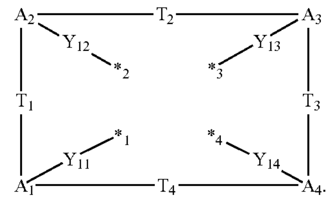

In Formulae 1-1 to 1-4, $A_1$ to $A_4$ may each independently be selected from a substituted or unsubstituted $C_5$-$C_{30}$ carbocyclic group, a substituted or unsubstituted $C_1$-$C_{30}$ heterocyclic group, and a non-cyclic group, $Y_{11}$ to $Y_{14}$ may each independently be a chemical bond, O, S, N($R_{91}$), B($R_{91}$), P($R_{91}$), or C($R_{91}$)($R_{92}$), $T_1$ to $T_4$ may each independently be selected from a single bond, a double bond, *—N($R_{93}$)—*', *—B($R_{93}$)—*', *—P($R_{93}$)—*', *—C($R_{93}$)($R_{94}$)—*', *—Si($R_{93}$)($R_{94}$)—*', *—Ge($R_{93}$)($R_{94}$)—*', *—S—*', *—Se—*', *—O—*', *—C(═O)—*', *—S(═O)—*', *—S(═O)$_2$—*', *—C($R_{93}$)=*'*=C($R_{93}$)—*', *—C($R_{93}$)═C($R_{94}$)—*', *—C(═S)—*', and *—C≡C—*', a substituent of the substituted $C_5$-$C_{30}$ carbocyclic group, a substituent of the substituted $C_1$-$C_{30}$ heterocyclic group, and $R_{91}$ to $R_{94}$ may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_2$-$C_{60}$ heteroaryloxy group, a substituted or unsubstituted $C_2$-$C_{60}$ heteroarylthio group, a substituted or unsubstituted $C_3$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(═O)($Q_8$)($Q_9$), and, provided that, the substituent of the substituted $C_5$-$C_{30}$ carbocyclic group and the substituent of the substituted $C_1$-$C_{30}$ heterocyclic group are not hydrogen, $*^1$, $*^2$, $*^3$ and $*^4$ each indicate a binding site to M of the dopant.

For example, the dopant may include a ligand represented by Formula 1-3, and any two of $A_1$ to $A_4$ may each be a substituted or unsubstituted benzimidazole group and a substituted or unsubstituted pyridine group, but embodiments of the present disclosure are not limited thereto.

In one or more embodiments, the dopant may be an organometallic compound represented by Formula 1A:

Formula 1A

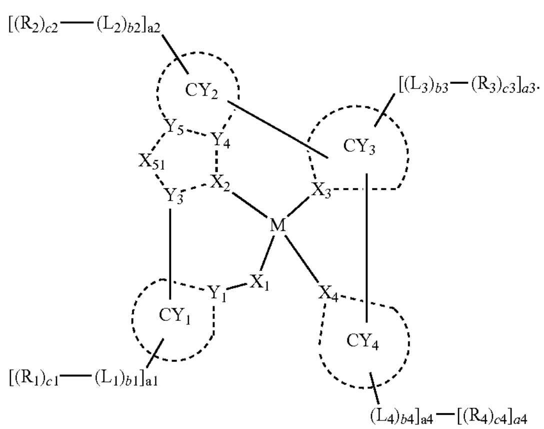

In Formula 1A,

M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ may be O or S, and a bond between $X_1$ and M may be a covalent bond, $X_2$ to $X_4$ may each independently be C or N, one bond selected from a bond between $X_2$ and M, a bond between $X_3$ and M, and a bond between $X_4$ and M may be a covalent bond, and the others thereof may each be a coordinate bond, $Y_1$ and $Y_3$ to $Y_5$ may each independently be C or N, a bond between $X_2$ and $Y_3$, a bond between $X_2$ and $Y_4$, a bond between $Y_4$ and $Y_5$, a bond between $Y_5$ and $X_{51}$, and a bond between $X_{51}$ and $Y_3$ may each be a chemical bond, $CY_1$ to $CY_5$ may each independently be a $C_5$-$C_{30}$ carbocyclic group or a $C_1$-$C_{30}$ heterocyclic group, and $CY_4$ is not a benzimidazole group, a cyclometalated ring formed by $CY_5$, $CY_2$, $CY_3$, and M may be a 6-membered ring, $X_{51}$ may be selected from O, S, N-$[(L_7)_{b7}$-$(R_7)_{c7}]$, $C(R_7)(R_8)$, $Si(R_7)(R_8)$, $Ge(R_7)(R_8)$, C(=O), N, $C(R_7)$, $Si(R_7)$, and $Ge(R_7)$, $R_7$ and $R_8$ may optionally be linked via a first linking group to form a substituted or unsubstituted $C_5$-$C_{30}$ carbocyclic group or a substituted or unsubstituted $C_1$-$C_{30}$ heterocyclic group, $L_1$ to $L_4$ and $L_7$ may each independently be a substituted or unsubstituted $C_5$-$C_{30}$ carbocyclic group or a substituted or unsubstituted $C_1$-$C_{30}$ heterocyclic group, b1 to b4 and b7 may each independently be an integer from 0 to 5, $R_1$ to $R_4$, $R_7$, and $R_8$ may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_2$-$C_{60}$ heteroaryloxy group, a substituted or unsubstituted $C_2$-$C_{60}$ heteroarylthio group, a substituted or unsubstituted $C_3$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, c1 to c4 may each independently be an integer from 1 to 5, a1 to a4 may each independently be 0, 1, 2, 3, 4, or 5, two of a plurality of neighboring groups $R_1$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, and two or more groups selected from $R_1$ to $R_4$ may optionally be linked to form a substituted or unsubstituted $C_5$-$C_{30}$ carbocyclic group or a substituted or unsubstituted $C_1$-$C_{30}$ heterocyclic group.

In Formulae 1-1 to 1-4 and 1A, a $C_5$-$C_{30}$ carbocyclic group, a $C_1$-$C_{30}$ heterocyclic group, and $CY_1$ to $CY_4$ may each independently be a) a first ring, b) a condensed ring in which two or more first rings are condensed each other, or c) a condensed ring in which at least one first ring and at least one second ring are condensed each other; the first ring may be selected from a cyclohexane group, a cyclohexene group, an adamantane group, a norbornane group, a norbornene group, a benzene group, a pyridine group, a pyrimidine group, a pyrazine group, a pyridazine group, and a triazine group; and the second ring may be selected from a cyclopentane group, a cyclopentene group, a cyclopentadiene group, a furan group, a thiophene group, a silole group, a pyrrole group, a pyrazole group, an imidazole group, a triazole group, an oxazole group, an isoxazole group, a thiazole group, an isothiazole group, an oxadiazole group, and a thiadiazole group.

In Formulae 1-1 to 1-4, a non-cyclic group may be *—C(=O)—*', *—O—C(=O)—*', *—S—C(=O)—*', *—O—C(=S)—*', or *—S—C(=S)—*', but embodiments of the present disclosure are not limited thereto.

In Formulae 1-1 to 1-4 and 1A, a substituent of the substituted $C_5$-$C_{30}$ carbocyclic group, a substituent of the substituted $C_1$-$C_{30}$ heterocyclic group, $R_{91}$ to $R_{94}$, $R_1$ to $R_4$, $R_7$, and $R_8$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group and —$Si(Q_{33})(Q_{34})(Q_{35})$; and —$N(Q_1)(Q_2)$, —$Si(Q_3)(Q_4)(Q_5)$, —$B(Q_6)(Q_7)$, and —$P(=O)(Q_8)(Q_9)$, provided that, the substituent of the substituted $C_5$-$C_{30}$ carbocyclic group and the substituent of the substituted $C_1$-$C_{30}$ heterocyclic group are not hydrogen, wherein $Q_1$ to $Q_9$ and $Q_{33}$ to $Q_{35}$ may each independently be selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments of the present disclosure are not limited thereto.

In one or more embodiments, the dopant may be an organometallic compound represented by Formula 1A, provided that, in Formula 1A, $X_2$ and $X_3$ may each independently be C or N, $X_4$ may be N, when i) M may be Pt, ii) $X_1$ may be 0, iii) $X_2$ and $X_4$ may each independently be N, $X_3$ may be C, a bond between $X_2$ and M and a bond between $X_4$ and M may each independently be a coordinate bond, and a bond between $X_3$ and M may be a covalent bond, iv) $Y_1$ to $Y_5$ may each independently be C, v) a bond between $Y_5$ and $X_{51}$ and a bond between $Y_3$ and $X_{51}$ may each independently be a single bond, vi) $CY_1$, $CY_2$, and $CY_3$ may each independently be a benzene group, and $CY_4$ may be a pyridine group, vii) $X_{51}$ may be O, S, or N-$[(L_7)_{b7}$-$(R_7)_{c7}]$, and viii) b7 may be 0, and c7 may be 1, and $R_7$ is a substituted or unsubstituted $C_1$-$C_{60}$ alkyl group, a) a1 to a4 may each independently be 1, 2, 3, 4, or 5, and b) at least one of $R_1$ to $R_4$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one or more embodiments, the dopant may be represented by Formula 1A-1:

Formula 1A-1

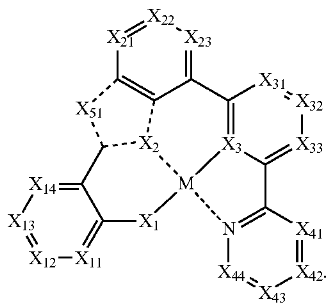

In Formula 1A-1,

M, $X_1$ to $X_3$, and $X_{51}$ are each independently the same as described herein, $X_{11}$ may be N or C-[$(L_{11})_{b11}$-$(R_{11})_{c11}$], $X_{12}$ may be N or C-[$(L_{12})_{b12}$-$(R_{12})_{c12}$], $X_{13}$ may be N or C-[$(L_{13})_{b13}$-$(R_{13})_{c13}$], and $X_{14}$ may be N or C-[$(L_{14})_{b14}$-$(R_{14})_{c14}$], $L_{11}$ to $L_{14}$, b11 to b14, $R_{11}$ to $R_{14}$, and c11 to c14 are each independently the same as described in connection with $L_1$, b1, $R_1$, and c1, $X_{21}$ may be N or C-[$(L_{21})_{b21}$-$(R_{21})_{c21}$], $X_{22}$ may be N or C-[$(L_{22})_{b22}$-$(R_{22})_{c22}$], and $X_{23}$ may be N or C-[$(L_{23})_{b23}$-$(R_{23})_{c23}$], $L_{21}$ to $L_{23}$, b21 to b23, $R_{21}$ to $R_{23}$, and c21 to c23 are each independently the same as described in connection with $L_2$, b2, $R_2$, and c2, $X_{31}$ may be N or C-[$(L_{31})_{b31}$-$(R_{31})_{c31}$], $X_{32}$ may be N or C-[$(L_{32})_{b32}$-$(R_{32})_{c32}$], and $X_{33}$ may be N or C-[$(L_{33})_{b33}$-$(R_{33})_{c33}$], $L_{31}$ to $L_{33}$, b31 to b33, $R_{31}$ to $R_{33}$, and c31 to c33 are each independently the same as described in connection with $L_3$, b3, $R_3$, and c3, $X_{41}$ may be N or C-[$(L_{41})_{b41}$-$(R_{41})_{c41}$], $X_{42}$ may be N or C-[$(L_{42})_{b42}$-$(R_{42})_{c42}$], $X_{43}$ may be N or C-[$(L_{43})_{b43}$-$(R_{43})_{c43}$], and $X_{44}$ may be N or C-[$(L_{44})_{b44}$-$(R_{44})_{c44}$], $L_{41}$ to $L_{44}$, b41 to b44, $R_{41}$ to $R_{44}$, and c41 to c44 are each independently the same as described in connection with $L_4$, b4, $R_4$, and c4, two of $R_{11}$ to $R_{14}$ may optionally be linked to form a substituted or unsubstituted $C_5$-$C_{30}$ carbocyclic group or a substituted or unsubstituted $C_1$-$C_{30}$ heterocyclic group, two of $R_{21}$ to $R_{23}$ may optionally be linked to form a substituted or unsubstituted $C_5$-$C_{30}$ carbocyclic group or a substituted or unsubstituted $C_1$-$C_{30}$ heterocyclic group, two of $R_{31}$ to $R_{33}$ may optionally be linked to form a substituted or unsubstituted $C_5$-$C_{30}$ carbocyclic group or a substituted or unsubstituted $C_1$-$C_{30}$ heterocyclic group, and two of $R_{41}$ to $R_{44}$ may optionally be linked to form a substituted or unsubstituted $C_5$-$C_{30}$ carbocyclic group or a substituted or unsubstituted $C_1$-$C_{30}$ heterocyclic group.

For example, the dopant may be one of Compounds 1-1 to 1-88, 2-1 to 2-47, and 3-1 to 3-582, but embodiments of the present disclosure are not limited thereto:

1-1

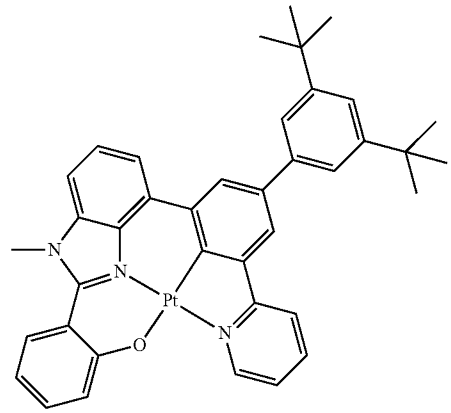

1-2

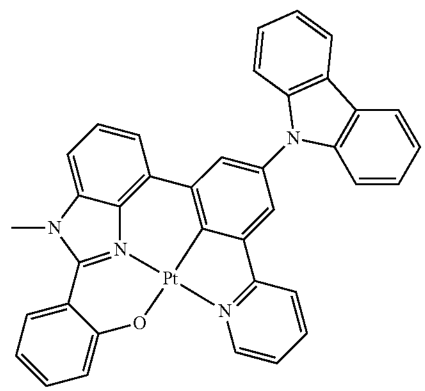

1-3

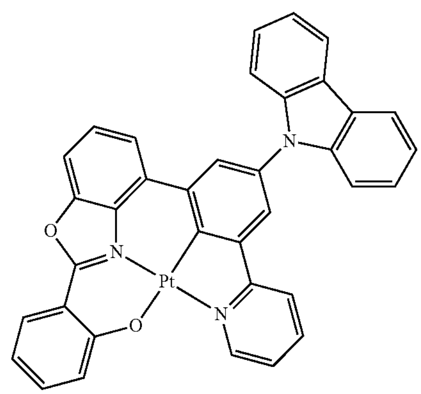

1-4

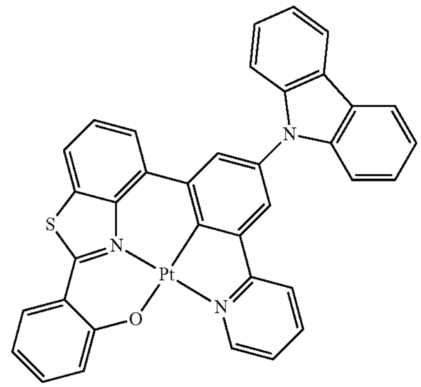

-continued
1-5
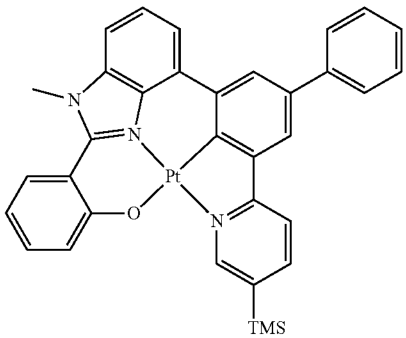
1-6
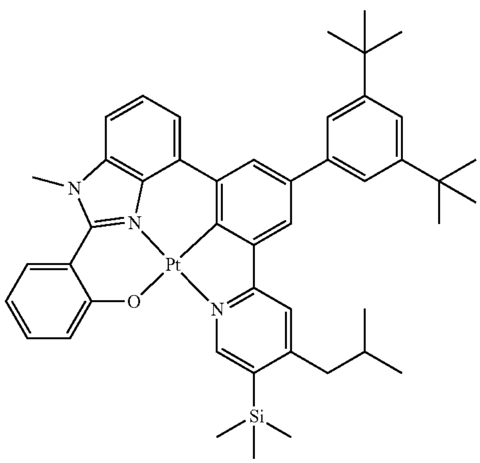
1-7
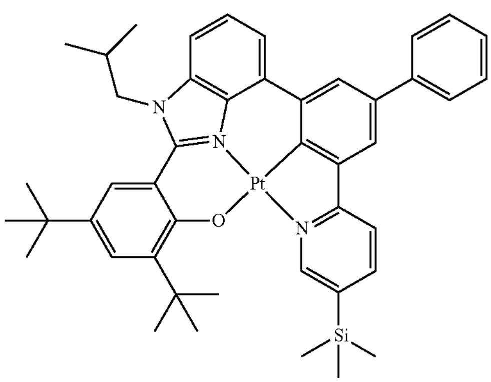
1-8
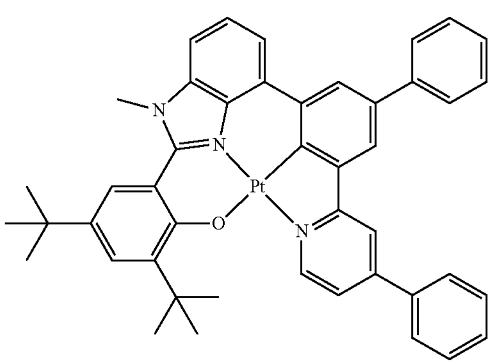
-continued
1-9
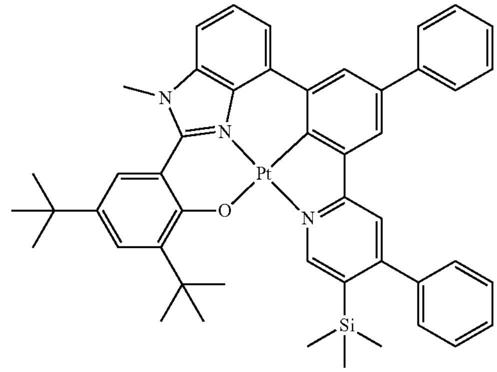
1-10
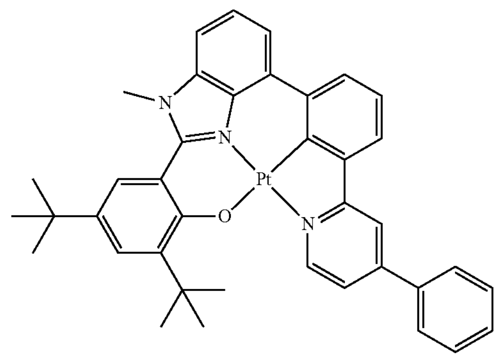
1-11
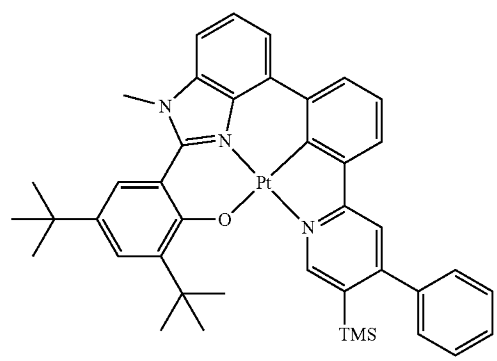
1-12
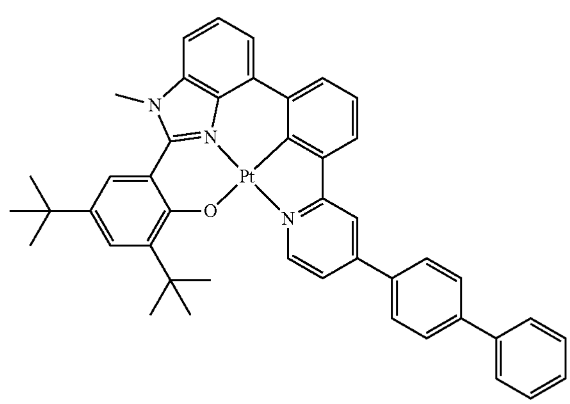

-continued
1-13
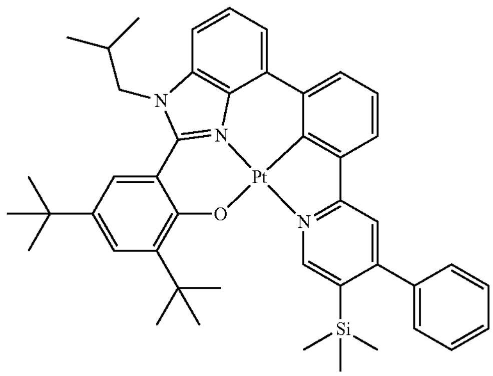
1-14
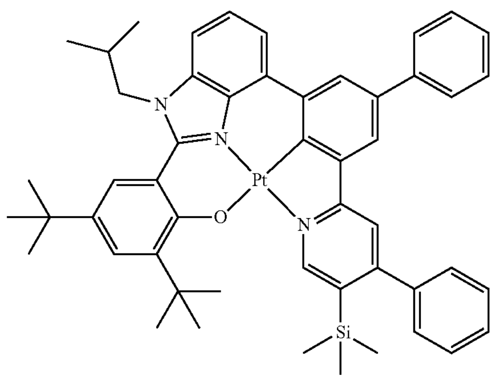
1-15
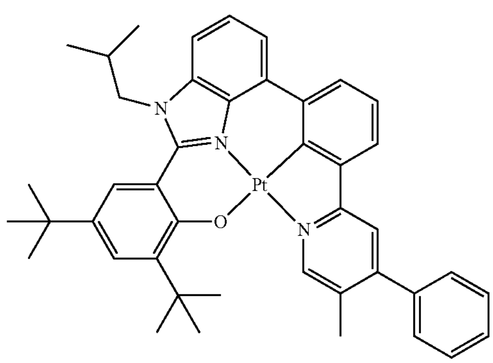
1-16
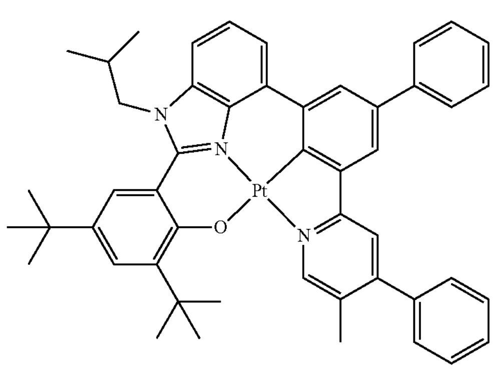
-continued
1-17
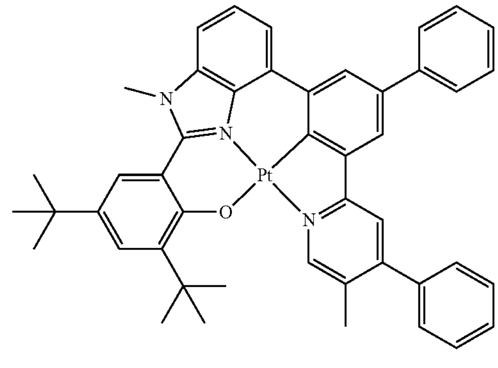
1-18
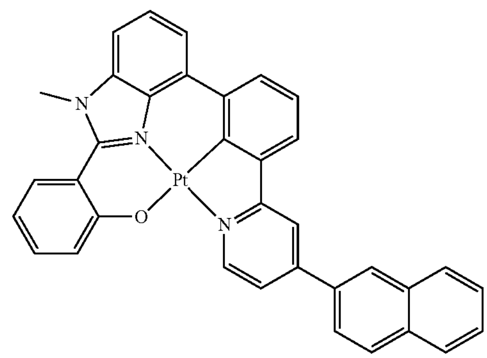
1-19
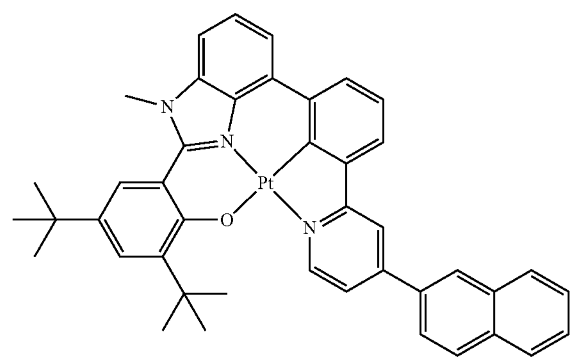
1-20
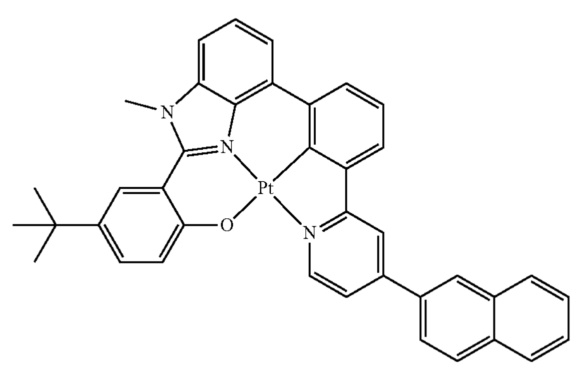

-continued
1-21
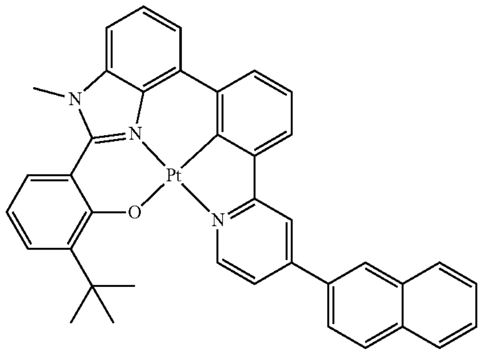
1-22
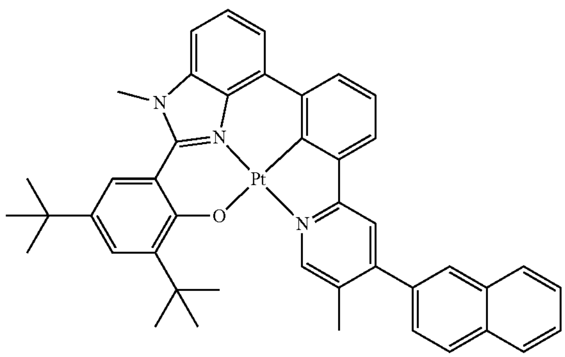
1-23
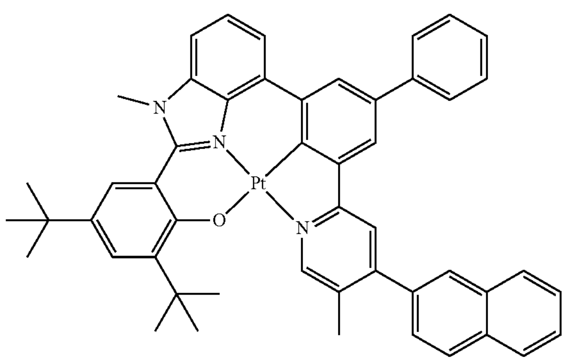
1-24
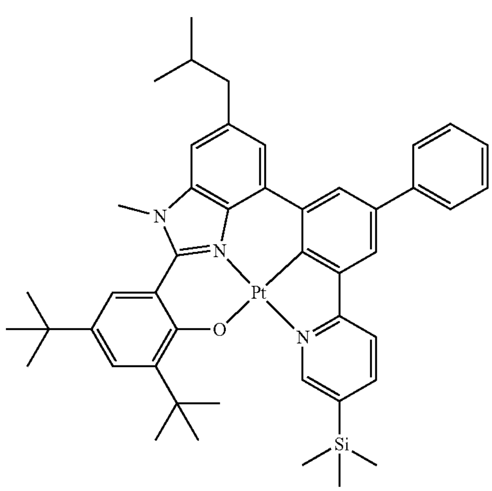
-continued
1-25
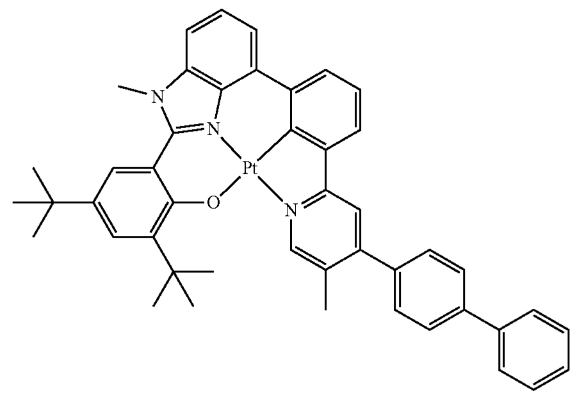
1-26
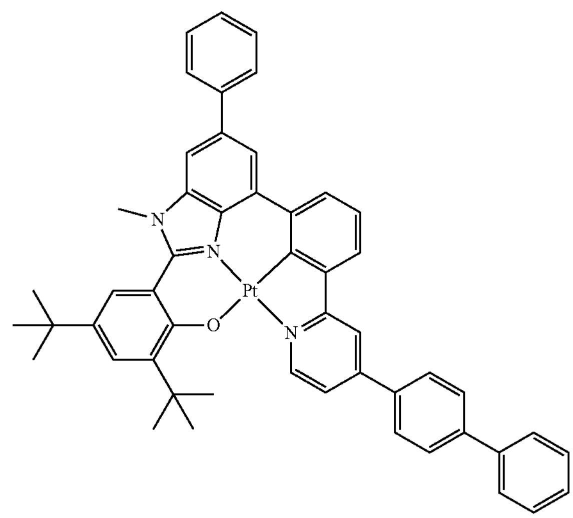
1-27
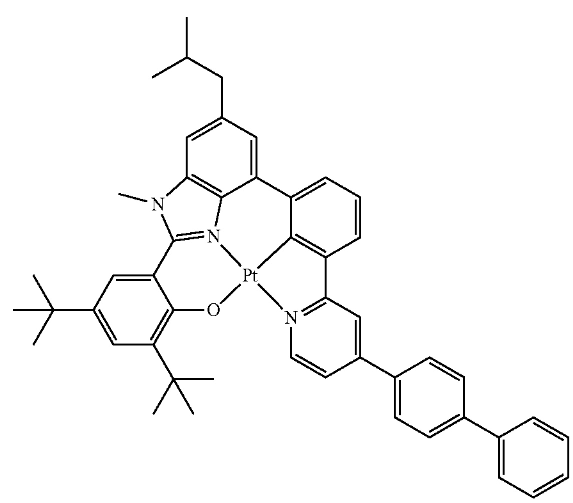

-continued
1-28
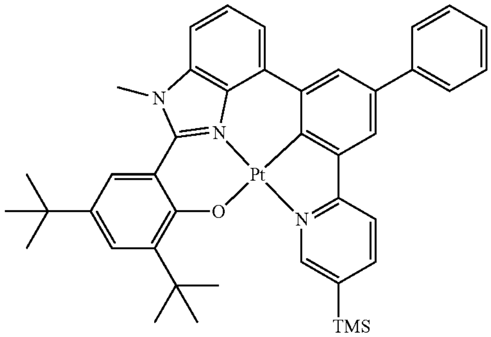
1-29
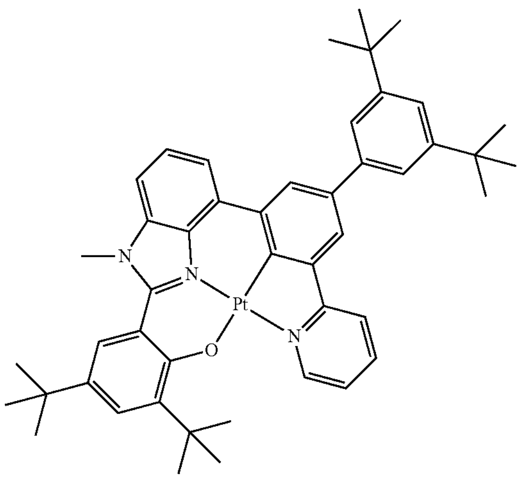
1-30
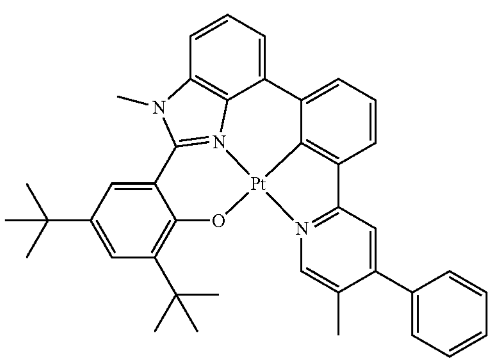
1-31
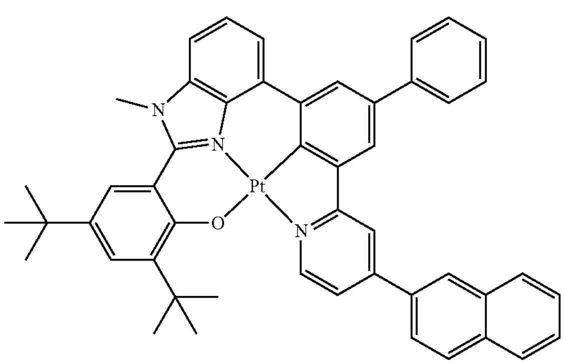
-continued
1-32
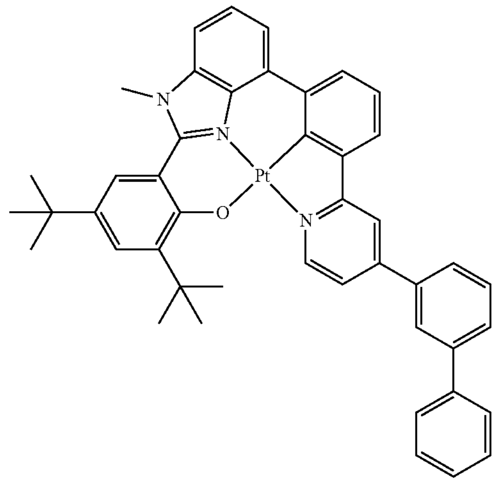
1-33
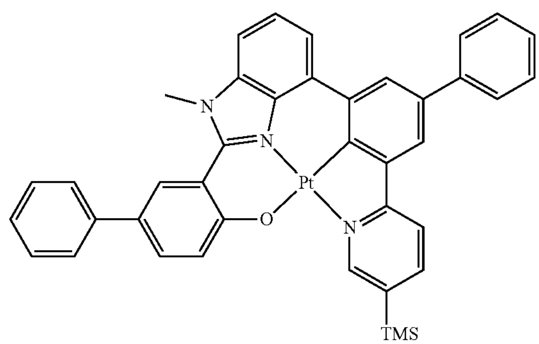
1-34
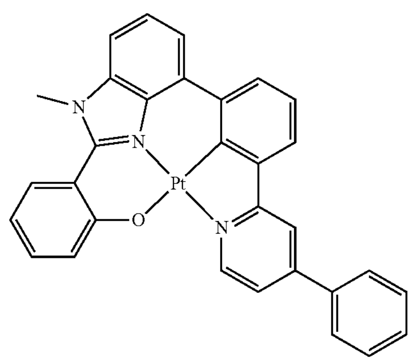
1-35
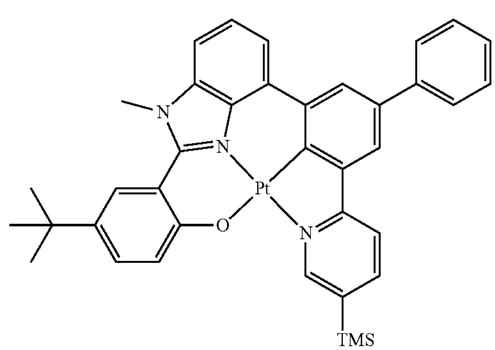

-continued
1-36
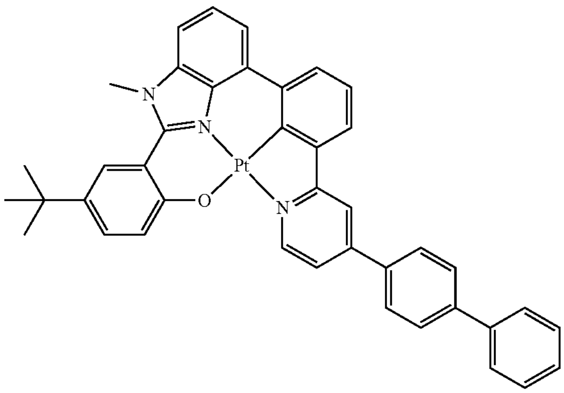
1-37
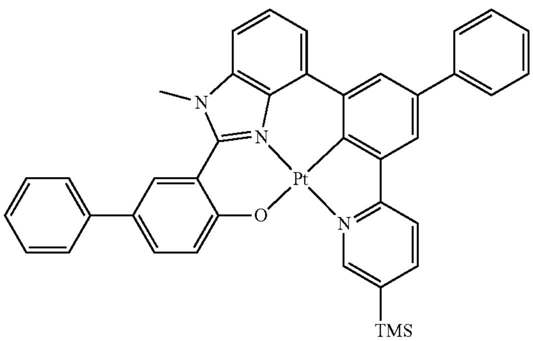
1-38
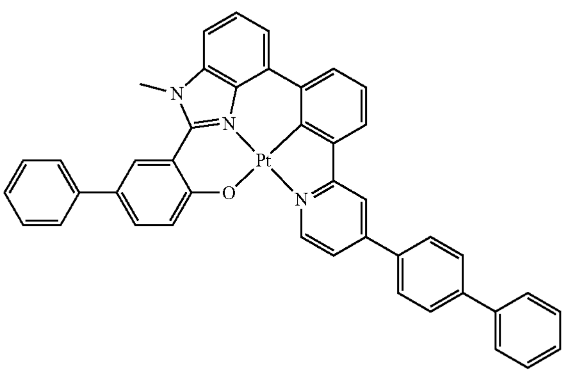
1-39
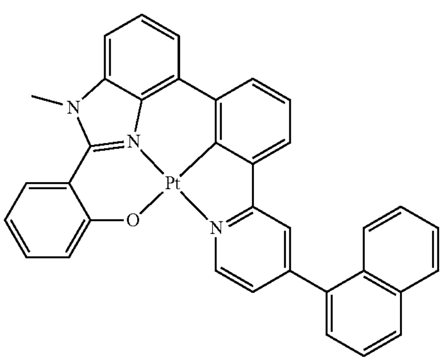
-continued
1-40
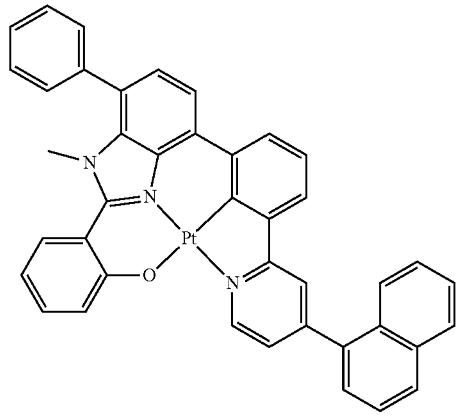
1-41
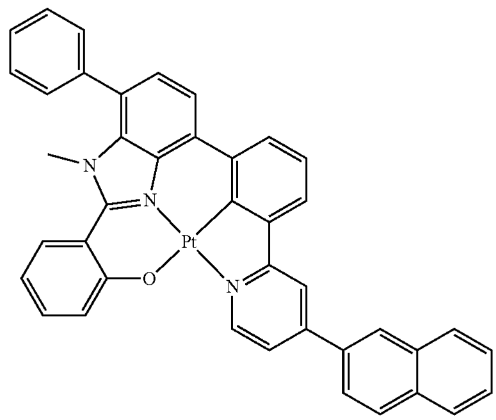
1-42
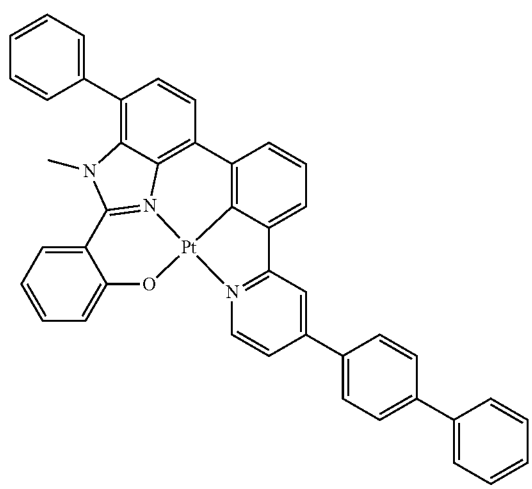

-continued
1-43
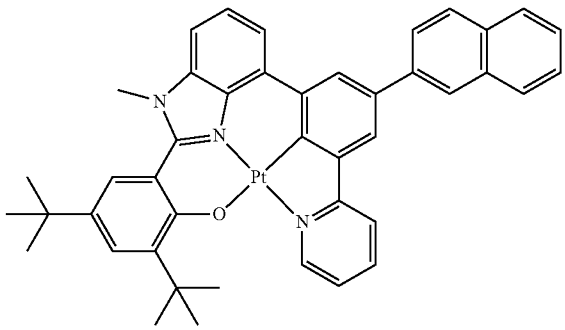
1-44
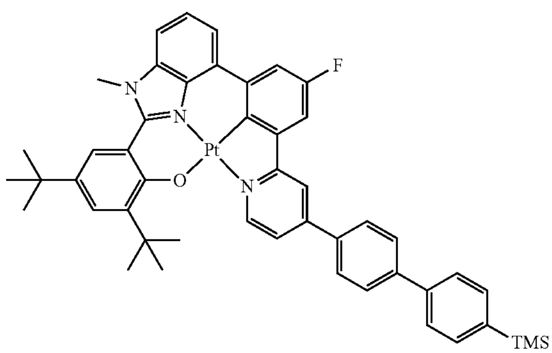
1-45
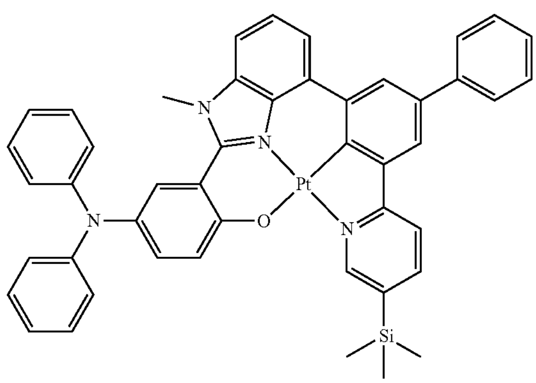
1-46
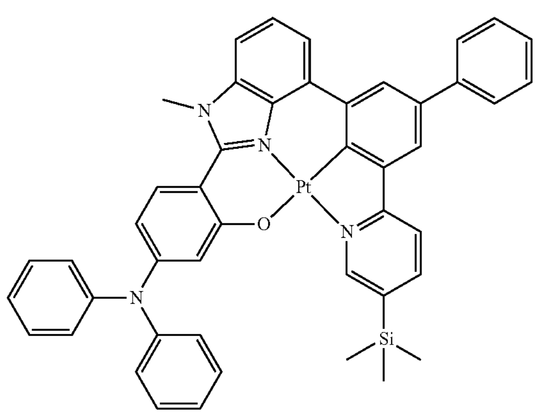
-continued
1-47
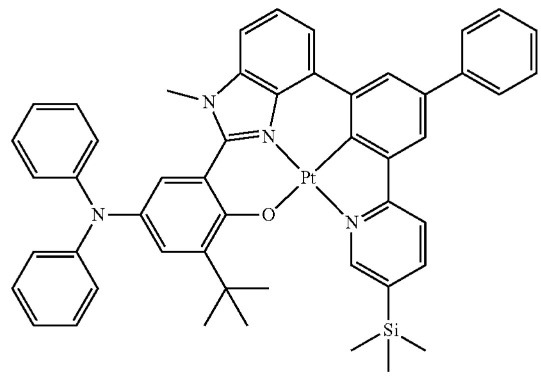
1-48
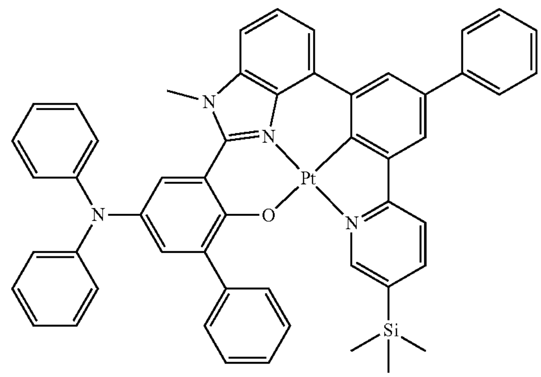
1-49
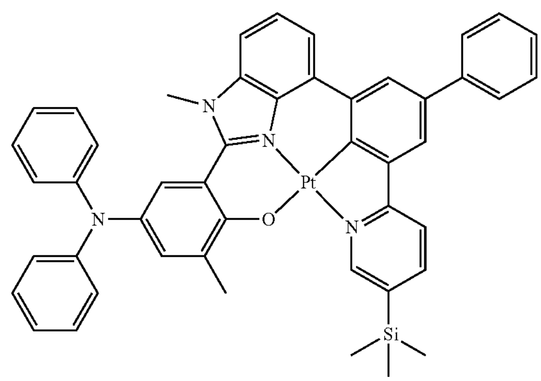
1-50
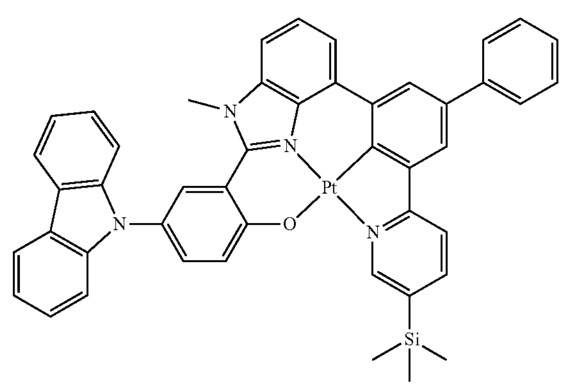

-continued
1-51
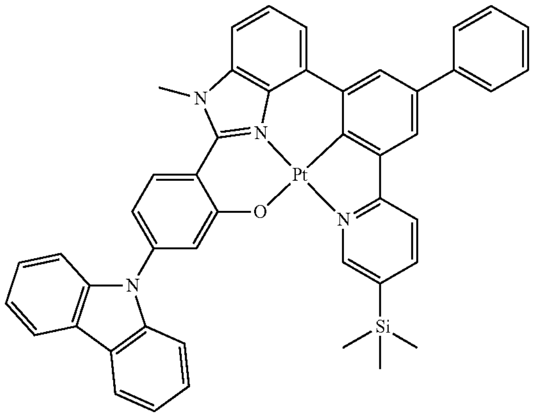
1-52
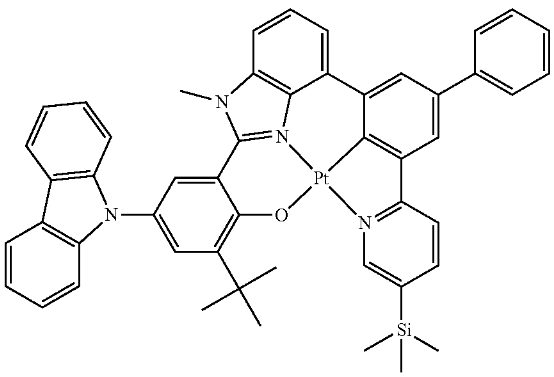
1-53
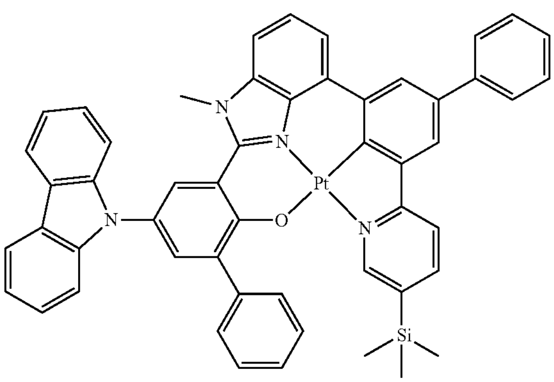
1-54
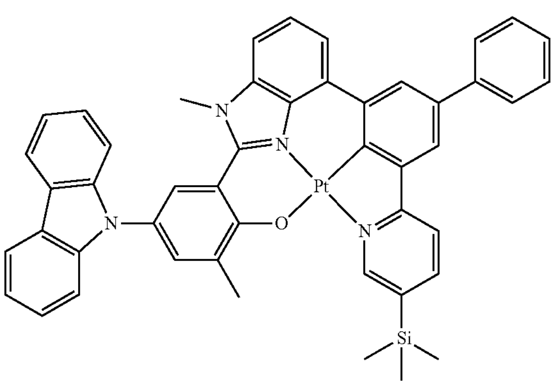
-continued
1-55
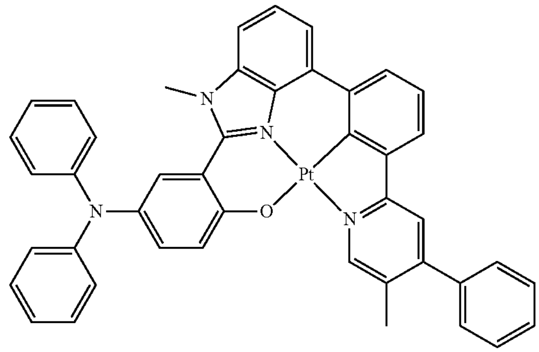
1-56
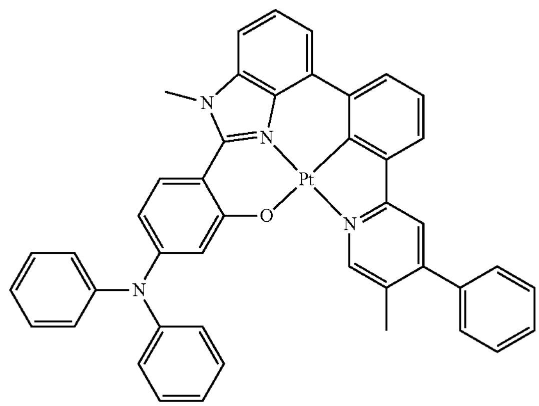
1-57
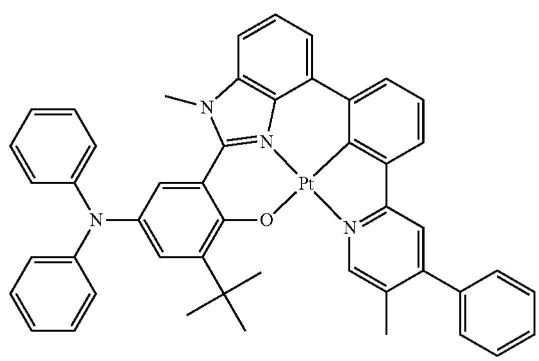
1-58
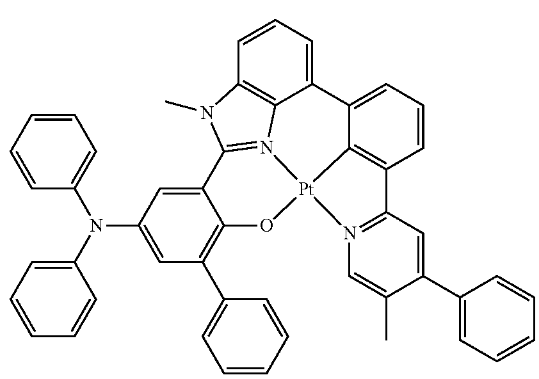

1-59
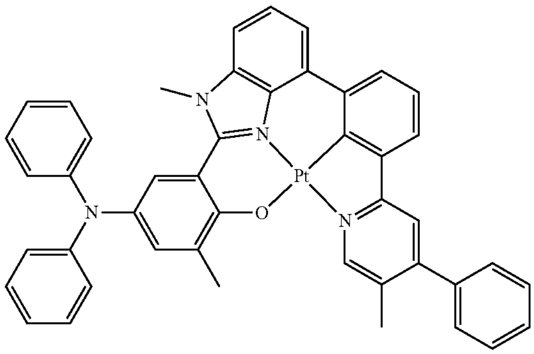
1-60
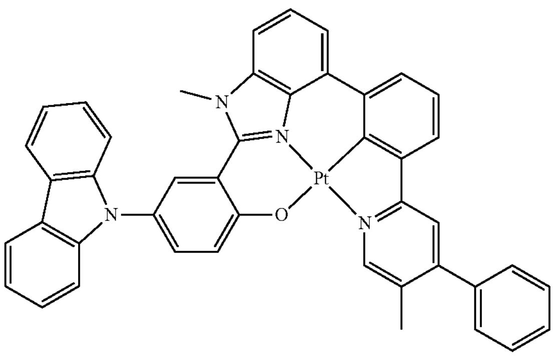
1-61
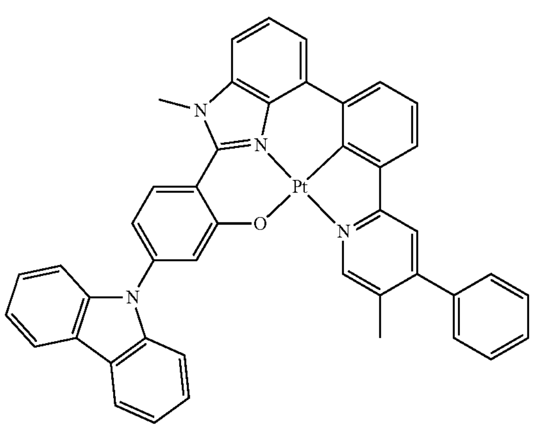
1-62
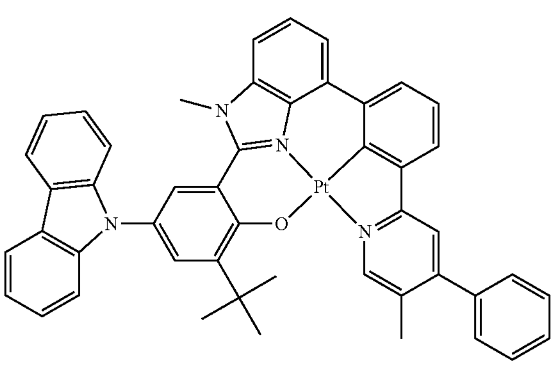
1-63
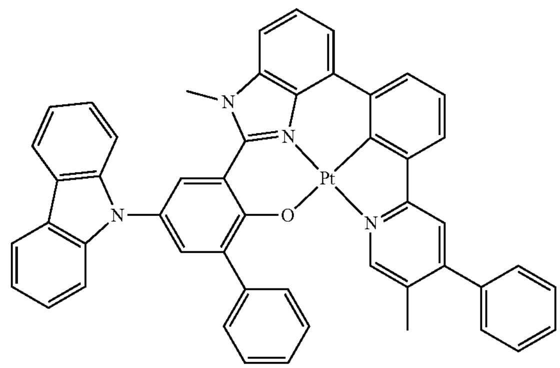
1-64
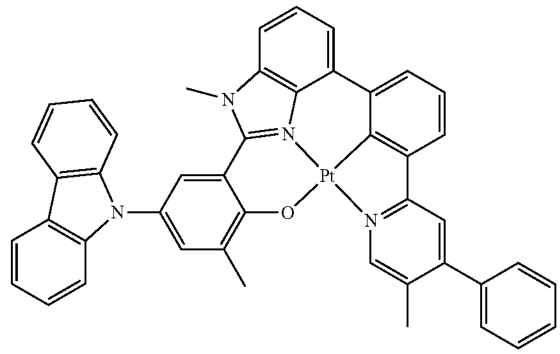
1-65
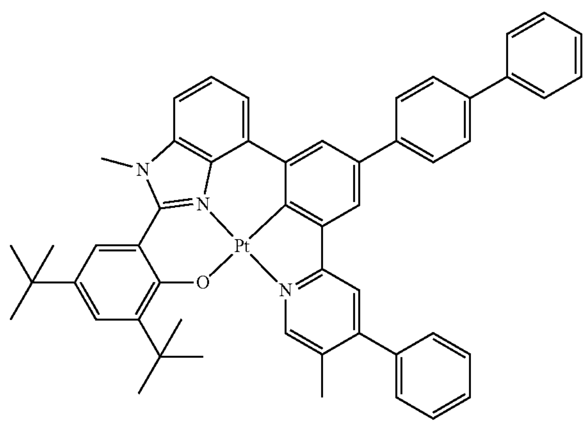
1-66
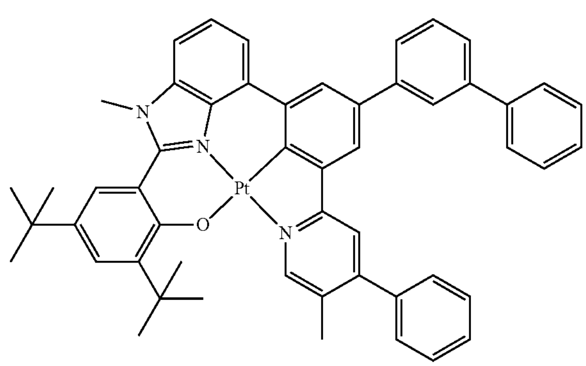

-continued
1-67
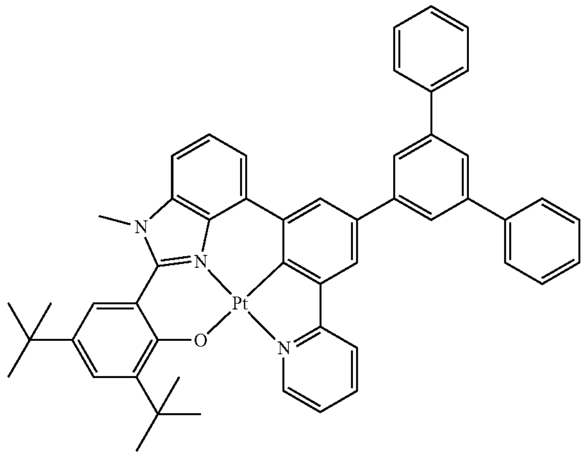
1-68
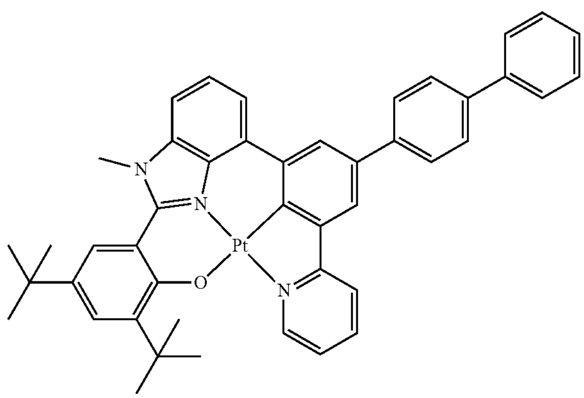
1-69
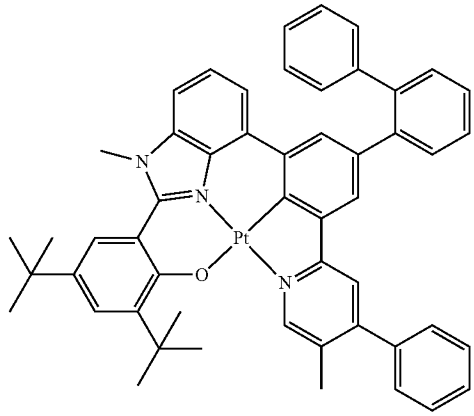
-continued
1-70
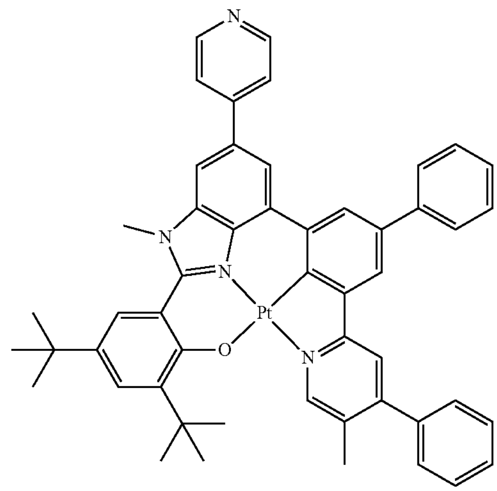
1-71
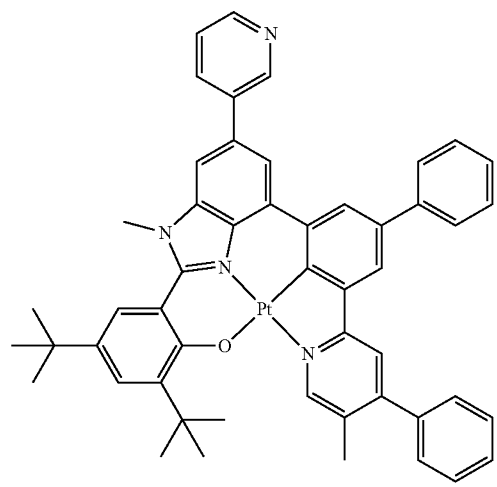
1-72
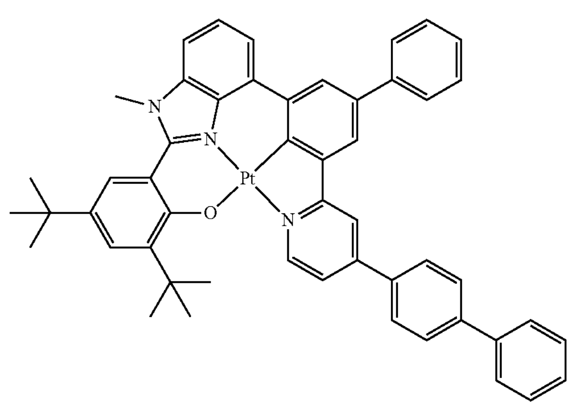

1-73
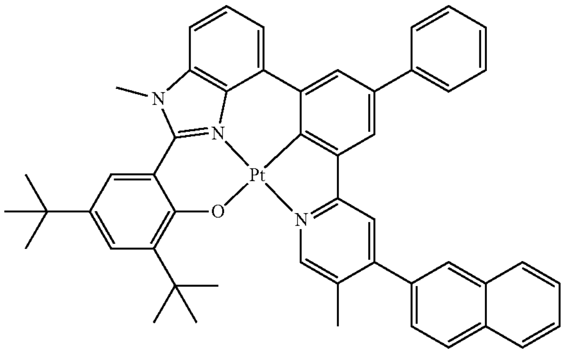
1-74
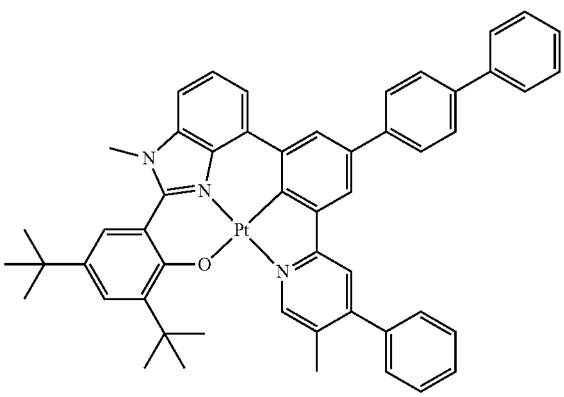
1-75
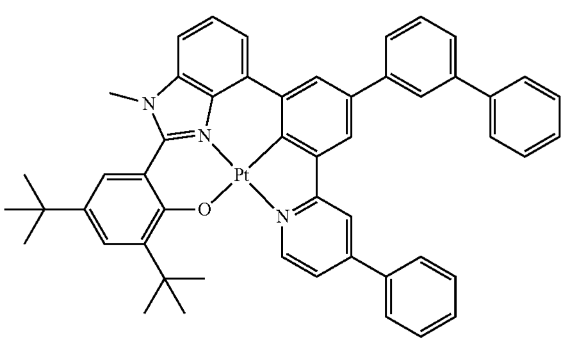
1-76
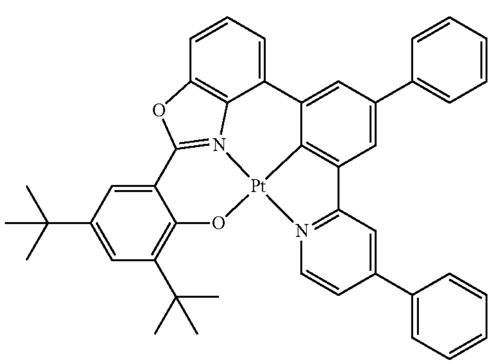
1-77
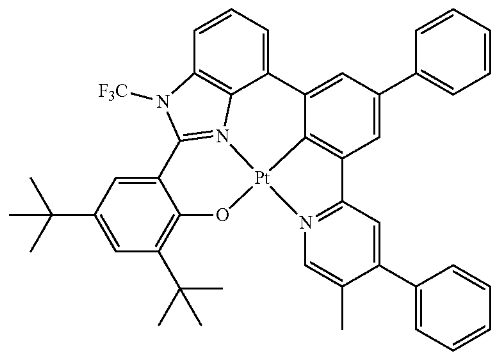
1-78
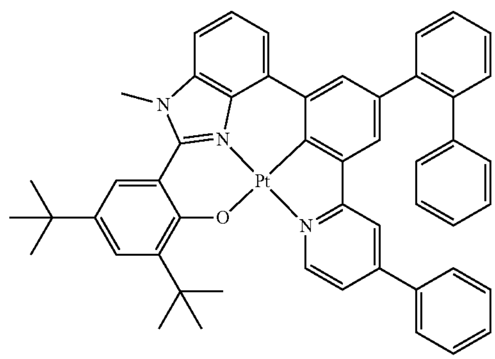
1-79
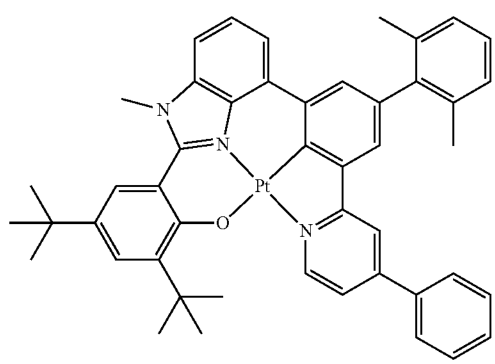
1-80
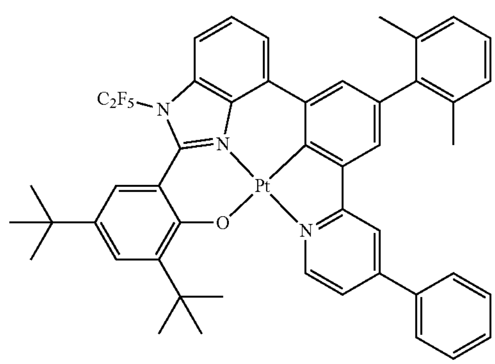

-continued
1-81
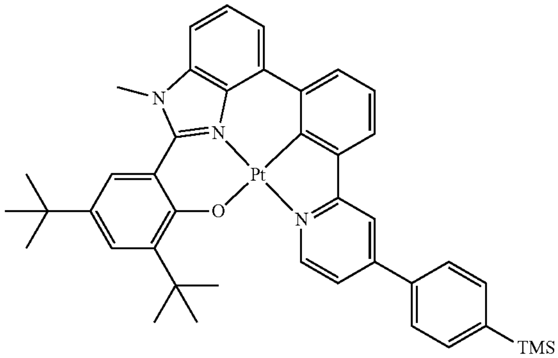
1-82
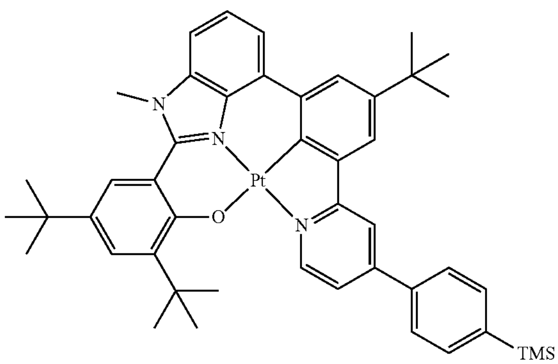
1-83
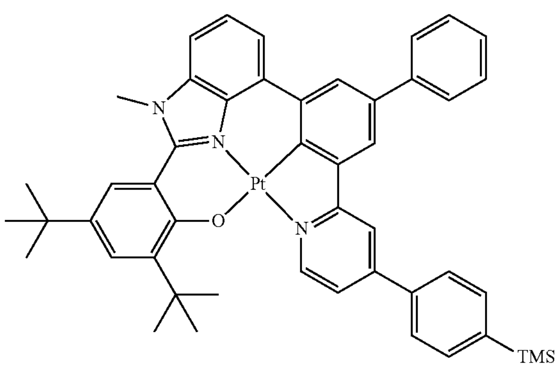
1-84
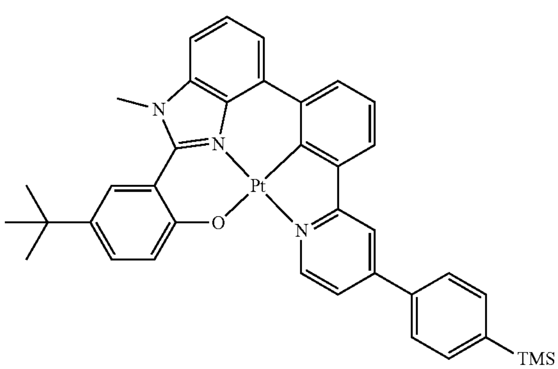
-continued
1-85
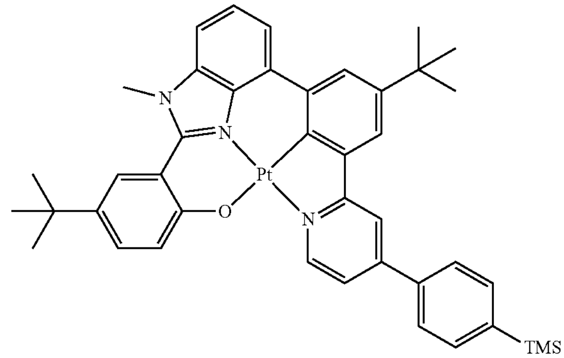
1-86
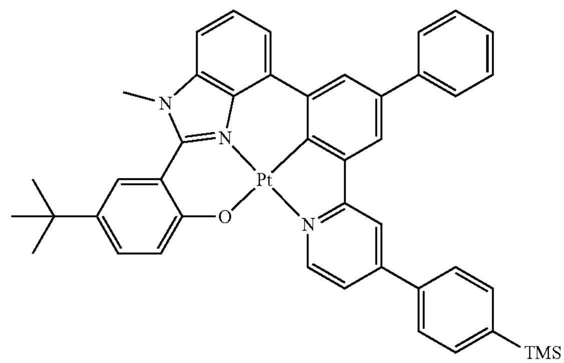
1-87
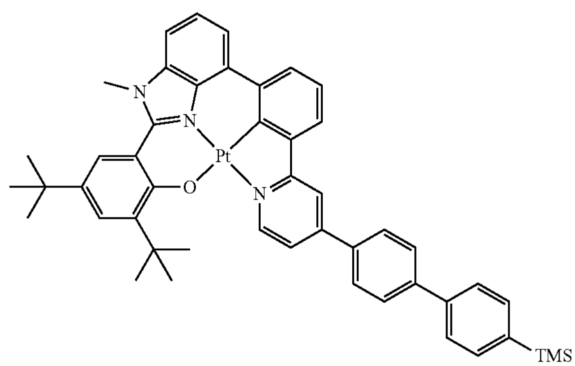
1-88
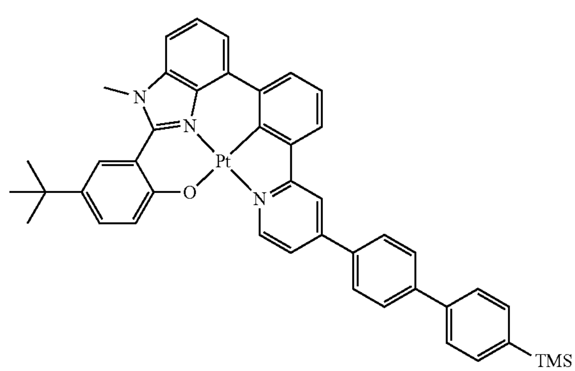

-continued
2-1
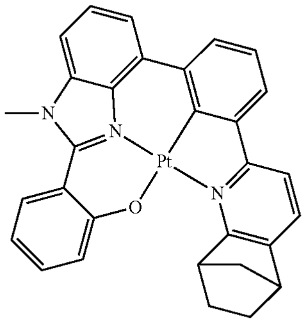
2-2
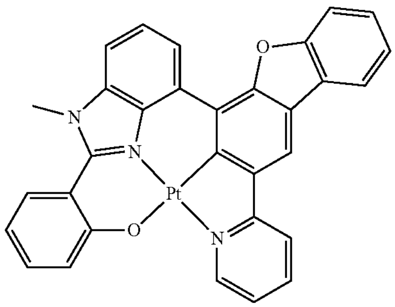
2-3
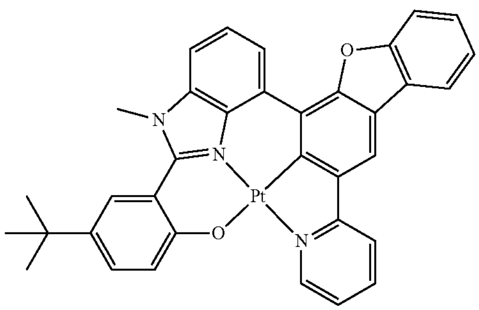
2-4
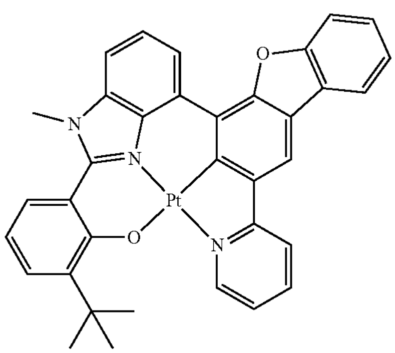
2-5
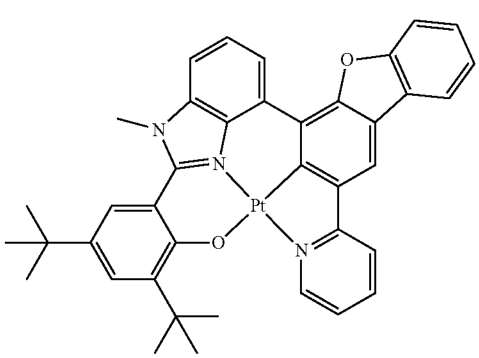
-continued
2-6
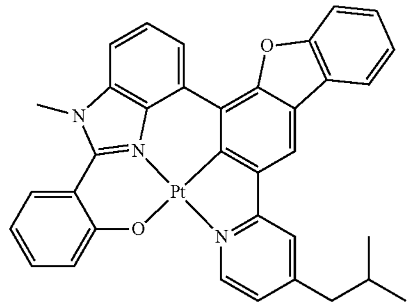
2-7
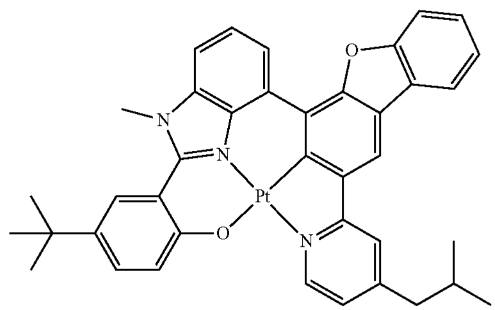
2-8
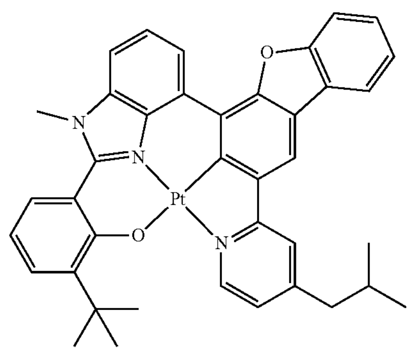
2-9
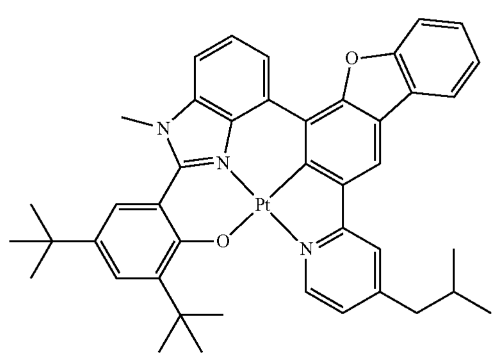

2-10
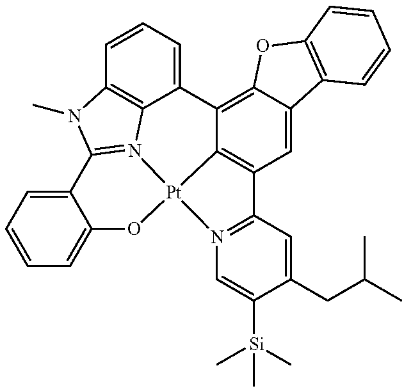
2-11
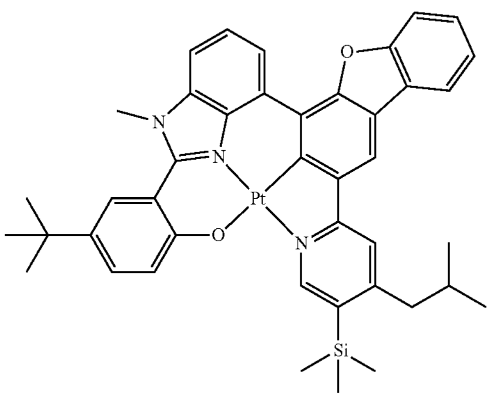
2-12
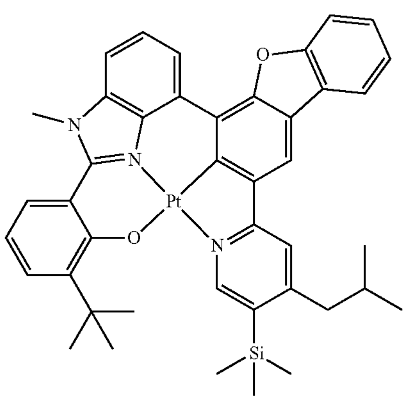
2-13
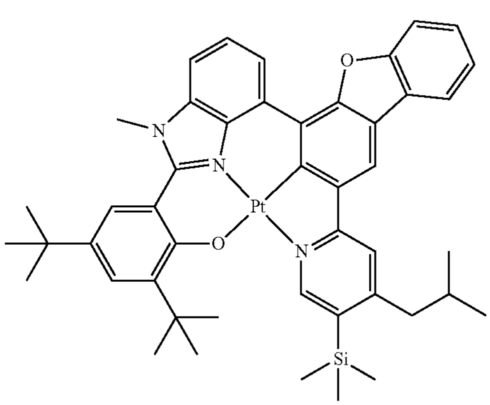
2-14
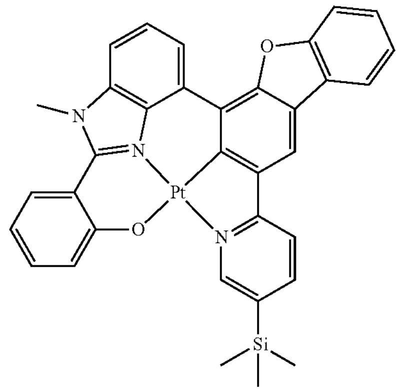
2-15
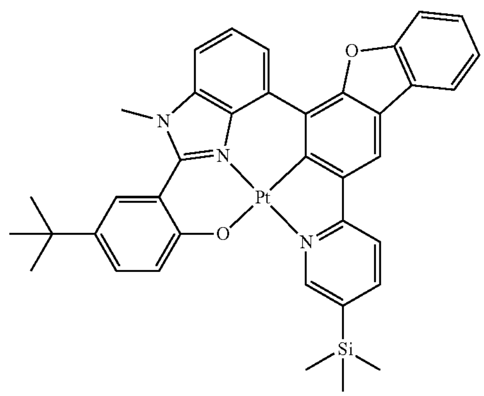
2-16
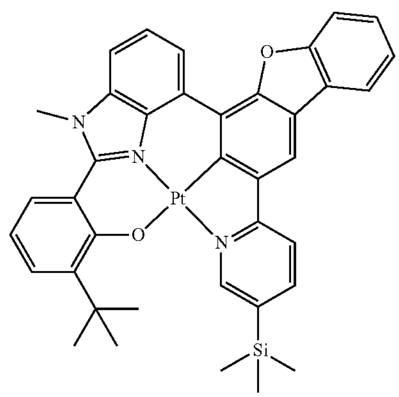
2-17
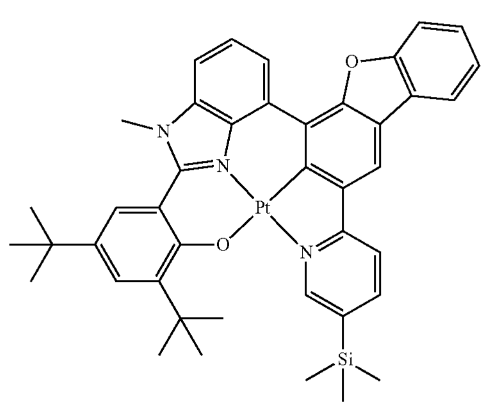

-continued
2-18
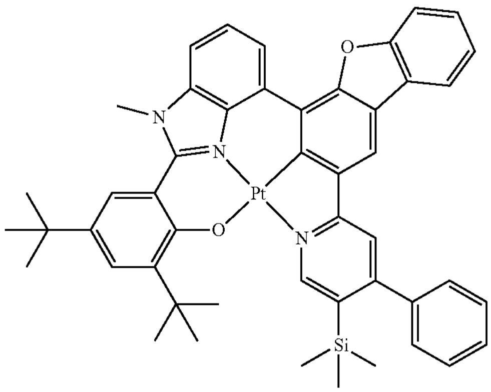
2-19
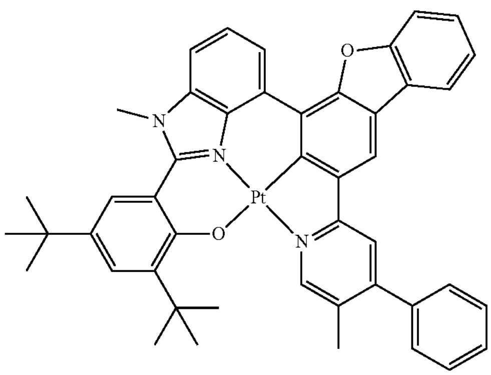
2-20
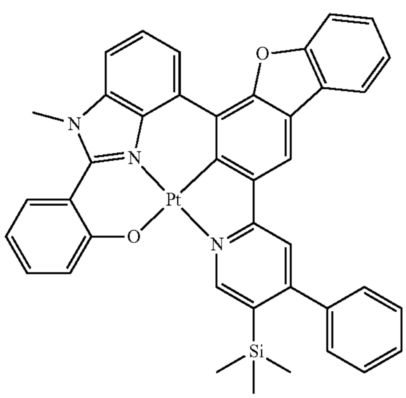
2-21
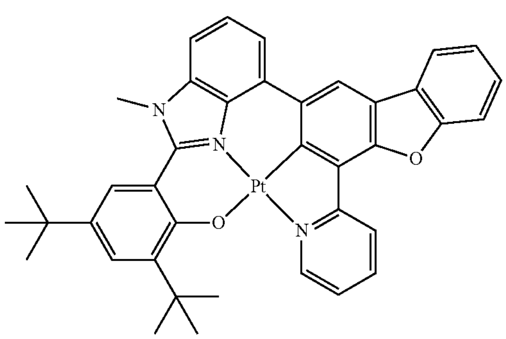
-continued
2-22
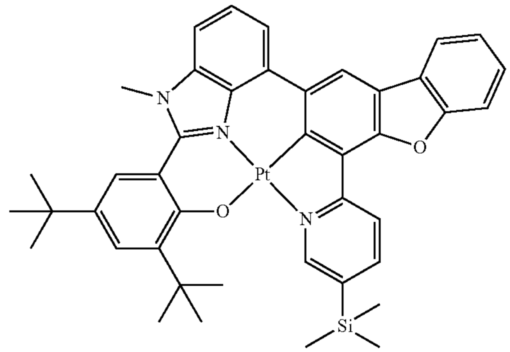
2-23
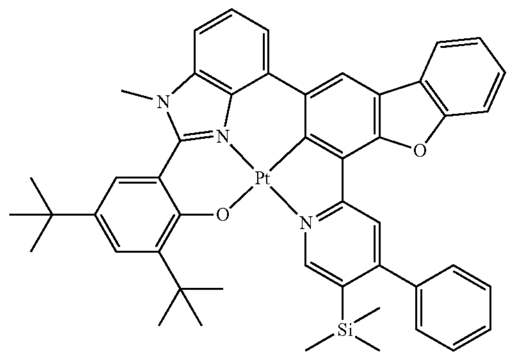
2-24
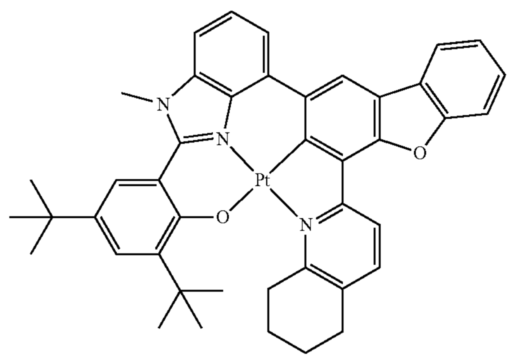
2-25
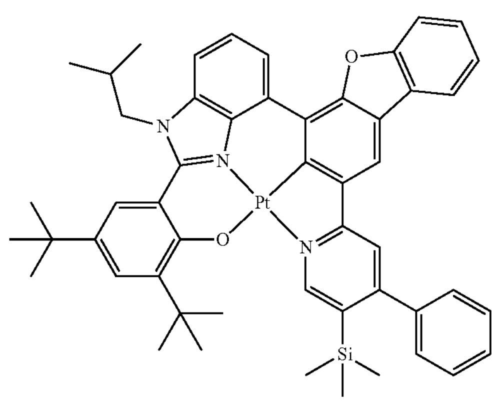

-continued
2-26
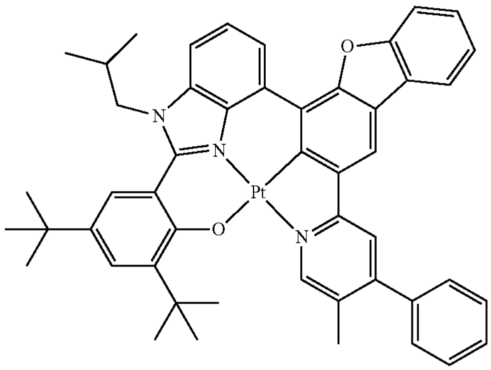
2-27
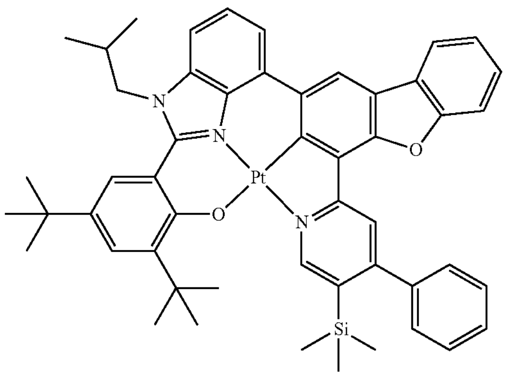
2-28
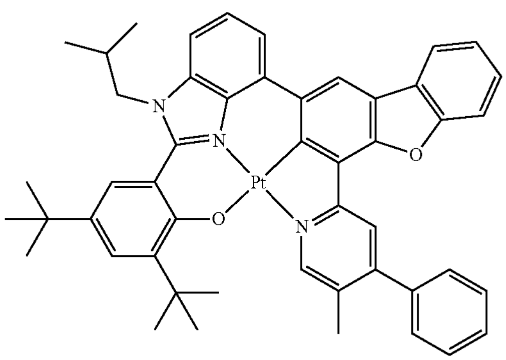
2-29
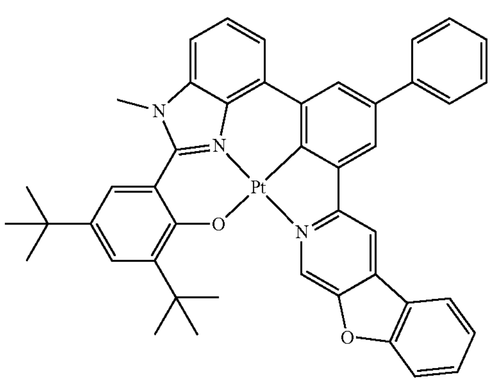
-continued
2-30
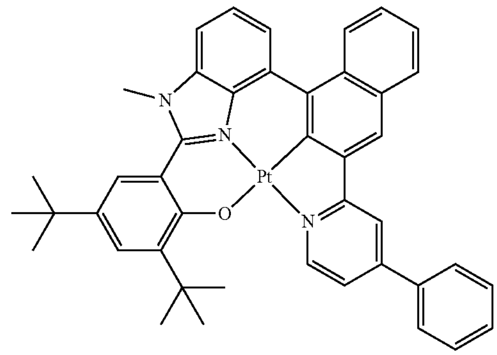
2-31
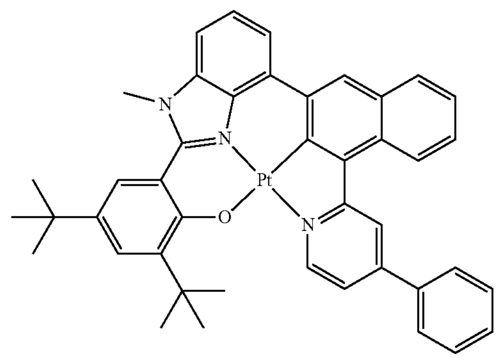
2-32
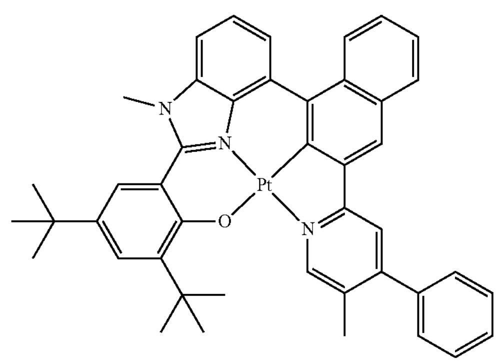
2-33
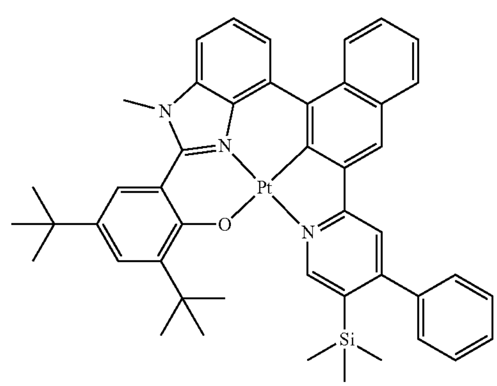

2-34
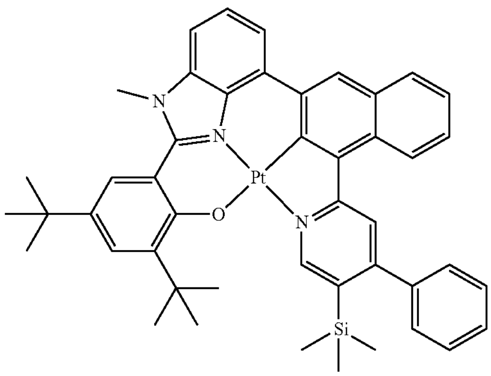
2-35
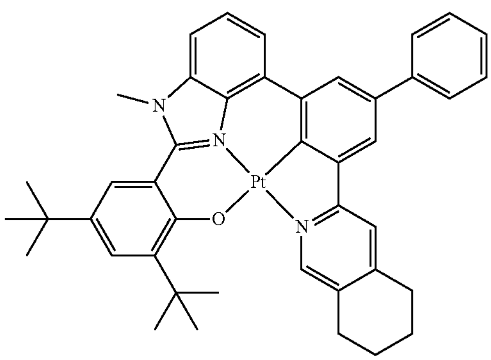
2-36
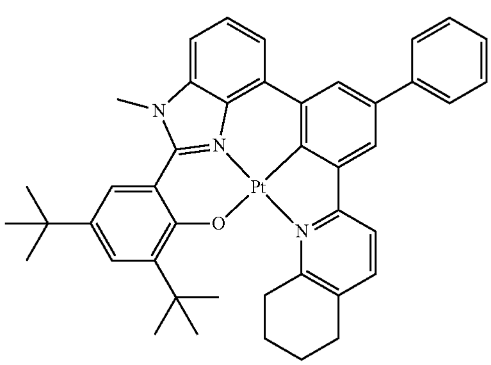
2-37
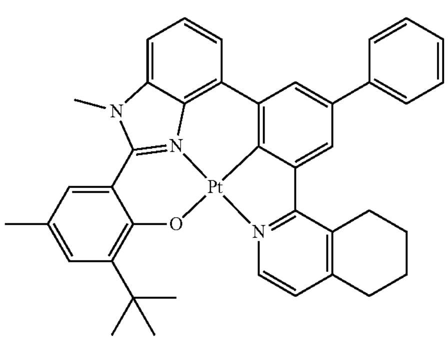
2-38
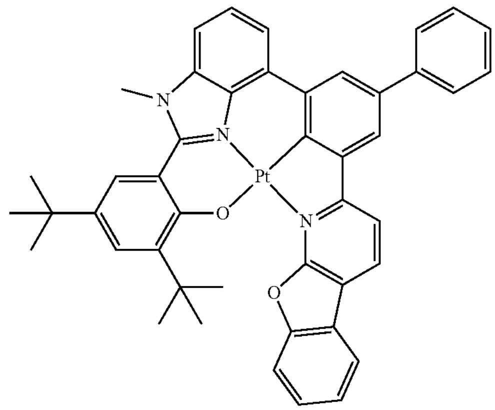
2-39
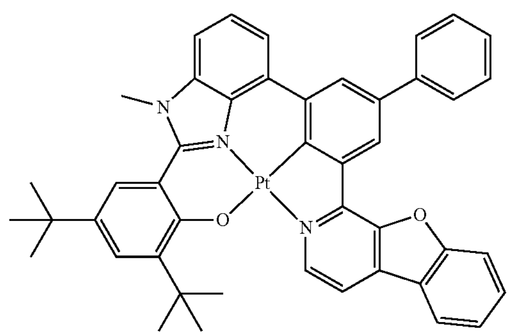
2-40
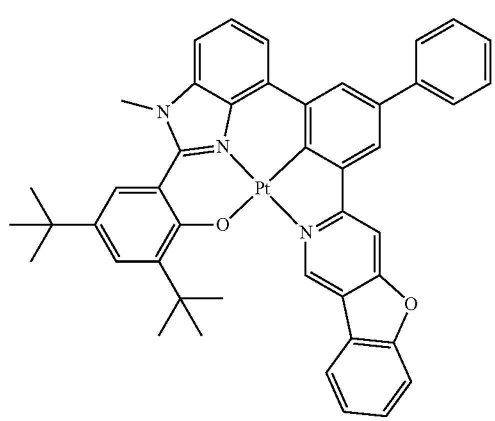
2-41
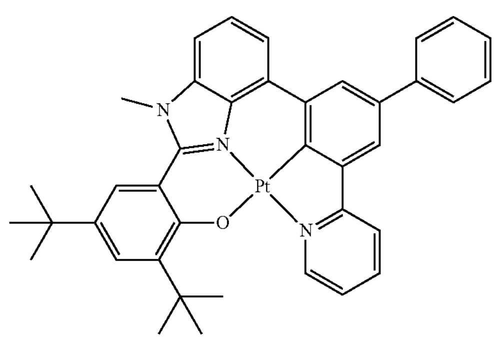

-continued
2-42
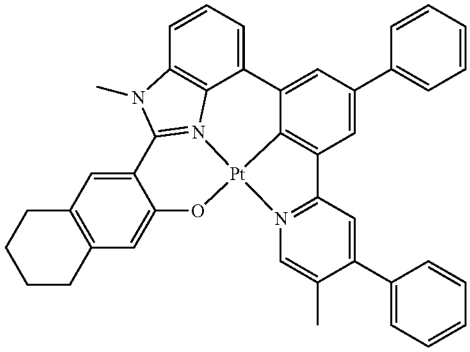
2-43
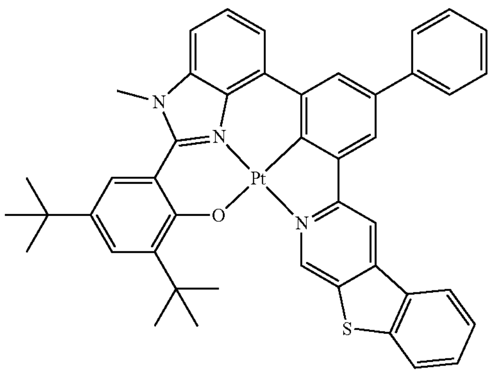
2-44
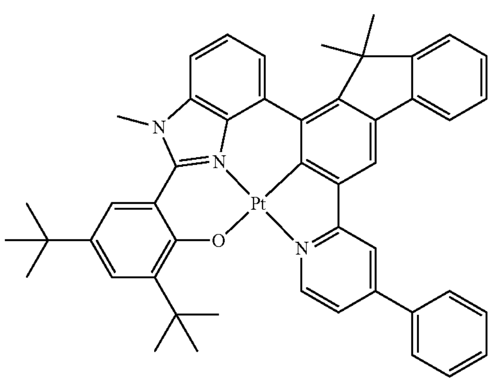
2-45
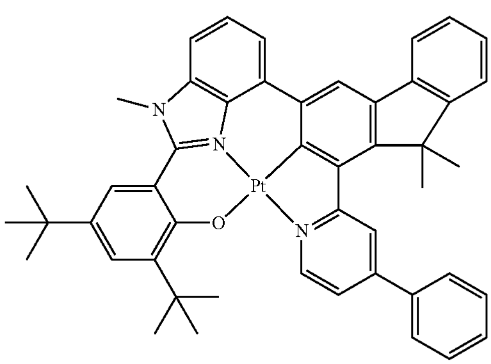
-continued
2-46
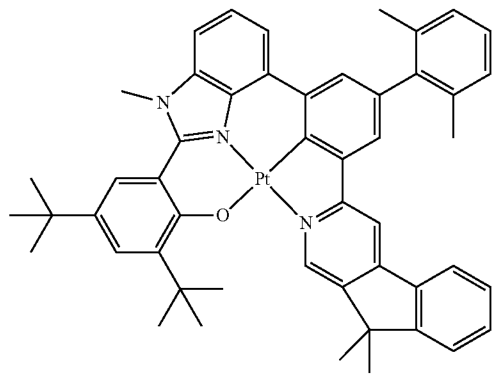
2-47
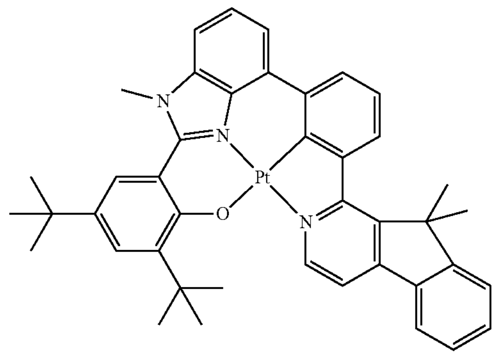
3-1
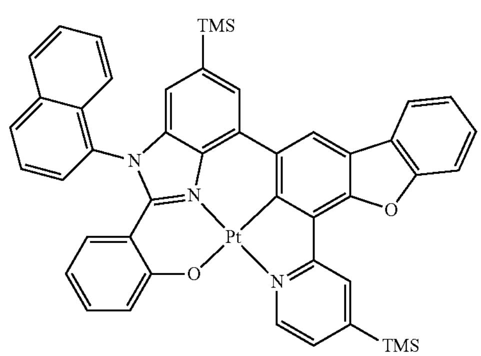
3-2
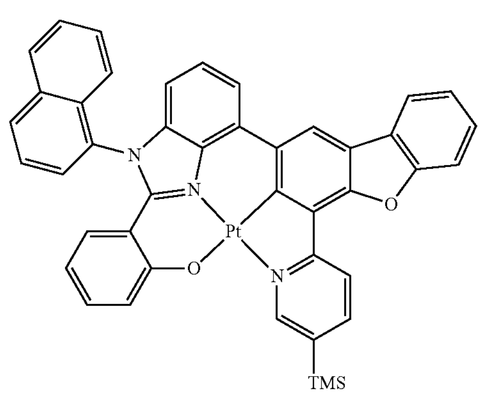

-continued
3-3
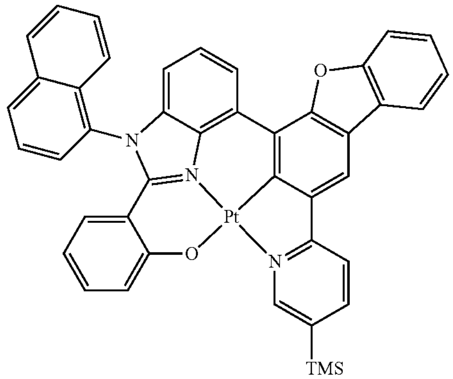
3-4
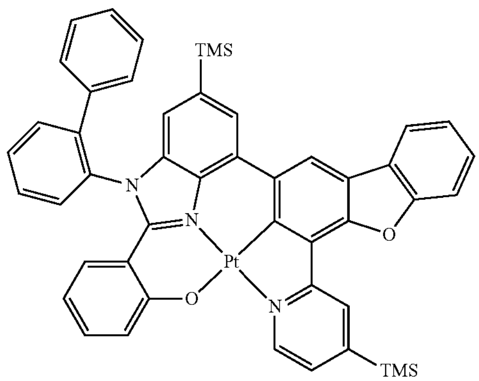
3-5
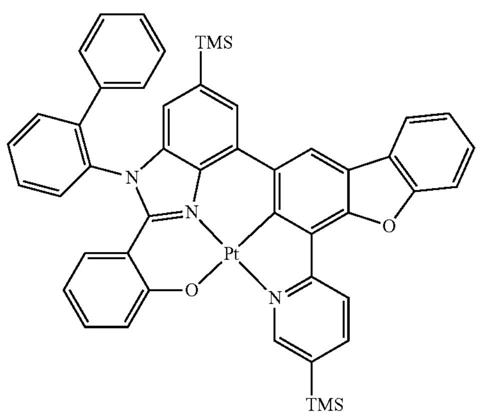
3-6
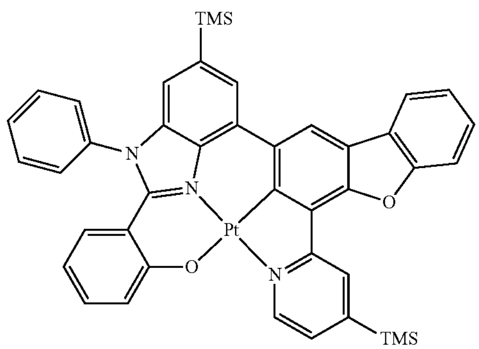
-continued
3-7
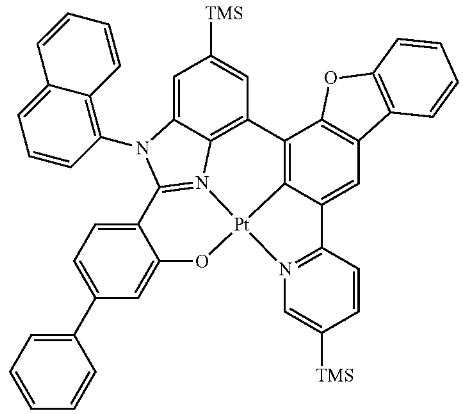
3-8
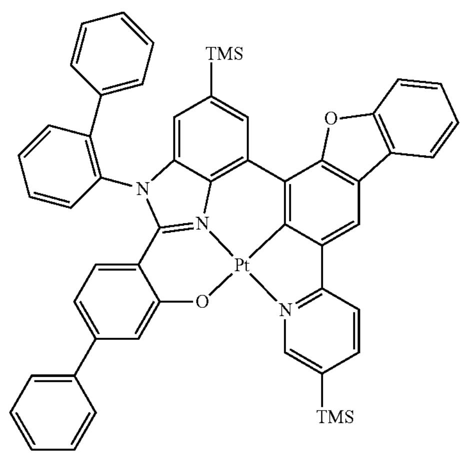
3-9
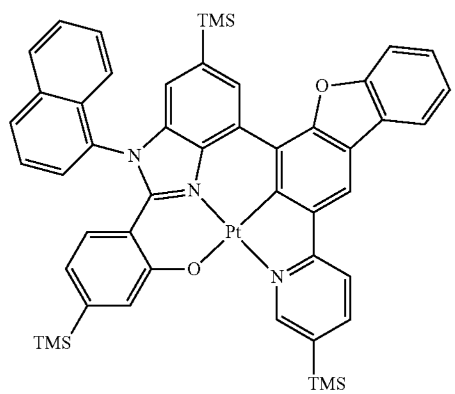

-continued
3-10
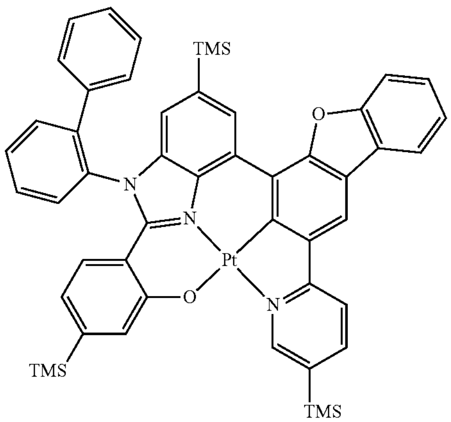
3-11
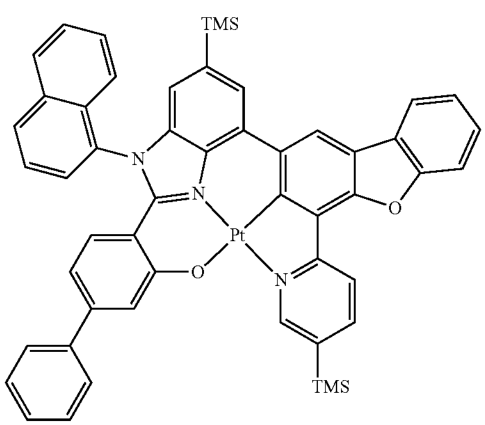
3-12
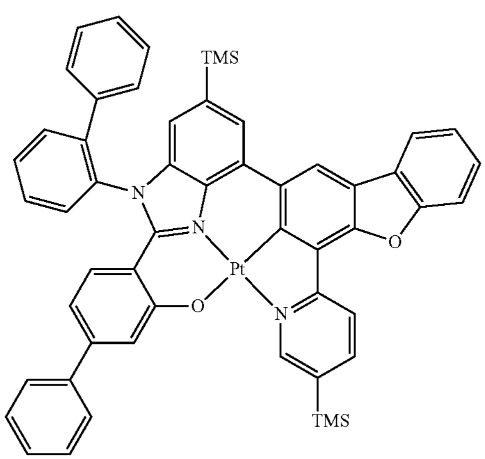
-continued
3-13
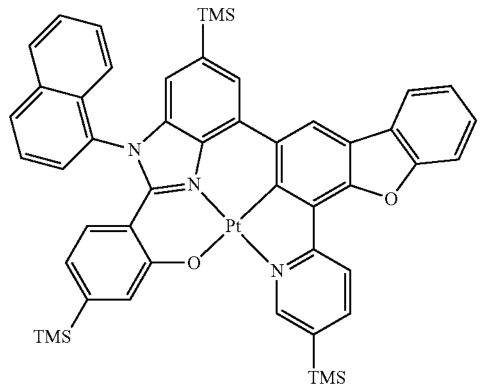
3-14
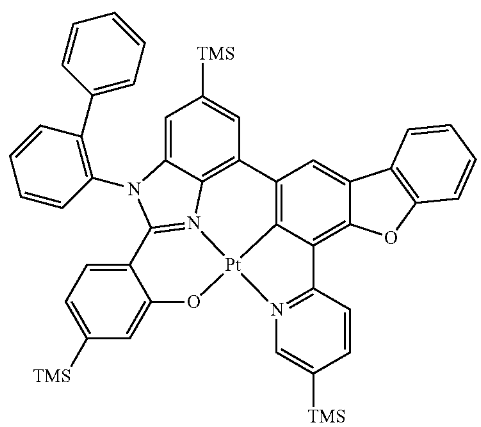
3-15
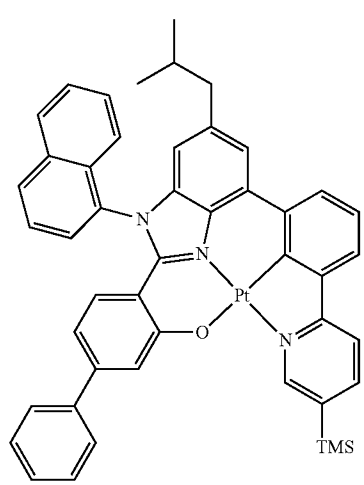

-continued
3-16
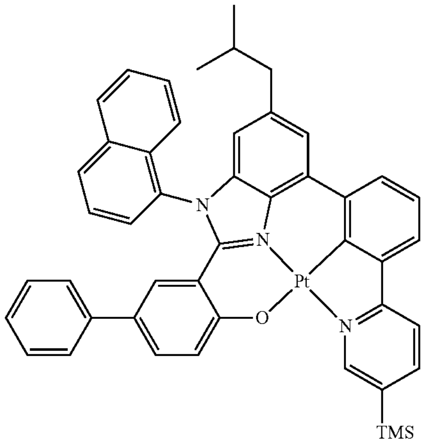
3-17
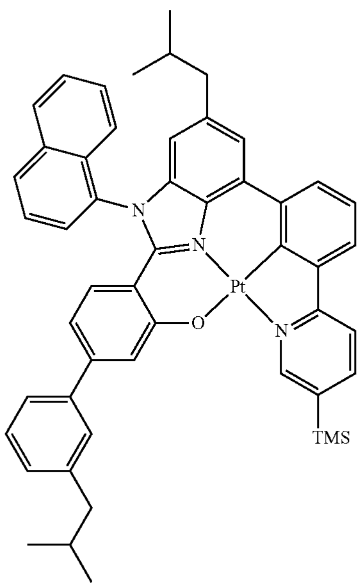
3-18
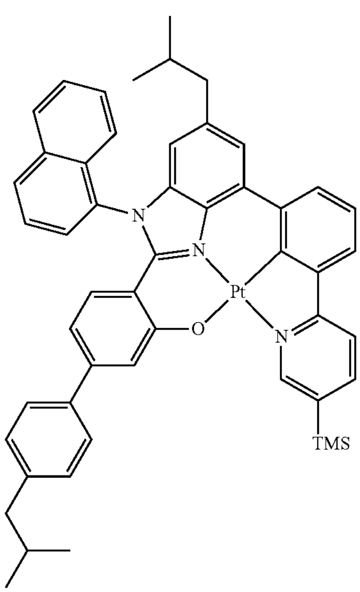
-continued
3-19
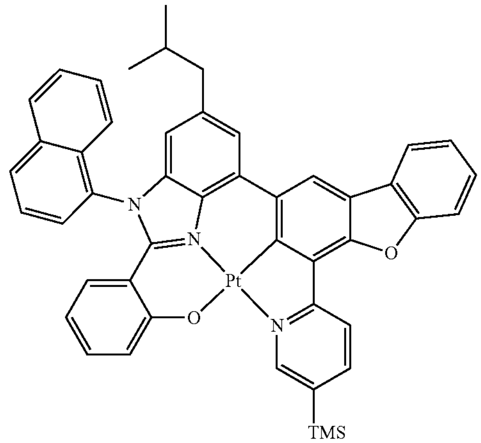
3-20
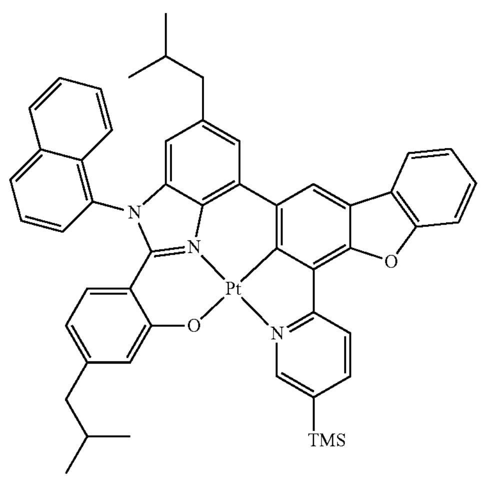
3-21
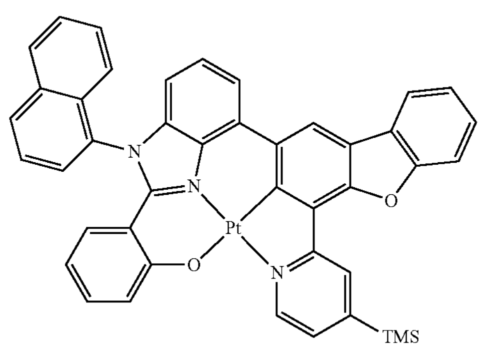

-continued
3-22
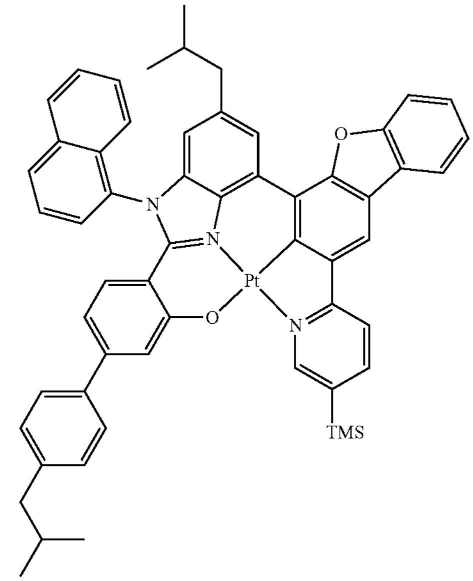
3-23
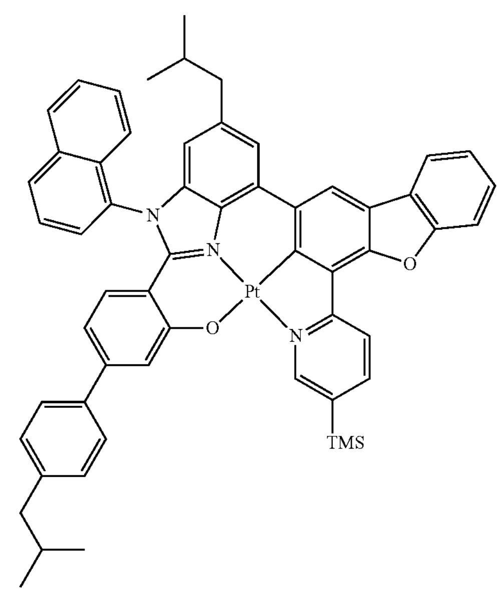
-continued
3-24
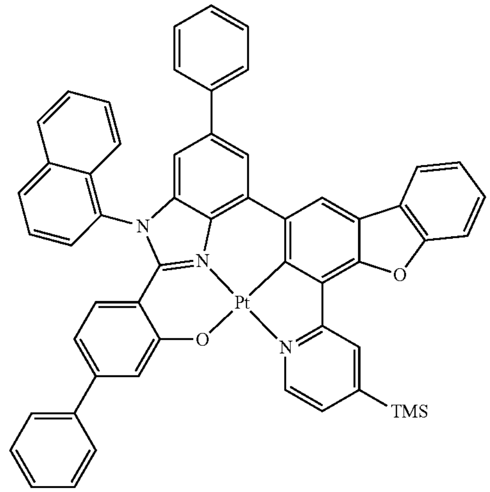
3-25
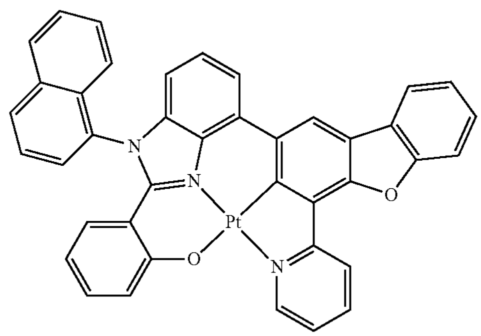
3-26
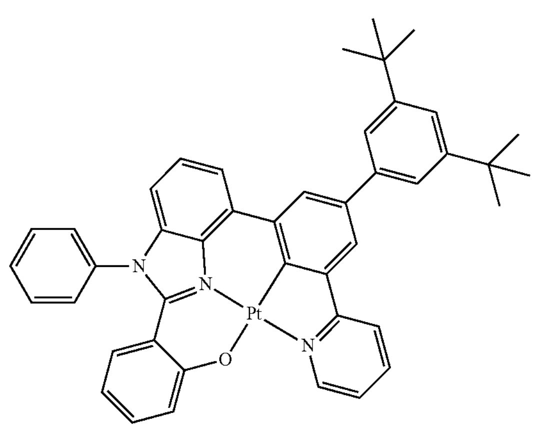

3-27
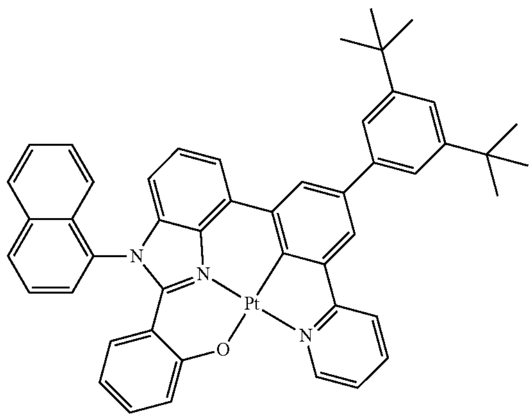
3-28
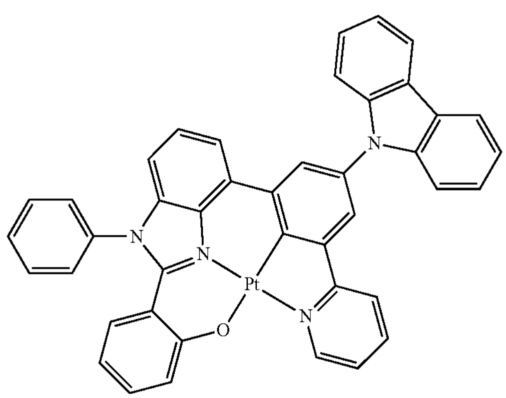
3-29
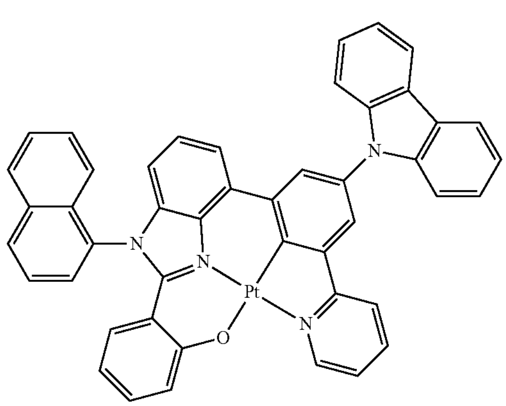
3-30
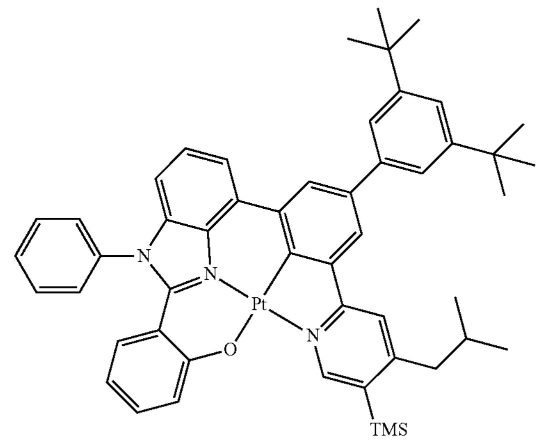
3-31
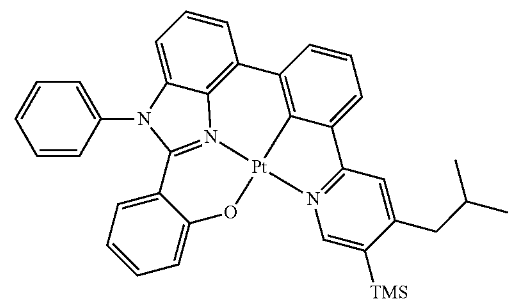
3-32
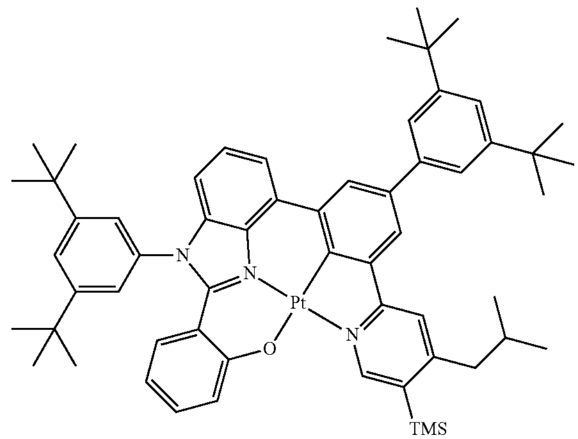
3-33
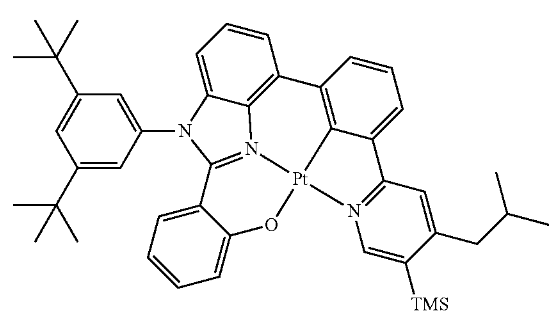

-continued
3-34
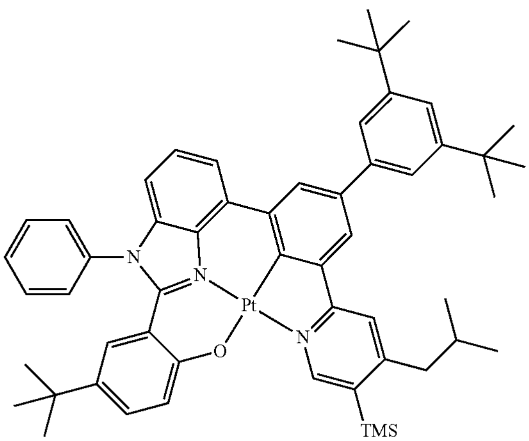
3-35
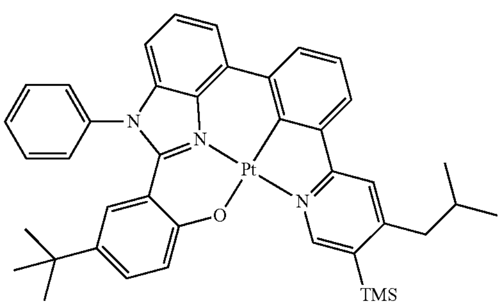
3-36
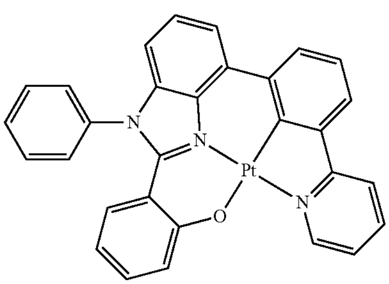
3-37
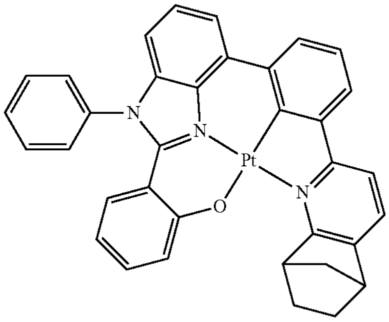
-continued
3-38
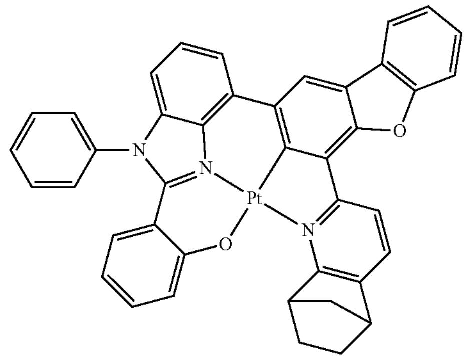
3-39
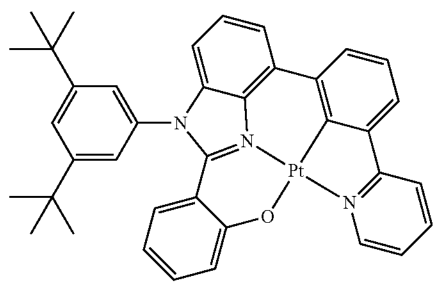
3-40
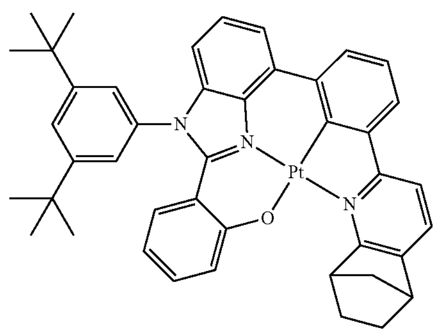
3-41
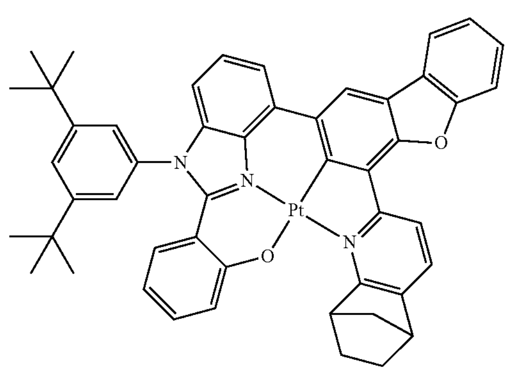

-continued
3-42
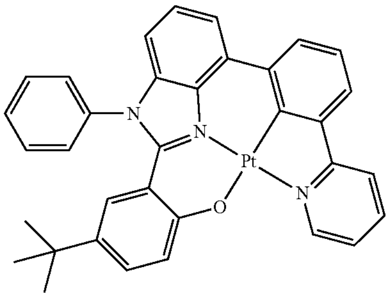
3-43
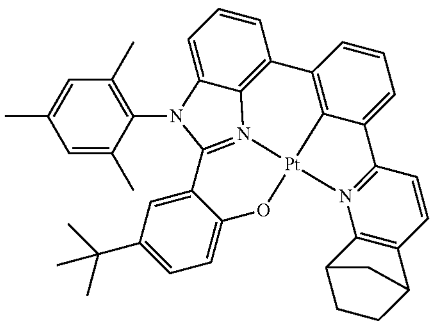
3-44
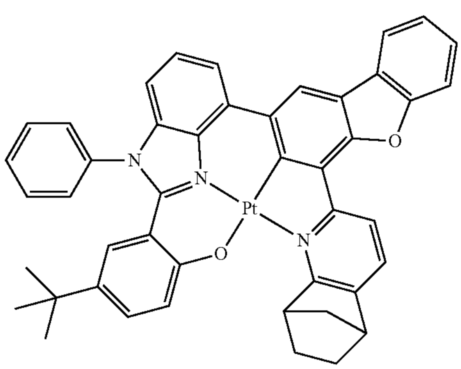
3-45
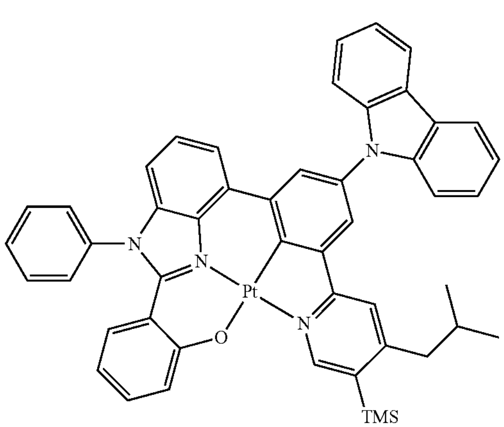
-continued
3-46
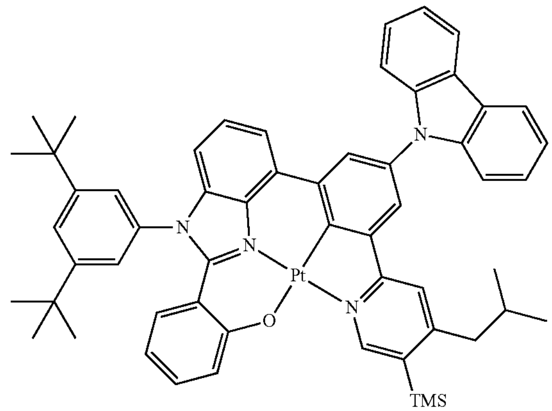
3-47
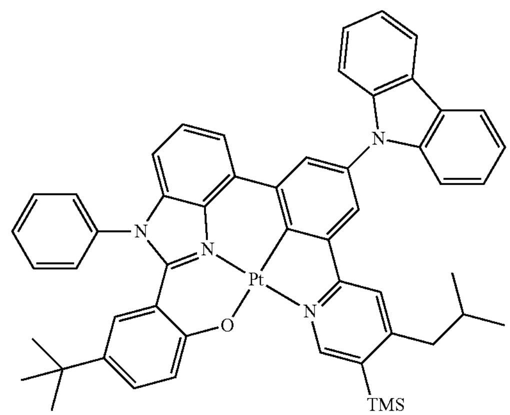
3-48
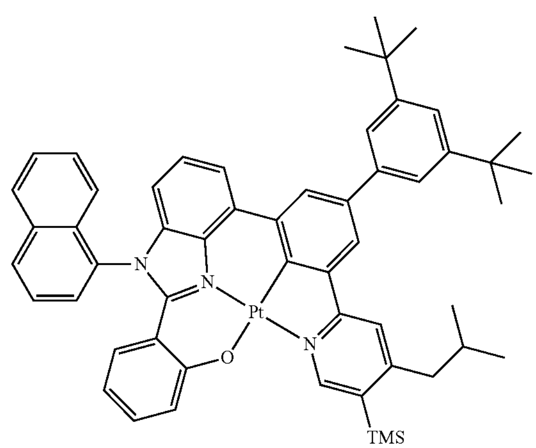
3-49
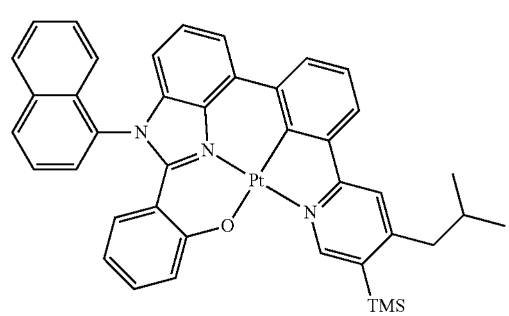

-continued
3-50
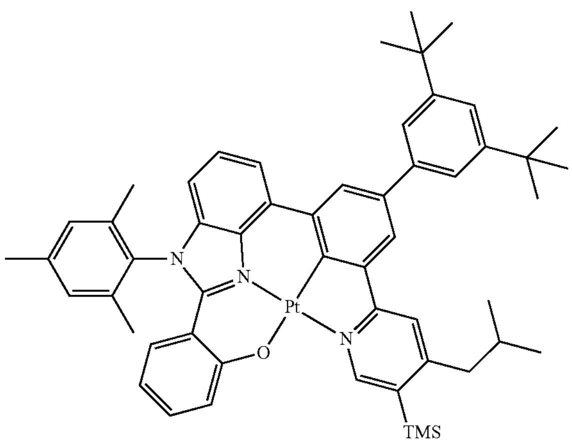
3-51
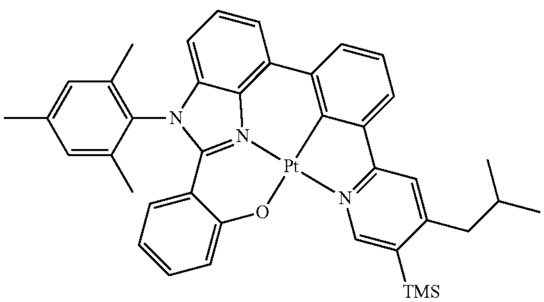
3-52
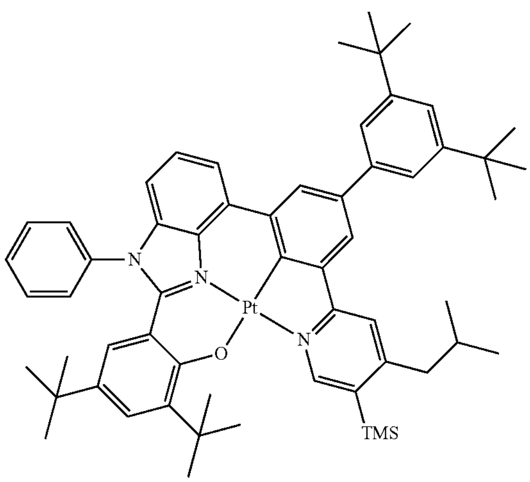
3-53
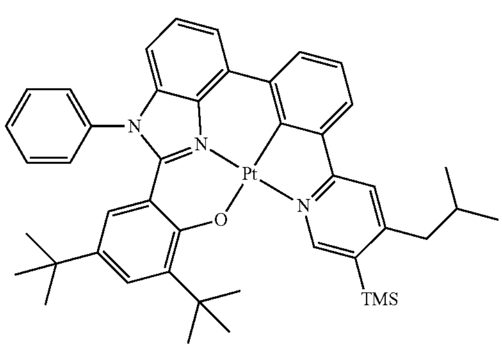
-continued
3-54
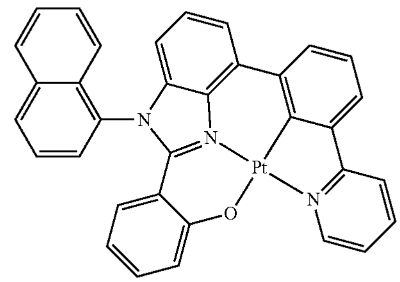
3-55
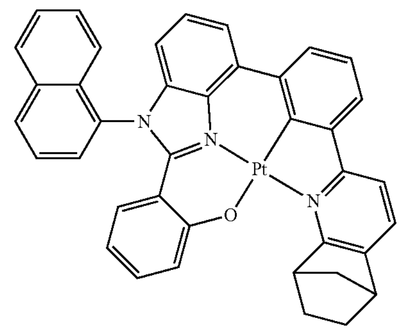
3-56
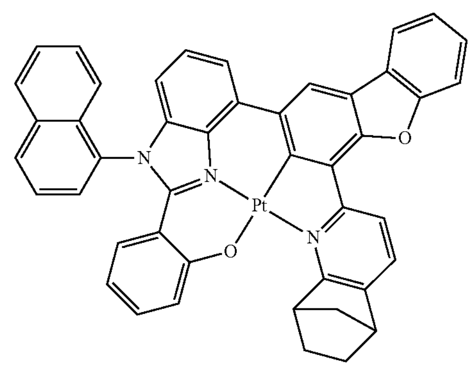
3-57
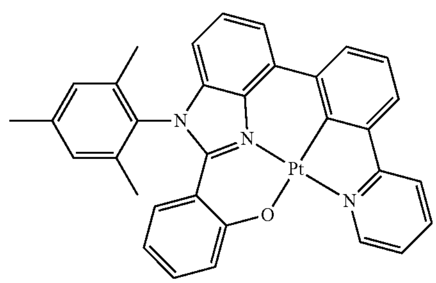
3-58
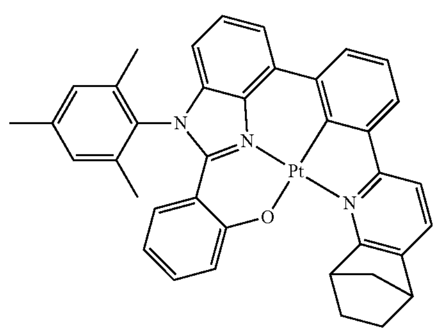

-continued
3-59
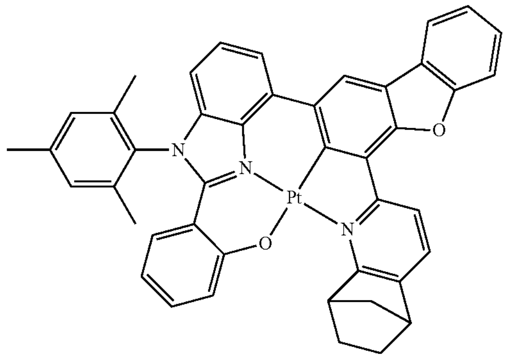
3-60
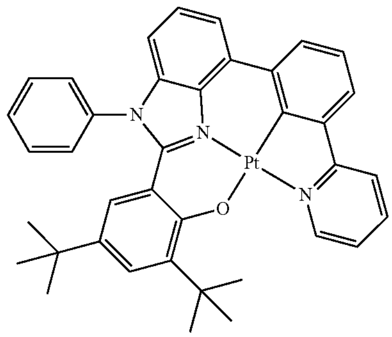
3-61
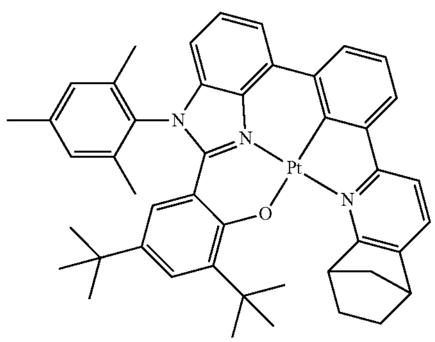
3-62
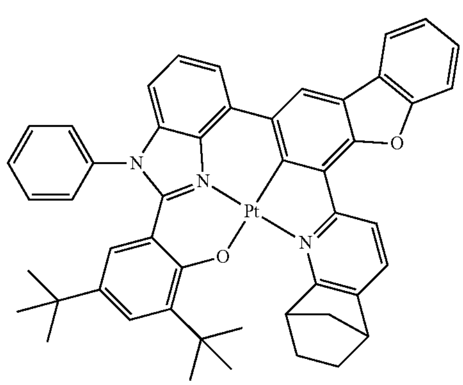
-continued
3-63
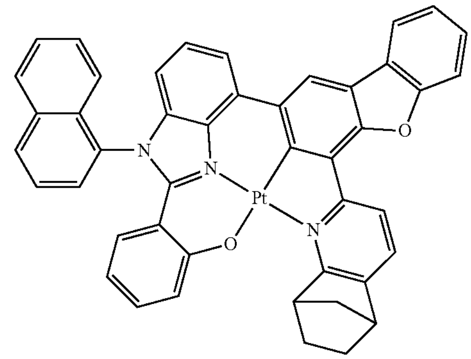
3-64
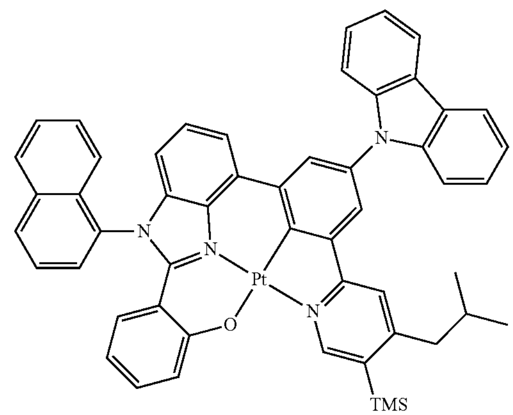
3-65
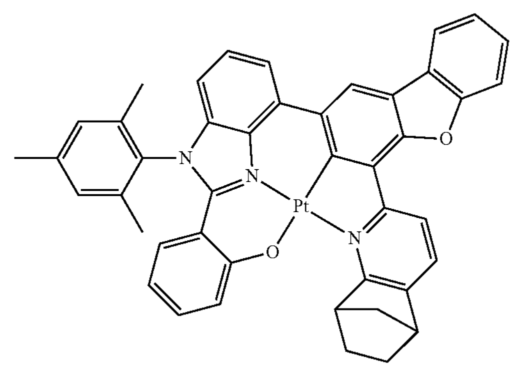
3-66
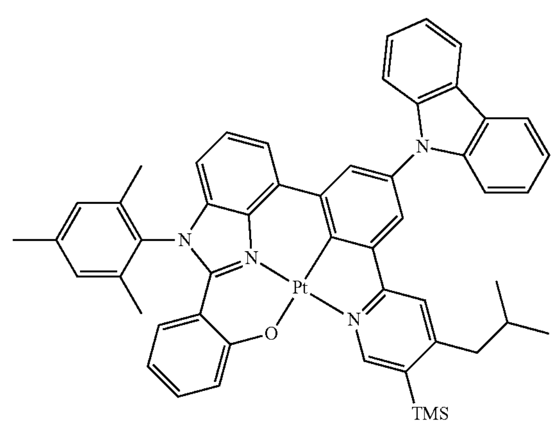

-continued
3-67
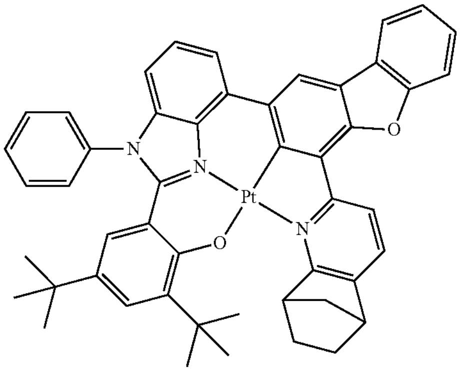
3-68
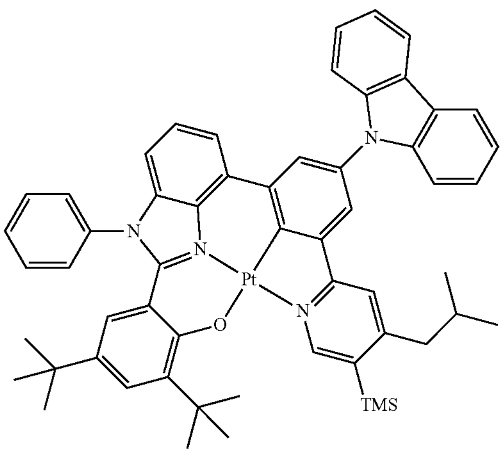
3-69
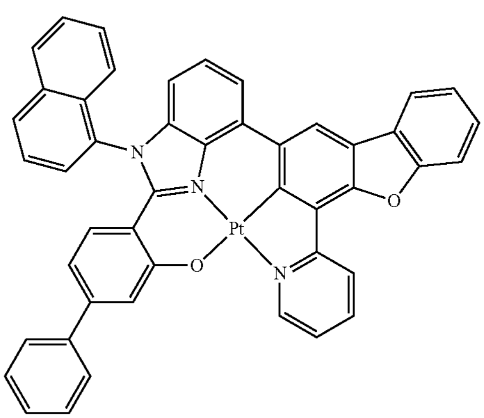
-continued
3-70
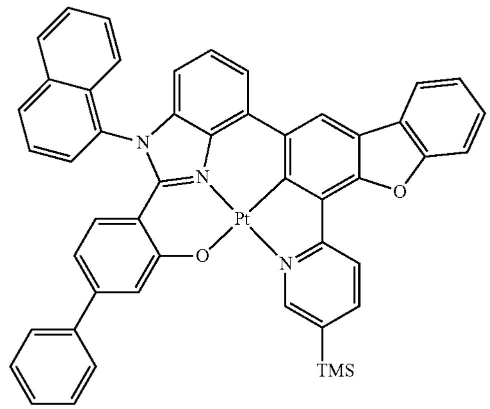
3-71
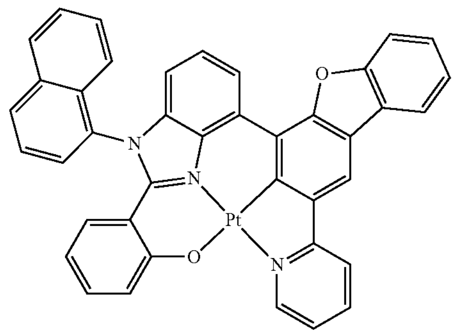
3-72
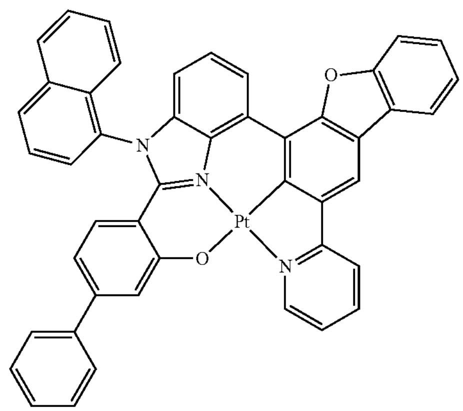
3-73
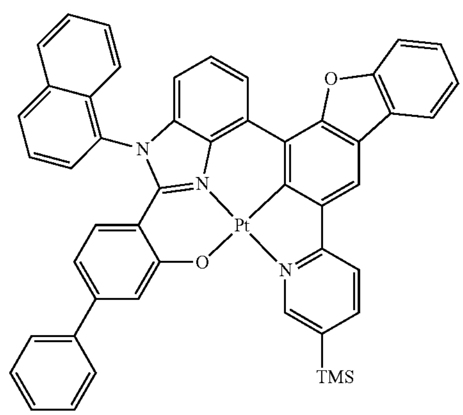

-continued
3-74
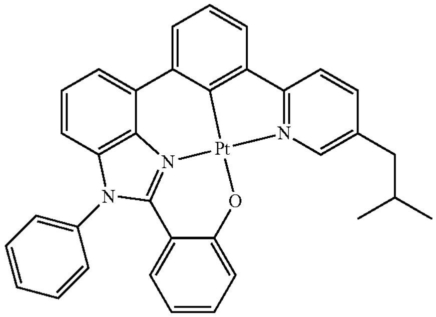
3-75
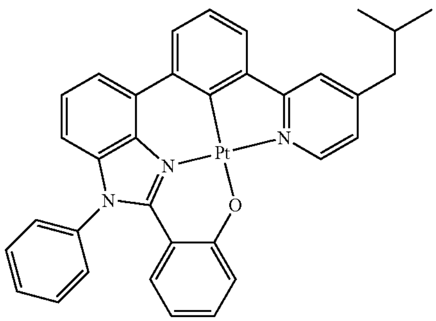
3-76
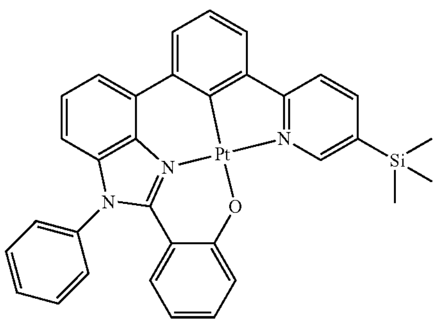
3-77
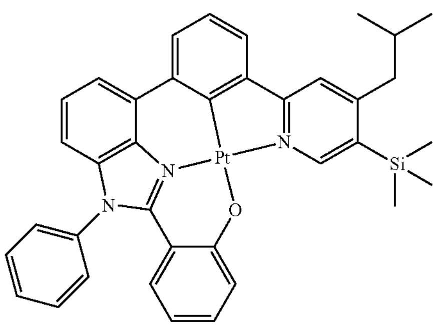
3-78
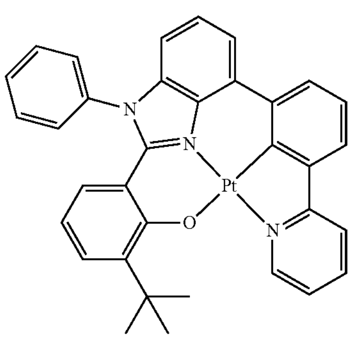
-continued
3-79
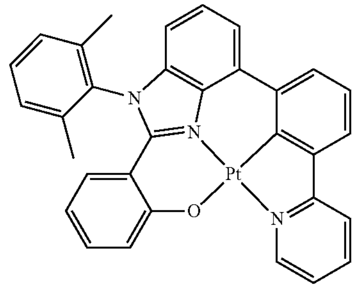
3-80
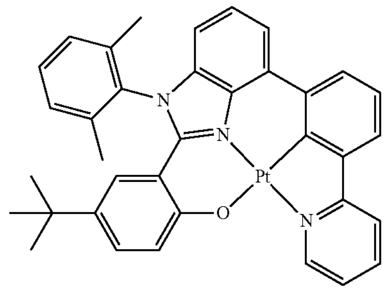
3-81
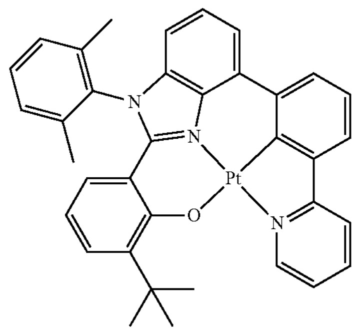
3-82
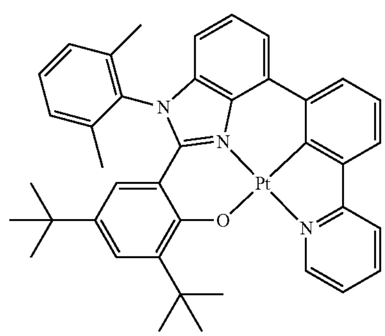
3-83
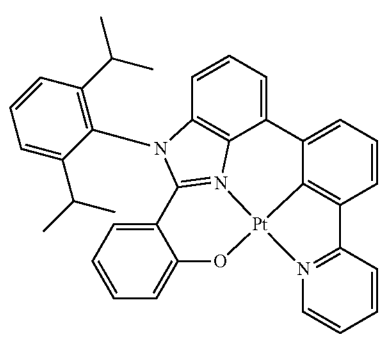

-continued
3-84
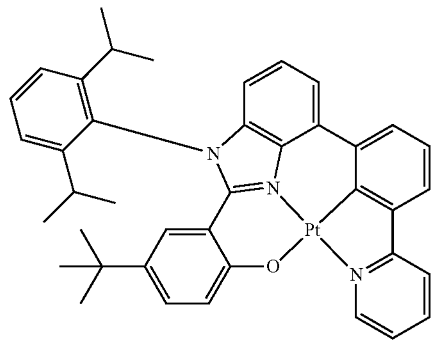
3-85
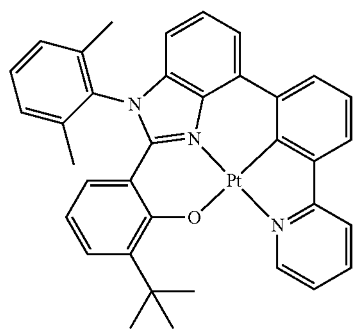
3-86
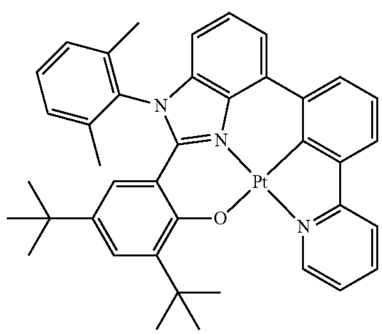
3-87
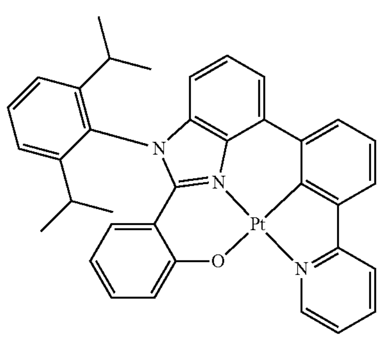
-continued
3-88
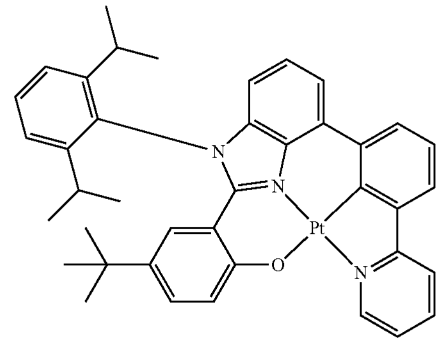
3-89
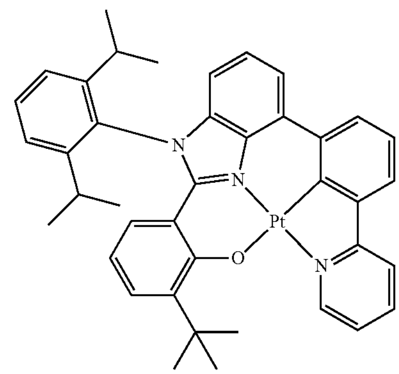
3-90
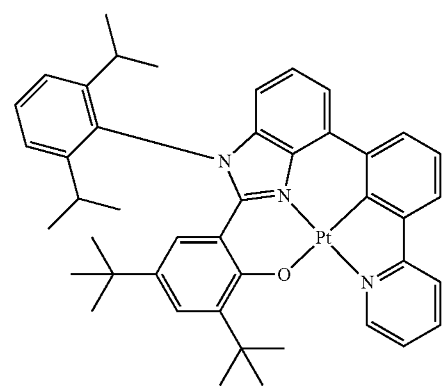
3-91
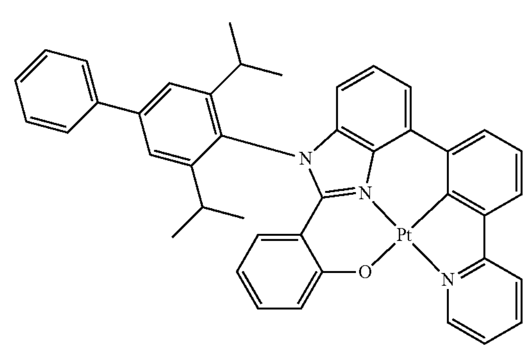

3-92
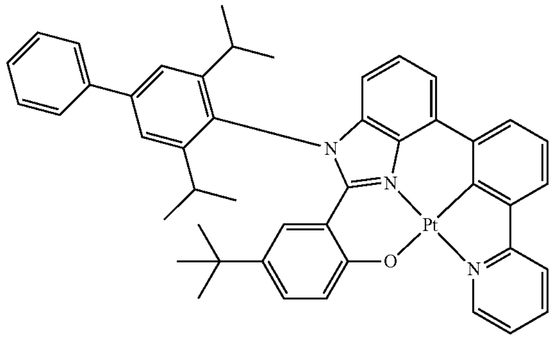
3-93
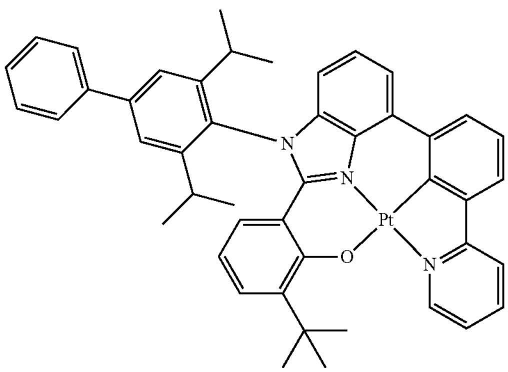
3-94
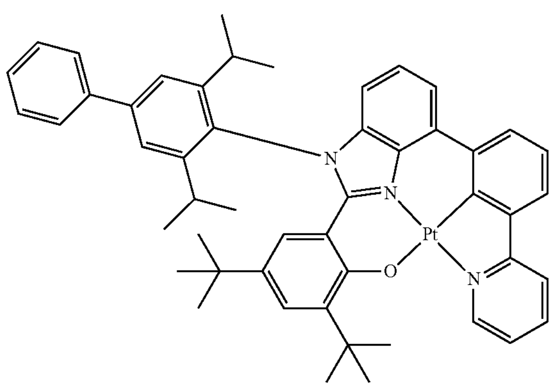
3-95
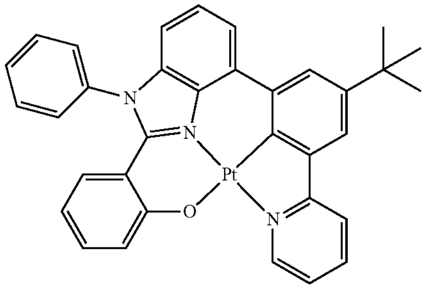
3-96
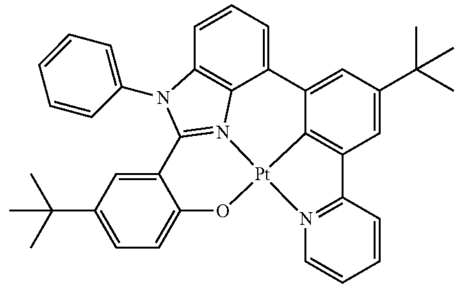
3-97
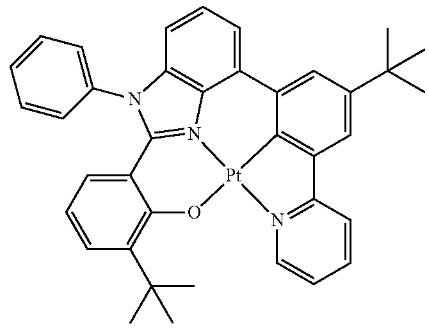
3-98
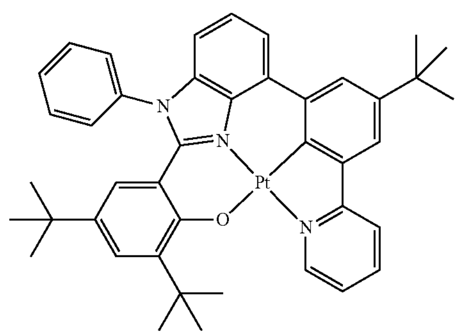
3-99
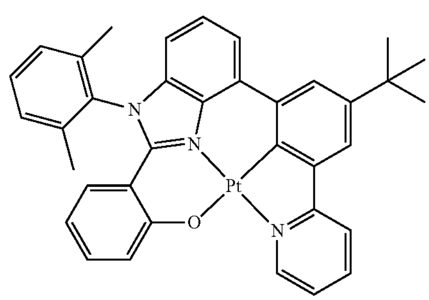
3-100
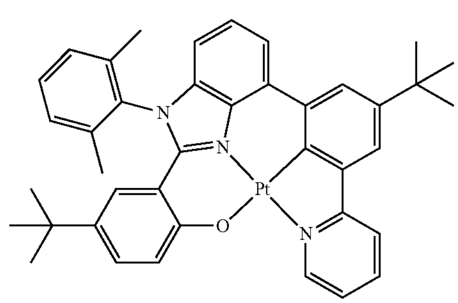

-continued
3-101
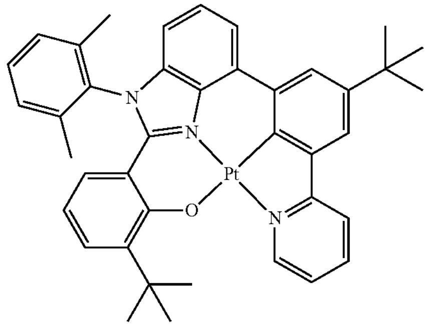
3-102
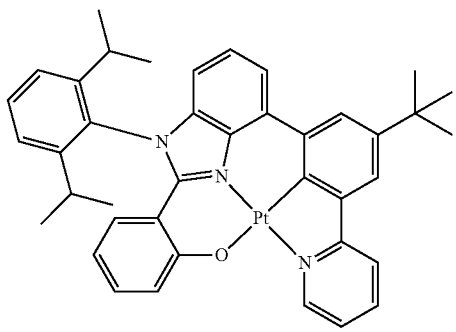
3-103
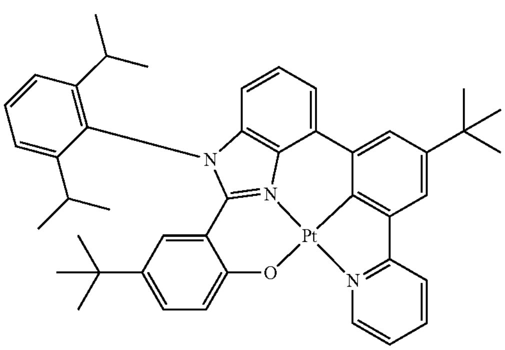
3-104
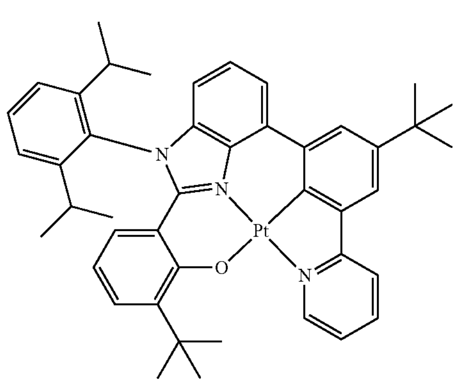
-continued
3-105
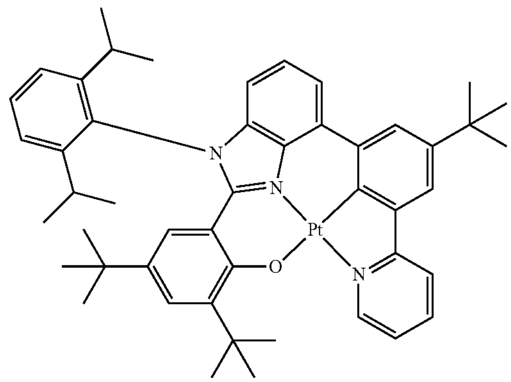
3-106
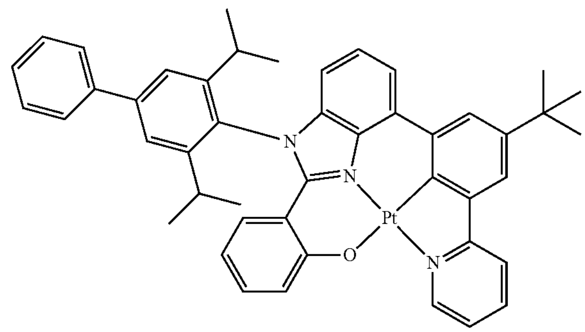
3-107
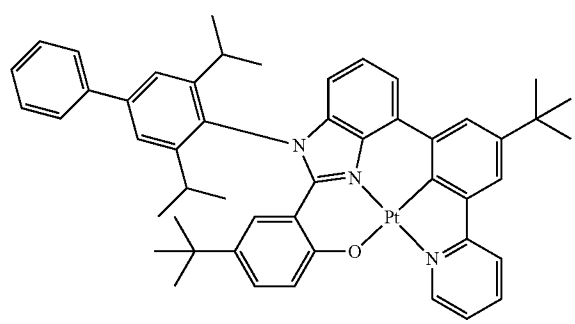
3-108
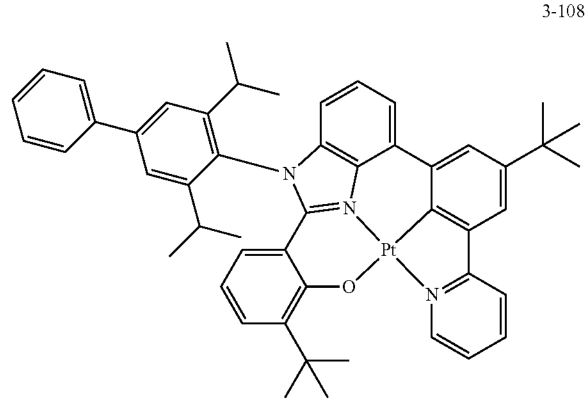

-continued
3-109
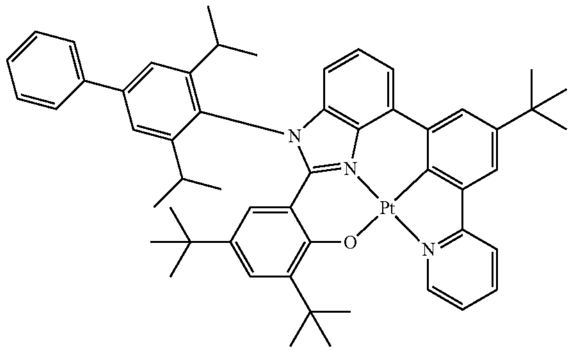
3-110
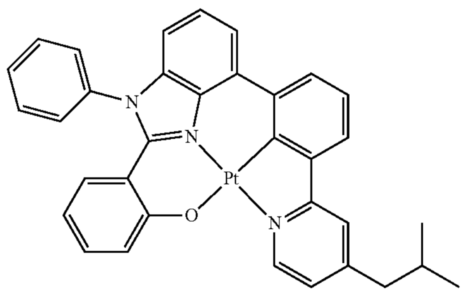
3-111
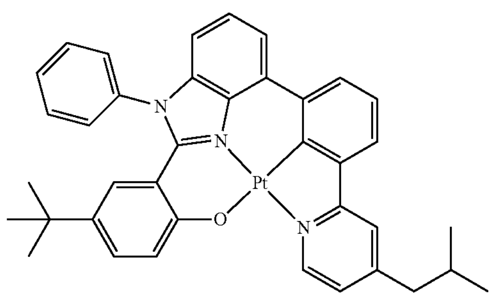
3-112
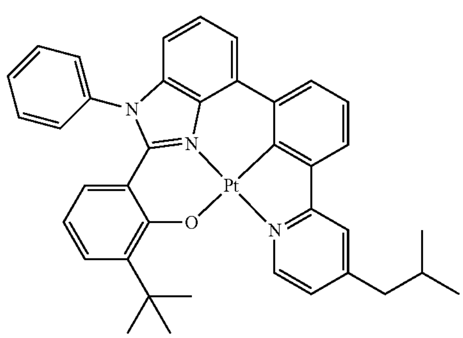
-continued
3-113
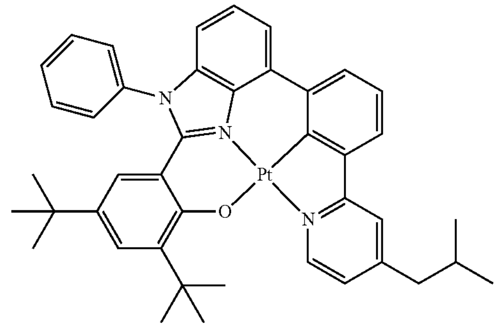
3-114
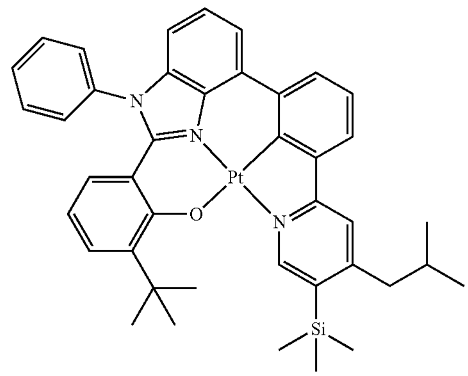
3-115
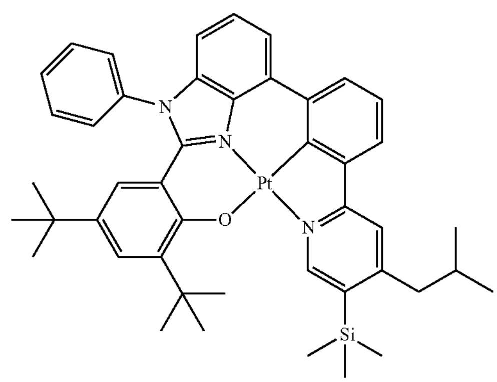
3-116
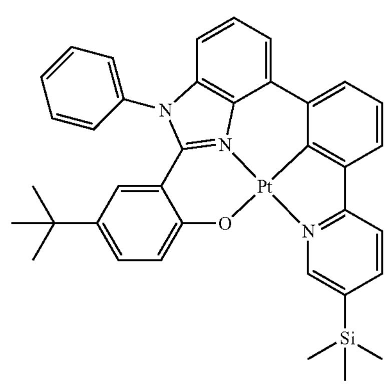

-continued
3-117
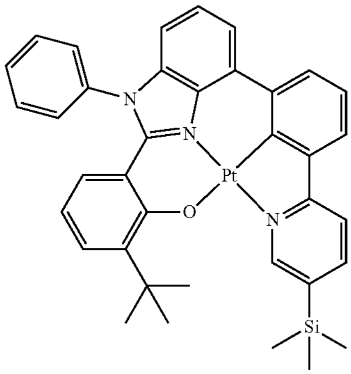
3-118
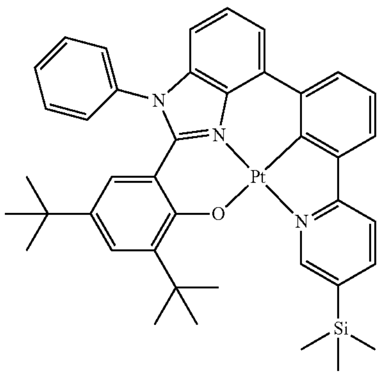
3-119
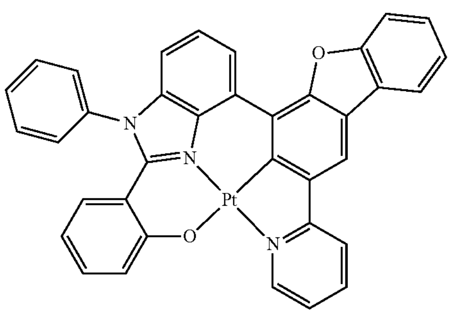
3-120
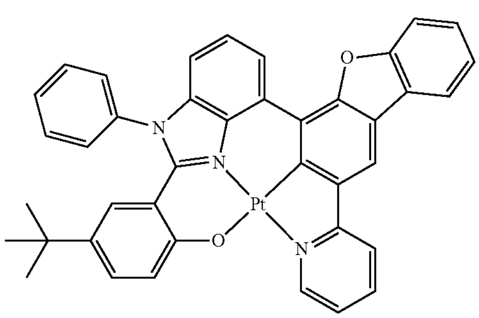
-continued
3-121
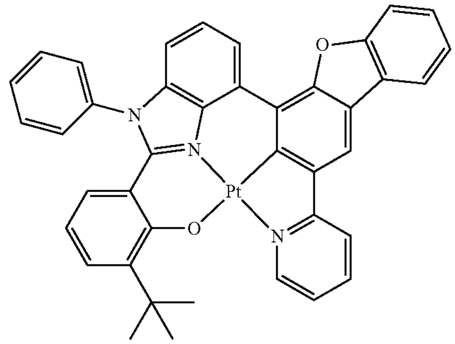
3-122
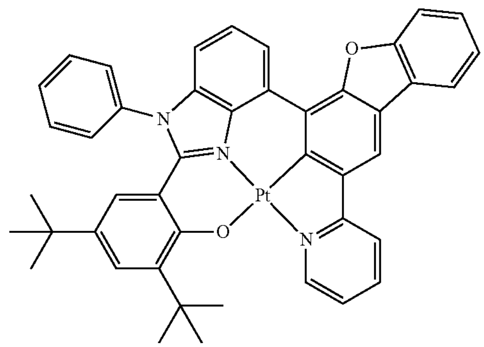
3-123
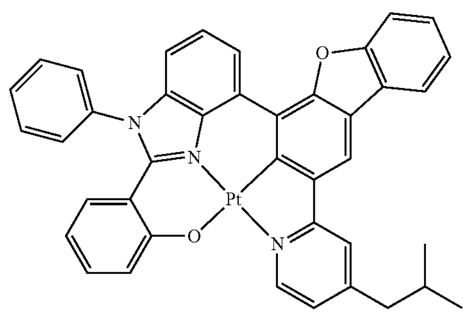
3-124
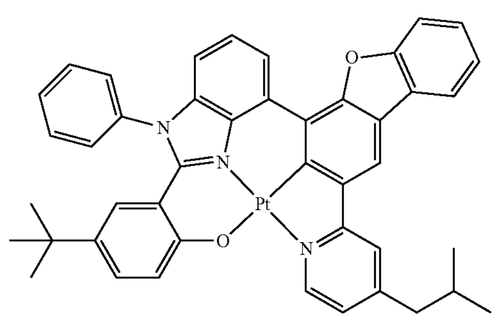

-continued
3-125
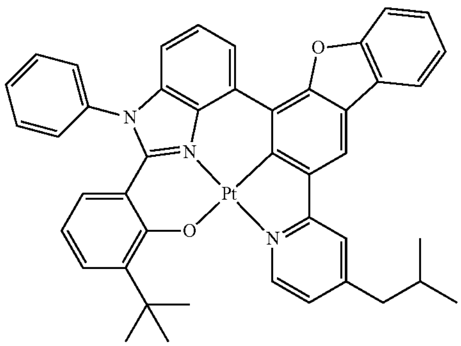
3-126
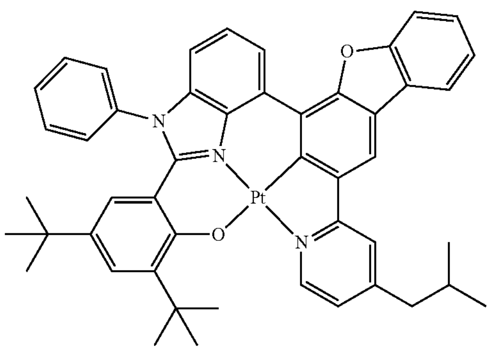
3-127
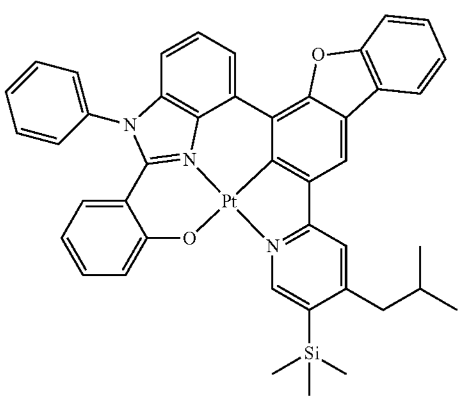
3-128
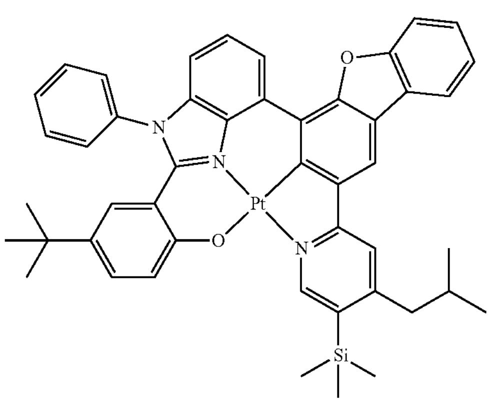
-continued
3-129
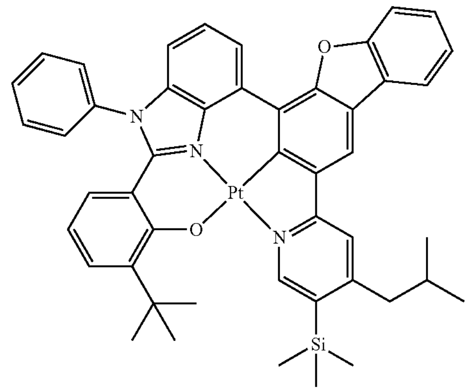
3-130
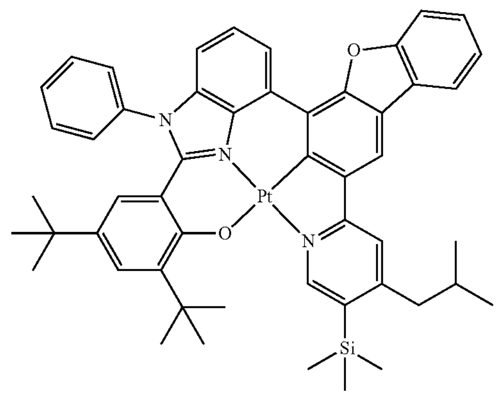
3-131
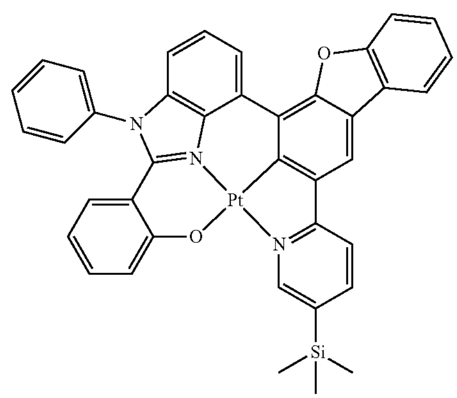
3-132
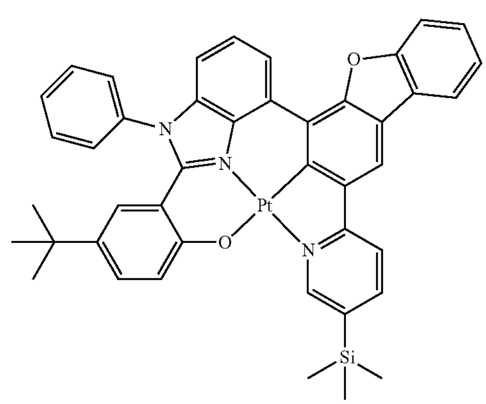

-continued
3-133
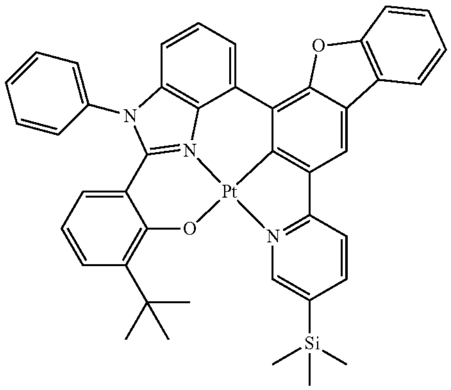
3-134
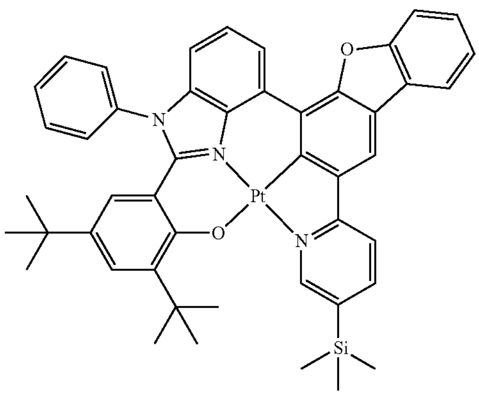
3-135
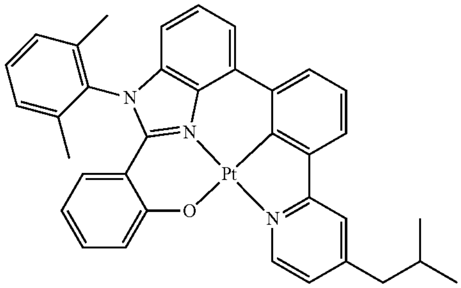
3-136
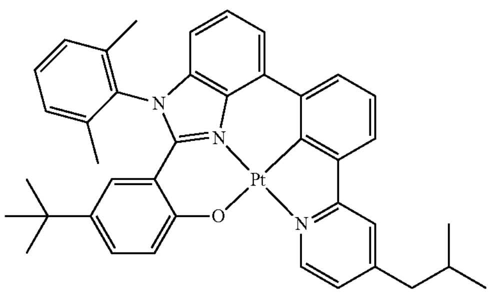
-continued
3-137
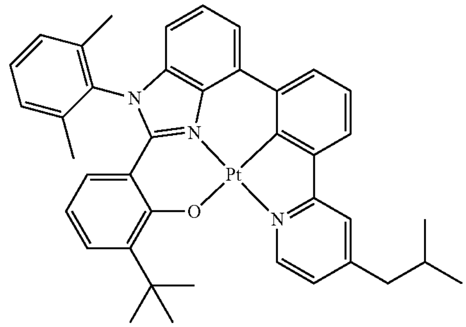
3-138
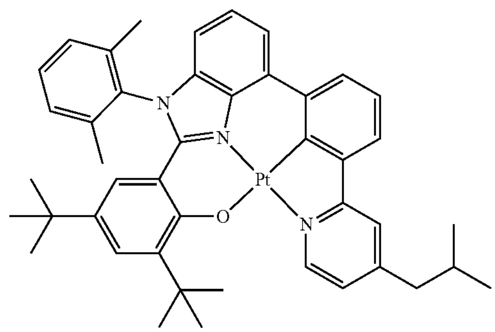
3-139
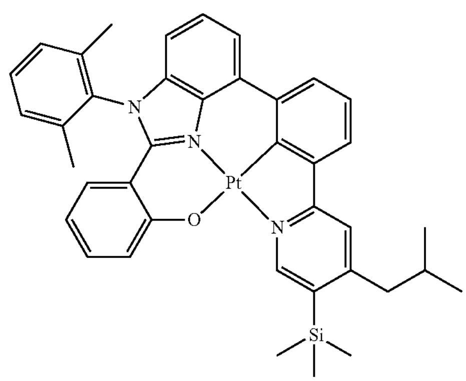
3-140
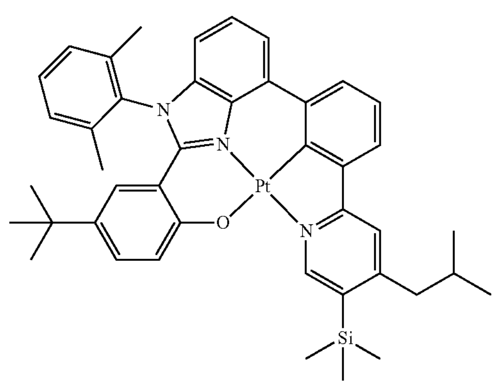

-continued
3-141
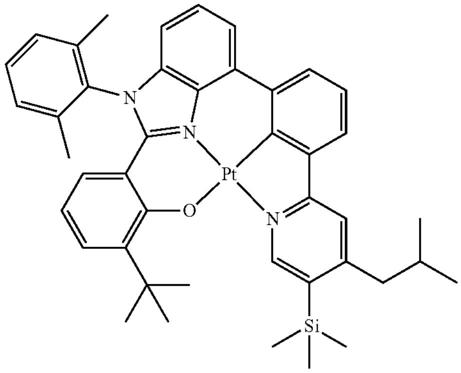
3-142
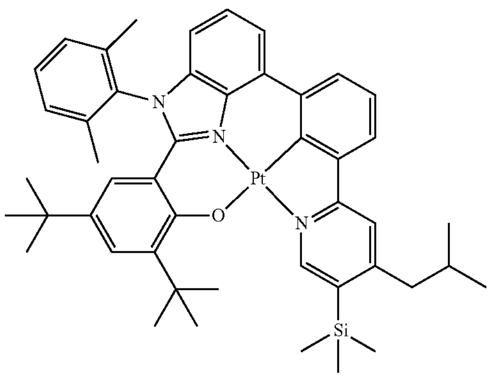
3-143
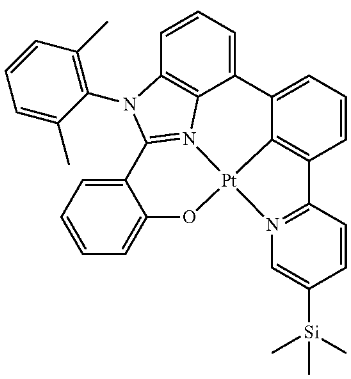
3-144
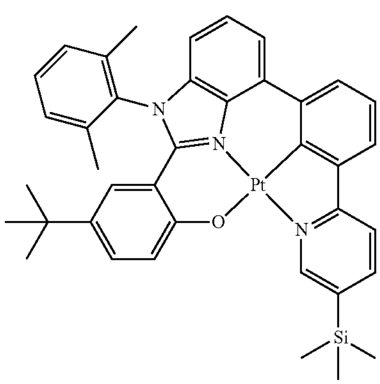
-continued
3-145
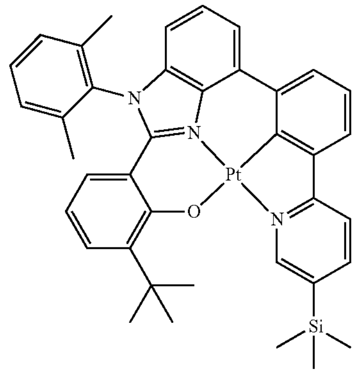
3-146
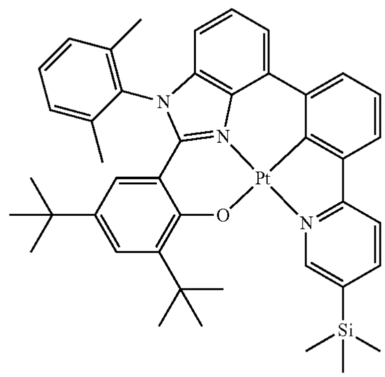
3-147
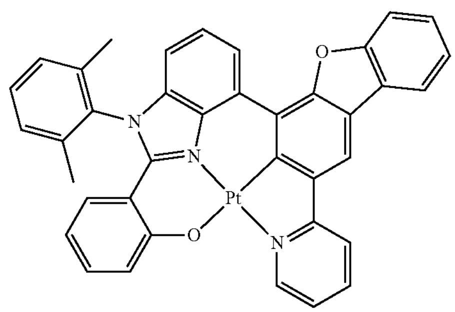
3-148
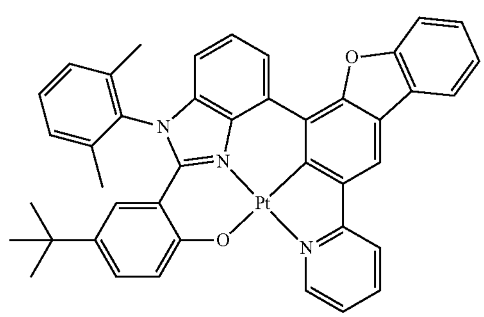

3-149
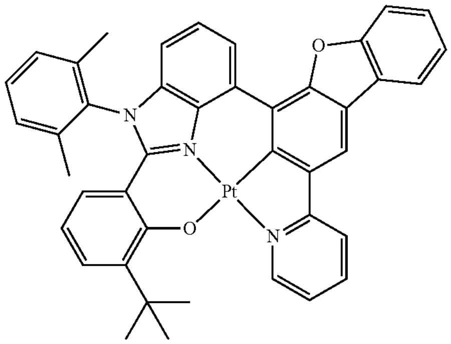
3-150
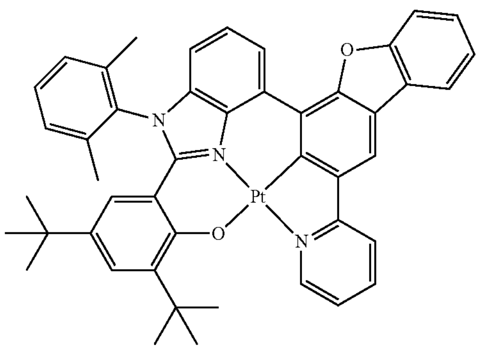
3-151
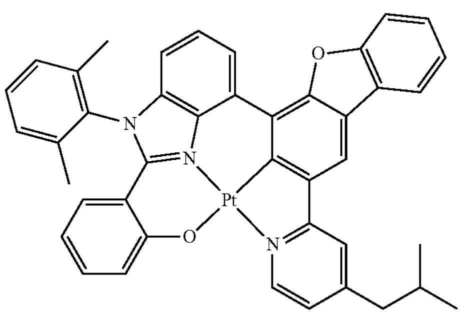
3-152
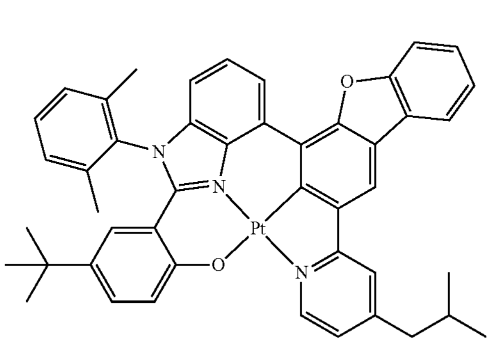
3-153
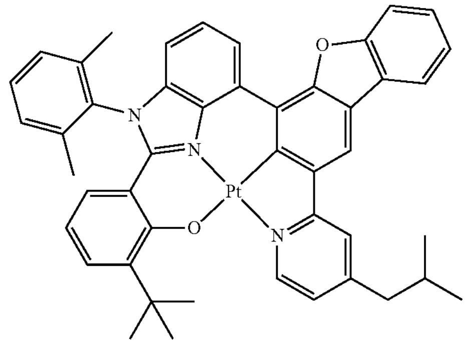
3-154
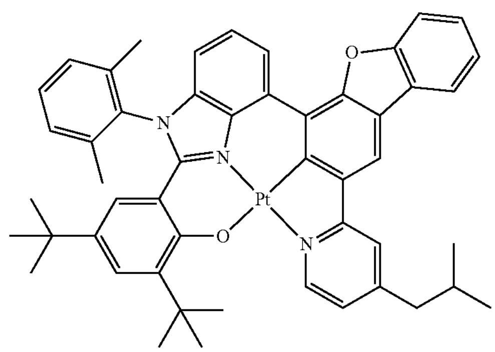
3-155
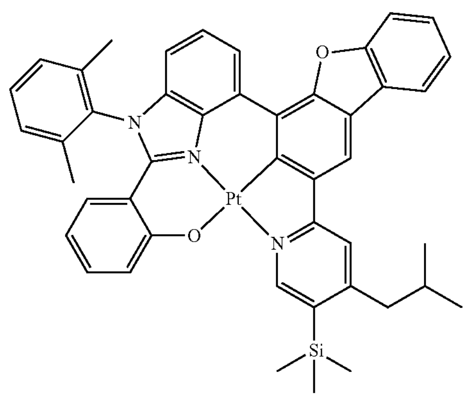
3-156
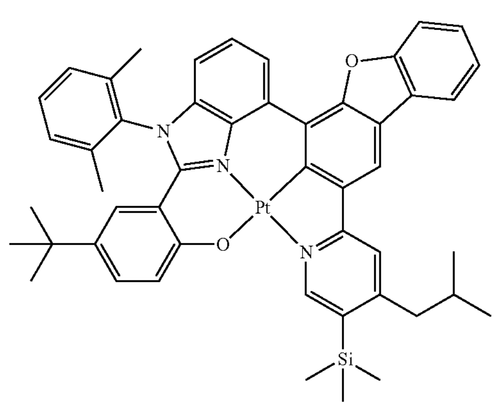

-continued
3-157
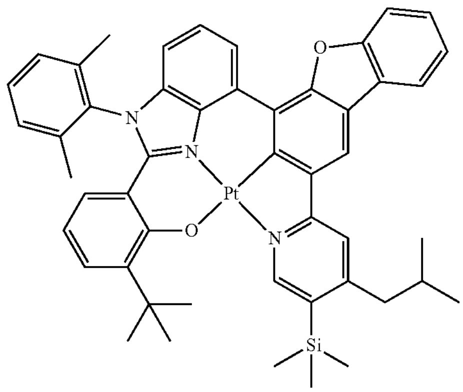
3-158
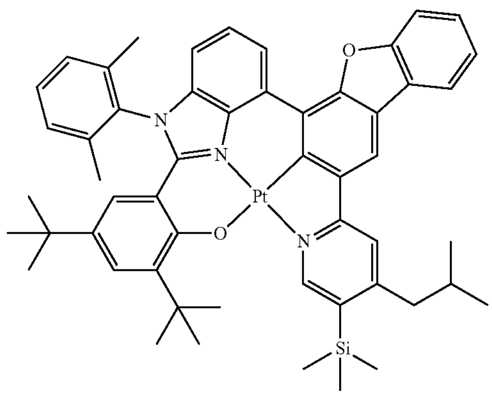
3-159
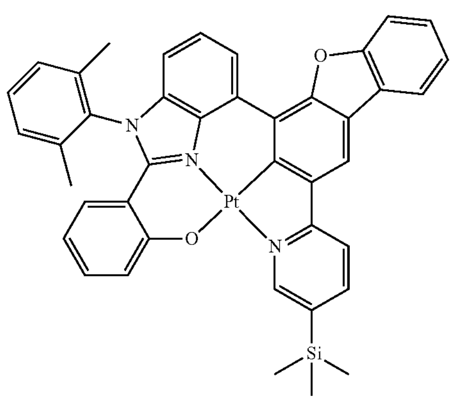
3-160
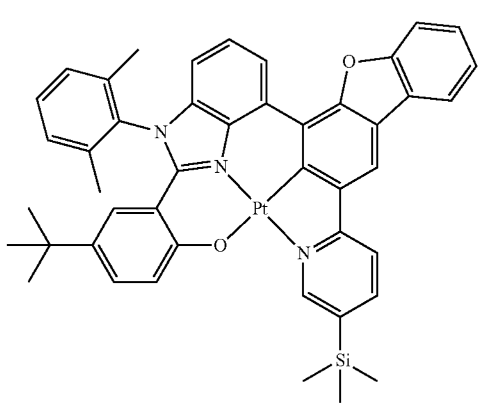
-continued
3-161
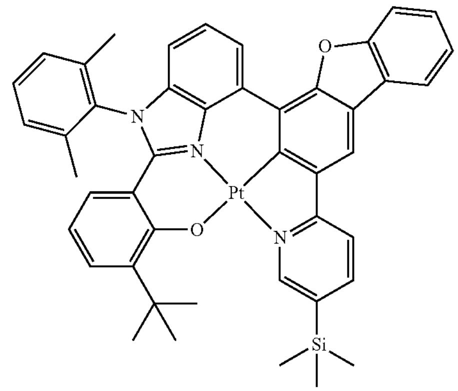
3-162
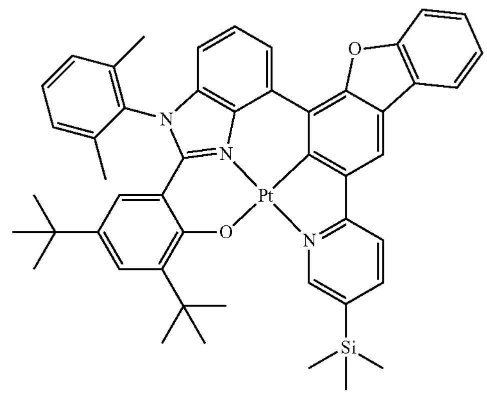
3-163
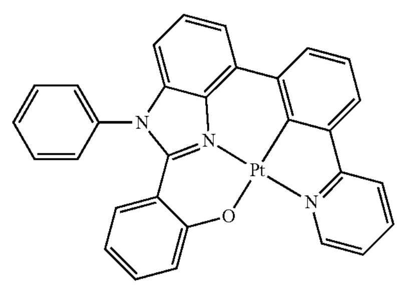
3-164
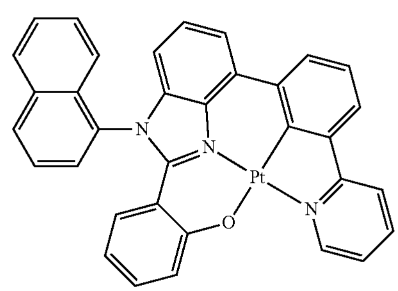

-continued
3-165
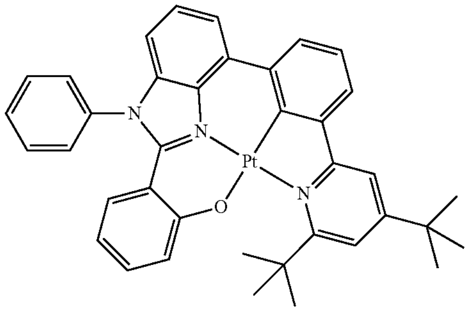
3-166
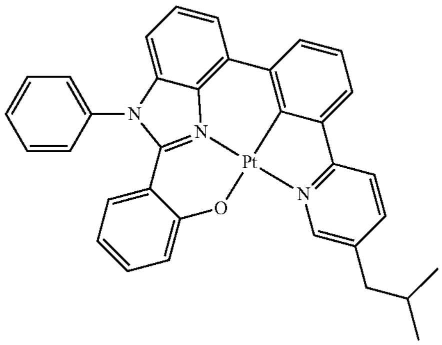
3-167
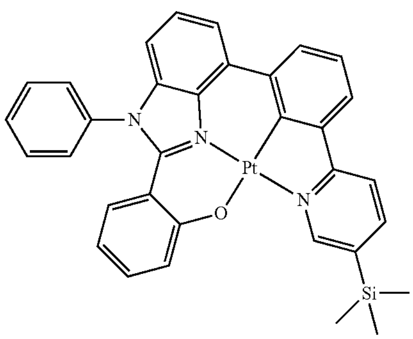
3-168
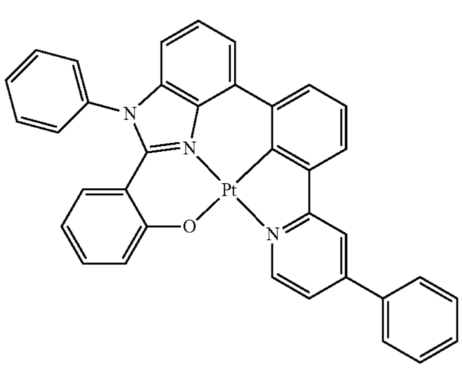
-continued
3-169
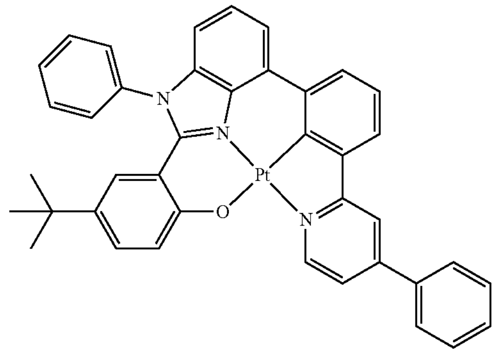
3-170
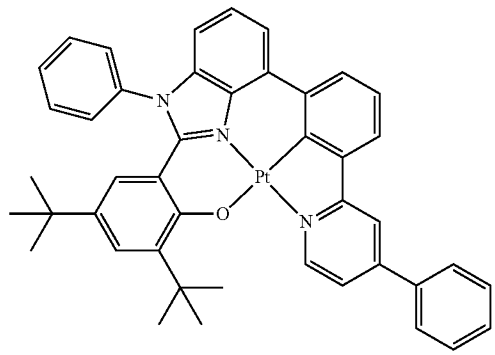
3-171
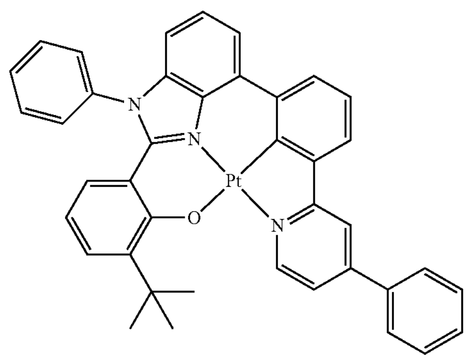
3-172
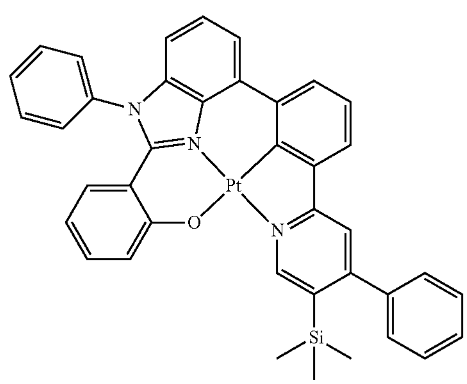

-continued
3-173
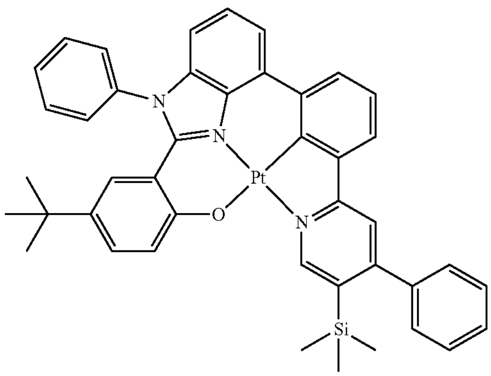
3-174
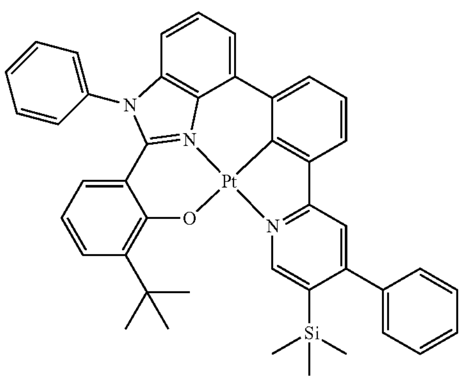
3-175
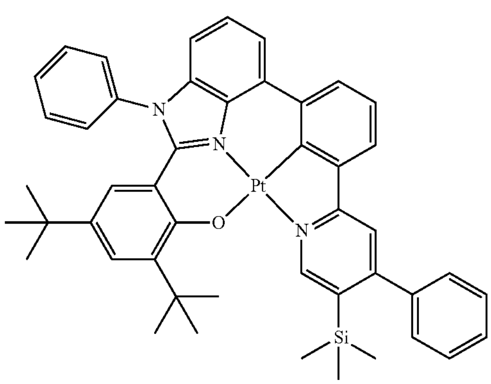
3-176
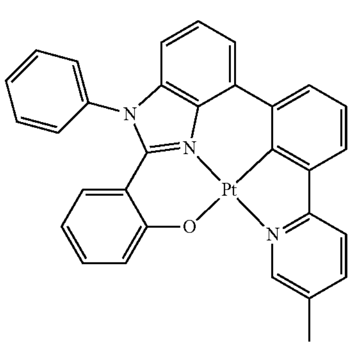
-continued
3-177
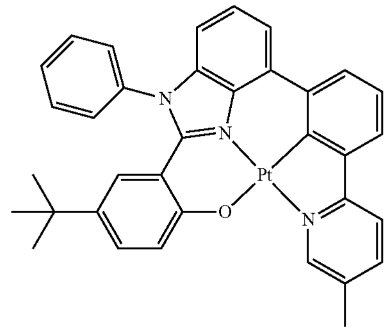
3-178
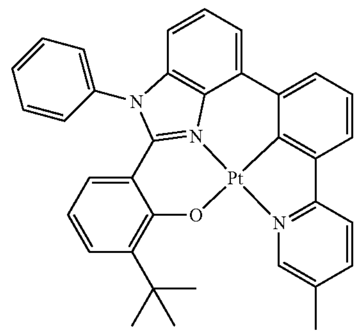
3-179
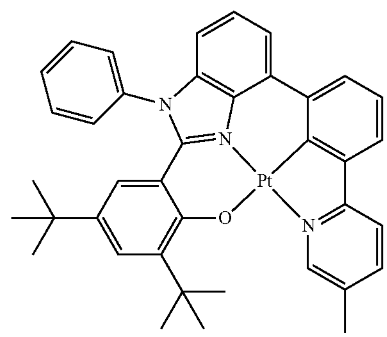
3-180
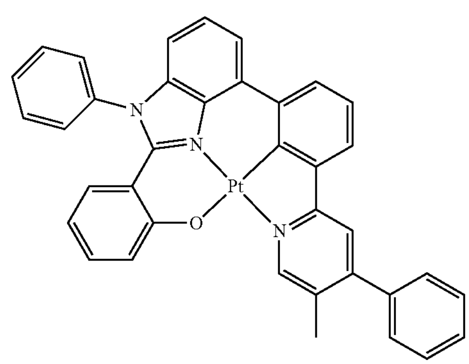

-continued
3-181
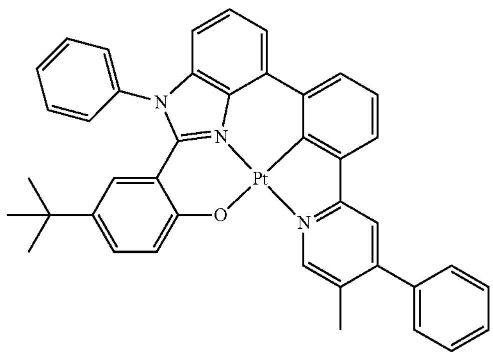
3-182
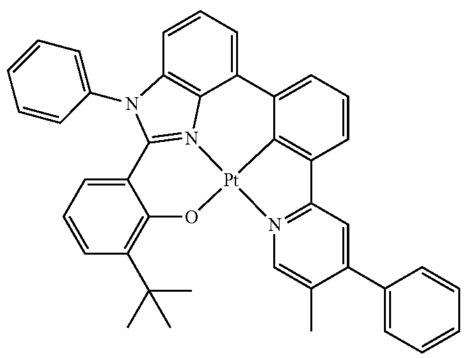
3-183
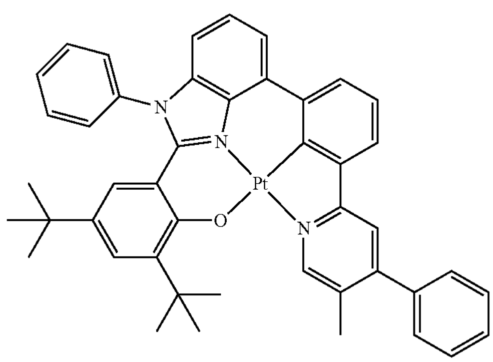
3-184
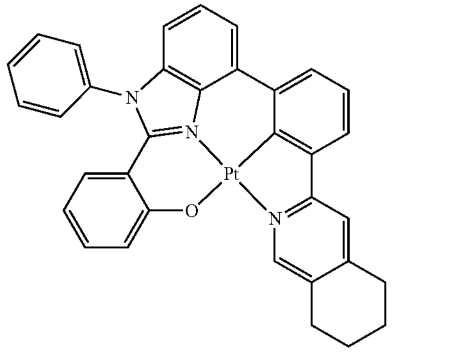
-continued
3-185
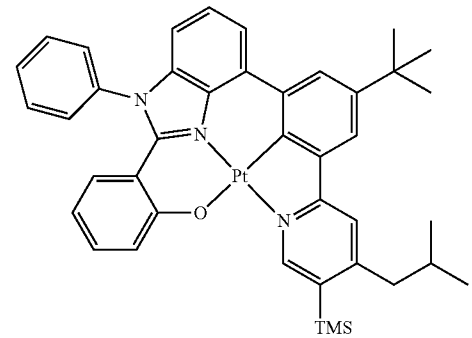
3-186
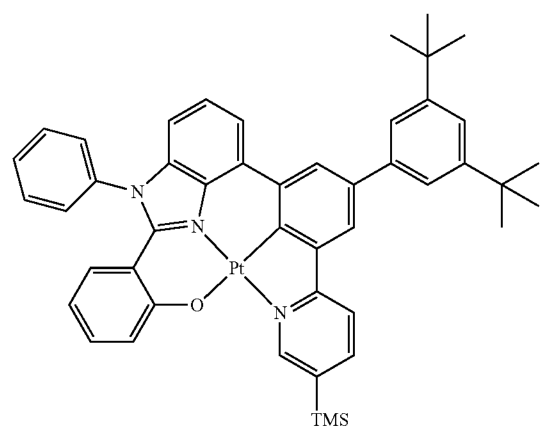
3-187
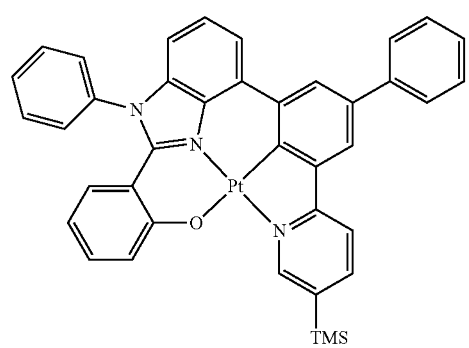
3-188
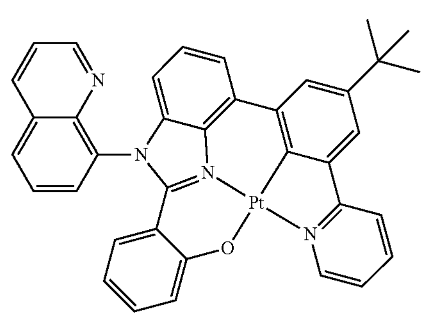

-continued
3-189
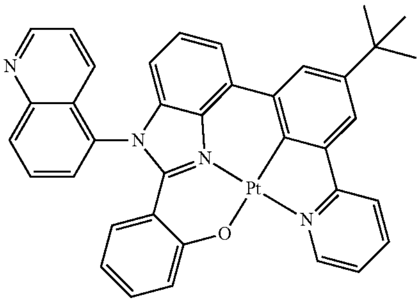
3-190
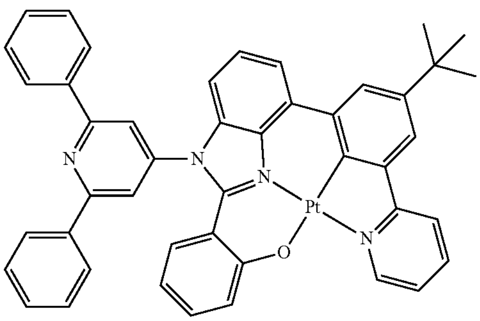
3-191
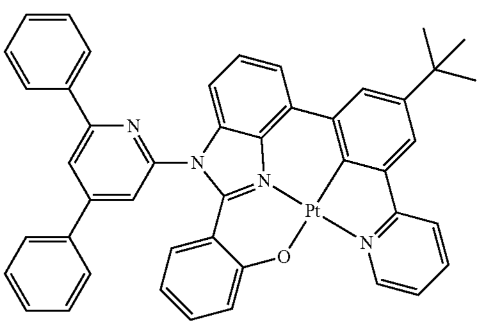
3-192
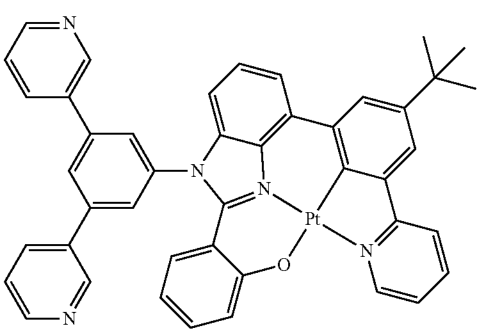
-continued
3-193
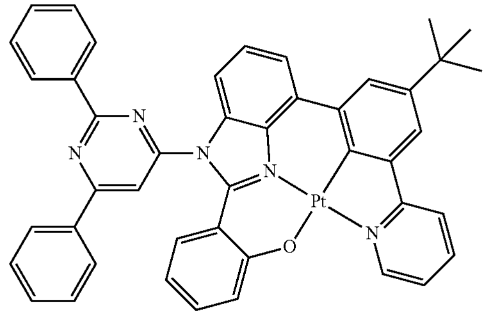
3-194
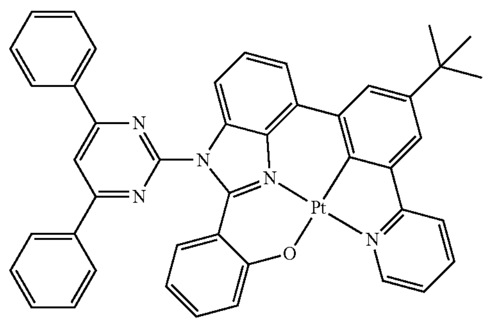
3-195
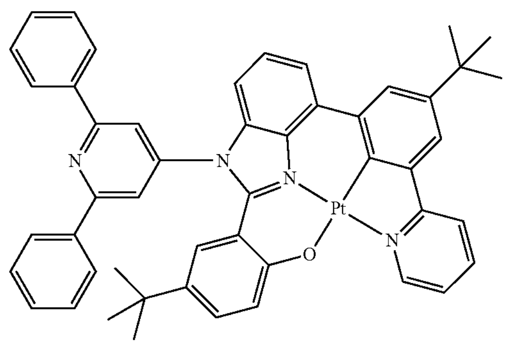
3-196
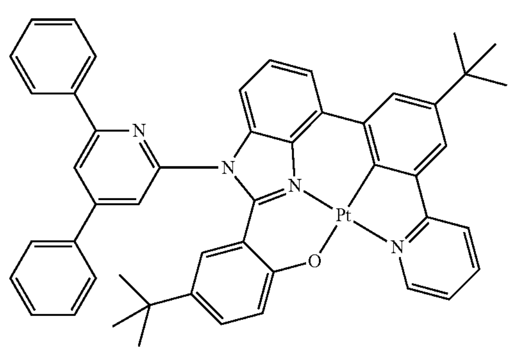

-continued
3-197
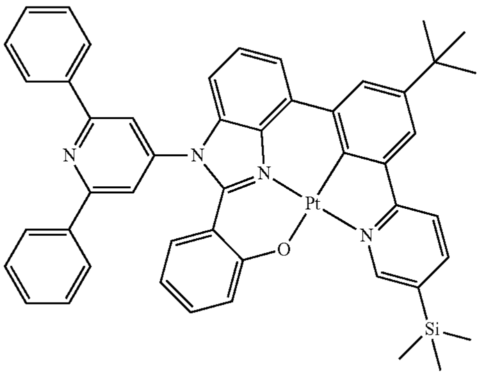
3-198
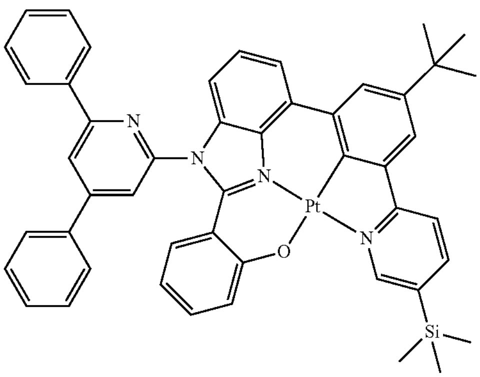
3-199
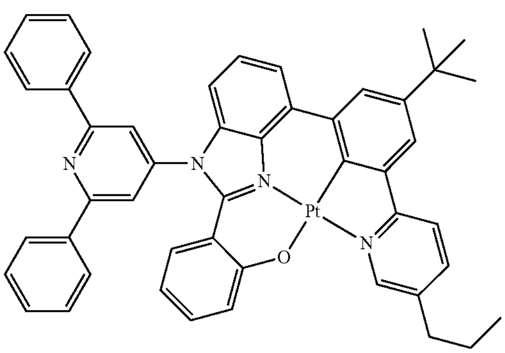
3-200
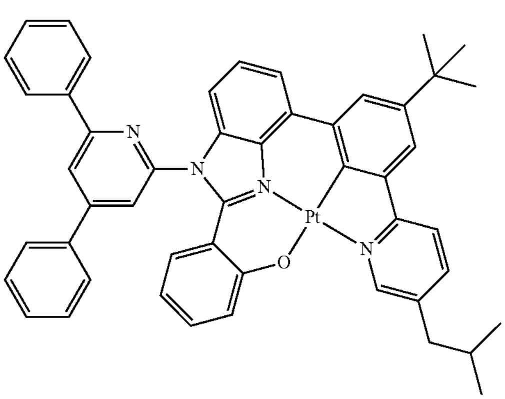
-continued
3-201
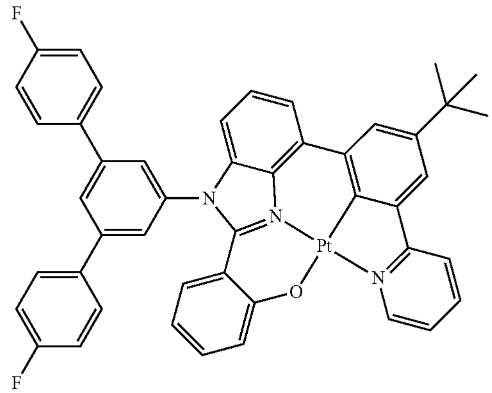
3-202
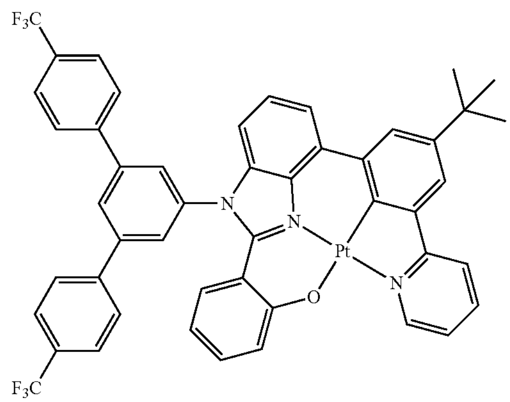
3-203
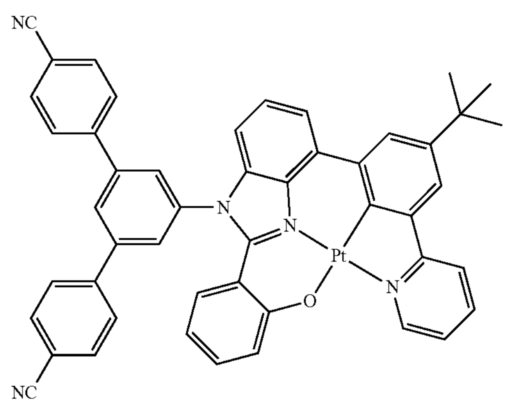
3-204
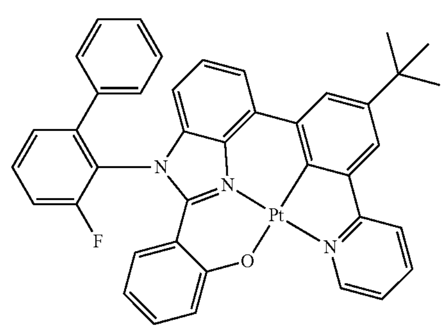

3-205
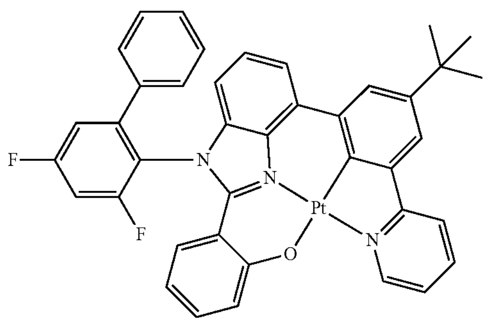
3-206
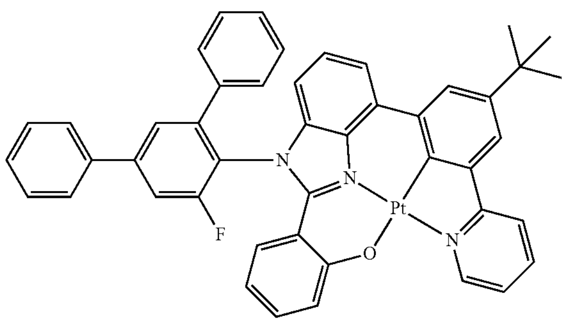
3-207
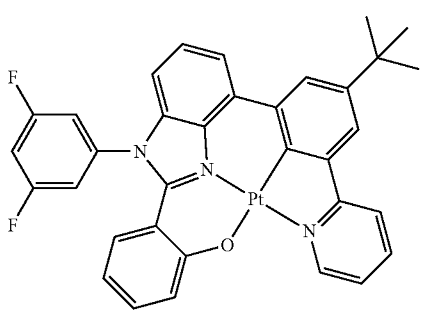
3-208
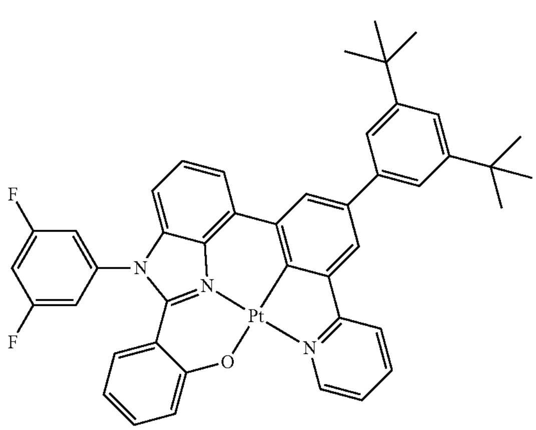
3-209
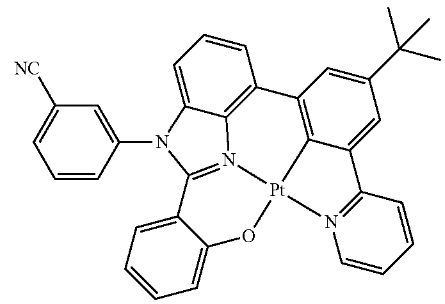
3-210
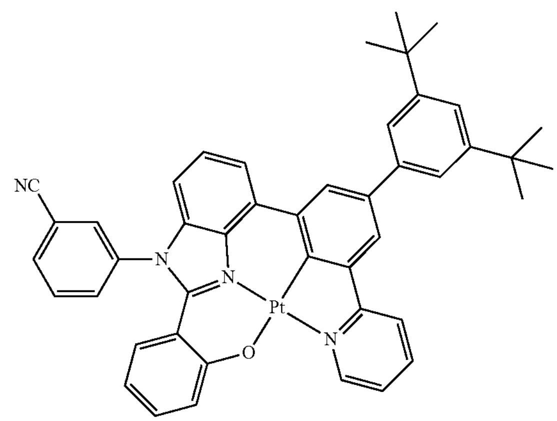
3-211
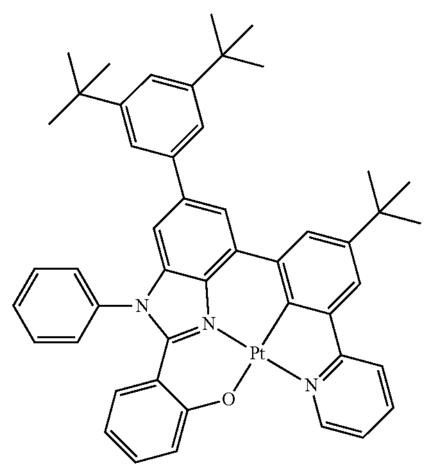
3-212
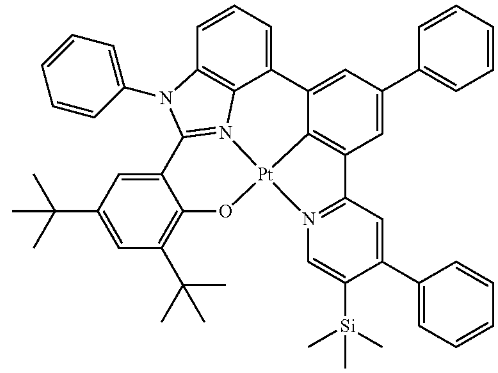

-continued
3-213
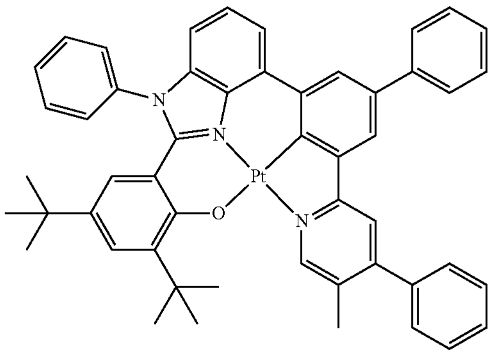
3-214
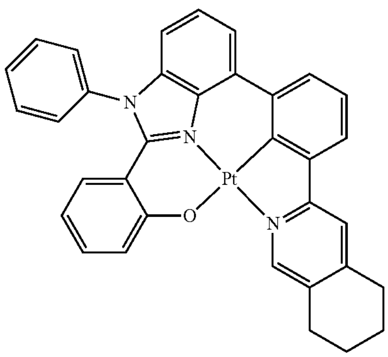
3-215
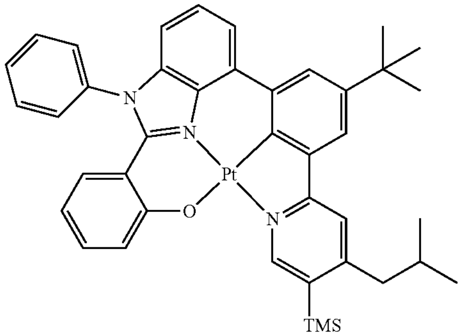
3-216
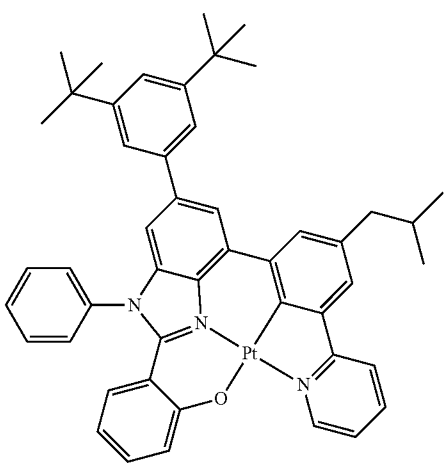
-continued
3-217
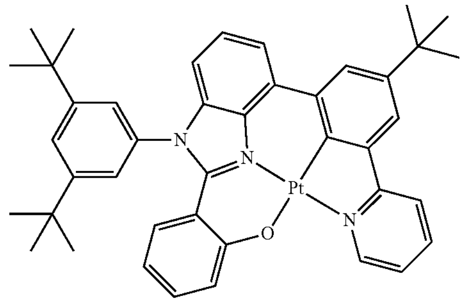
3-218
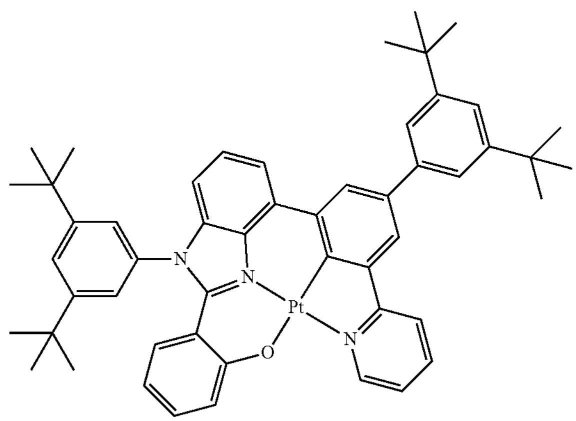
3-219
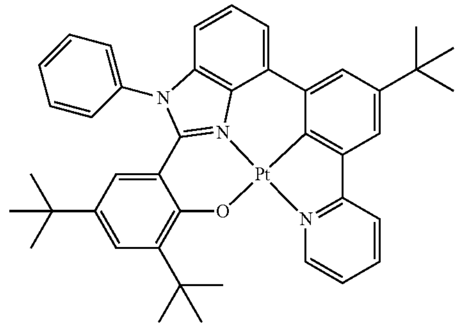
3-220
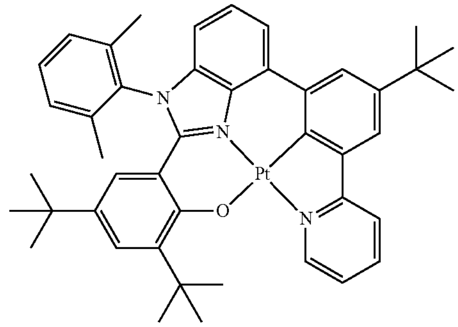

-continued
3-221
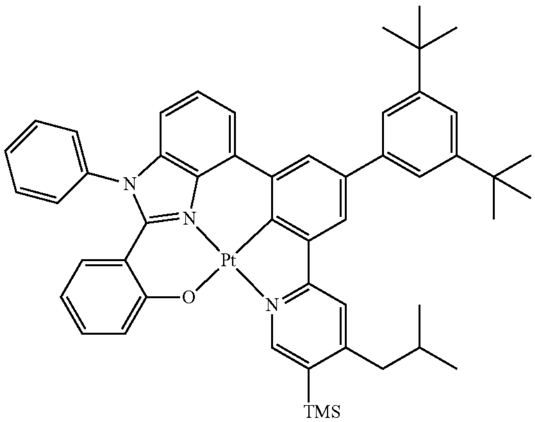
3-222
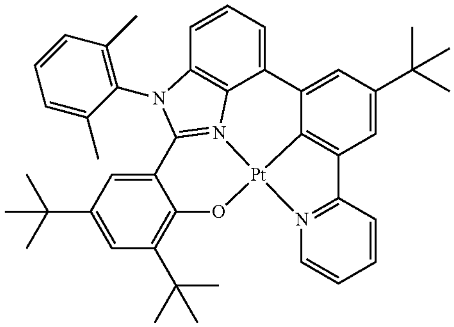
3-223
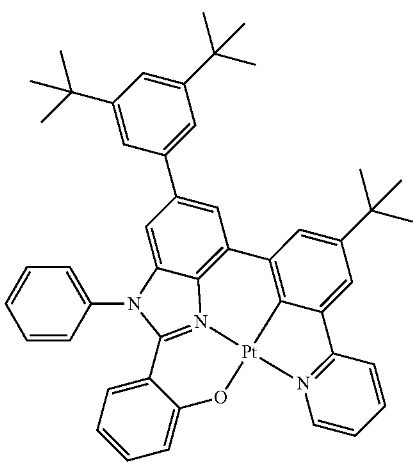
3-224
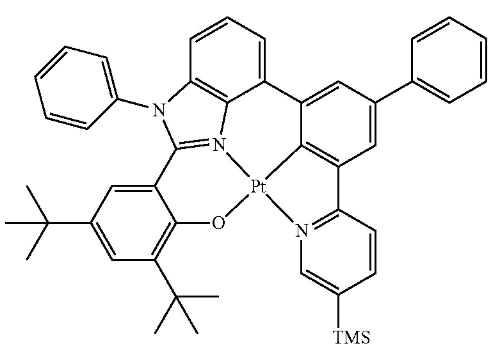
-continued
3-225
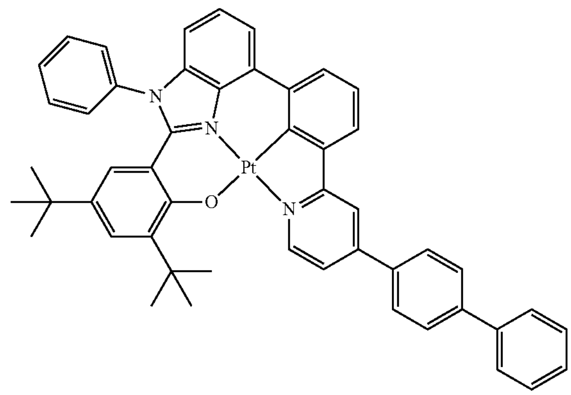
3-226
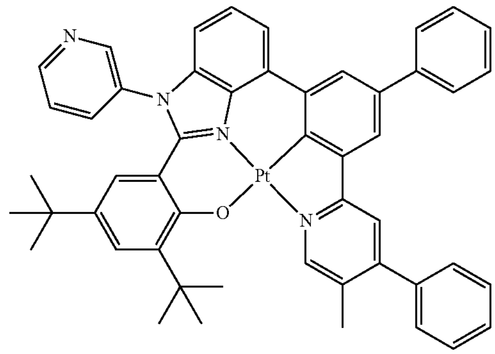
3-227
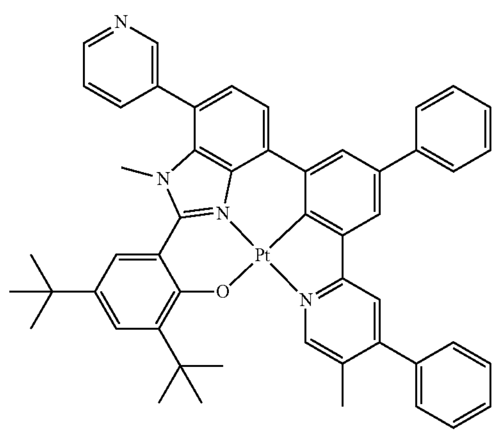
3-228
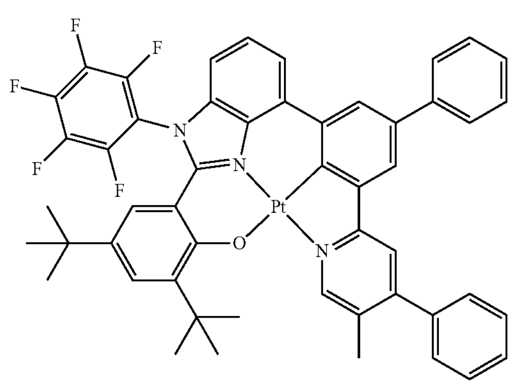

-continued
3-229
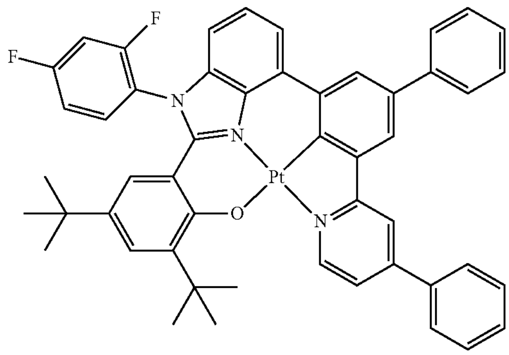
3-230
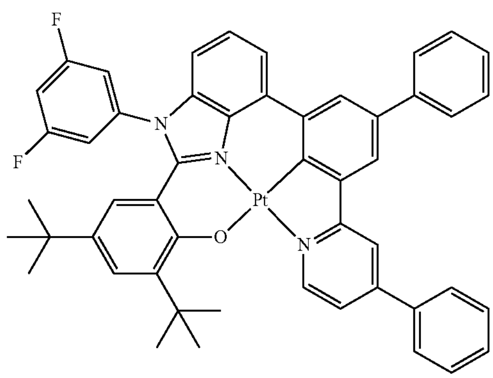
3-231
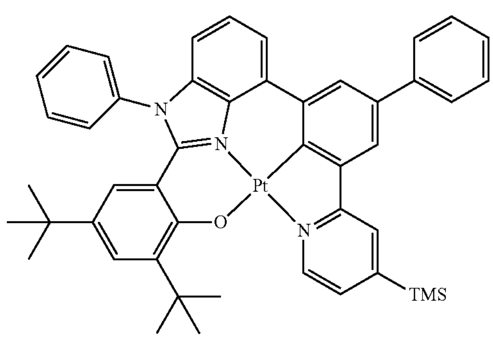
3-232
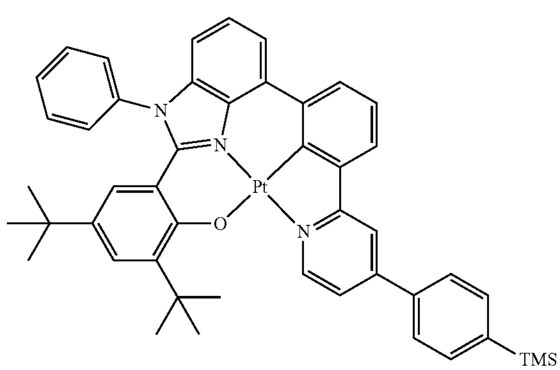
-continued
3-233
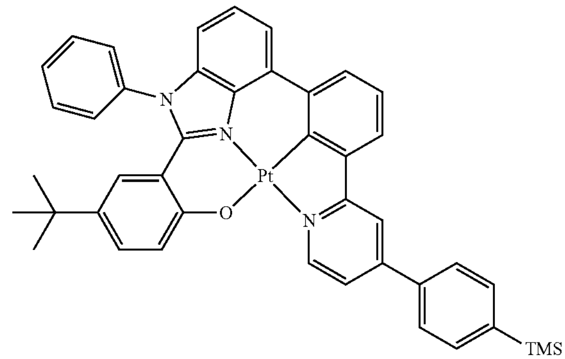
3-234
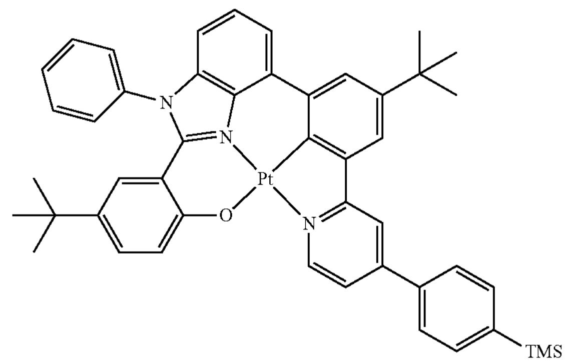
3-235
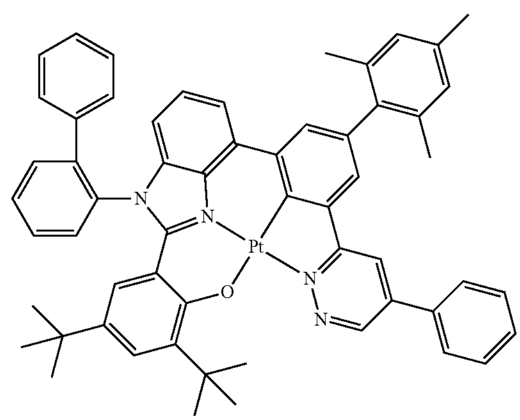
3-236
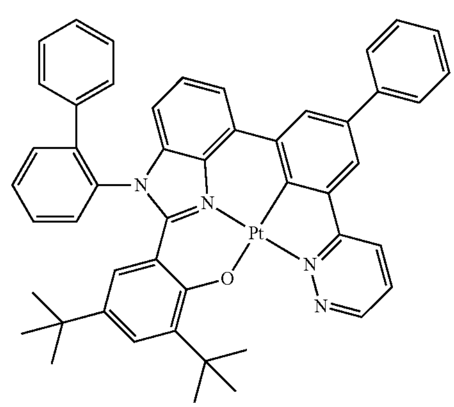

-continued
3-237
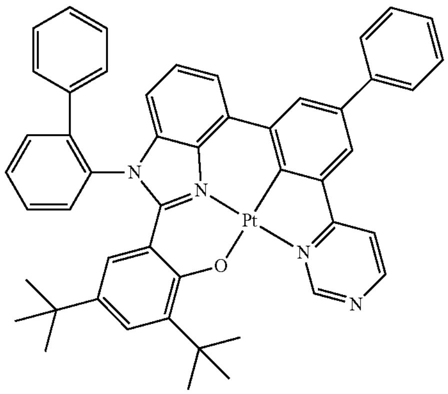
3-238
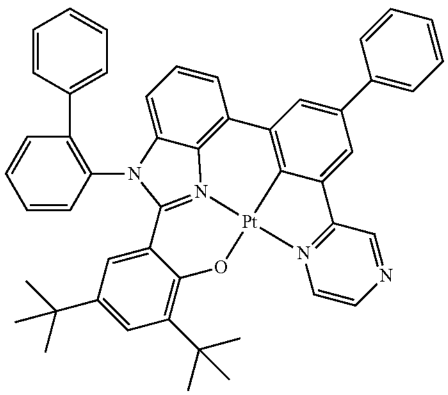
3-239
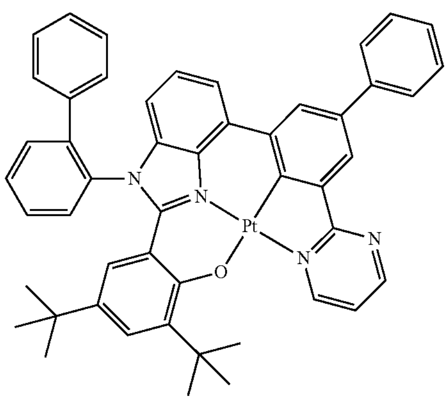
3-240
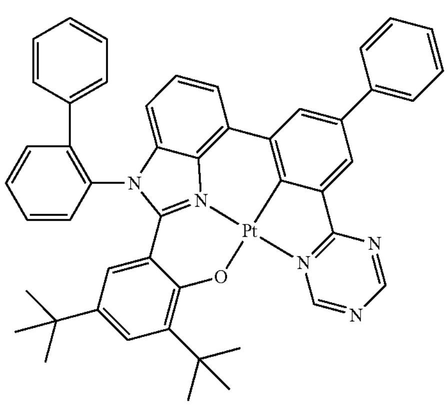
-continued
3-241
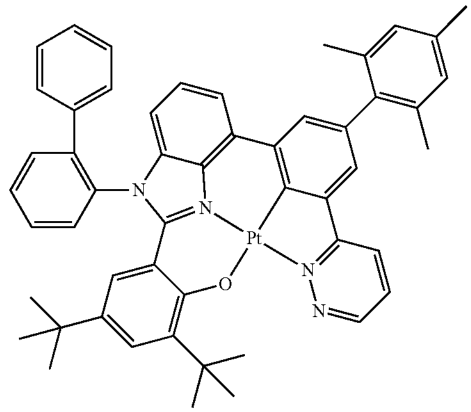
3-242
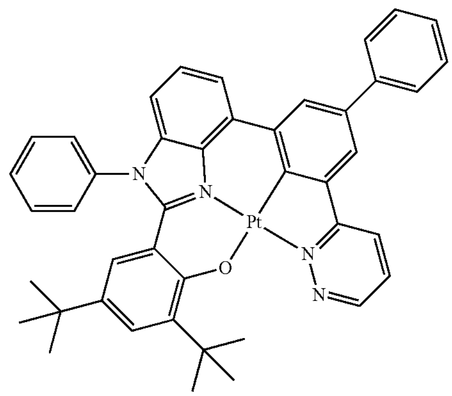
3-243
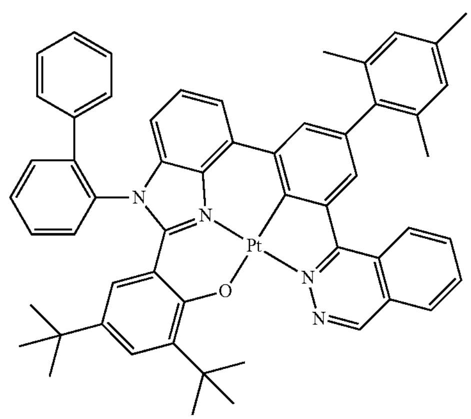
3-244
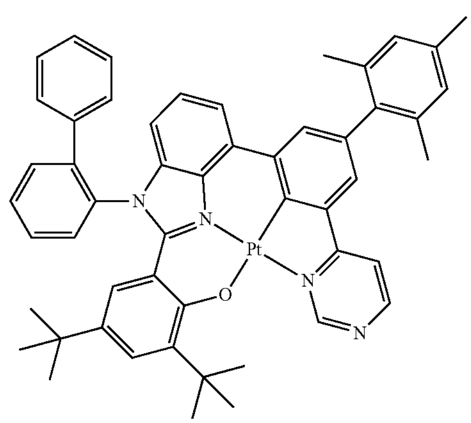

-continued
3-245
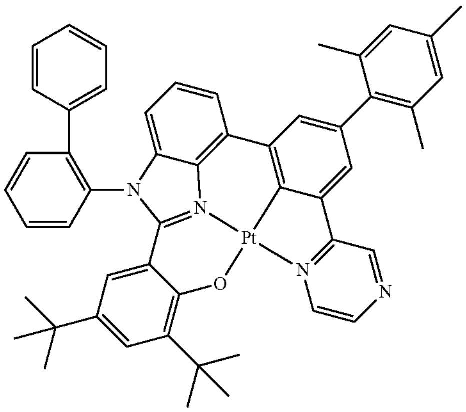
3-246
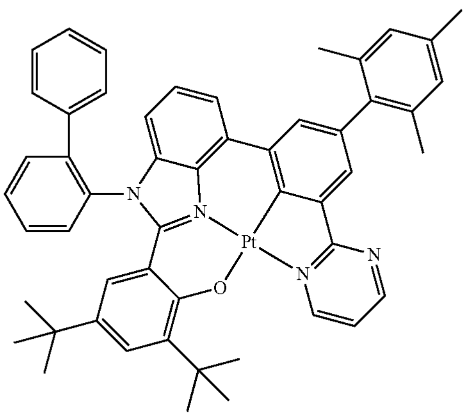
3-247
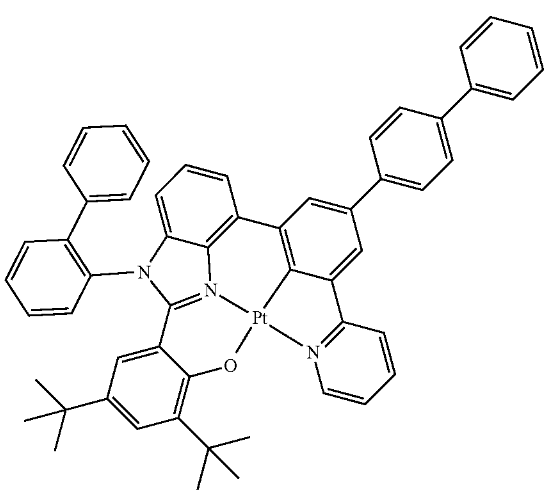
-continued
3-248
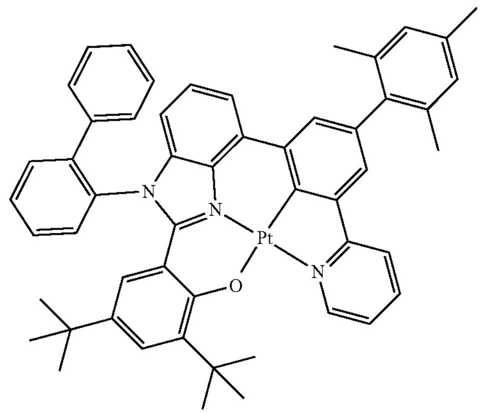
3-249
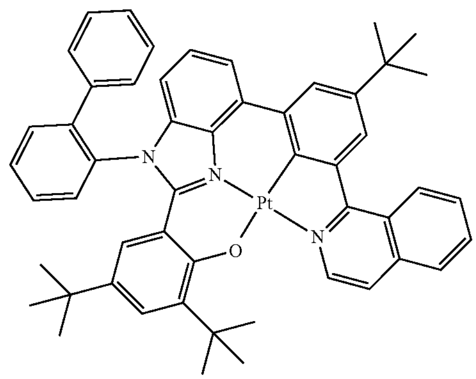
3-250
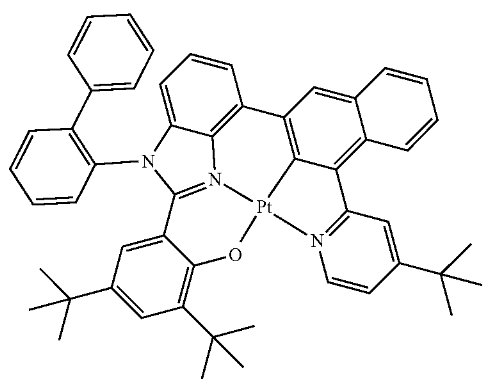
3-251
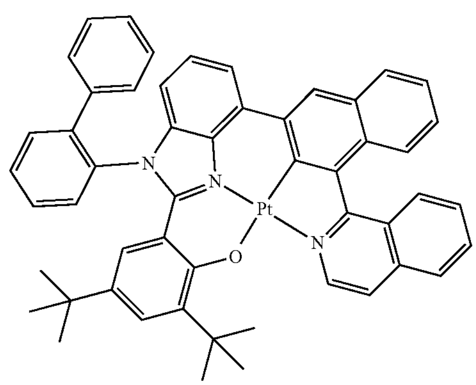

-continued
3-252
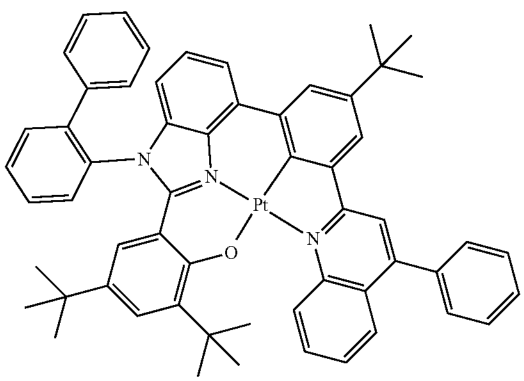
3-253
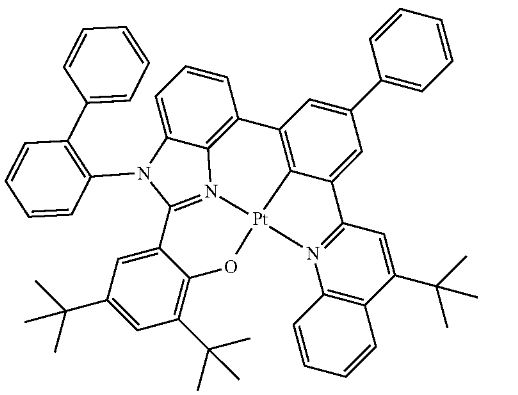
3-254
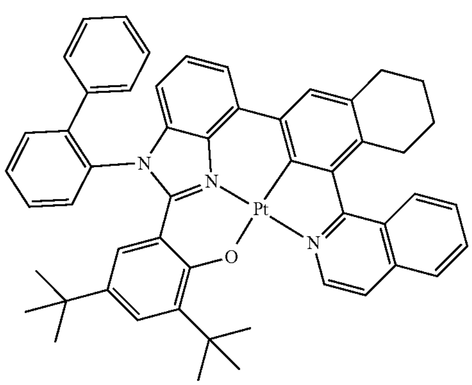
-continued
3-255
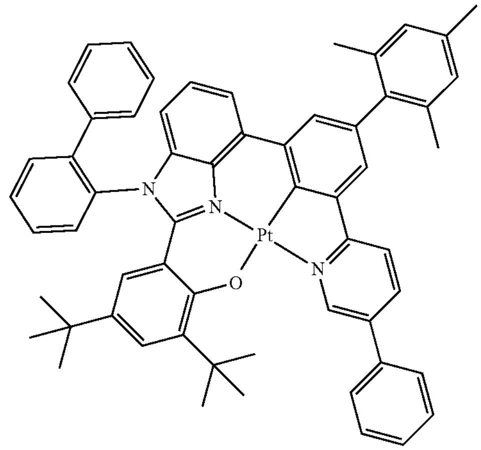
3-256
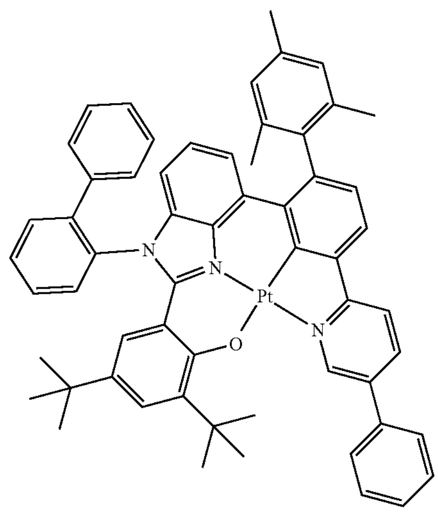
3-257
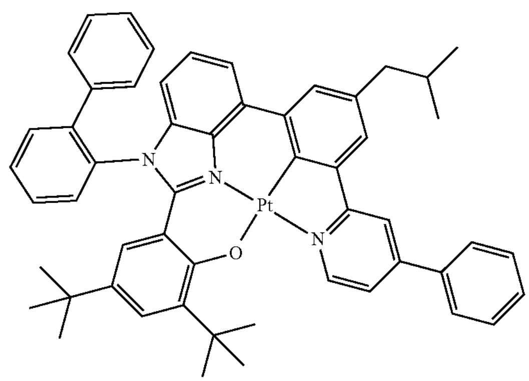

-continued
3-258
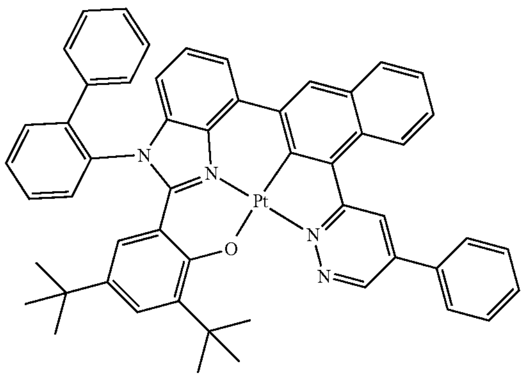
3-259
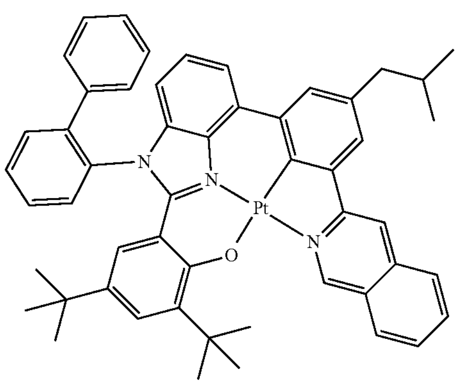
3-260
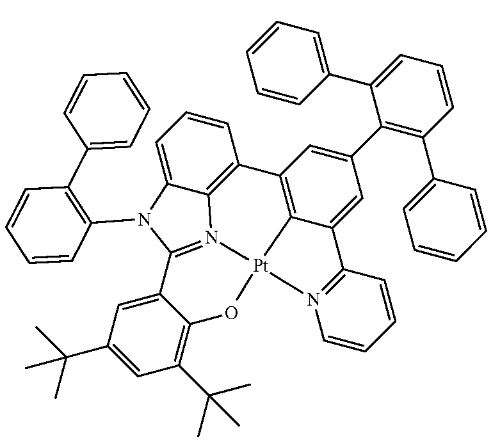
-continued
3-261
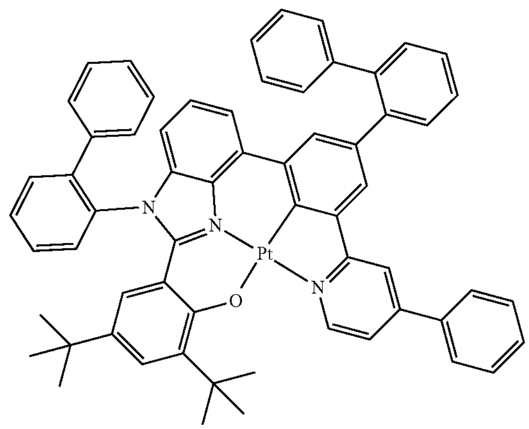
3-262
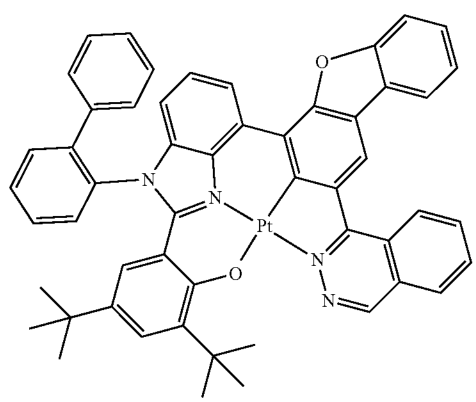
3-263
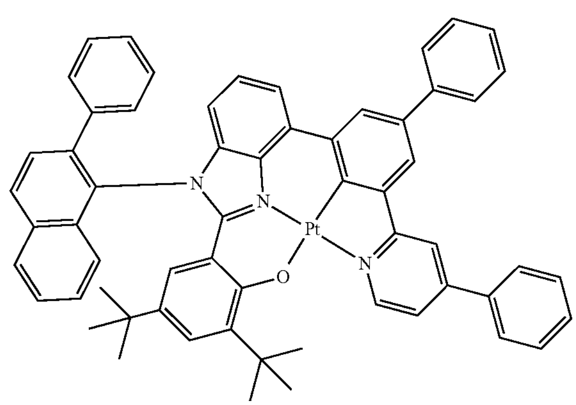

3-264
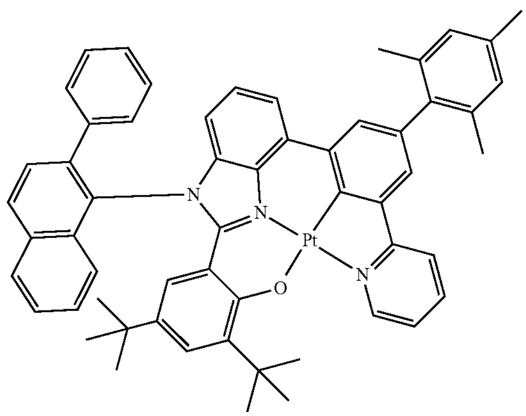
3-265
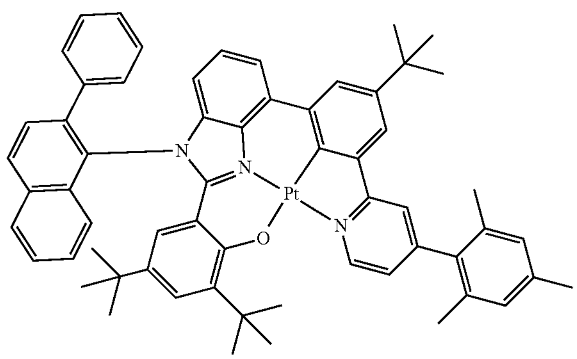
3-266
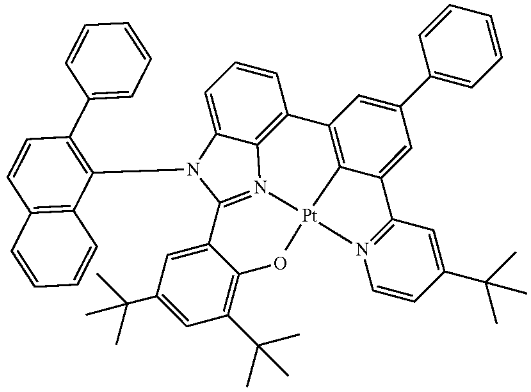
3-267
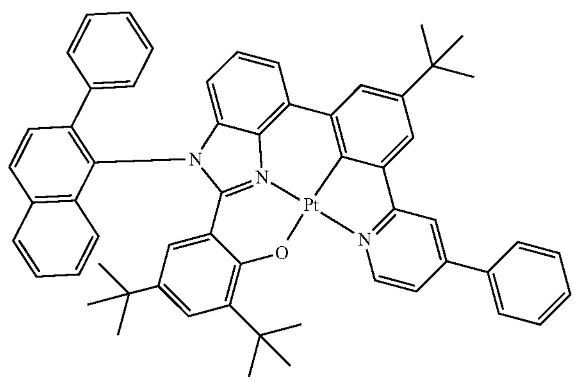
3-268
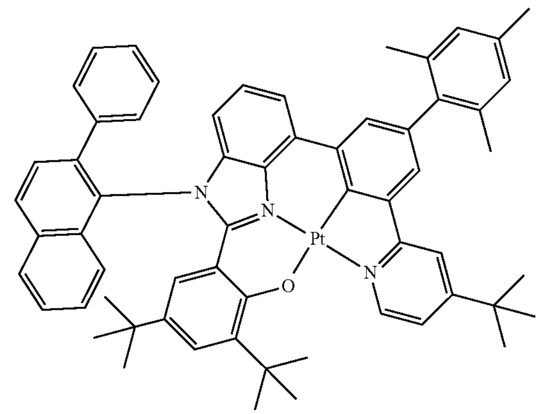
3-269
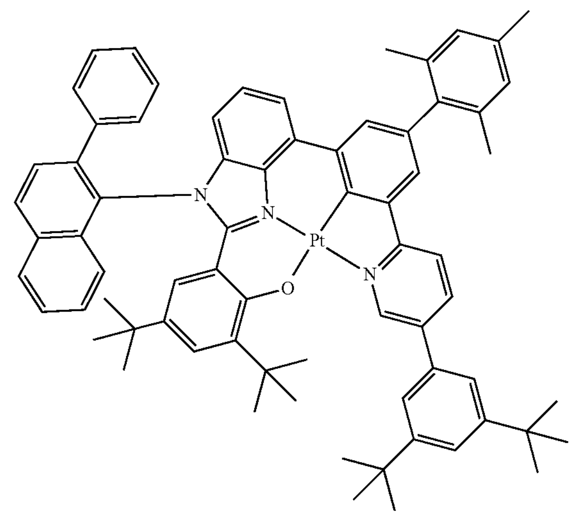
3-270
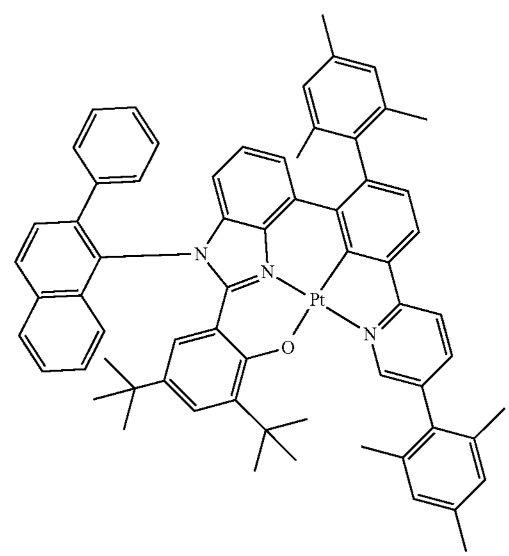

-continued
3-271
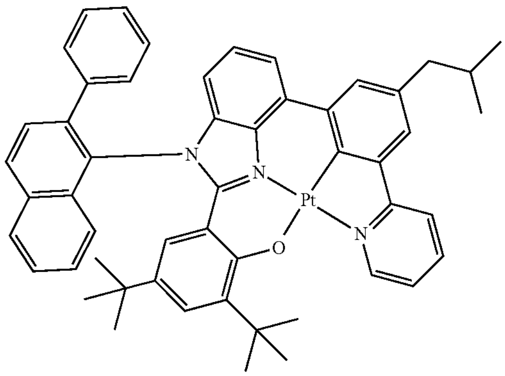
3-272
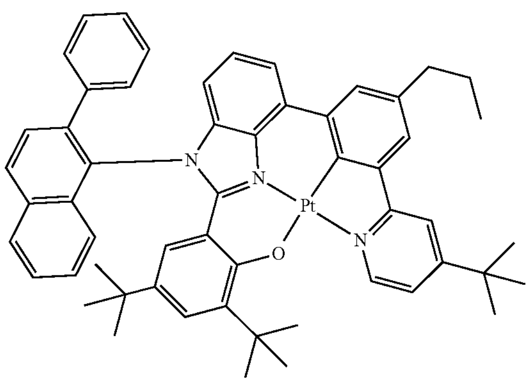
3-273
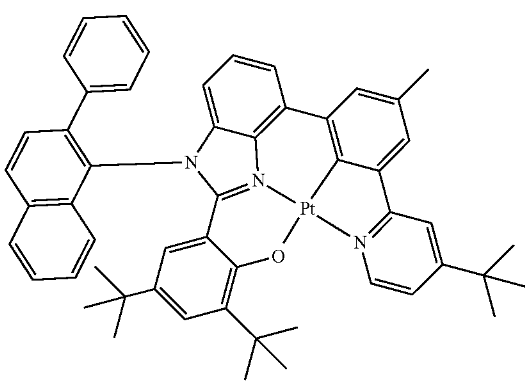
3-274
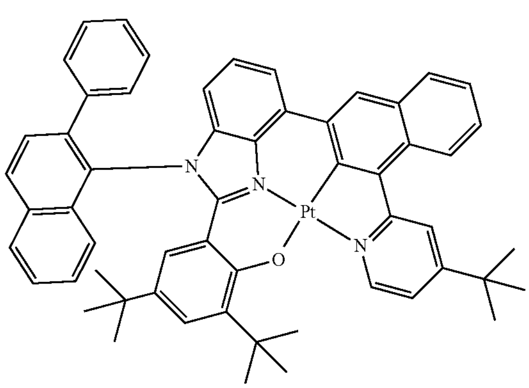
-continued
3-275
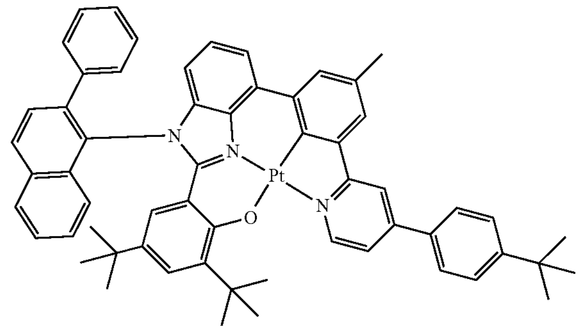
3-276
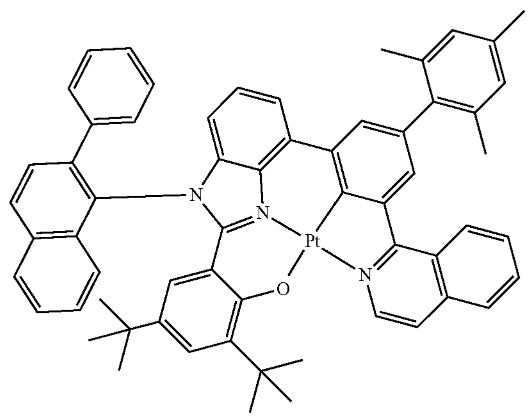
3-277
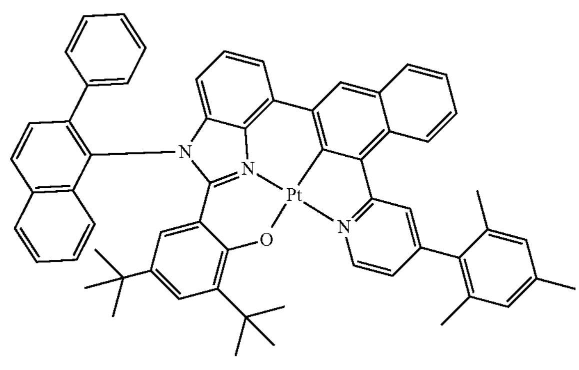
3-278
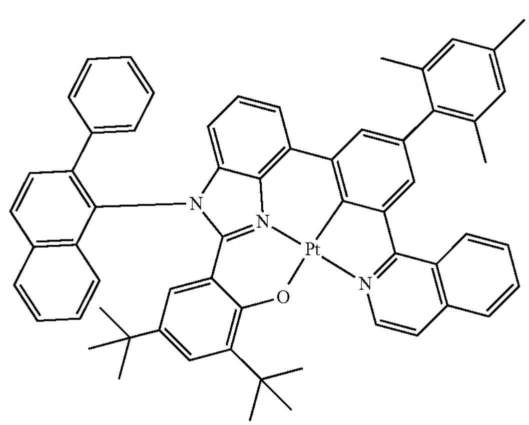

-continued
3-279
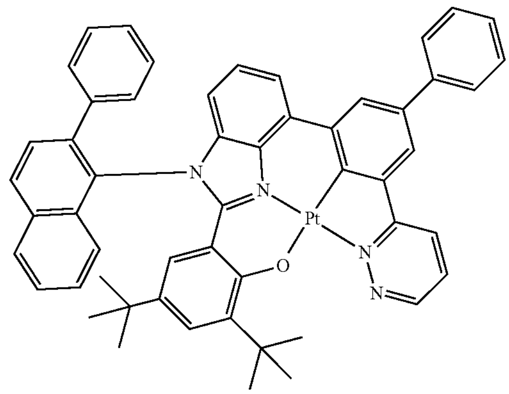
3-280
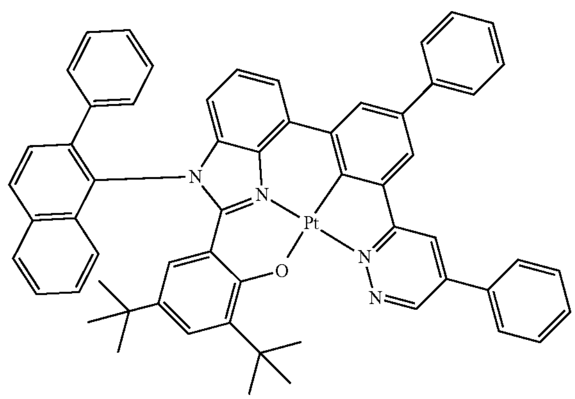
3-281
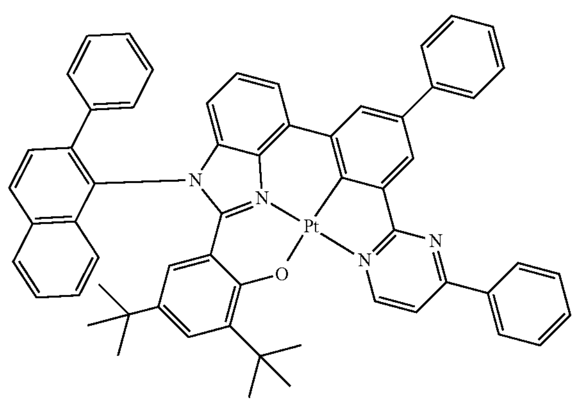
3-282
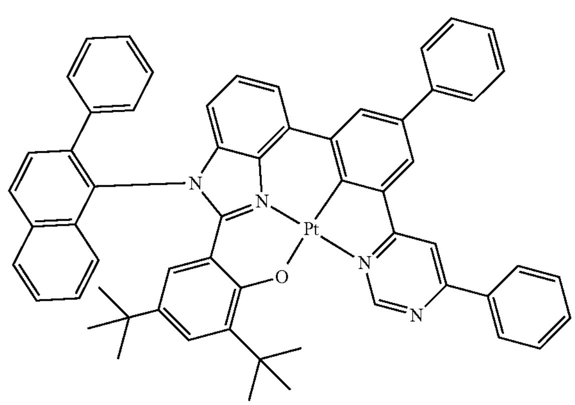
-continued
3-283
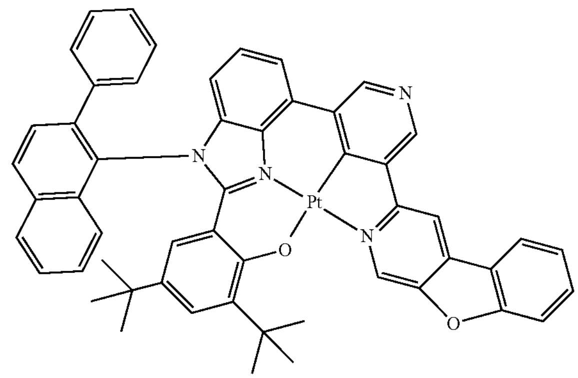
3-284
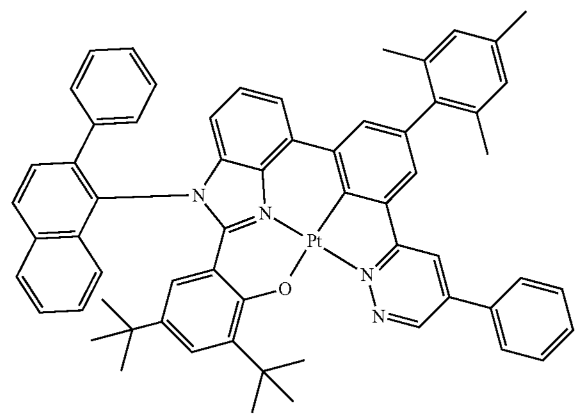
3-285
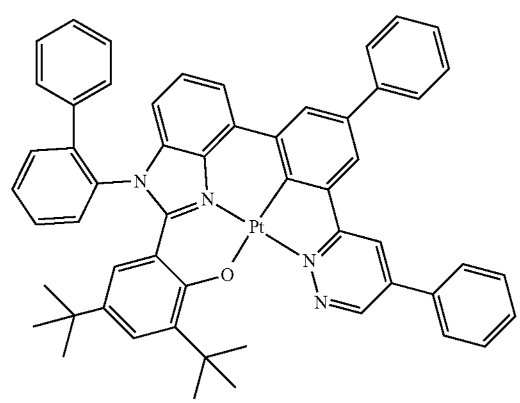
3-286
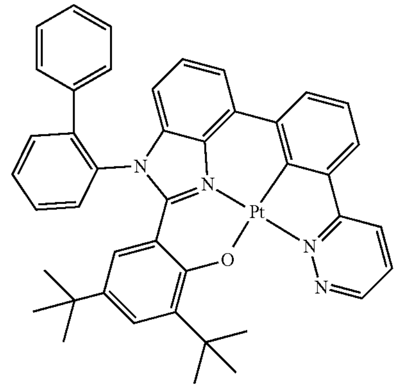

3-287
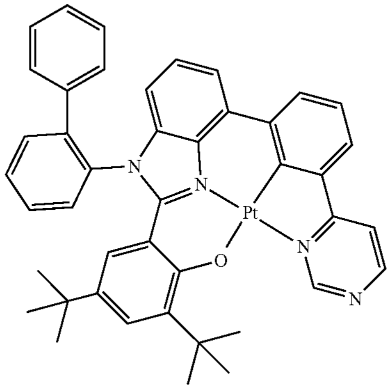
3-288
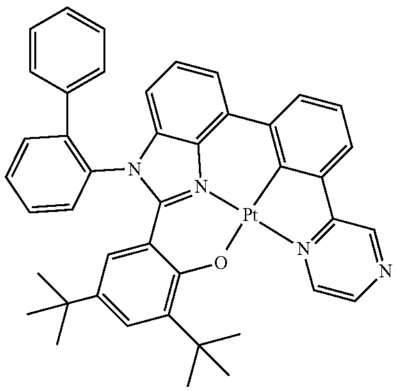
3-289
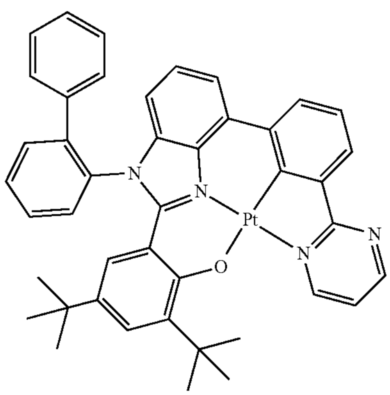
3-290
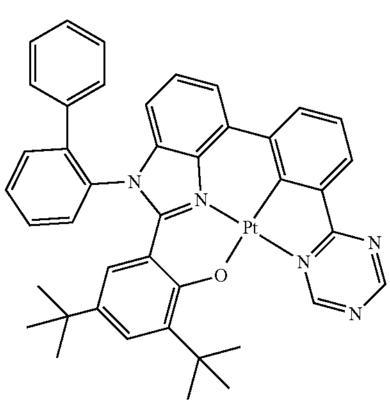
3-291
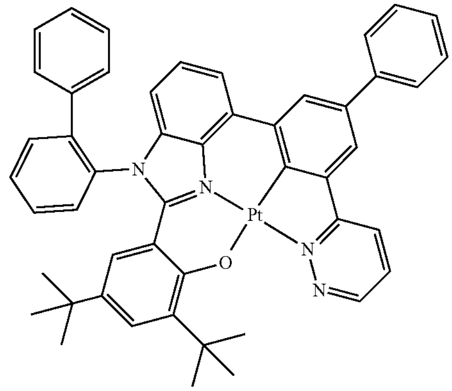
3-292
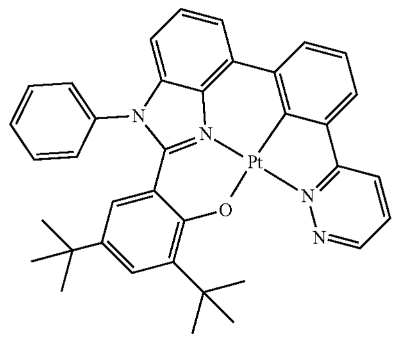
3-293
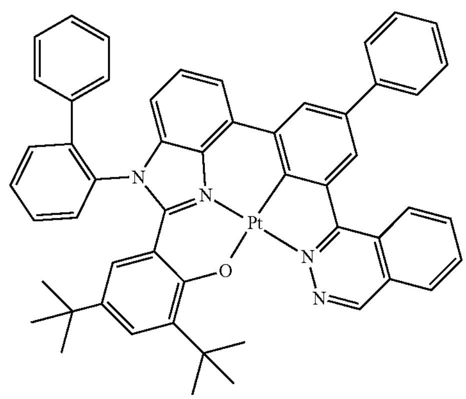
3-294
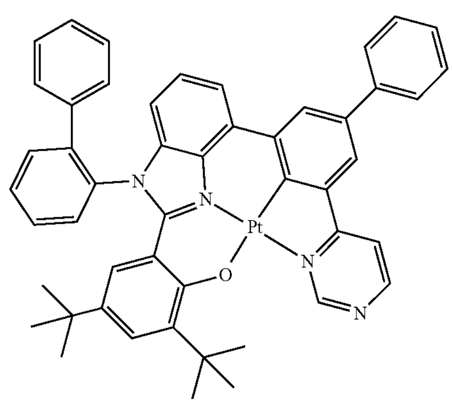

-continued
3-295
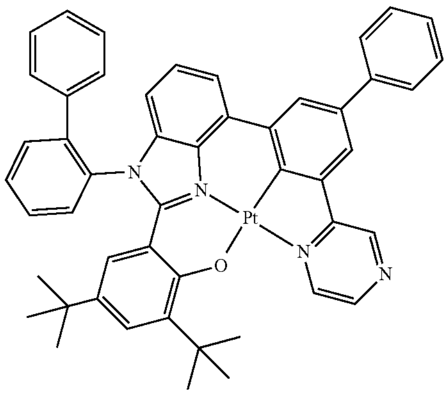
3-296
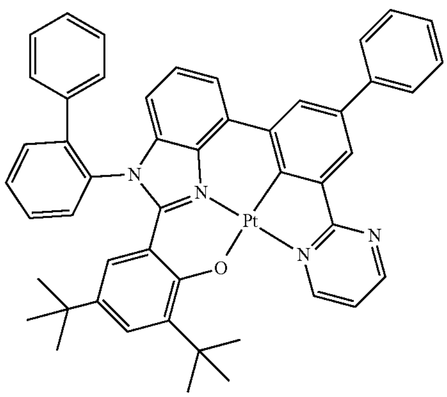
3-297
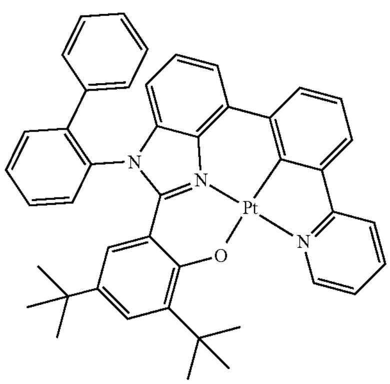
3-298
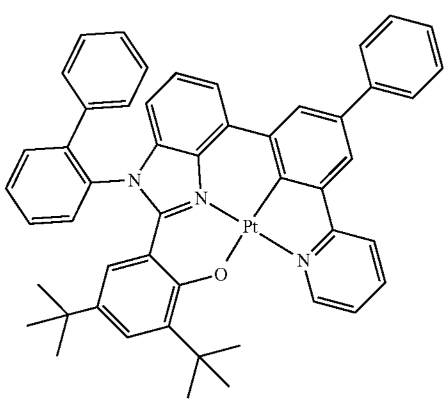
-continued
3-299
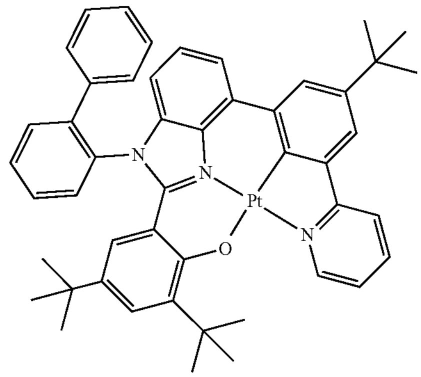
3-300
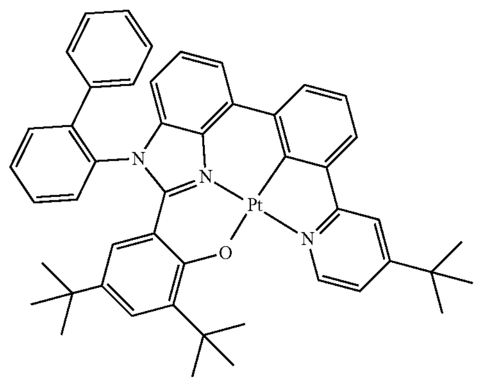
3-301
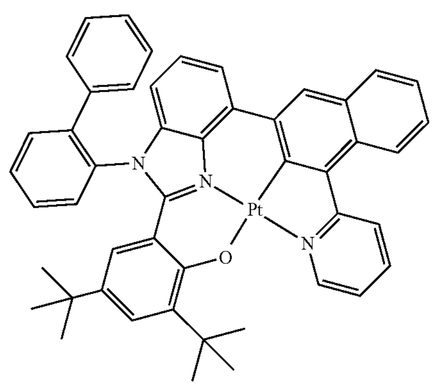
3-302
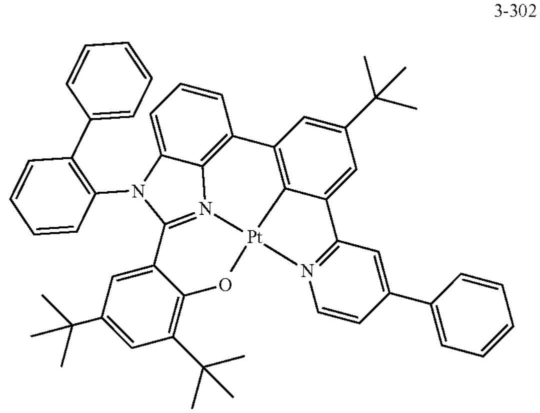

-continued
3-303
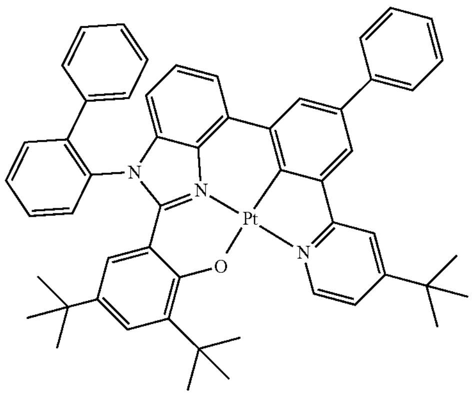
3-304
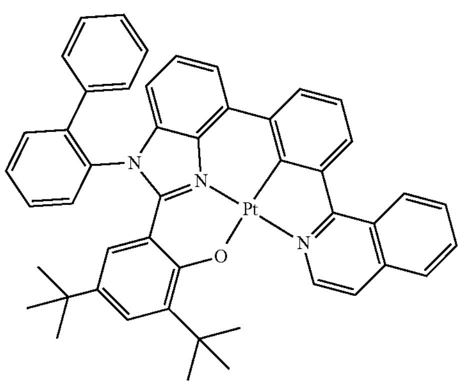
3-305
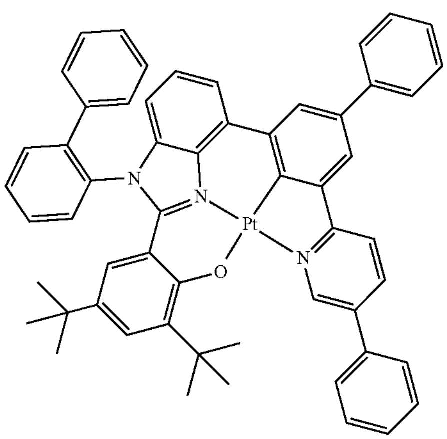
-continued
3-306
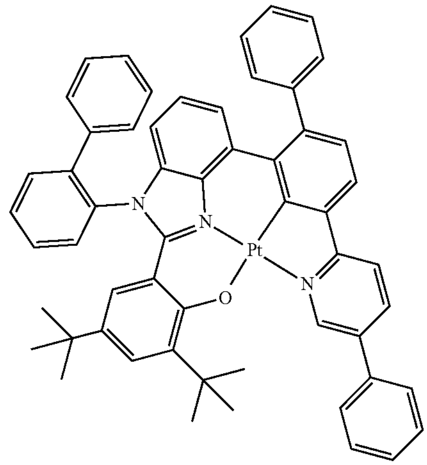
3-307
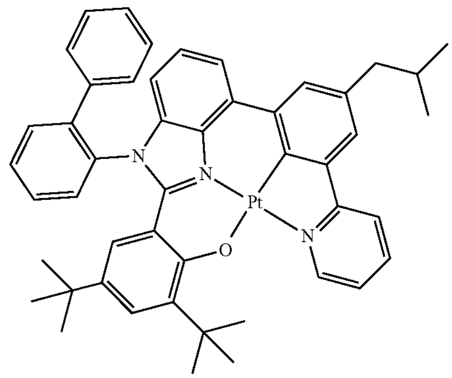
3-308
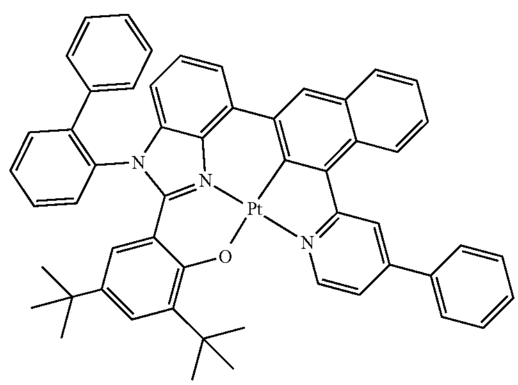
3-309
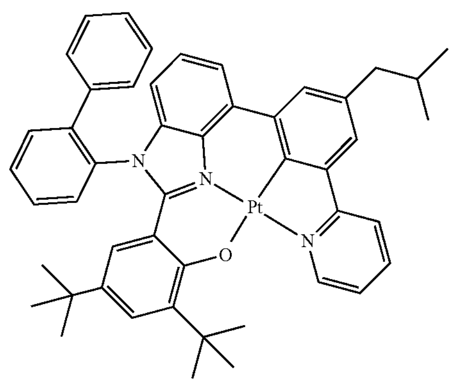

3-310
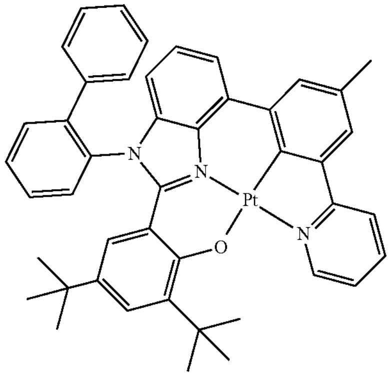
3-311
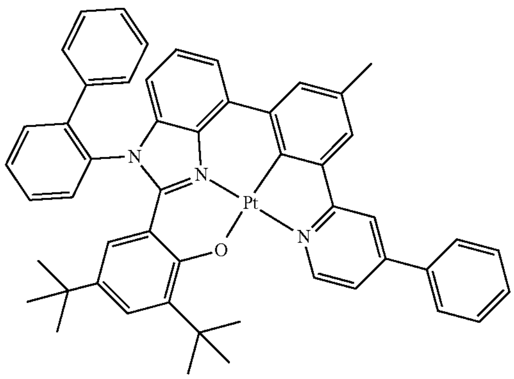
3-312
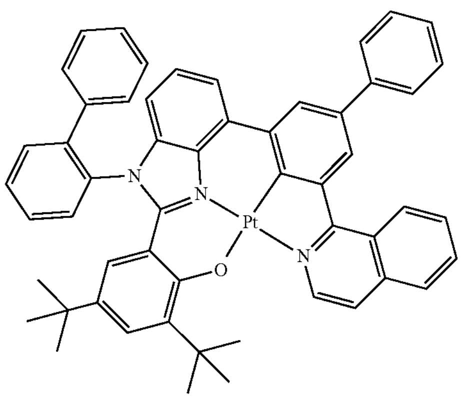
3-313
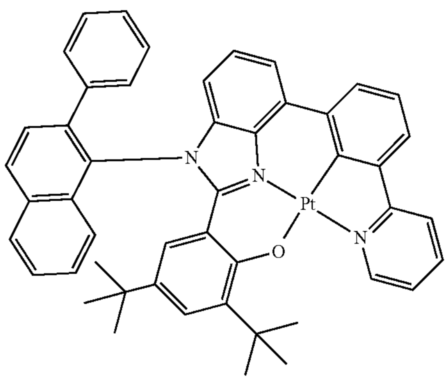
3-314
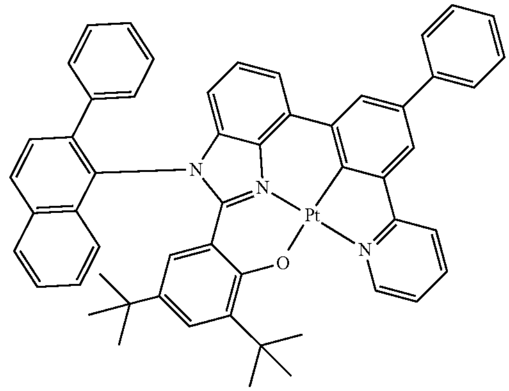
3-315
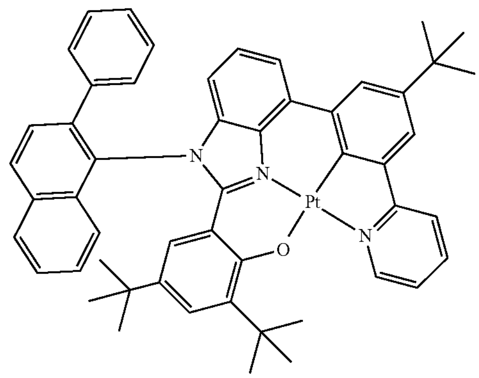
3-316
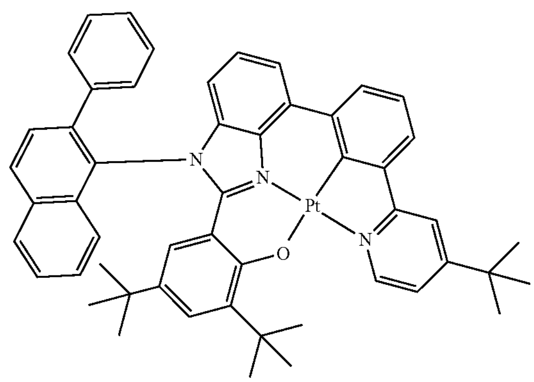
3-317
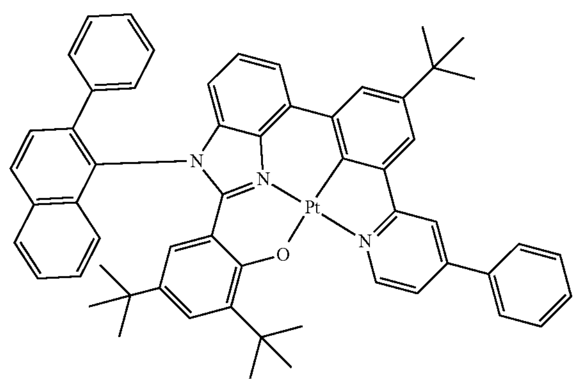

-continued
3-318
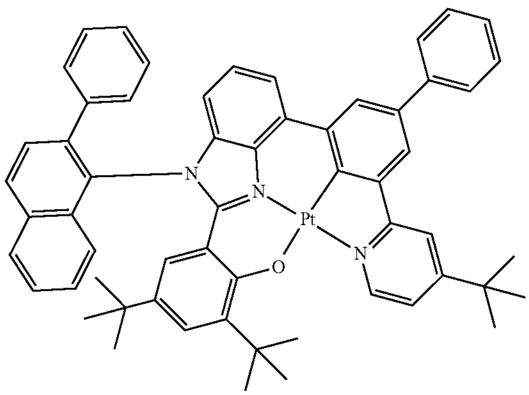
3-319
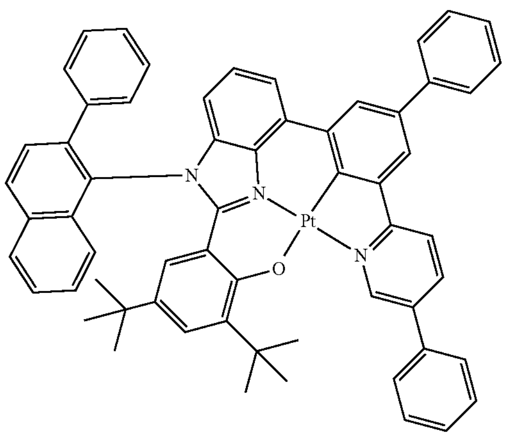
3-320
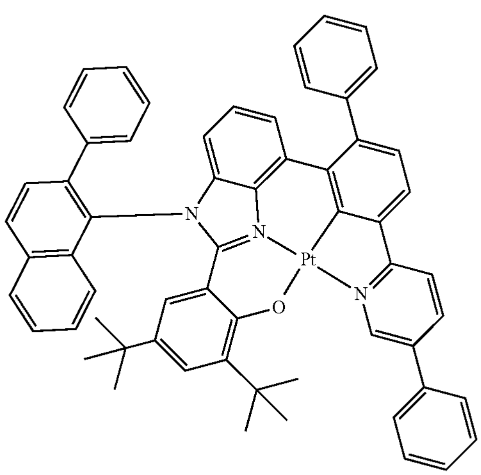
-continued
3-321
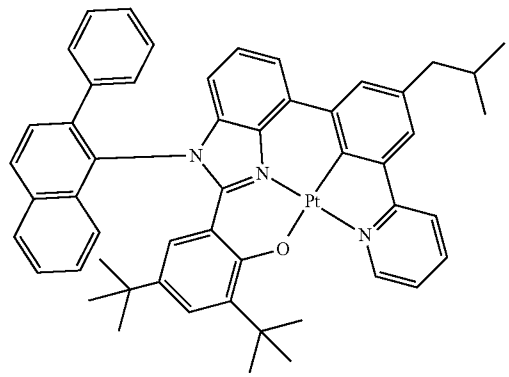
3-322
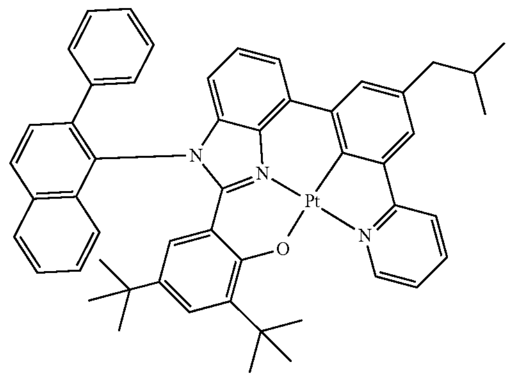
3-323
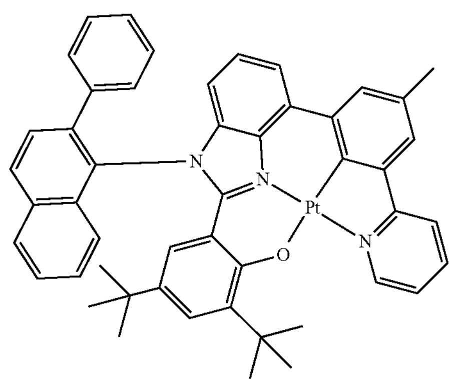
3-324
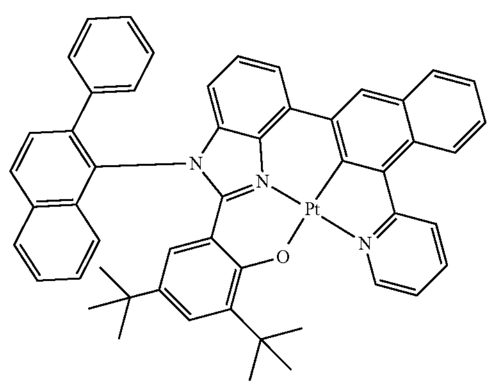

-continued
3-325
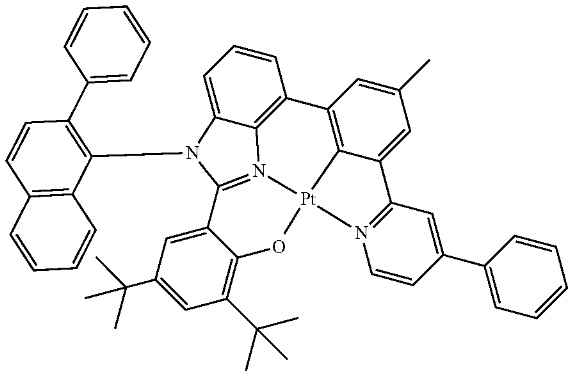
3-326
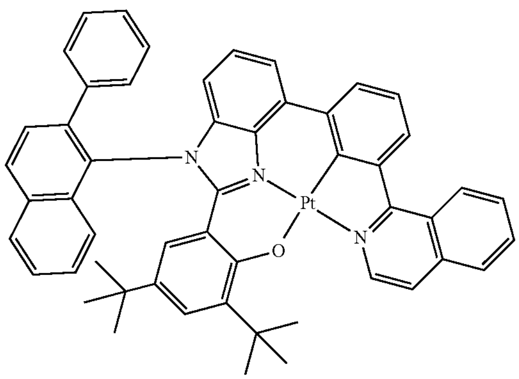
3-327
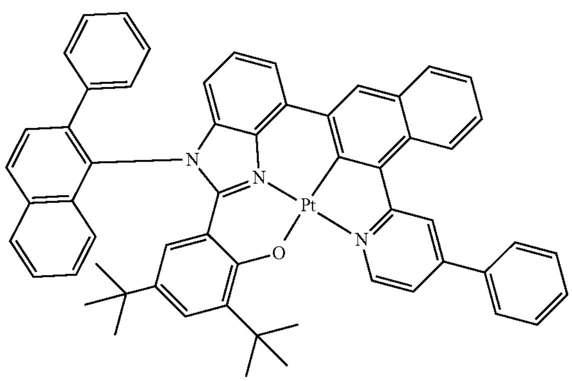
3-328
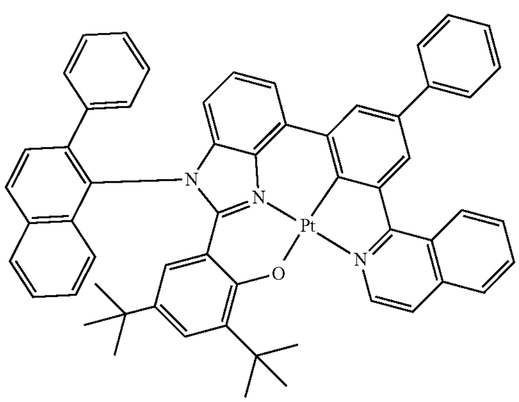
-continued
3-329
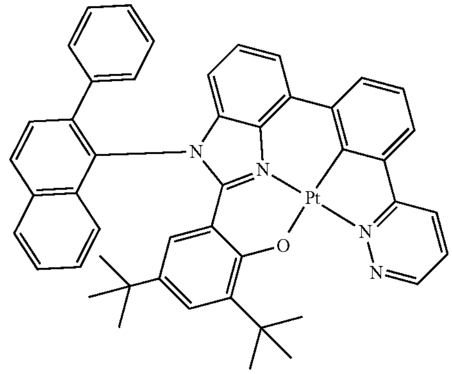
3-330
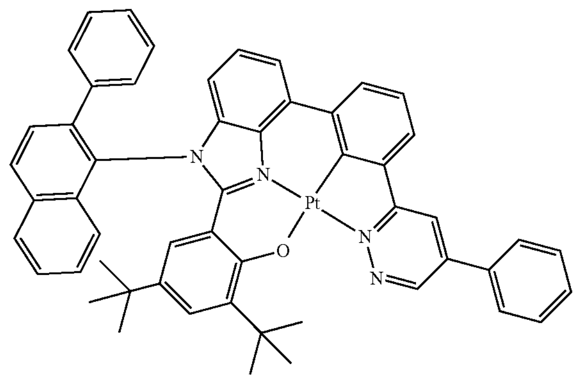
3-331
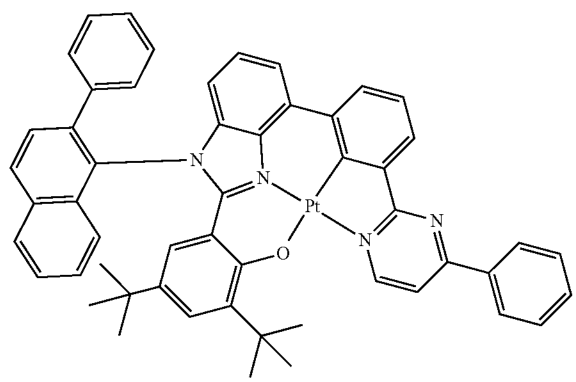
3-332
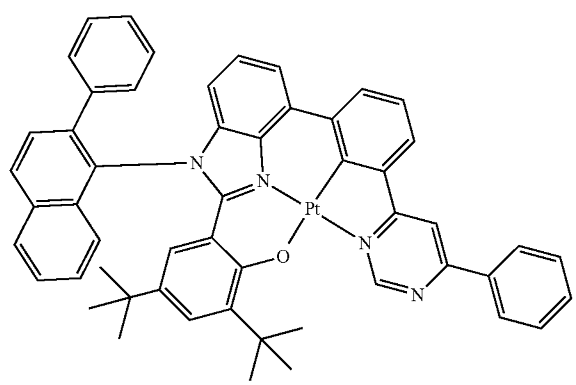

3-333
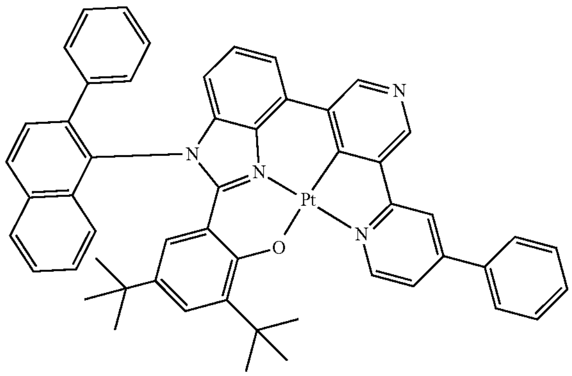
3-334
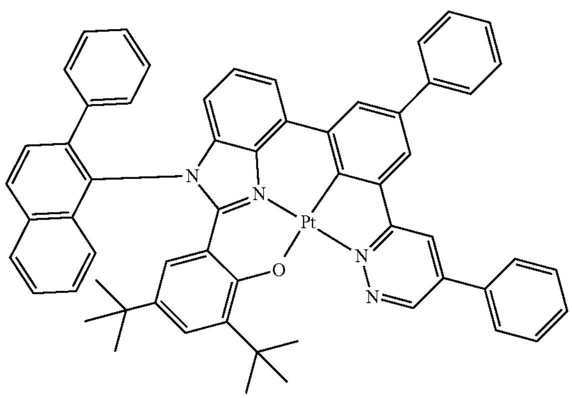
3-335
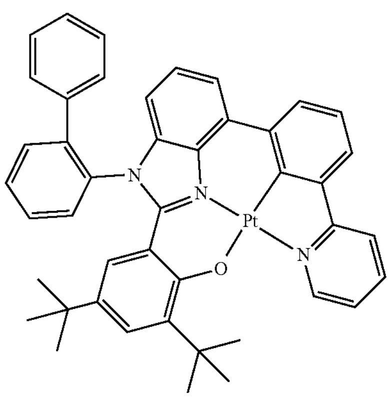
3-336
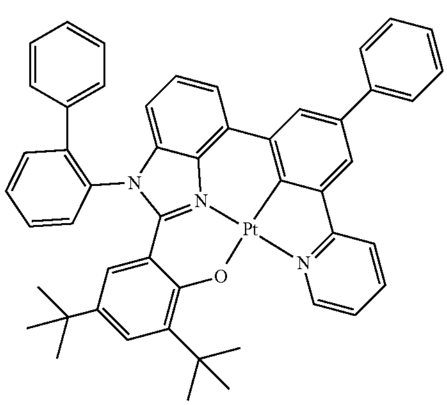
3-337
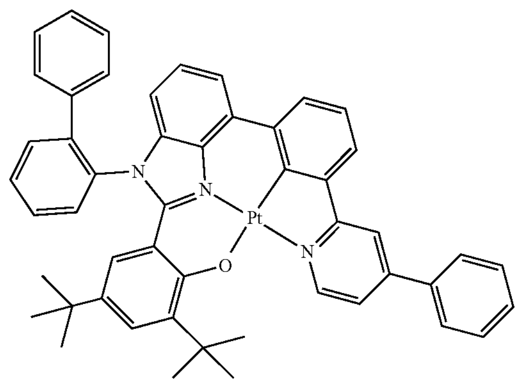
3-338
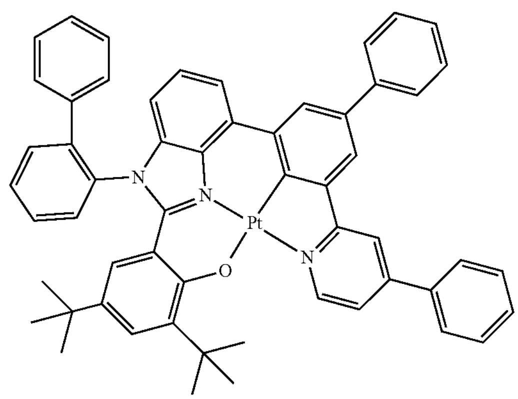
3-339
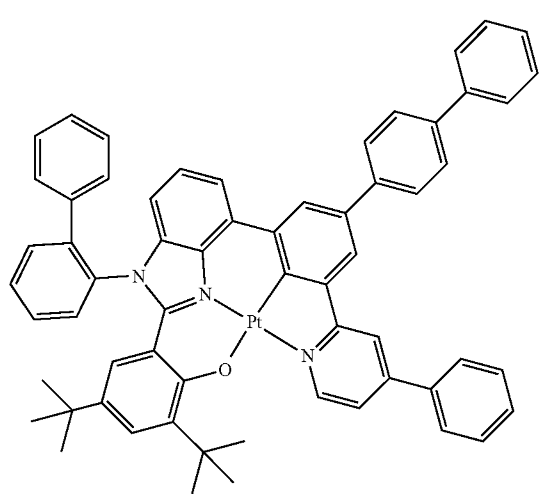

3-340
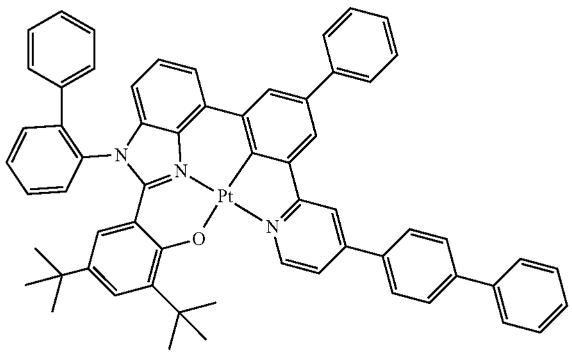
3-341
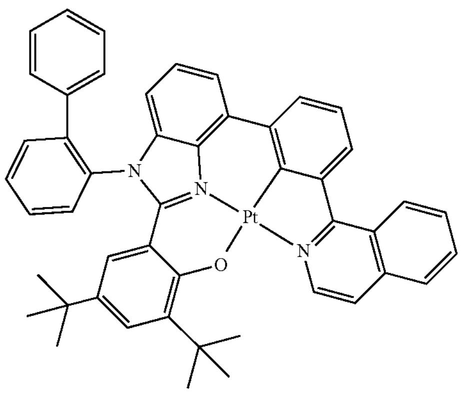
3-342
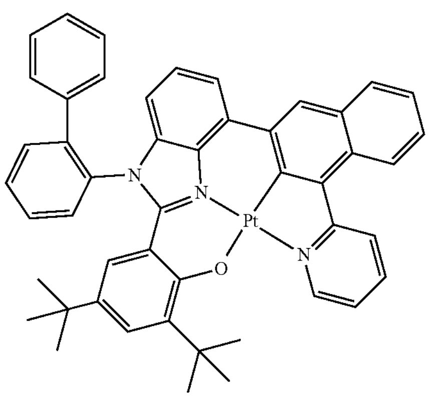
3-343
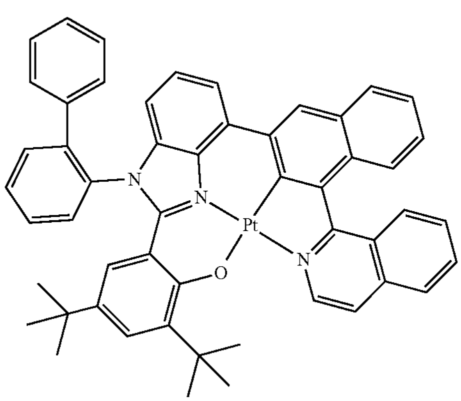
3-344
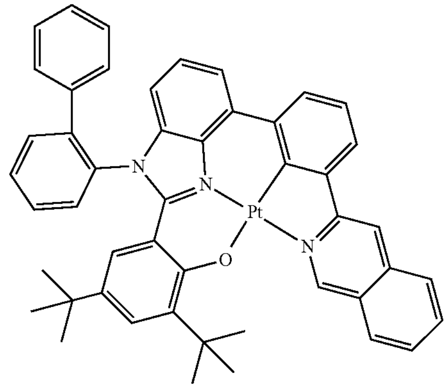
3-345
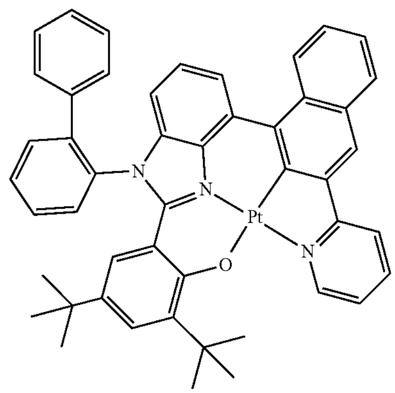
3-346
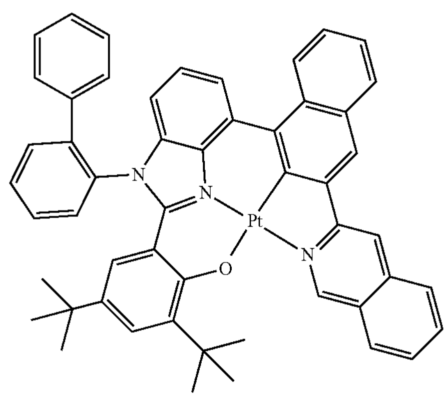
3-347
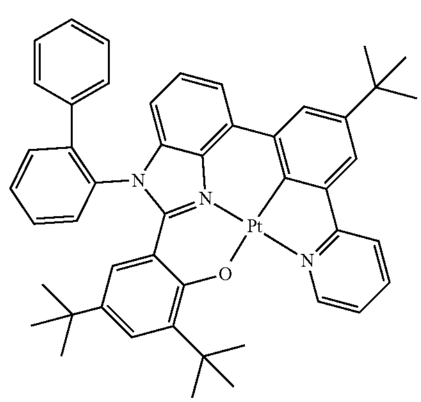

-continued
3-348
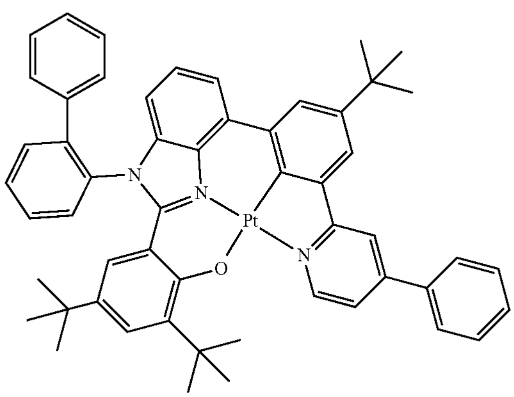
3-349
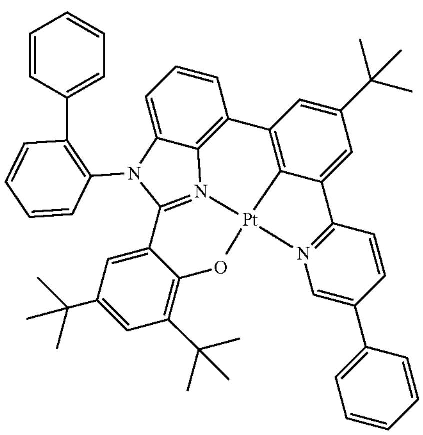
3-350
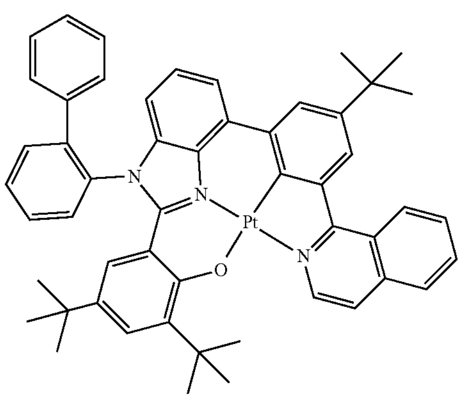
3-351
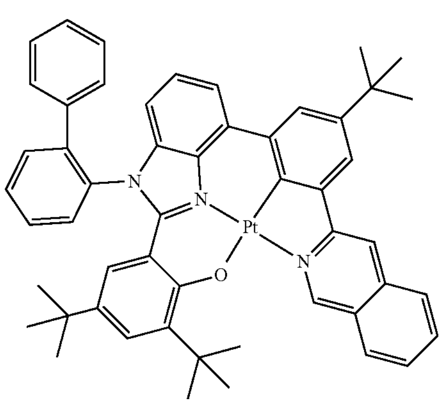
-continued
3-352
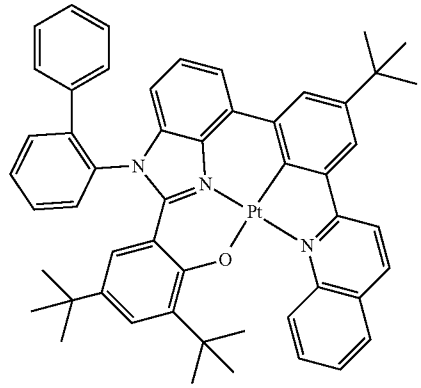
3-353
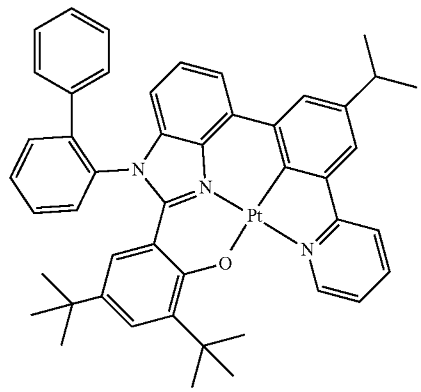
3-354
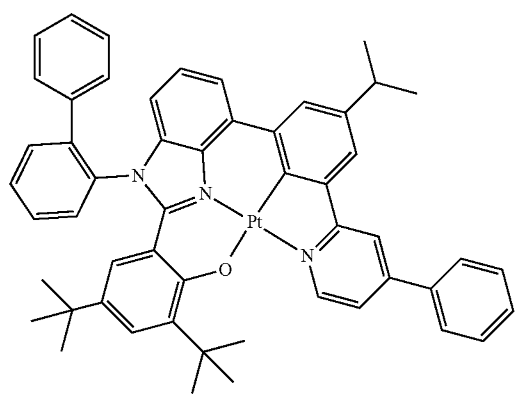
3-355
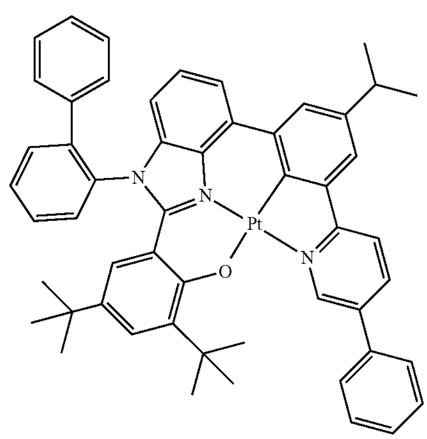

3-356
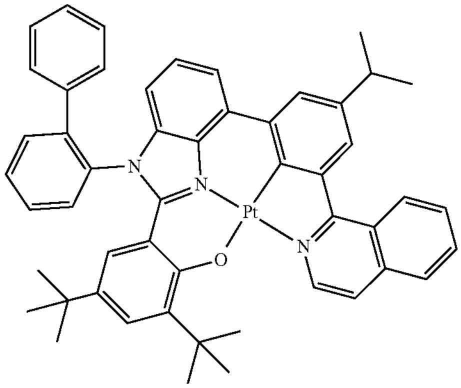
3-357
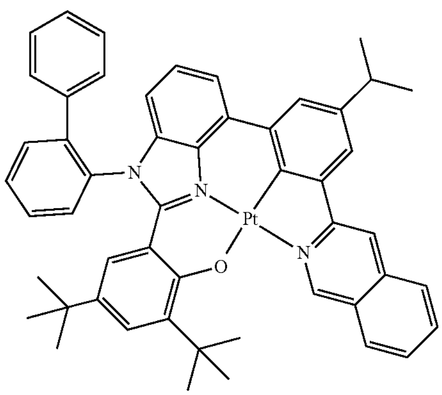
3-358
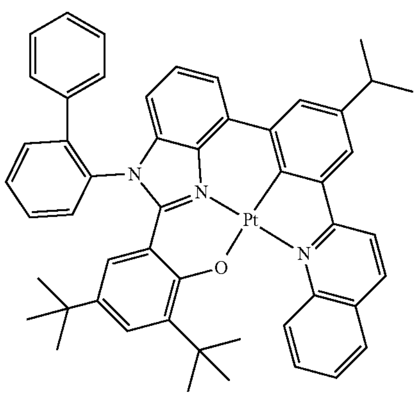
3-359
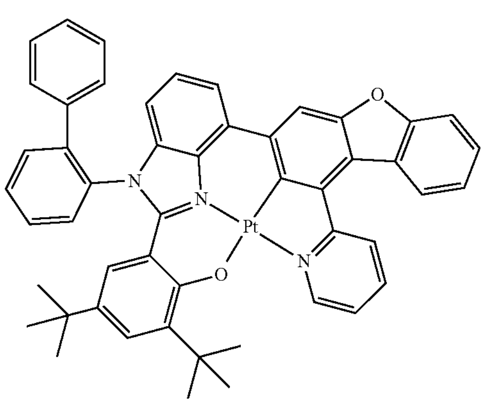
3-360
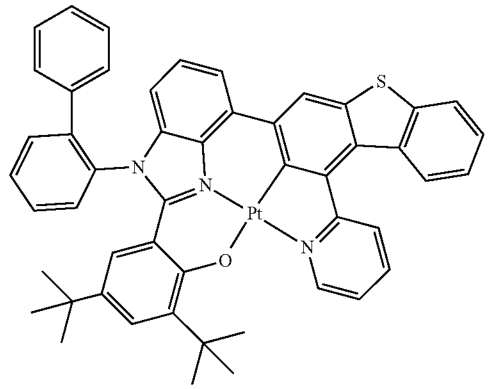
3-361
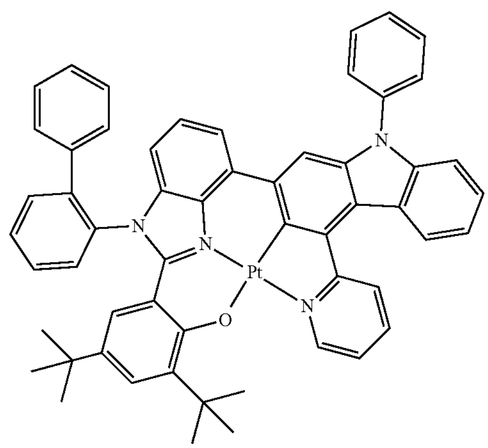
3-362
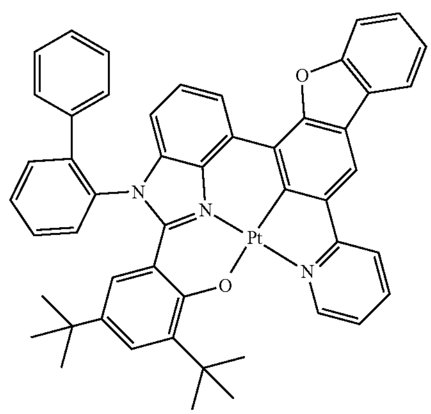

-continued
3-363
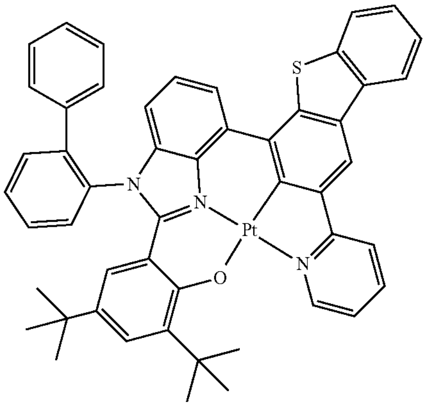
3-364
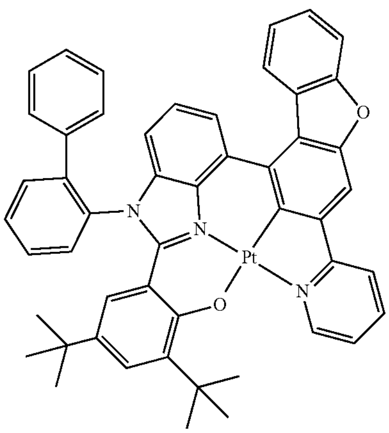
3-365
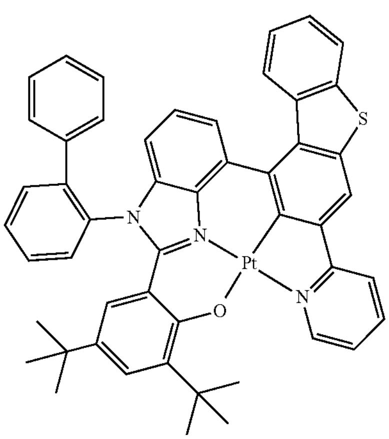
-continued
3-366
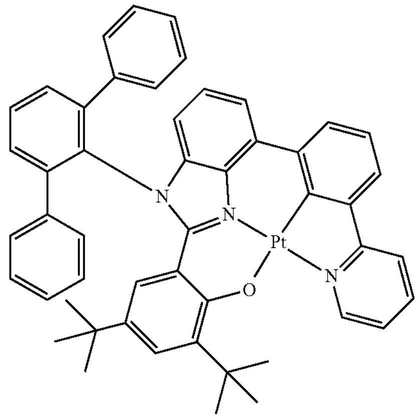
3-367
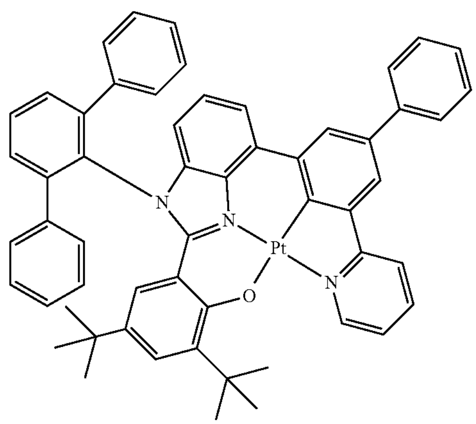
3-368
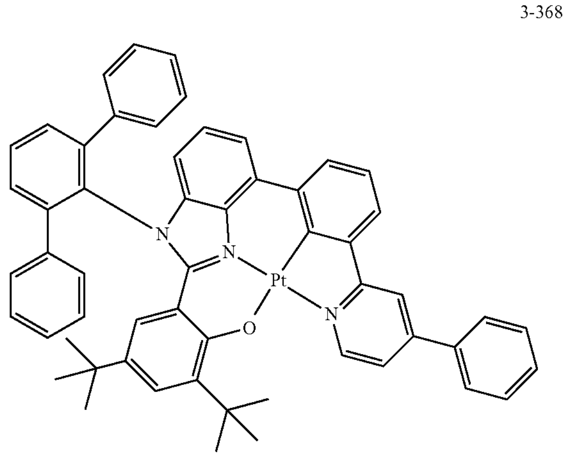

-continued
3-369
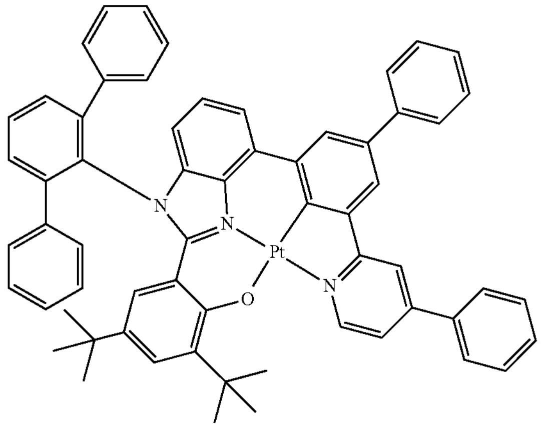
3-370
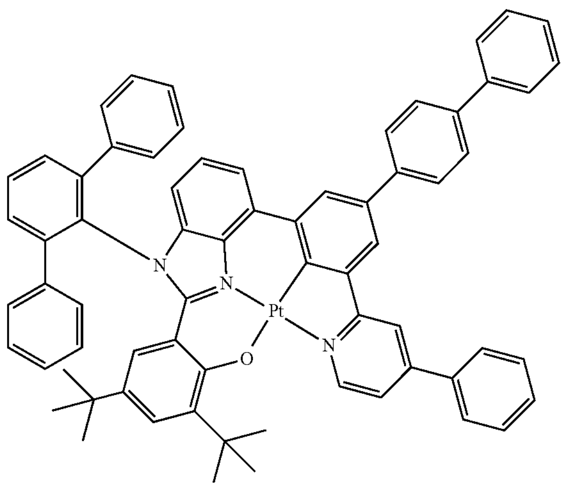
3-371
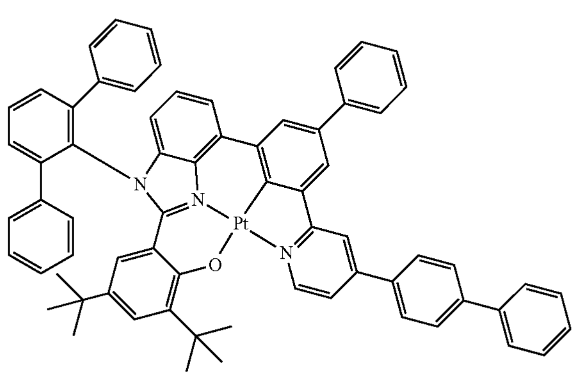
-continued
3-372
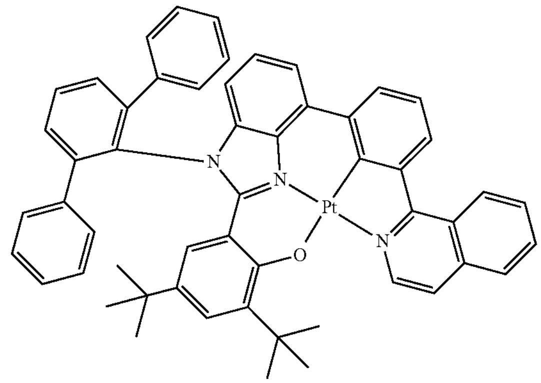
3-373
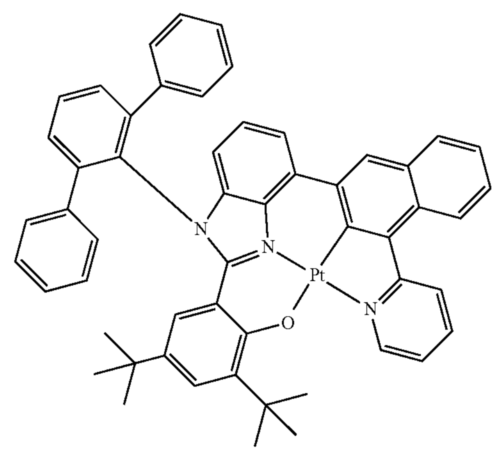
3-374
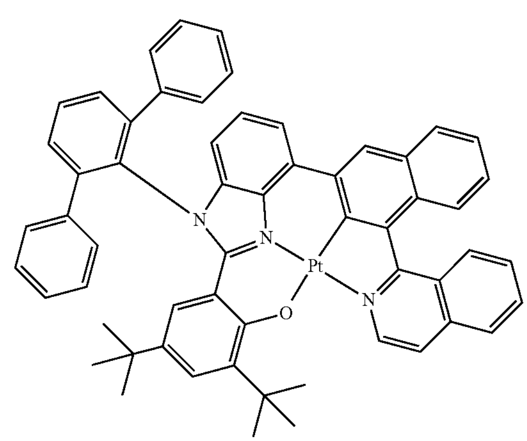

-continued
3-375
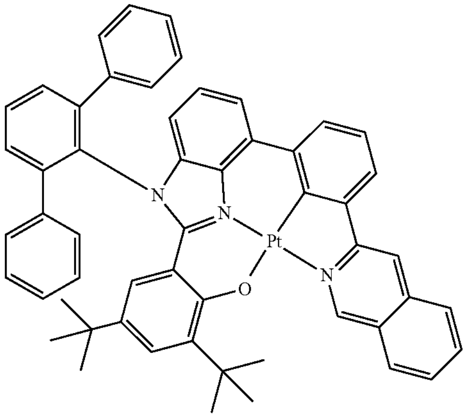
3-376
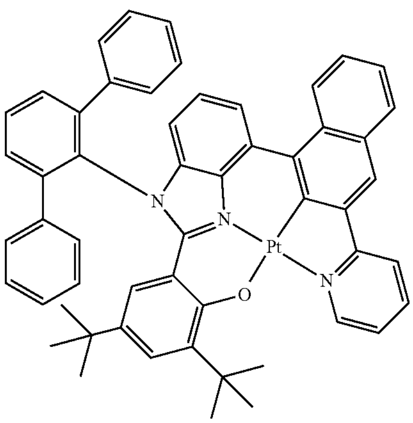
3-377
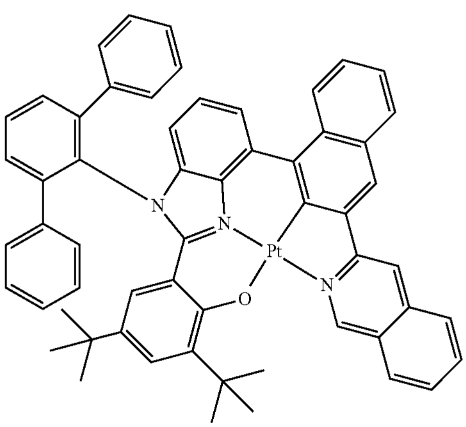
-continued
3-378
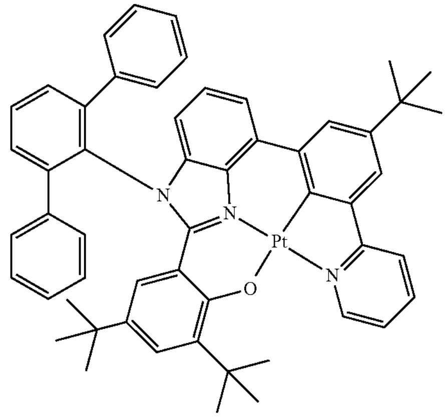
3-379
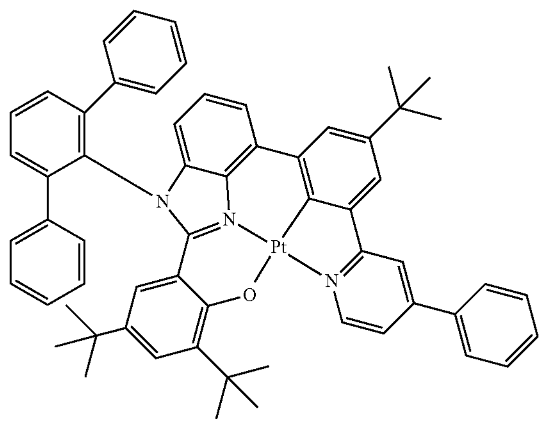
3-380
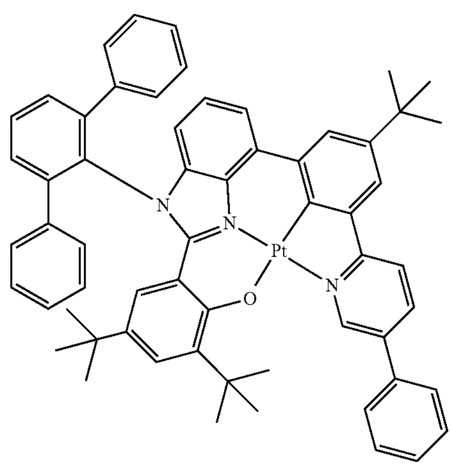

-continued
3-381
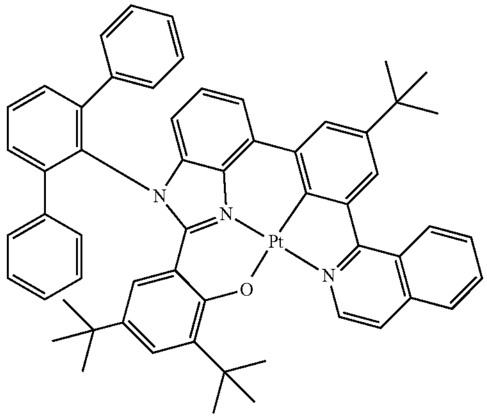
3-382
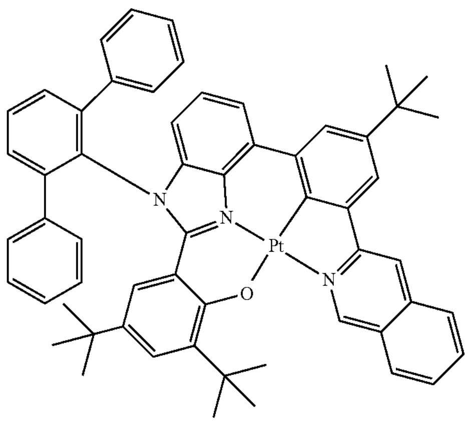
3-383
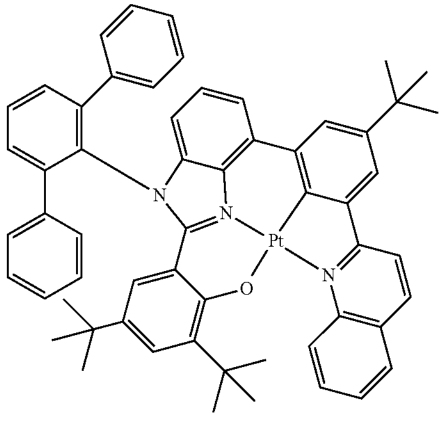
-continued
3-384
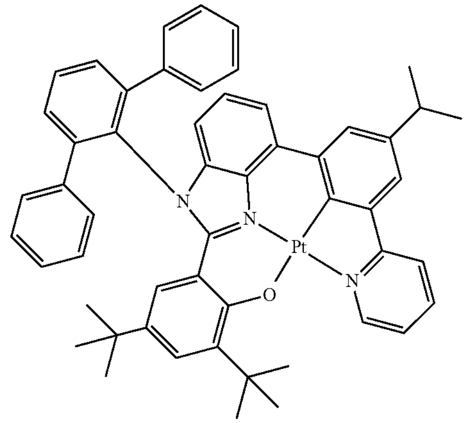
3-385
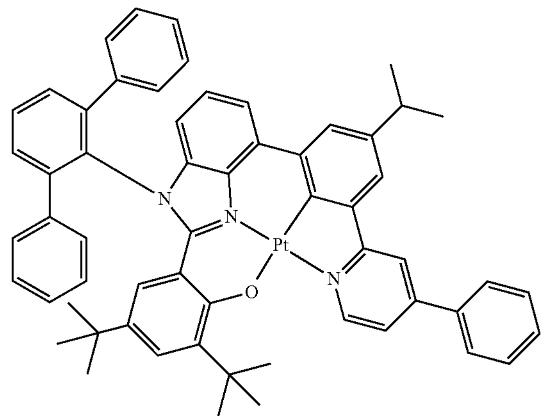
3-386
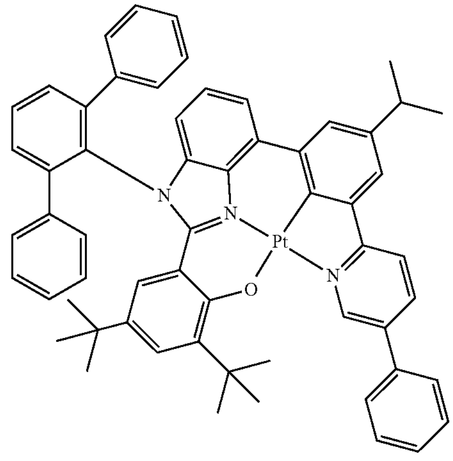

-continued
3-387
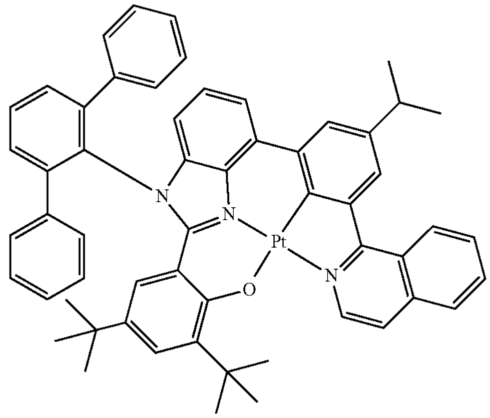
3-388
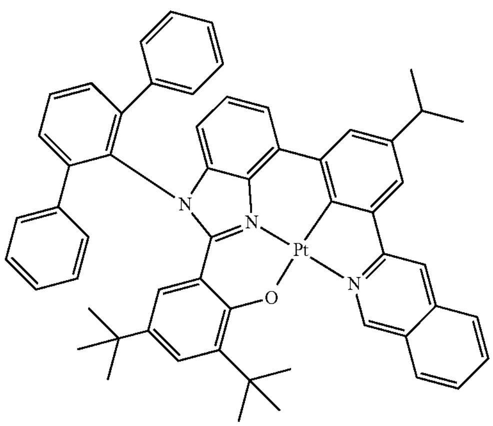
3-389
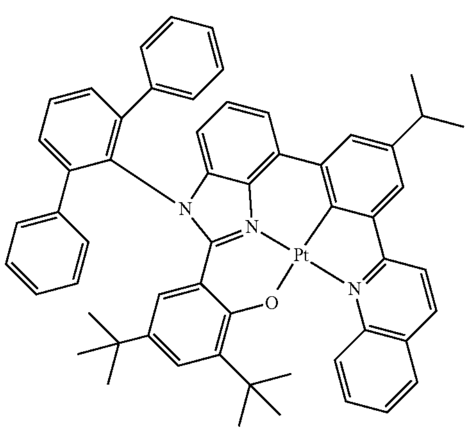
-continued
3-390
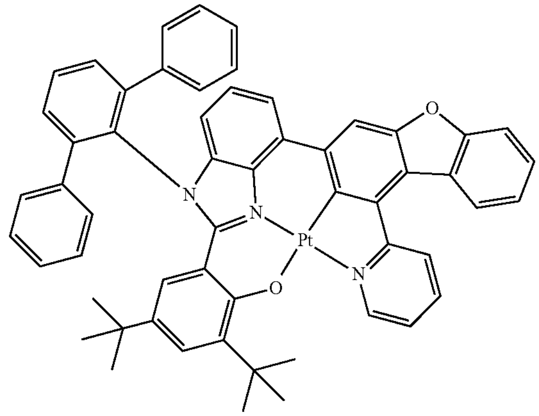
3-391
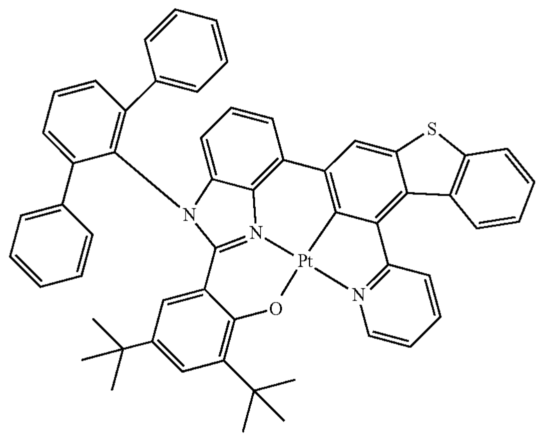
3-392
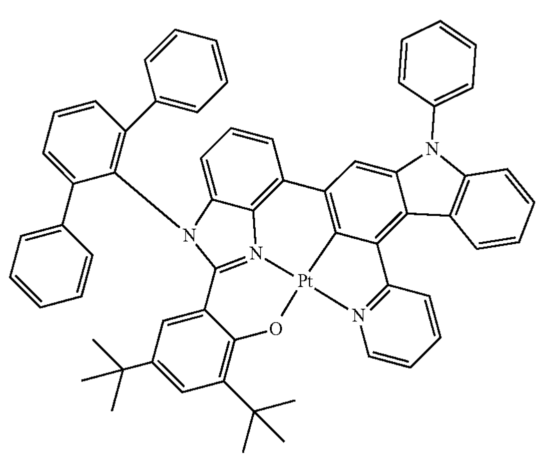

-continued
3-393
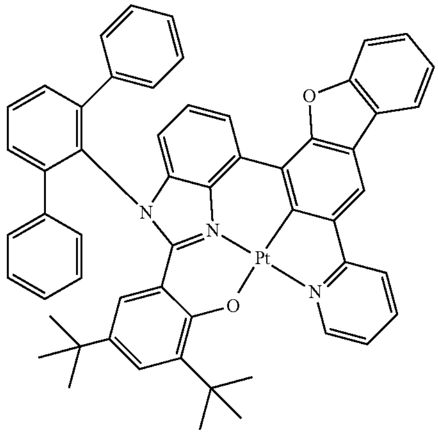
3-394
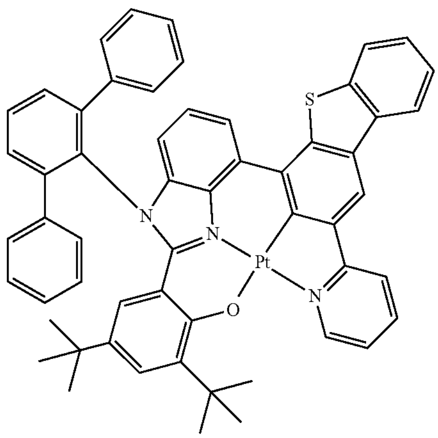
3-395
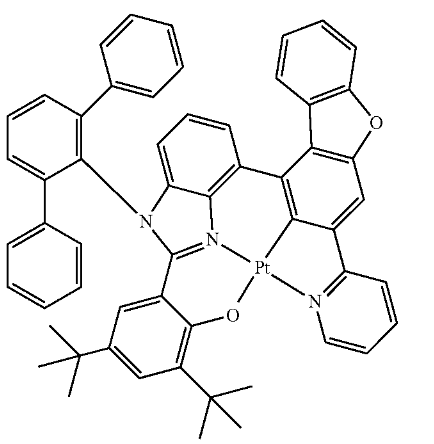
-continued
3-396
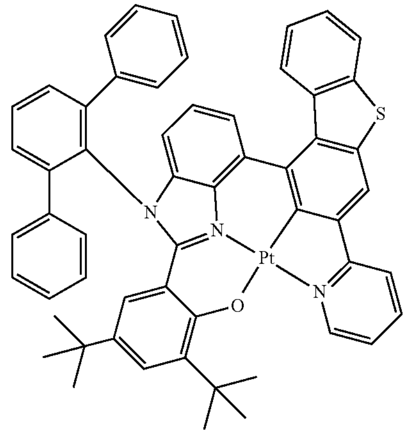
3-397
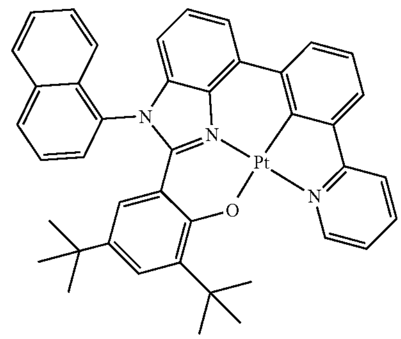
3-398
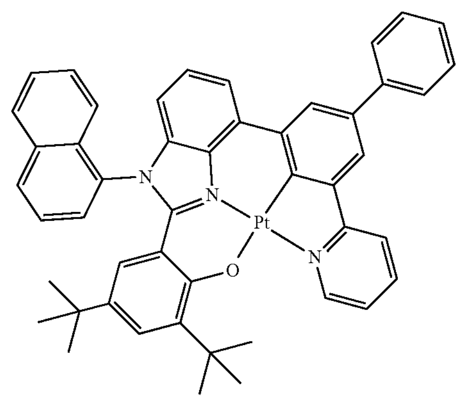
3-399
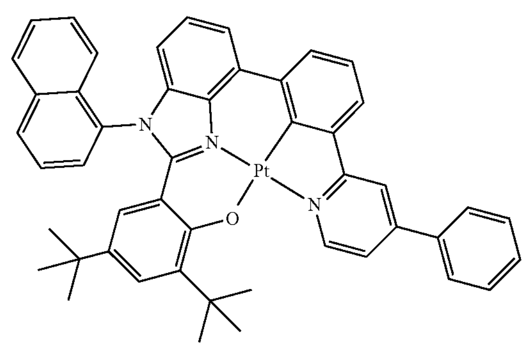

-continued
3-400
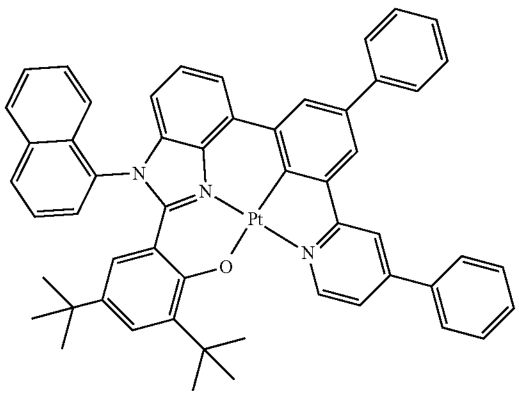
3-401
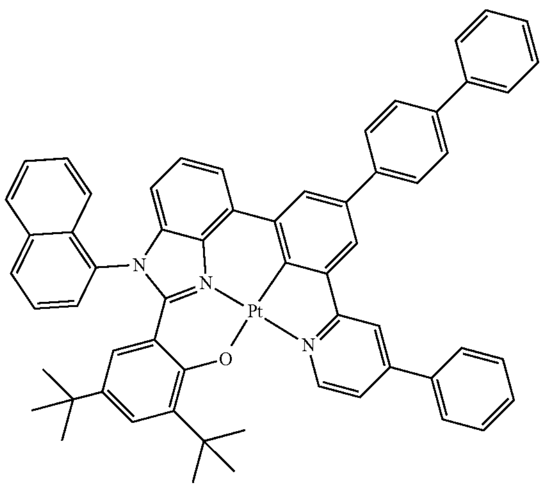
3-402
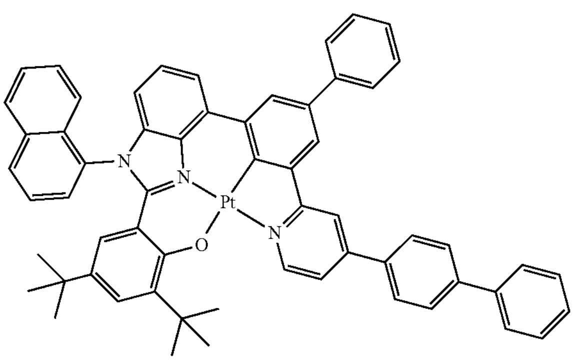
3-403
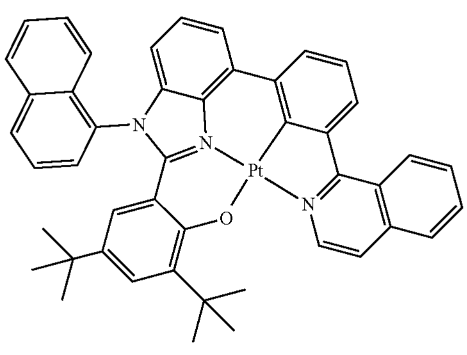
-continued
3-404
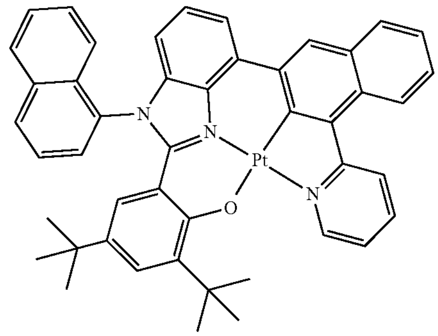
3-405
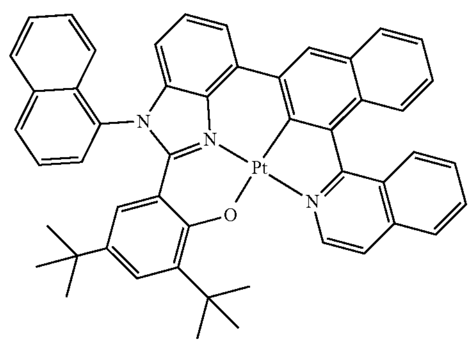
3-406
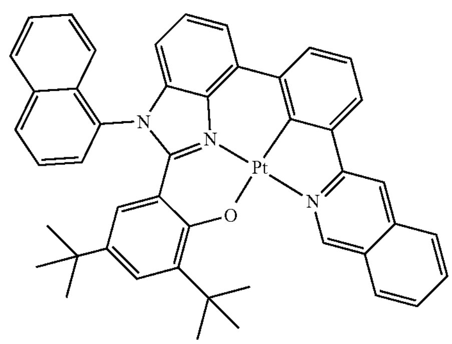
3-407
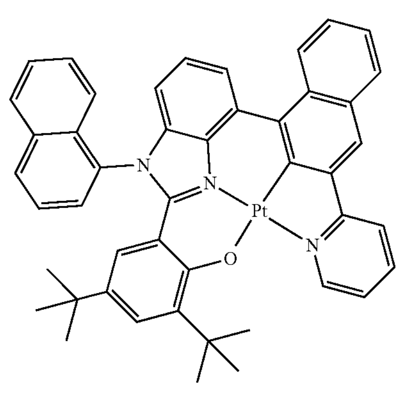

-continued
3-408
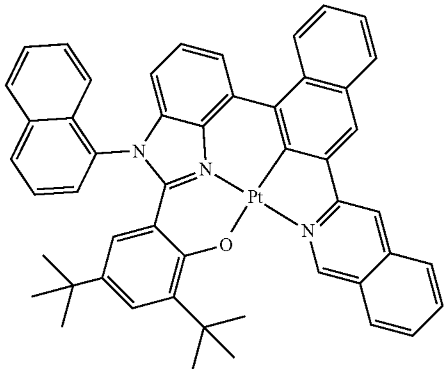
3-409
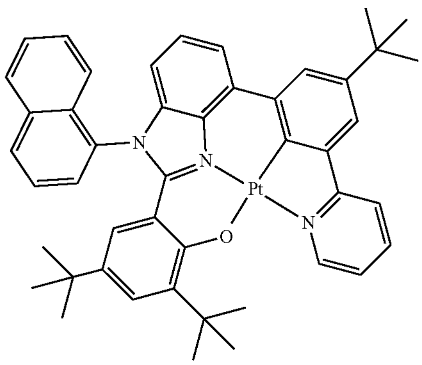
3-410
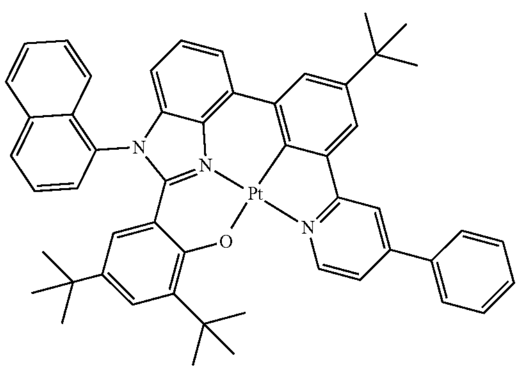
3-411
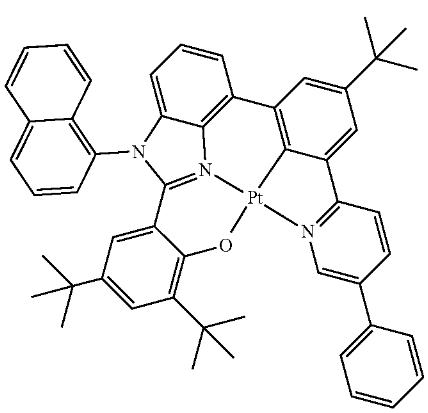
-continued
3-412
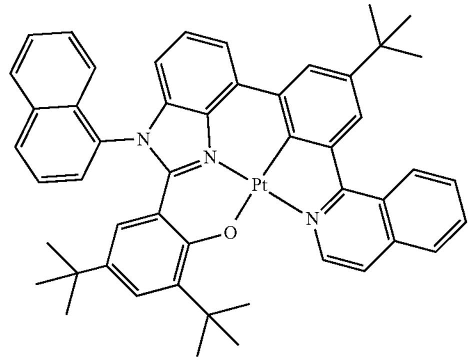
3-413
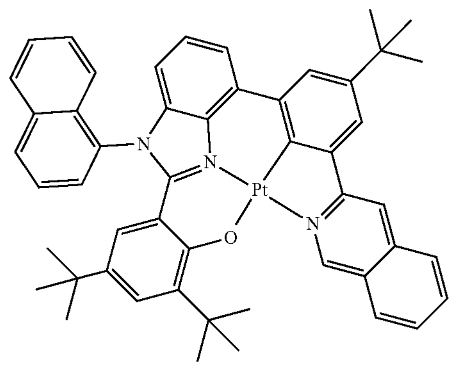
3-414
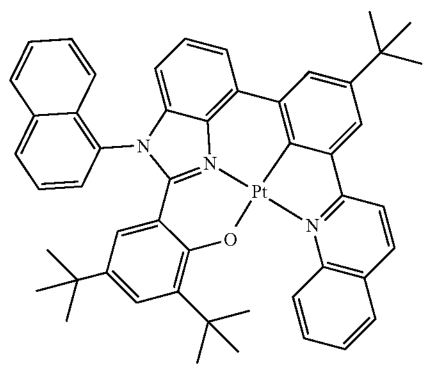
3-415
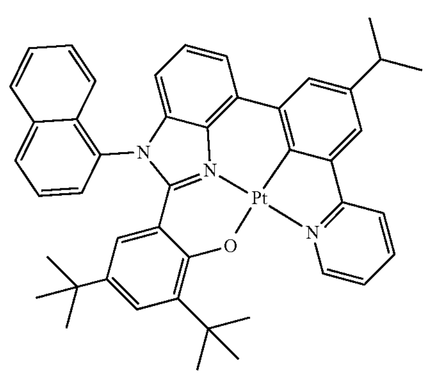

-continued
3-416
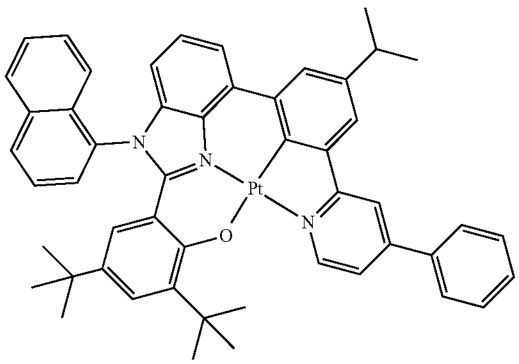
3-417
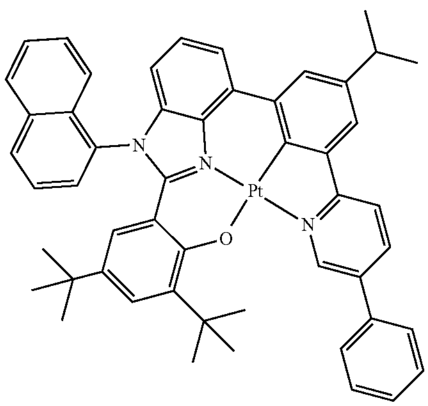
3-418
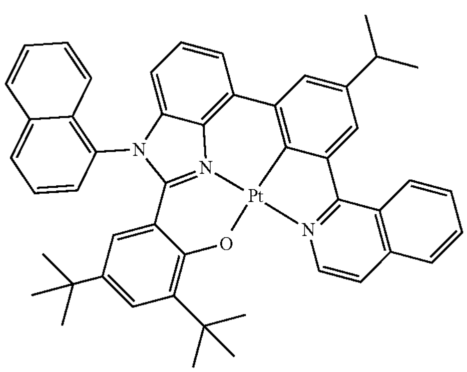
3-419
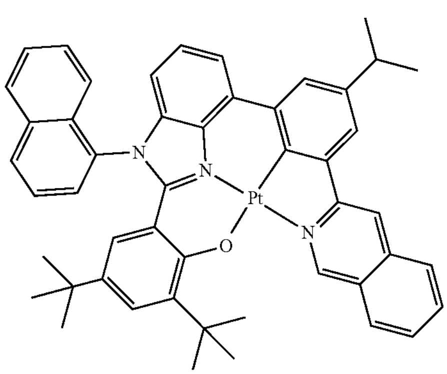
-continued
3-420
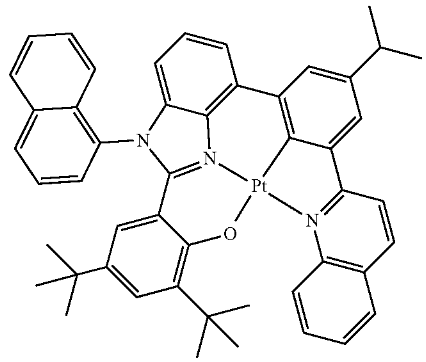
3-421
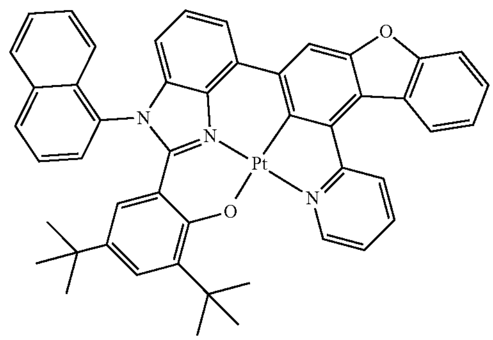
3-422
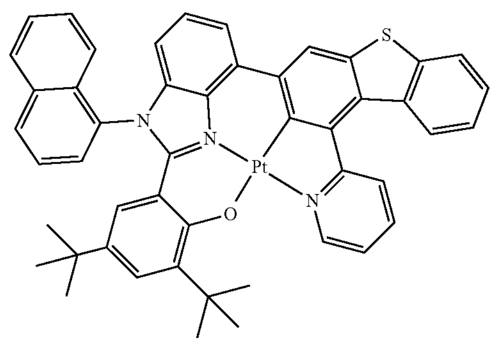
3-423
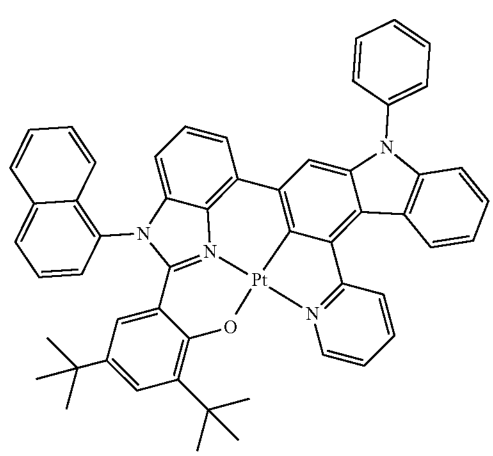

-continued
3-424
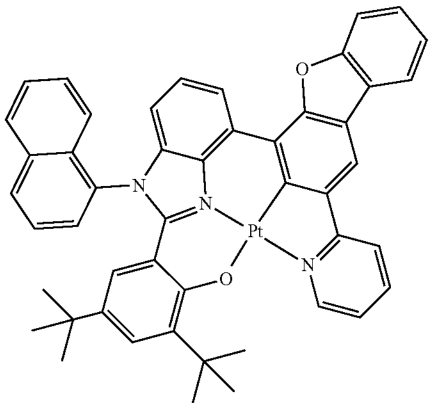
3-425
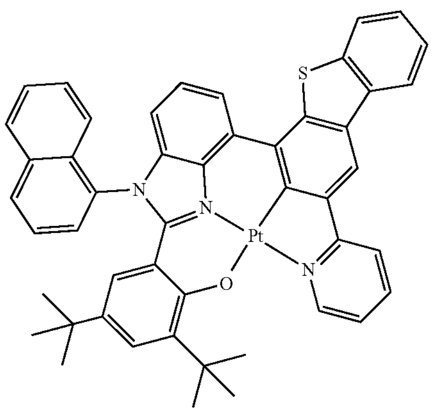
3-426
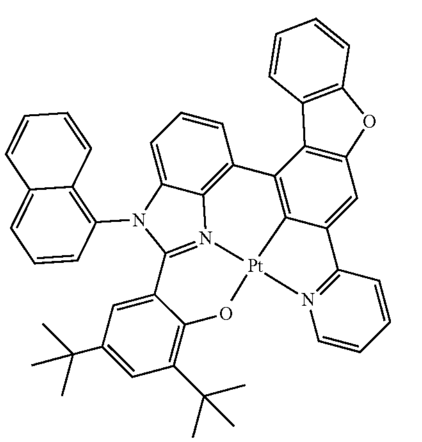
-continued
3-427
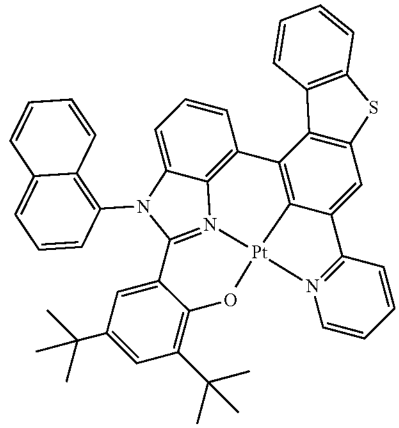
3-428
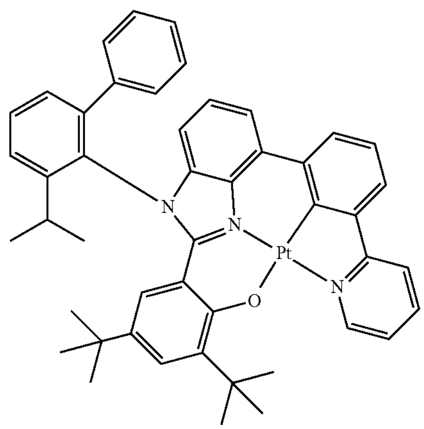
3-429
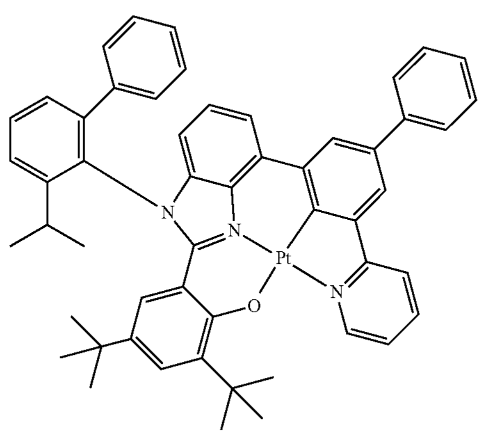

-continued
3-430
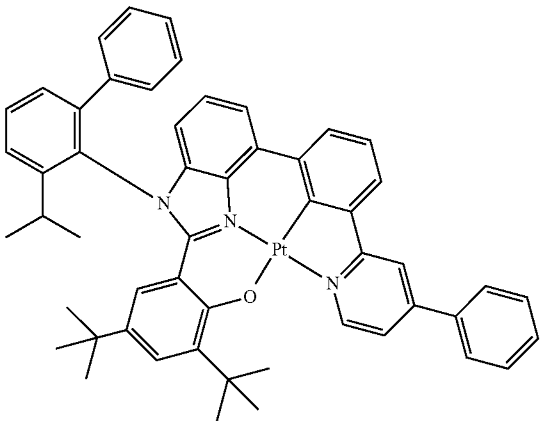
3-431
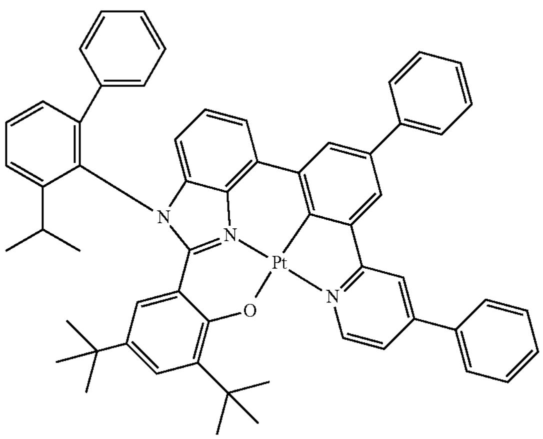
3-432
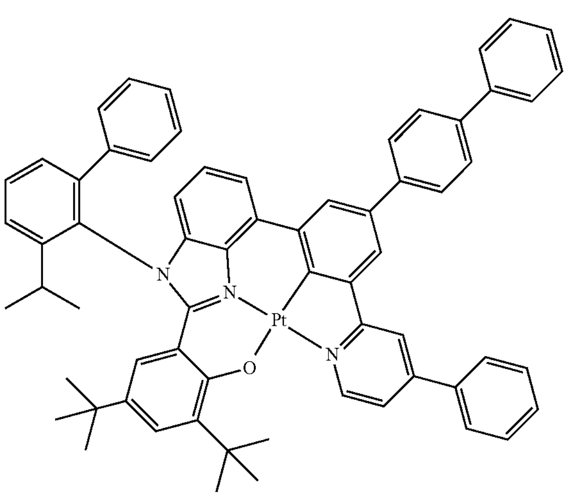
-continued
3-433
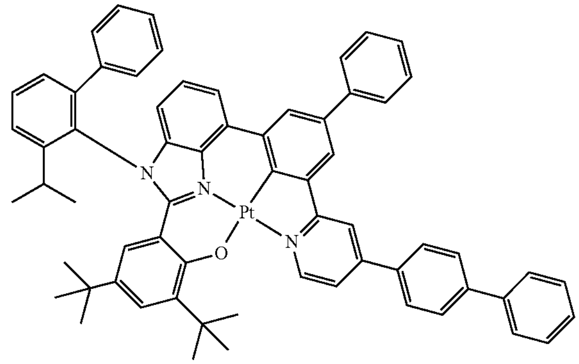
3-434
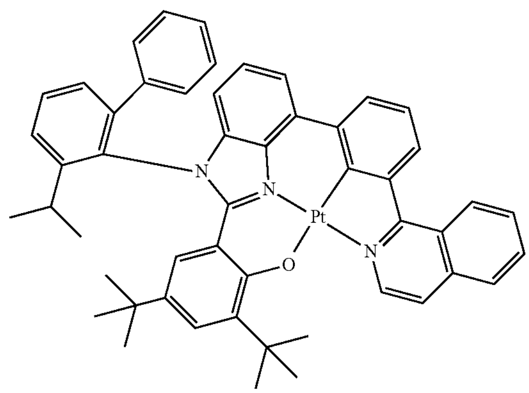
3-435
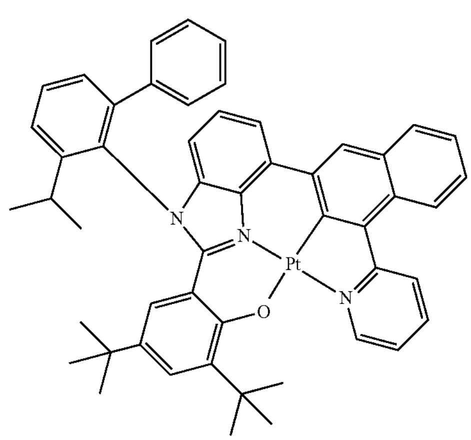

-continued
3-436
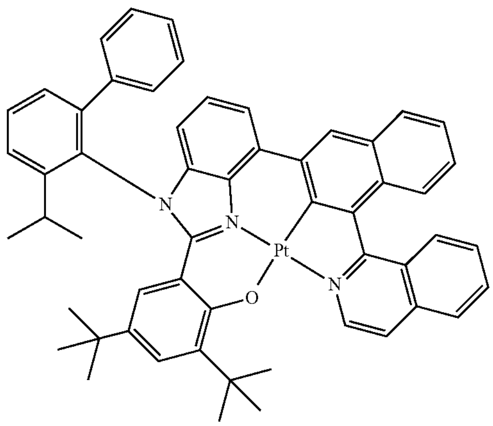
3-437
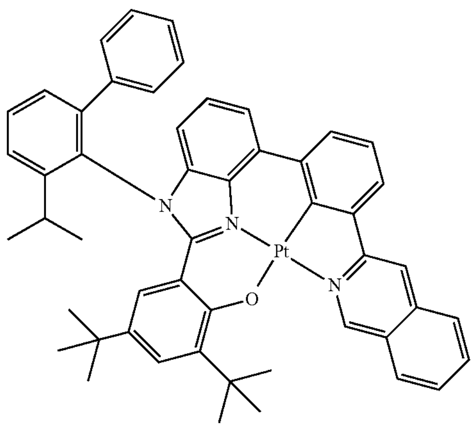
3-438
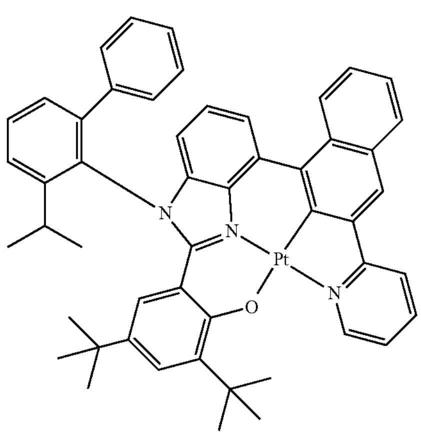
-continued
3-439
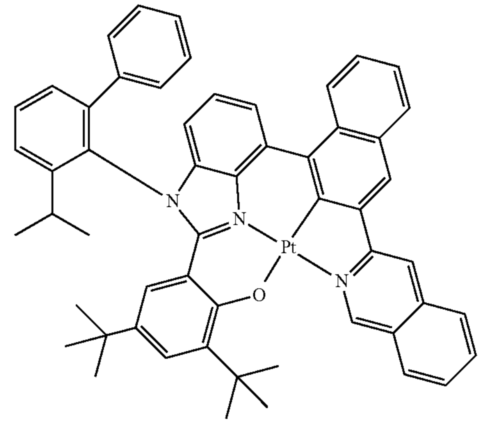
3-440
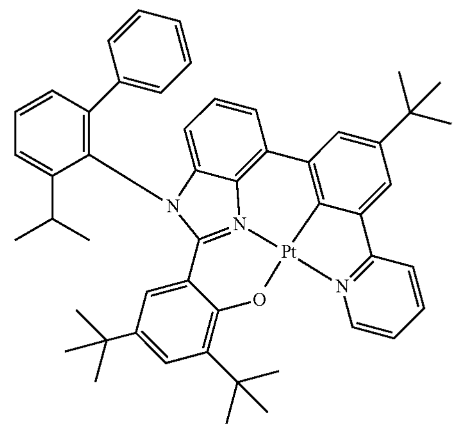
3-441
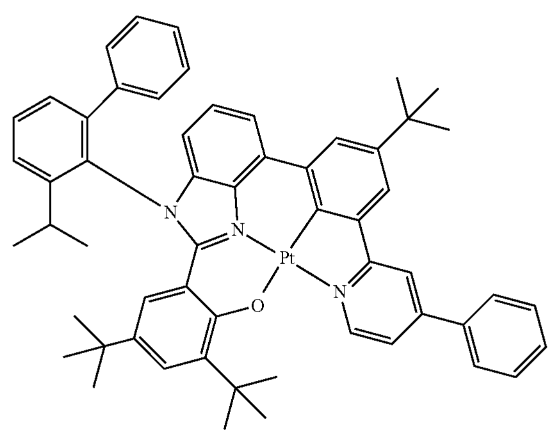

-continued
3-442
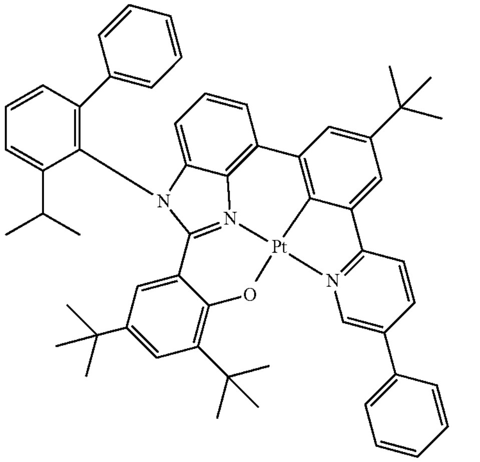
3-443
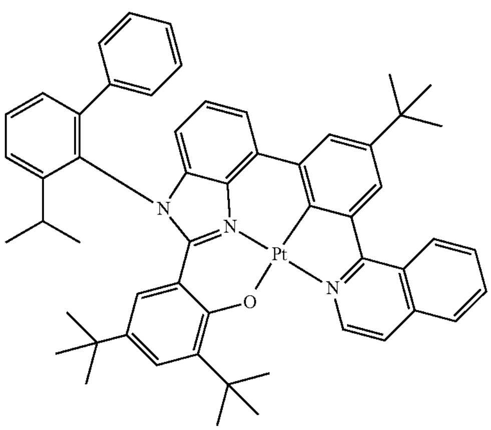
3-444
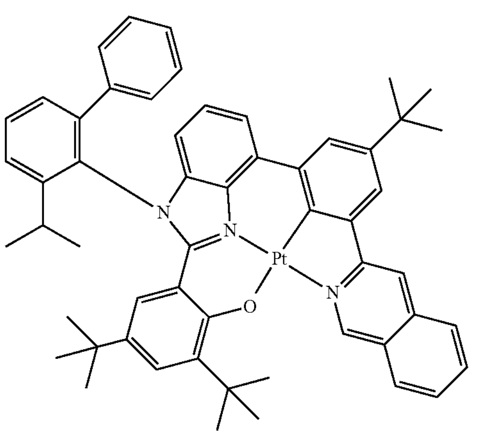
-continued
3-445
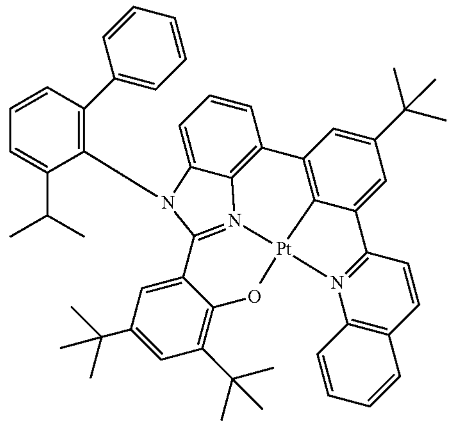
3-446
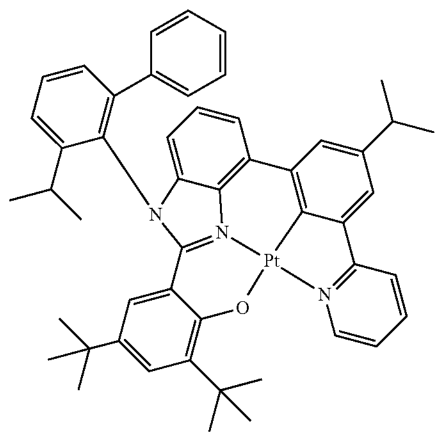
3-447
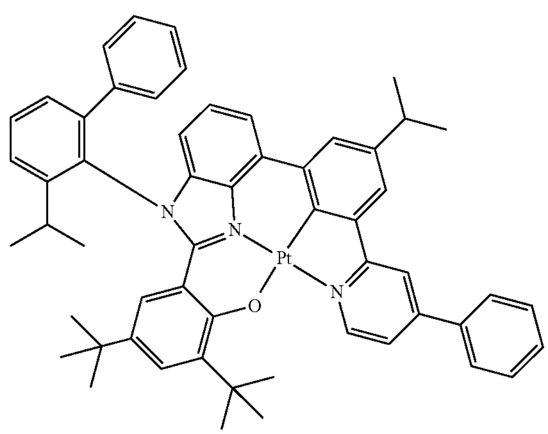

-continued
3-448
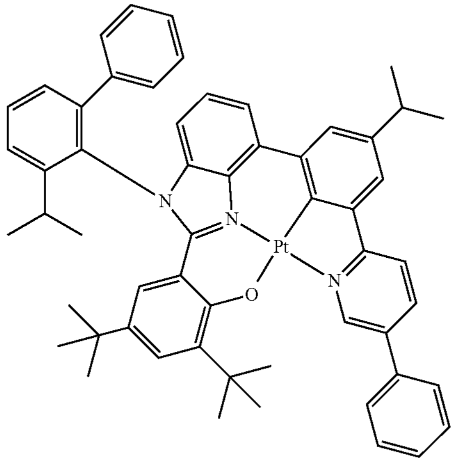
3-449
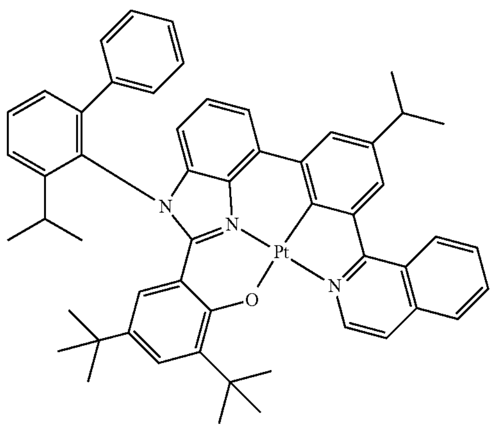
3-450
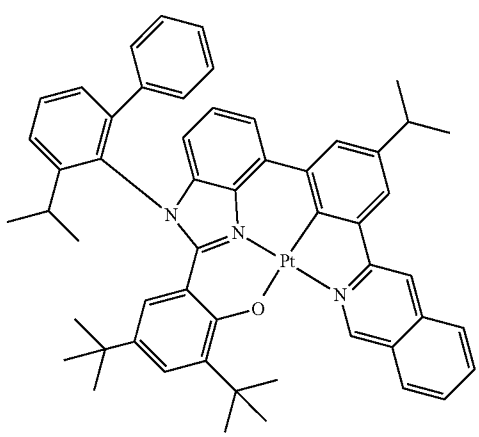
-continued
3-451
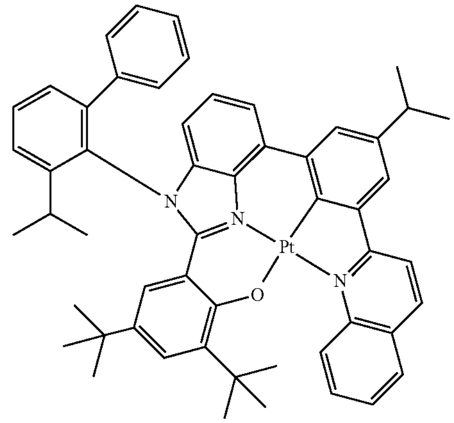
3-452
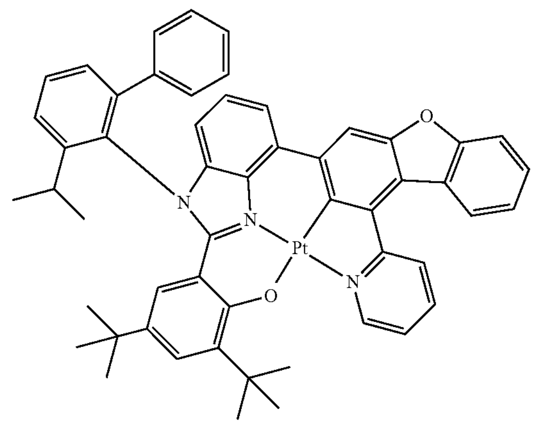
3-453
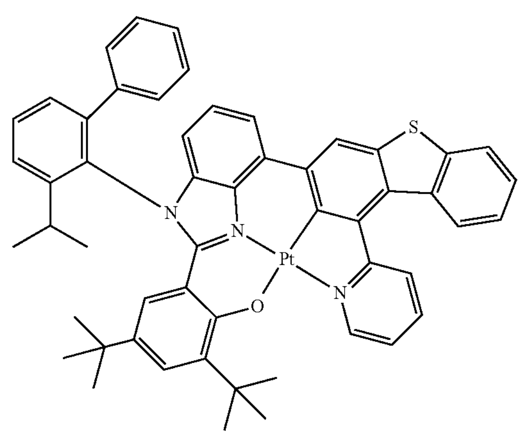

3-454
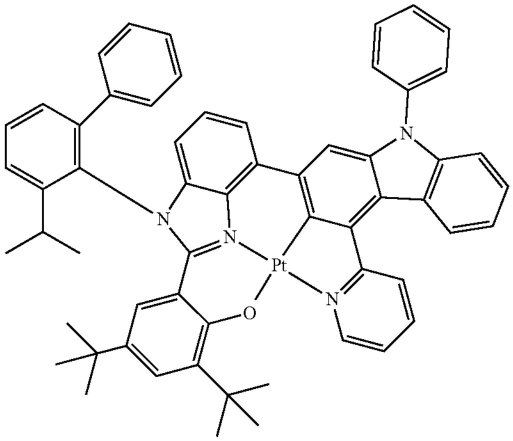
3-455
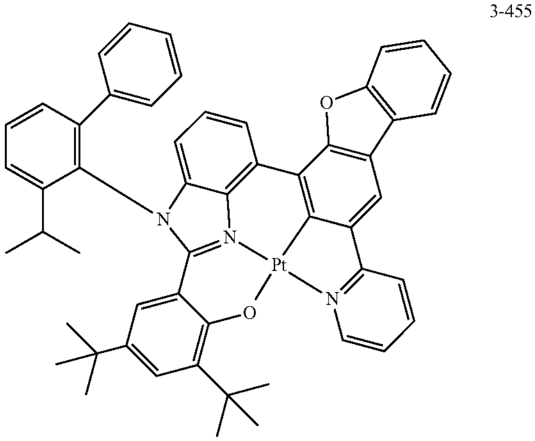
3-456
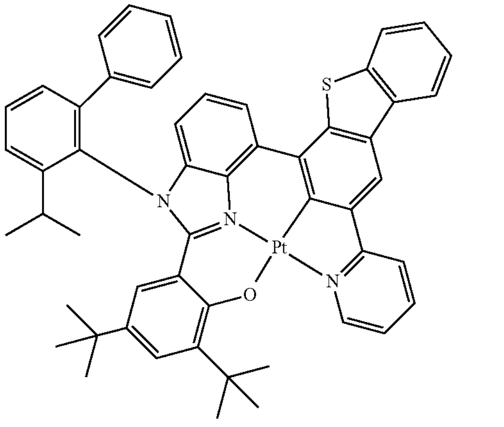
3-457
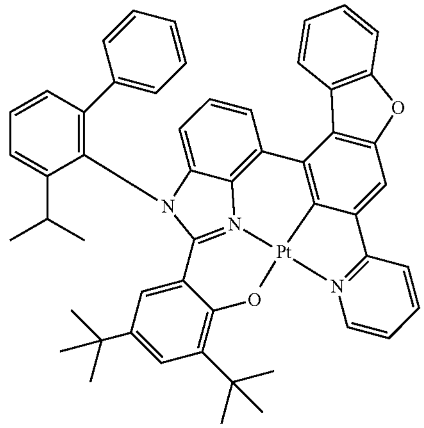
3-458
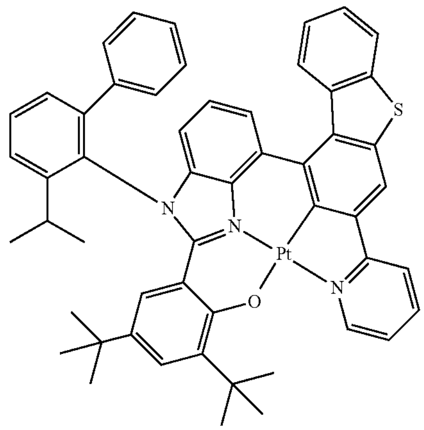
3-459
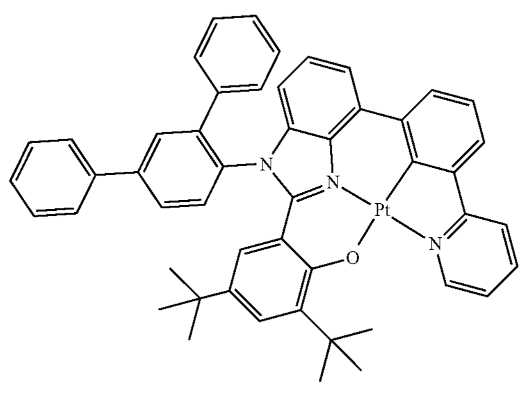

-continued
3-460
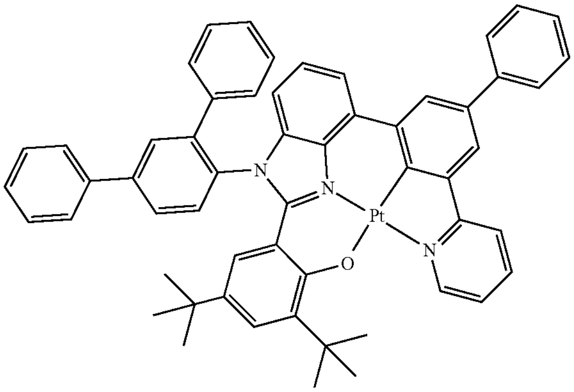
3-461
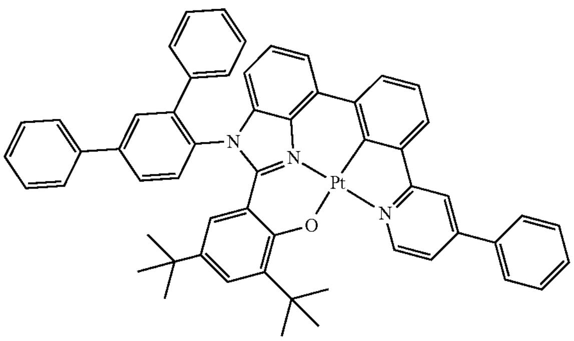
3-462
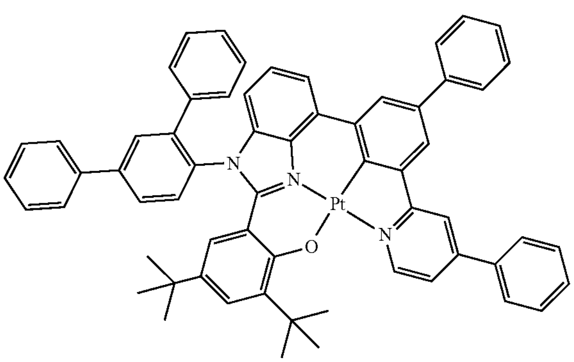
3-463
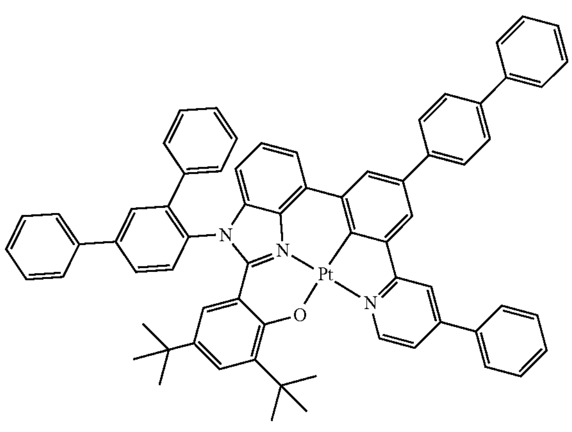
-continued
3-464
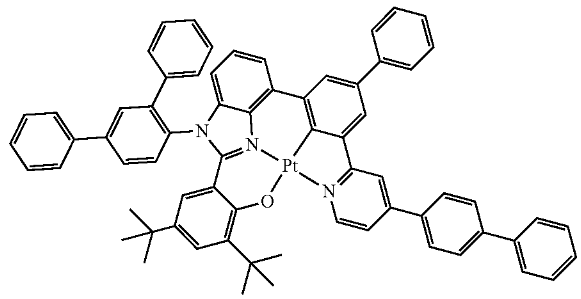
3-465
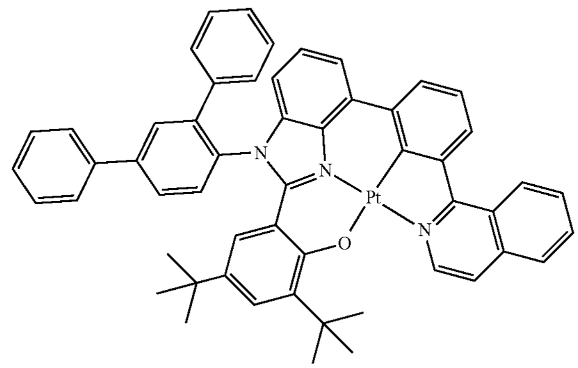
3-466
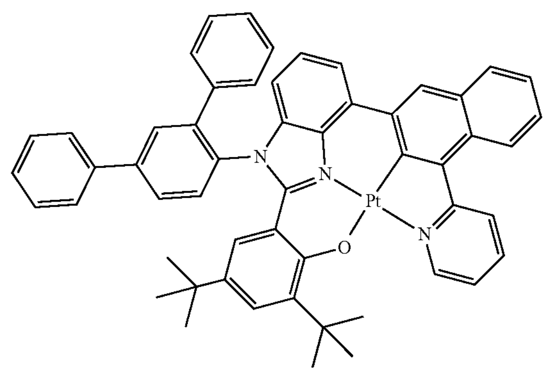
3-467
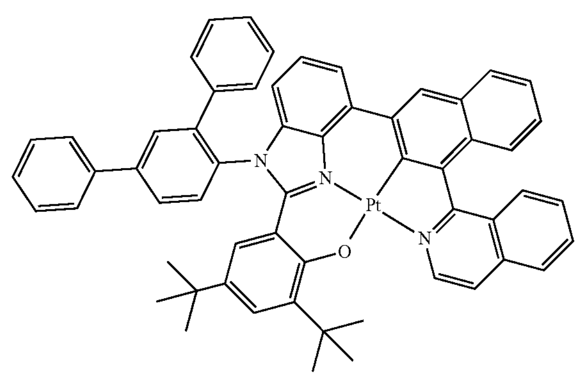

-continued
3-468
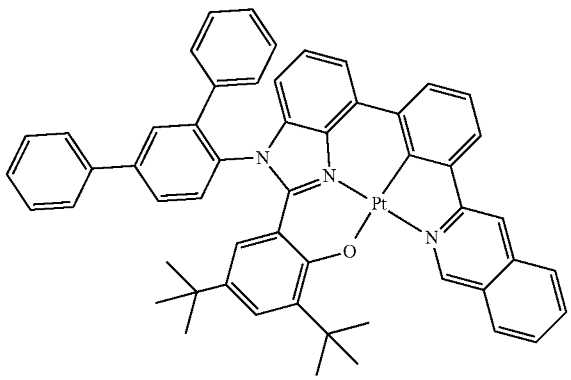
3-469
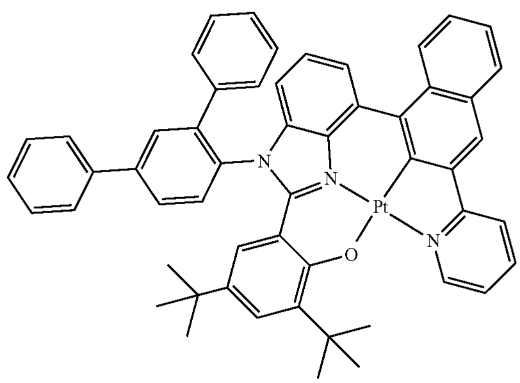
3-470
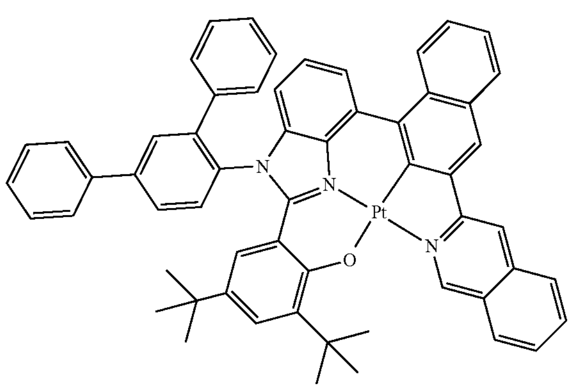
3-471
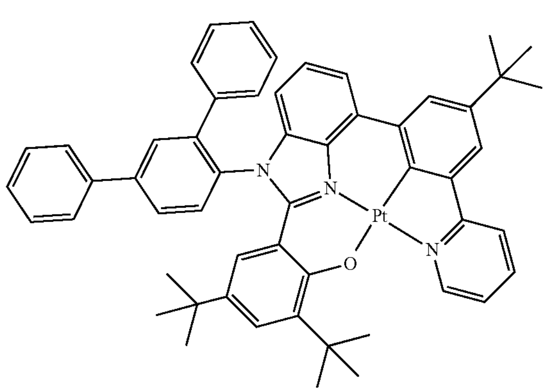
-continued
3-472
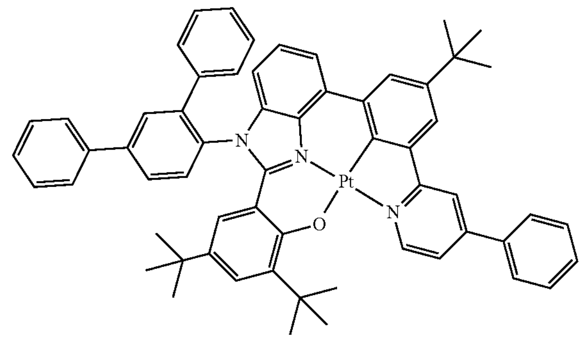
3-473
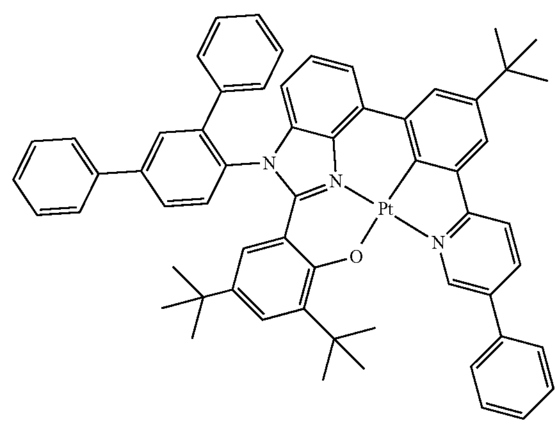
3-474
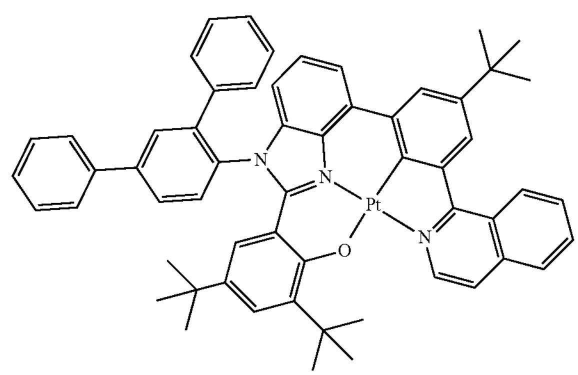
3-475
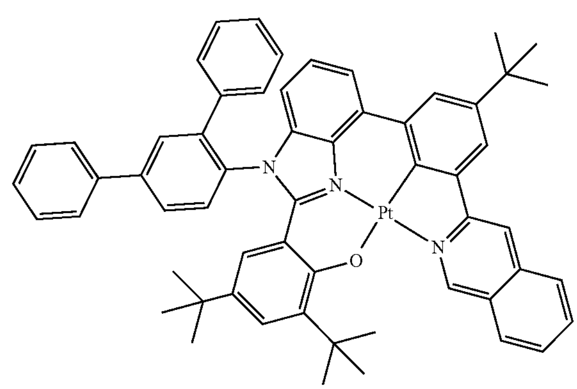

-continued
3-476
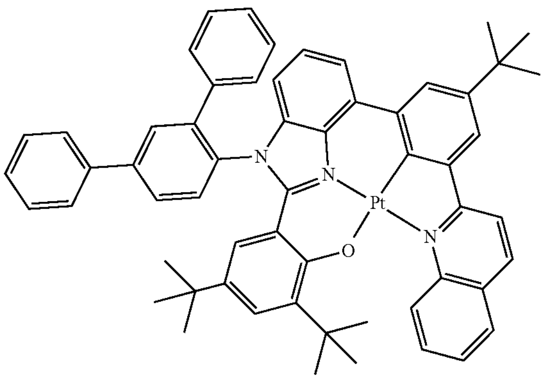
3-477
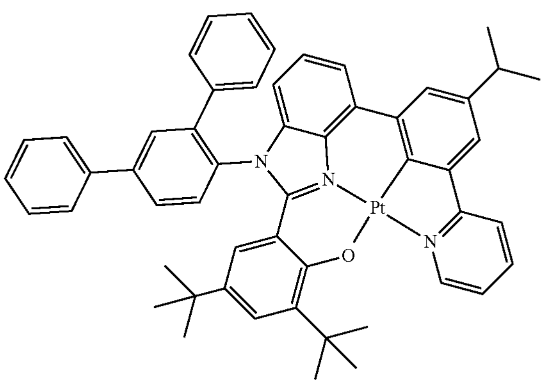
3-478
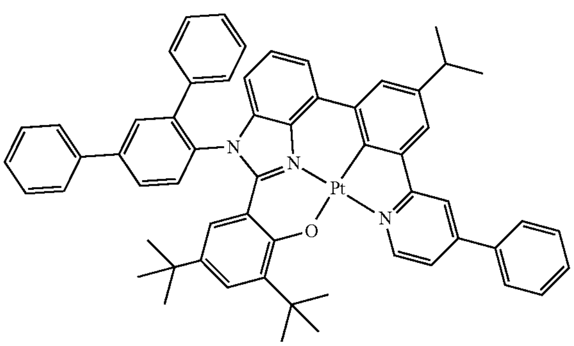
3-479
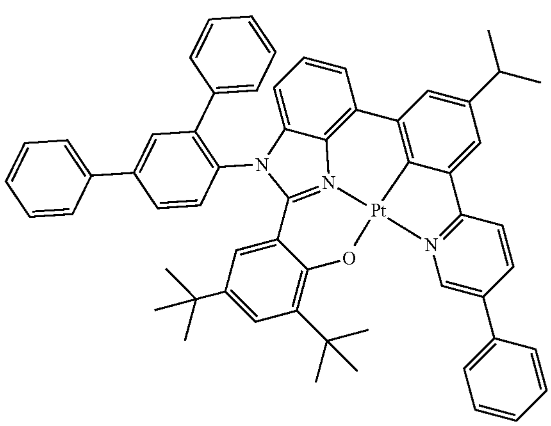
-continued
3-480
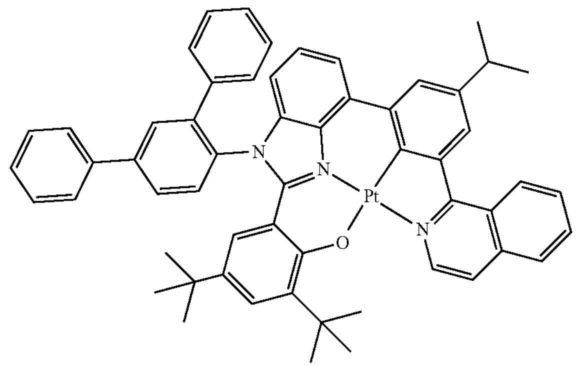
3-481
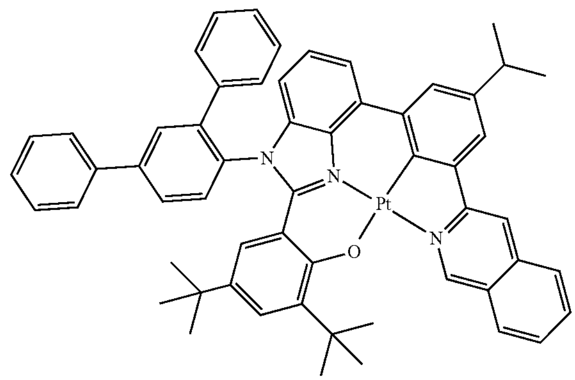
3-482
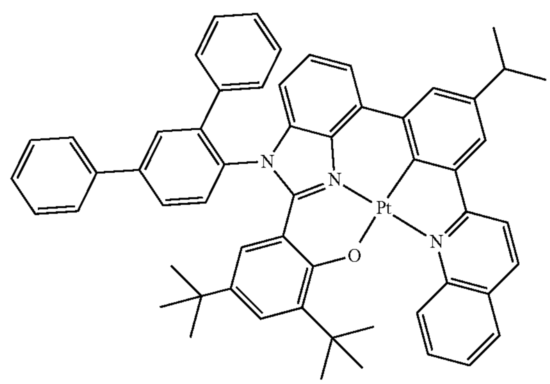
3-483
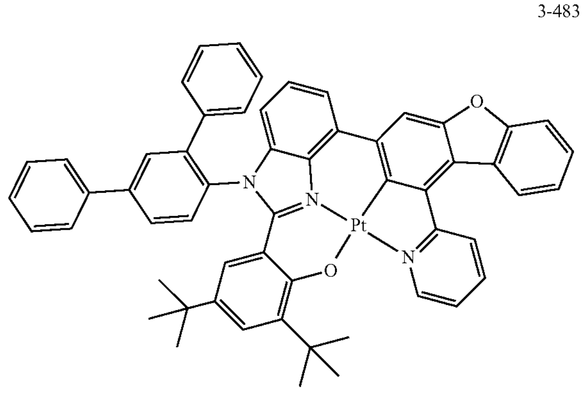

-continued
3-484
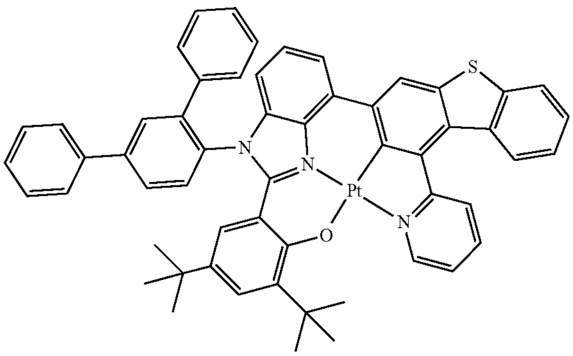
3-485
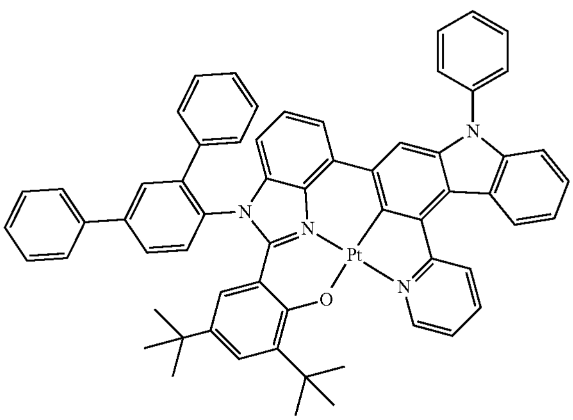
3-486
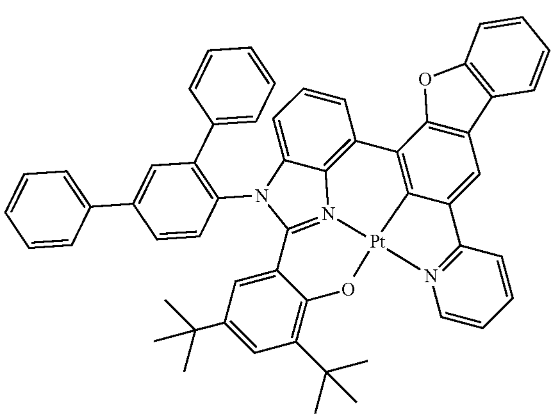
-continued
3-487
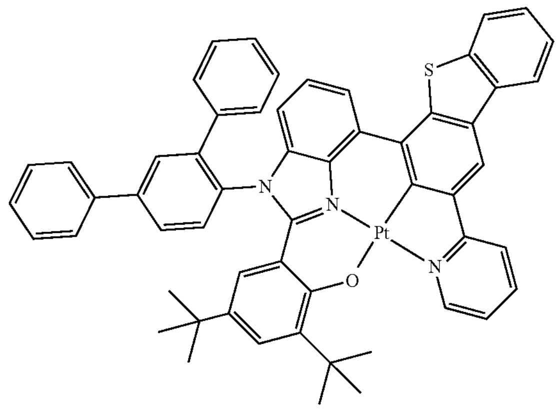
3-488
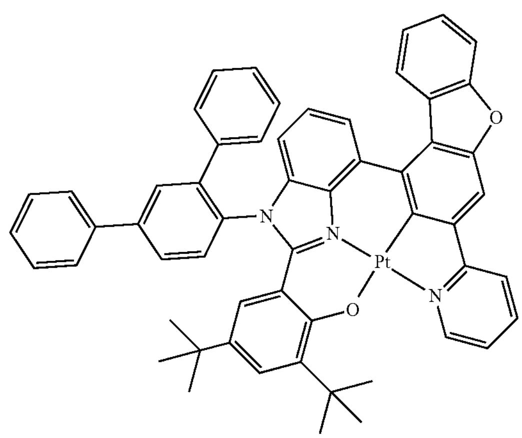
3-489
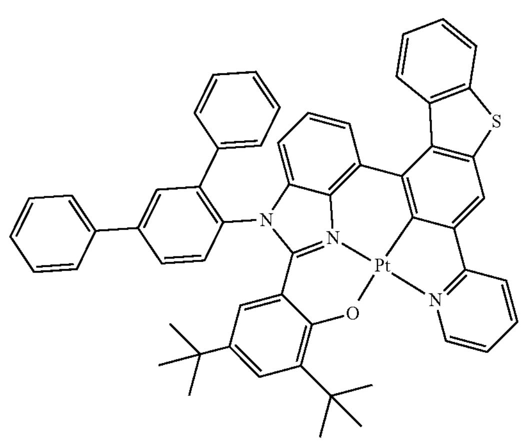

-continued
3-490
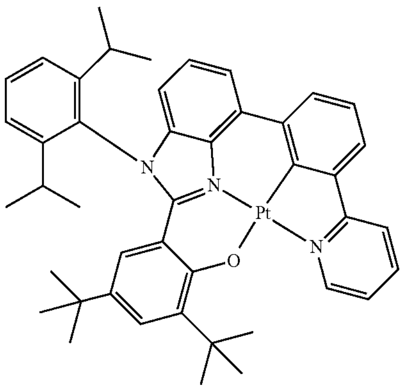
3-491
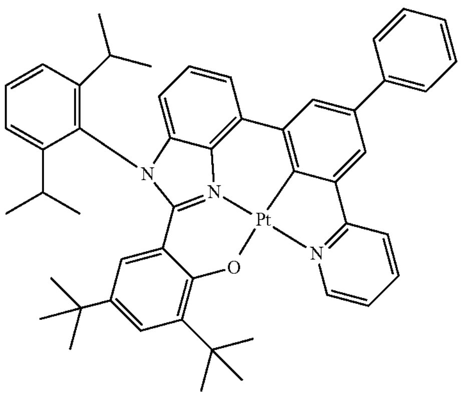
3-492
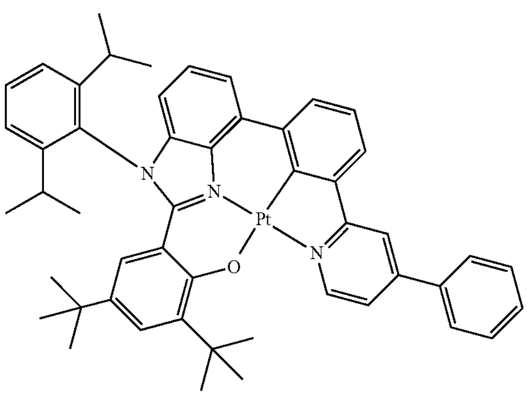
3-493
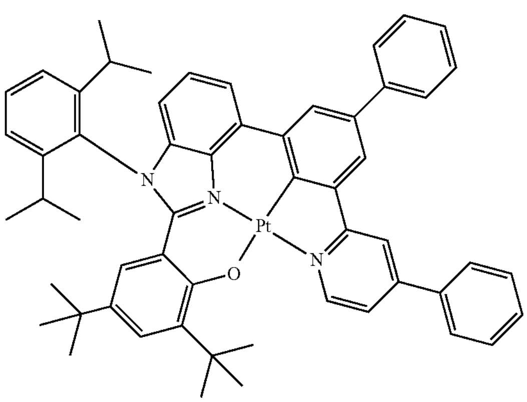
-continued
3-494
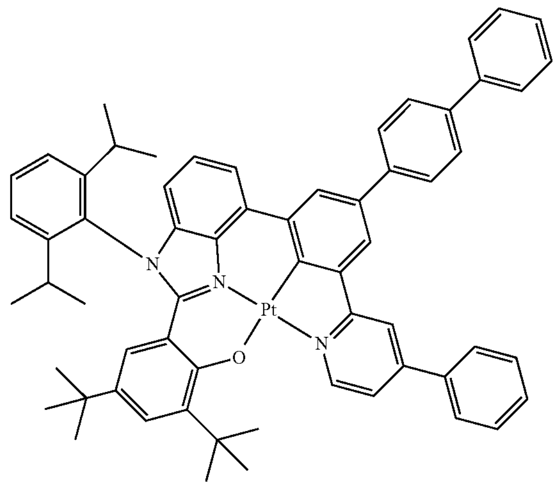
3-495
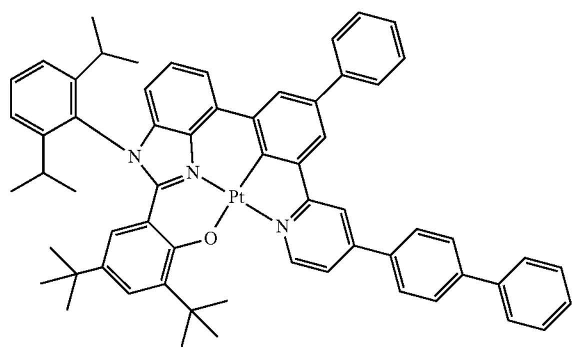
3-496
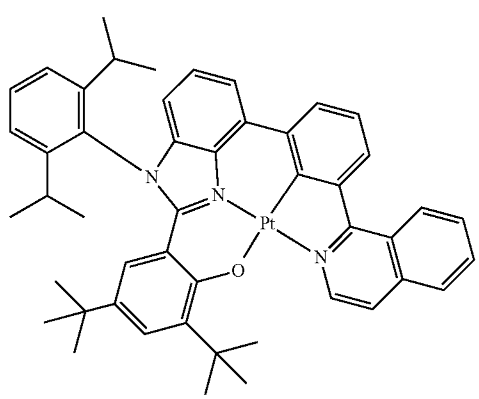

-continued
3-497
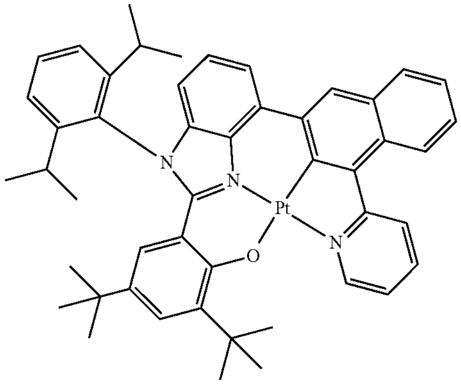
3-498
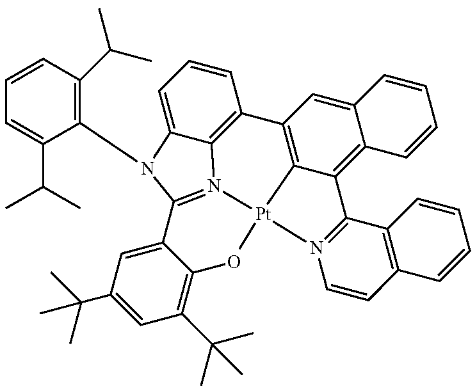
3-499
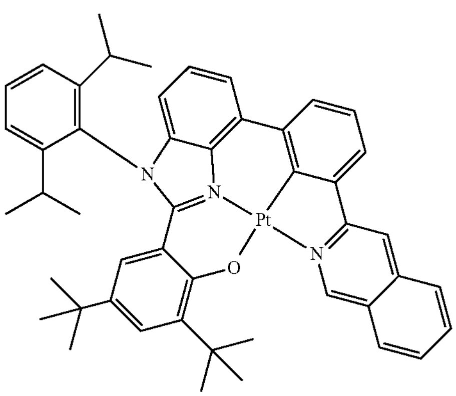
3-500
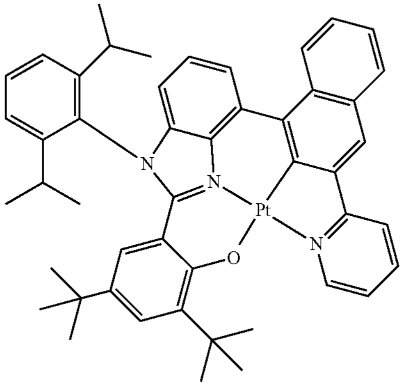
-continued
3-501
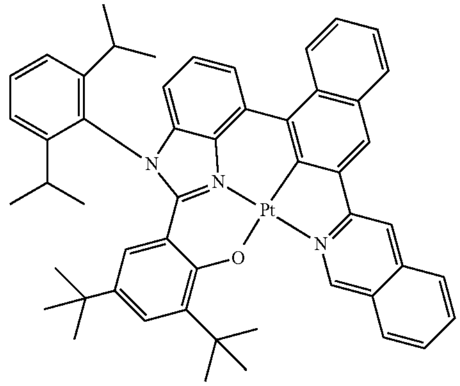
3-502
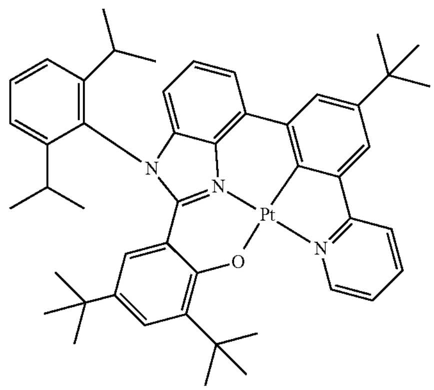
3-503
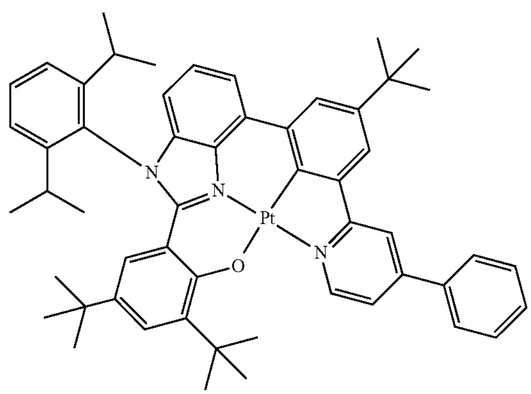
3-504
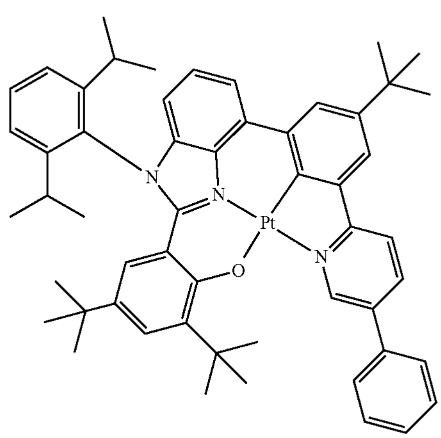

-continued
3-505
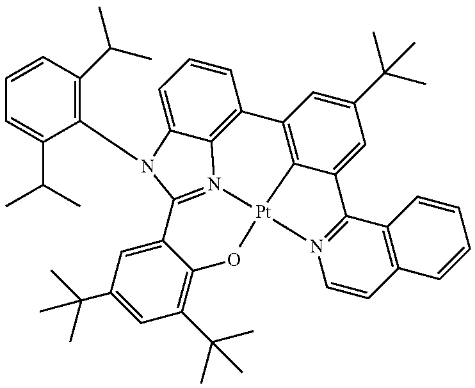
3-506
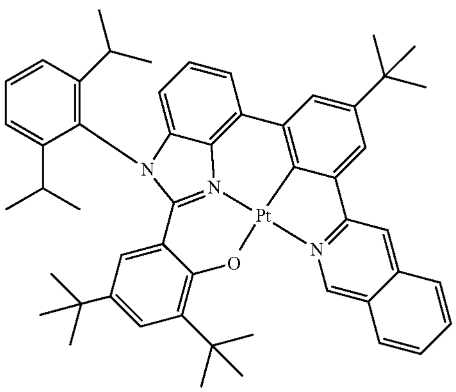
3-507
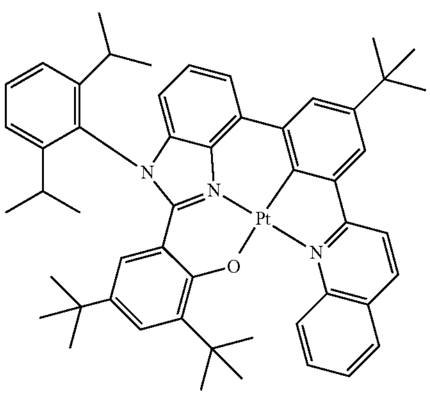
3-508
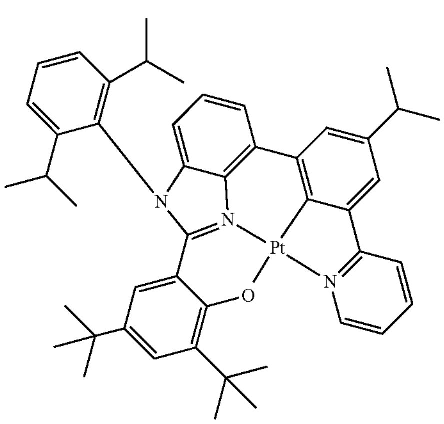
-continued
3-509
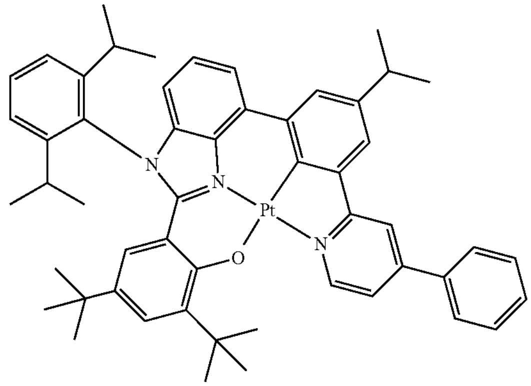
3-510
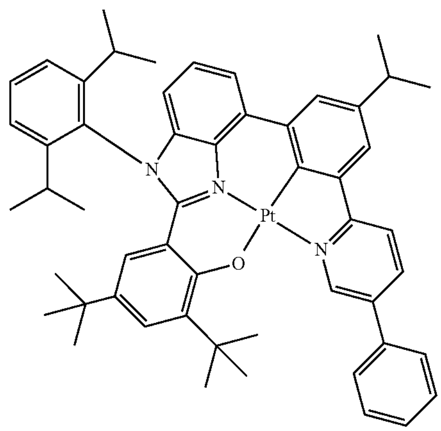
3-511
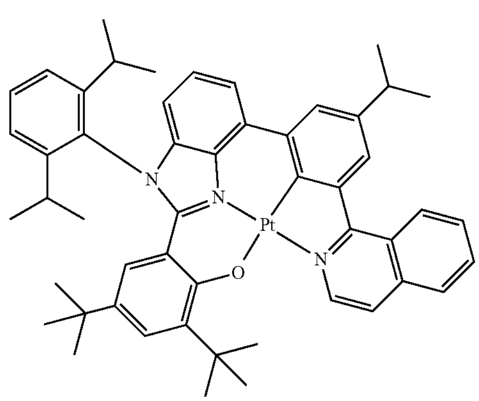

-continued
3-512
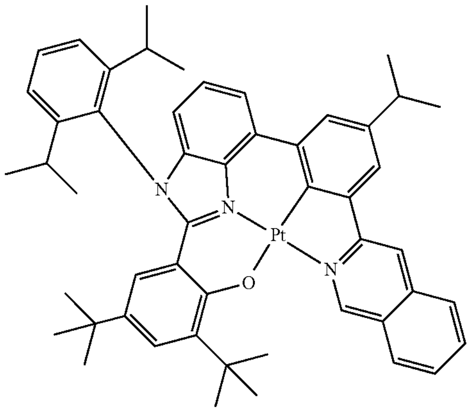
3-513
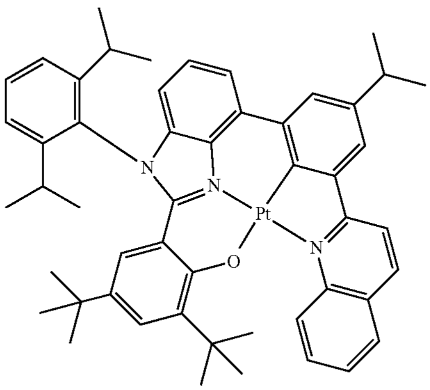
3-514
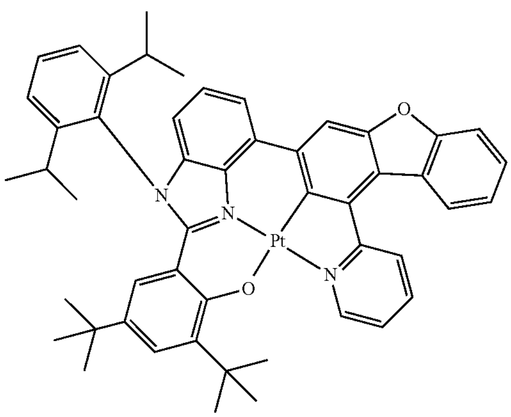
3-515
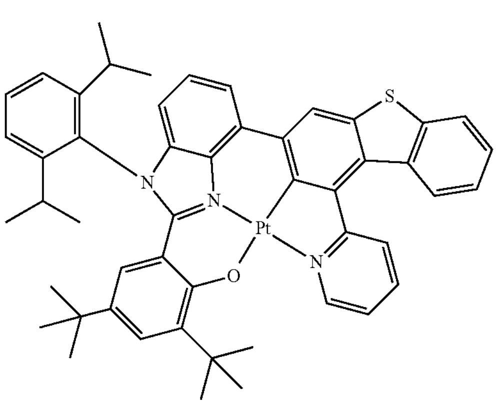
-continued
3-516
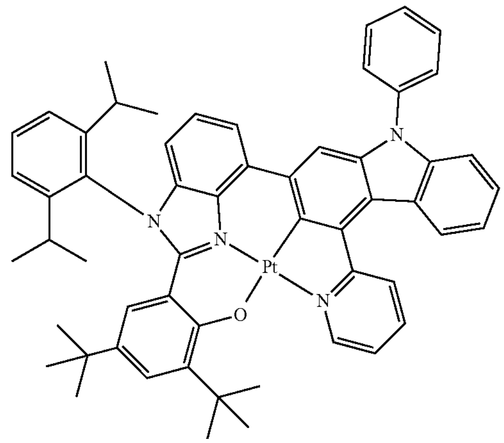
3-517
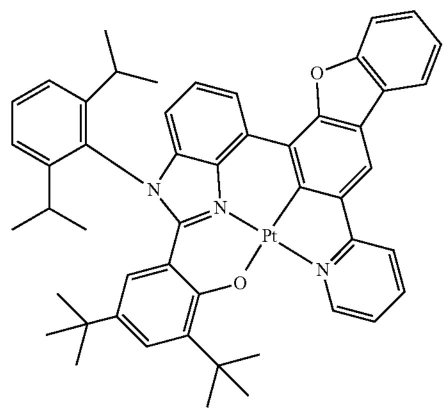
3-518
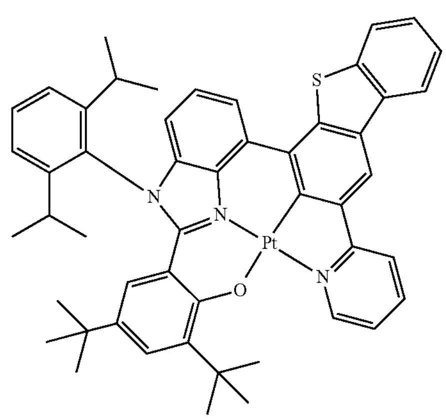

-continued
3-519
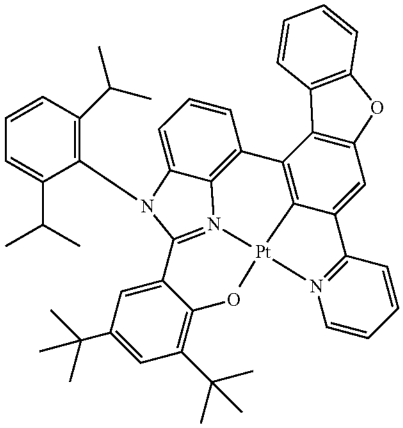
3-520
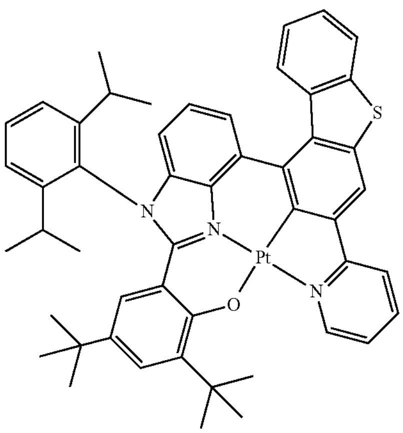
3-521
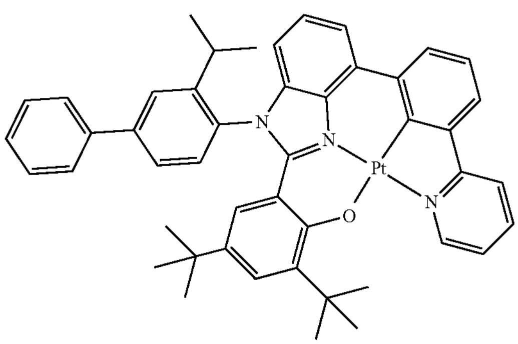
3-522
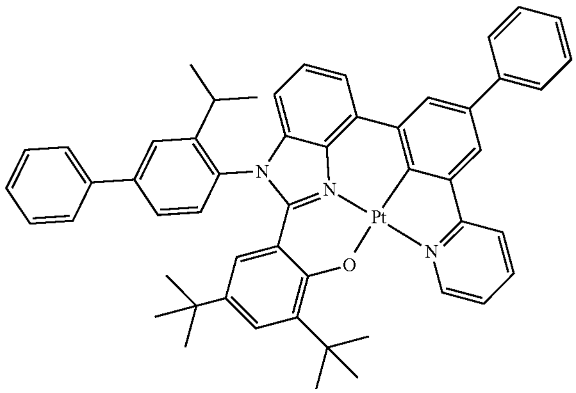
-continued
3-523
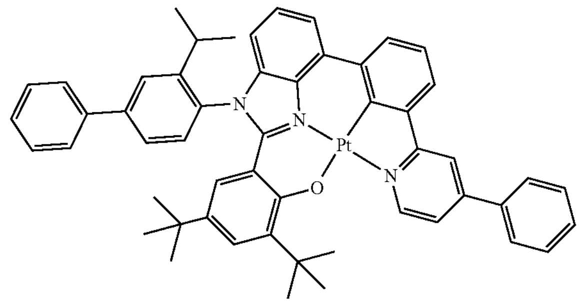
3-524
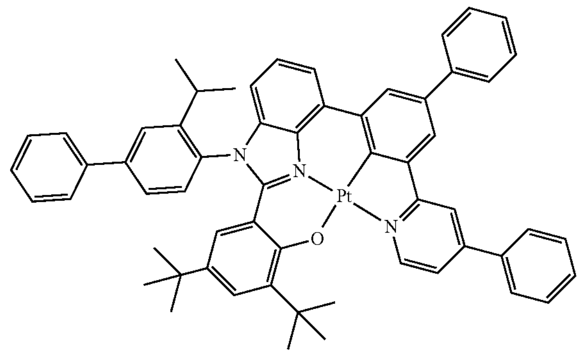
3-525
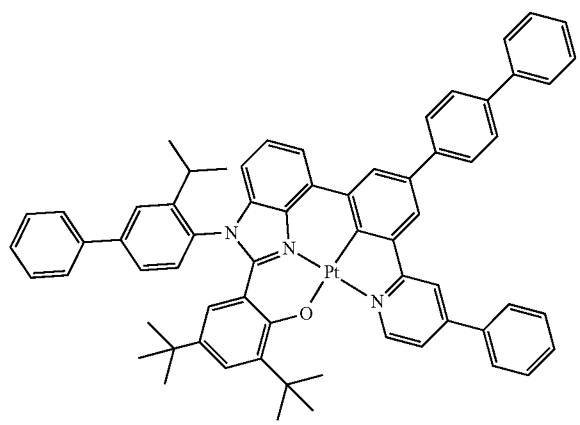
3-526
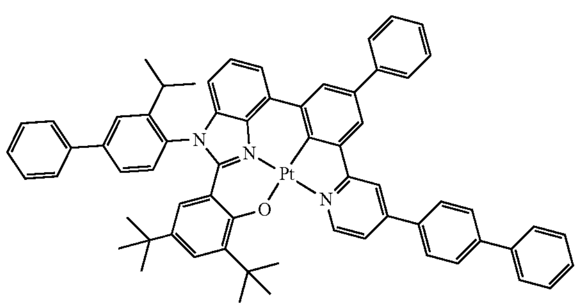

3-527
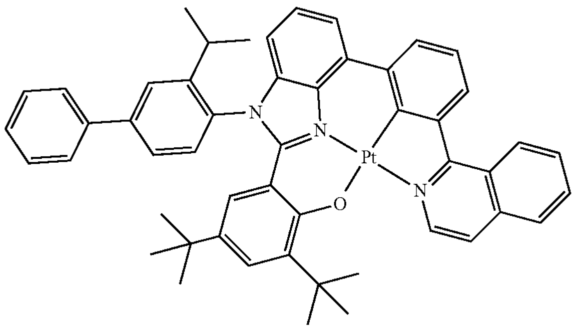
3-528
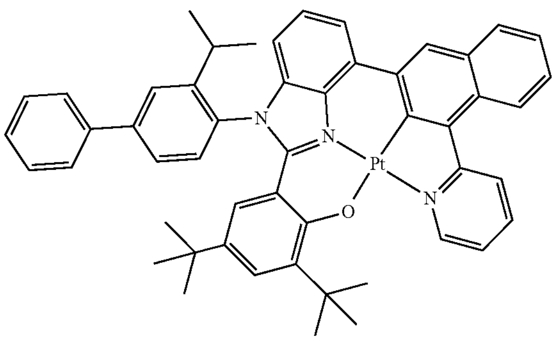
3-529
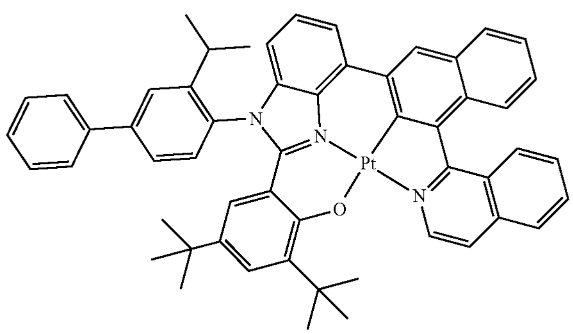
3-530
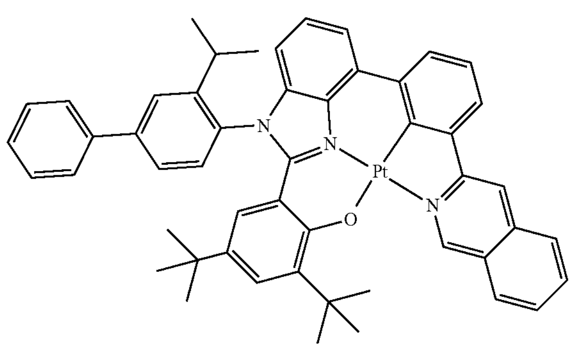
3-531
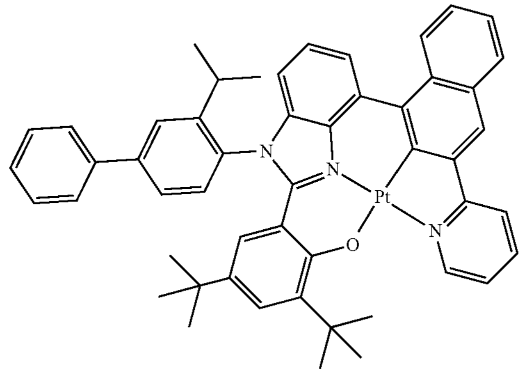
3-532
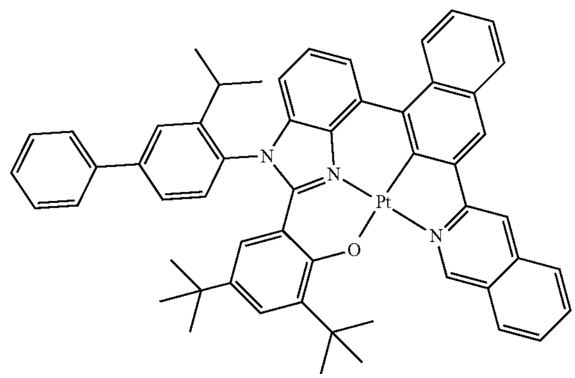
3-533
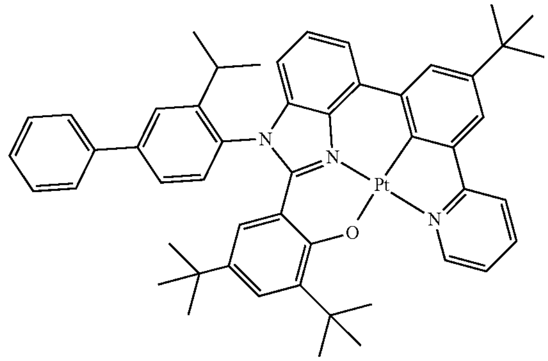
3-534
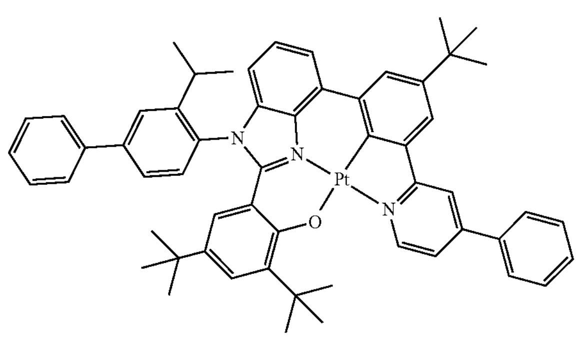

-continued
3-535
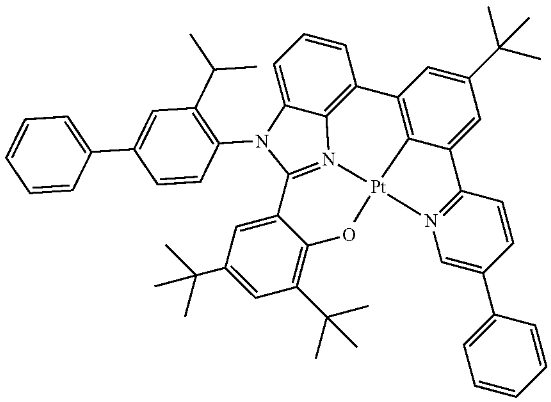
3-536
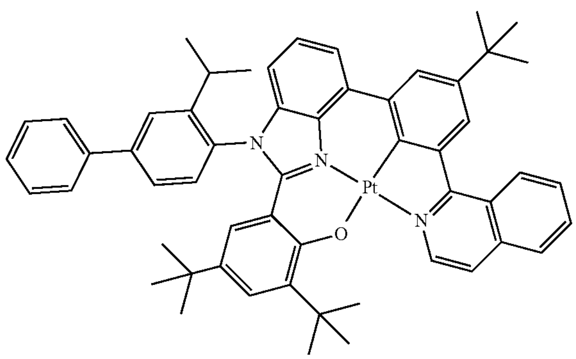
3-537
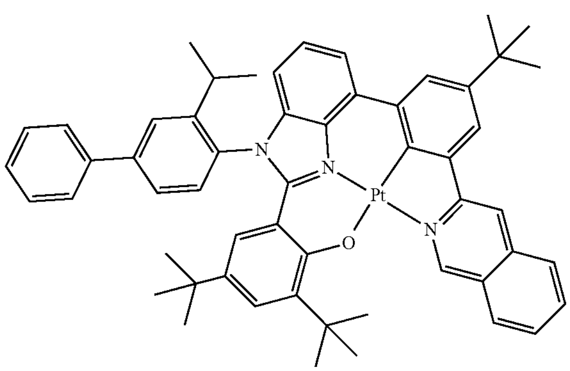
3-538
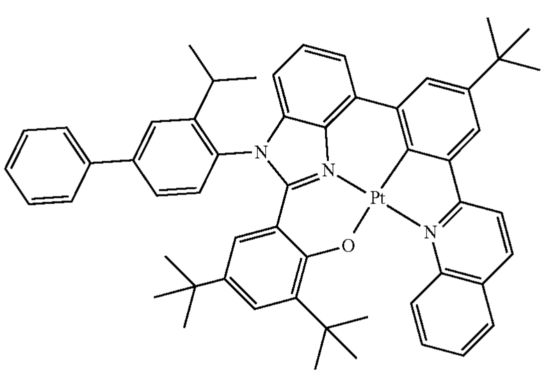
-continued
3-539
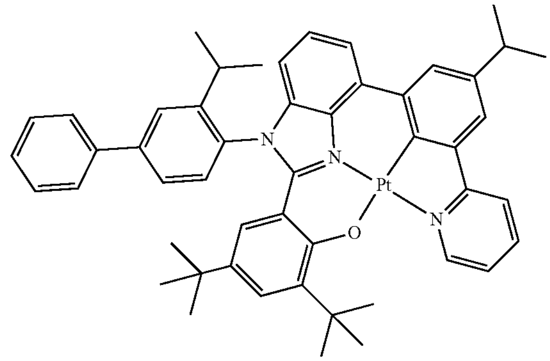
3-540
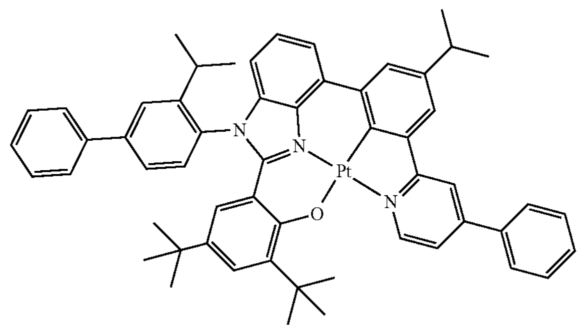
3-541
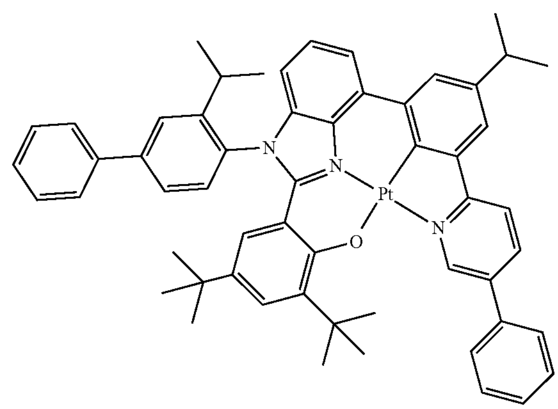
3-542
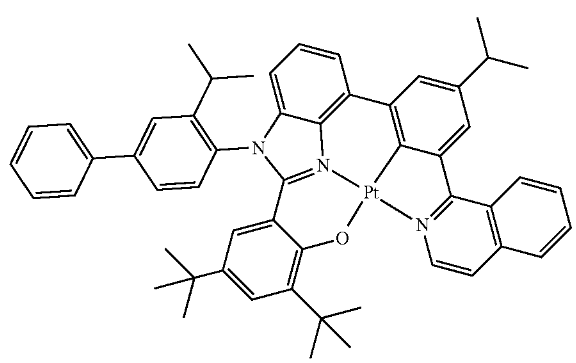

-continued
3-543
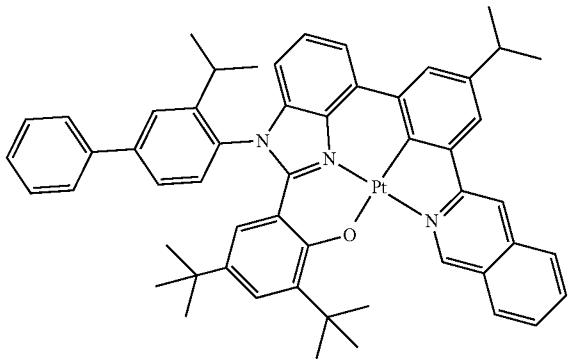
3-544
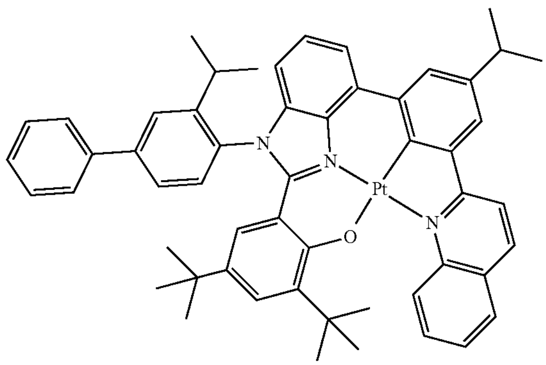
3-545
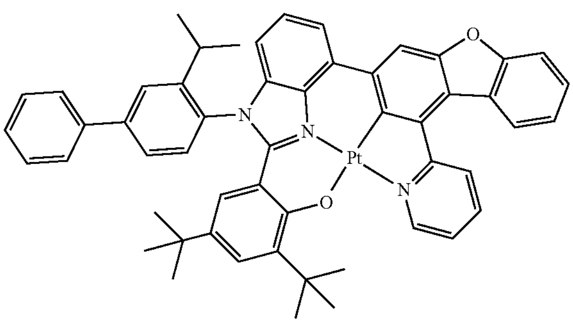
3-546
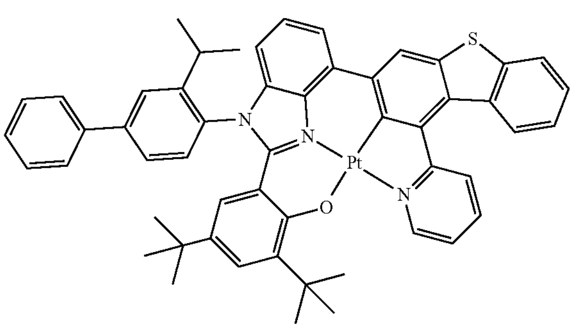
-continued
3-547
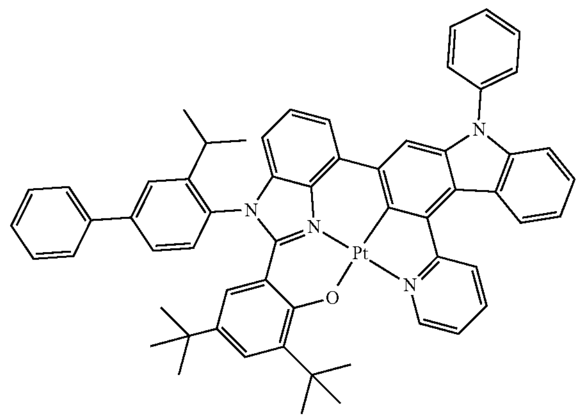
3-548
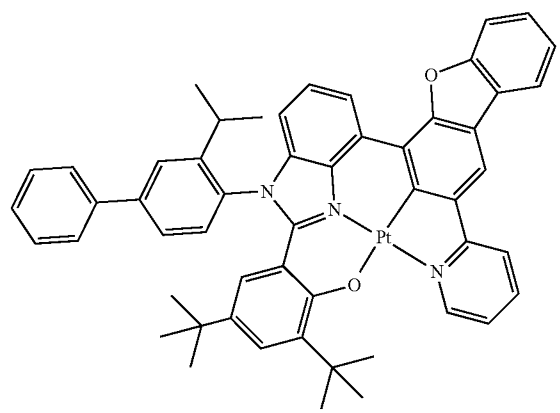
3-549
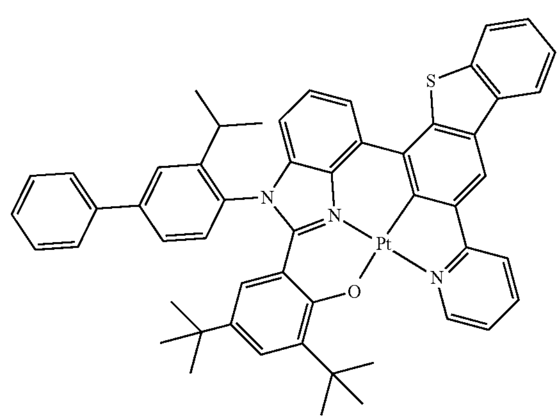

-continued
3-550
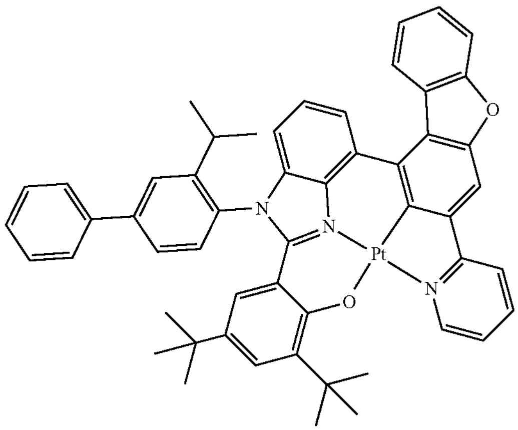
3-551
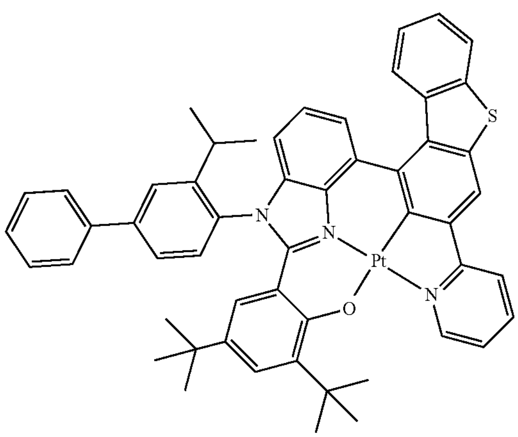
3-552
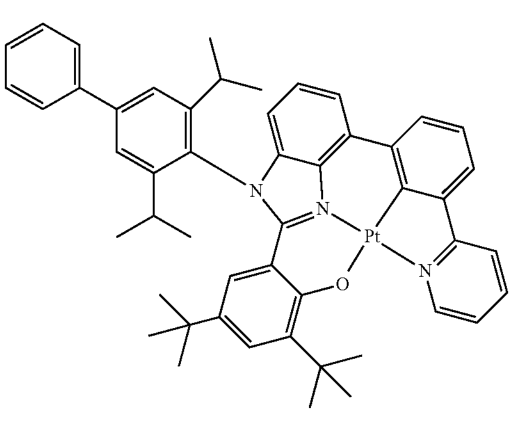
-continued
3-553
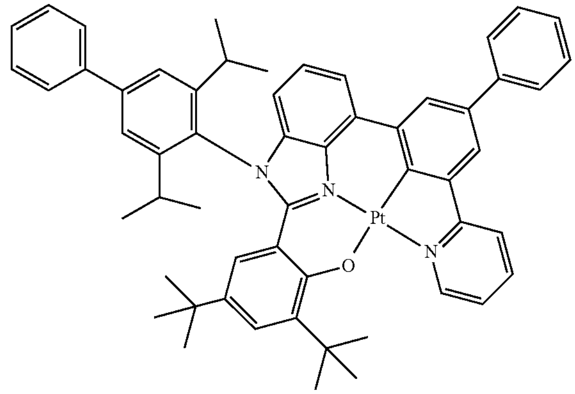
3-554
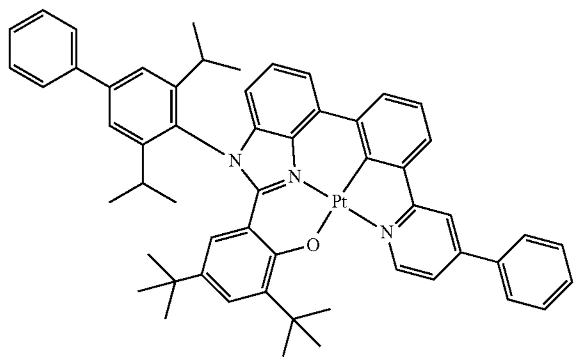
3-555
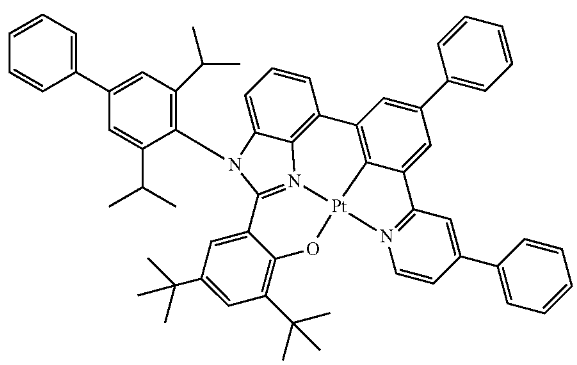
3-556
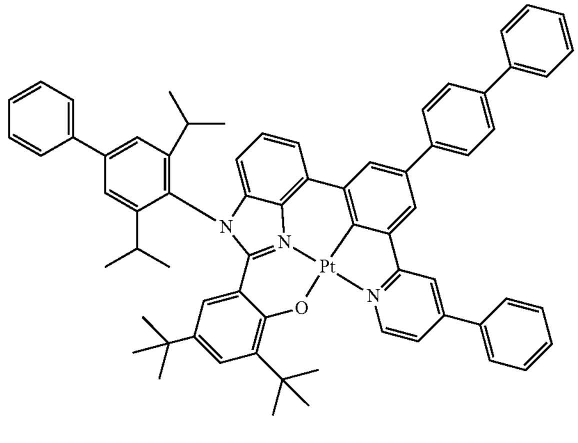

-continued
3-557
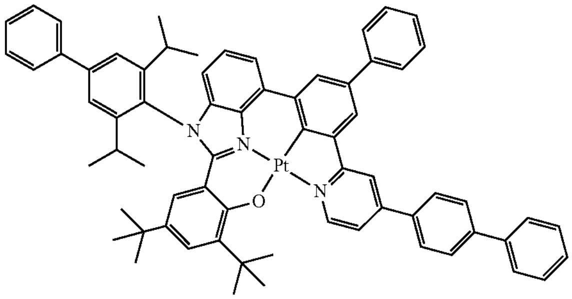
3-558
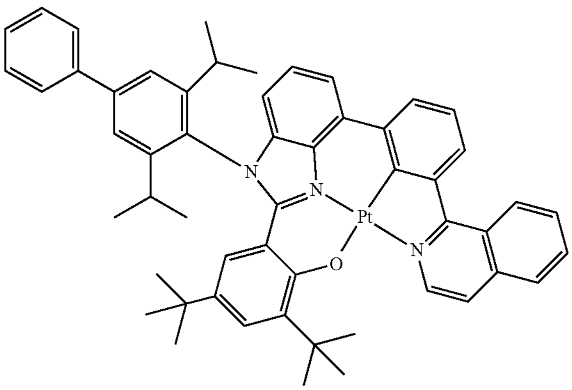
3-559
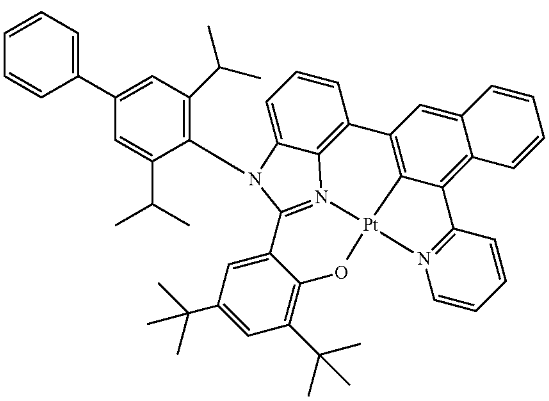
3-560
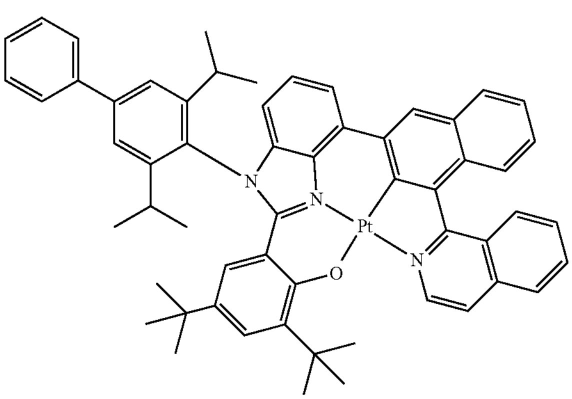
-continued
3-561
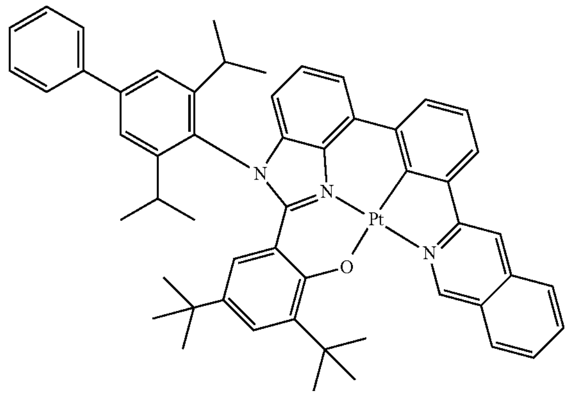
3-562
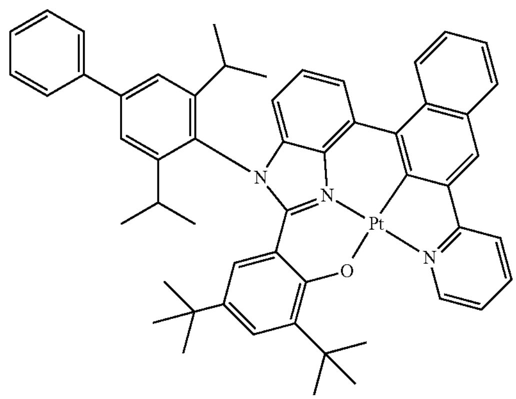
3-563
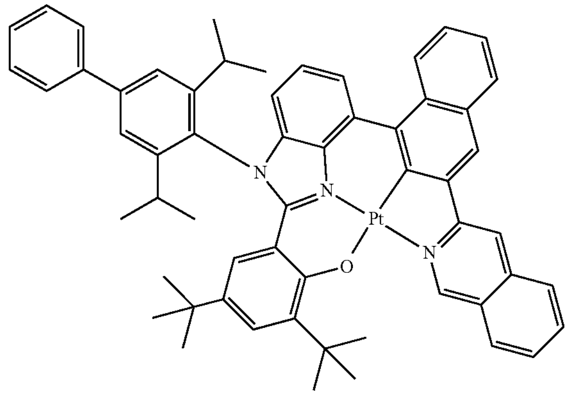

-continued
3-564
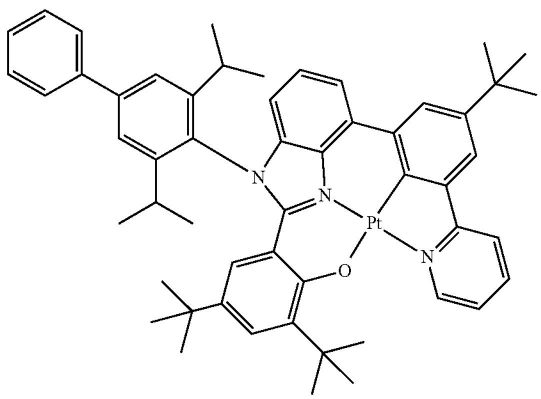
3-565
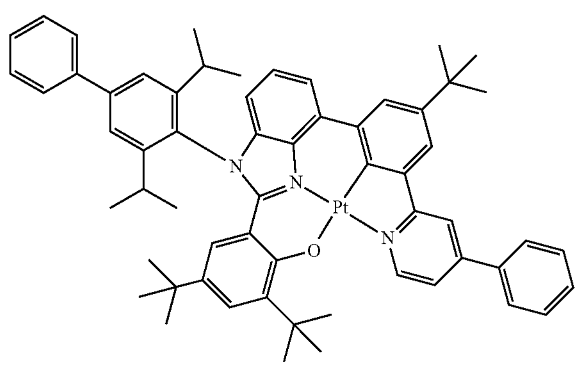
3-566
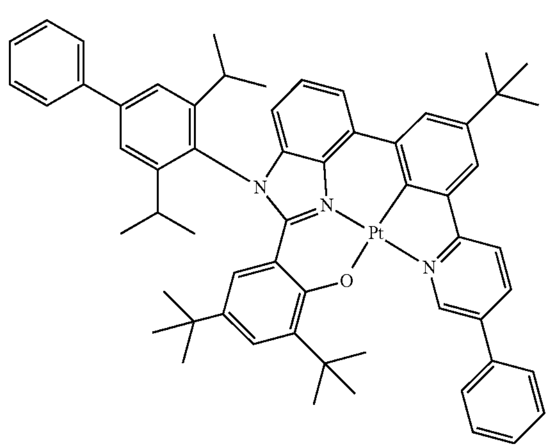
-continued
3-567
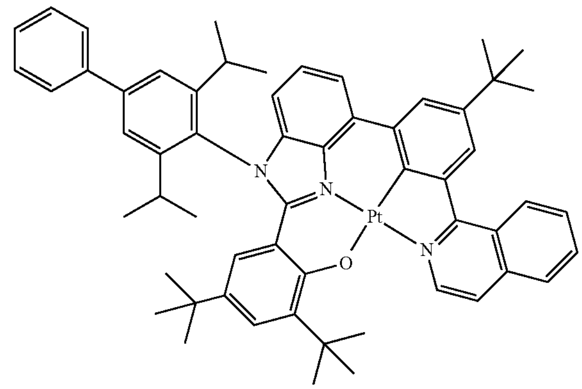
3-568
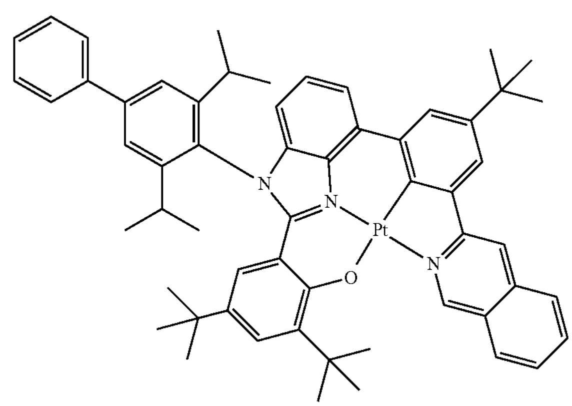
3-569
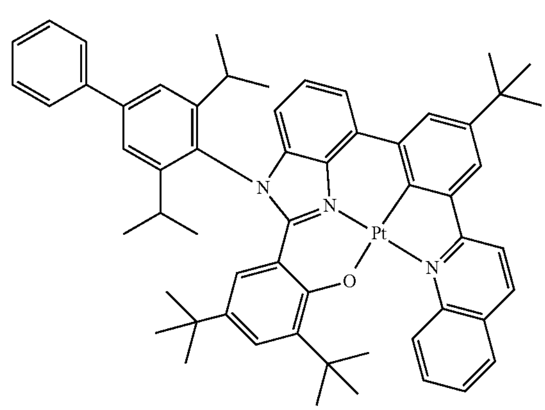

-continued
3-570
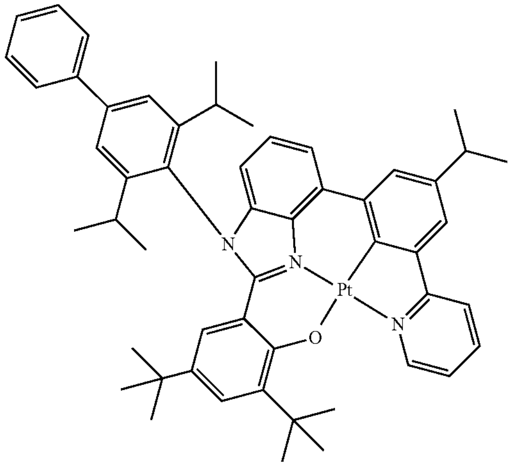
3-571
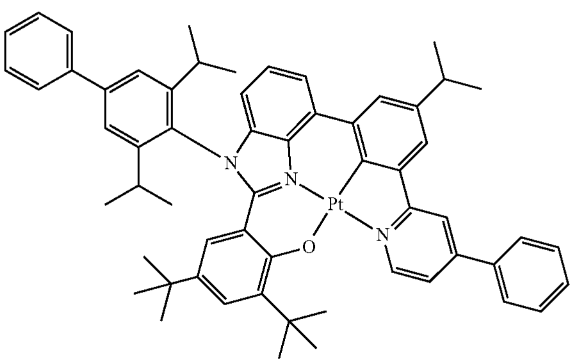
3-572
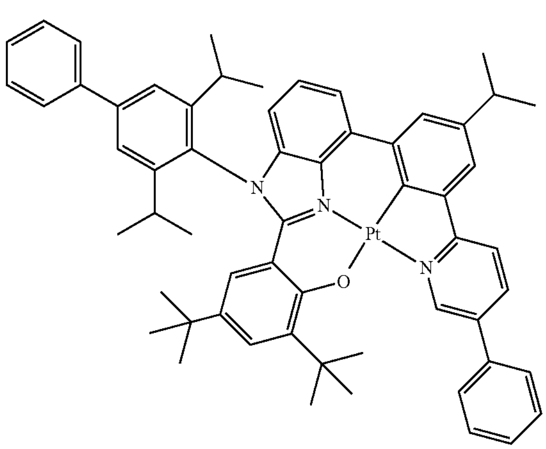
-continued
3-573
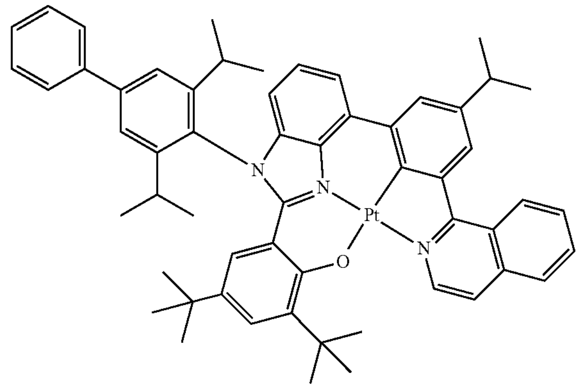
3-574
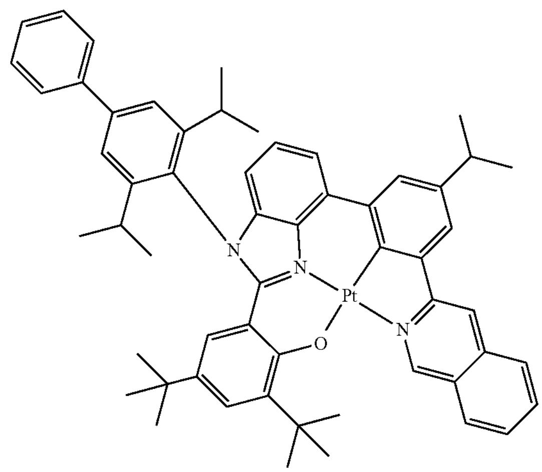
3-575
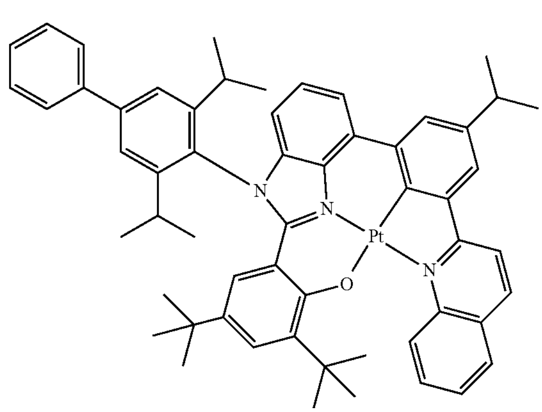

3-576
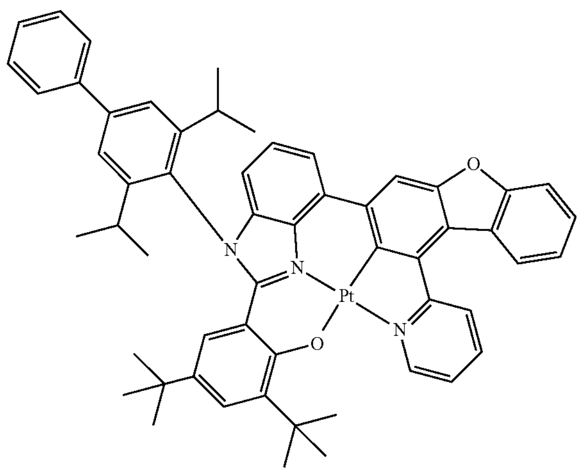
3-577
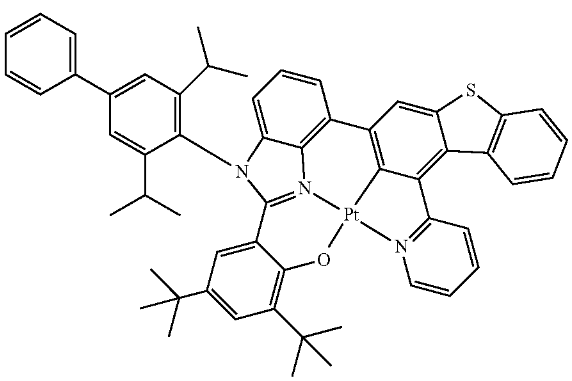
3-578
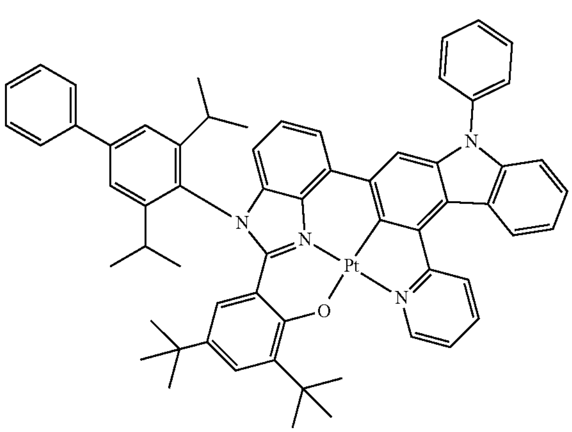
3-579
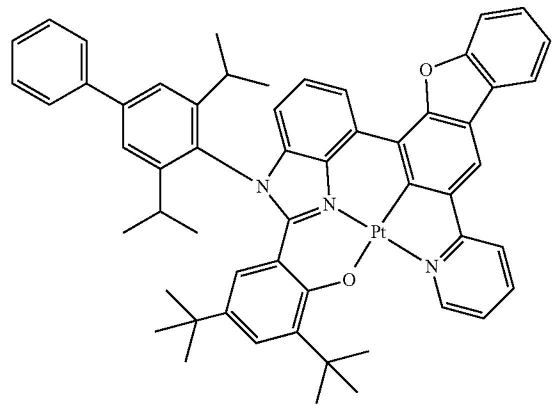
3-580
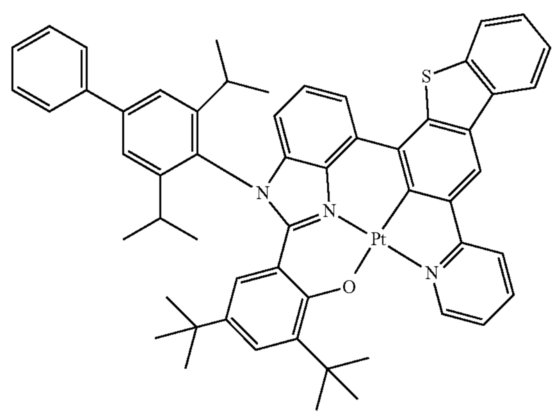
3-581
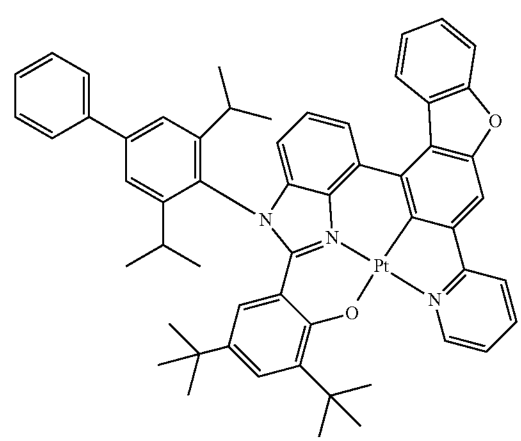

-continued 3-582

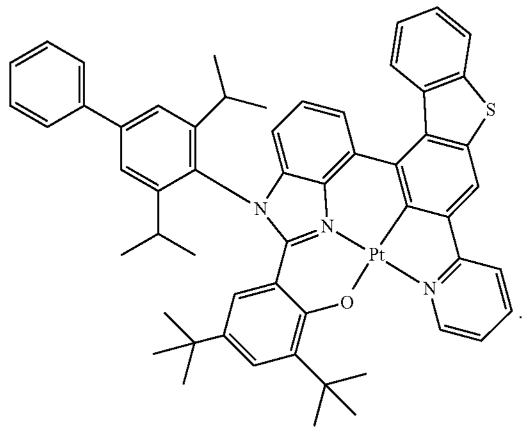

Electron Transport Host and Hole Transport Host in Emission Layer 15

The electron transport host may include at least one electron transport moiety, and the hole transport host may not include an electron transport moiety.

The electron transport moiety used herein may be selected from a cyano group, a π electron-depleted nitrogen-containing cyclic group, and a group represented by one of the following formulae:

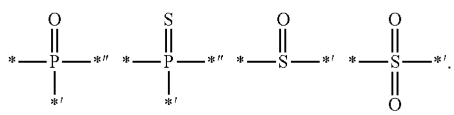

In these formulae, *, *', and *" each indicate a binding site to a neighboring atom.

In an embodiment, the electron transport host in the emission layer 15 may include at least one of a cyano group and a π electron-depleted nitrogen-containing cyclic group.

In one or more embodiments, the electron transport host in the emission layer 15 may include at least one cyano group.

In one or more embodiments, the electron transport host in the emission layer 15 may include at least one cyano group and at least one π electron-depleted nitrogen-containing cyclic group.

Figure 5:
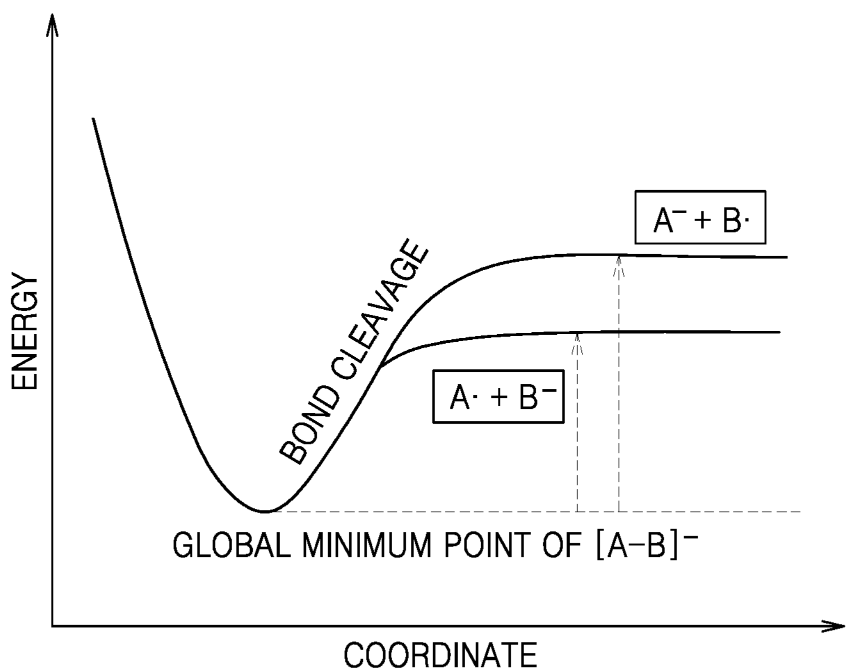
FIG. 5 is a schematic view of a method for calculating the lowest anion decomposition energy of the electron transport host in the emission layer.

In one or more embodiments, the electron transport host in the emission layer 15 may have a lowest anion decomposition energy of 2.5 eV or more. While not wishing to be bound by a particular theory, it is understood that when the lowest anion decomposition energy of the electron transport host is within the range described above, the decomposition of the electron transport host due to charges and/or excitons may be substantially prevented. With reference to FIG. 5, the lowest anion decomposition energy may be measured according to Equation 10:

$$E_{lowest\ anion\ decomposition\ energy} = E_{[A-B]^-} - [E_{A}^{-} + E_{B} (\text{or } E_{A} + E_{B}^{-})] \quad \text{Equation 10}$$

1. A density function theory (DFT) and/or ab initio method was used to calculate the ground state of a neutral molecule.

2. The structure of a neutral molecular under an excess electron was used to calculate the anionic state ($E_{[A-B]^-}$) of the molecule.

3. Based on an anionic state being the most stable structure (global minimum), the energy of the decomposition process was calculated:

$$[A-B]^- \rightarrow A^x \text{ and } B^y([E_A^- + E_B (\text{or } E_A + E_B^-)]).$$

In this regard, the decomposition may produce i) $A^- + B^-$ or ii) $A^- + B^-$, and from these two decomposition modes i and ii, the decomposition mode having a smaller decomposition energy value was selected for the calculation.

In one or more embodiments, the electron transport host may include at least one π electron-depleted nitrogen-free cyclic group and at least one electron transport moiety, and the hole transport host may include at least one π electron-depleted nitrogen-free cyclic group and may not include an electron transport moiety.

The term "π electron-depleted nitrogen-containing cyclic group" as used herein refers to a cyclic group having at least one *—N=*' moiety and may be, for example, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, or a condensed group in which at least one of the groups above is condensed with a cyclic group (for example, a condensed cyclic group in which a triazole group is condensed with a naphthalene group).

Alternatively, the π electron-depleted nitrogen-free cyclic group may be selected from a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, an iso-indole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, and a triindolobenzene group, but embodiments of the present disclosure are not limited thereto.

In an embodiment, the electron transport host may be selected from compounds represented by Formula E-1, and the hole transport host may be selected from compounds represented by Formula H-1, but embodiments of the present disclosure are not limited thereto:

$$[Ar_{301}]_{xb11}-[(L_{301})_{xb1}-R_{301}]_{xb21}. \quad \text{Formula E-1}$$

In Formula E-1, $Ar_{301}$ may be selected from a substituted or unsubstituted $C_5$-$C_{60}$ carbocyclic group, and a substituted or unsubstituted $C_1$-$C_{60}$ heterocyclic group, xb11 may be 1, 2, or 3, $L_{301}$ may be selected from a single bond, a group represented by one of the following formulae, a substituted or unsubstituted $C_5$-$C_{60}$ carbocyclic group, and a substituted or unsubstituted $C_1$-$C_{60}$ heterocyclic group, and *, *', and *" in the following formulae each indicate a binding site to a neighboring atom:

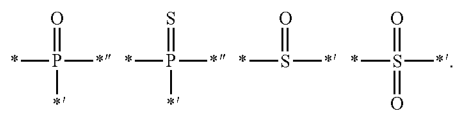

In the formulae above, xb1 may be an integer from 1 to 5, $R_{301}$ may be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_2$-$C_{60}$ heteroaryloxy group, a substituted or unsubstituted $C_2$-$C_{60}$ heteroarylthio group, a substituted or unsubstituted $C_3$-$C_{60}$ heteroarylalkyl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), —S(═O)($Q_{301}$), —P(═O)($Q_{301}$)($Q_{302}$), and —P(═S)($Q_{301}$)($Q_{302}$), xb21 may be an integer from 1 to 5, $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, and the organic light-emitting device satisfies at least one of Condition 1 to Condition 3:

Condition 1 at least one of $Ar_{301}$, $L_{301}$, and $R_{301}$ in Formula E-1 includes a π electron-depleted nitrogen-containing cyclic group Condition 2

$L_{301}$ in Formula E-1 is a group represented by one of the following formulae

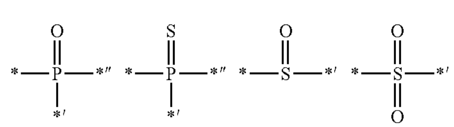

Condition 3

$R_{301}$ in Formula E-1 is selected from a cyano group, —S(═O)$_2$($Q_{301}$), —S(═O)($Q_{301}$), —P(═O)($Q_{301}$)($Q_{302}$), and —P(═S)($Q_{301}$)($Q_{302}$)

$$Ar_{401}\text{-}(L_{401})_{xd1}\text{-}(Ar_{402})_{xd11} \quad \text{Formula H-1}$$

Formula 11

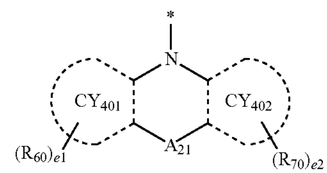

Formula 12

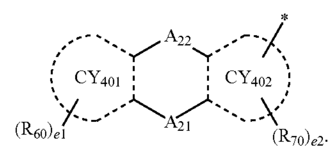

In Formulae H-1, 11, and 12, $L_{401}$ may be selected from:

a single bond; and a π electron-depleted nitrogen-free cyclic group (for example, a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, an iso-indole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indeno carbazole group, an indolocarbazole group, a benzofurocarbazole group, a benzothienocarbazole group, and a triindolobenzene group), unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, and —Si($Q_{401}$)($Q_{402}$)($Q_{403}$), xd1 may be an integer from 1 to 10, wherein, when xd1 is two or more, two or more groups $L_{401}$ may be identical to or different from each other, $Ar_{401}$ may be selected from groups represented by Formulae 11 and 12, $Ar_{402}$ may be selected from:

groups represented by Formulae 11 and 12 and a π electron-depleted nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, and a triphenylenyl group); and a π electron-depleted nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, and a triphenylenyl group), substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, a biphenyl group, a terphenyl group, and a triphenylenyl group, $CY_{401}$ and $CY_{402}$ may each independently be selected from a π electron-depleted nitrogen-free cyclic group (for example, a benzene group, a naphthalene group, a fluorene group, a carbazole group, a benzocarbazole group, an indolocarbazole group, a dibenzofuran group, a dibenzothiophene group, a dibenzosilole group, a benzonaphthofuran group, a benzonaphthothiophene group, and a benzonaphthosilole group), $A_{21}$ may be selected from a single bond, O, S, $N(R_{51})$, $C(R_{51})(R_{52})$, and $Si(R_{51})(R_{52})$, $A_{22}$ may be selected from a single bond, O, S, $N(R_{53})$, $C(R_{53})(R_{54})$, and $Si(R_{53})(R_{54})$, in Formula 12, at least one of $A_{21}$ and $A_{22}$ may not be a single bond, $R_{51}$ to $R_{54}$, $R_{60}$, and $R_{70}$ may each independently be selected from:

hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, and a dibenzothiophenyl group;

a π electron-depleted nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, and a triphenylenyl group);

a π electron-depleted nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, and a triphenylenyl group), substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, and a biphenyl group; and $—Si(Q_{404})(Q_{405})(Q_{406})$, e1 and e2 may each independently be an integer from 0 to 10, $Q_{401}$ to $Q_{406}$ may each independently be selected from hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, a dibenzothiophenyl group, a biphenyl group, a terphenyl group, and a triphenylenyl group, and

* indicates a binding site to a neighboring atom.

In an embodiment, in Formula E-1, $Ar_{301}$ and $L_{401}$ may each independently be selected from a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a phenyl group containing a cyano group, a biphenyl group including a cyano group, a terphenyl group containing a cyano group, a naphthyl group containing a cyano group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, at least one of groups $L_{301}$ in the number of xb1 may each independently be selected from an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a phenyl group containing a cyano group, a biphenyl group containing a cyano group, a terphenyl group containing a cyano group, a naphthyl group containing a cyano group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl) triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, $R_{301}$ may be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a tetraphenyl group, a naphthyl group, a phenyl group containing a cyano group, a biphenyl group containing a cyano group, a terphenyl group containing a cyano group, a tetraphenyl group containing a cyano group, a naphthyl group containing a cyano group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl) triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group. However, embodiments of the present disclosure are not limited thereto.

In one or more embodiments, $Ar_{301}$ may be selected from a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a phenyl group containing a cyano group, a biphenyl group containing a cyano group, a terphenyl group containing a cyano group, a naphthyl group containing a cyano group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl) triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$ and —$P(=O)(Q_{31})(Q_{32})$; and groups represented by Formulae 5-1 to 5-3 and 6-1 to 6-33, and $L_{301}$ may be selected from groups represented by Formulae 5-1 to 5-3 and 6-1 to 6-33:

Formula 5-1

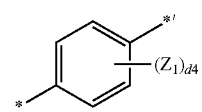

Formula 5-2

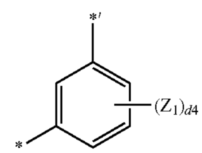

Formula 5-3

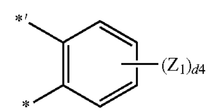

Formula 6-1

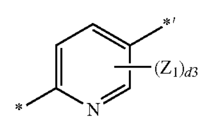

Formula 6-2

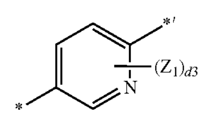

Formula 6-3

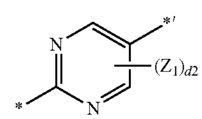

Formula 6-4

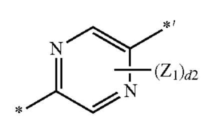

Formula 6-5

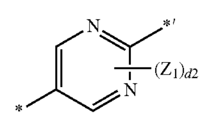

Formula 6-6

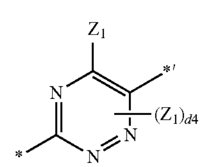

-continued
Formula 6-7
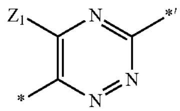
Formula 6-8
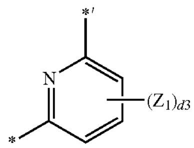
Formula 6-9
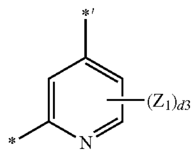
Formula 6-10
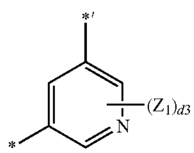
Formula 6-11
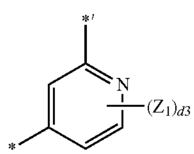
Formula 6-12
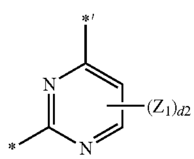
Formula 6-13
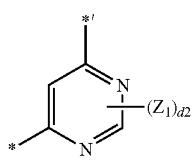
Formula 6-14
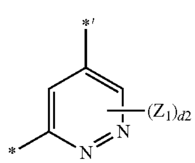
Formula 6-15
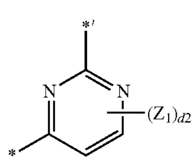
Formula 6-16
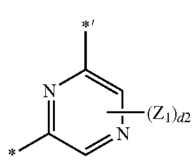
-continued
Formula 6-17
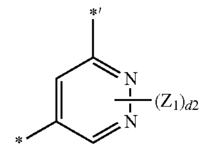
Formula 6-18
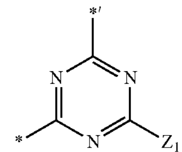
Formula 6-19
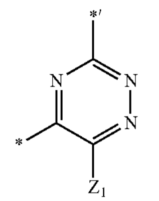
Formula 6-20
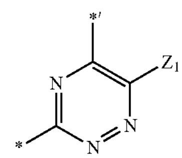
Formula 6-21
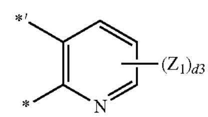
Formula 6-22
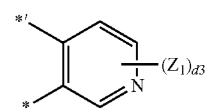
Formula 6-23
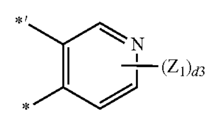
Formula 6-24
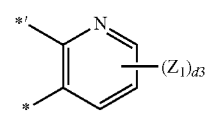
Formula 6-25
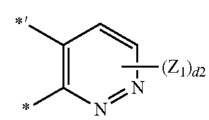
Formula 6-26
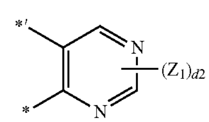
Formula 6-27
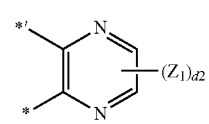

-continued

Formula 6-28

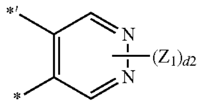

Formula 6-29

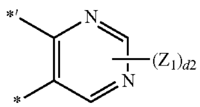

Formula 6-30

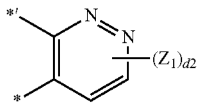

Formula 6-31

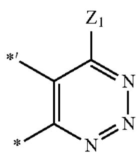

Formula 6-32

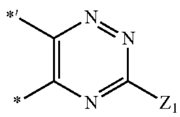

Formula 6-33

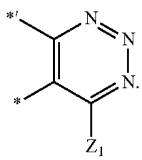

In Formulae 5-1 to 5-3 and 6-1 to 6-33, $Z_1$ may be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a phenyl group containing a cyano group, a biphenyl group containing a cyano group, a terphenyl group containing a cyano group, a naphthyl group containing a cyano group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), d4 may be 0, 1, 2, 3, or 4, d3 may be 0, 1, 2, or 3, d2 may be 0, 1, or 2,

* and *' each indicate a binding site to a neighboring atom, and $Q_{31}$ to $Q_{33}$ are the same as described above.

In one or more embodiments, $L_{301}$ may be selected from groups represented by Formulae 5-2, 5-3 and 6-8 to 6-33.

In one or more embodiments, $R_{301}$ may be selected from a cyano group and groups represented by Formulae 7-1 to 7-18, and at least one of $Ar_{402}$ in the number of xd11 may be selected from groups represented by Formulae 7-1 to 7-18, but embodiments of the present disclosure are not limited thereto:

7-1

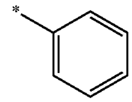

7-2

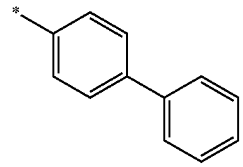

7-3

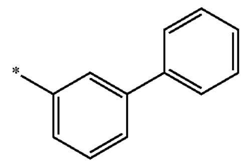

7-4

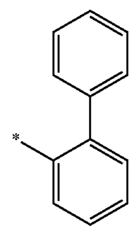

7-5

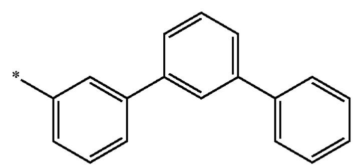

7-6

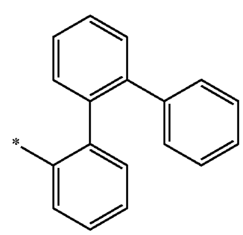

7-7

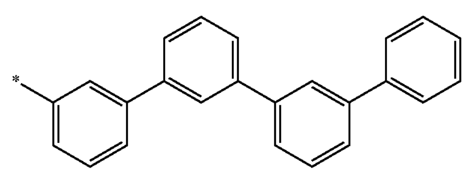

7-8

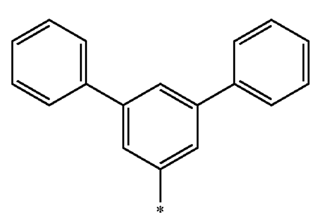

-continued 7-9

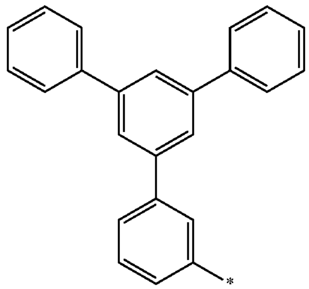

7-10

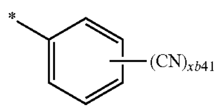

7-11

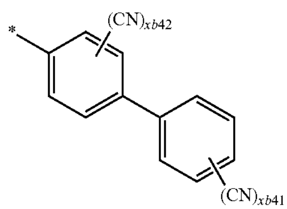

7-12

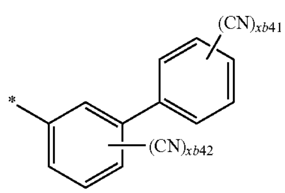

7-13

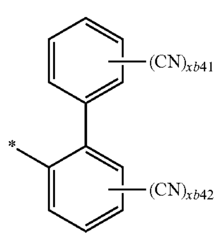

7-14

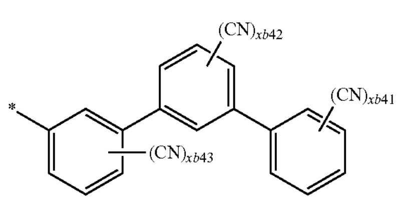

-continued 7-15

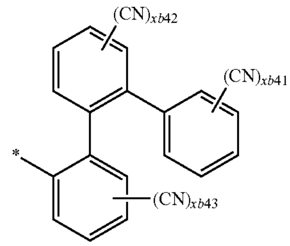

7-16

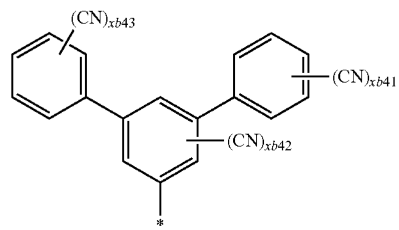

7-17

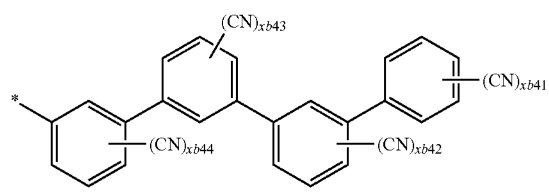

7-18

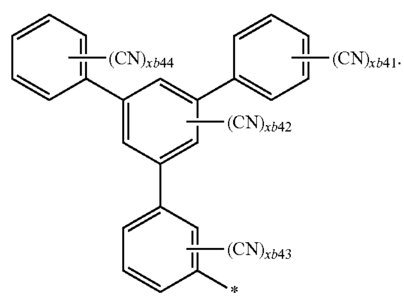

In Formulae 7-1 to 7-18, xb41 to xb44 may each independently be 0, 1, or 2, wherein xb41 in Formulae 7-10 may not be 0, xb41+xb42 in Formulae 7-11 to 7-13 may not be 0, xb41+xb42+xb43 in Formulae 7-14 to 7-16 may not be 0, xb41+xb42+xb43+xb44 in Formulae 7-17 and 7-18 may not be 0, and

* indicates a binding site to a neighboring atom.

In Formula E-1, two or more groups $Ar_{301}$ may be identical to or different from each other, two or more groups $L_{301}$ may be identical to or different from each other, and in Formula H-1, two or more groups $L_{401}$ may be identical to or different from each other, and two or more groups $Ar_{402}$ may be identical to or different from each other.

The electron transport host may be, for example, selected from Compounds H-E1 to H-E4, Compounds A-1 to A-125, and Compounds A(1) to A(154), but embodiments of the present disclosure are not limited thereto:

H-E1
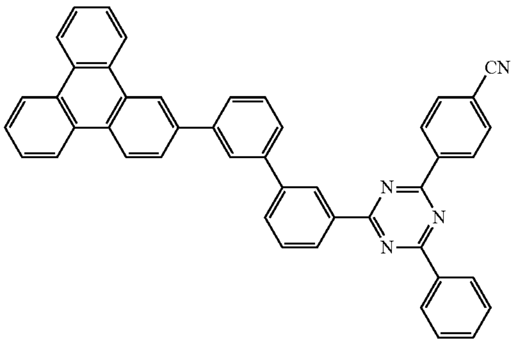
H-E2
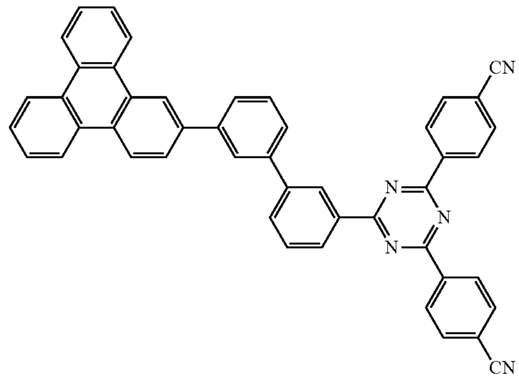
H-E3
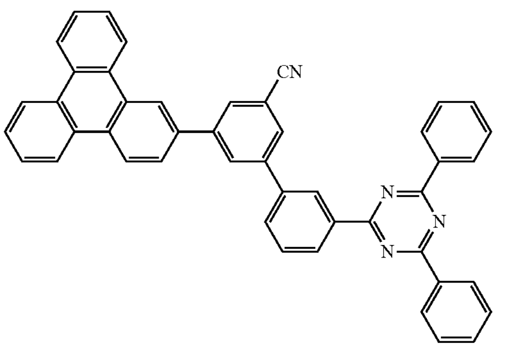
H-E4
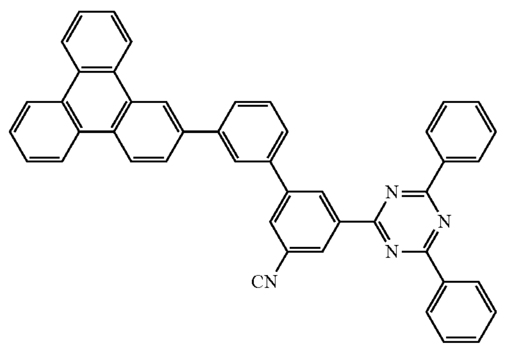
A-1
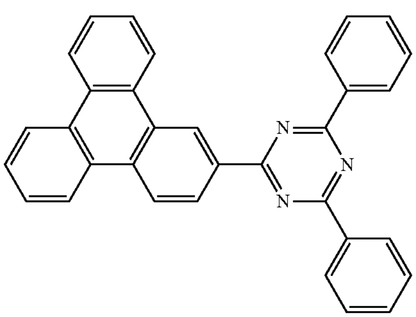
A-2
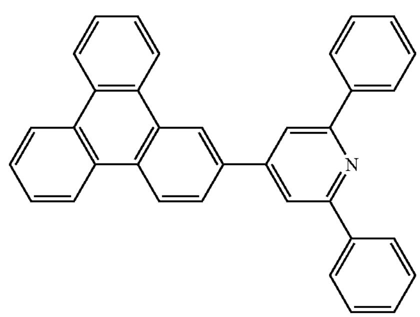
A-3
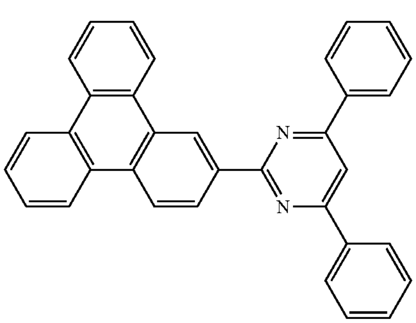
A-4
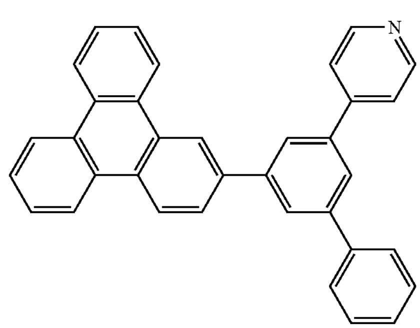

-continued
A-5
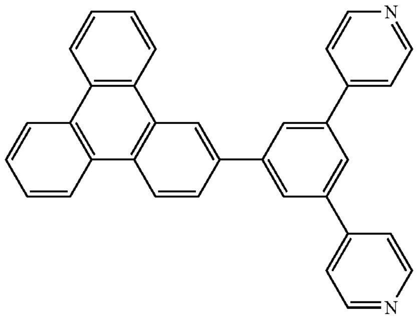
A-6
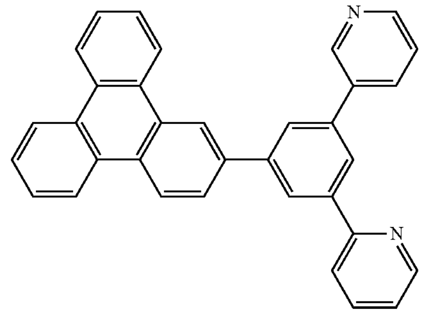
A-7
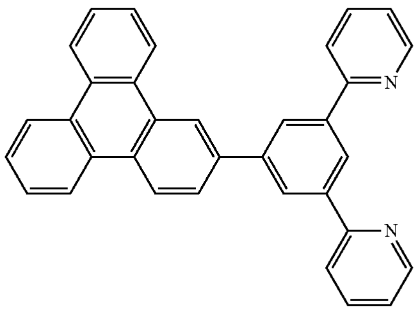
A-8
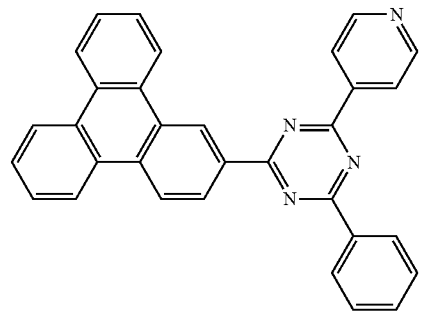
A-9
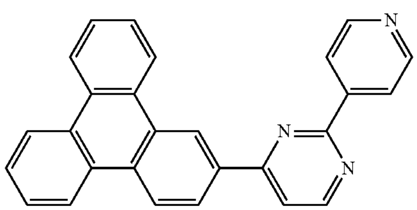
A-10
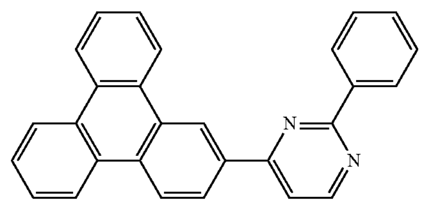
A-11
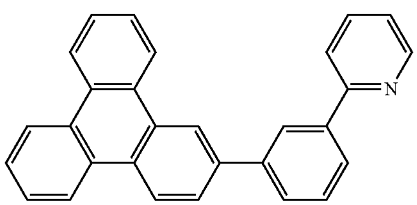
A-12
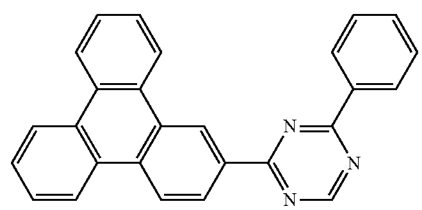
A-13
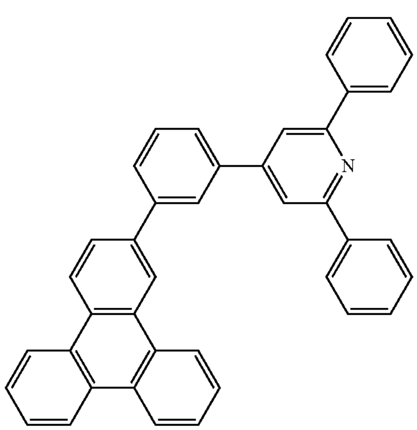
A-14
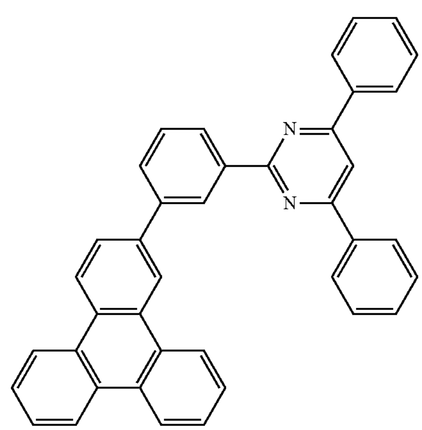

-continued
A-15
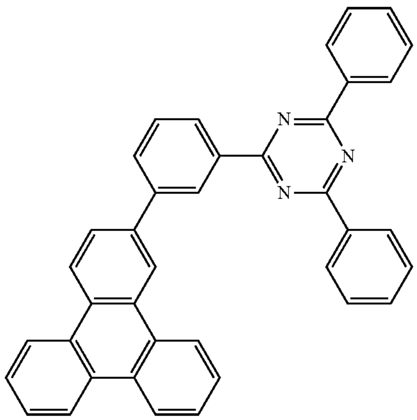
A-16
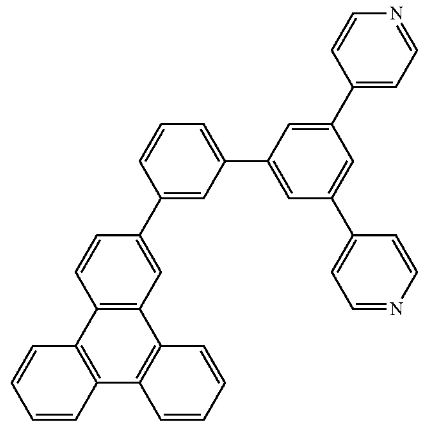
A-17
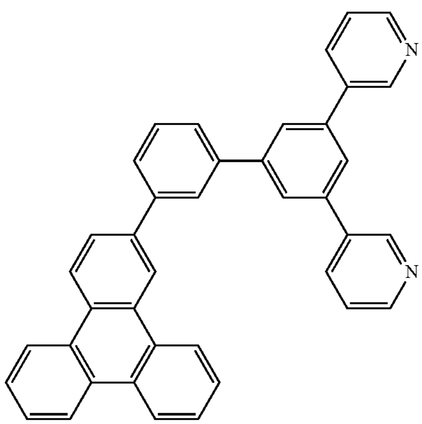
A-18
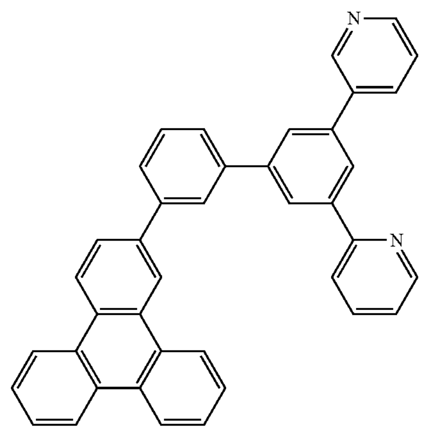
A-19
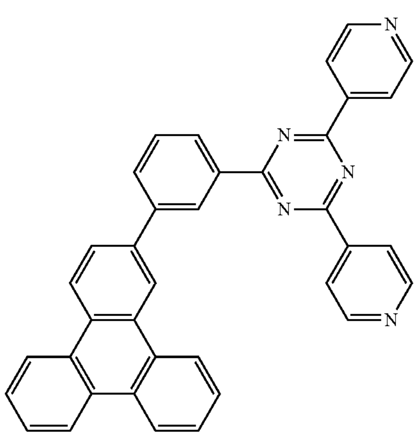
A-20
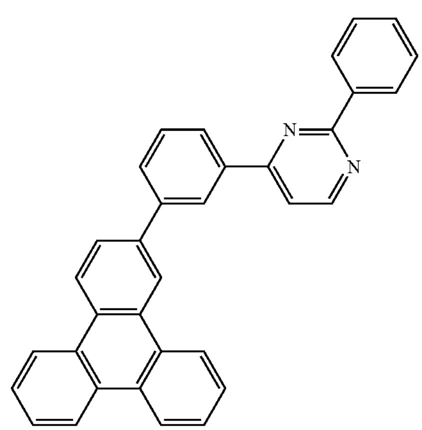

-continued
A-21
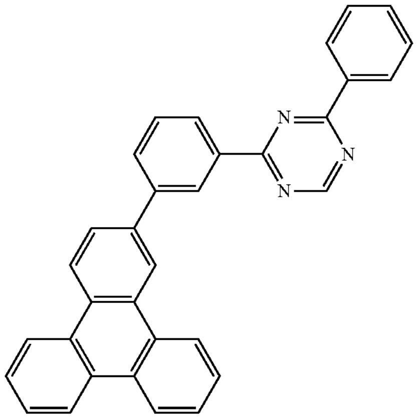
A-22
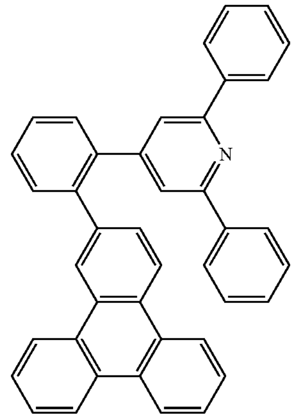
A-23
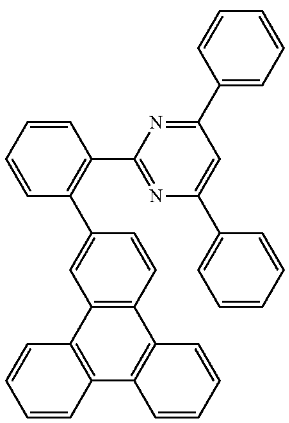
A-24
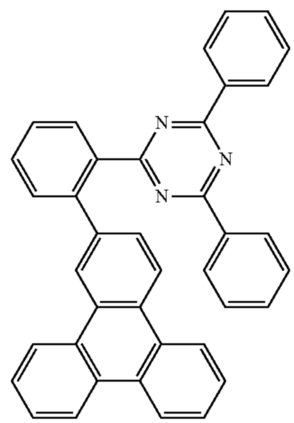
A-25
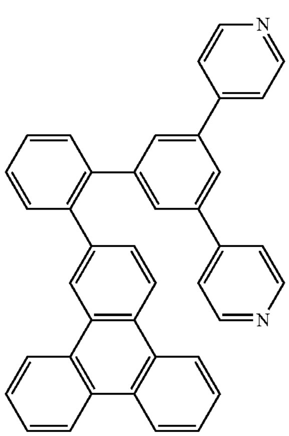
A-26
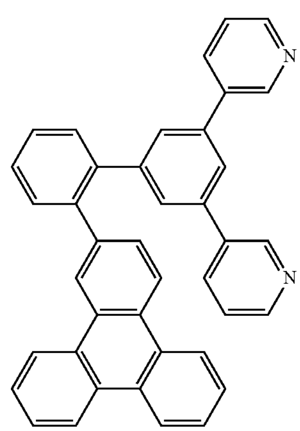

-continued
A-27
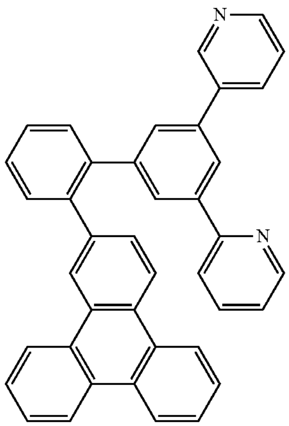
A-28
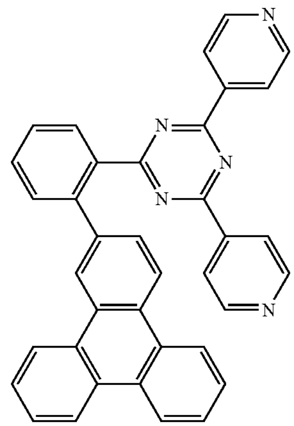
A-29
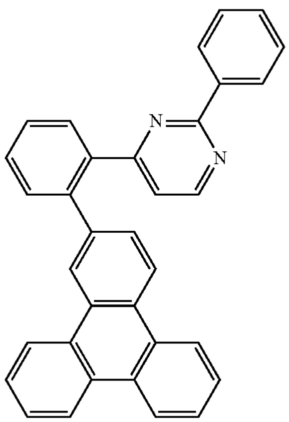
A-30
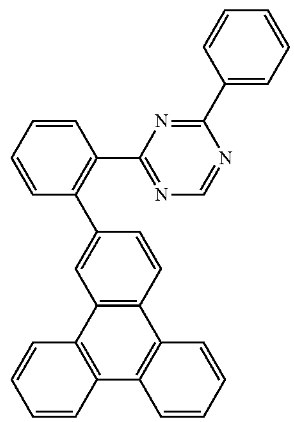
A-31
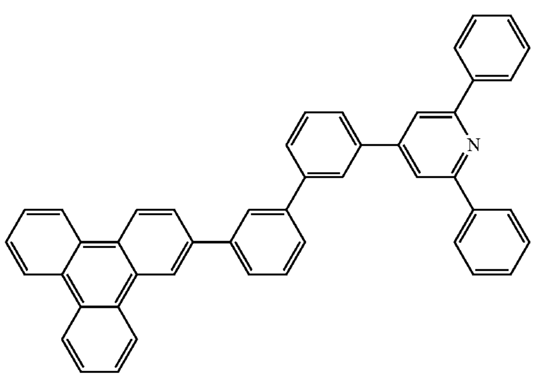
A-32
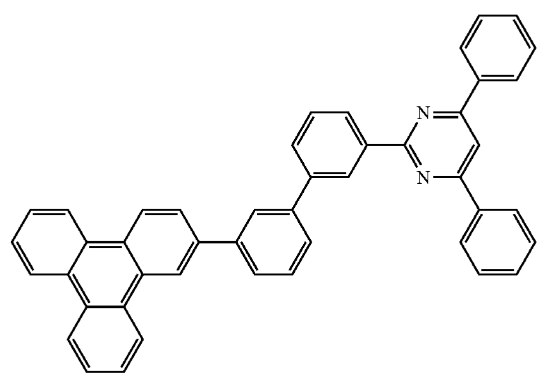
A-33
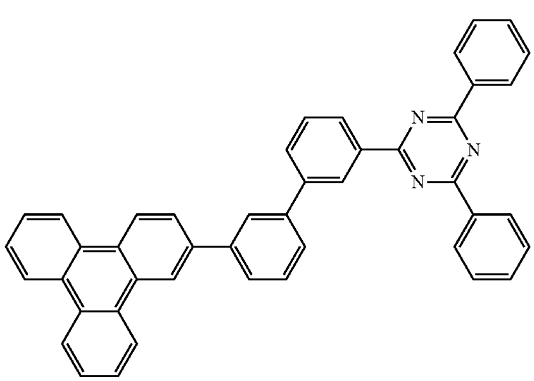
A-34
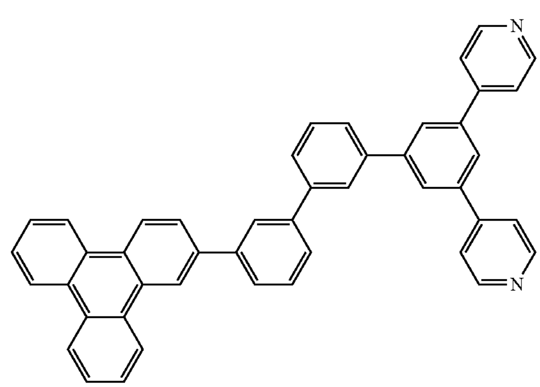

-continued
A-35
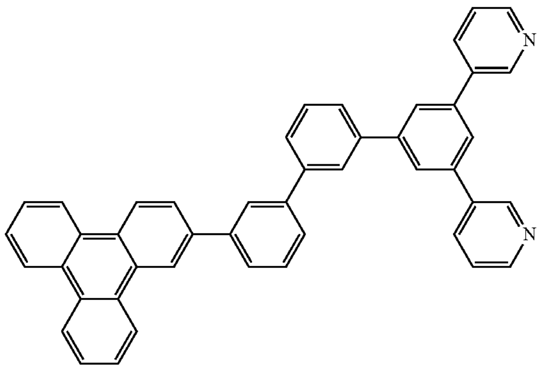
A-36
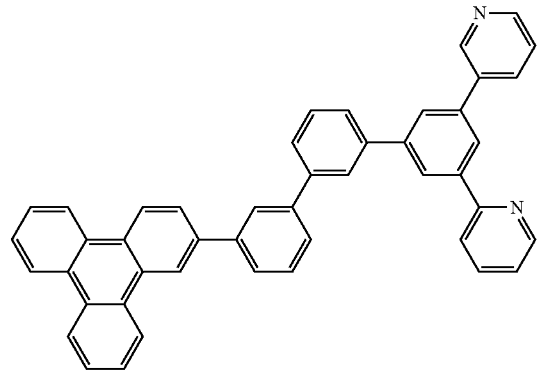
A-37
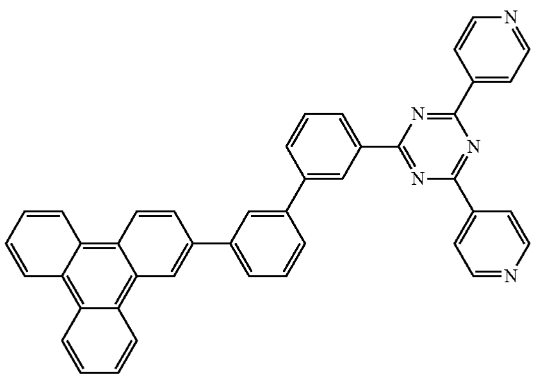
A-38
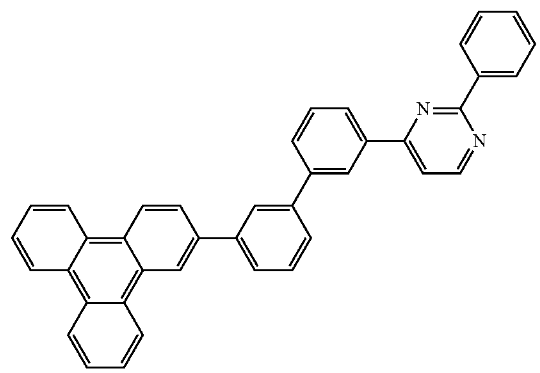
A-39
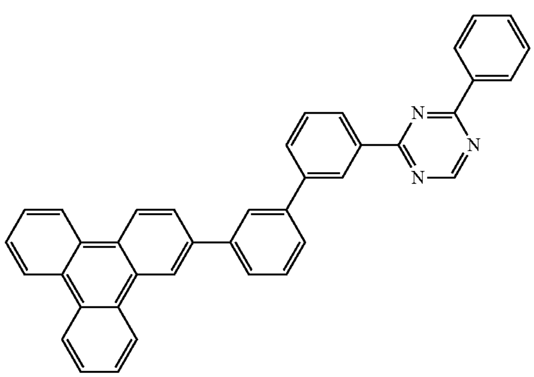
A-40
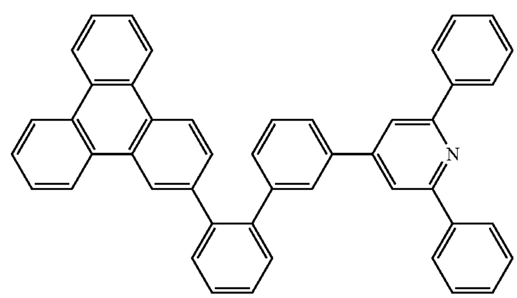
A-41
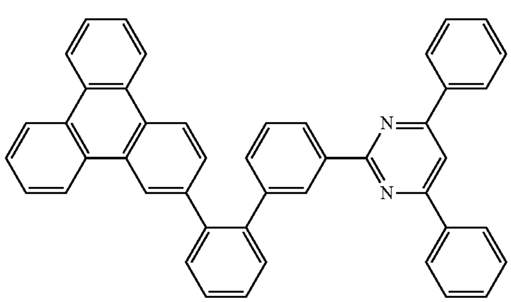
A-42
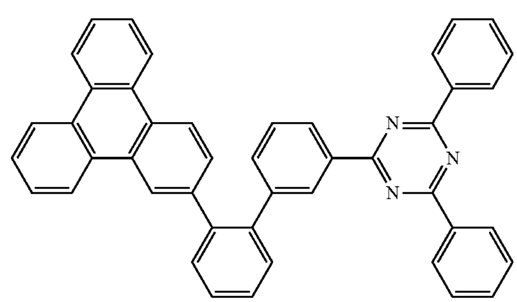

-continued
A-43
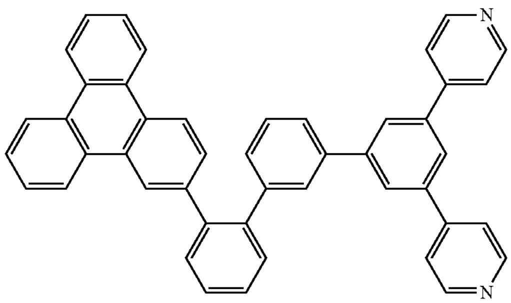
A-44
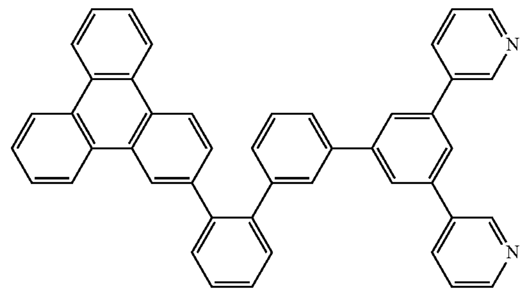
A-45
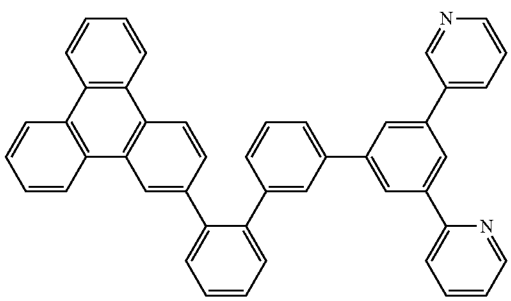
A-46
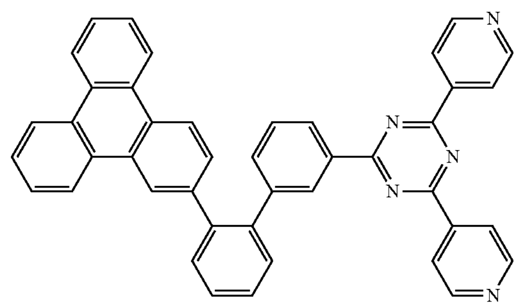
A-47
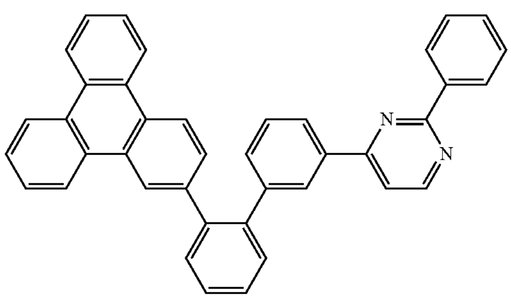
A-48
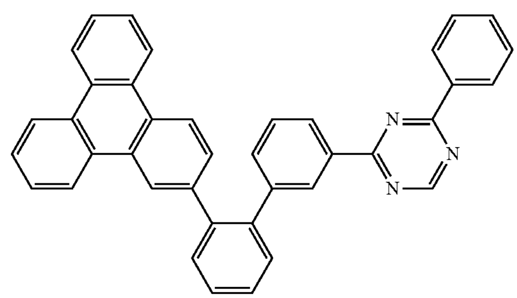
A-49
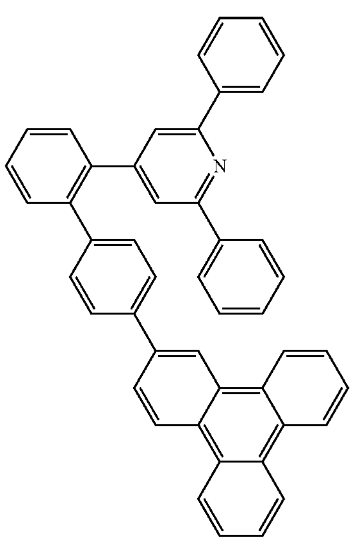
A-50
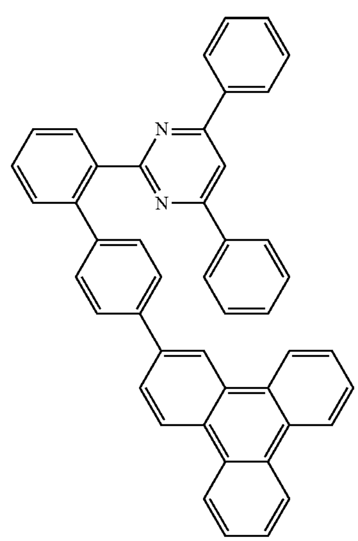

-continued
A-51
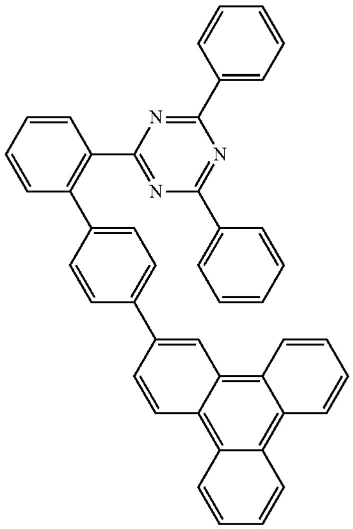
A-52
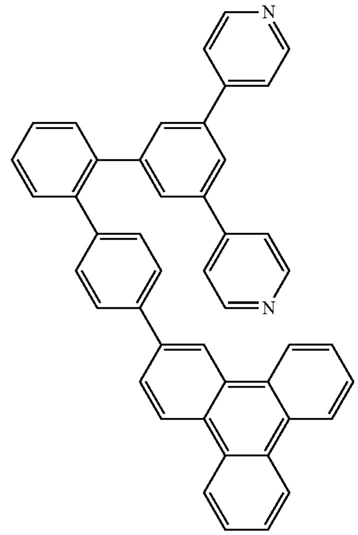
A-53
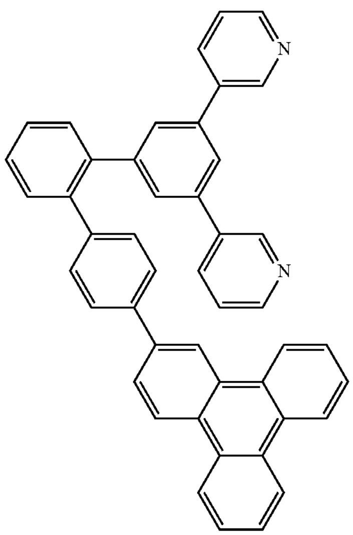
A-54
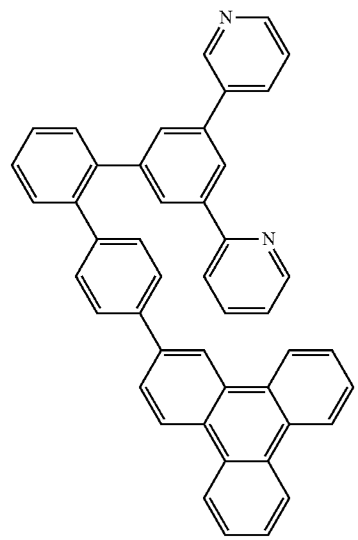
A-55
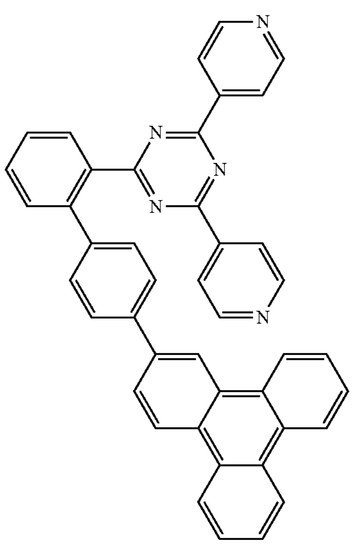
A-56
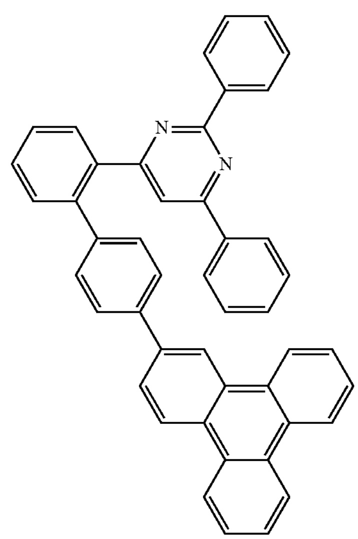

-continued
A-57
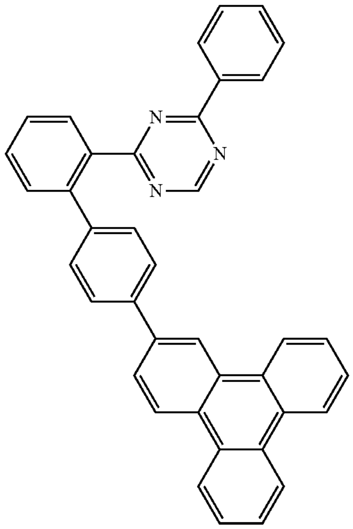
A-58
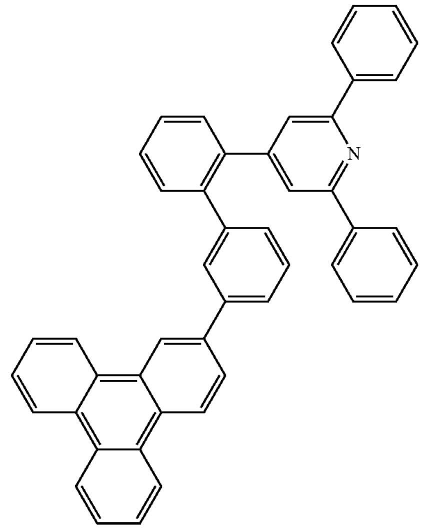
A-59
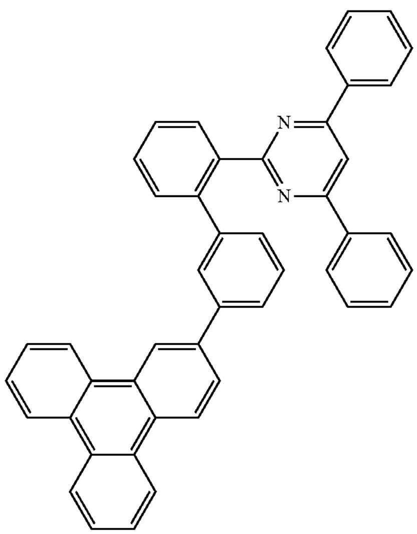
A-60
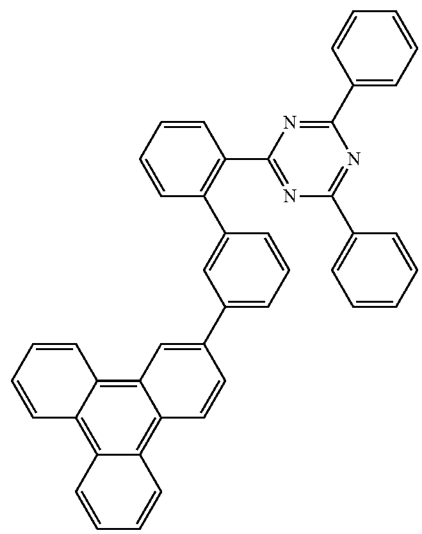
A-61
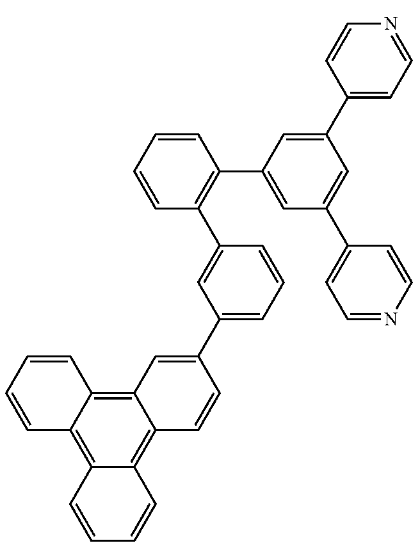
A-62
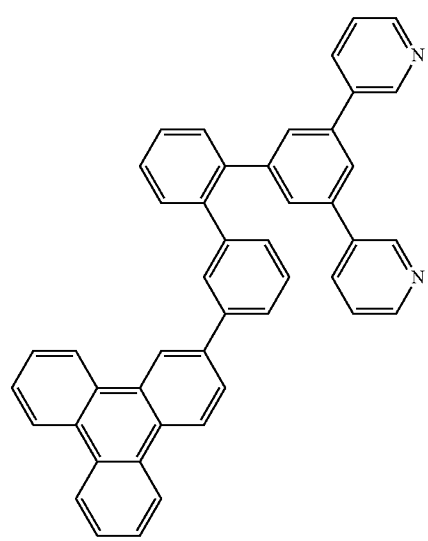

-continued
A-63
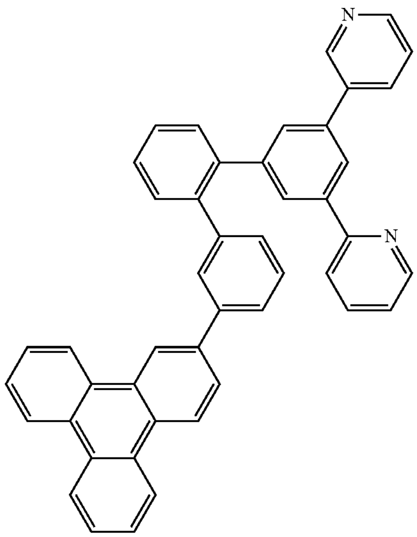
A-64
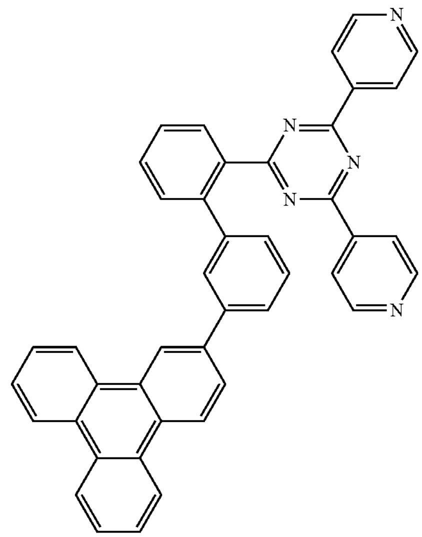
A-65
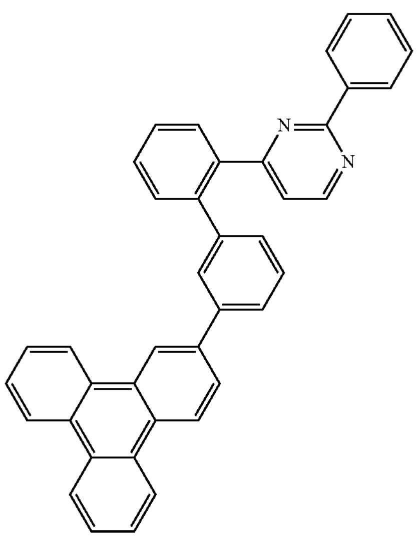
A-66
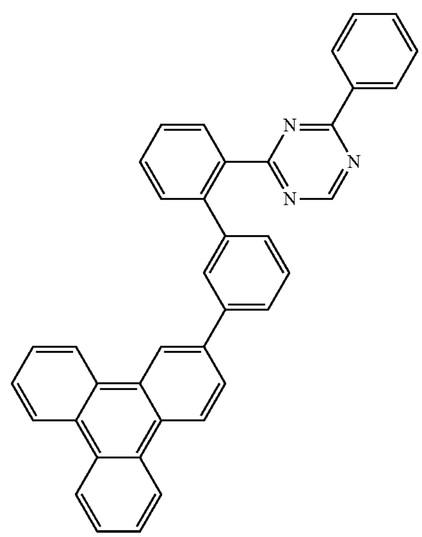
A-67
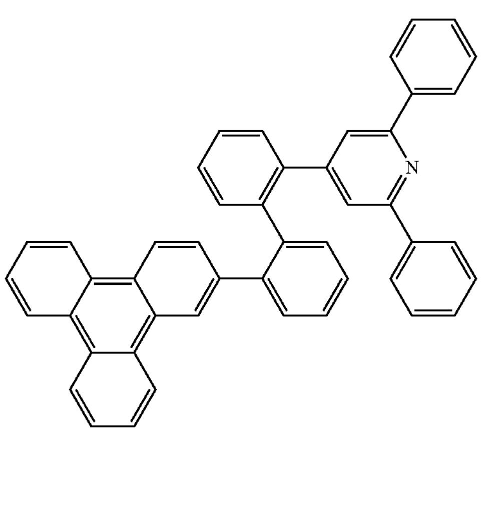
A-68
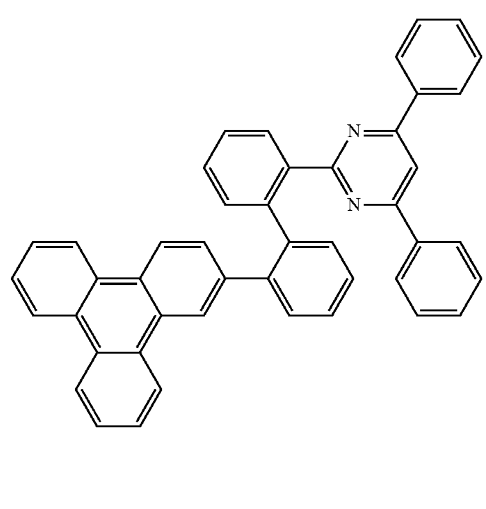

-continued
A-69
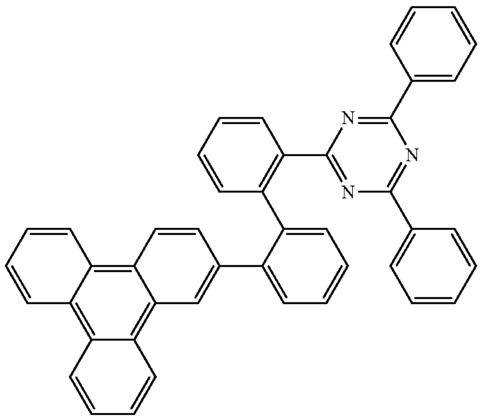
A-70
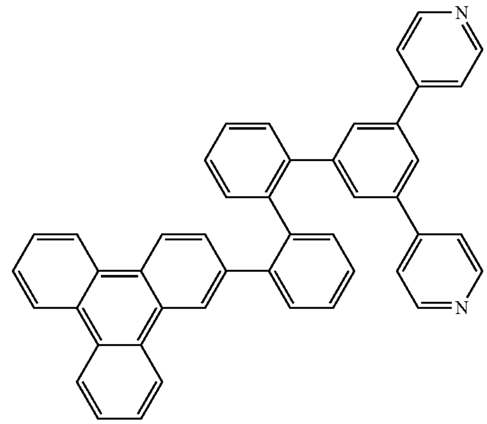
A-71
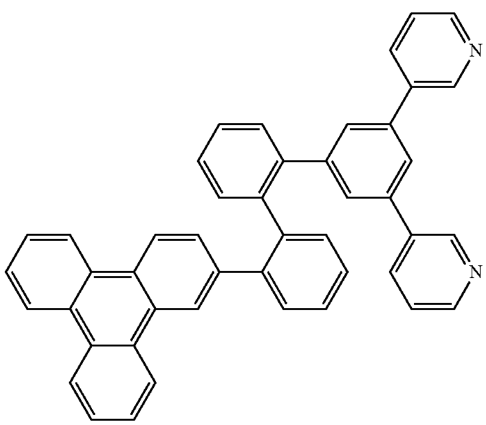
A-72
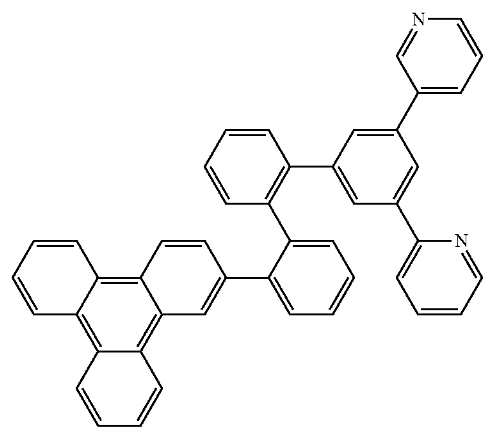
A-73
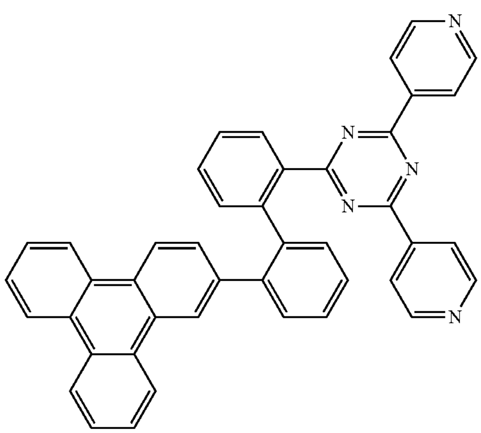
A-74
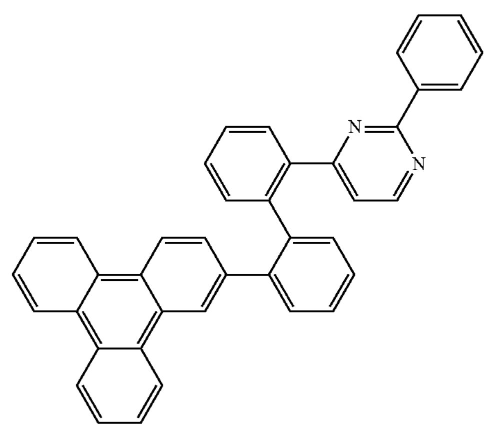

-continued
A-75
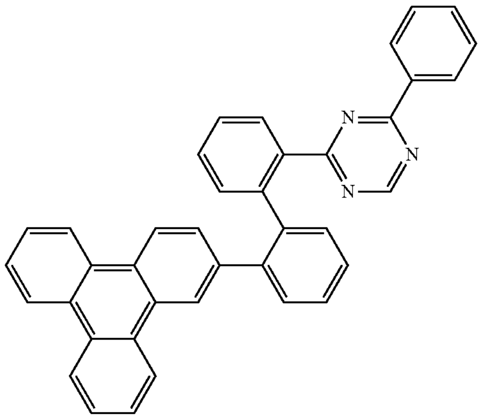
A-76
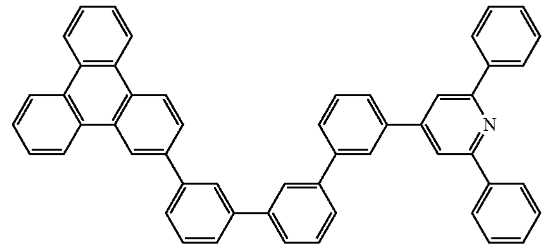
A-77
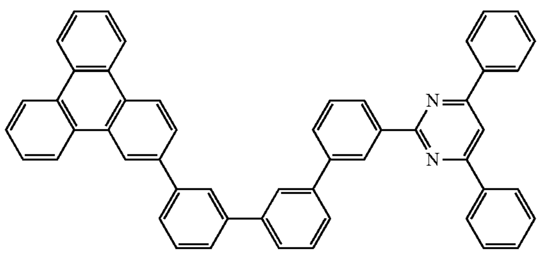
A-78
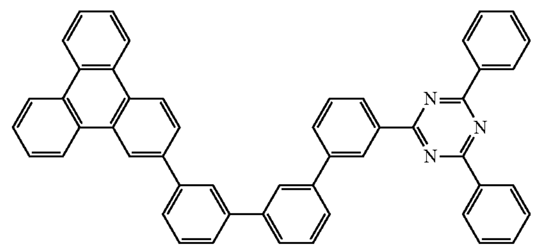
A-79
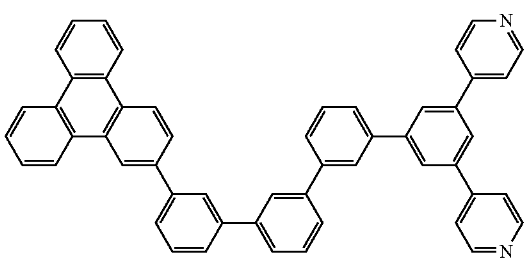
A-80
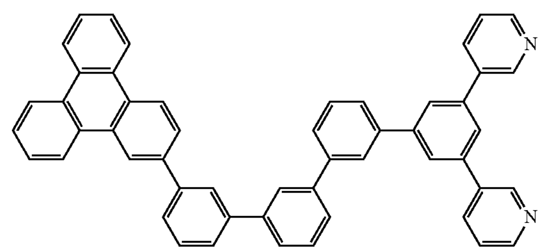
A-81
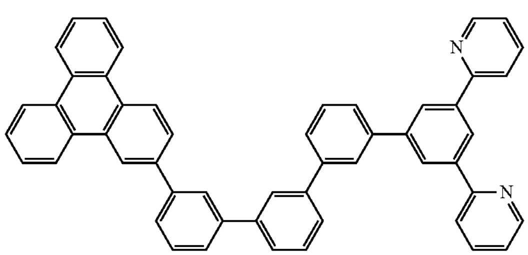
A-82
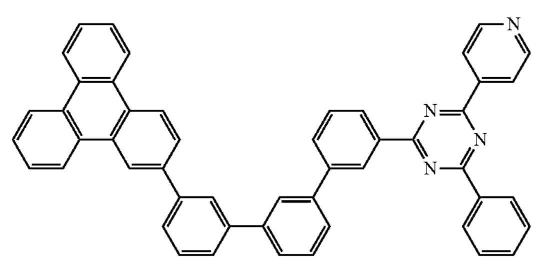
A-83
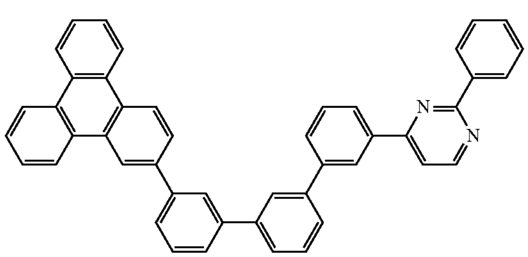
A-84
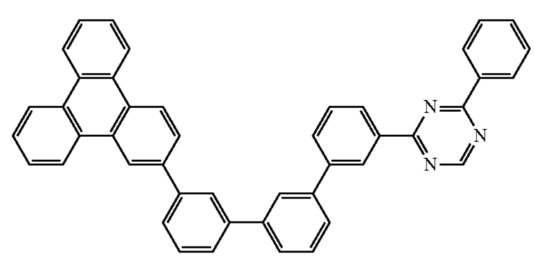

-continued
A-85
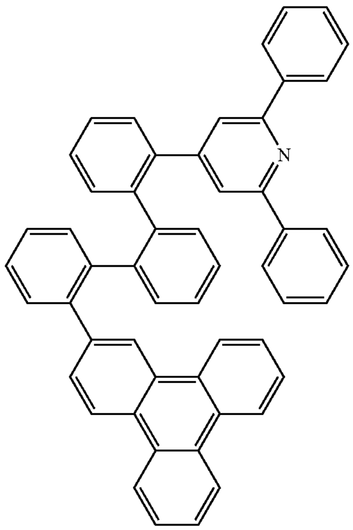
A-86
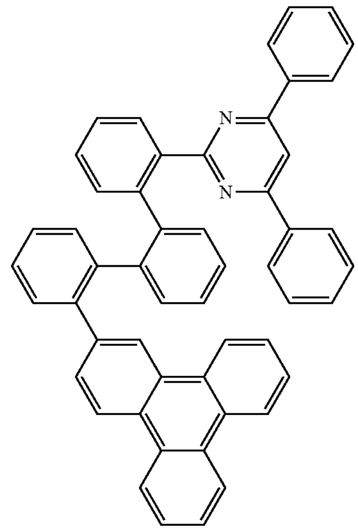
A-87
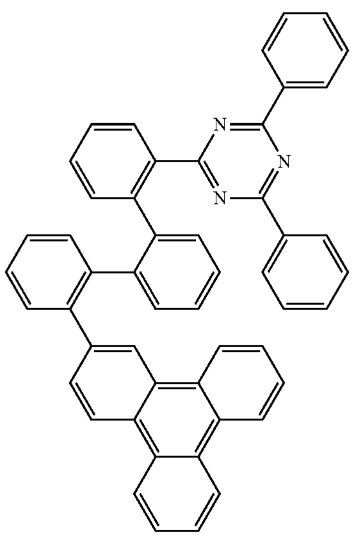
A-88
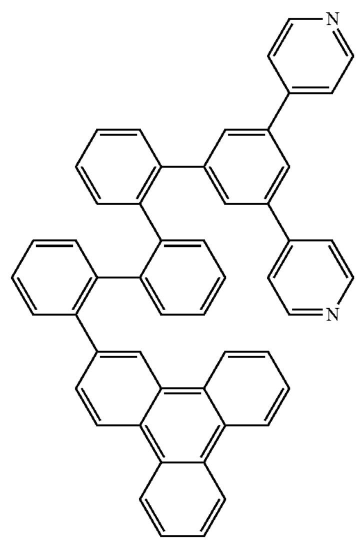
A-89
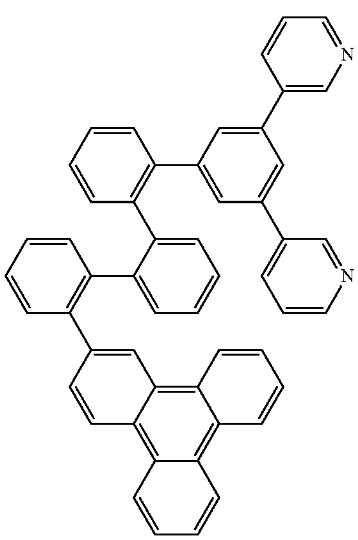
A-90
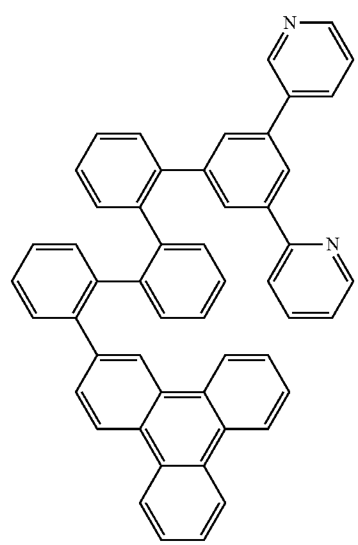

-continued
A-91
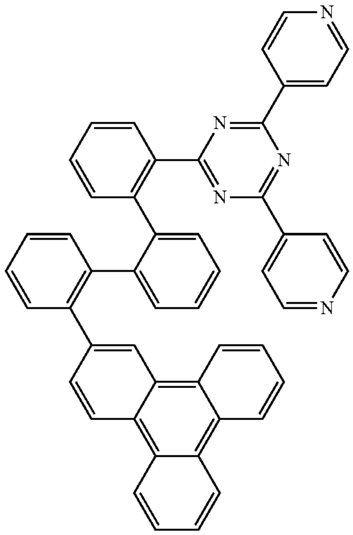
A-92
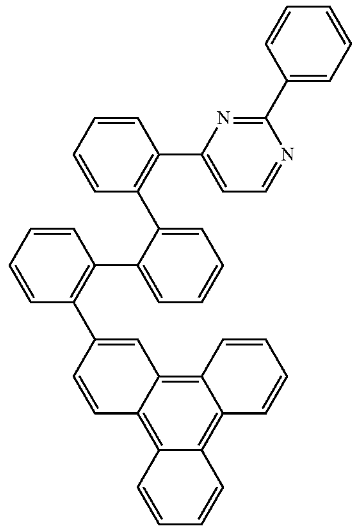
A-93
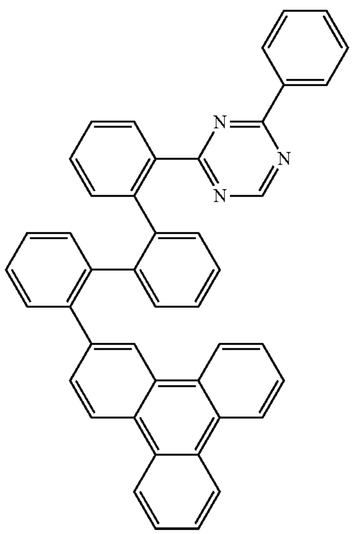
A-94
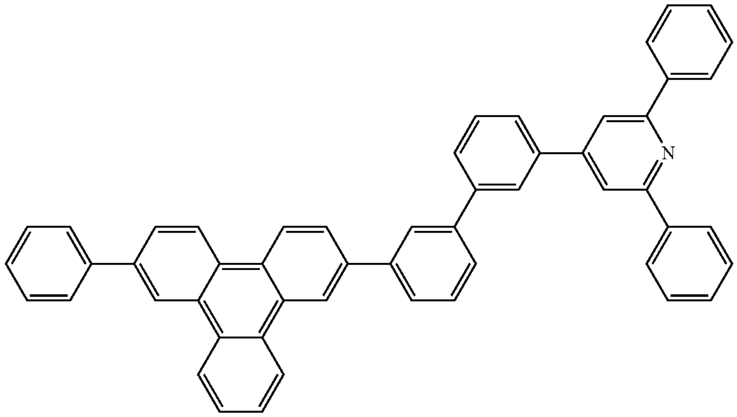

-continued
A-95
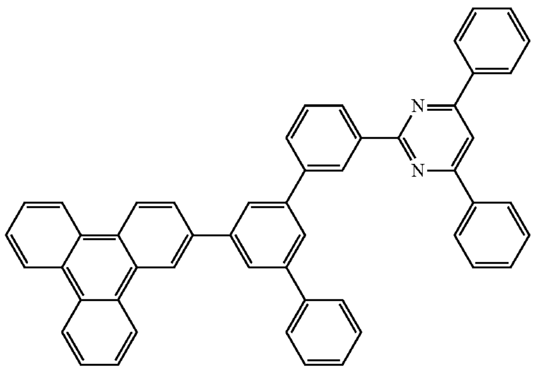
A-96
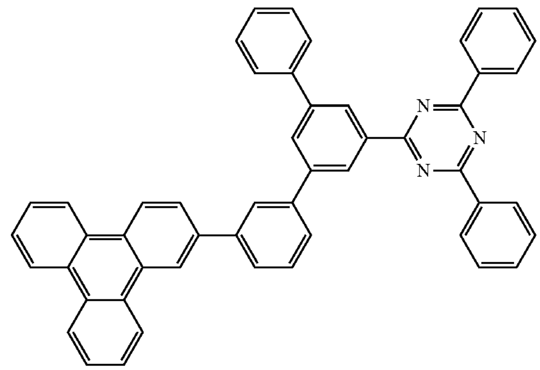
A-97
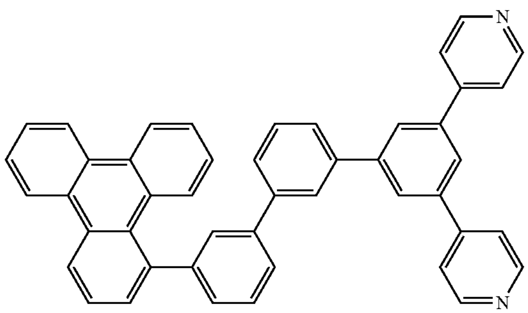
A-98
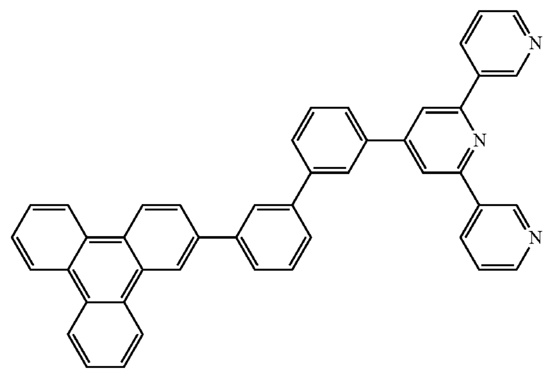
A-99
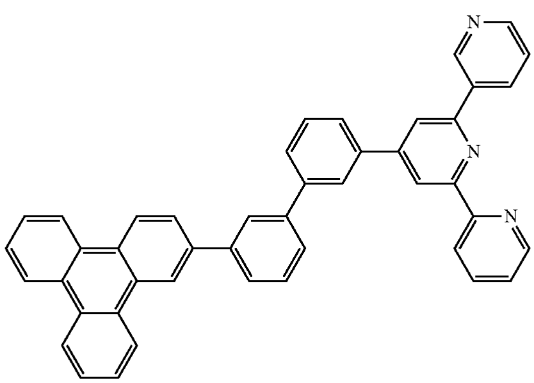
A-100
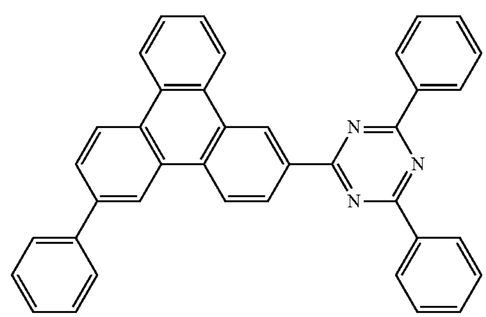
A-101
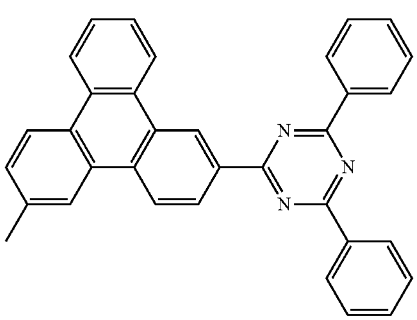
A-102
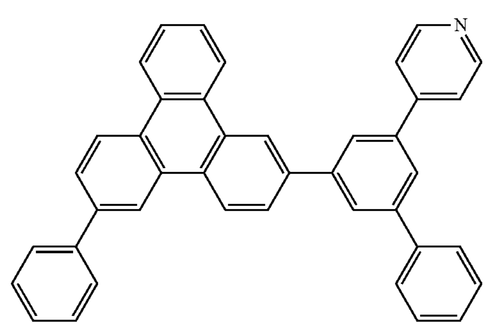

-continued
A-103
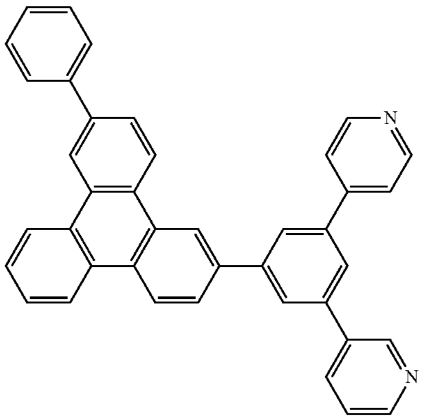
A-104
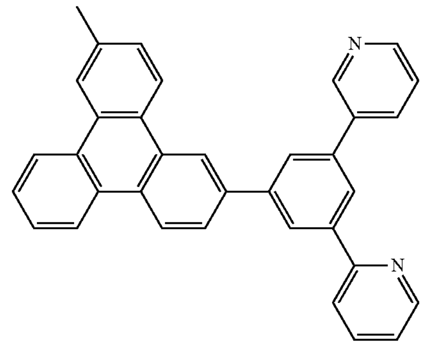
A-105
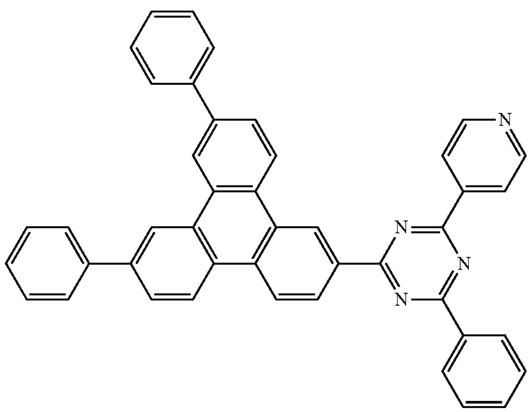
A-106
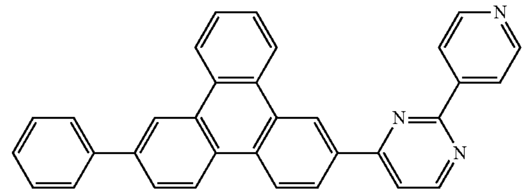
A-107
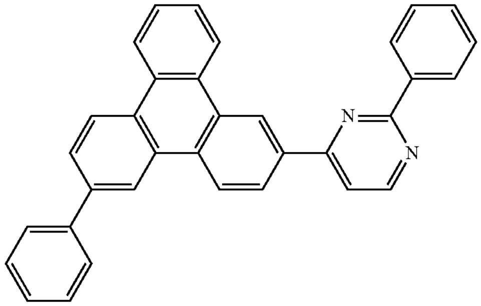
A-108
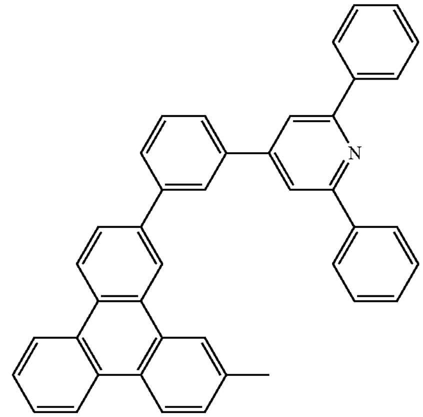

-continued
A-109
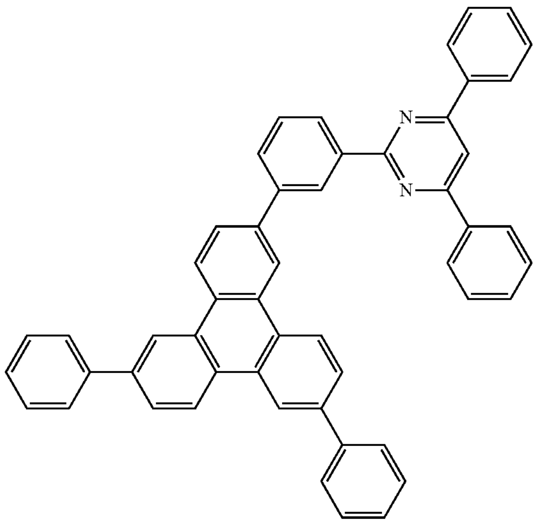
A-110
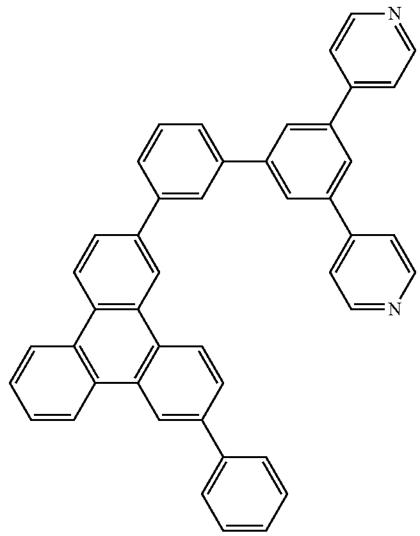
A-111
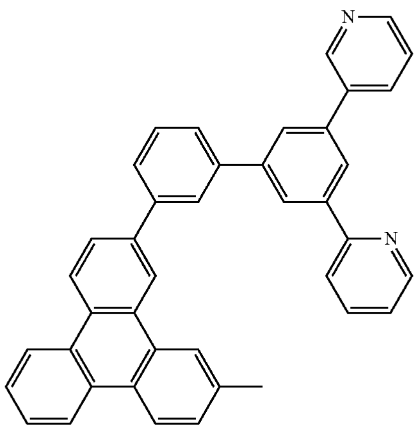
A-112
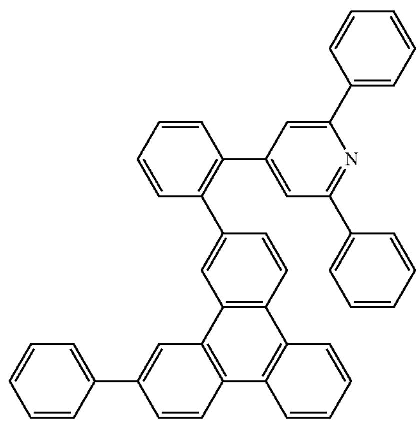
A-113
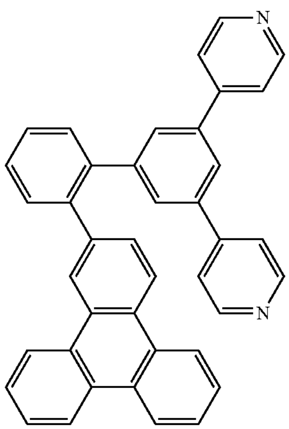
A-114
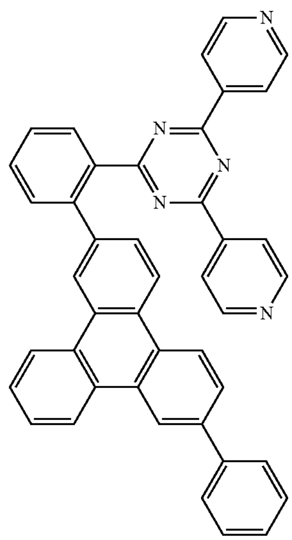

-continued
A-115
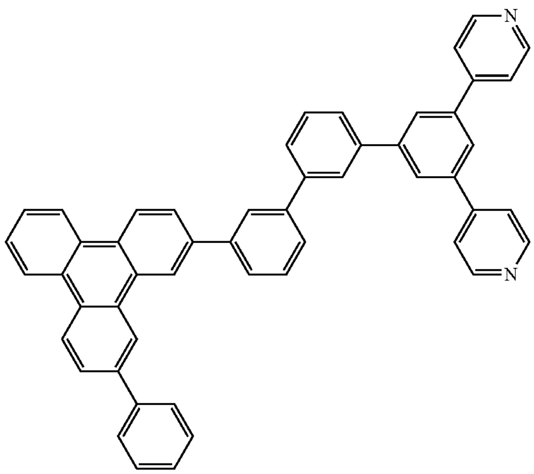
A-116
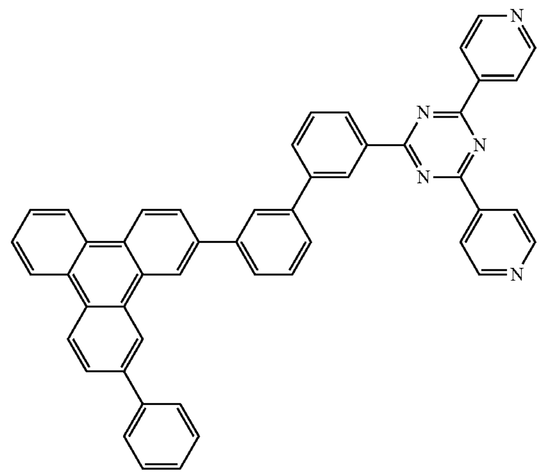
A-117
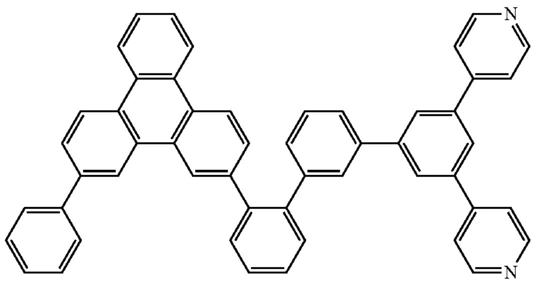
A-118
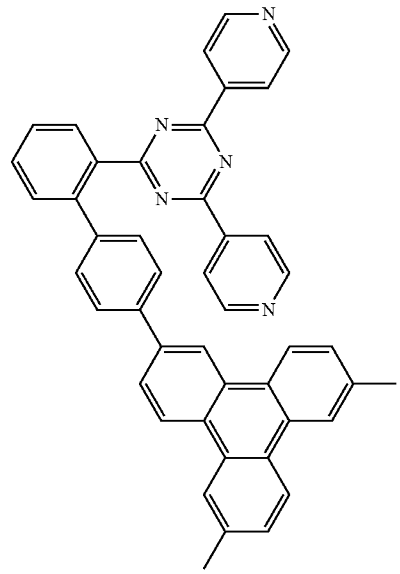
A-119
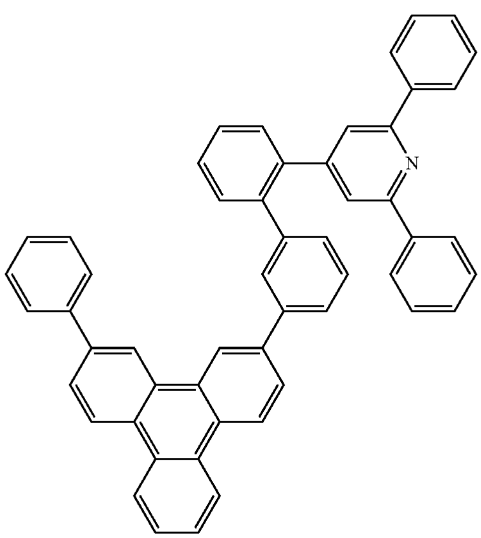
A-120
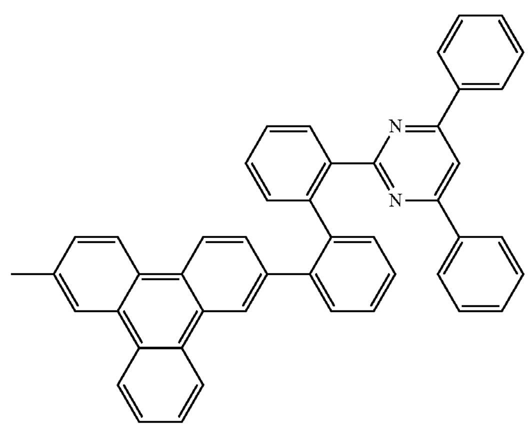

-continued
A-121
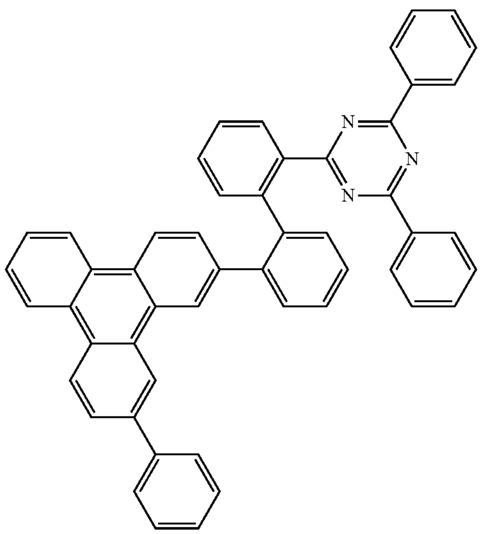
A-122
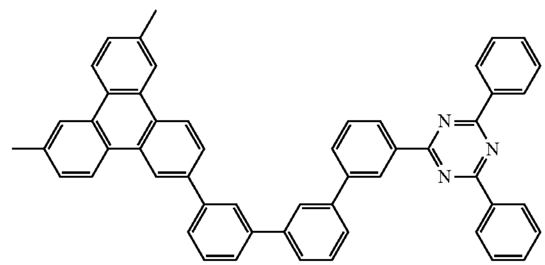
A-123
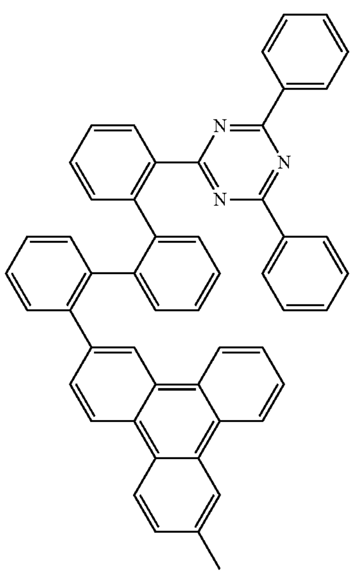
A-124
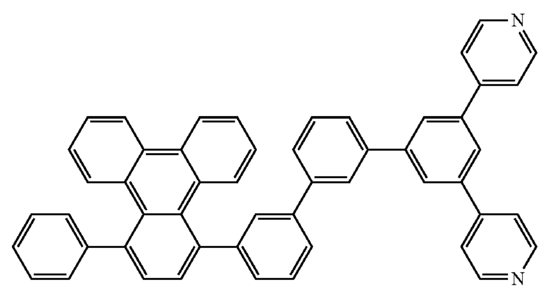
A-125
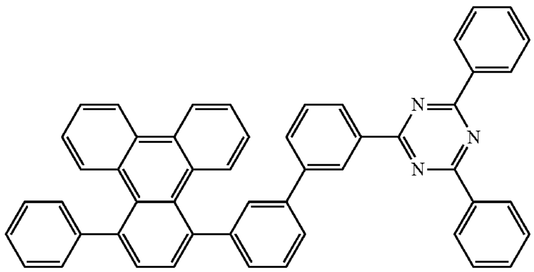
A(1)
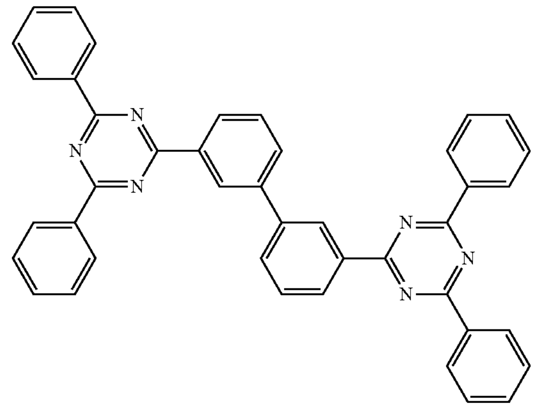

-continued
A(2)
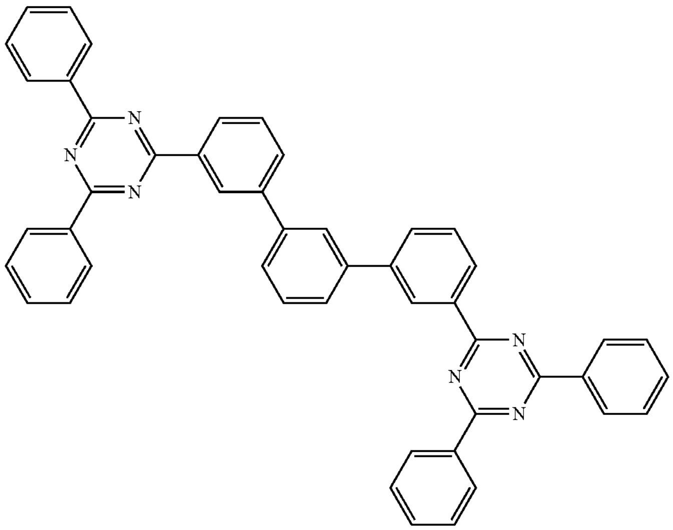
A(3)
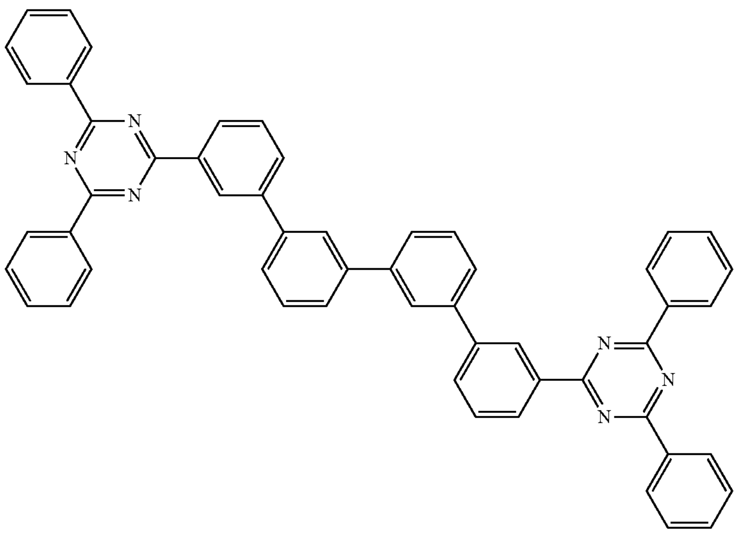
A(4)
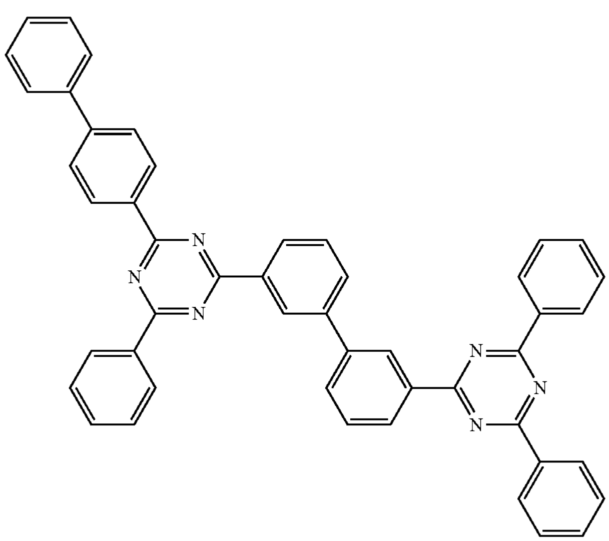

-continued
A(5)
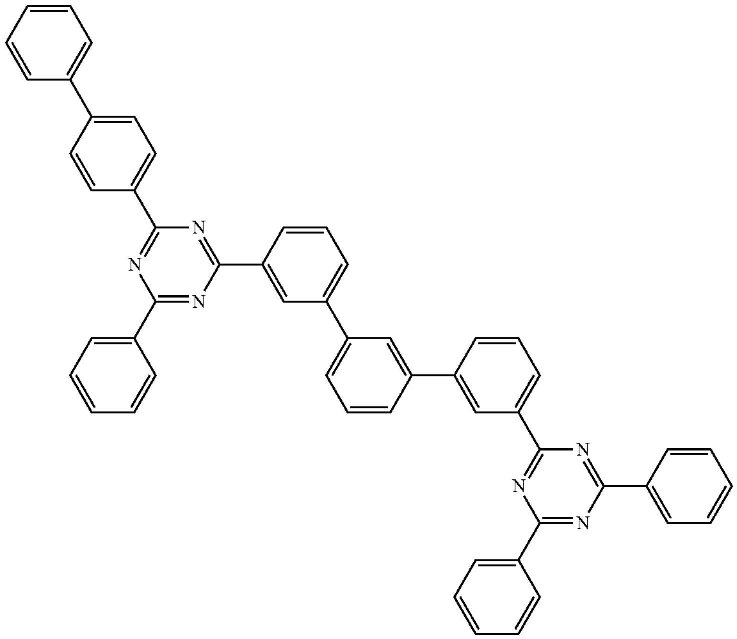
A(6)
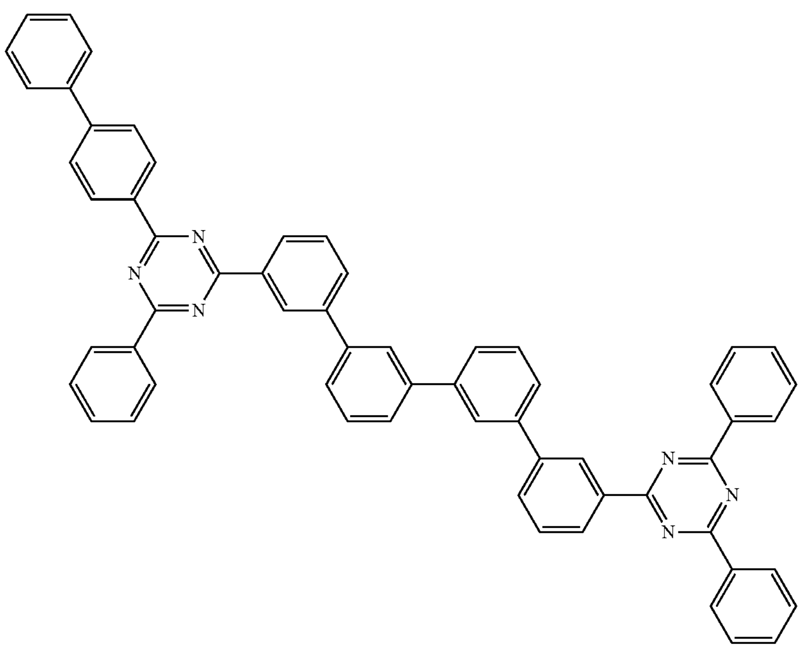

-continued
A(7)
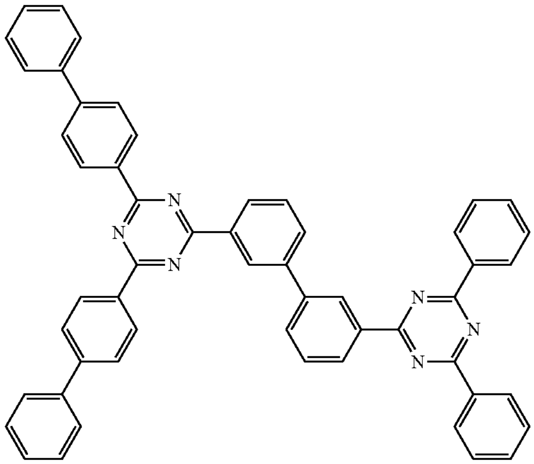
A(8)
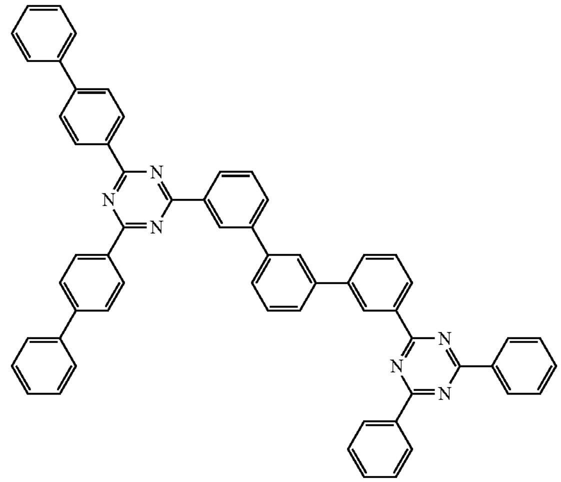
A(9)
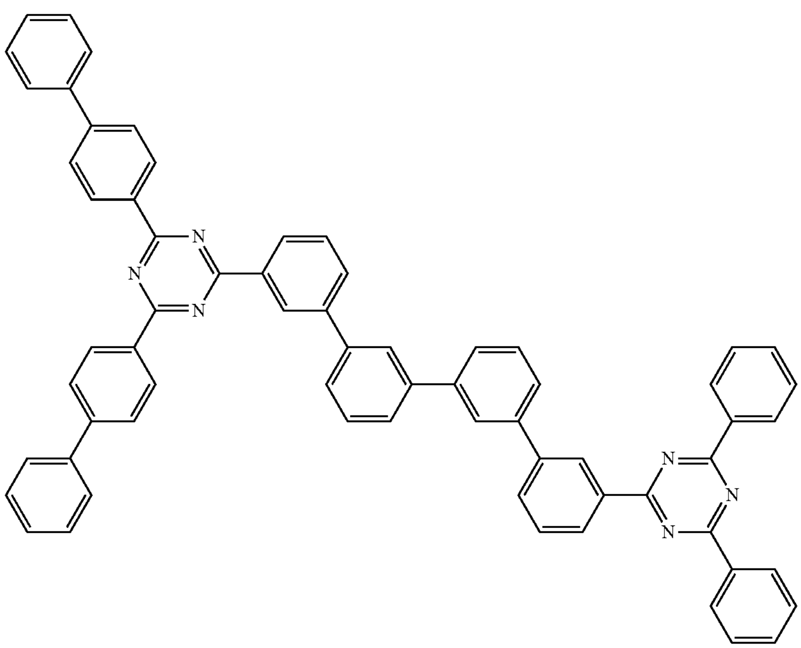

-continued
A(10)
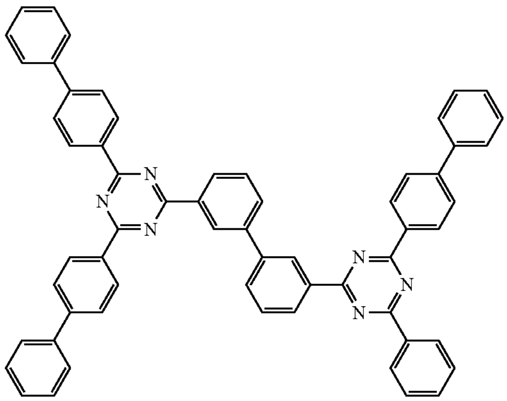
A(11)
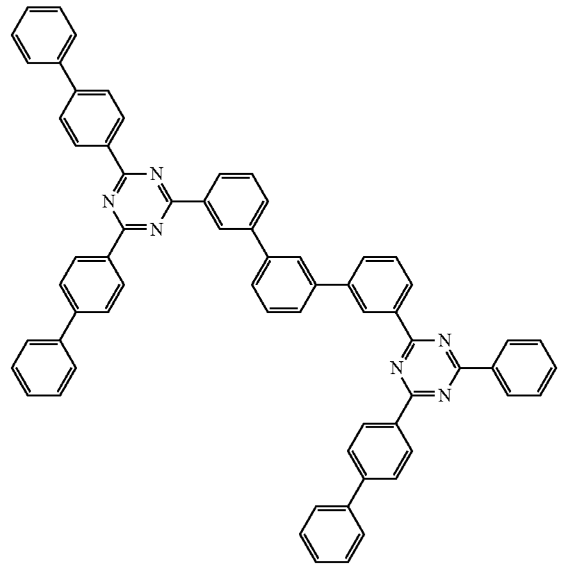
A(12)
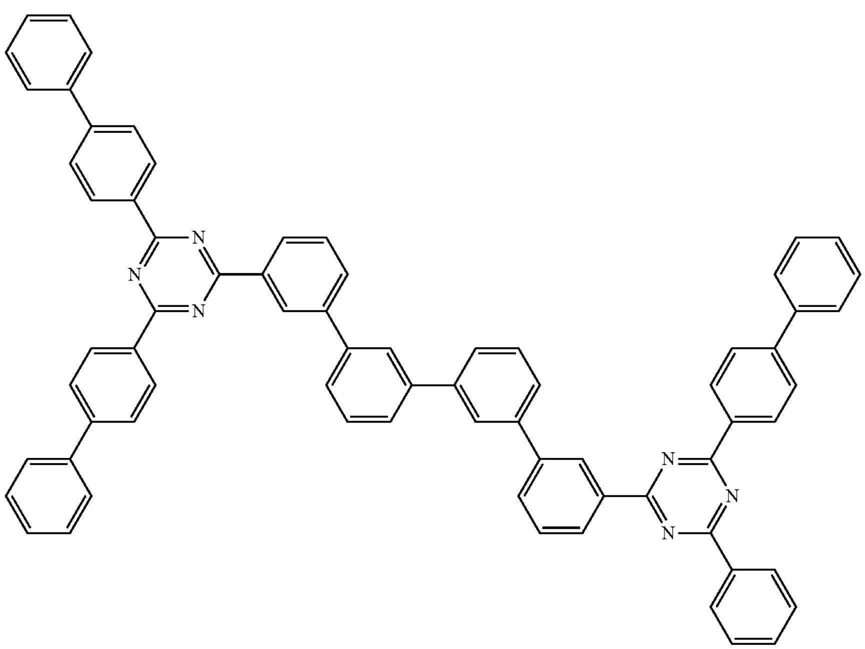

-continued
A(13)
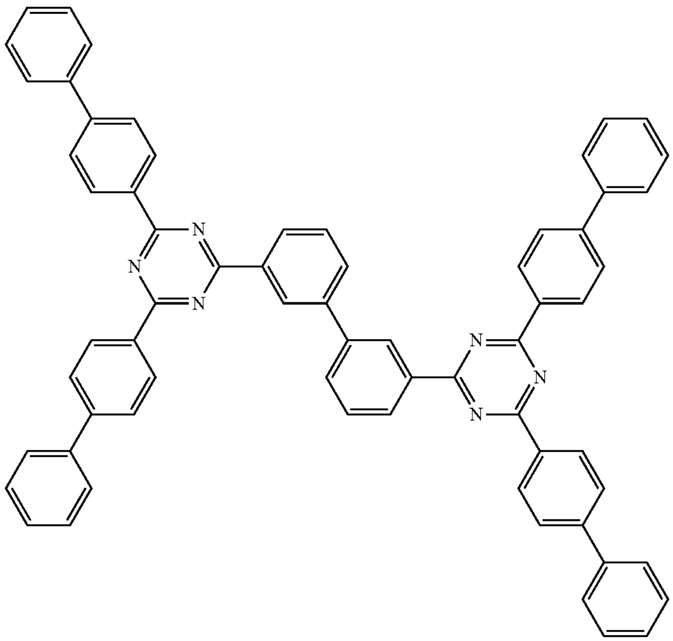
A(14)
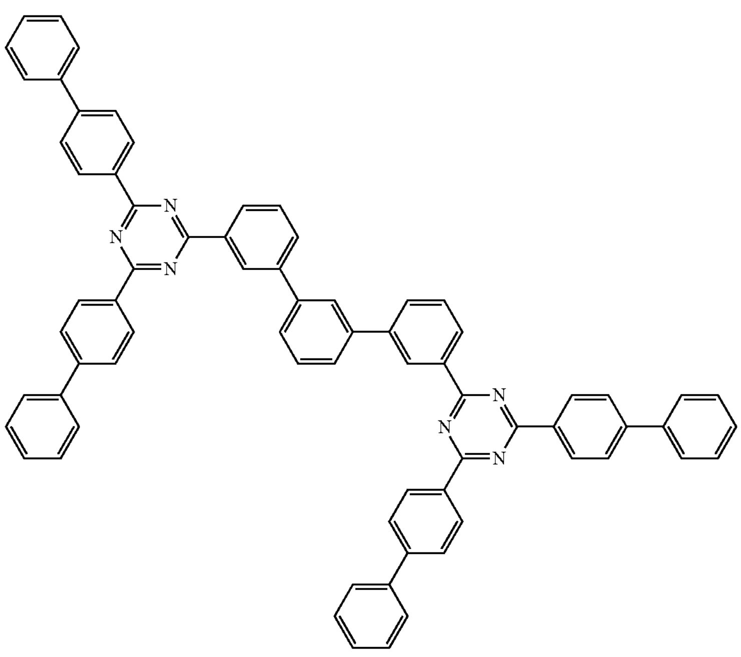

-continued
A(15)
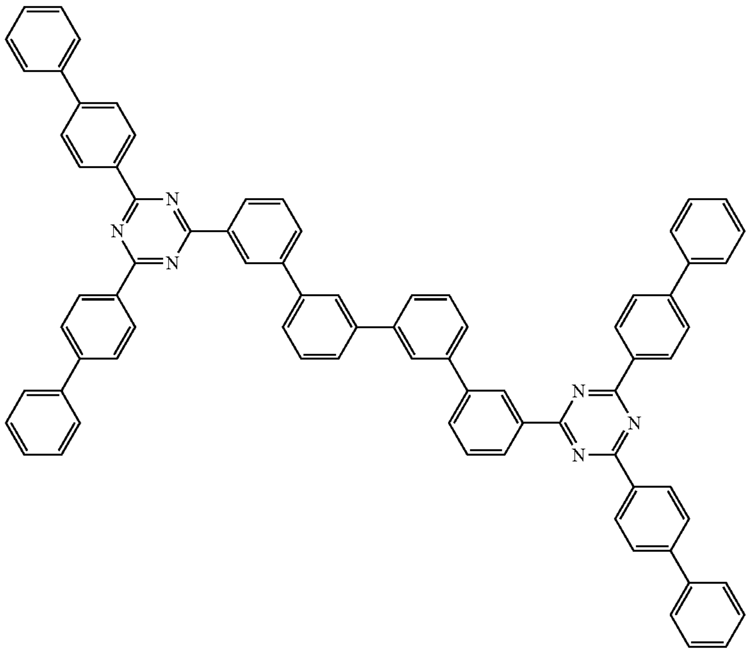
A(16)
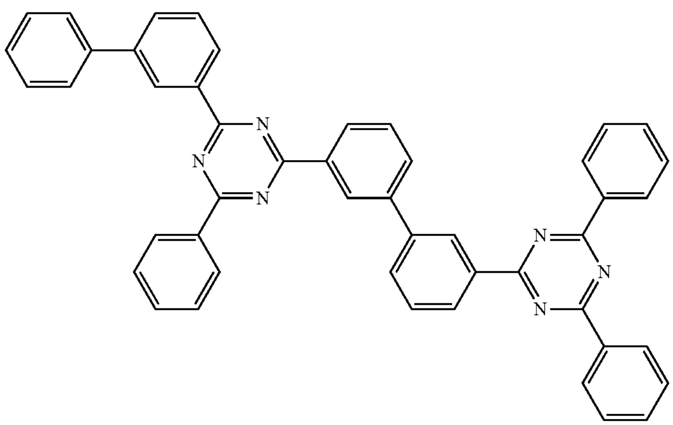
A(17)
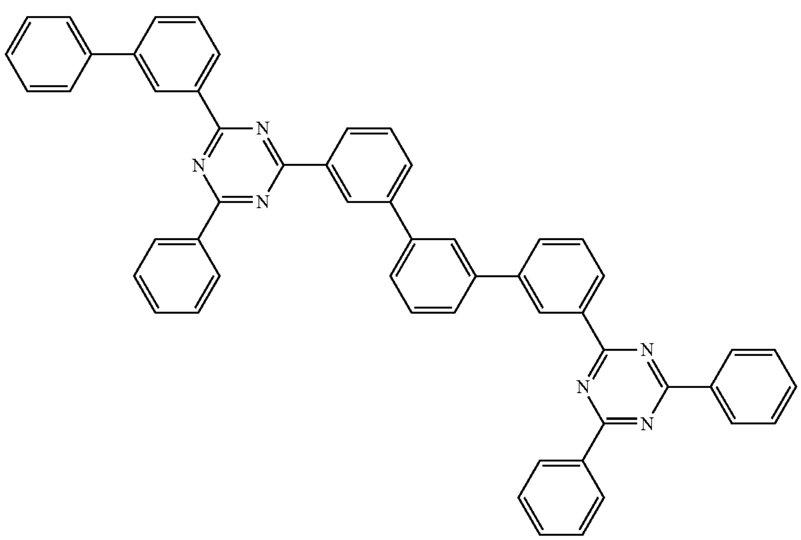

-continued
A(18)
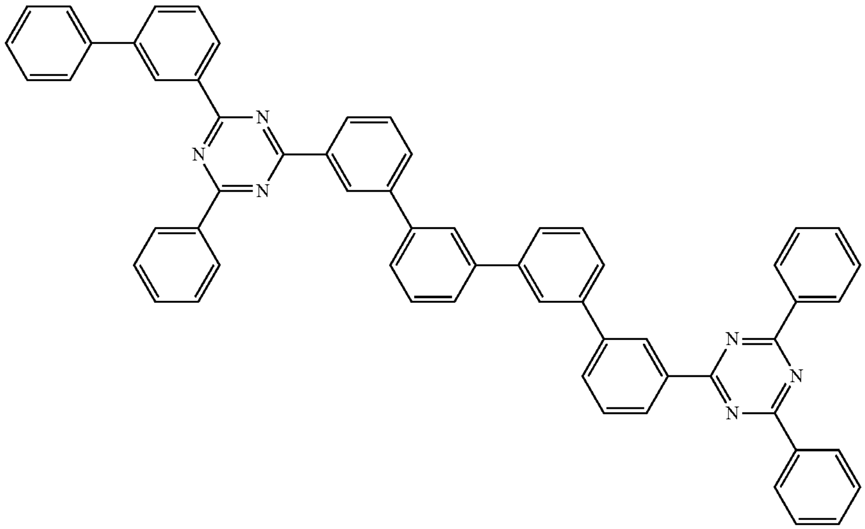
A(19)
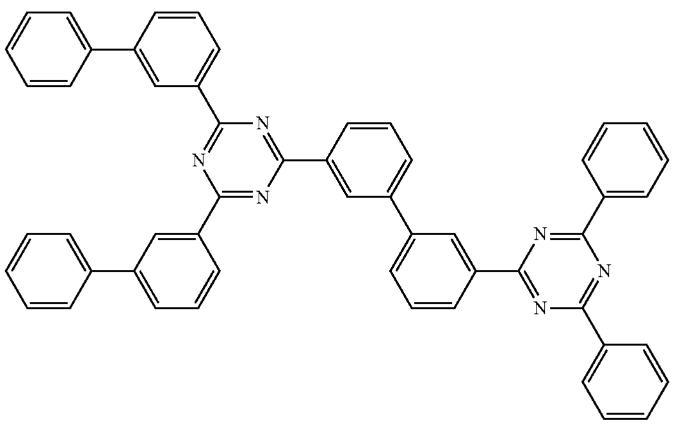
A(20)
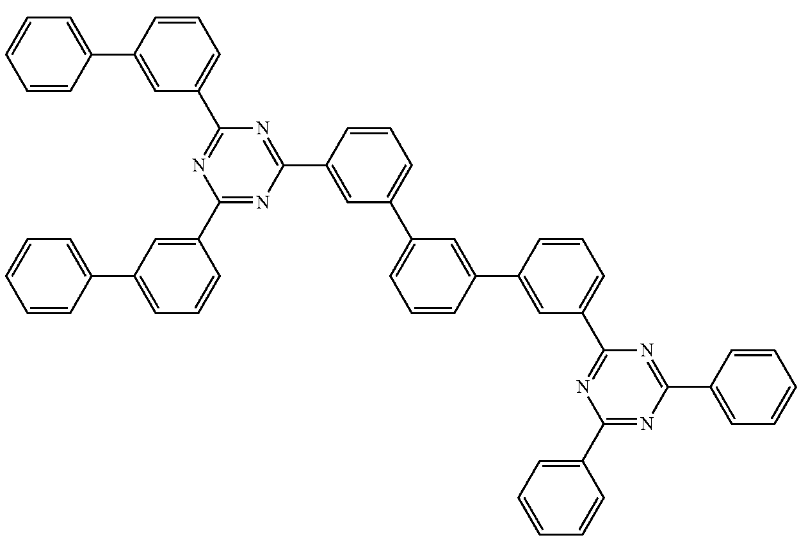

-continued
A(21)
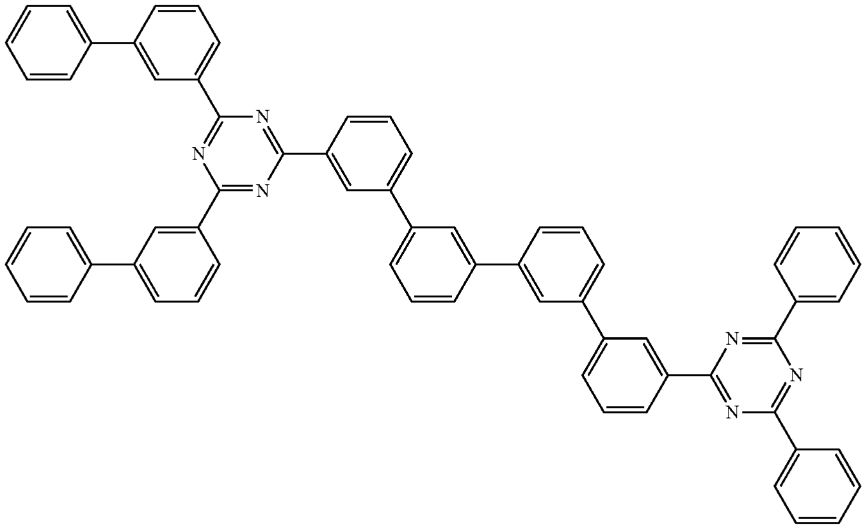
A(22)
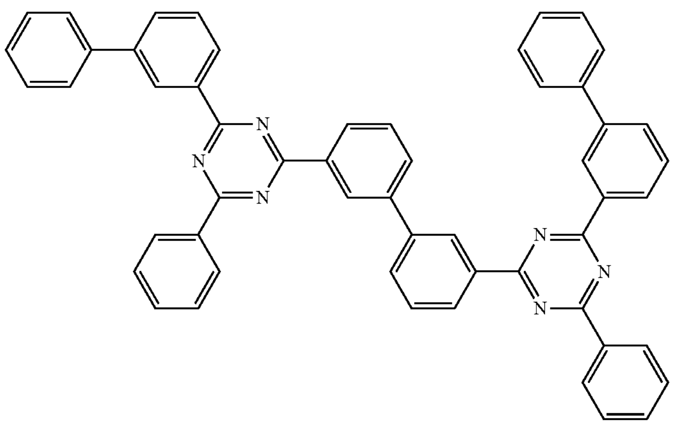
A(23)
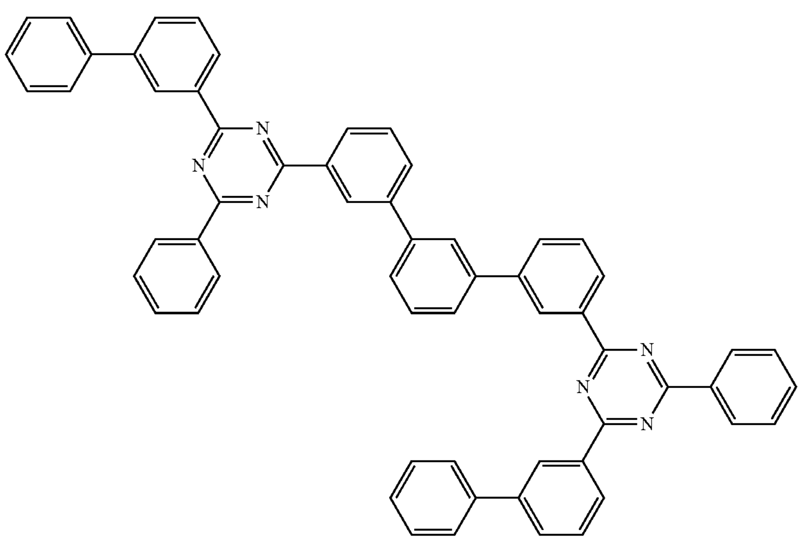

-continued
A(24)
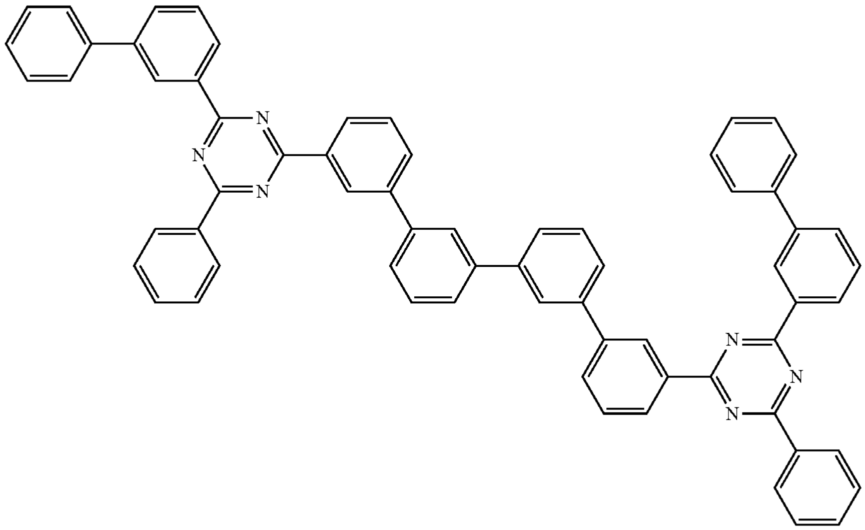
A(25)
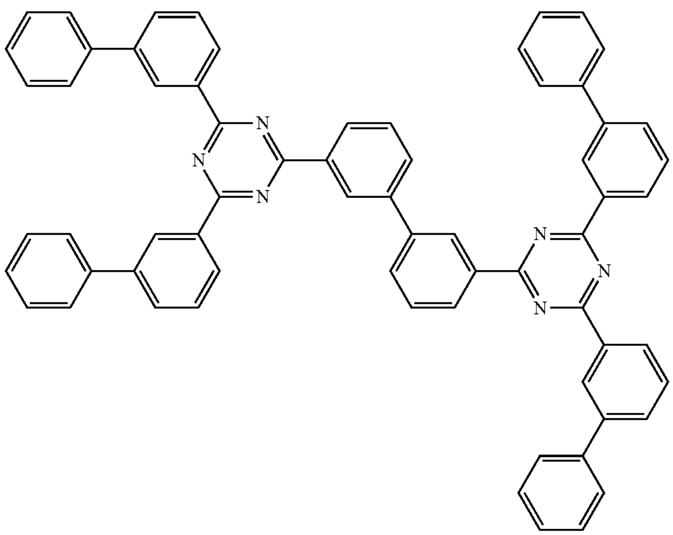
A(26)
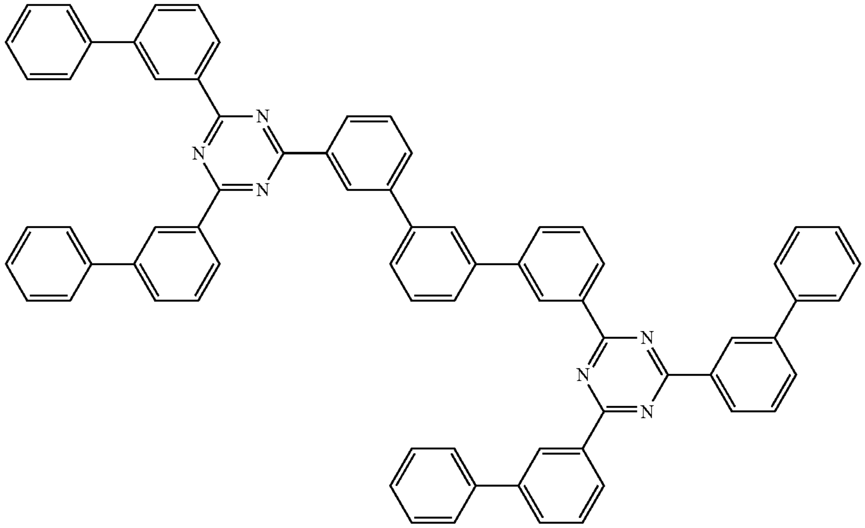

-continued
A(27)
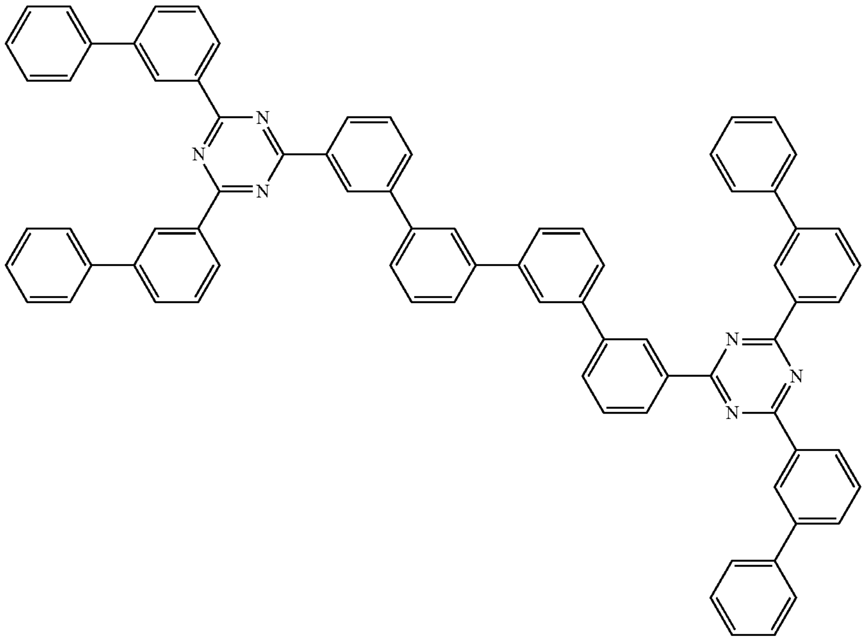
A(28)
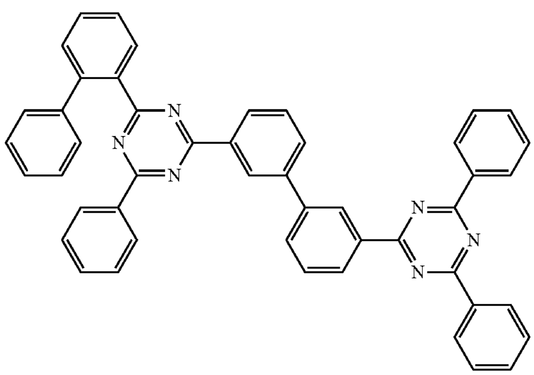
A(29)
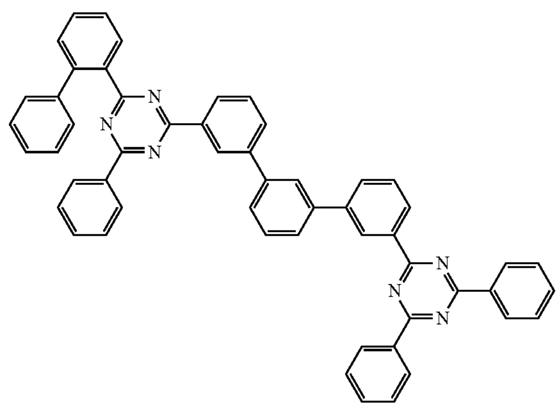
A(30)
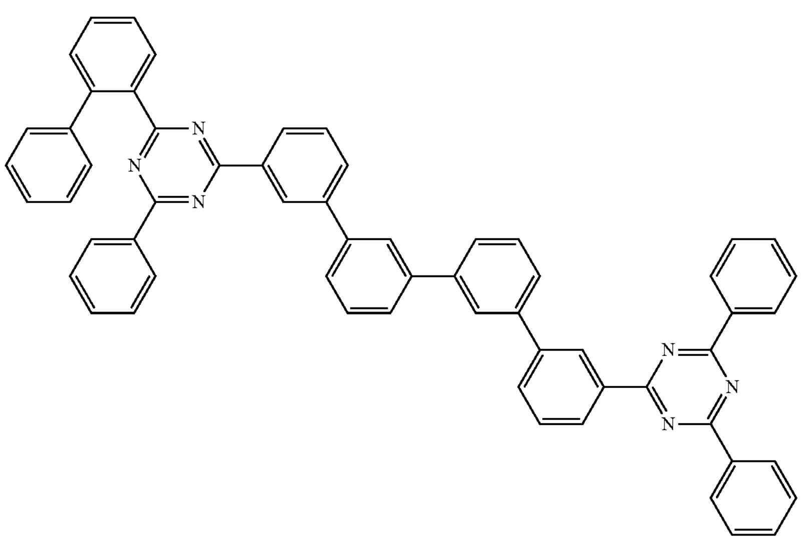

-continued
A(31)
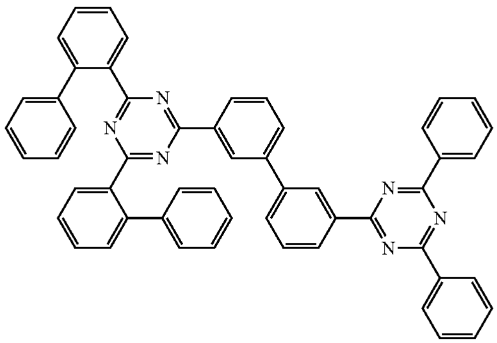
A(32)
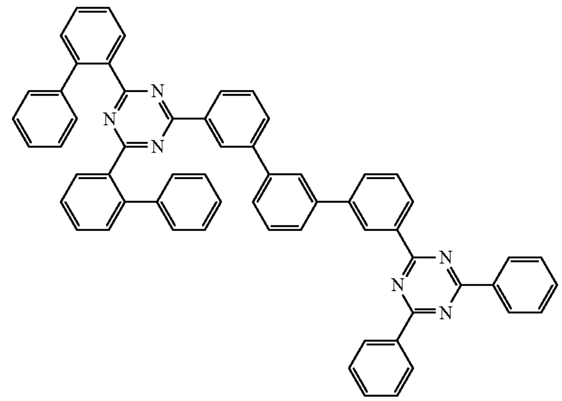
A(33)
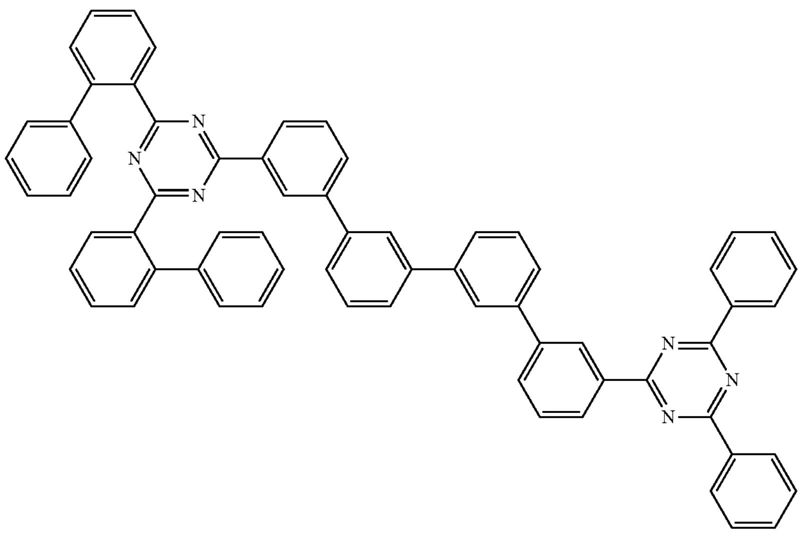
A(34)
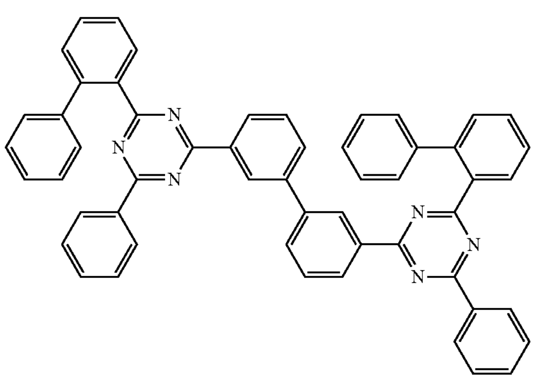
A(35)
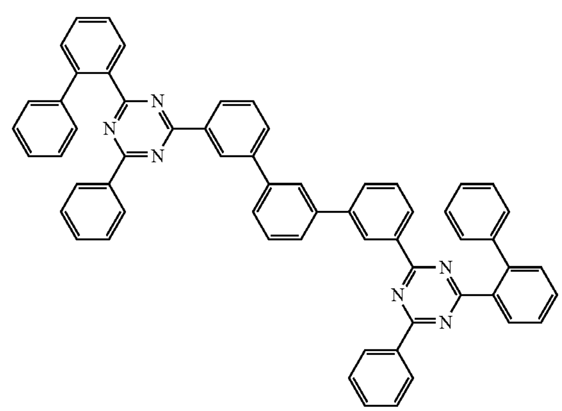

-continued
A(36)
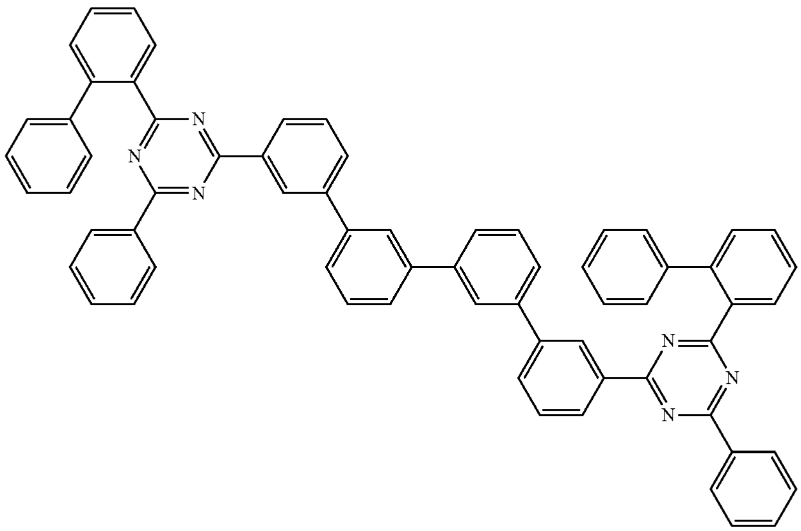
A(37)
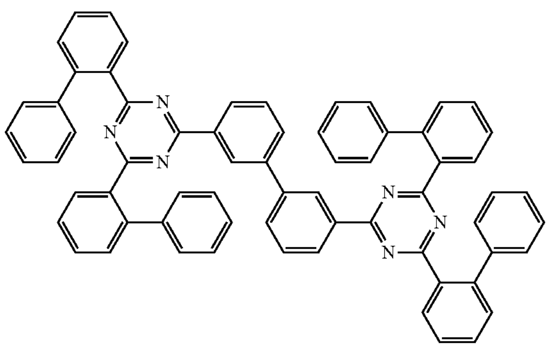
A(38)
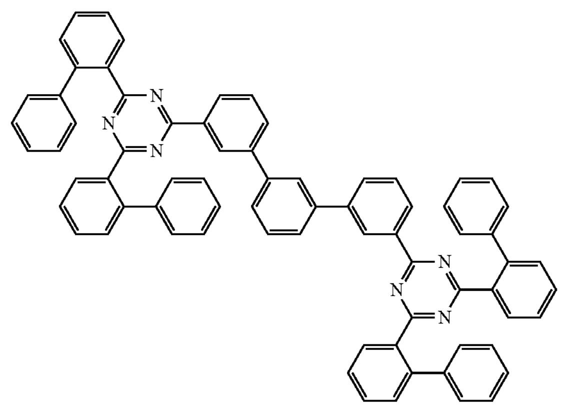
A(39)
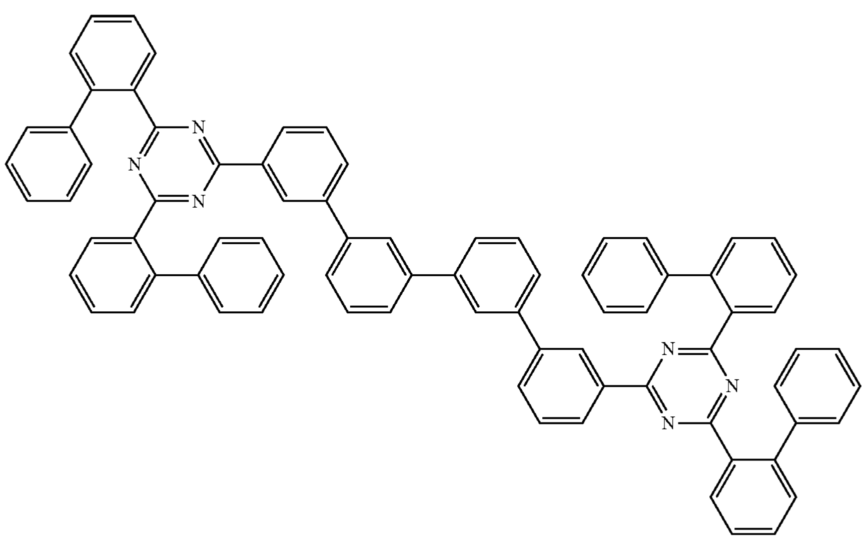

-continued
A(40)
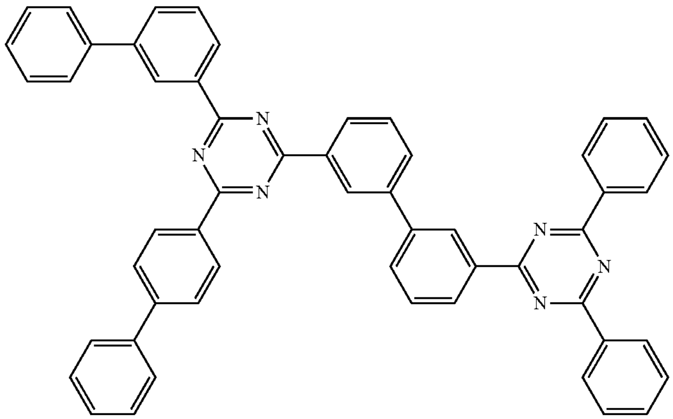
A(41)
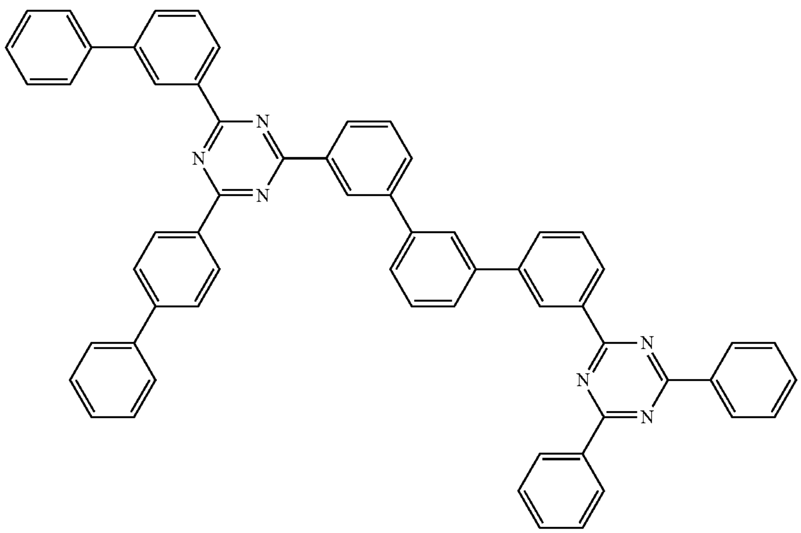
A(42)
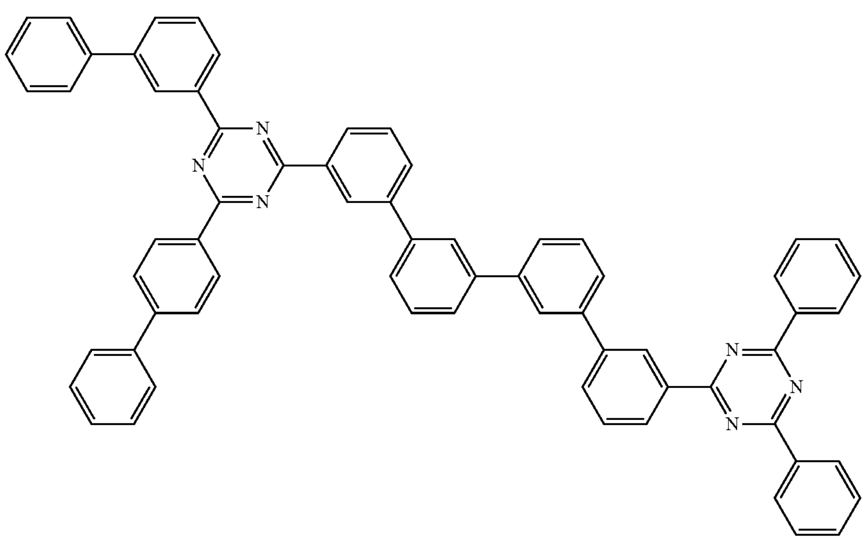

-continued
A(43)
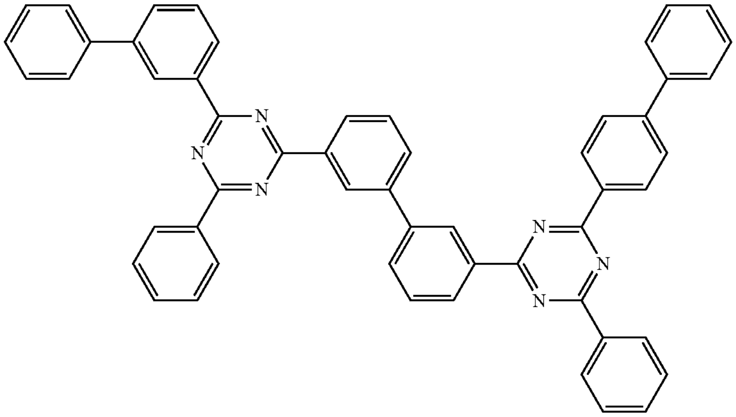
A(44)
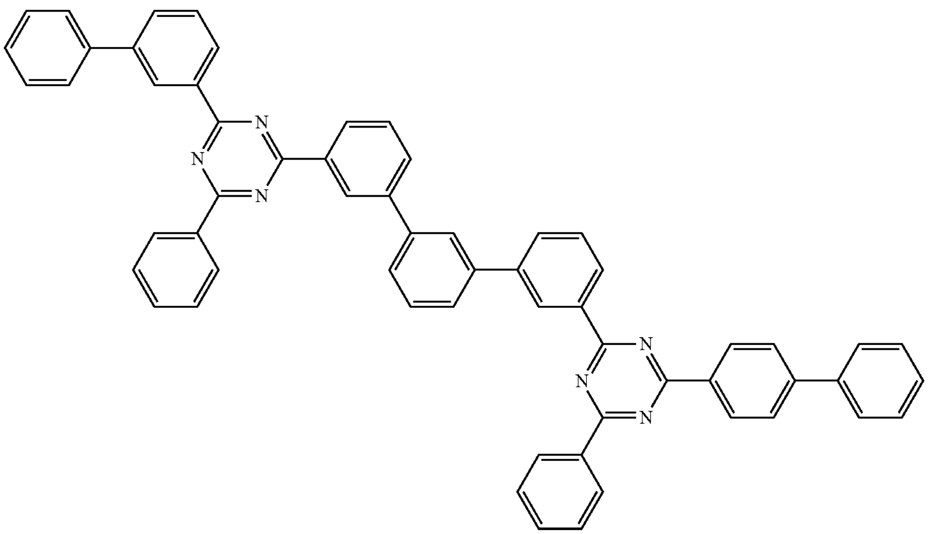
A(45)
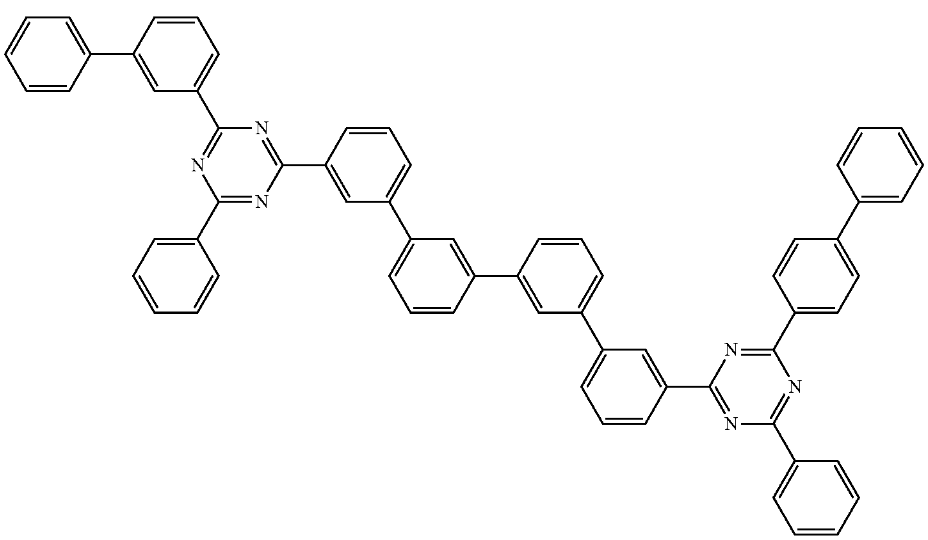

-continued
A(46)
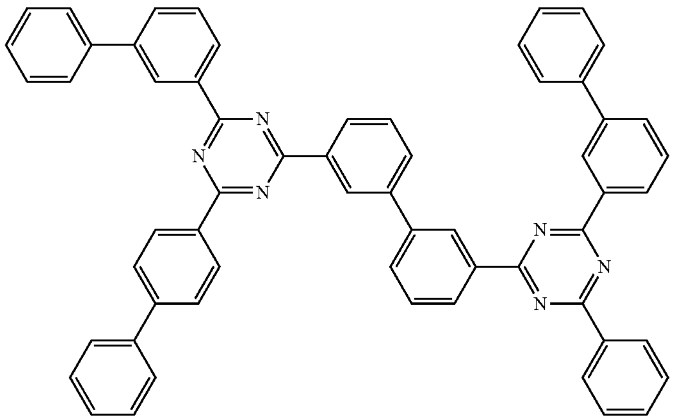
A(47)
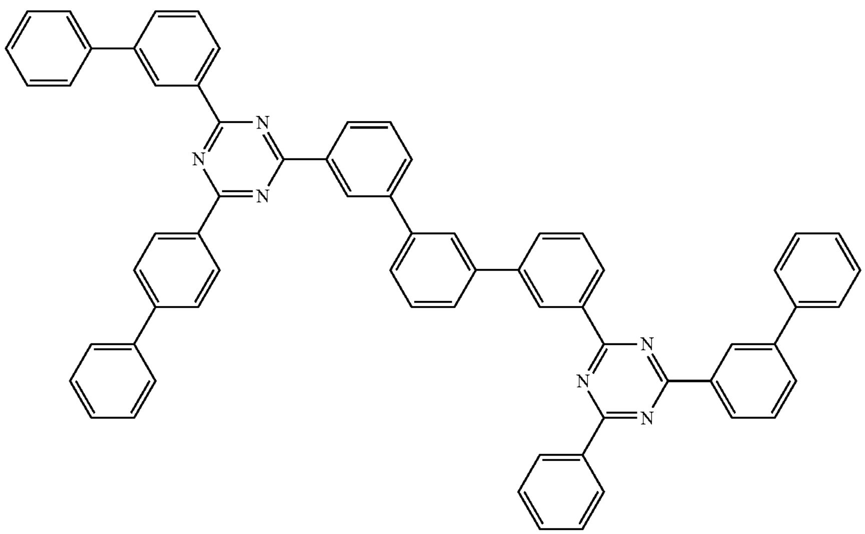
A(48)
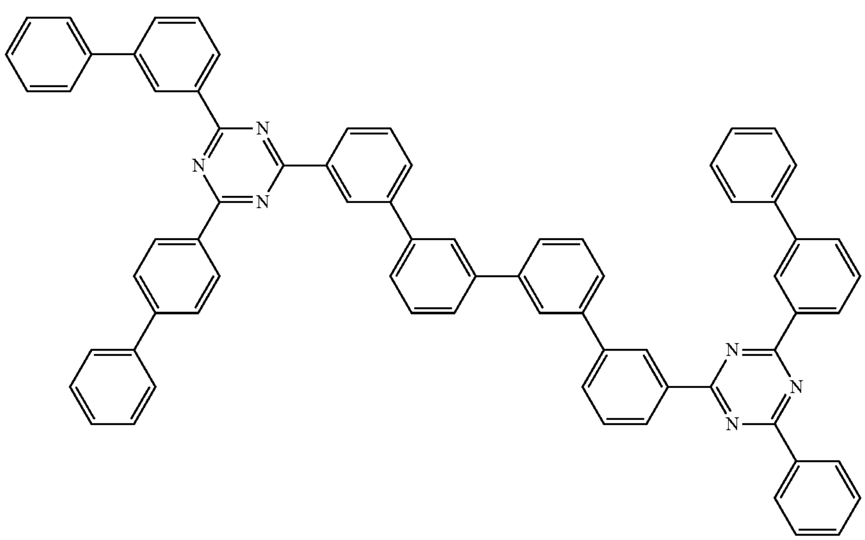

-continued
A(49)
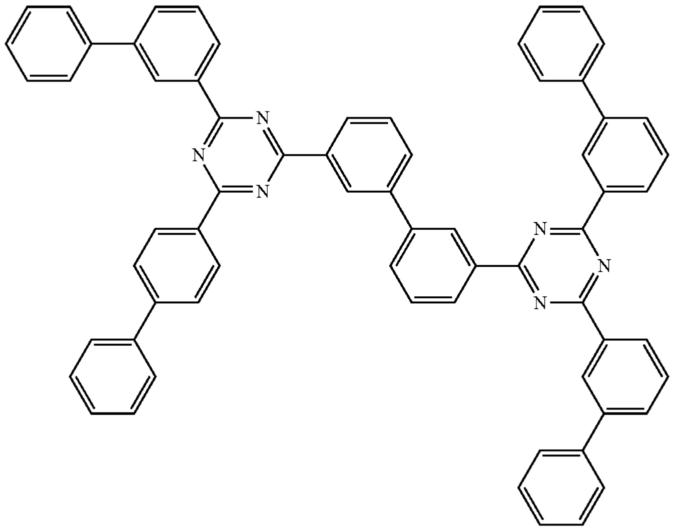
A(50)
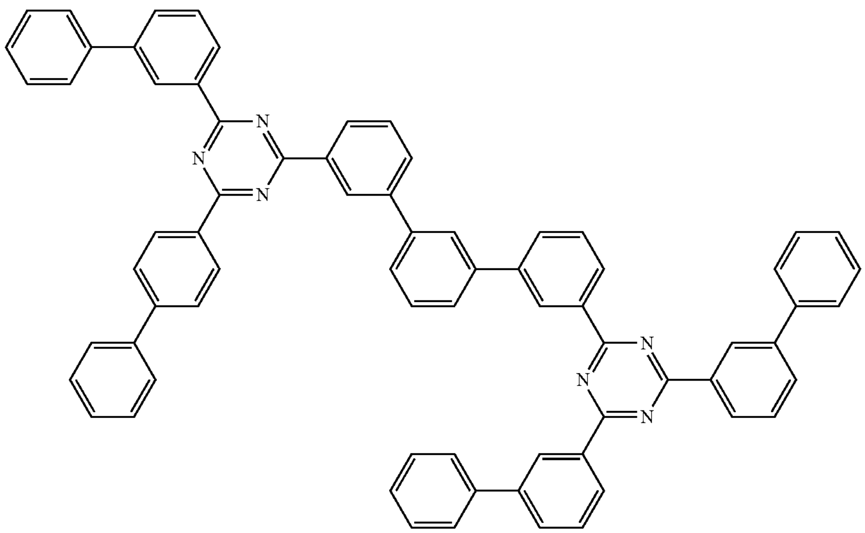
A(51)
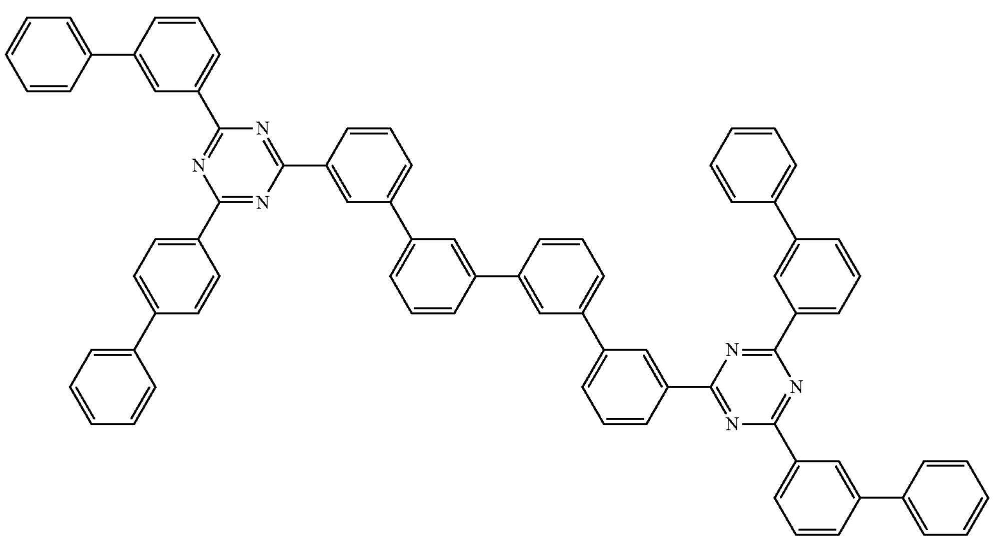

-continued
A(52)
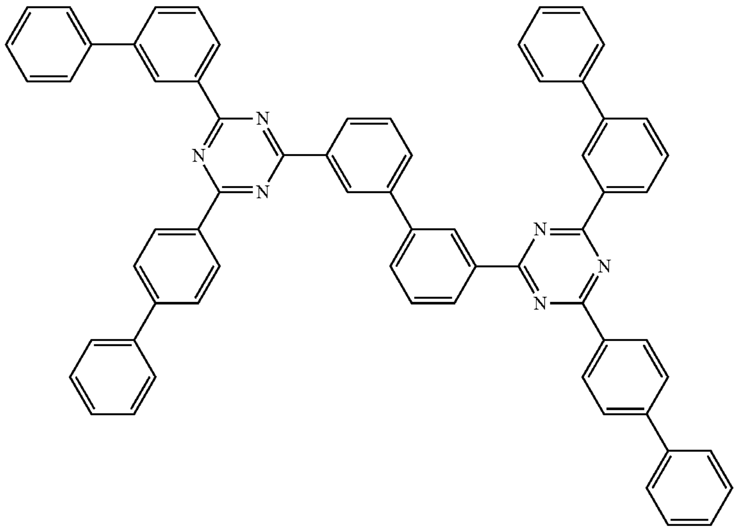
A(53)
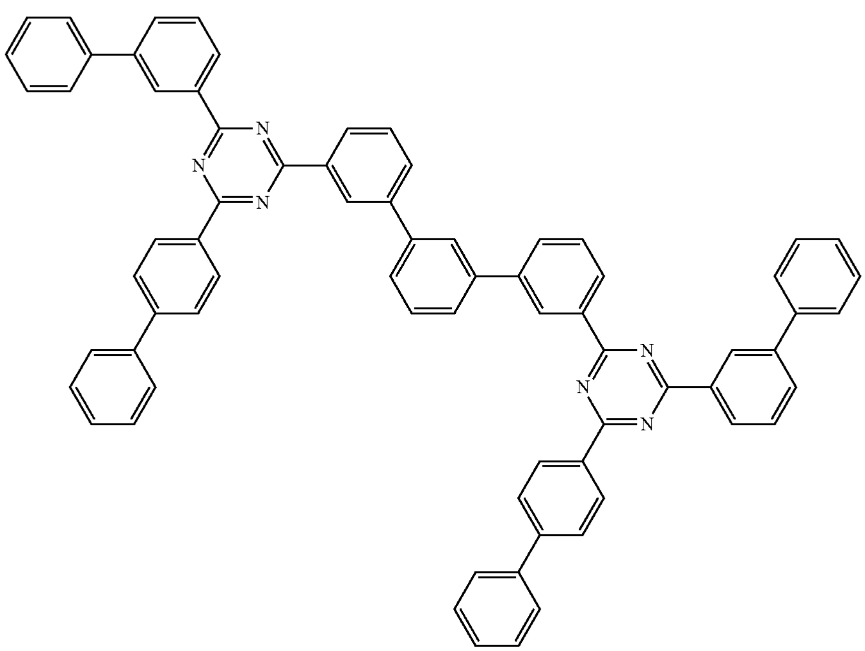

-continued
A(54)
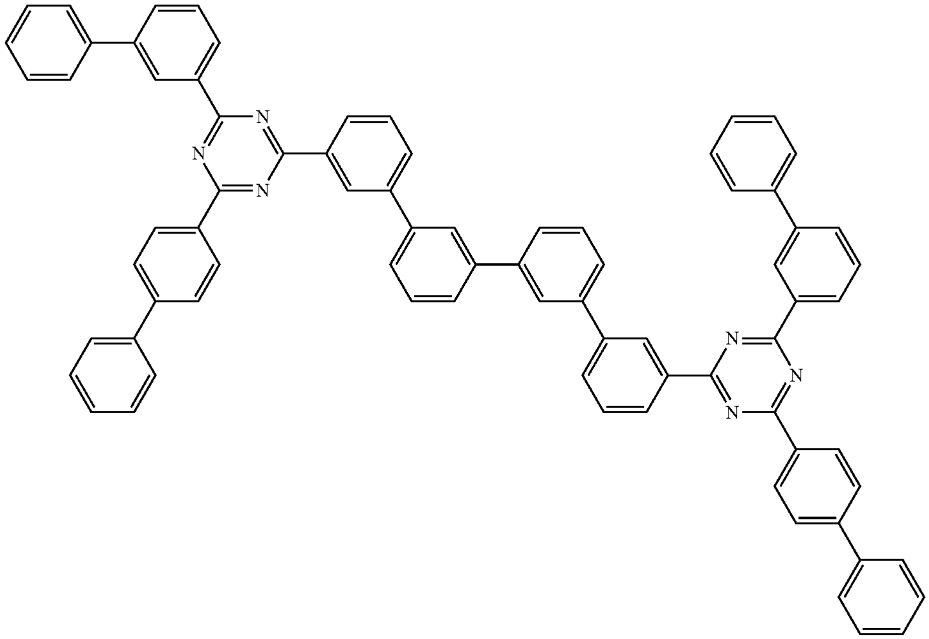
A(55)
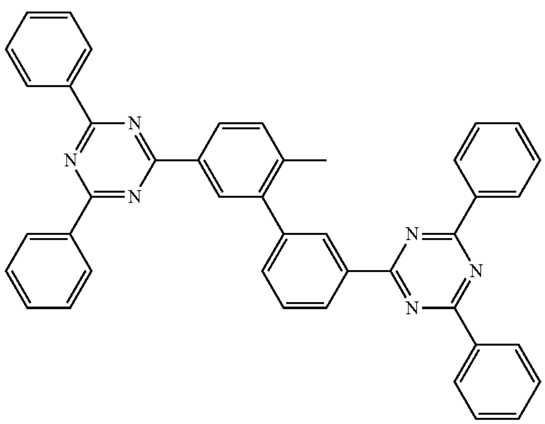
A(56)
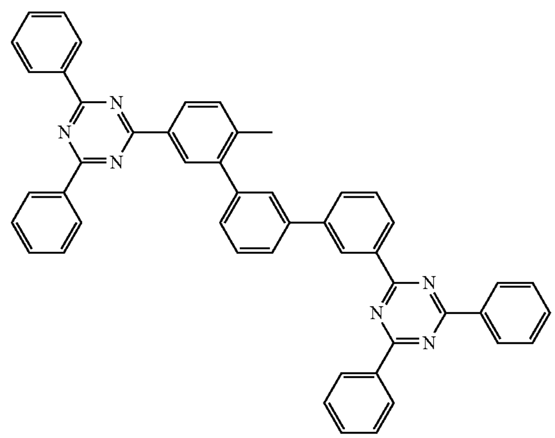
A(57)
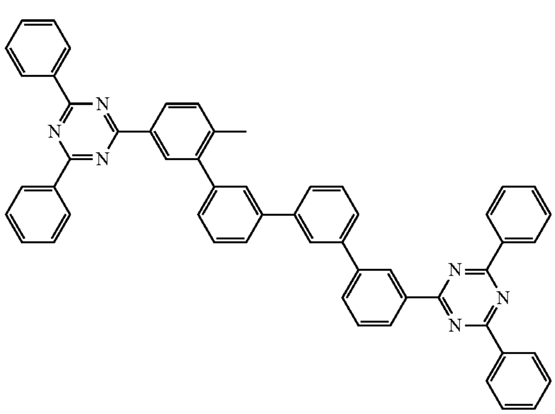
A(58)
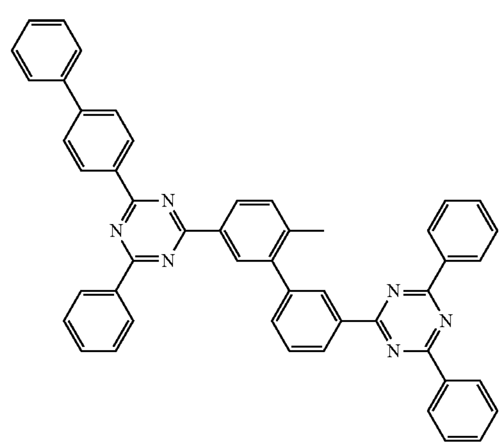

-continued
A(59)
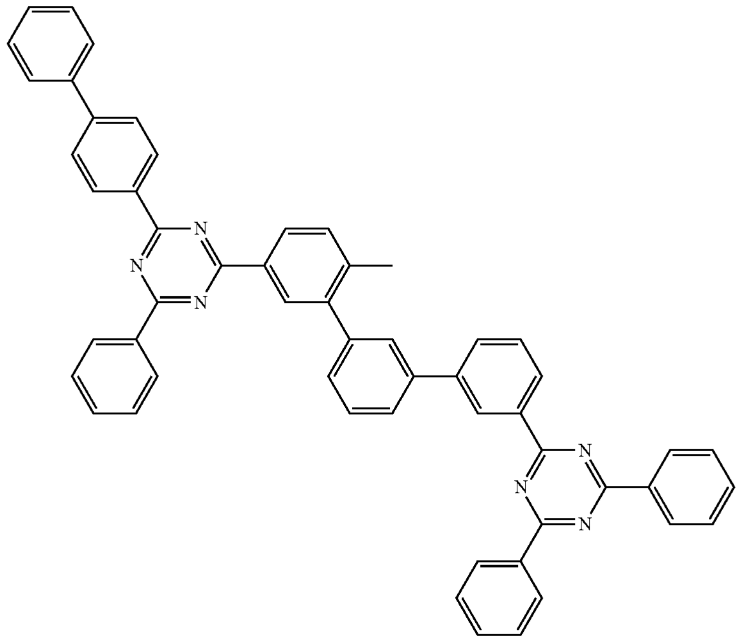
A(60)
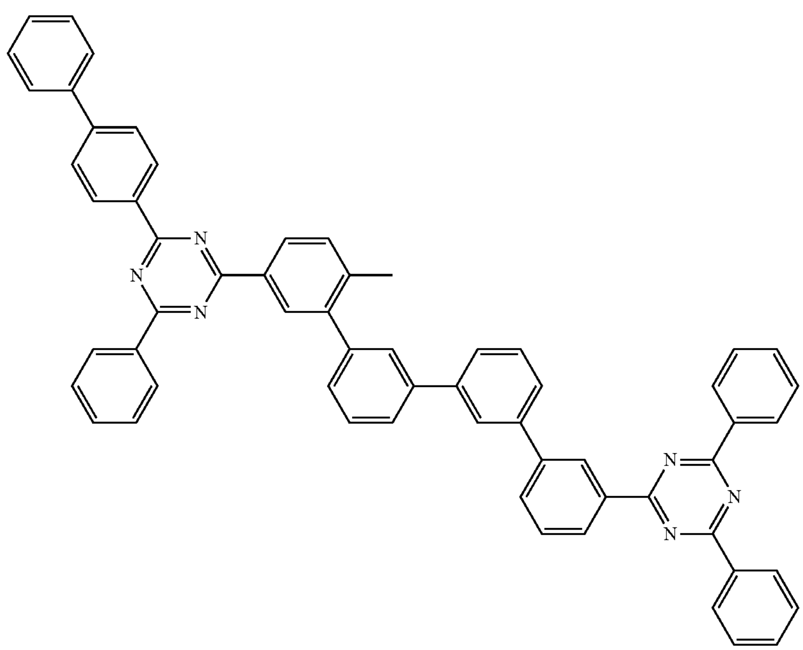

-continued
A(61)
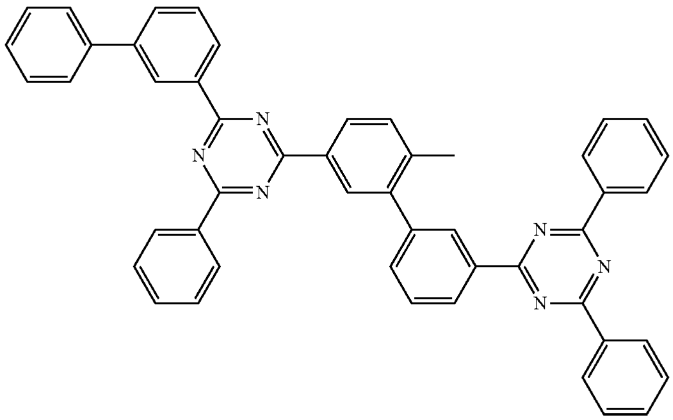
A(62)
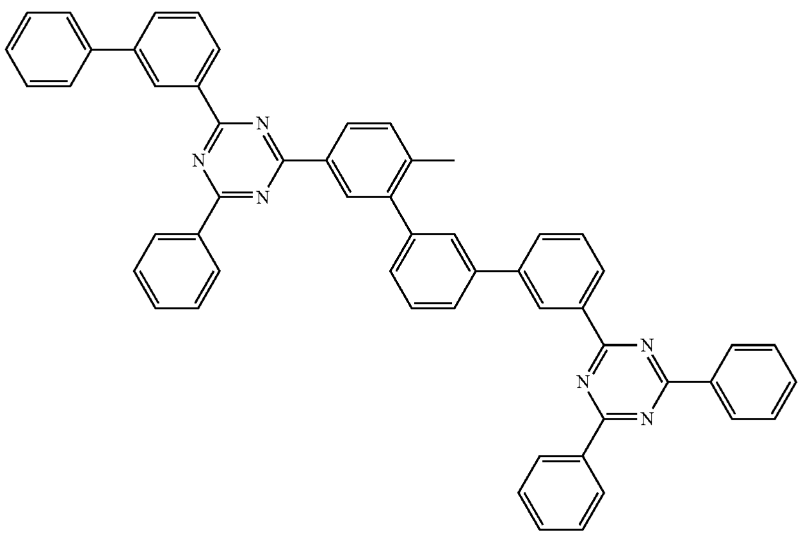
A(63)
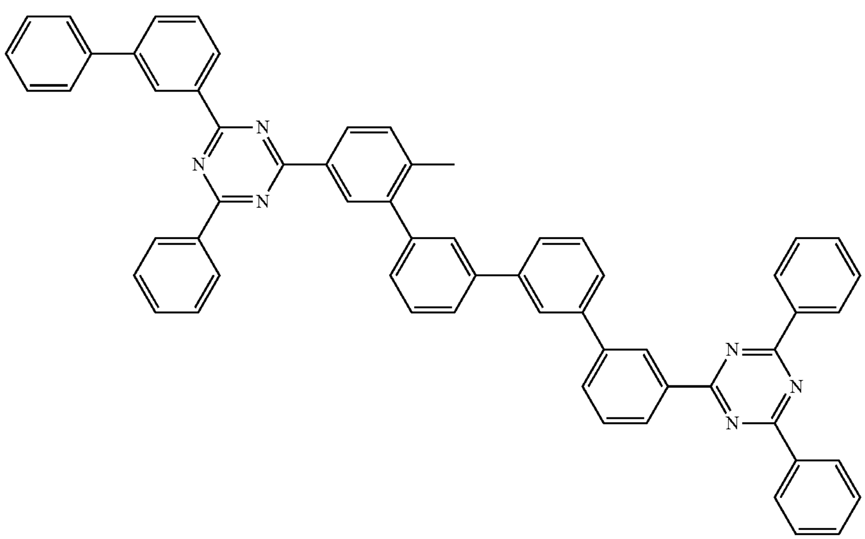

-continued
A(64)
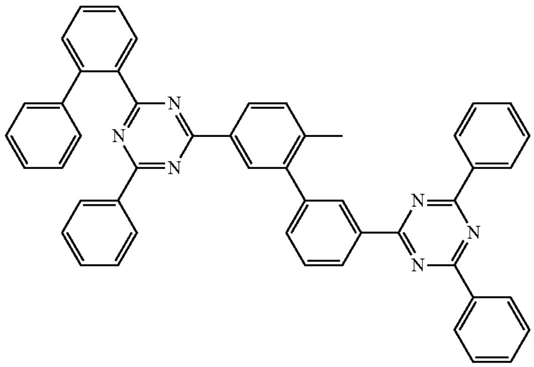
A(65)
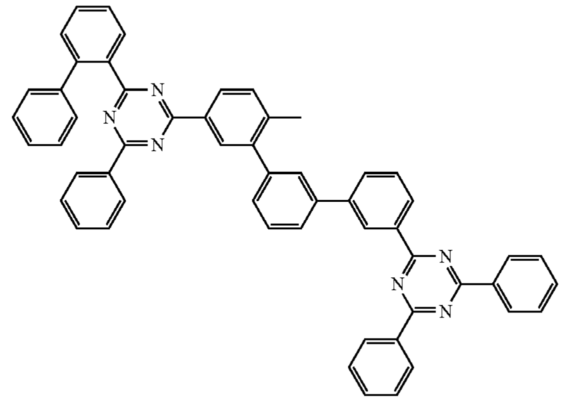
A(66)
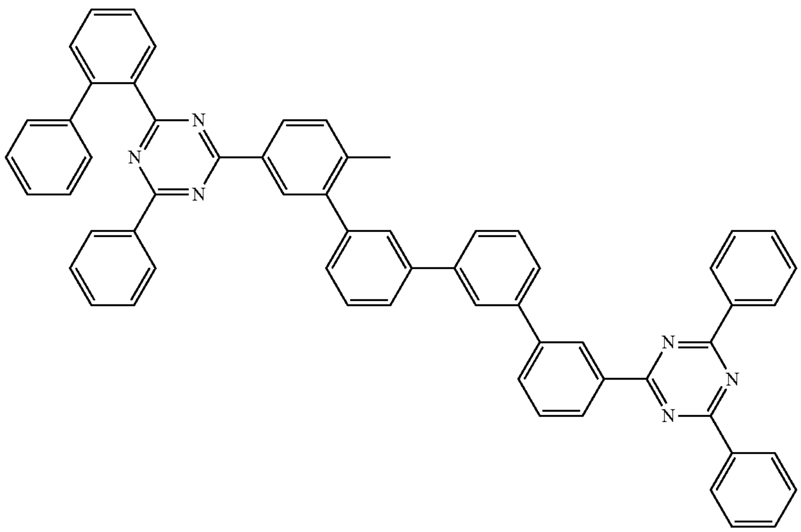
A(67)
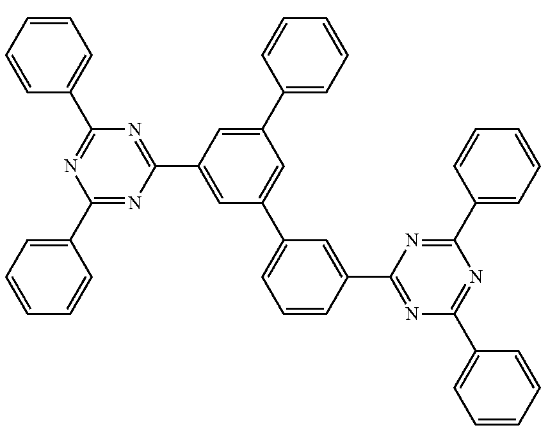
A(68)
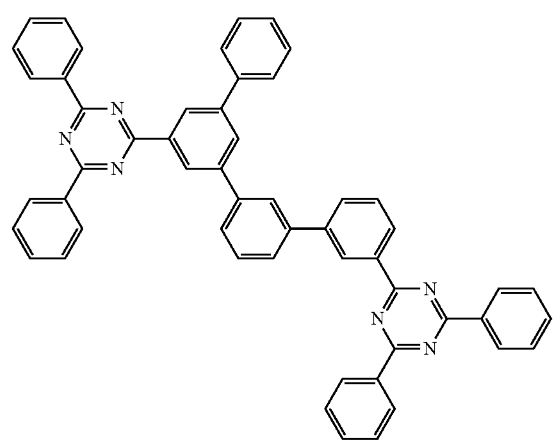

-continued
A(69)
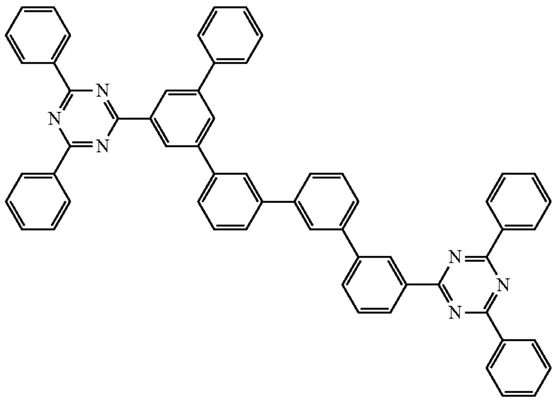
A(70)
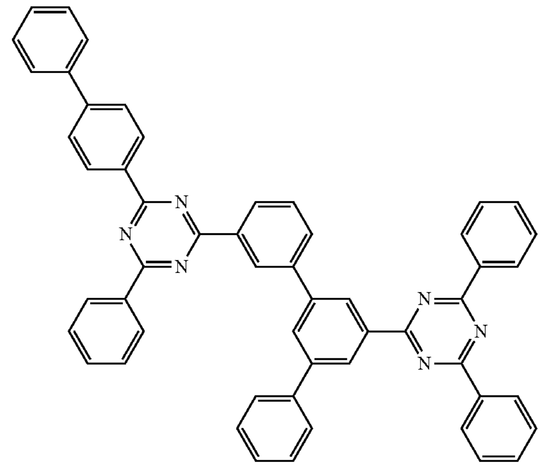
A(71)
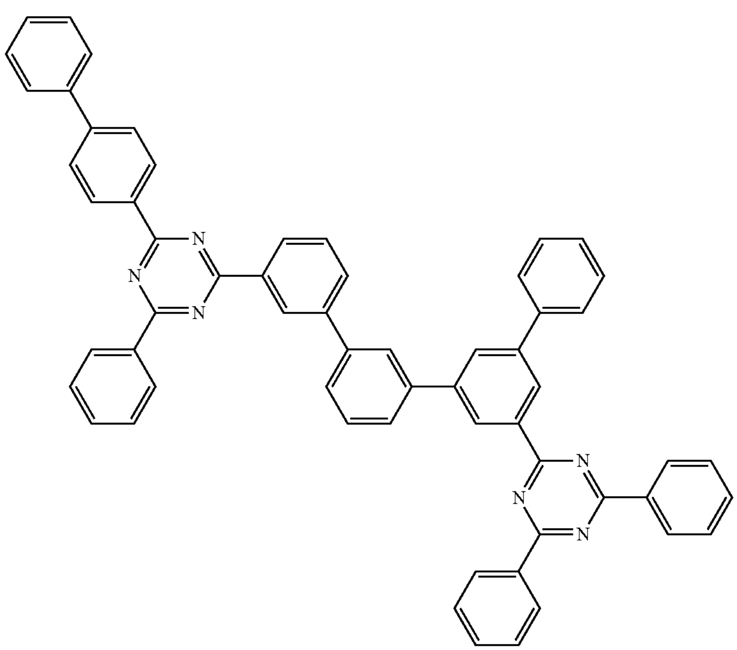

-continued
A(72)
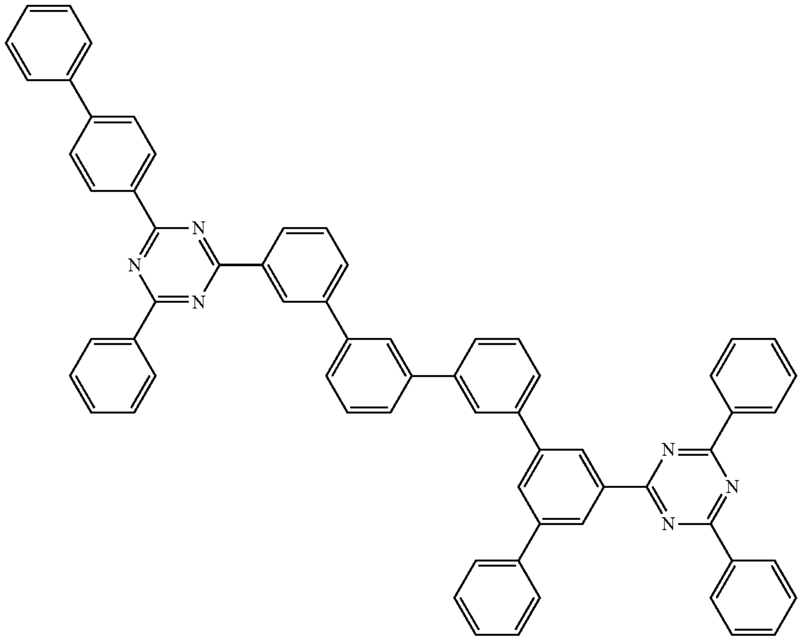
A(73)
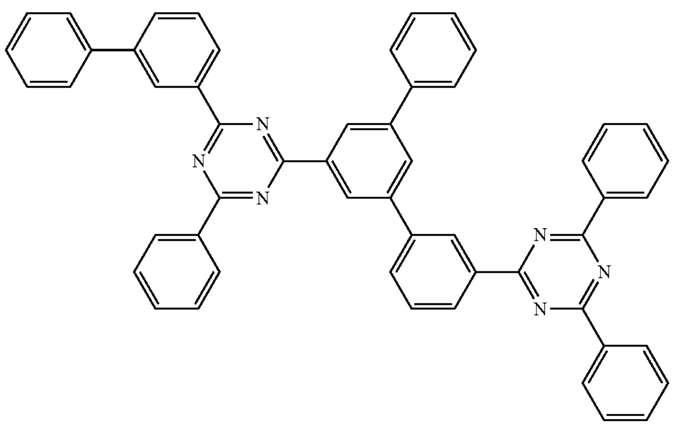
A(74)
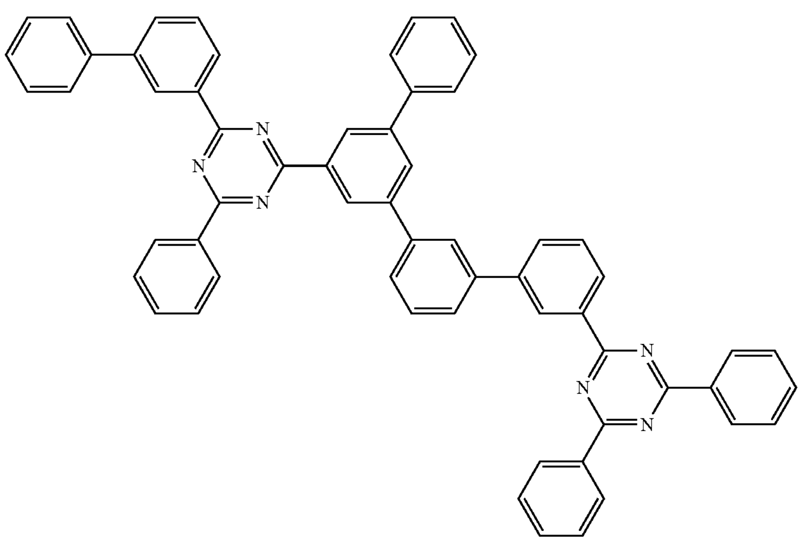

-continued
A(75)
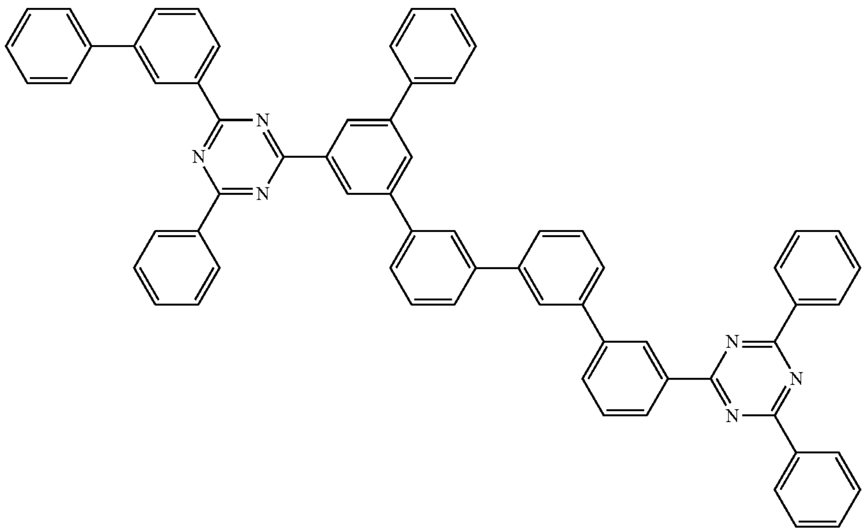
A(76)
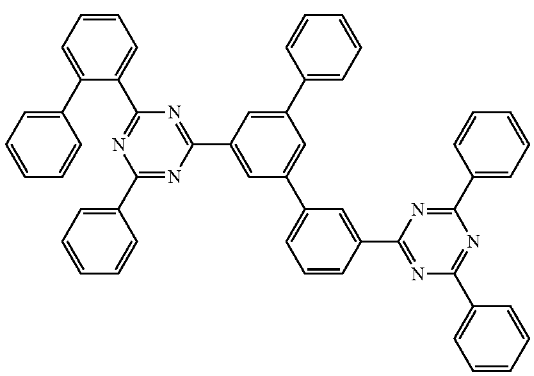
A(77)
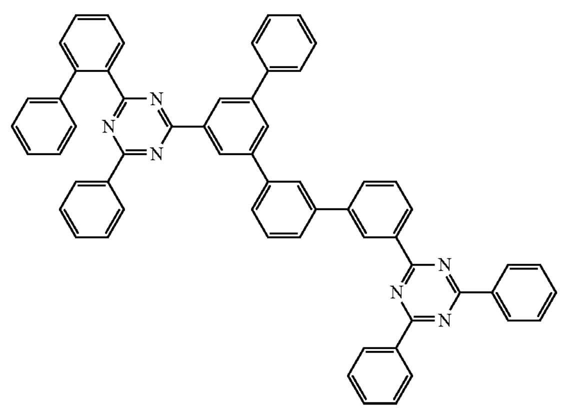
A(78)
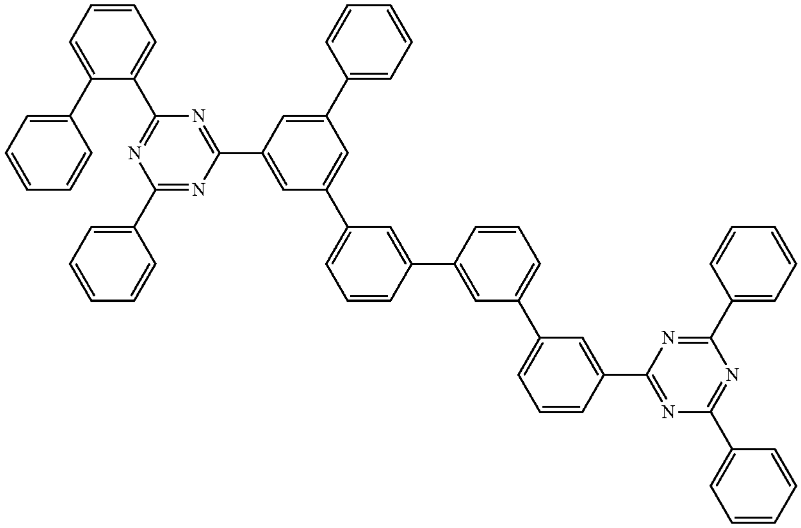

-continued
A(79)
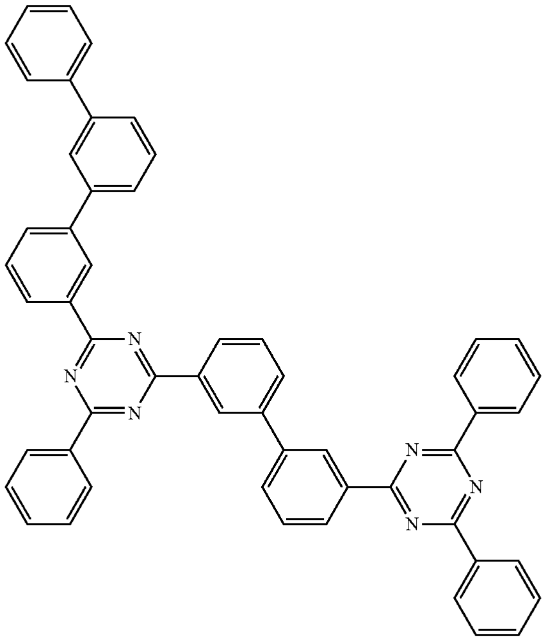
A(80)
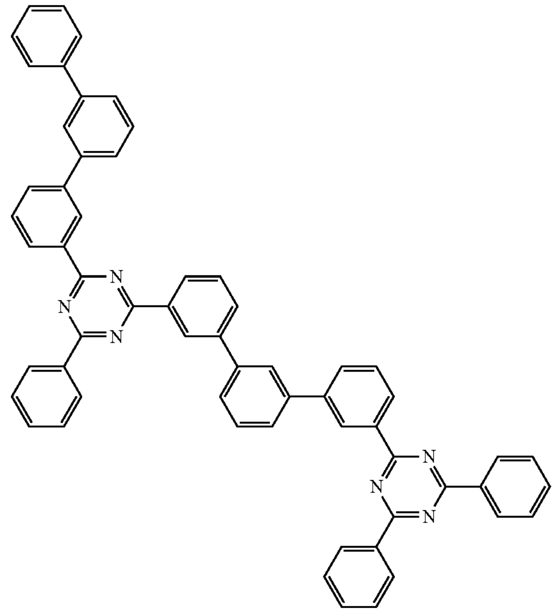
A(81)
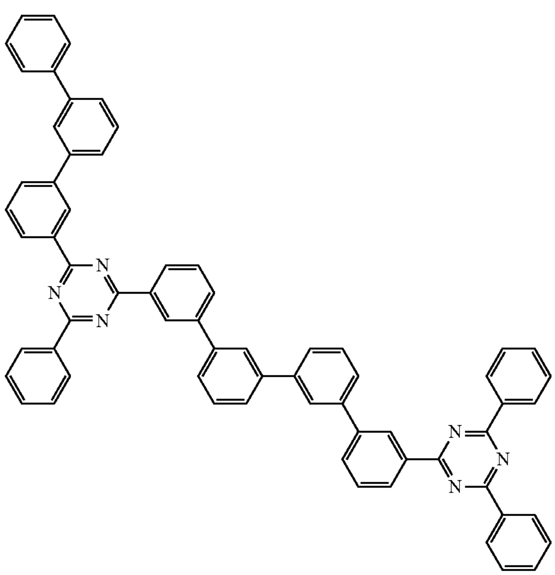
A(82)
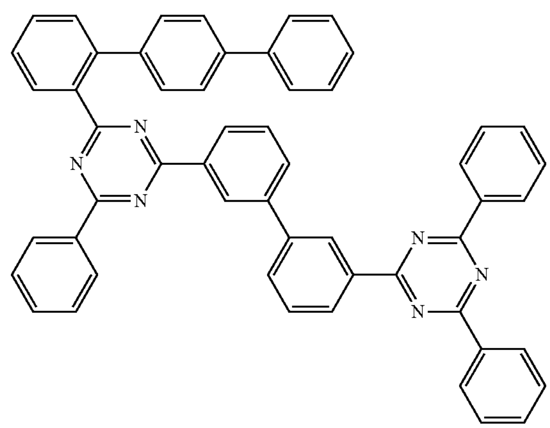

-continued
A(83)
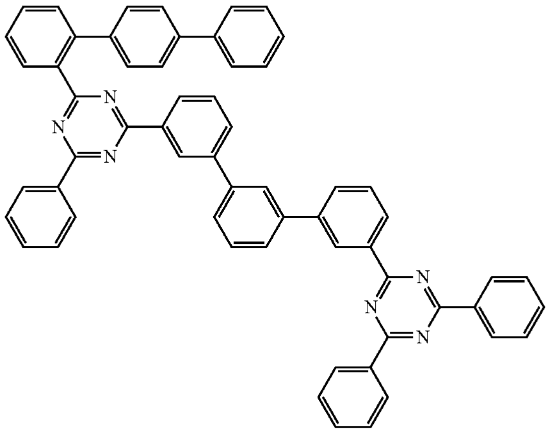
A(84)
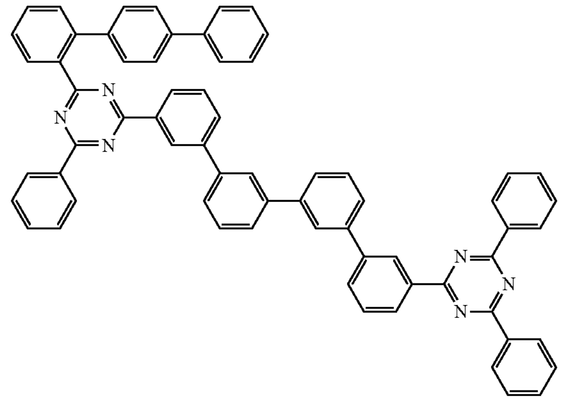
A(85)
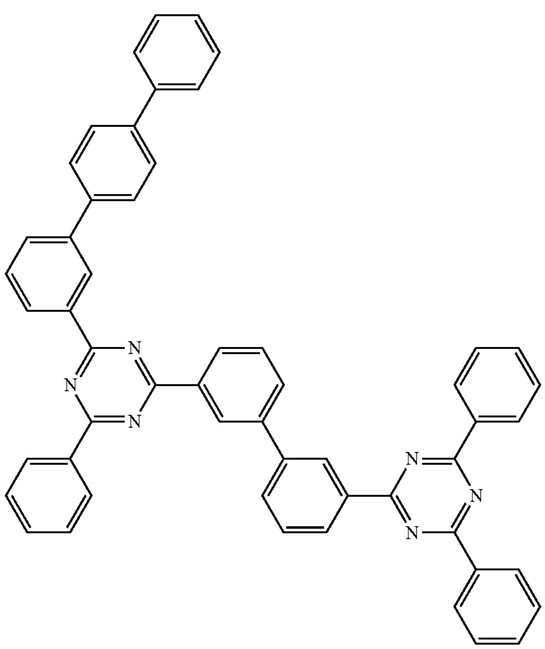
A(86)
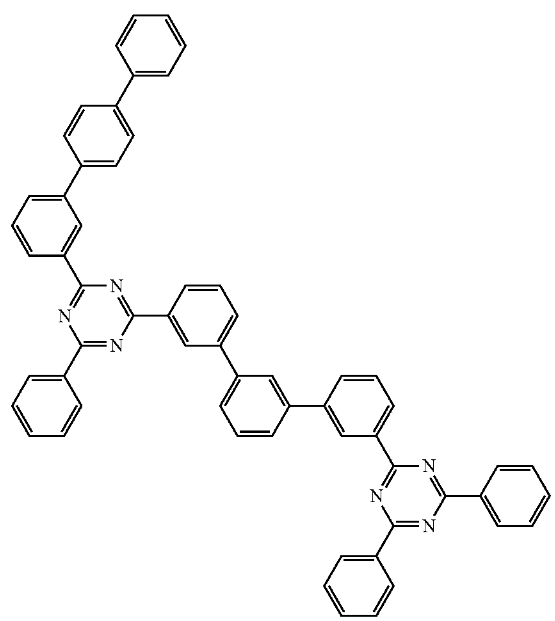

-continued
A(87)
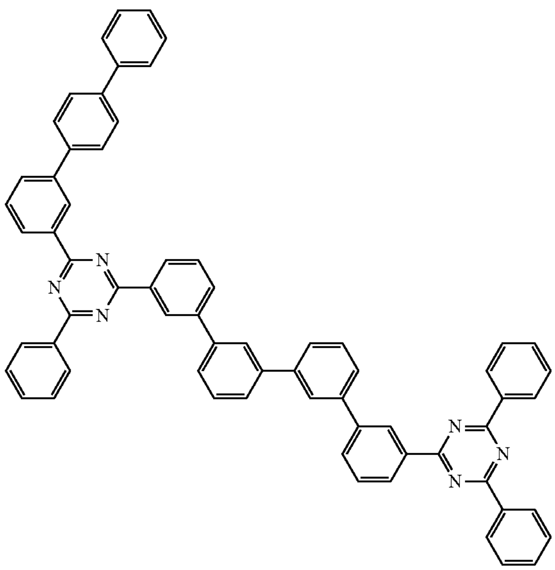
A(88)
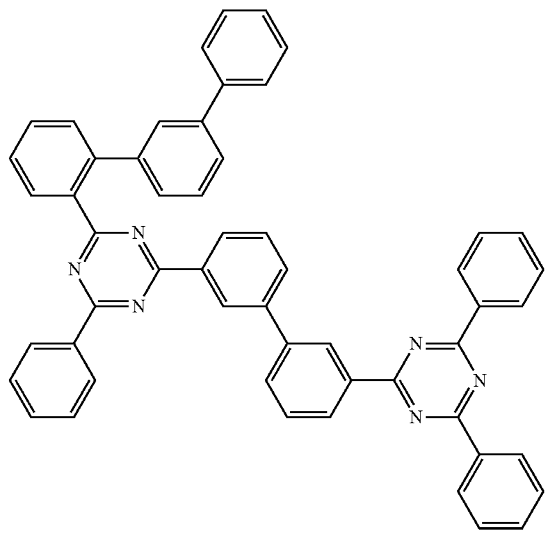
A(89)
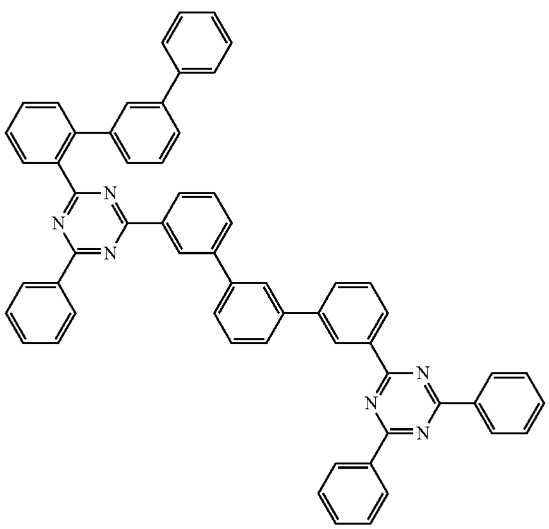
A(90)
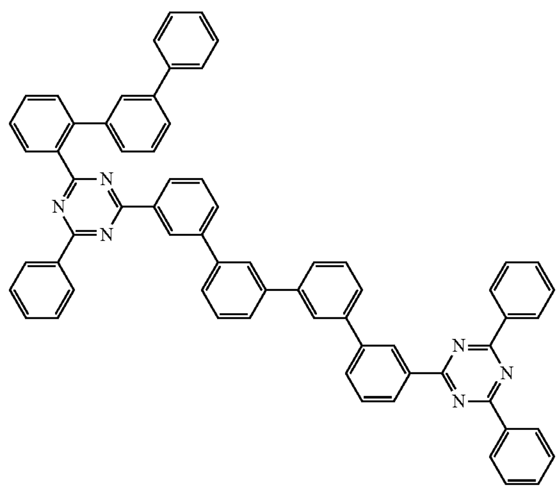
A(91)
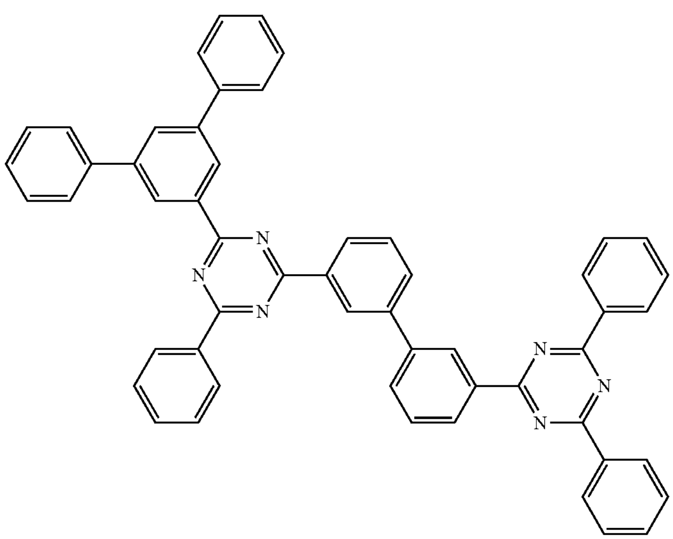

-continued
A(92)
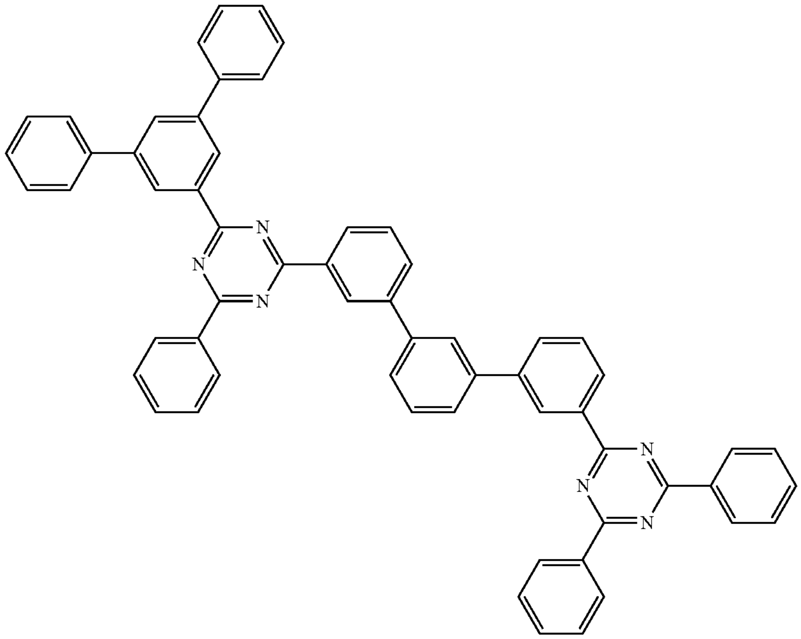
A(93)
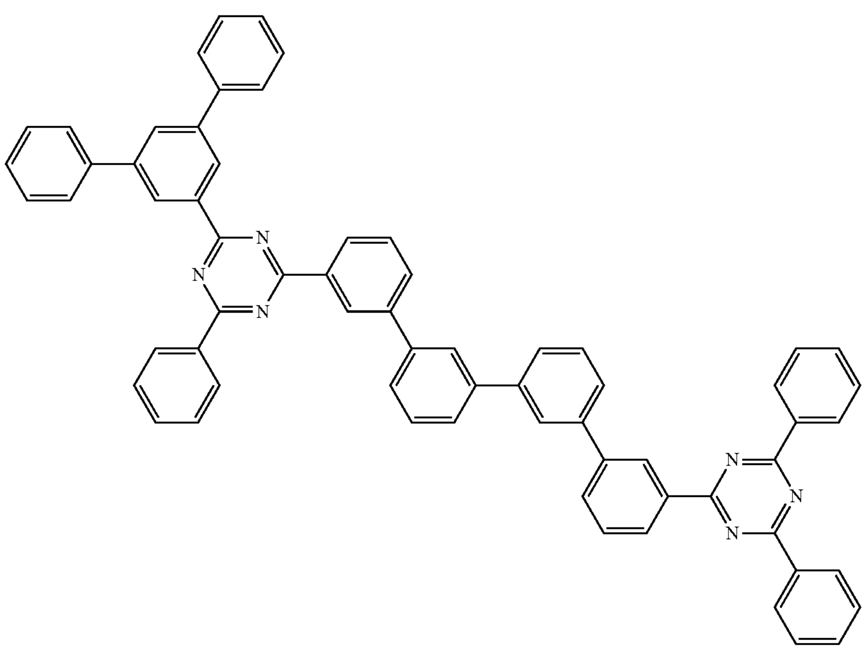

-continued
A(94)
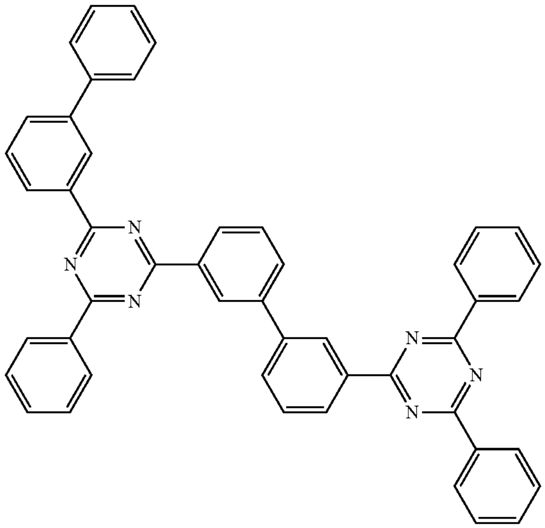
A(95)
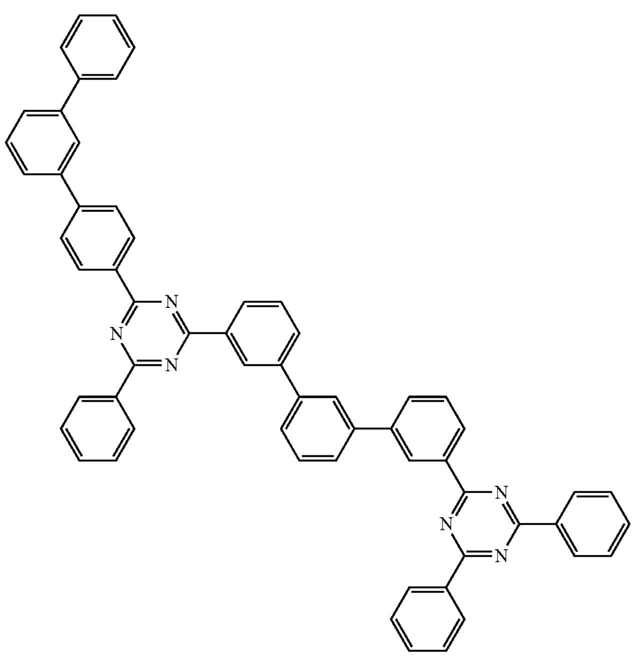

-continued
A(96)
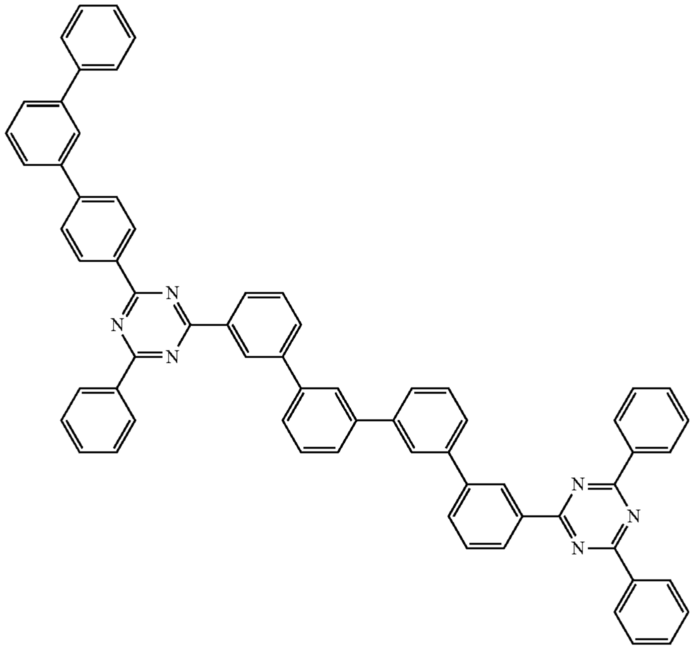
A(97)
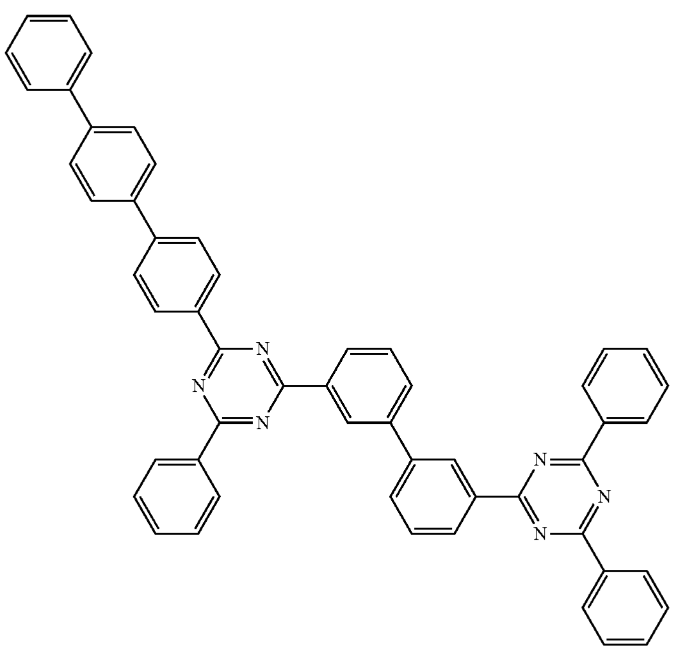

-continued
A(98)
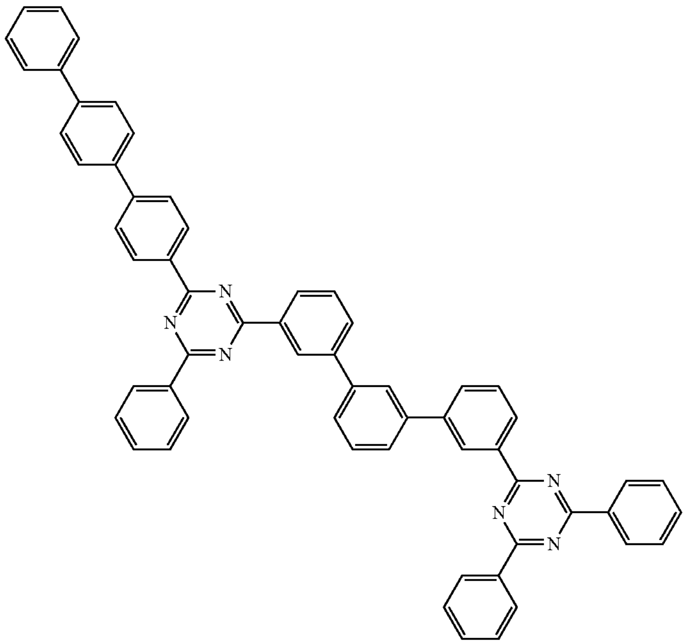
A(99)
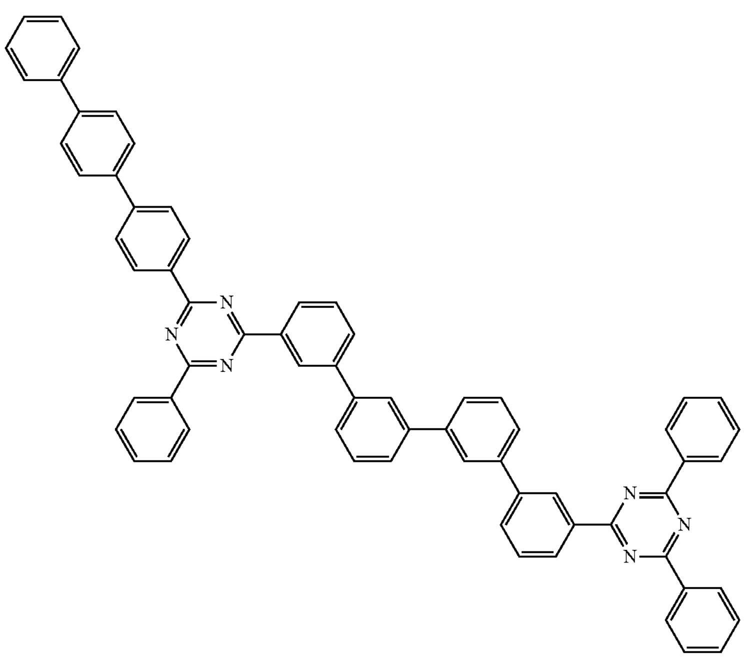

-continued
A(100)
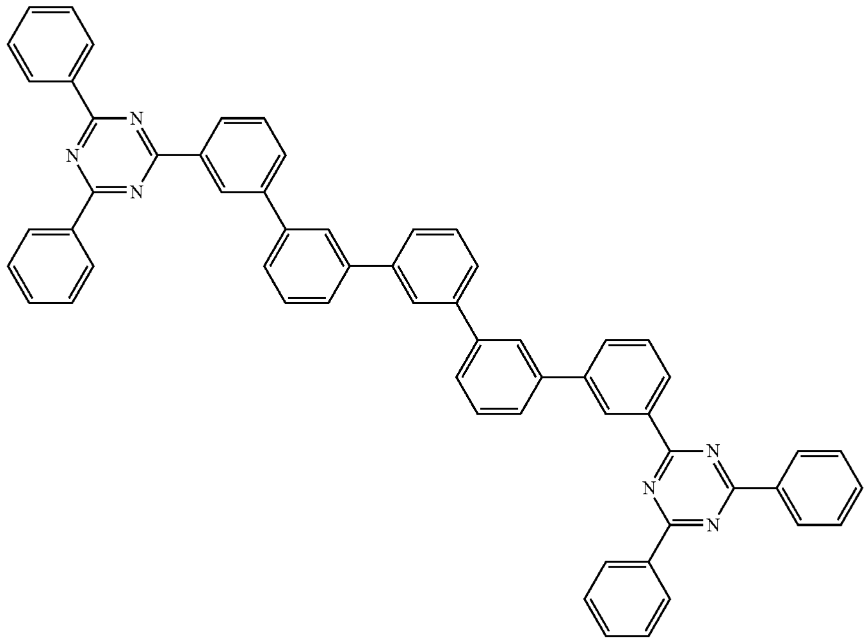
A(101)
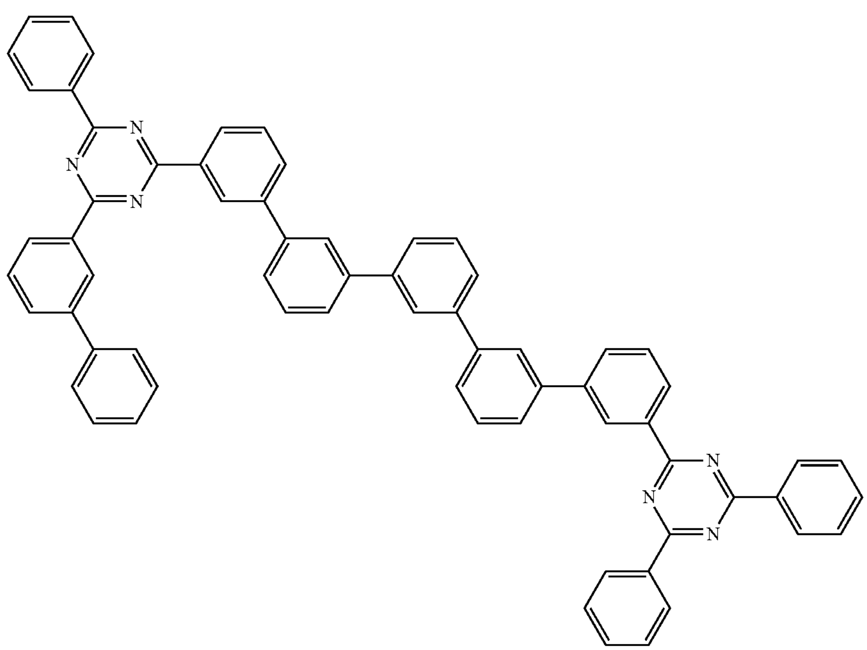

-continued
A(102)
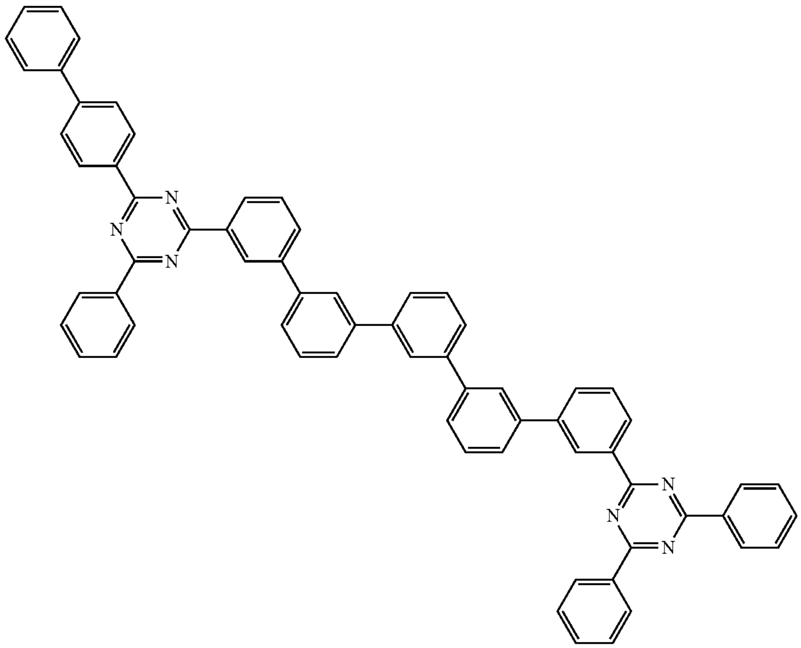
A(103)
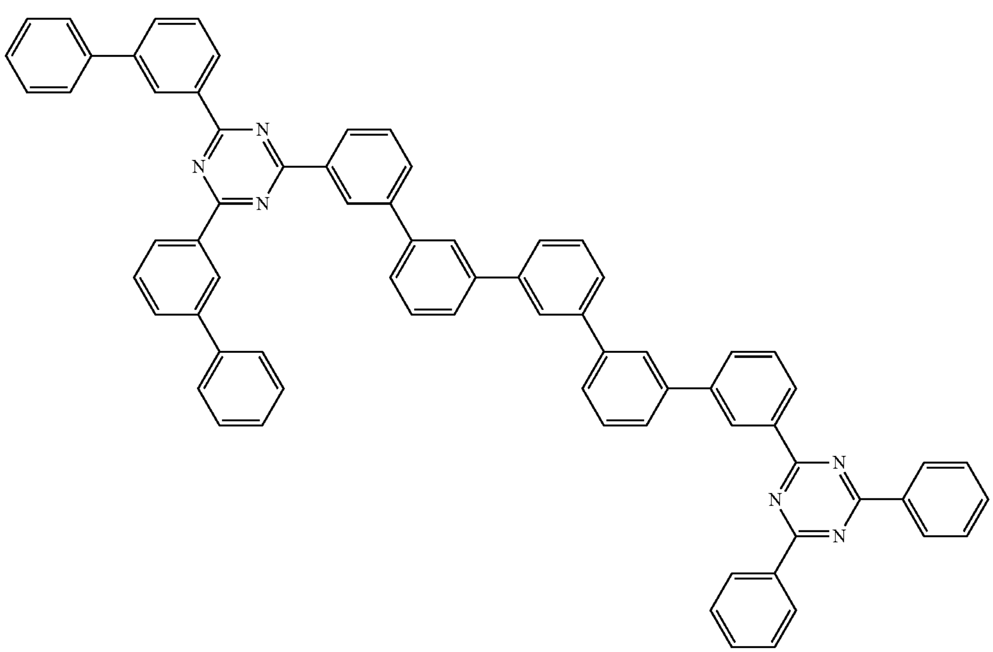

-continued
A(104)
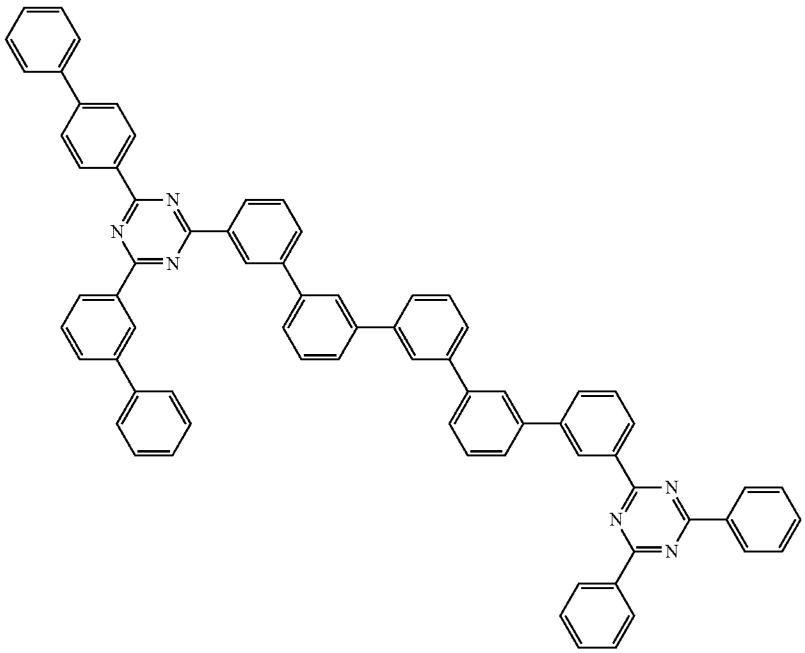
A(105)
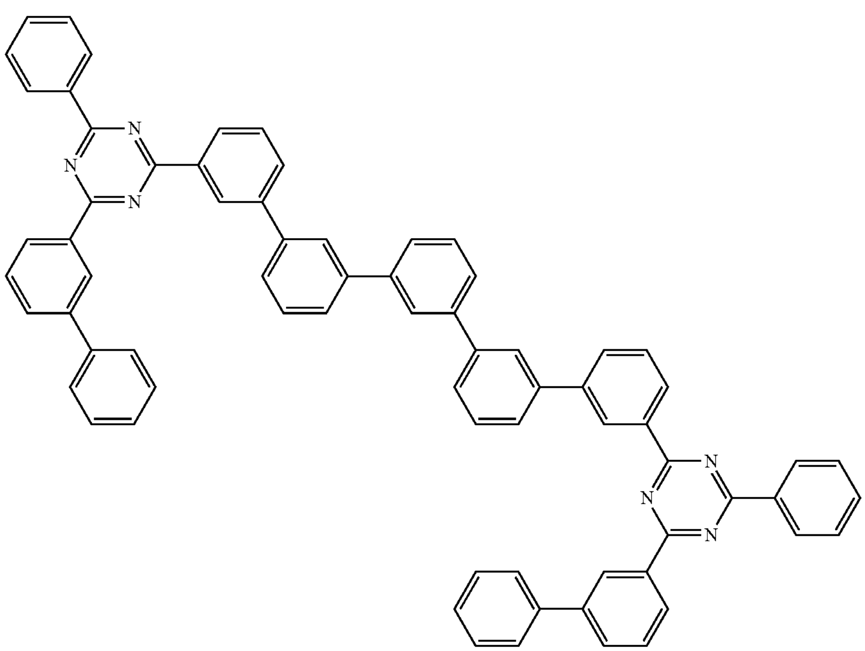

-continued
A(106)
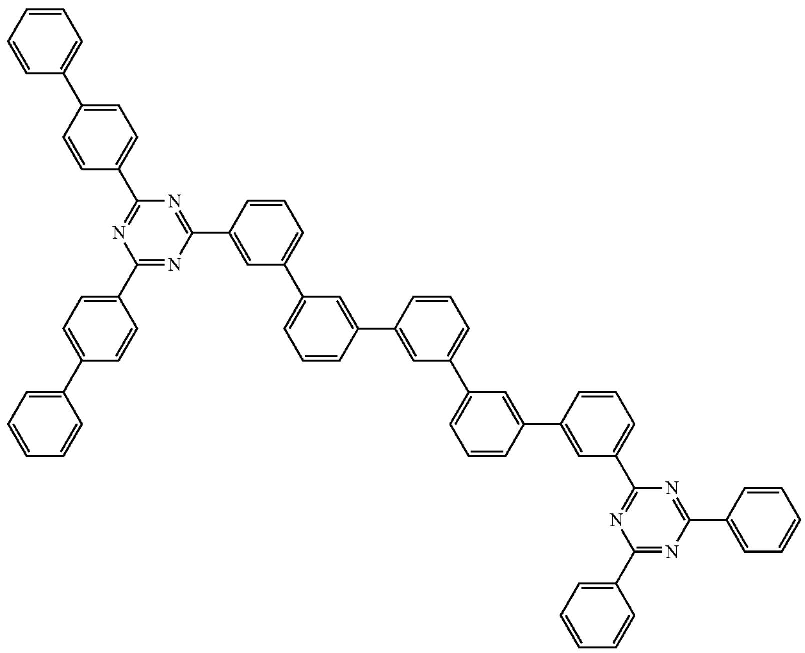
A(107)
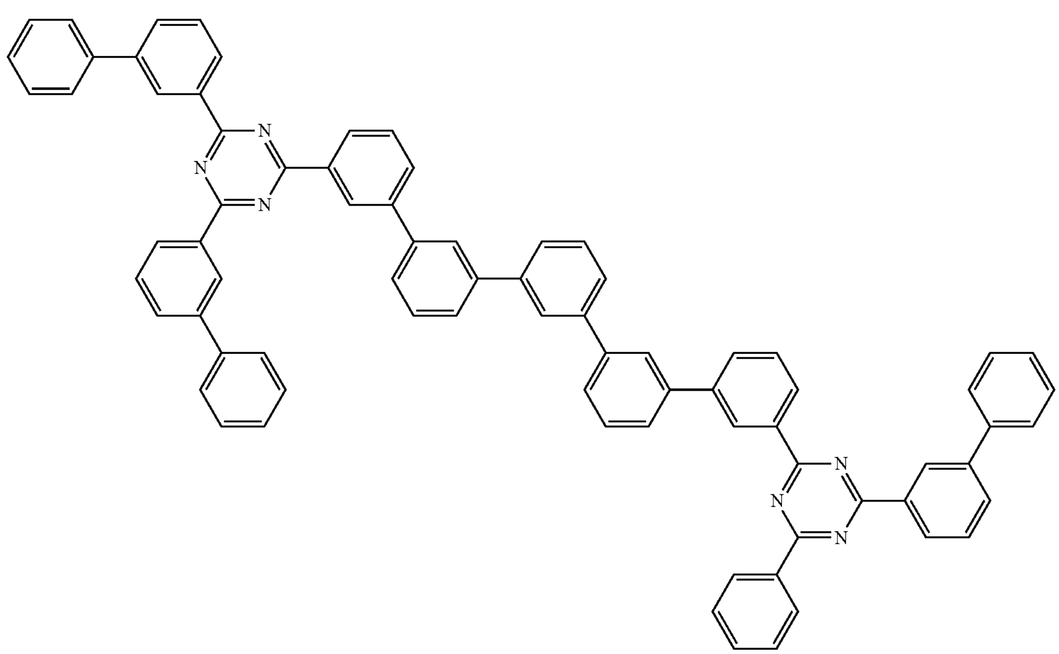

-continued
A(108)
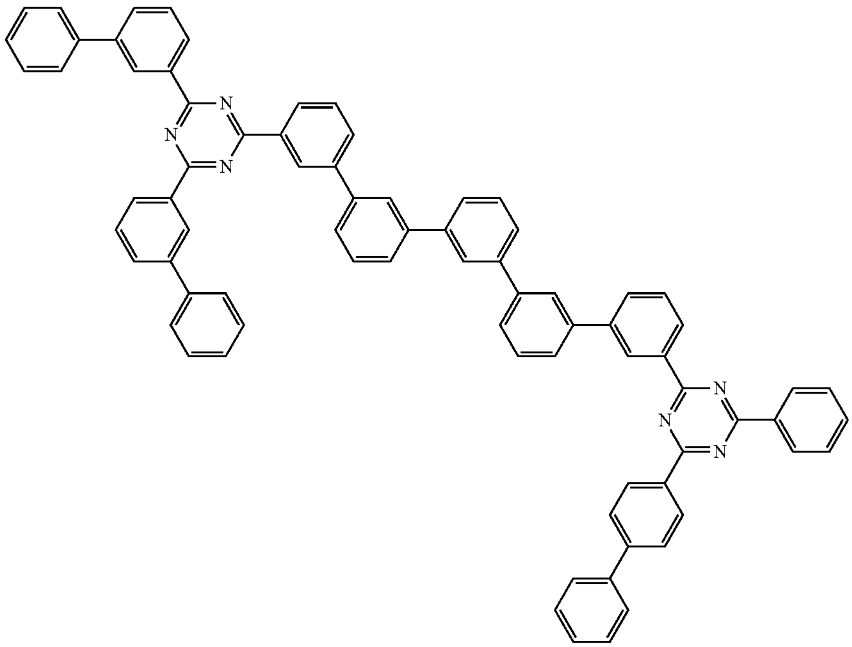
A(109)
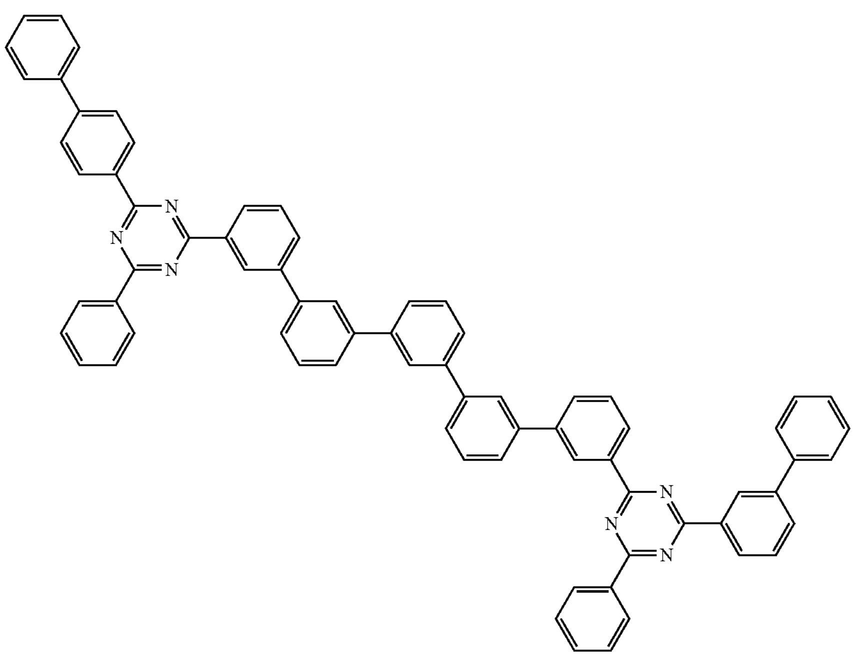

-continued
A(110)
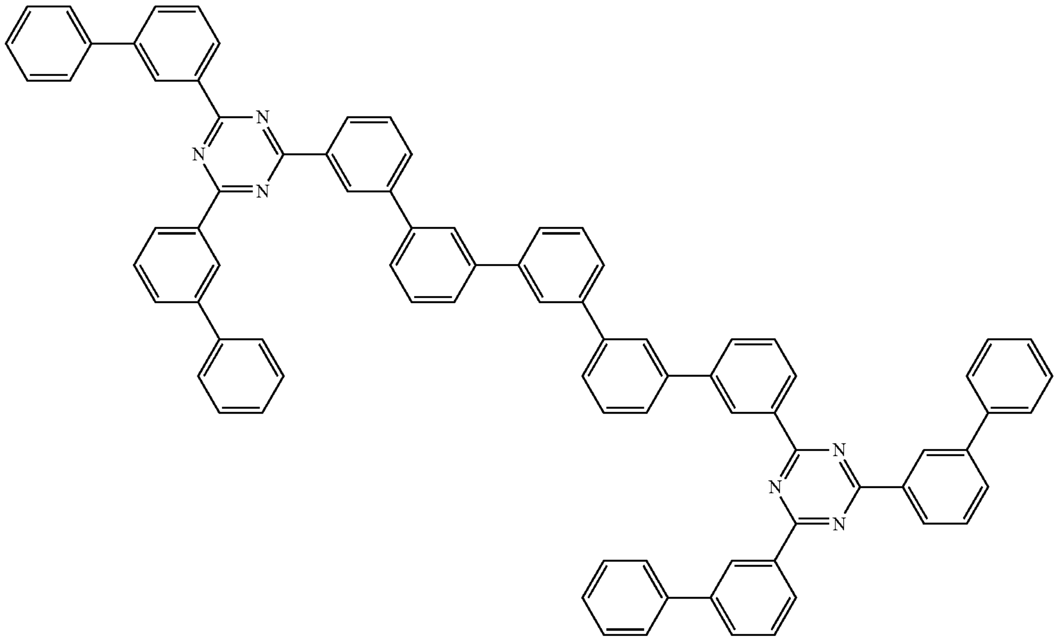
A(111)
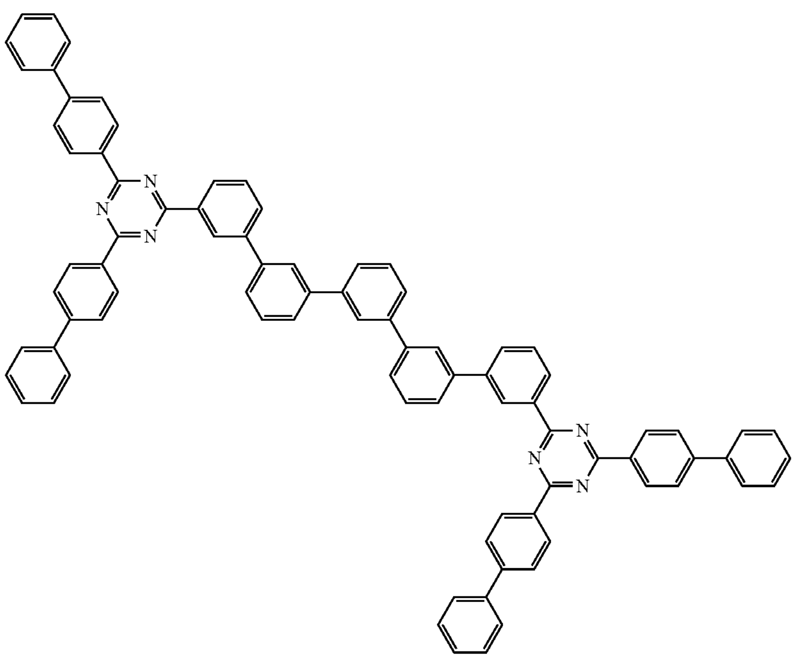

-continued
A(112)
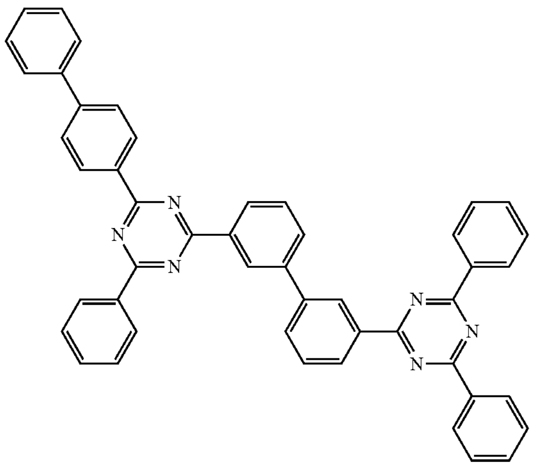
A(113)
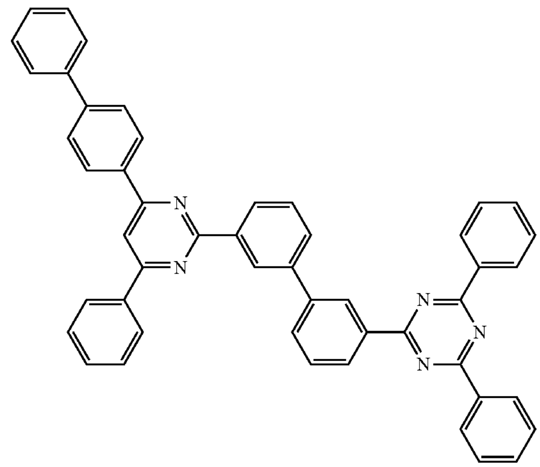
A(114)
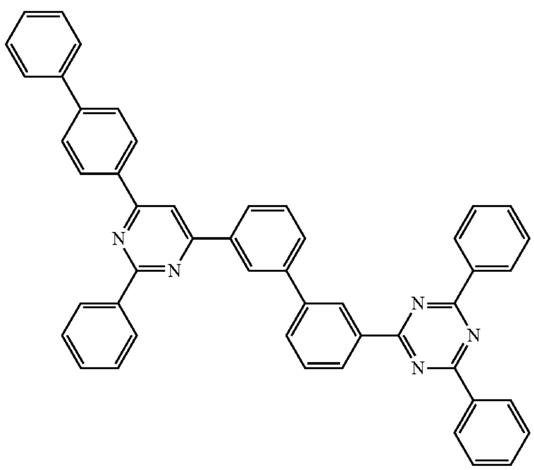
A(115)
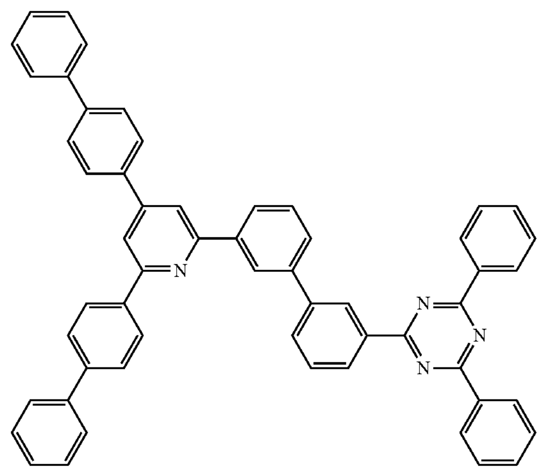
A(116)
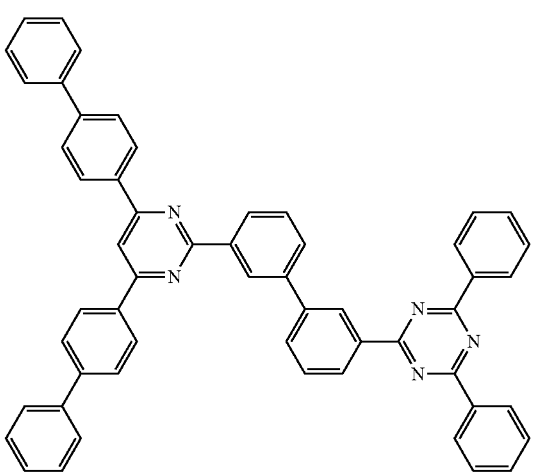
A(117)
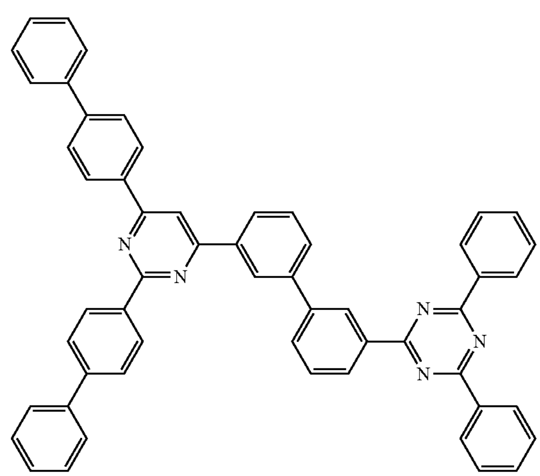

-continued
A(118)
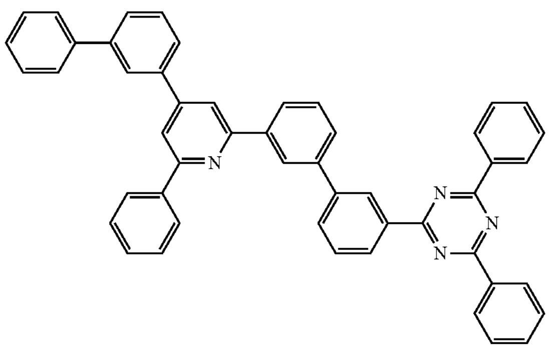
A(119)
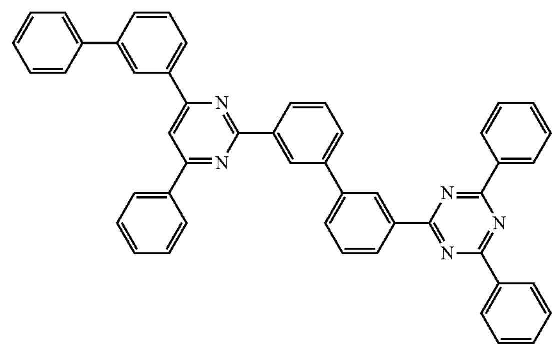
A(120)
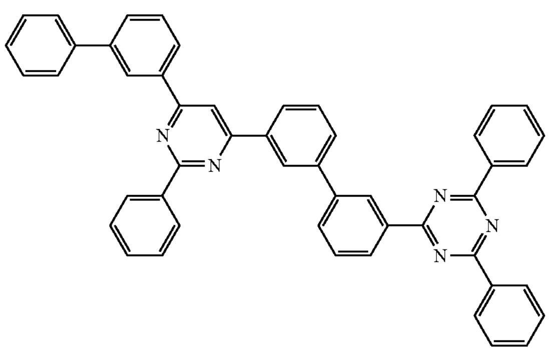
A(121)
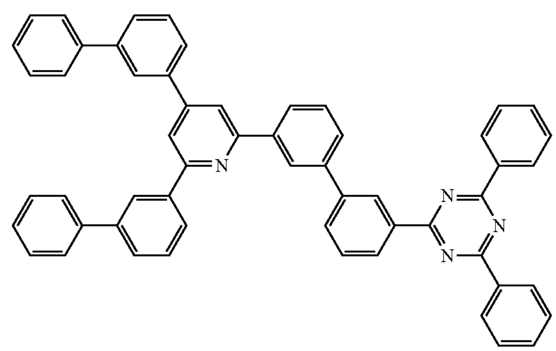
A(122)
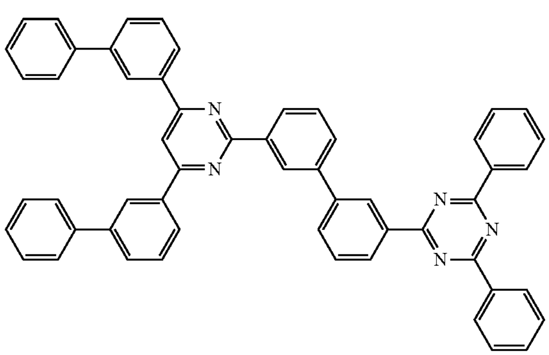
A(123)
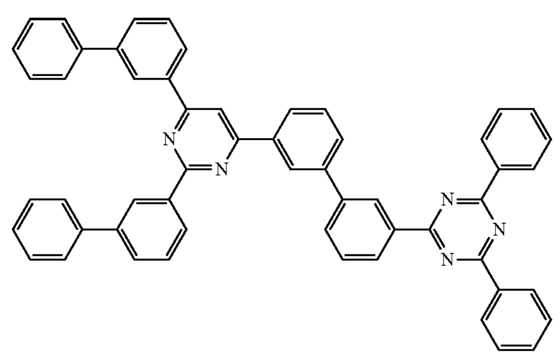
A(124)
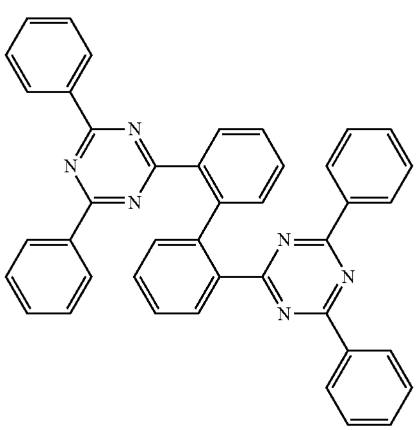
A(125)
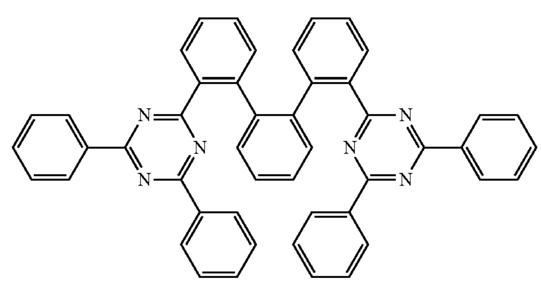

-continued
A(126)
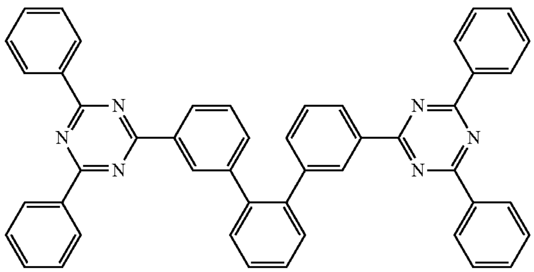
A(127)
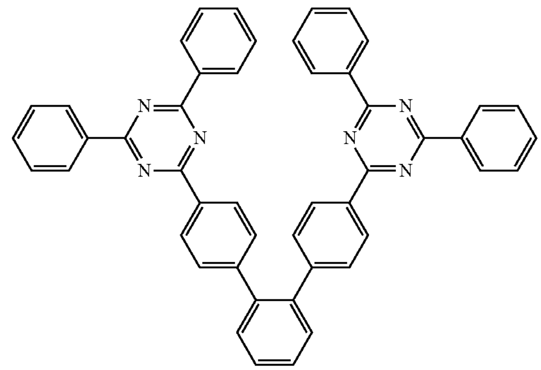
A(128)
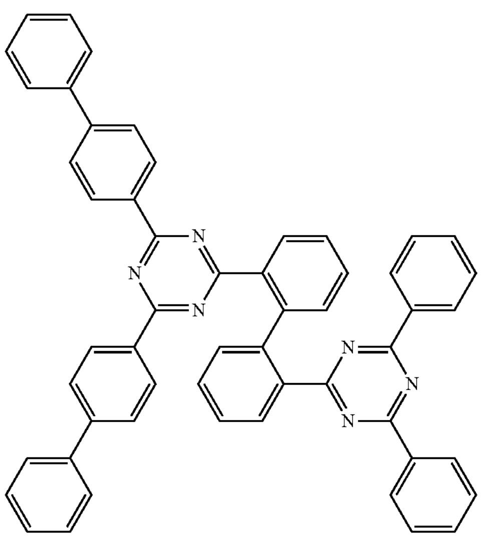
A(129)
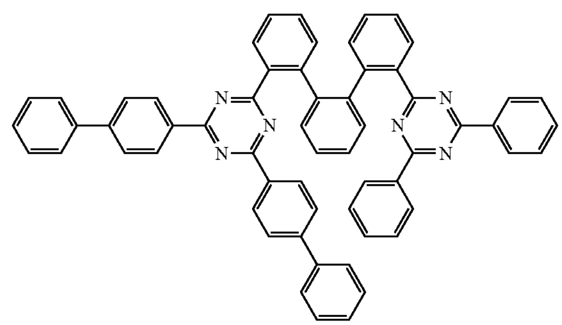
A(130)
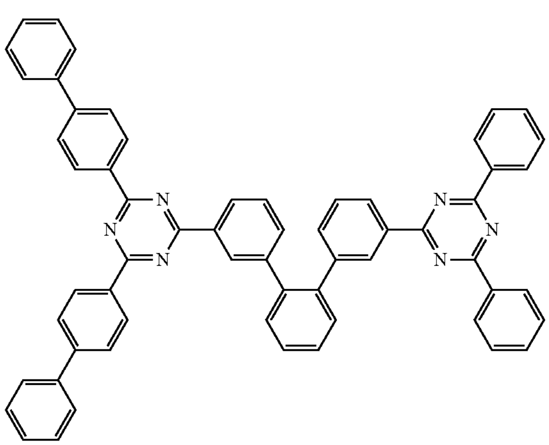
A(131)
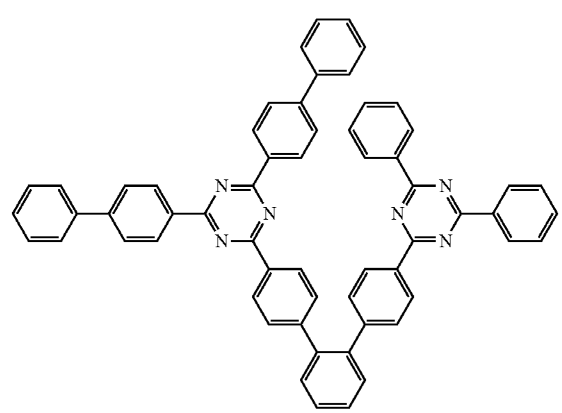

-continued
A(132)
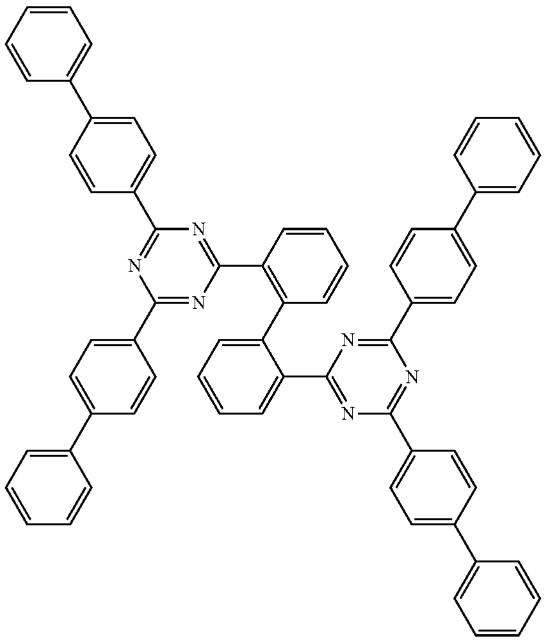
A(133)
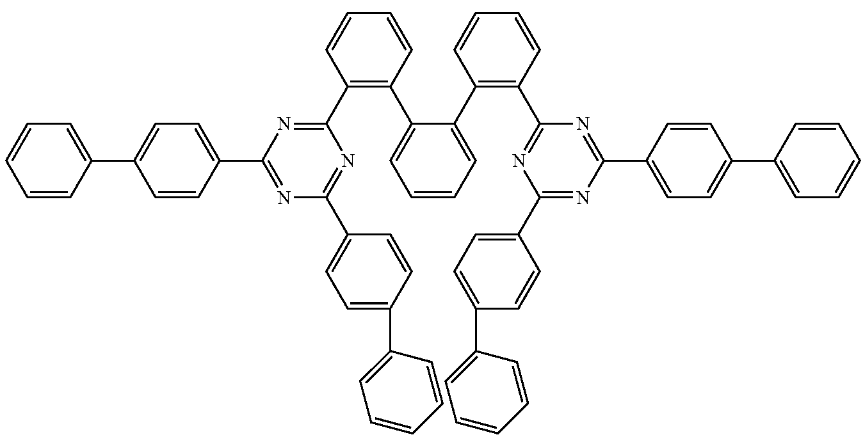
A(134)
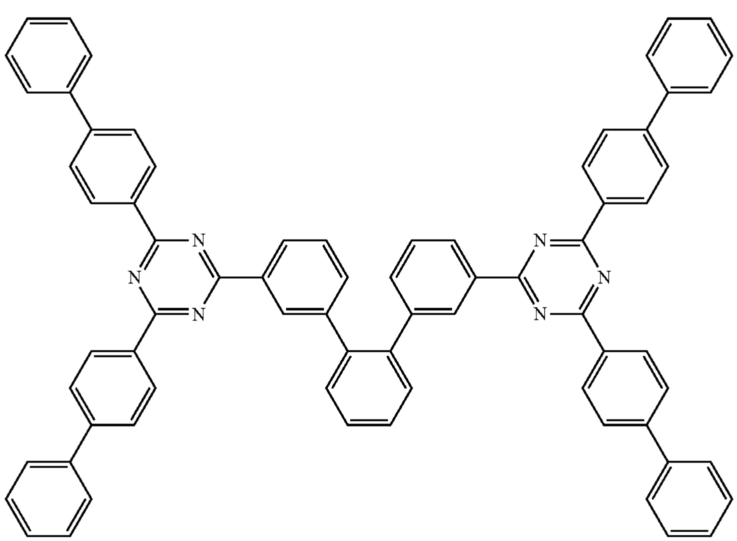

-continued
A(135)
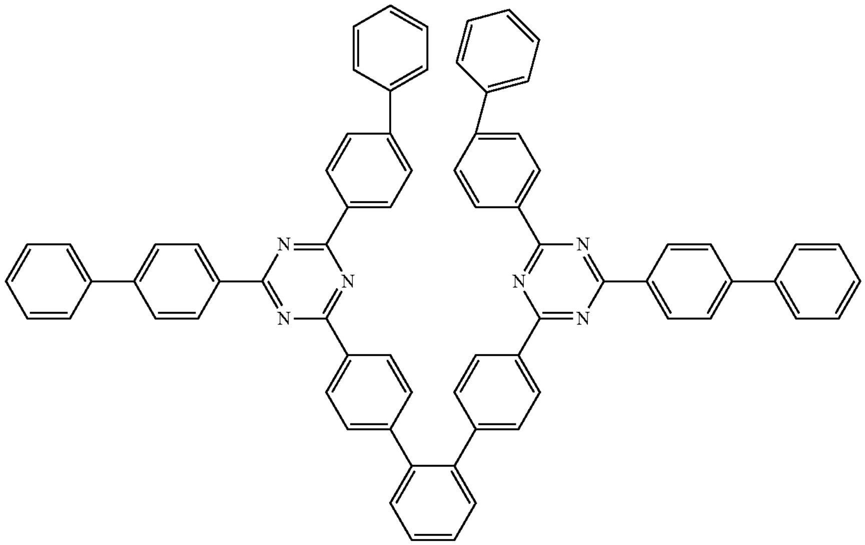
A(136)
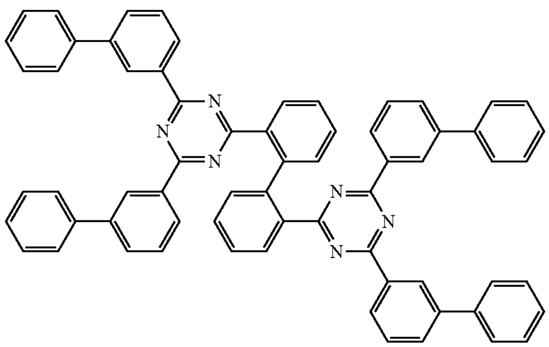
A(137)
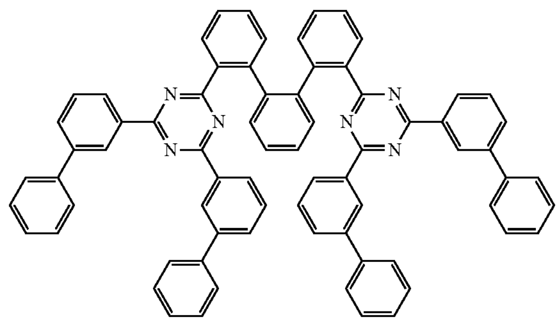
A(138)
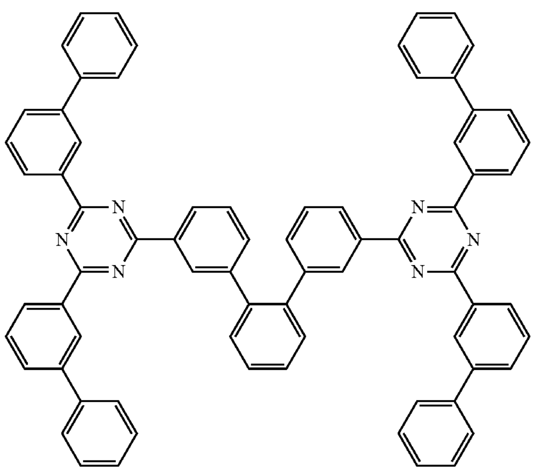
A(139)
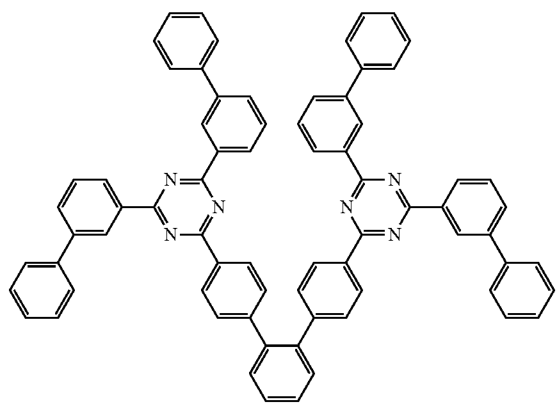

-continued
A(140)
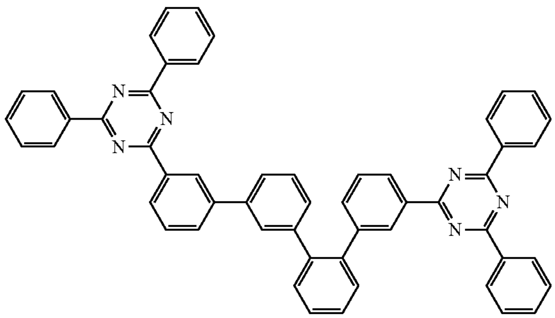
A(141)
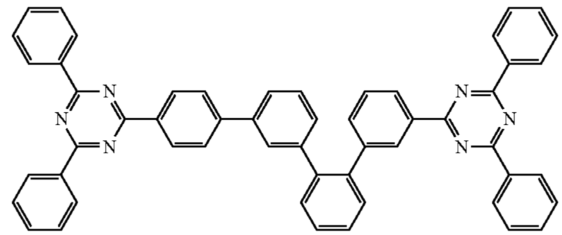
A(142)
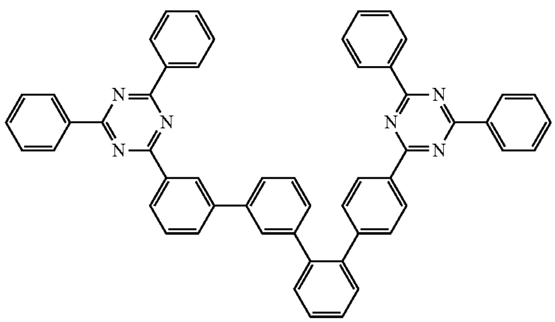
A(143)
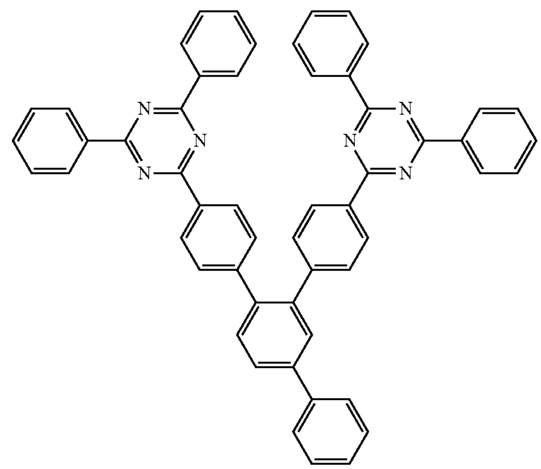
A(144)
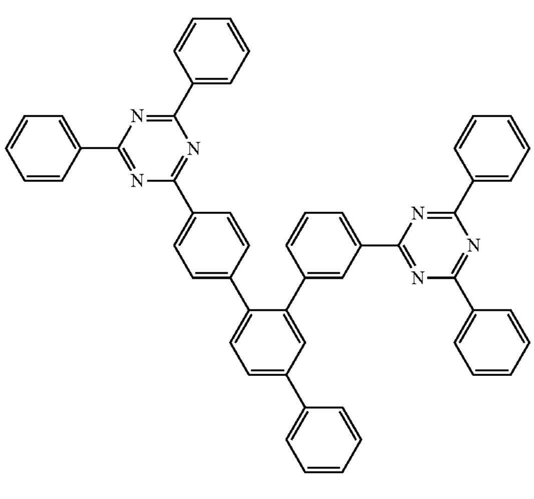
A(145)
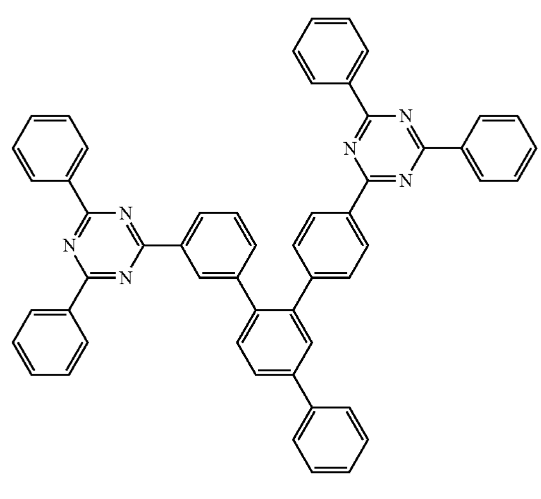

-continued
A(146)
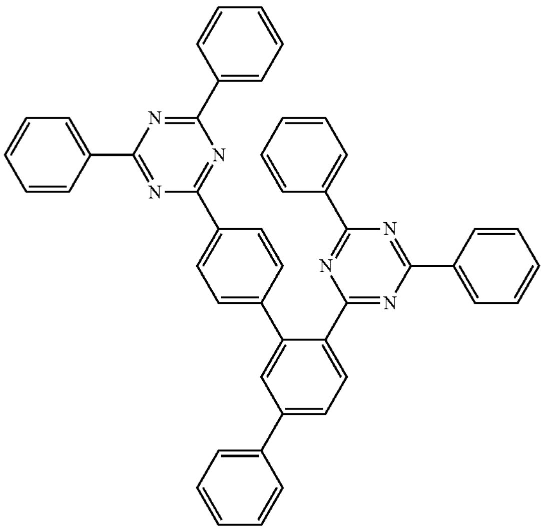
A(147)
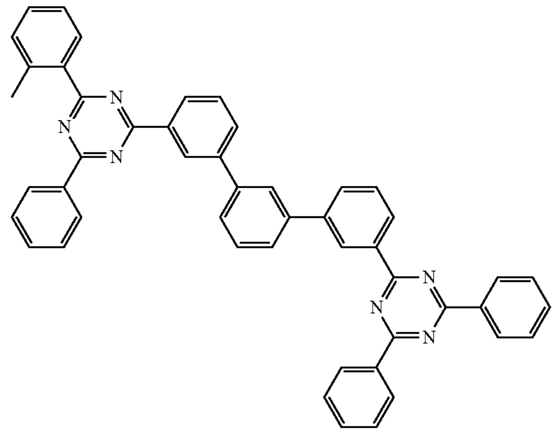
A(148)
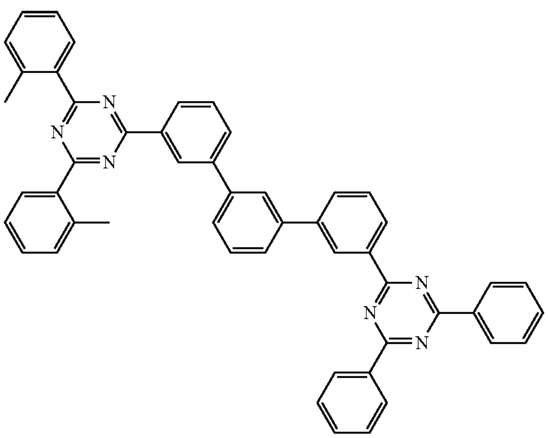
A(149)
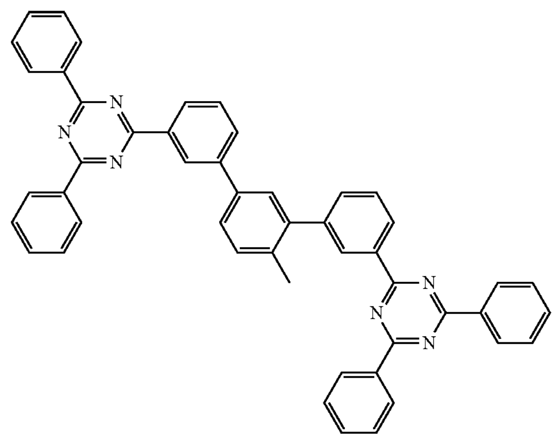
A(150)
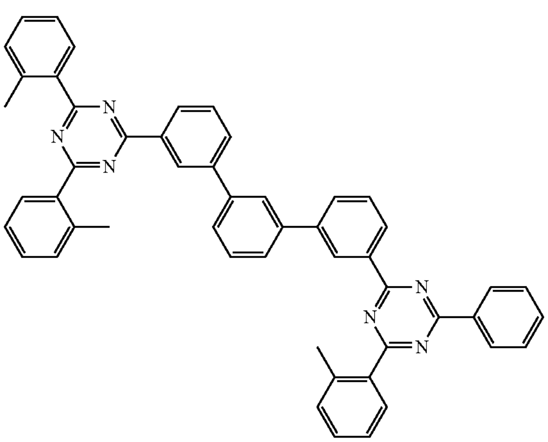
A(151)
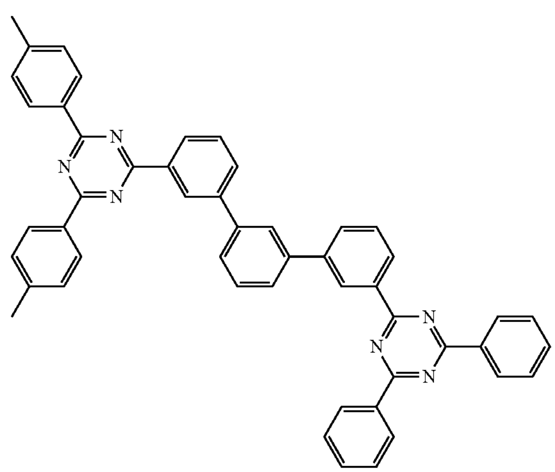

-continued
A(152)
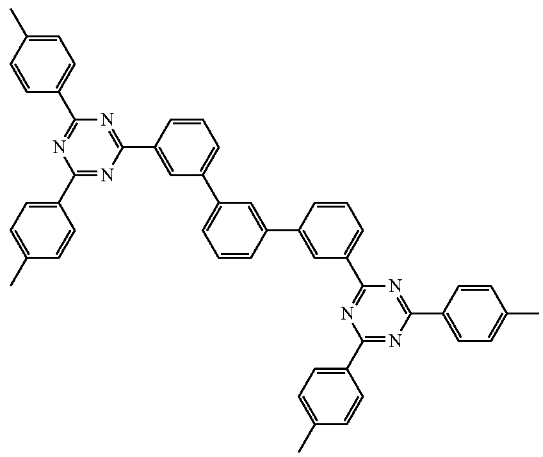
A(153)
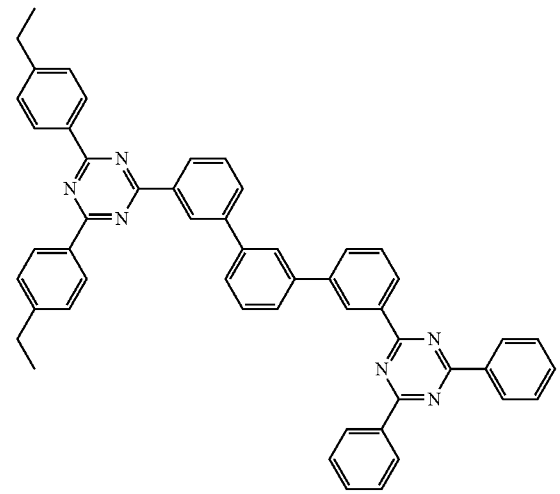
A(154)
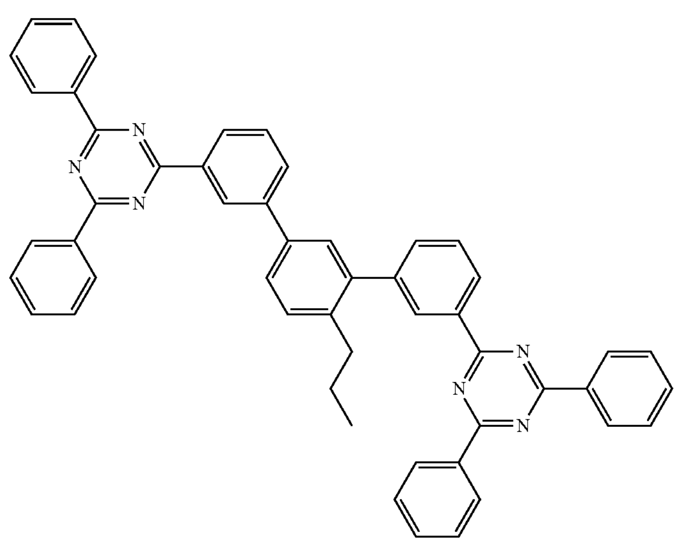

In an embodiment, the hole transport host may be selected from Compounds H—H1 to H—H103, but embodiments of the present disclosure are not limited thereto:
H-H1
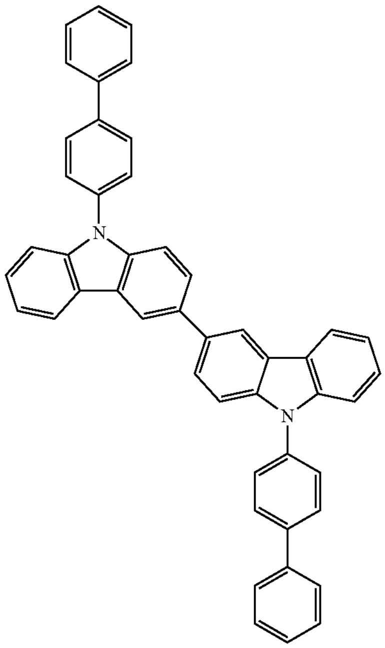
H-H2
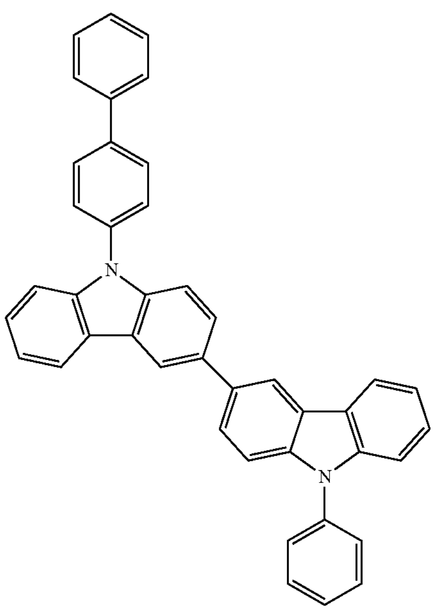
-continued
H-H3
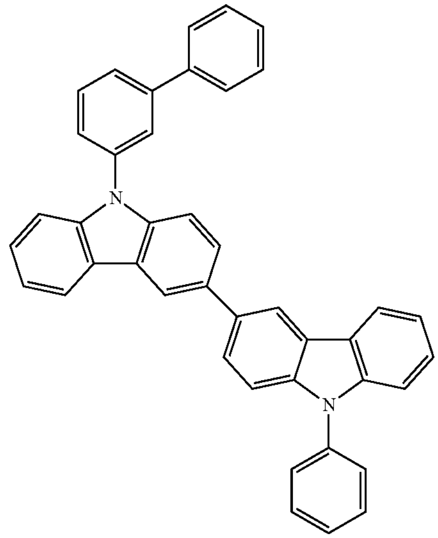
H-H4
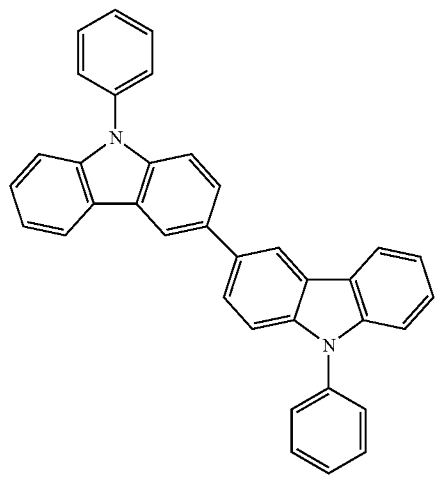
H-H5
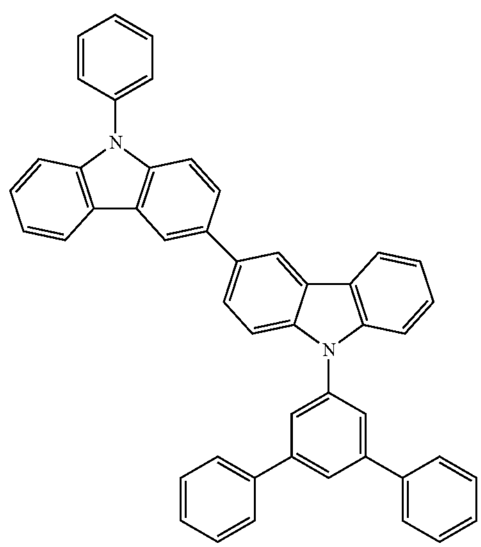

-continued
H-H6
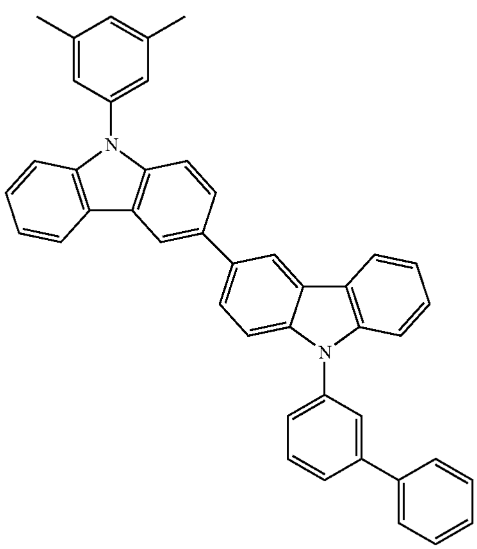
H-H7
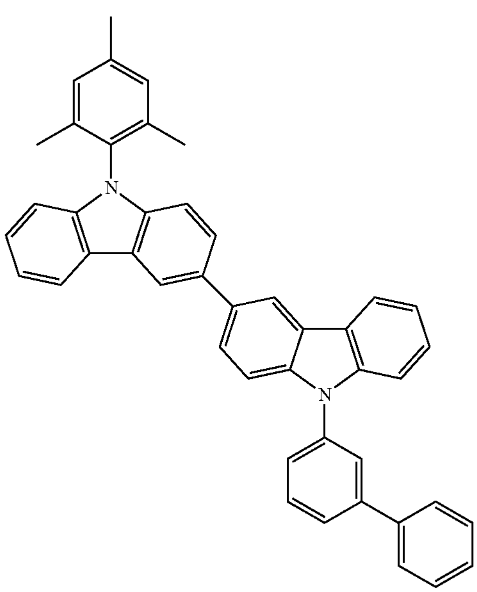
-continued
H-H8
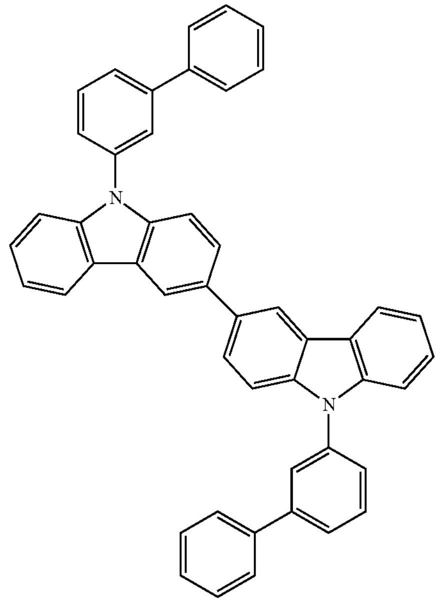
H-H9
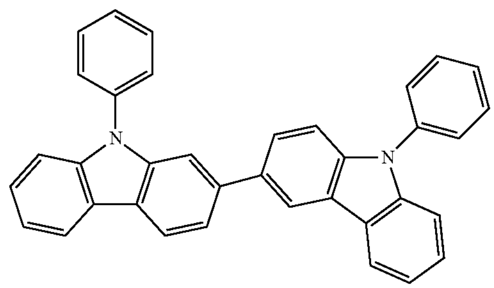
H-H10
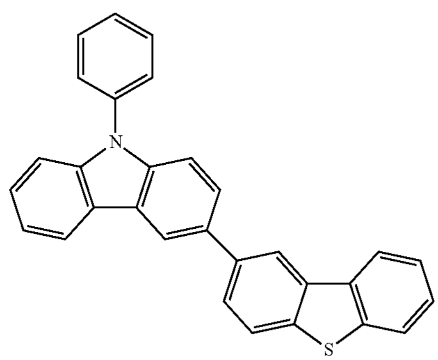
H-H11
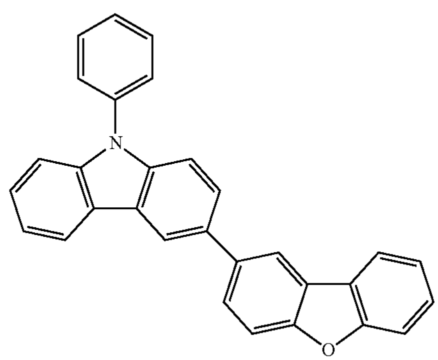

-continued
H-H12
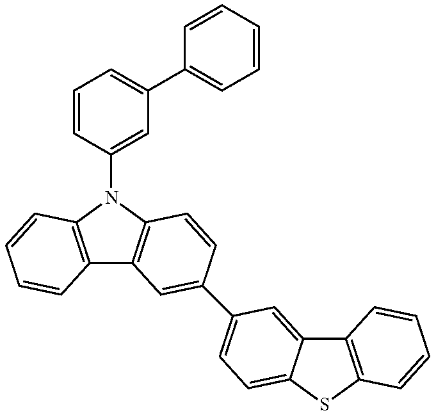
H-H13
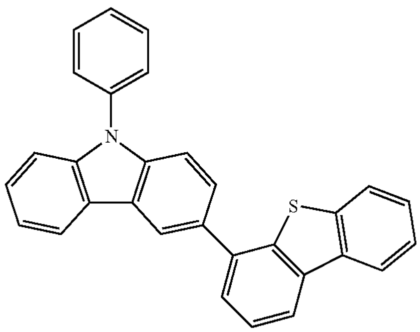
H-H14
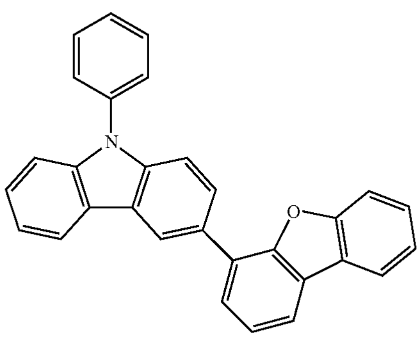
H-H15
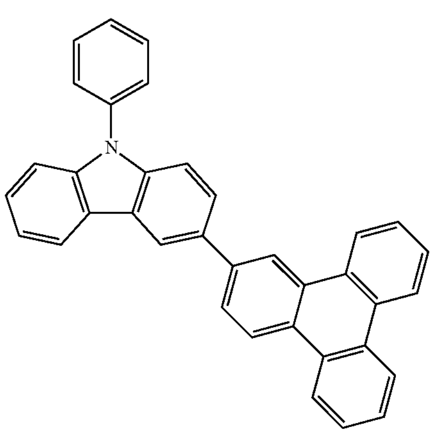
-continued
H-H16
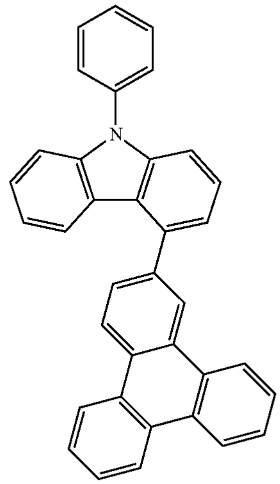
H-H17
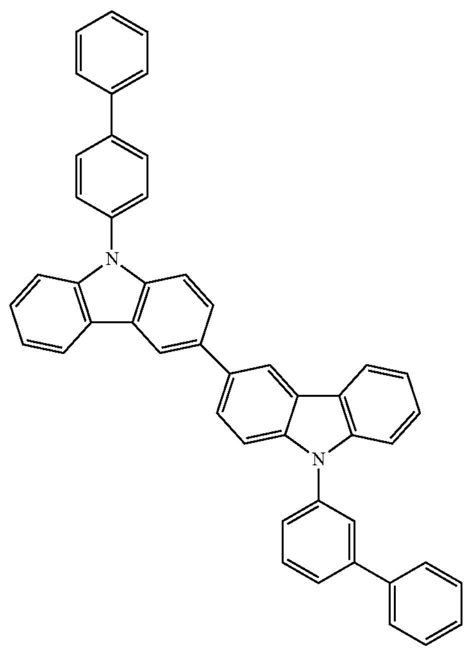
H-H18
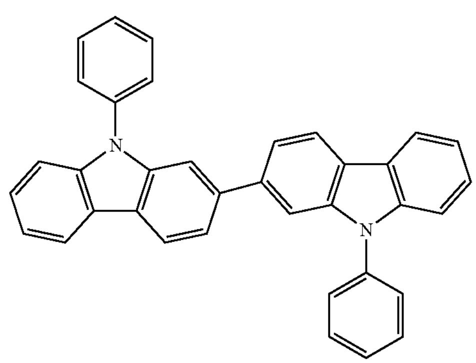

-continued
H-H19
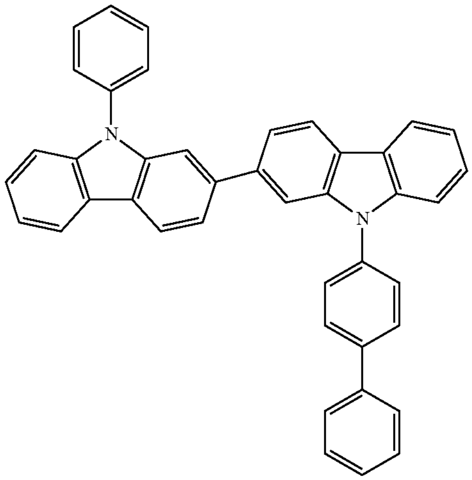
H-H20
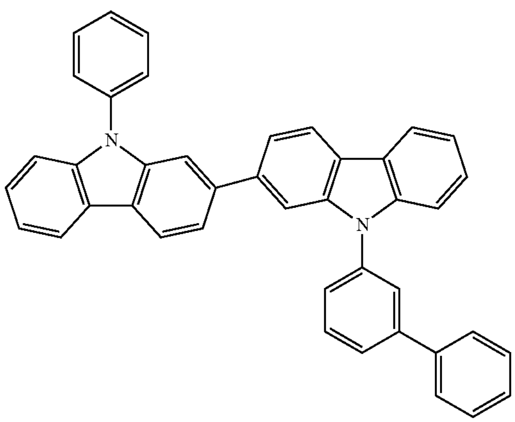
H-H21
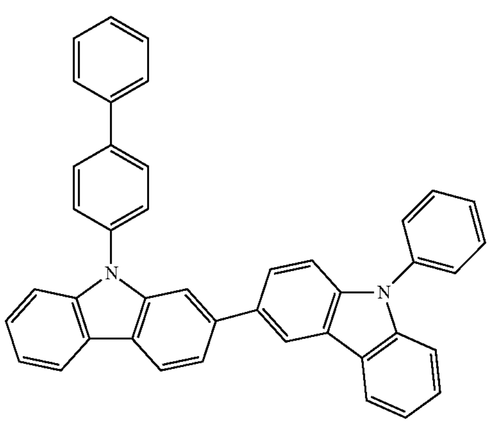
-continued
H-H22
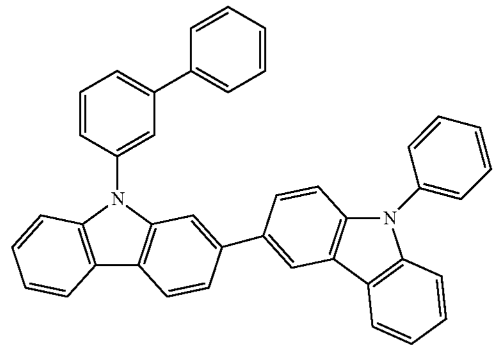
H-H23
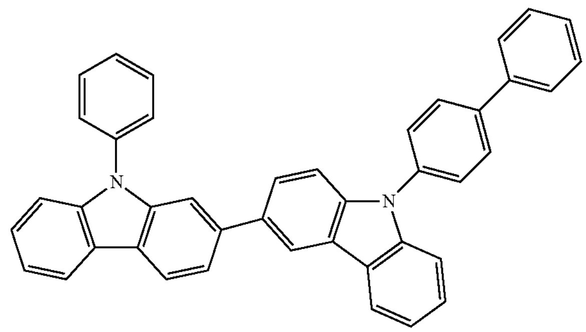
H-H24
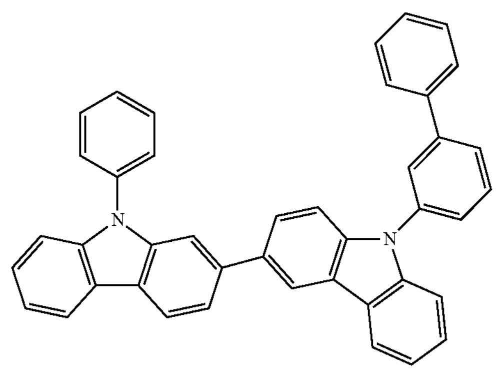
H-H25
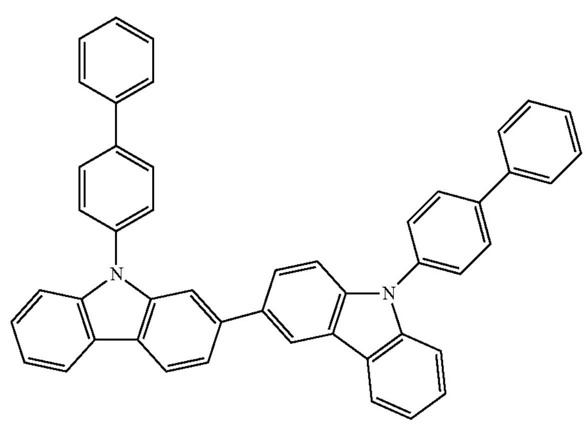

-continued
H-H26
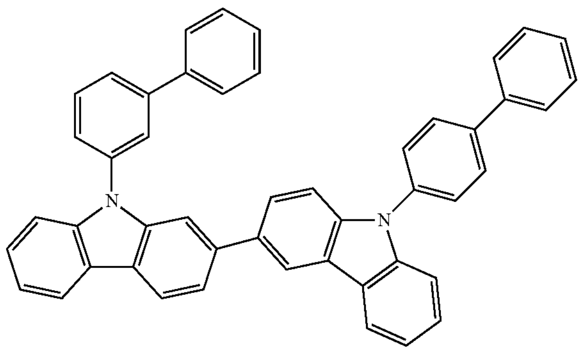
H-H27
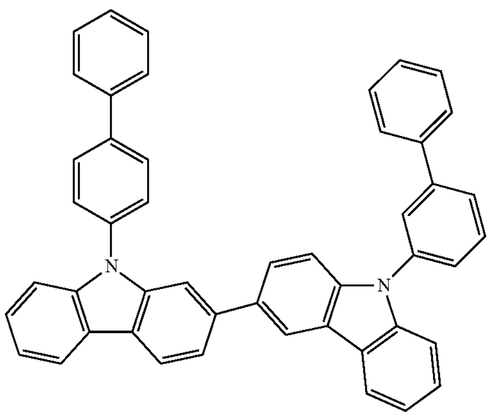
H-H28
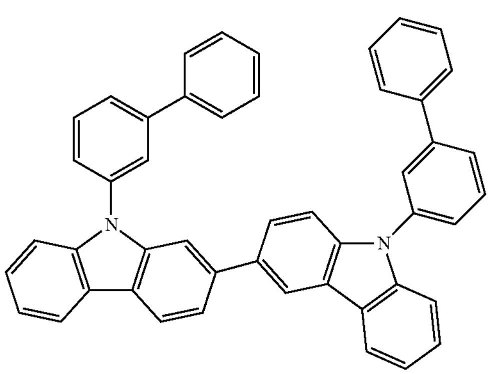
-continued
H-H29
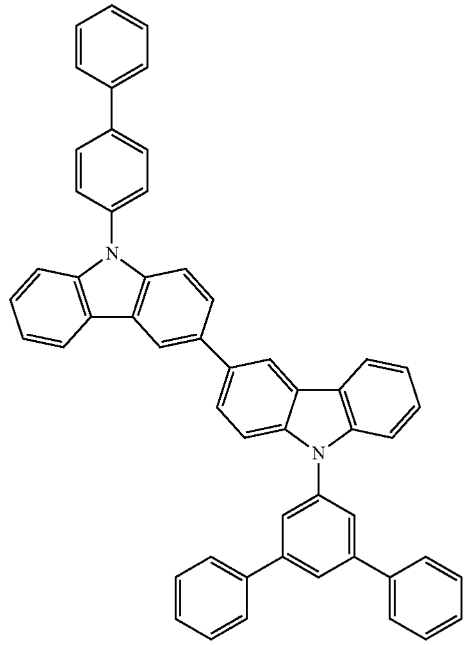
H-H30
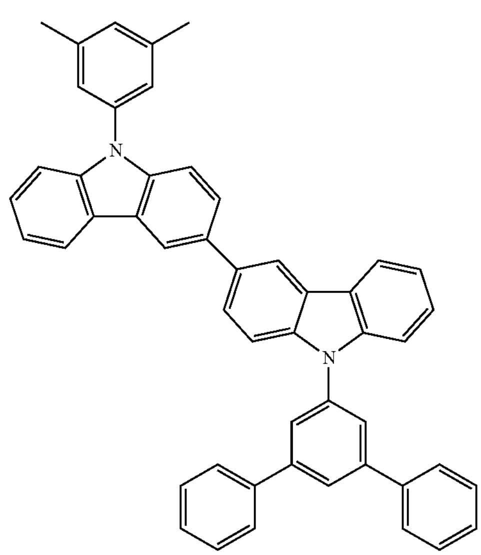

-continued
H-H31
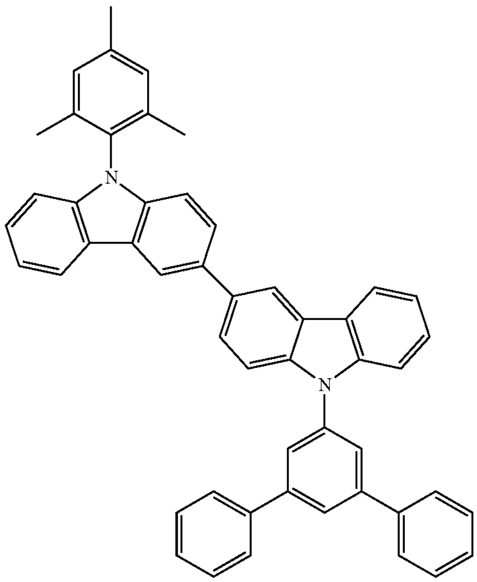
H-H32
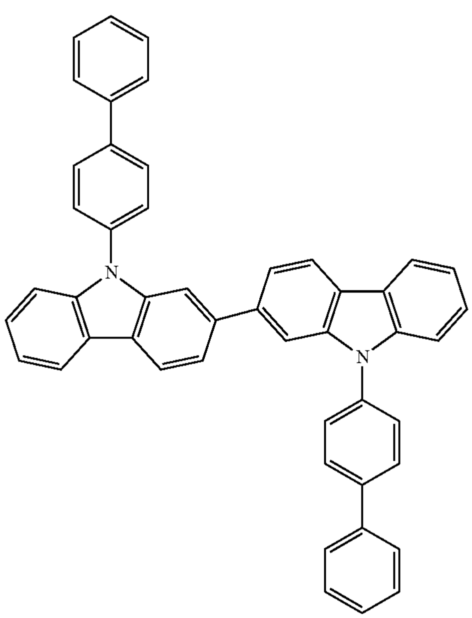
-continued
H-H33
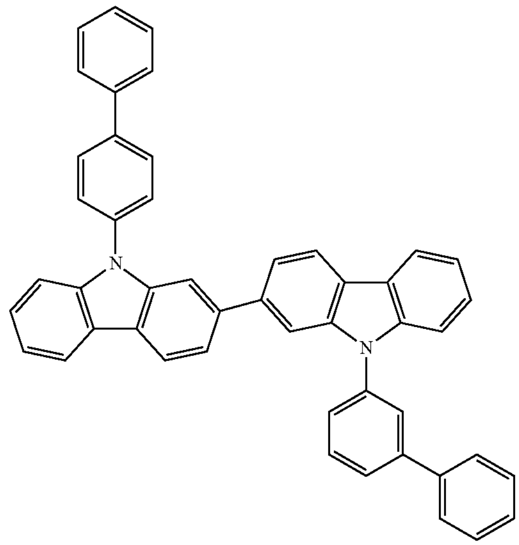
H-H34
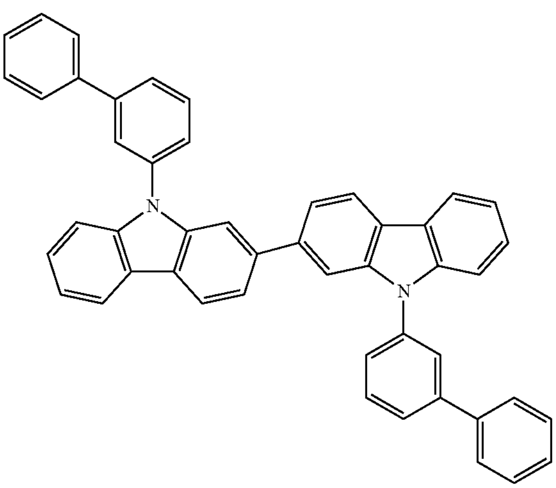
H-H35
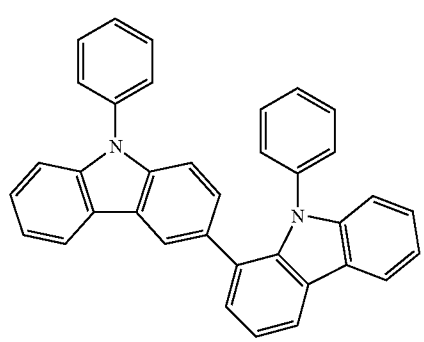

-continued
H-H36
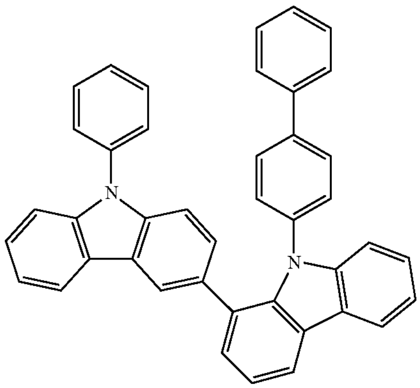
H-H37
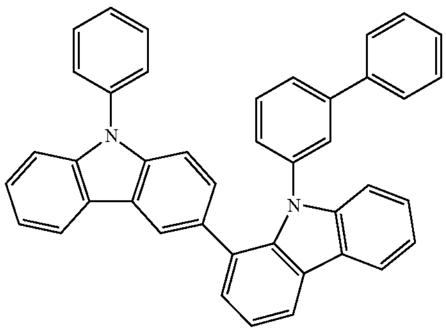
H-H38
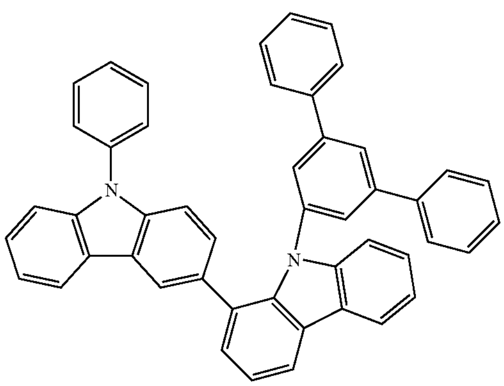
H-H39
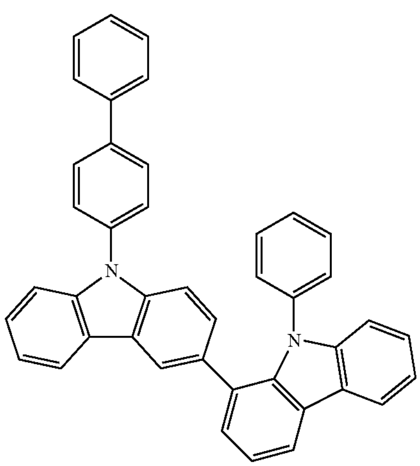
-continued
H-H40
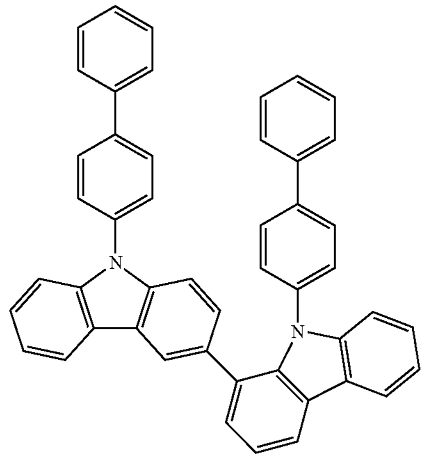
H-H41
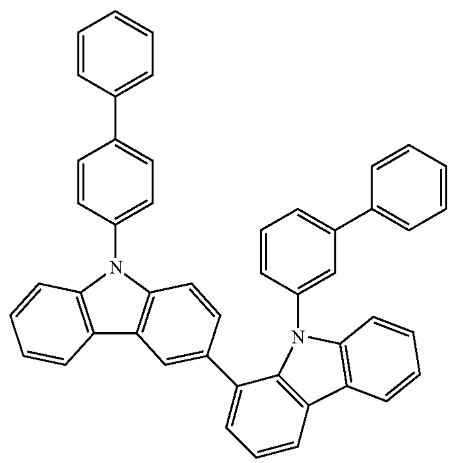
H-H42
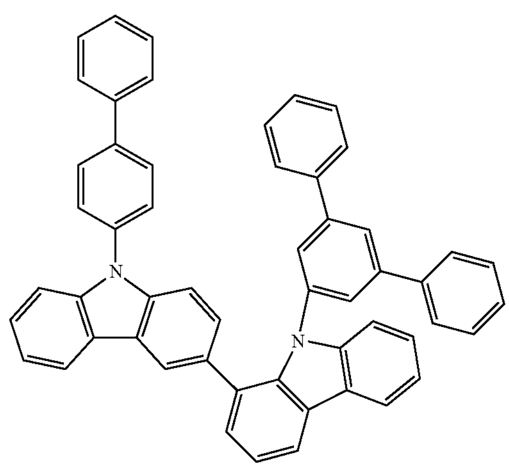

-continued
H-H43
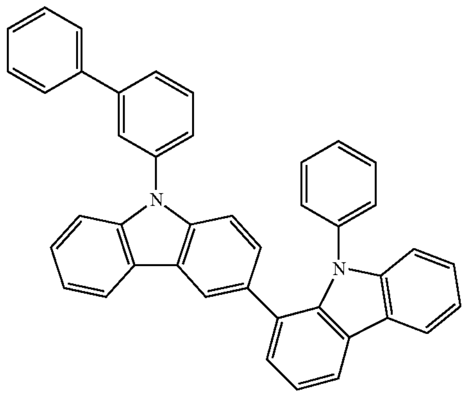
H-H44
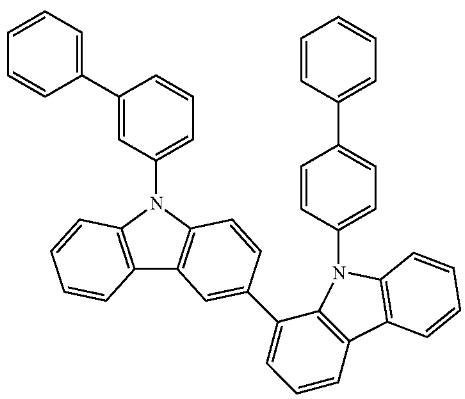
H-H45
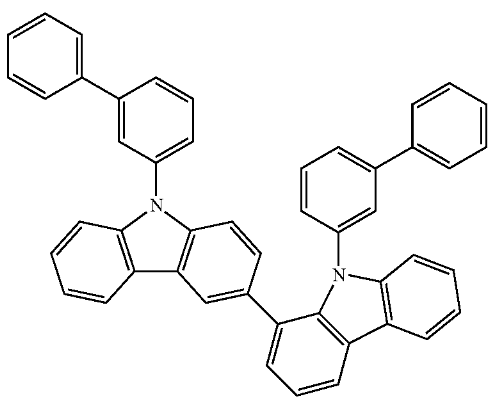
H-H46
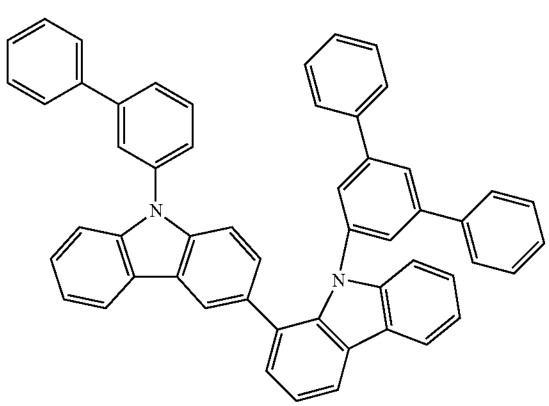
-continued
H-H47
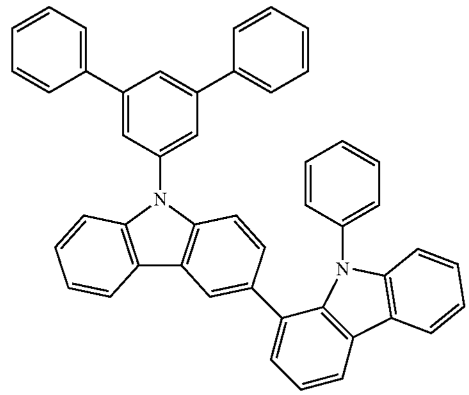
H-H48
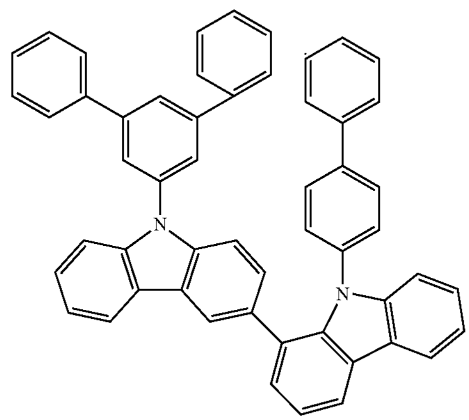
H-H49
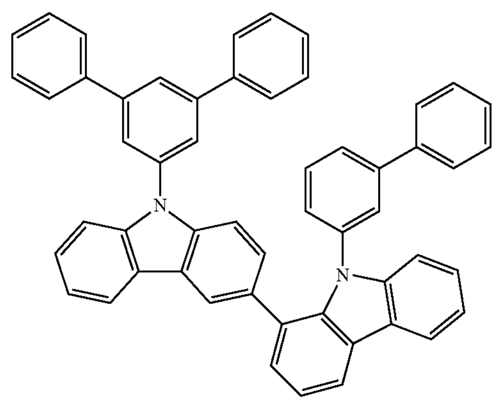
H-H50
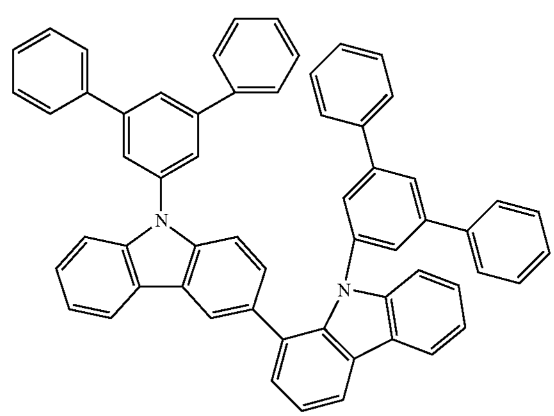

-continued
H-H51
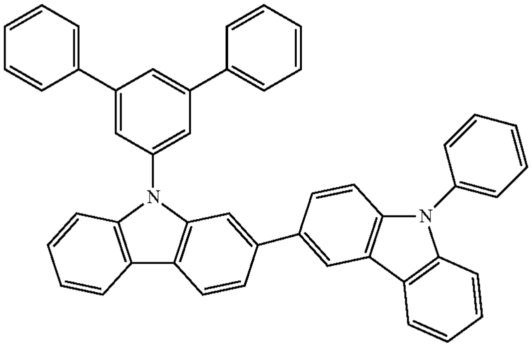
H-H52
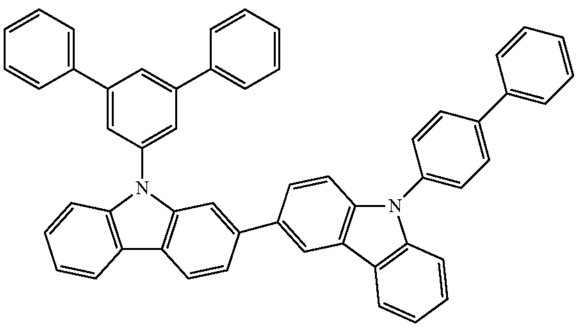
H-H53
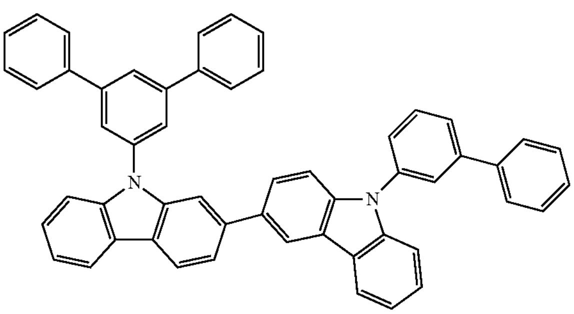
H-H54
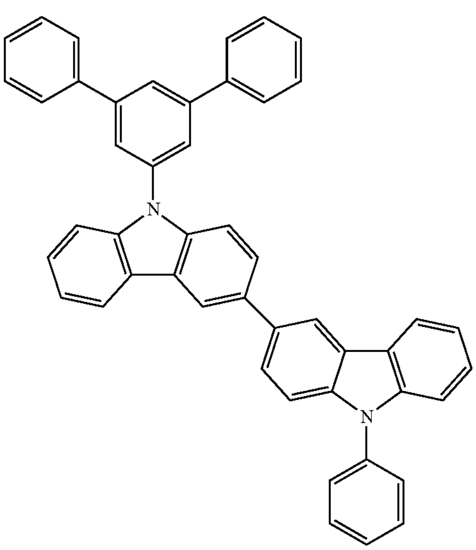
-continued
H-H55
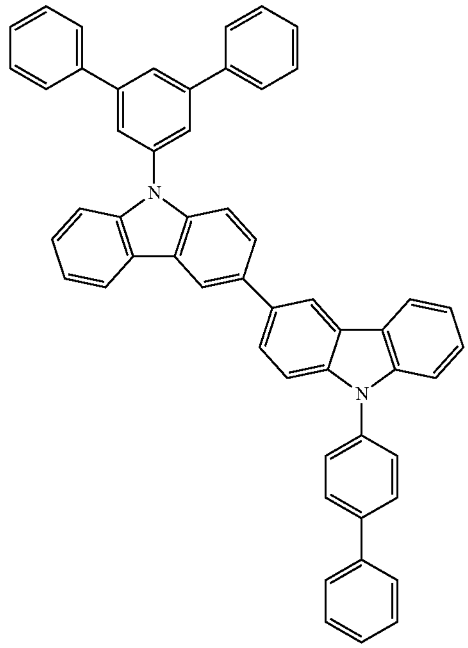
H-H56
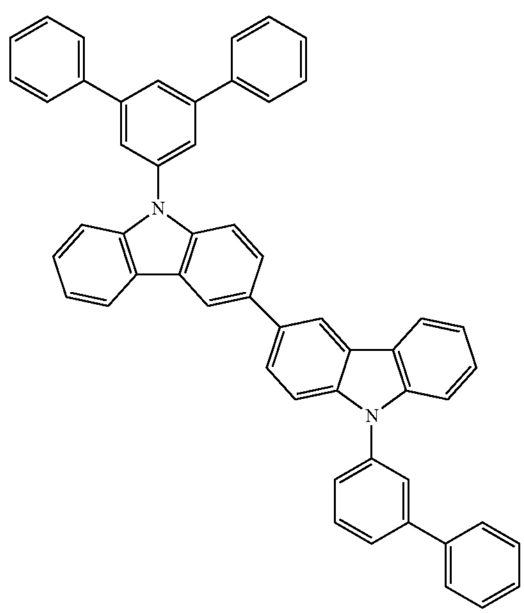

-continued
H-H57
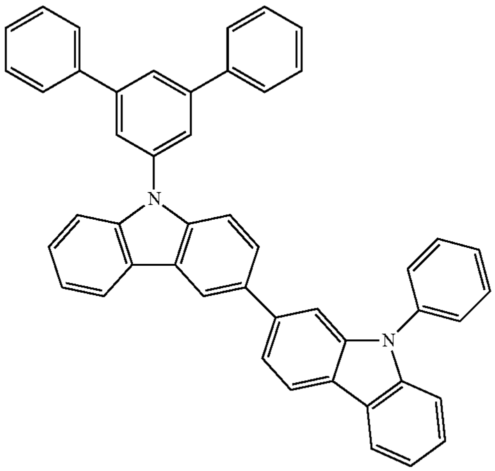
H-H58
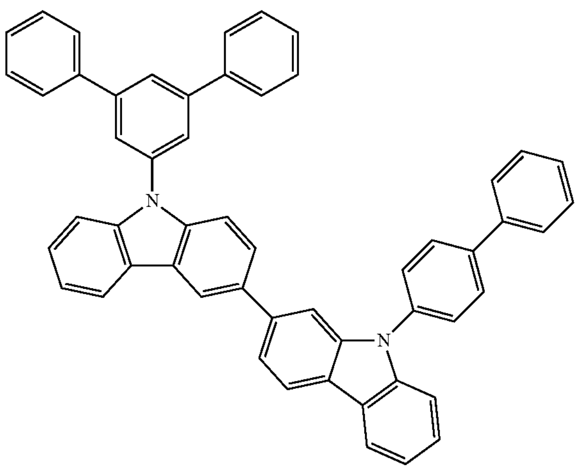
H-H59
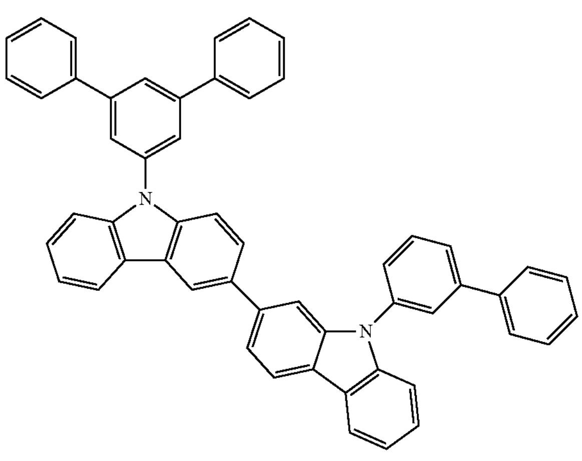
-continued
H-H60
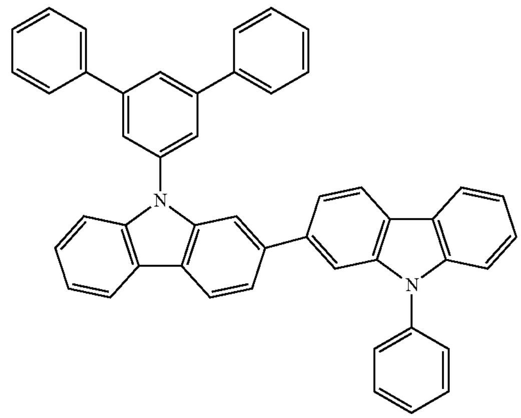
H-H61
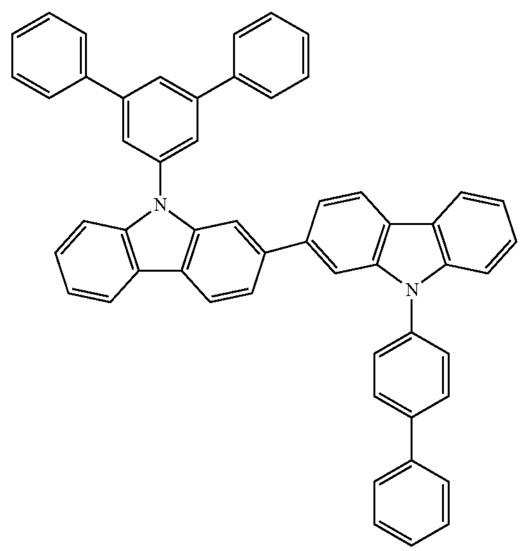
H-H62
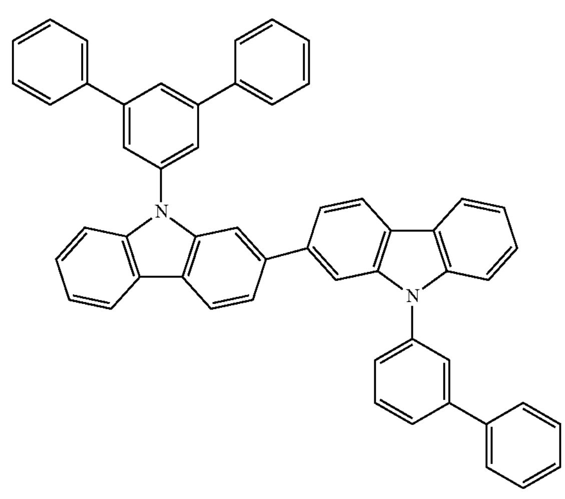

-continued
H-H63
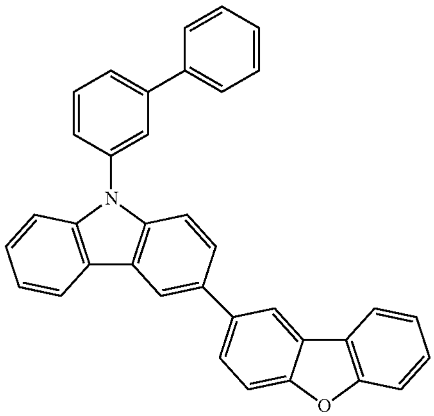
H-H64
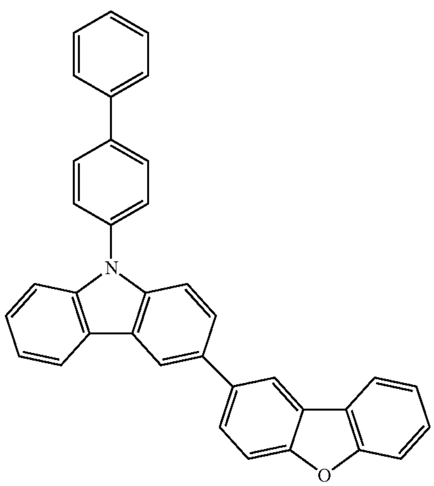
H-H65
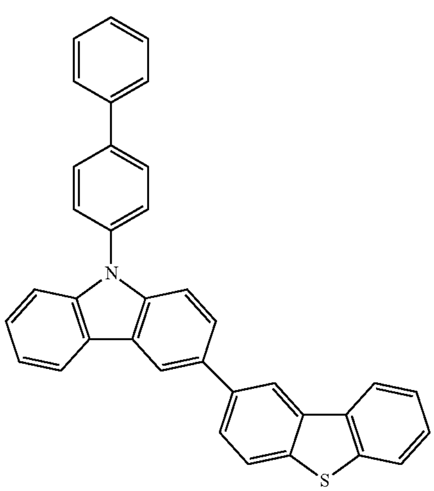
-continued
H-H66
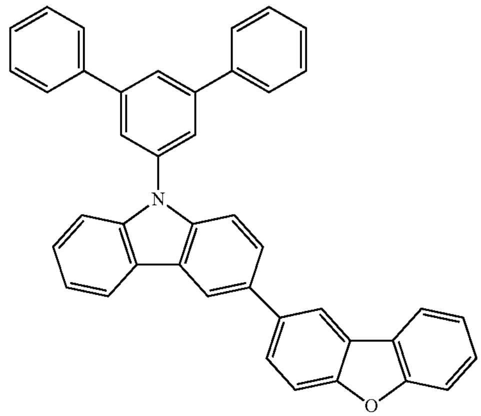
H-H67
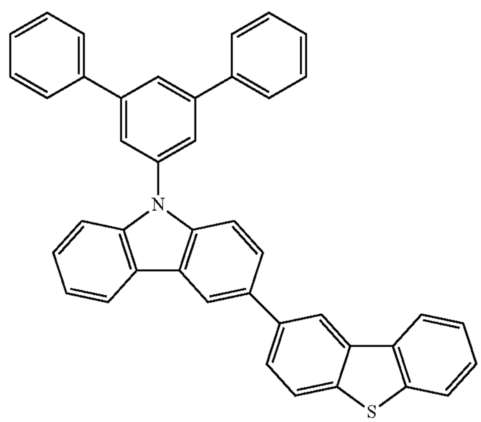
H-H68
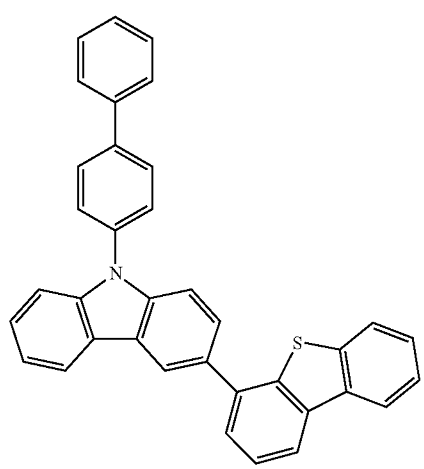

-continued
H-H69
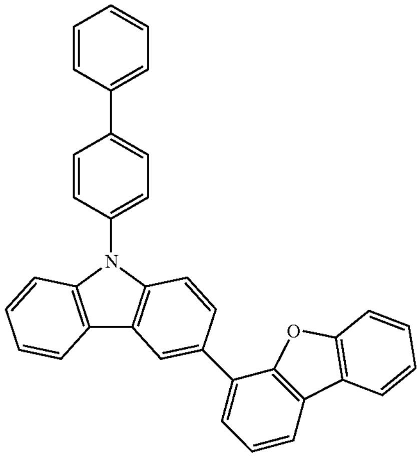
H-H70
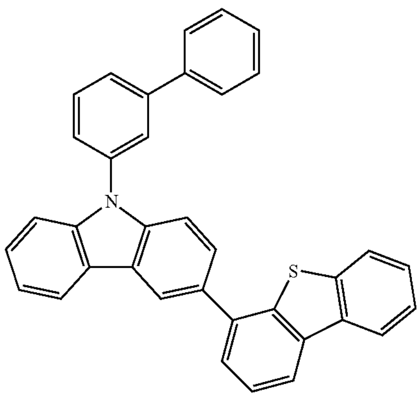
H-H71
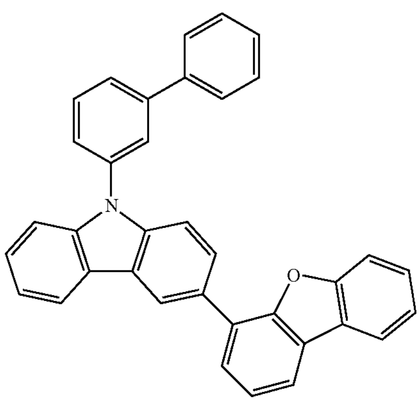
H-H72
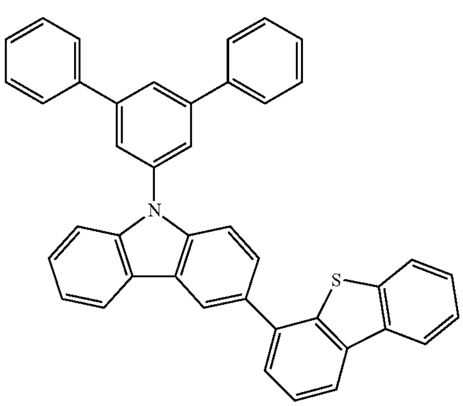
-continued
H-H73
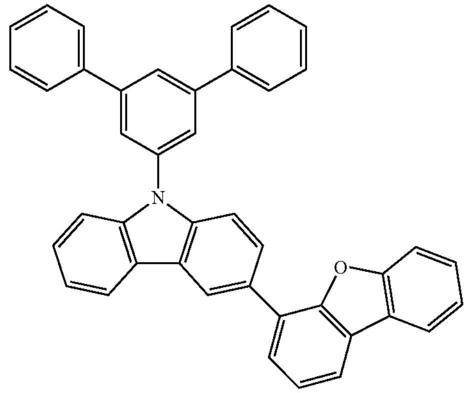
H-H74
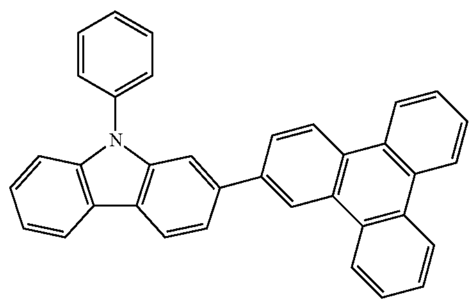
H-H75
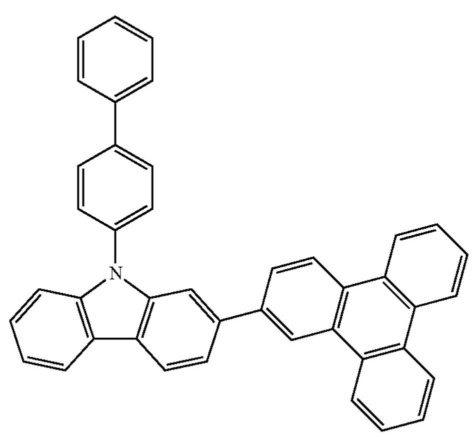

-continued
H-H76
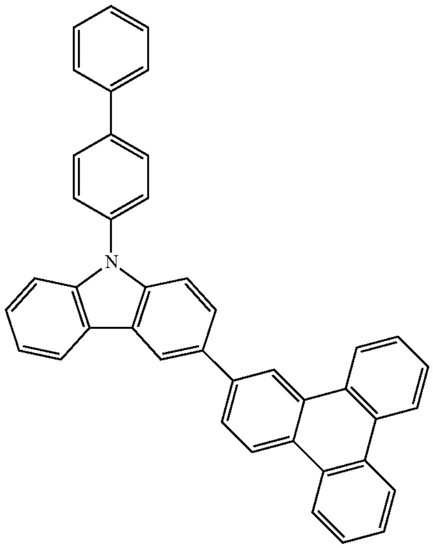
H-H77
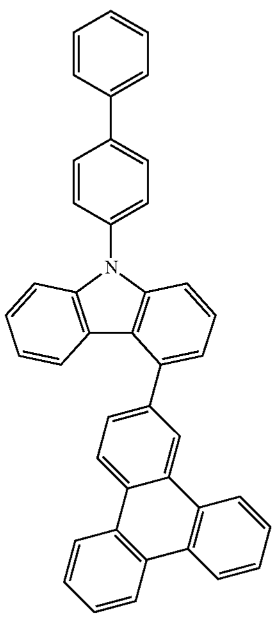
H-H78
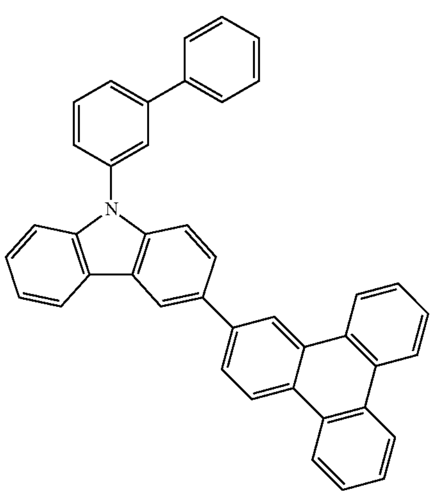
-continued
H-H79
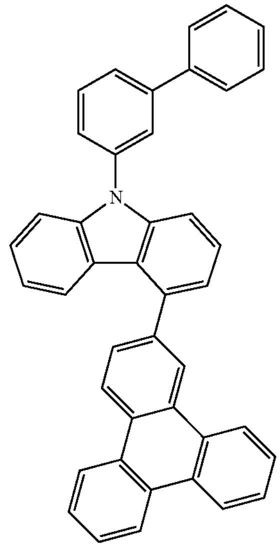
H-H80
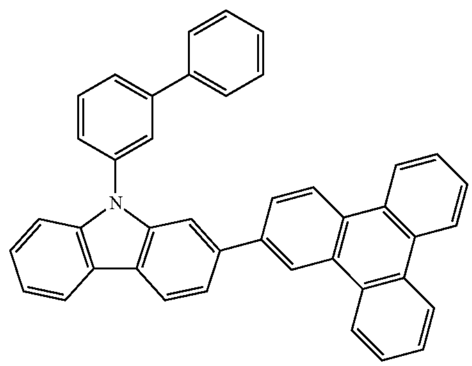
H-H81
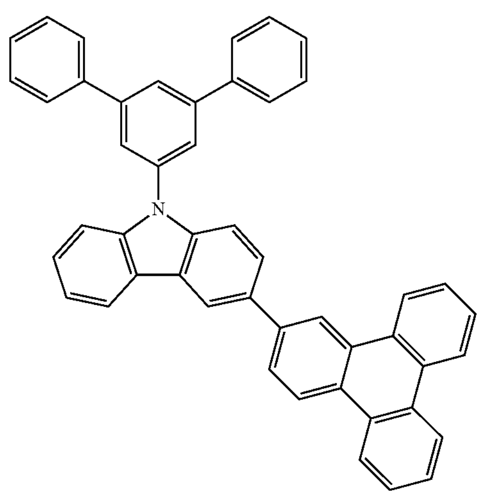

-continued
H-H82
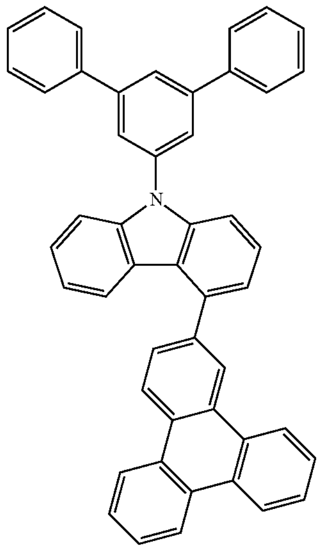
H-H83
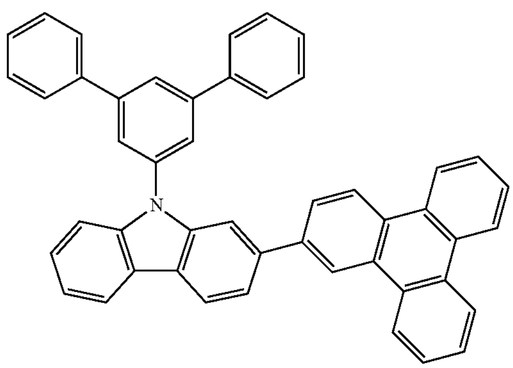
H-H84
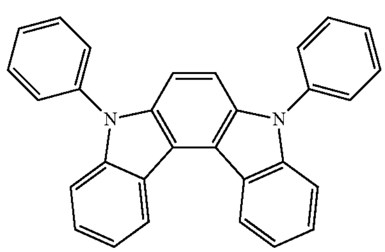
H-H85
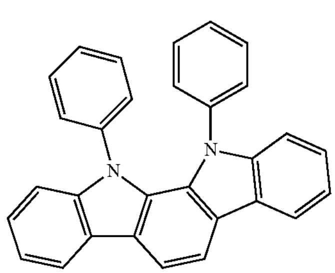
-continued
H-H86
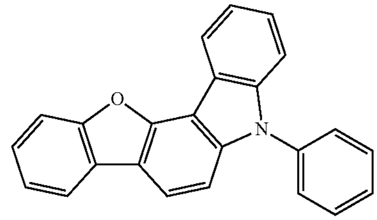
H-H87
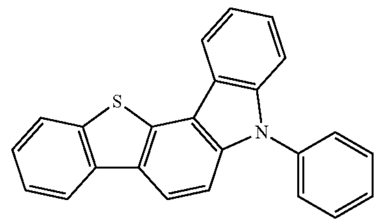
H-H88
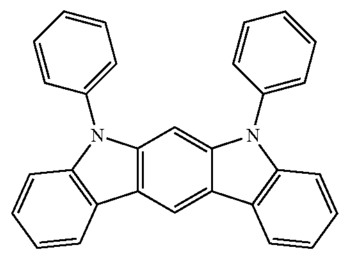
H-H89
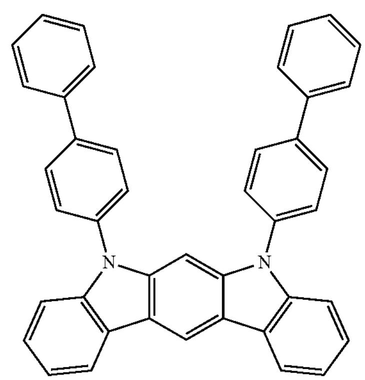
H-H90
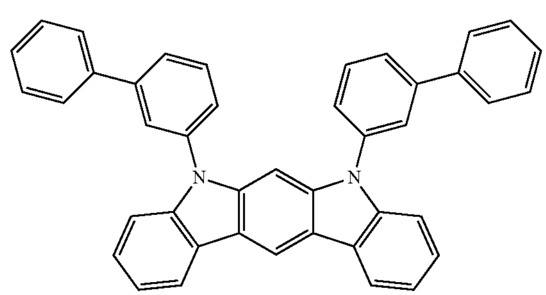

H-H91
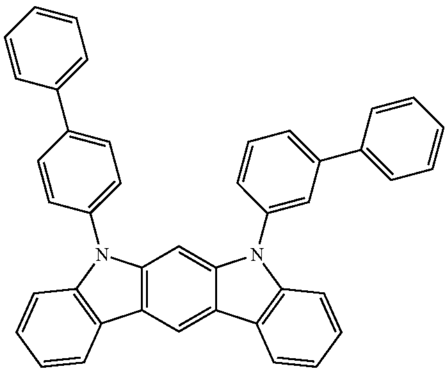
H-H92
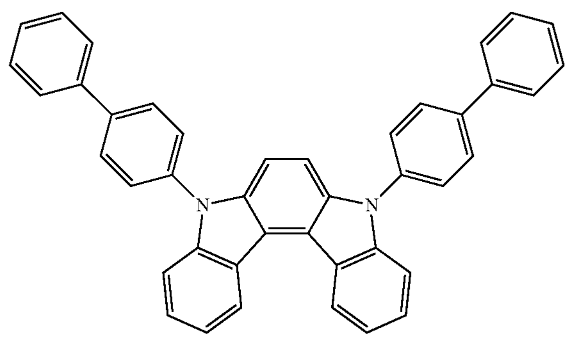
H-H93
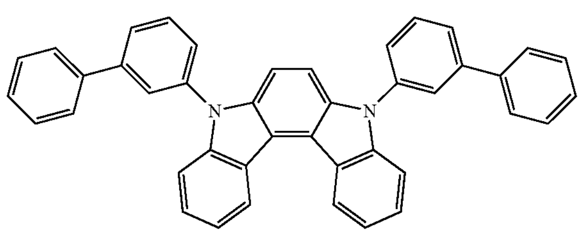
H-H94
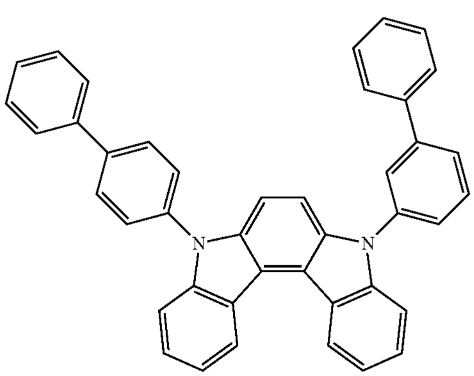
H-H95
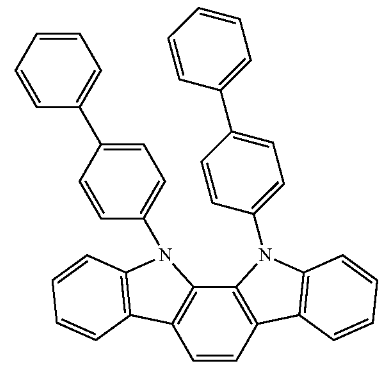
H-H96
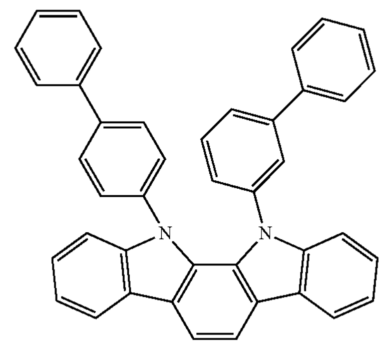
H-H97
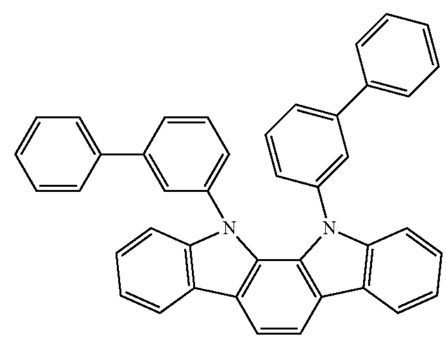
H-H98
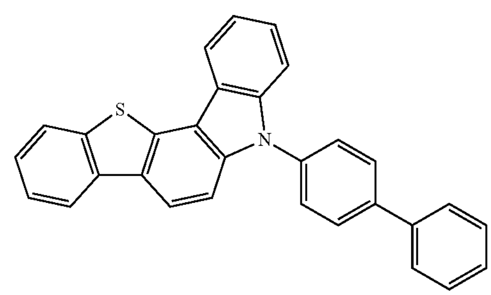
H-H99
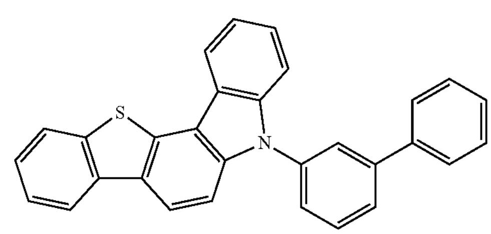

-continued

H-H100

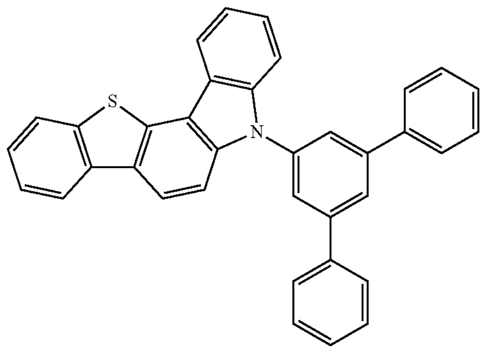

H-H101

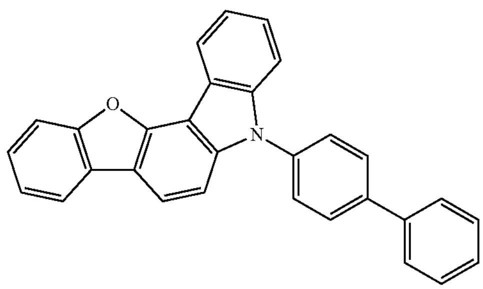

H-H102

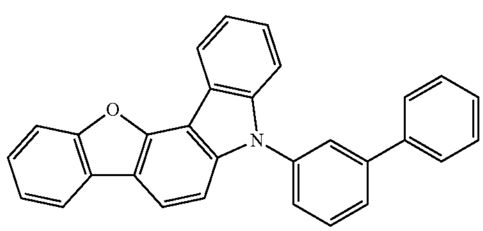

H-H103

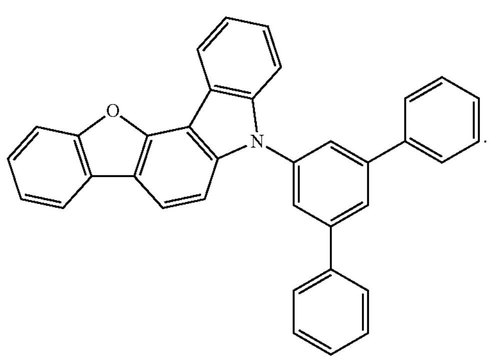

In one or more embodiments, the host may include an electron transport host and a hole transport host, wherein the electron transport host may include a triphenylene group and a triazine group, and the hole transport host may include a carbazole group, but embodiments of the present disclosure are not limited thereto.

A weight ratio of the electron transport host to the hole transport host may be in a range of 1:9 to 9:1, for example, 2:8 to 8:2. In an embodiment, the weight ratio of the electron transport host to the hole transport host may be in a range of 4:6 to 6:4. While not wishing to be bound by a particular theory, it is understood that when the weight ratio of the electron transport host to the hole transport host is within these ranges, hole and electron transport balance into the emission layer 15 may be achieved.

In an embodiment, the electron transport host may not be BCP, Bphen, B3PYMPM, 3P-T2T, BmPyPb, TPBi, 3TPYMB, or BSFM:

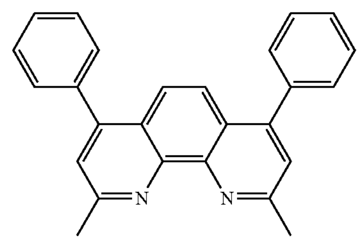

BCP

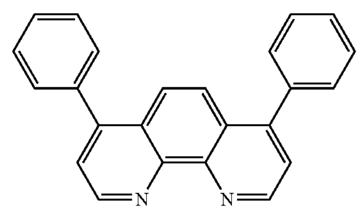

Bphen

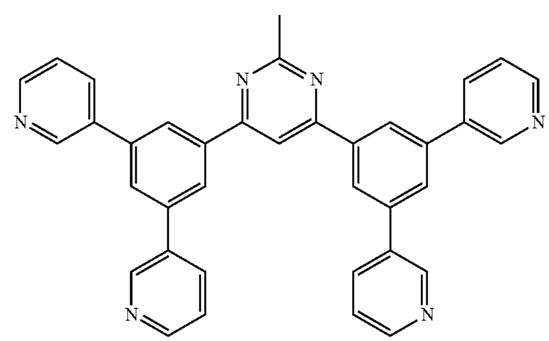

B3PYMPM

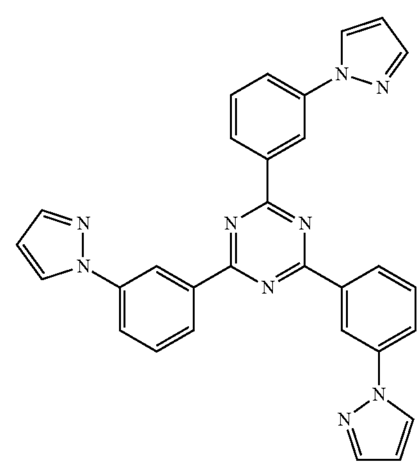

3P—T2T

-continued

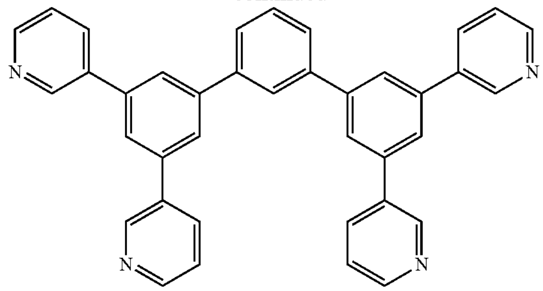

BmPyPb

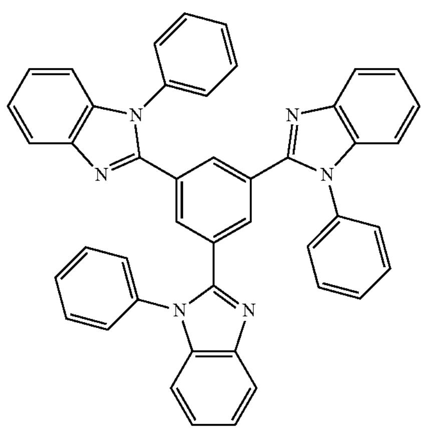

TPBi

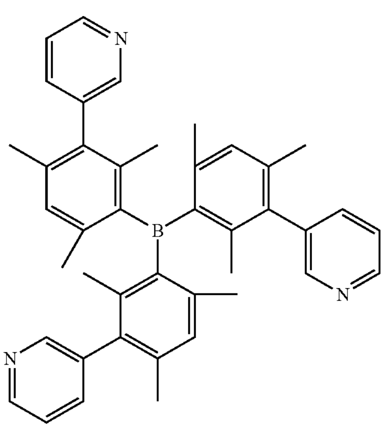

3TPYMB

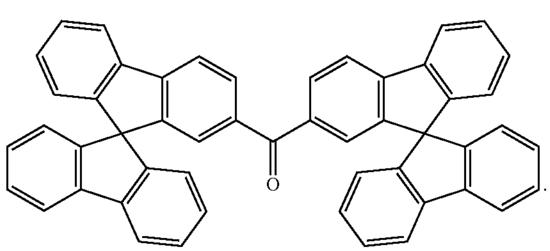

BSFM

In one or more embodiments, the hole transport host may not be mCP, CBP, or an amino group-containing compound:

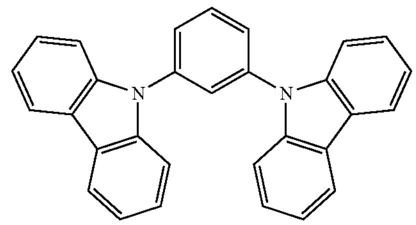

mCP

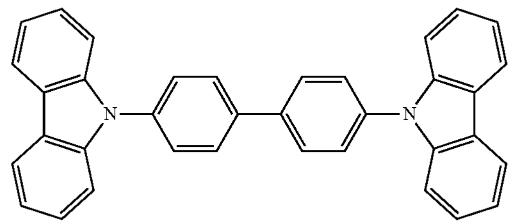

CBP

Hole Transport Region 12

In the organic light-emitting device 10, the hole transport region 12 may be disposed between the first electrode 11 and the emission layer 15.

The hole transport region 12 may have a single-layered structure or a multi-layered structure.

For example, the hole transport region 12 may have a structure of hole injection layer, a structure of hole transport layer, a structure of hole injection layer/hole transport layer, a structure of hole injection layer/first hole transport layer/second hole transport layer, a structure of hole transport layer/interlayer, a structure of hole injection layer/hole transport layer/interlayer, a structure of hole transport layer/electron blocking layer, or a structure of hole injection layer/hole transport layer/electron blocking layer, but embodiments of the present disclosure are not limited thereto.

The hole transport region 12 may include a compound having hole transport characteristics.

For example, the hole transport region 12 may include an amine-based compound.

In an embodiment, the hole transport region 12 may include at least one compound selected from compounds represented by Formulae 201 to 205, but embodiments of the present disclosure are not limited thereto:

Formula 201

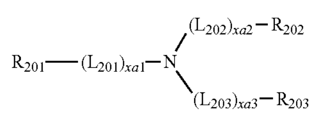

Formula 202

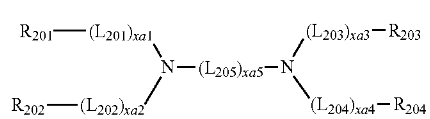

-continued

Formula 203

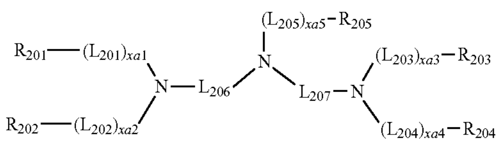

Formula 204

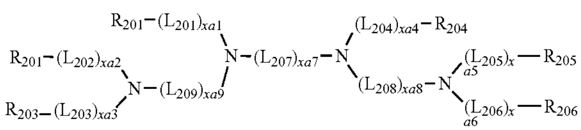

Formula 205

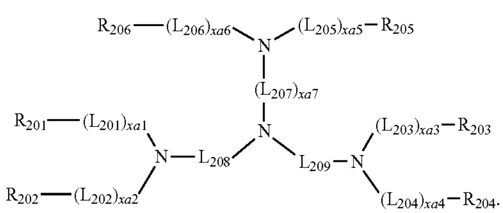

In Formulae 201 to 205, $L_{201}$ to $L_{209}$ may each independently be *—O—*', *—S—*', a substituted or unsubstituted $C_5$-$C_{60}$ carbocyclic group, or a substituted or unsubstituted $C_1$-$C_{60}$ heterocyclic group, xa1 to xa9 may each independently be an integer from 0 to 5, and $R_{201}$ to $R_{206}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_2$-$C_{60}$ heteroaryloxy group, a substituted or unsubstituted $C_2$-$C_{60}$ heteroarylthio group, a substituted or unsubstituted $C_3$-$C_{60}$ heteroarylalkyl group, a substituted or unsubstituted monovalent non-aromatic condensed polycyclic group, and a substituted or unsubstituted monovalent non-aromatic condensed heteropolycyclic group, wherein two neighboring groups selected from $R_{201}$ to $R_{206}$ may optionally be linked via a single bond, a dimethyl-methylene group, or a diphenyl-methylene group.

For example, $L_{201}$ to $L_{209}$ may each independently selected from a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a corozene group, an ovalene group, a pyrrole group, an iso-indole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indeno carbazole group, an indolocarbazole group, a benzofurocarbazole group, a benzothienocarbazole group, and a triindolobenzene group, each unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, and —$Si(Q_{11})(Q_{12})(Q_{13})$, xa1 to xa9 may each independently be 0, 1, or 2, and $R_{201}$ to $R_{206}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an indeno carbazolyl group, an indolocarbazolyl group, a benzofurocarbazolyl group, and a benzothienocarbazolyl group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$).

In one or more embodiments, the hole transport region 12 may include an amine-based compound containing at least one carbazole group.

In one or more embodiments, the hole transport region 12 may include an amine-based compound containing at least one carbazole group and an amine-based compound not containing a carbazole group.

The amine-based compound containing at least one carbazole group may be selected from, for example, a compound represented by Formula 201, wherein the compound of Formula 201 may include, in addition to a carbazole group, at least one selected from a dibenzofuran group, a dibenzothiophene group, a fluorene group, a spirofluorene group, an indenocarbazole group, an indolocarbazole group, a benzofurocarbazole group, and a benzothienocarbazole group.

The amine-based compound not containing a carbazole group may be selected from, for example, a compound represented by Formula 201, wherein the compound may not include a carbazole group, but may include at least one selected from a dibenzofuran group, a dibenzothiophene group, a fluorene group, a spirofluorene group, an indenocarbazole group, an indolocarbazole group, a benzofurocarbazole group, and a benzothienocarbazole group.

In one or more embodiments, the hole transport region 12 may include at least one of the compound of Formula 201 and the compound of Formula 202.

In one or more embodiments, the hole transport region 12 may include at least one selected from compounds represented by Formulae 201-1, 202-1, and 201-2, but embodiments of the present disclosure are not limited thereto:

Formula 201-1

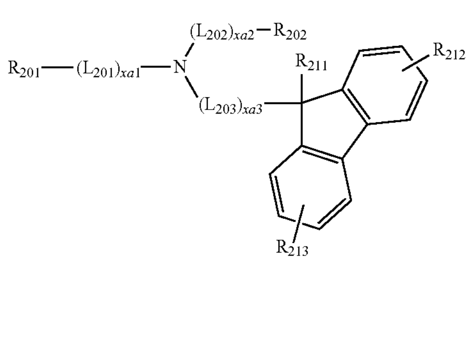

-continued

Formula 202-1

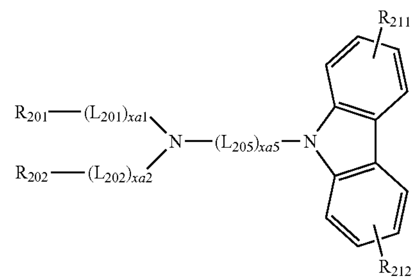

Formula 201-2

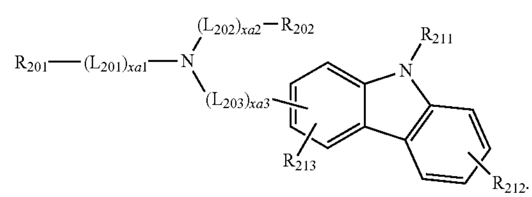

In Formulae 201-1, 202-1, and 201-2, $L_{201}$ to $L_{203}$, $L_{205}$, xa1 to xa3, xa5, $R_{201}$, and $R_{202}$ are each independently the same as described herein, and $R_{211}$ to $R_{213}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a phenyl group substituted with at least one $C_1$-$C_{10}$ alkyl group, a phenyl group substituted with at least one —F, a naphthyl group, a fluorenyl group, a spiro-bifluorenyl group, a dimethylfluorenyl group, a diphenylfluorenyl group, a triphenylenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

For example, the hole transport region 12 may include at least one compound selected from Compounds HT1 to HT39, but embodiments of the present disclosure are not limited thereto.

HT1
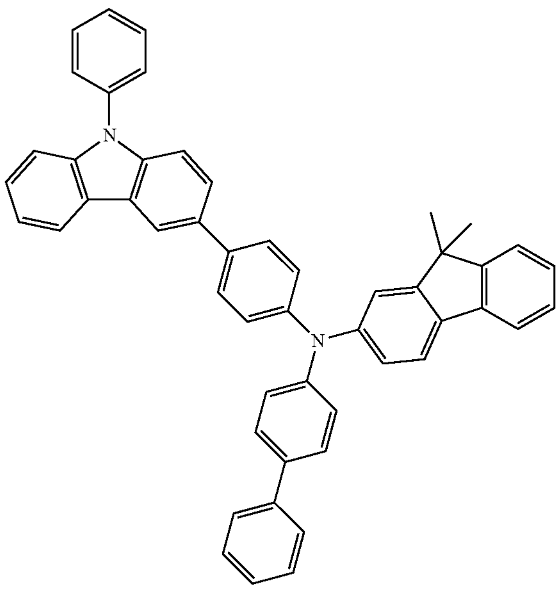
HT2
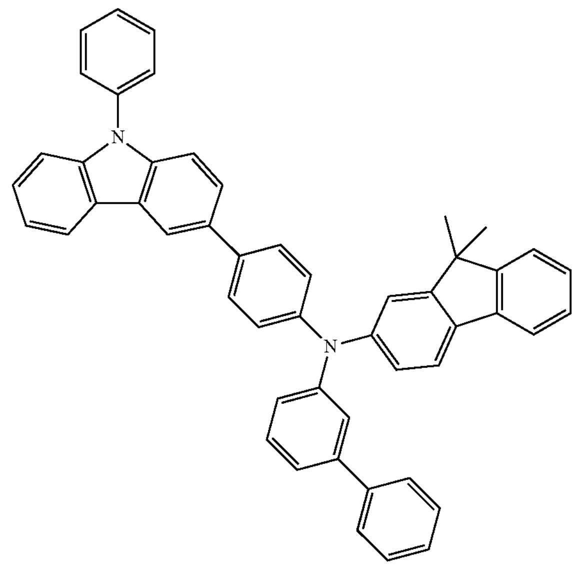
HT3
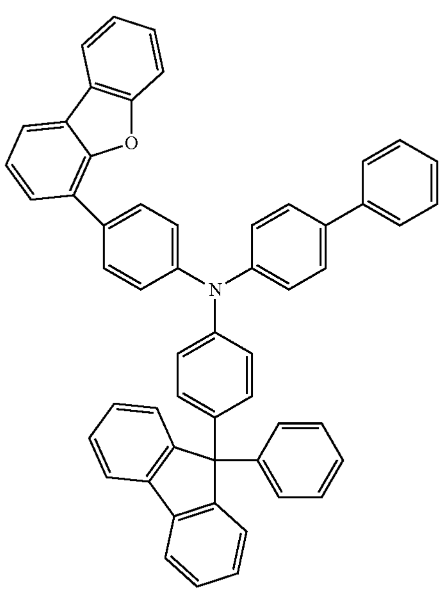
HT4
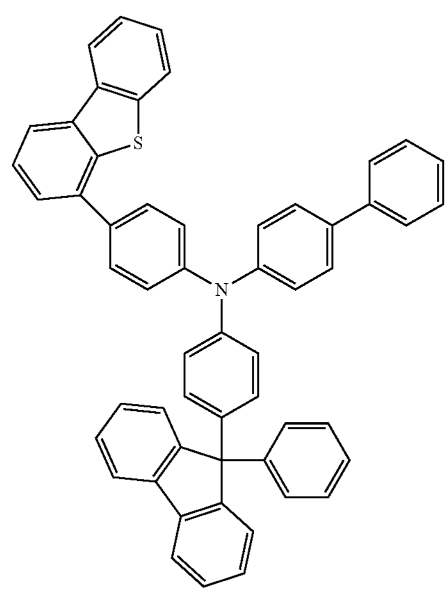

-continued
HT5
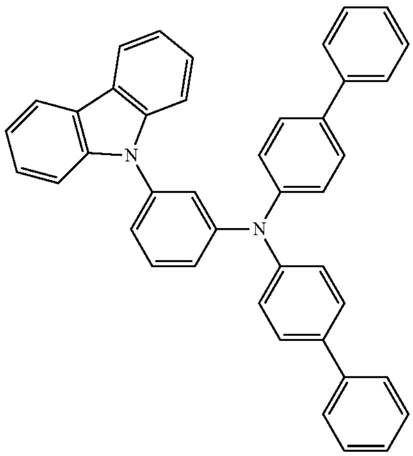
HT6
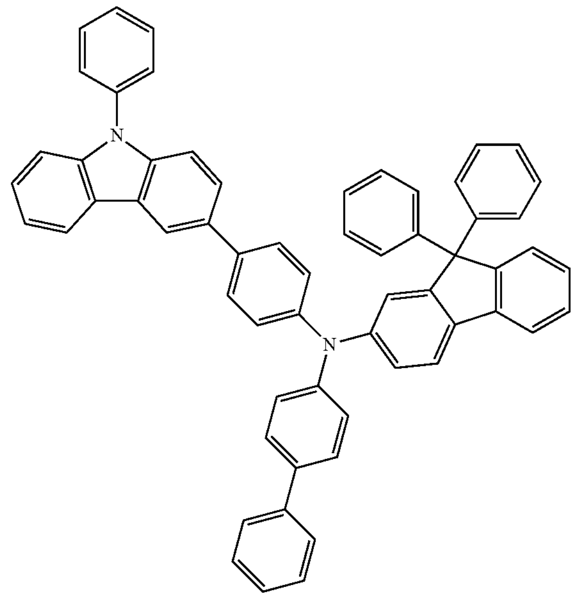
HT7
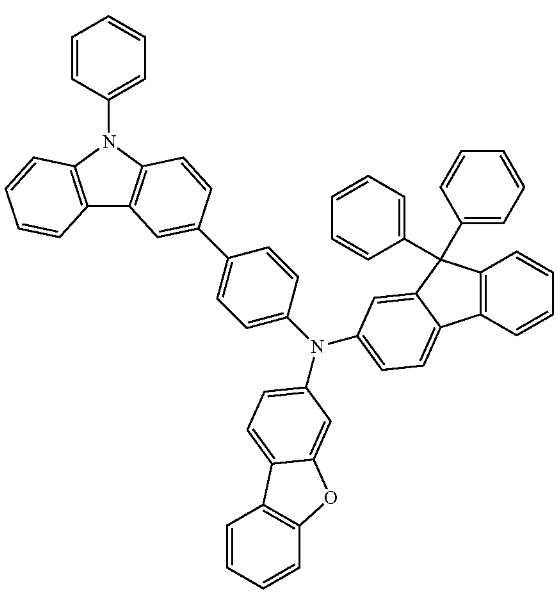
HT8
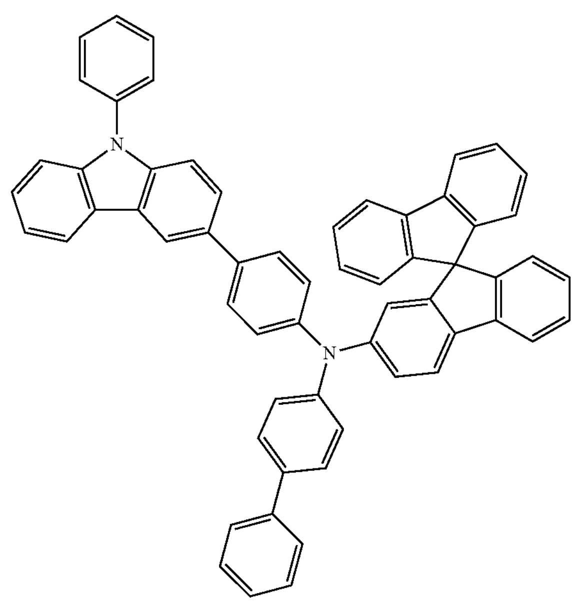

-continued
HT9
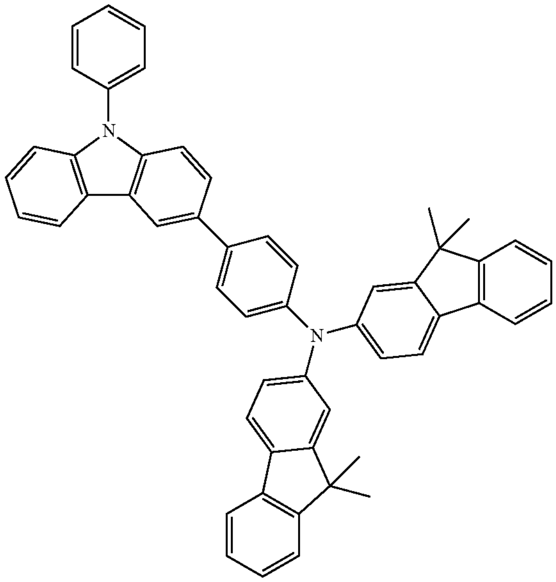
HT10
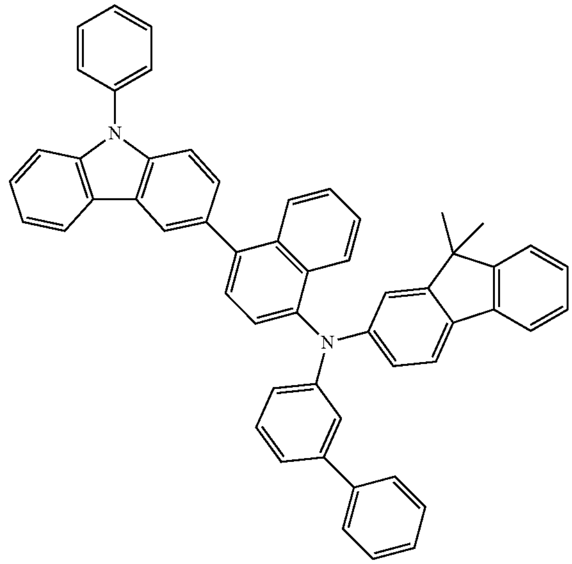
HT11
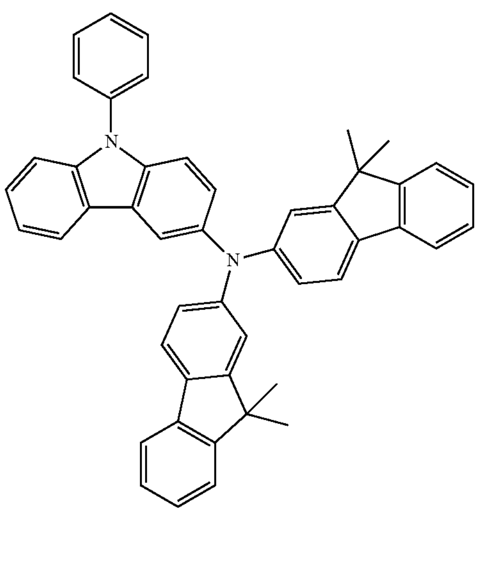
HT12
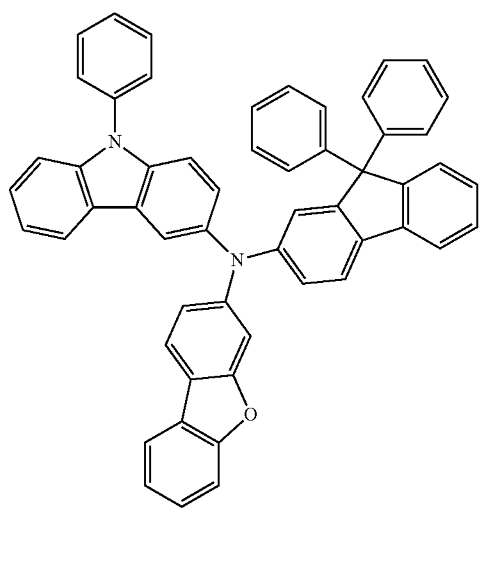

-continued
HT13
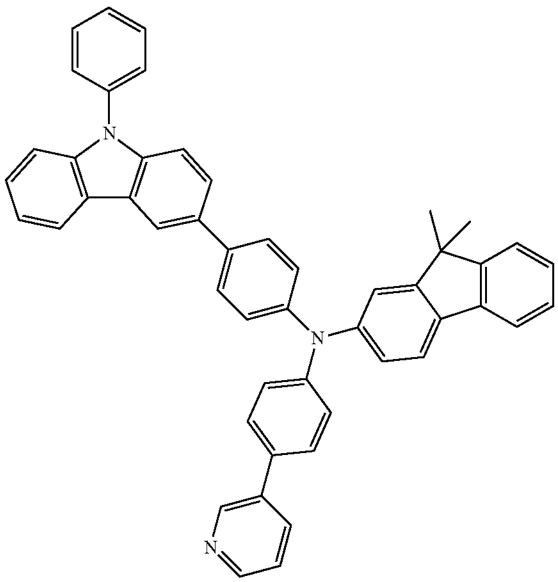
HT14
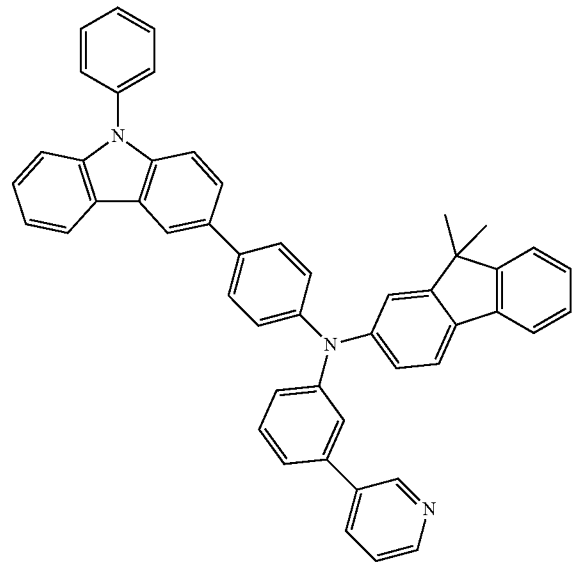
HT15
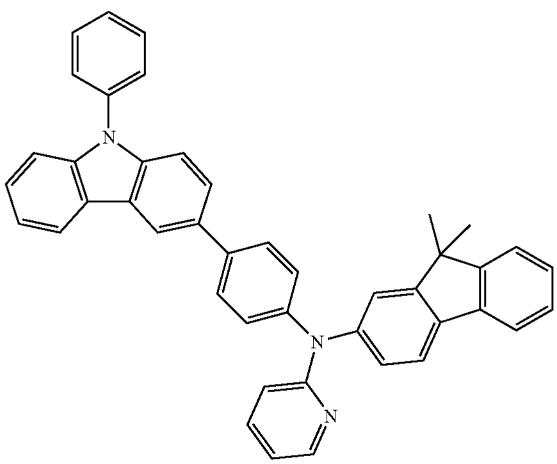
HT16
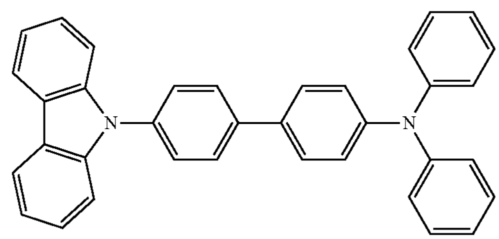
HT17
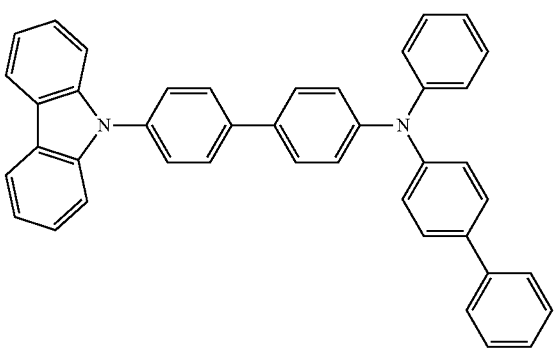
HT18
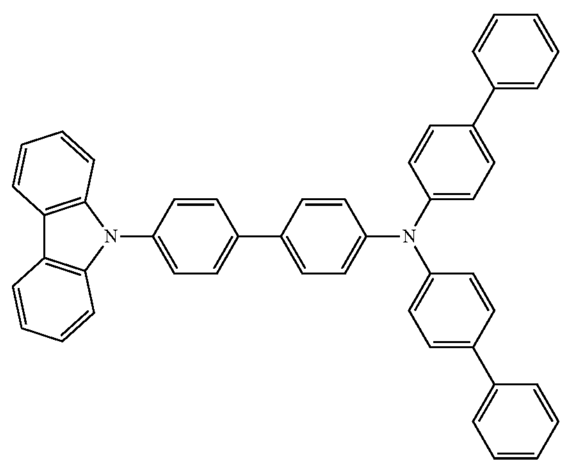

-continued
HT19
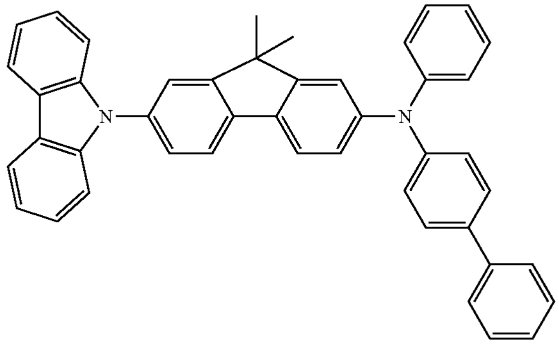
HT20
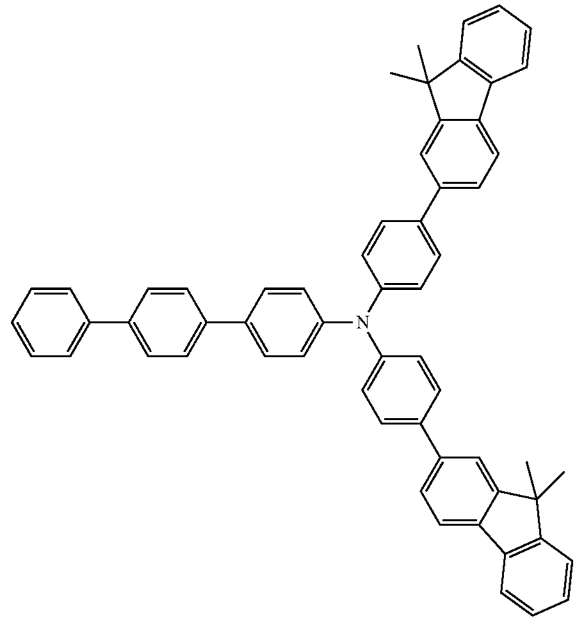
HT21
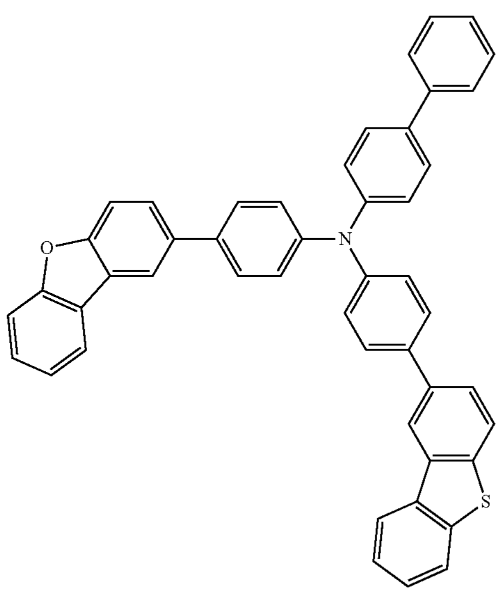
HT22
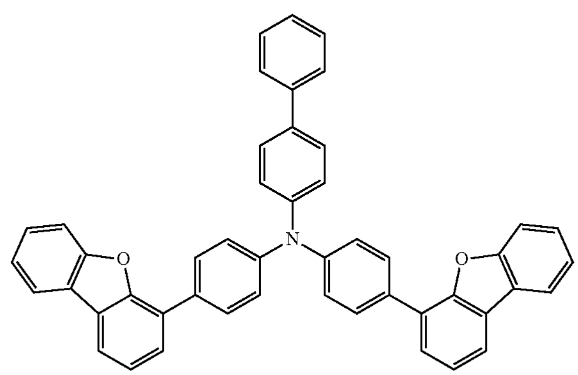

-continued
HT23
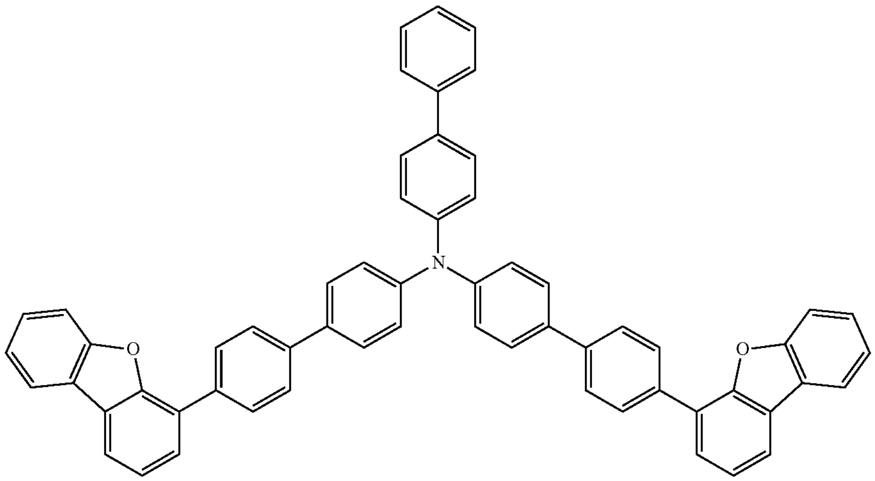
HT24
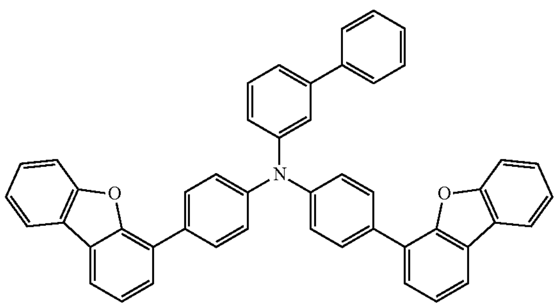
HT25
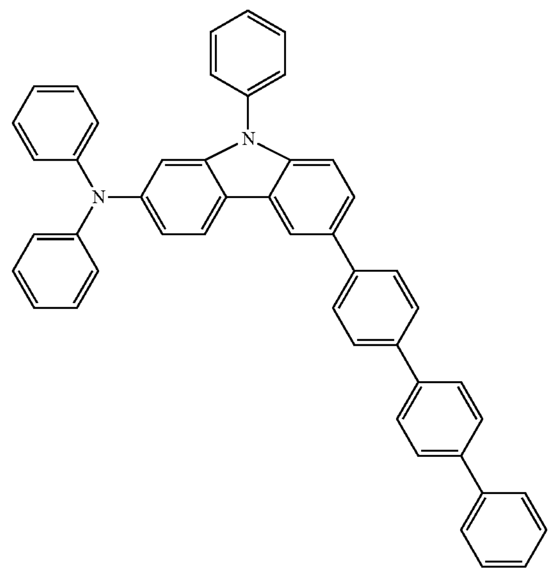
HT26
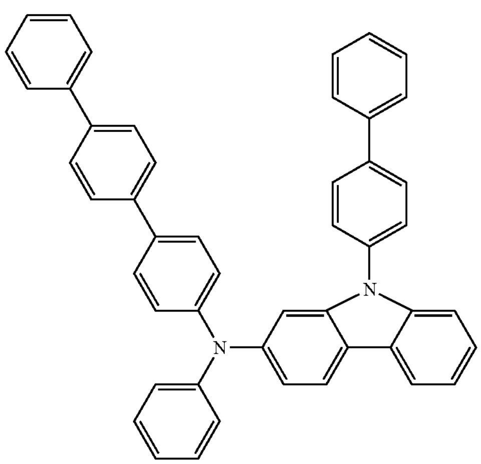
HT27
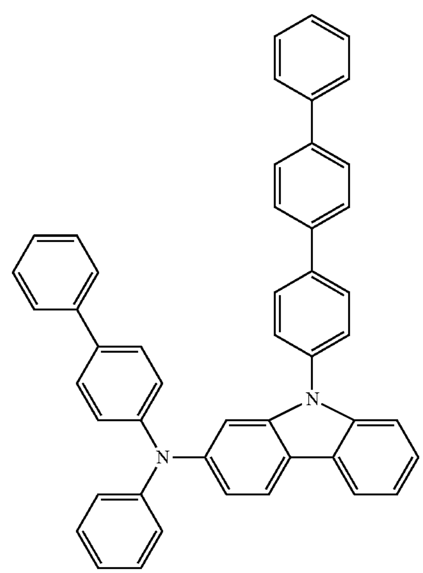

-continued
HT28
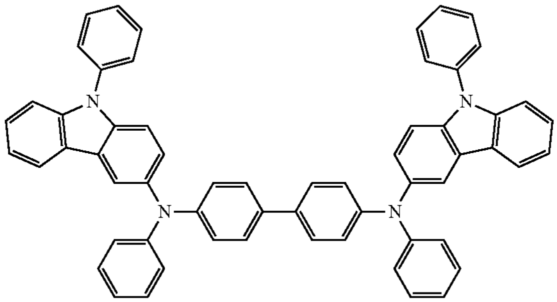
HT29
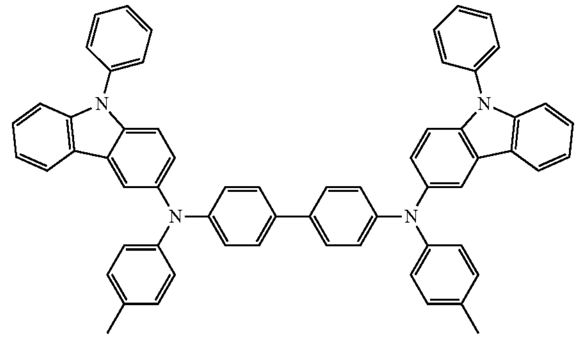
HT30
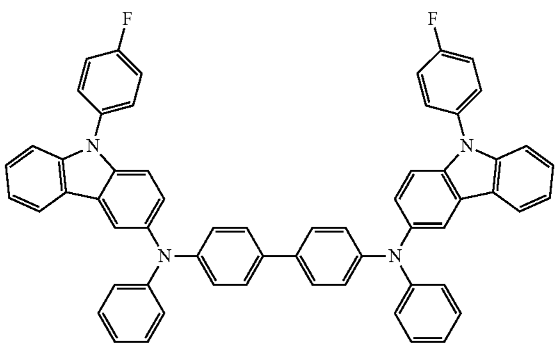
HT31
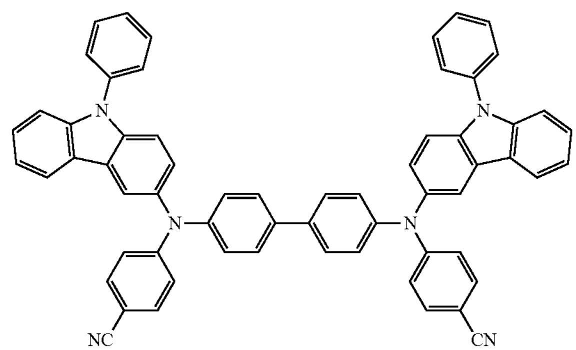
HT32
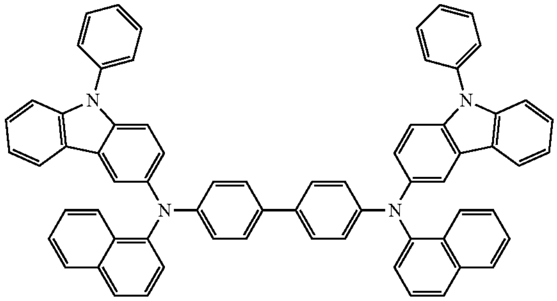
HT33
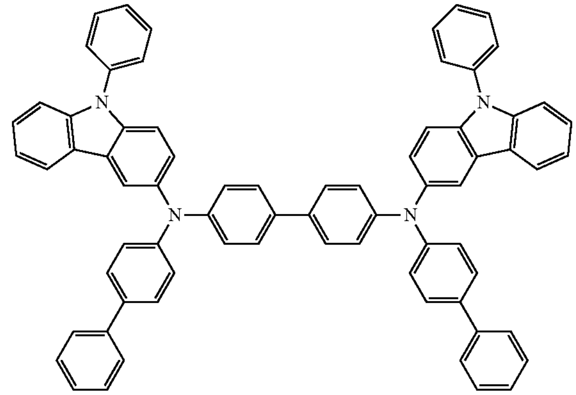

-continued
HT34
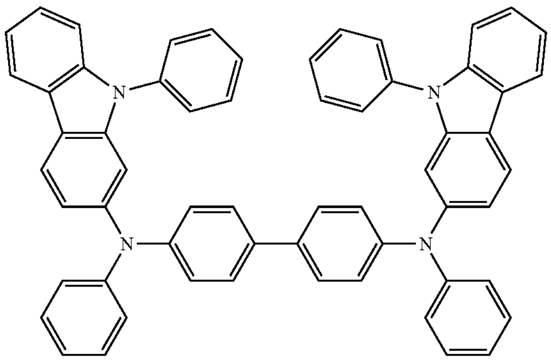
HT35
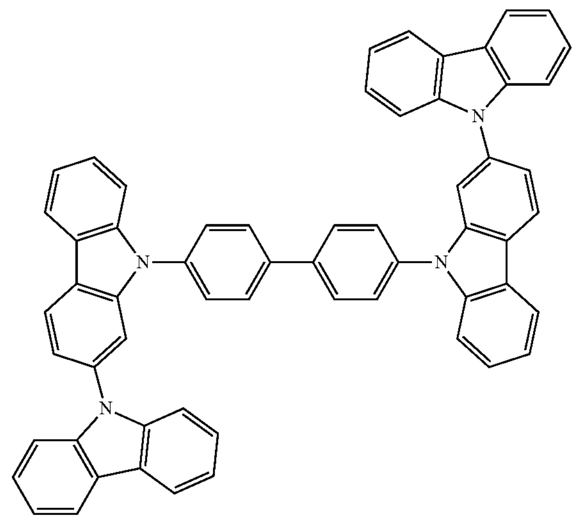
HT36
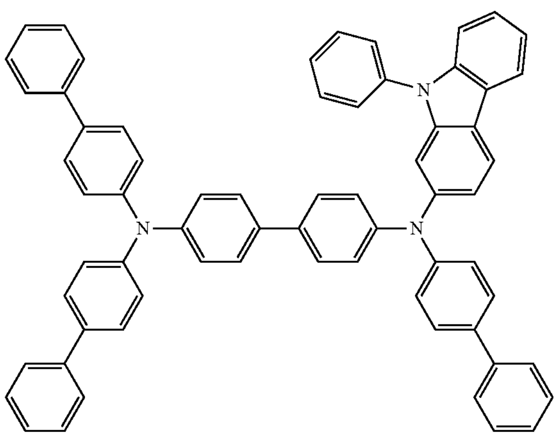
HT37
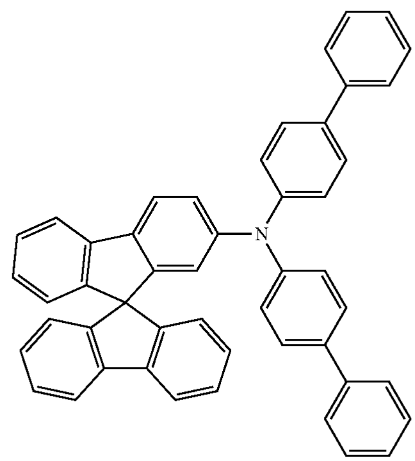
HT38
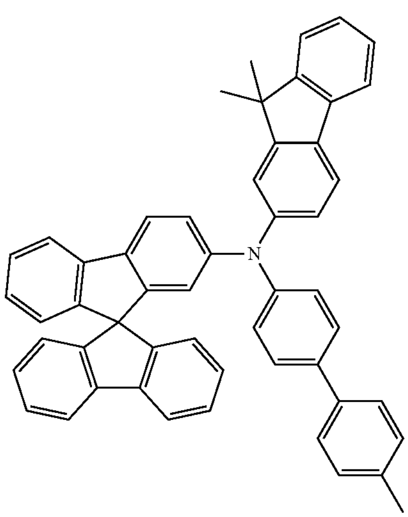
HT39
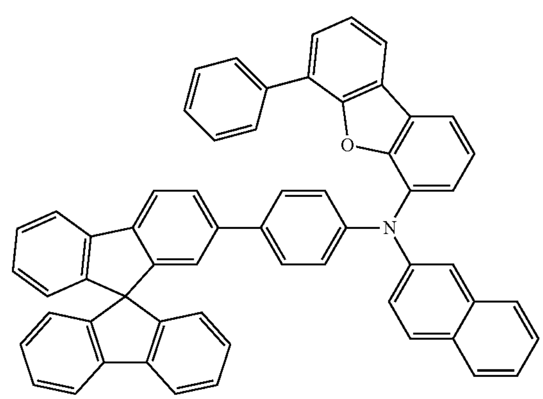

In an embodiment, the hole transport region 12 of the organic light-emitting device 10 may further include a p-dopant. When the hole transport region 12 further includes the p-dopant, the hole transport region 12 may have a structure including a matrix (for example, at least one compounds represented by Formulae 201 to 205) and a p-dopant included in the matrix. The p-dopant may be homogeneously or non-homogeneously doped in the hole transport region 12.

In an embodiment, the p-dopant may have a LUMO energy level of about −3.5 eV or less.

The p-dopant may include at least one selected from a quinone derivative, a metal oxide, and a cyano group-containing compound, but embodiments of the present disclosure are not limited thereto.

For example, the p-dopant may include at least one selected from:

a quinone derivative such as tetracyanoquinodimethane (TCNQ), 2,3,5,6-tetrafluoro-7,7,8,8-tetracyanoquinodimethane (F4-TCNQ), and F6-TCNNQ;

a metal oxide such as a tungsten oxide and a molybdenum oxide;

1,4,5,8,9,12-hexaazatriphenylene-hexacarbonitrile (HAT-CN); and a compound represented by Formula 221, but embodiments of the present disclosure are not limited thereto:

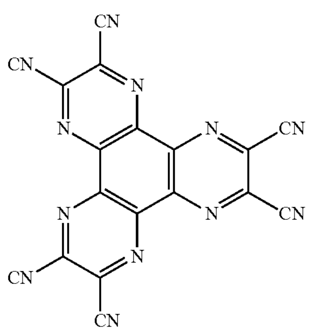

HAT—CN

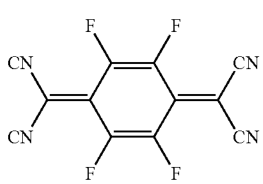

F4—TCNQ

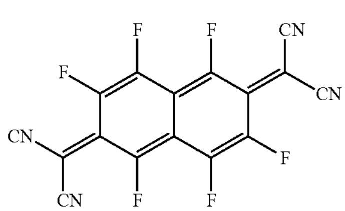

F6—TCNNQ

-continued

Formula 221

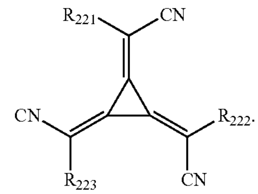

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one of $R_{221}$ to $R_{223}$ may have at least one substituent selected from a cyano group, —F, —Cl, —Br, —I, a $C_1$-$C_{20}$ alkyl group substituted with at least one —F, a $C_1$-$C_{20}$ alkyl group substituted with at least one —Cl, a $C_1$-$C_{20}$ alkyl group substituted with at least one —Br, and a $C_1$-$C_{20}$ alkyl group substituted with at least one —I.

A thickness of the hole transport region 12 may be in a range of about 100 Angstroms (Å) to about 10,000 Å, for example, about 400 Å to about 2,000 Å, and a thickness of the emission layer 15 may be in a range of about 100 Å to about 3,000 Å, for example, about 300 Å to about 1,000 Å. While not wishing to be bound by a particular theory, it is understood that when the thicknesses of the hole transport region 12 and the emission layer are within these ranges, satisfactory hole transporting characteristics and/or luminescence characteristics may be obtained without a substantial increase in driving voltage.

Electron Transport Region 17

In the organic light-emitting device 10, the electron transport region 17 may be disposed between the emission layer 15 and the second electrode 19.

The electron transport region 17 may have a single-layered structure or a multi-layered structure.

For example, the electron transport region 17 may have a structure of electron transport layer, a structure of electron transport layer/electron injection layer, a structure of buffer layer/electron transport layer, a structure of hole blocking layer/electron transport layer, a structure of buffer layer/electron transport layer/electron injection layer, or a structure of hole blocking layer/electron transport layer/electron injection layer, but embodiments of the present disclosure are not limited thereto.

The electron transport region 17 may include a known electron transport material.

The electron transport region (for example, the buffer layer, the hole blocking layer, the electron control layer, or the electron transport layer in the electron transport region) may include a metal-free compound including at least one π electron-depleted nitrogen-containing cyclic group. The π electron-depleted nitrogen-containing cyclic group is the same as described above. The electron transport region 17 may also include an electron control layer.

For example, the electron transport region may include a compound represented by Formula 601:

$$[Ar_{601}]_{xe11}\text{-}[(L_{601})_{xe1}\text{-}R_{601}]_{xe21}. \quad \text{Formula 601}$$

In Formula 601, $Ar_{601}$ and $L_{601}$ may each independently be a substituted or unsubstituted $C_5$-$C_{60}$ carbocyclic group or a substituted or unsubstituted $C_1$-$C_{60}$ heterocyclic group, xe11 may be 1, 2, or 3, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_2$-$C_{60}$ heteroaryloxy group, a substituted or unsubstituted $C_2$-$C_{60}$ heteroarylthio group, a substituted or unsubstituted $C_3$-$C_{60}$ heteroarylalkyl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one of groups $Ar_{601}$ in the number of xe11 and at least one of groups $R_{601}$ in the number of xe21 may include the π electron-depleted nitrogen-containing cyclic group.

In an embodiment, in Formula 601, ring $Ar_{601}$ and ring $L_{601}$ may each independently be selected from a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is two or more, two or more groups $Ar_{601}$ may be linked via a single bond.

In one or more embodiments, $Ar_{601}$ in Formula 601 may be an anthracene group.

In one or more embodiments, a compound represented by Formula 601 may be represented by Formula 601-1:

Formula 601-1

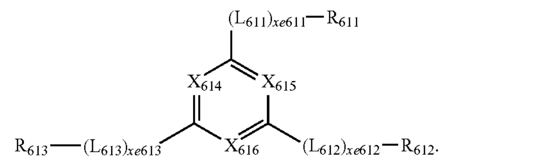

In Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, xe1 and xe611 to xe613 in Formulae 601 and 601-1 may each independently be 0, 1, or 2.

In one or more embodiments, in Formulae 601 and 601-1, $R_{601}$ and $R_{611}$ to $R_{613}$ may each independently be selected from a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and $$—S(=O)_2(Q_{601}) \text{ and } —P(=O)(Q_{601})(Q_{602}), \text{ and}$$

$Q_{601}$ and $Q_{602}$ are the same as described above.

The electron transport region may include at least one compound selected from Compounds ET1 to ET36, but embodiments of the present disclosure are not limited thereto:

ET1

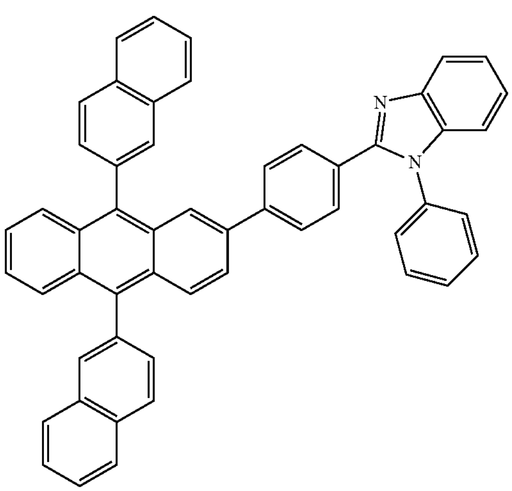

-continued

ET2

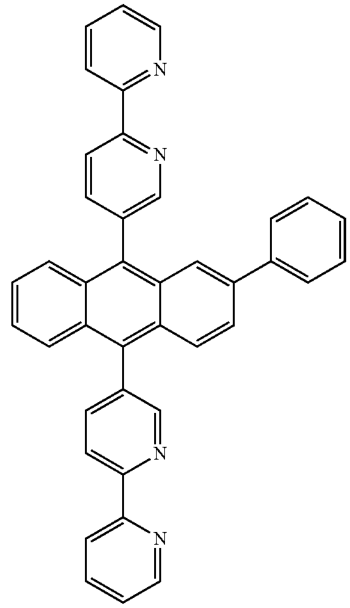

ET3

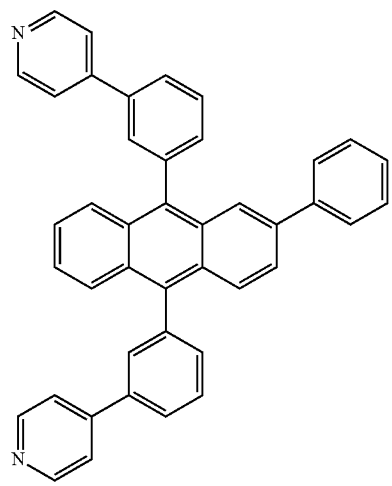

ET4

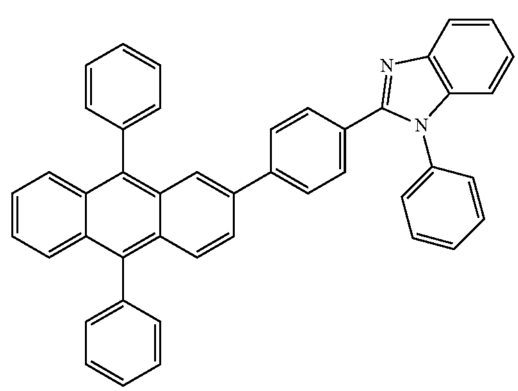

-continued
ET5
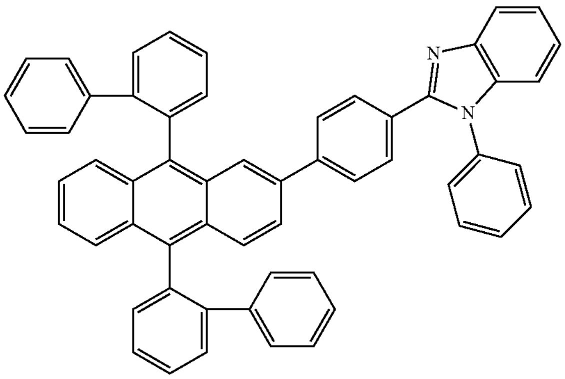
ET6
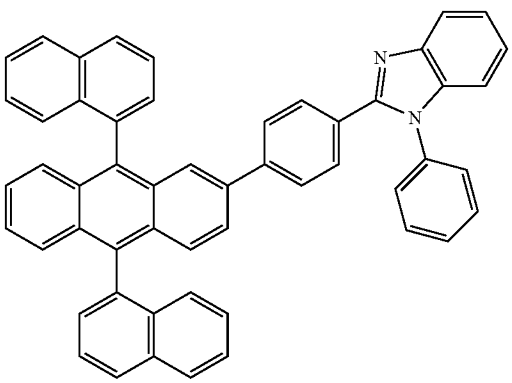
ET7
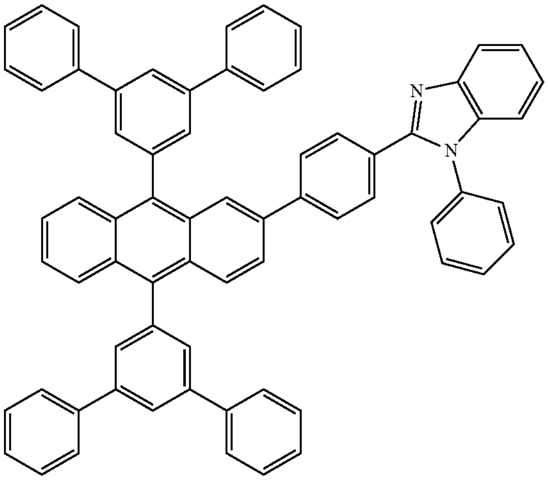
-continued
ET8
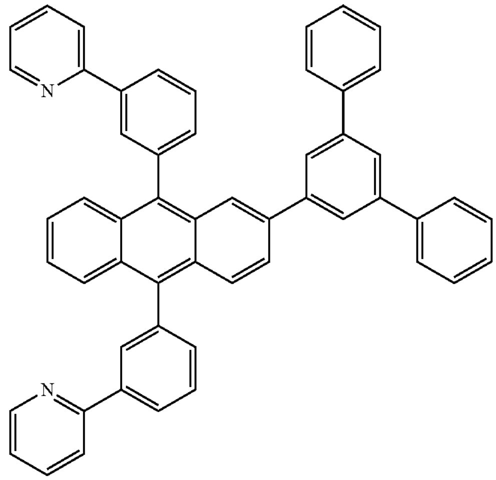
ET9
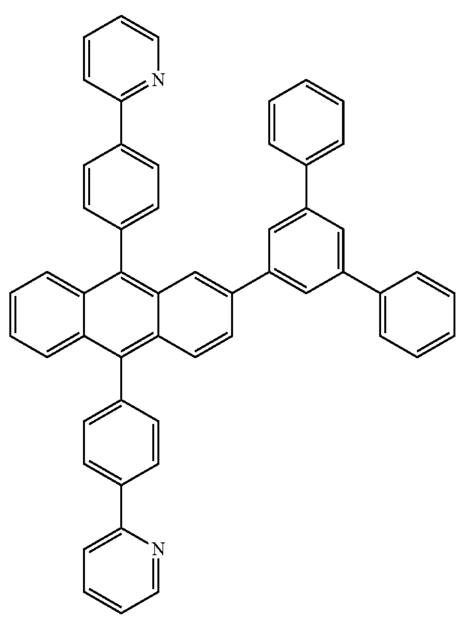

-continued
ET10
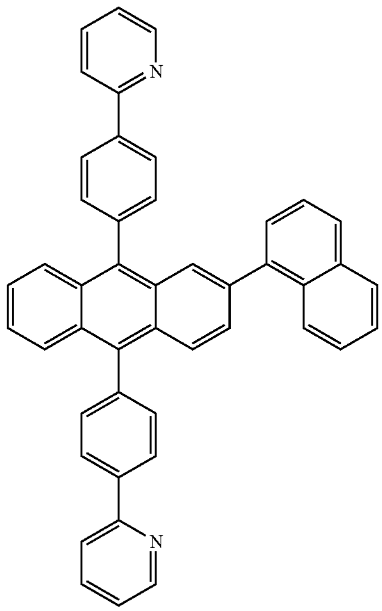
ET11
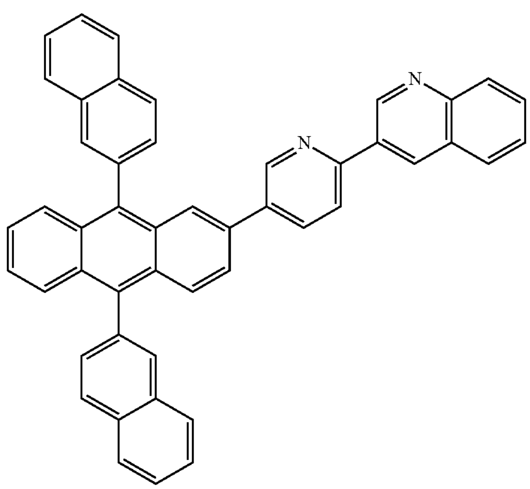
ET12
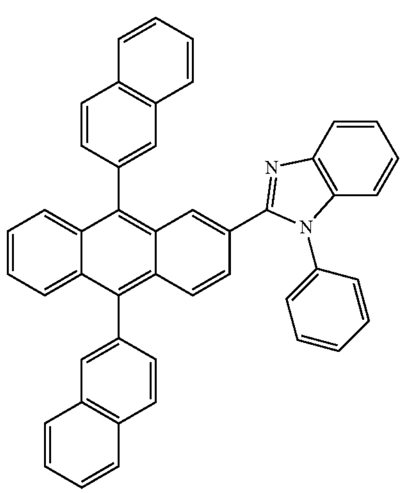
-continued
ET13
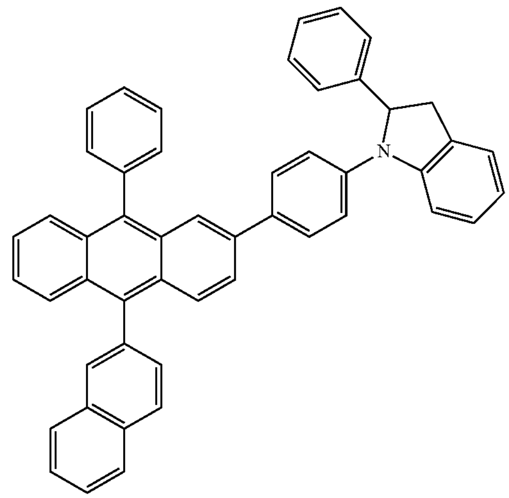
ET14
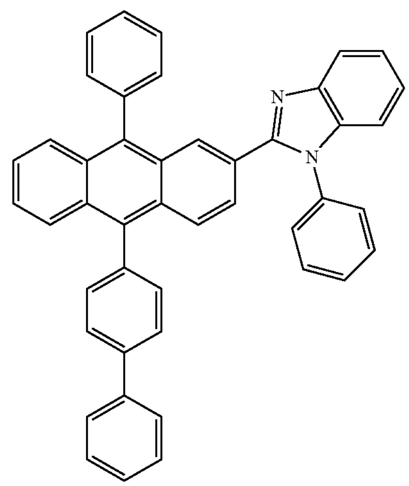
ET15
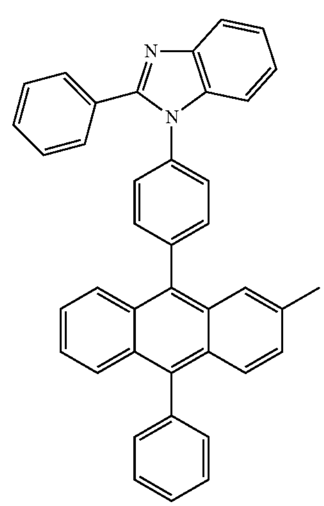

-continued
ET16
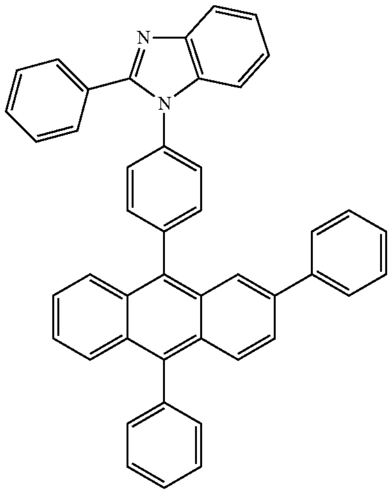
ET17
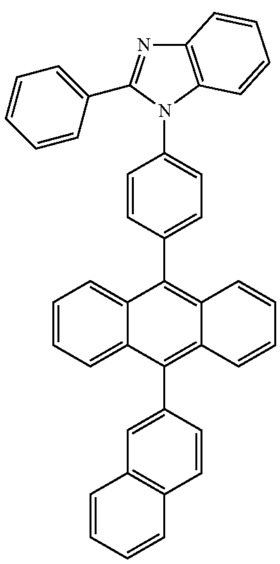
ET18
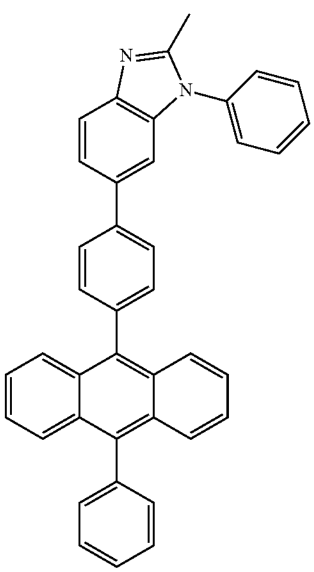
-continued
ET19
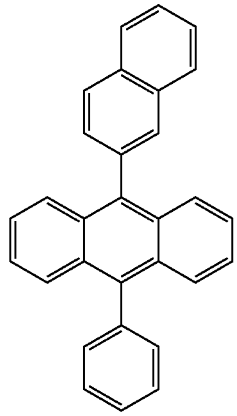
ET20
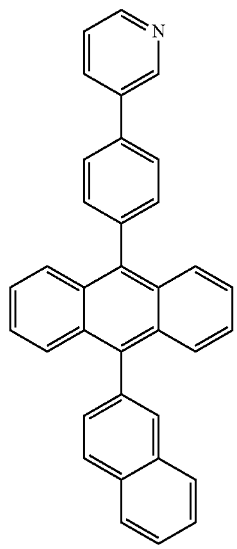
ET21
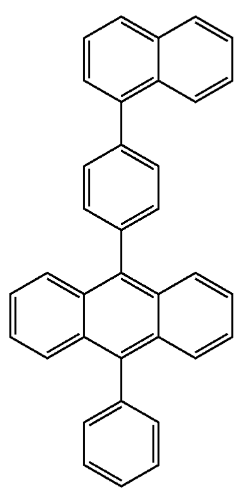

-continued
ET22
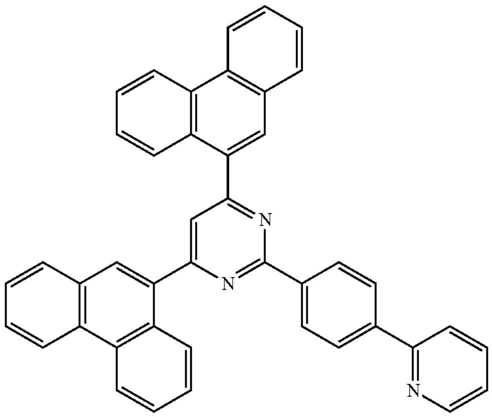
ET23
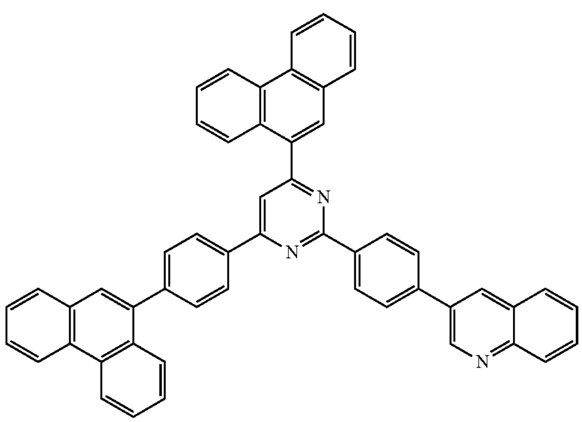
ET24
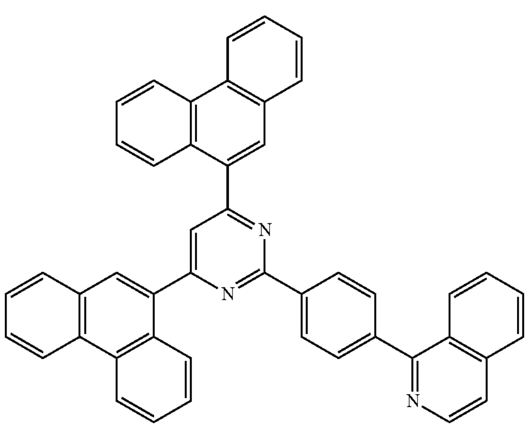
-continued
ET25
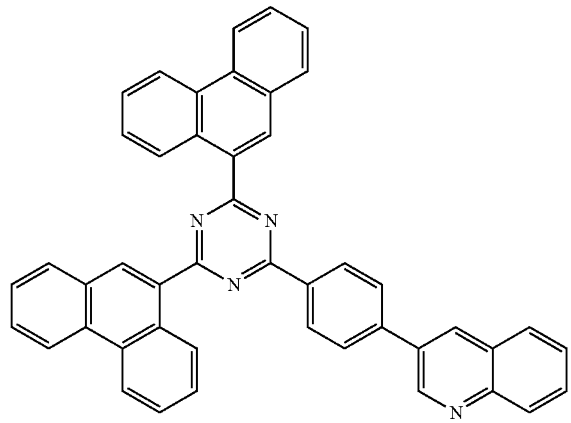
ET26
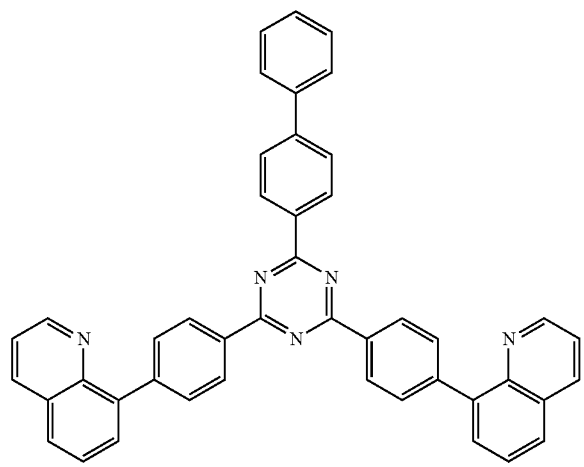
ET27
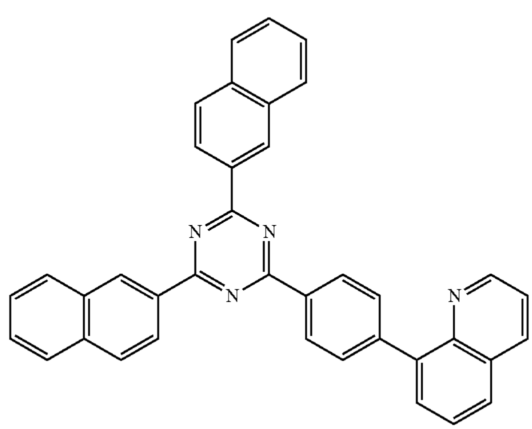

-continued
ET28
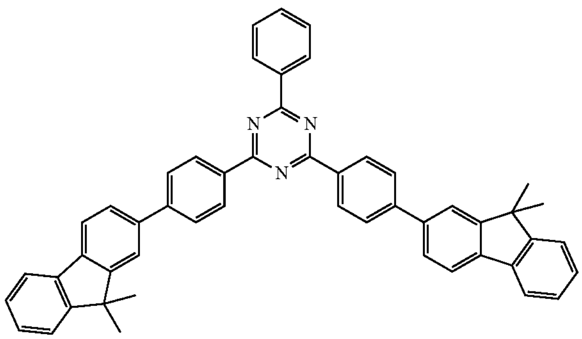
ET29
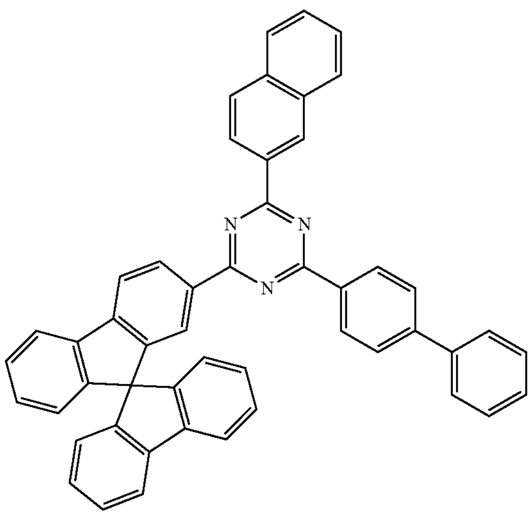
ET30
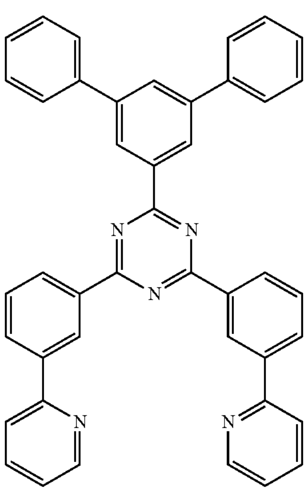
-continued
ET31
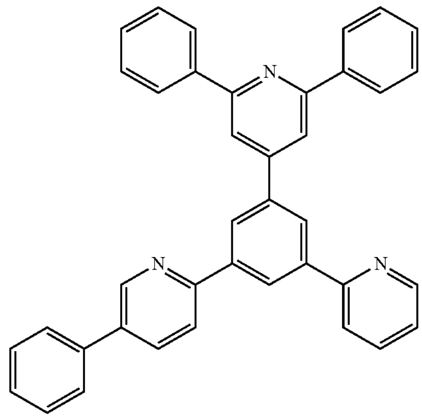
ET32
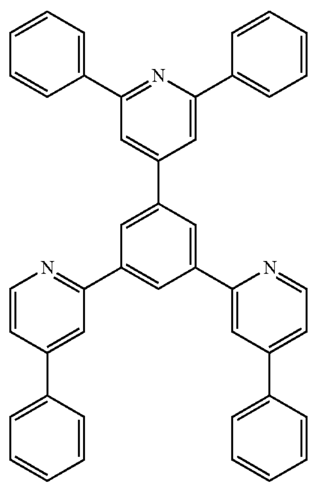
ET33
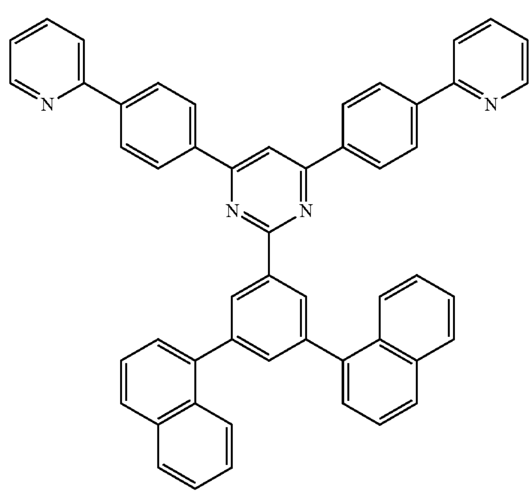

-continued

ET34

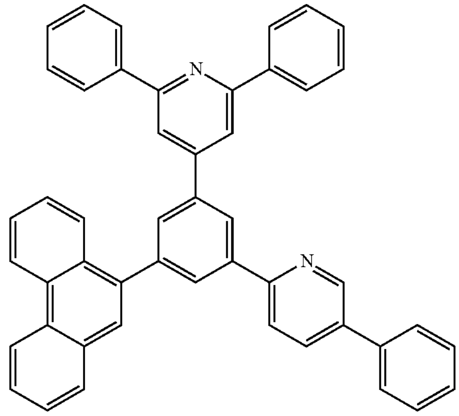

ET35

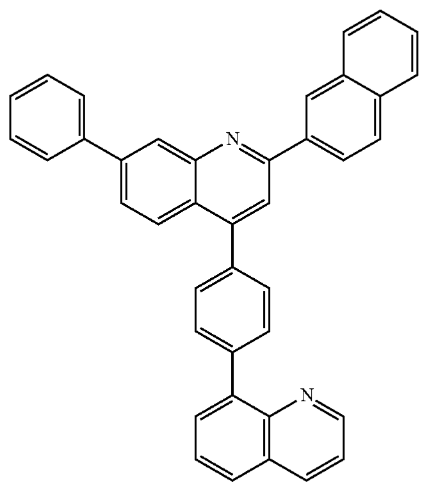

ET36

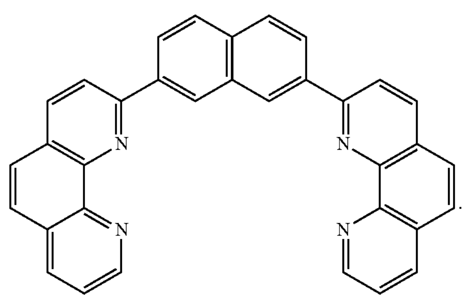

In one or more embodiments, the electron transport region may include at least one compound selected from 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), and NTAZ:

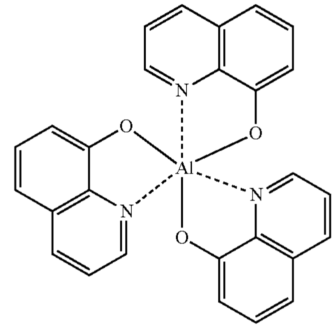

$Alq_3$

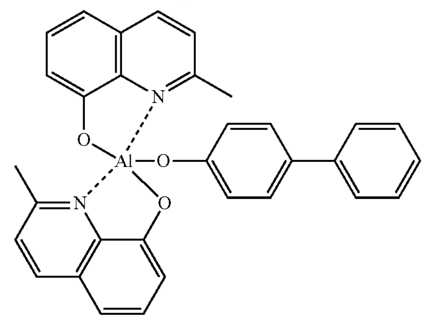

BAlq

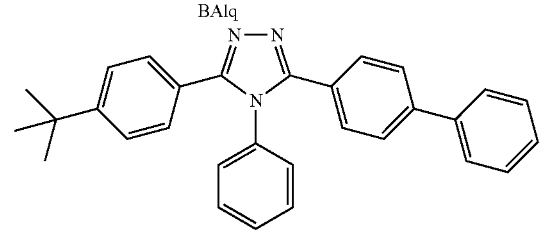

TAZ

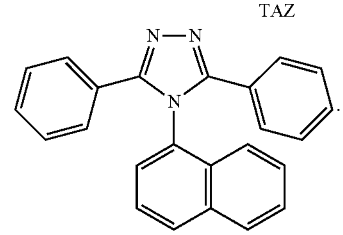

NTAZ

A thickness of the buffer layer, the hole blocking layer, or the electron control layer may each independently be in a range of about 20 Å to about 1,000 Å, for example, about 30 Å to about 300 Å. While not wishing to be bound by a particular theory, it is understood that when the thicknesses of the buffer layer, the hole blocking layer, and the electron control layer are within these ranges, the electron blocking layer may have excellent hole blocking characteristics or electron control characteristics without a substantial increase in driving voltage.

A thickness of the electron transport layer may be in a range of about 100 Å to about 1,000 Å, for example, about 150 Å to about 500 Å. While not wishing to be bound by a particular theory, it is understood that when the thickness of the electron transport layer is within the range described above, the electron transport layer may have satisfactory electron transport characteristics without a substantial increase in driving voltage.

The electron transport region 17 (for example, the electron transport layer in the electron transport region) may further include, in addition to the materials described above, a metal-containing material.

The metal-containing material may include at least one selected from alkali metal complex and alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium 8-hydroxyquinolate, LiQ) or ET-D2:

ET-D1

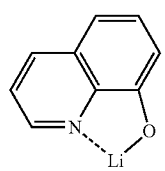

ET-D2

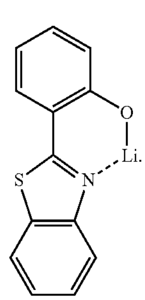

The electron transport region 17 may include an electron injection layer that facilitates injection of electrons from the second electrode 19. The electron injection layer may directly contact the second electrode 19.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be selected from Li, a Na, K, Rb, and Cs. In an embodiment, the alkali metal may be Li, a Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, or Kl. In an embodiment, the alkali metal compound may be selected from LiF, $Li_2O$, a NaF, LiI, a NaI, CsI, and Kl, but embodiments of the present disclosure are not limited thereto.

The alkaline earth-metal compound may be selected from alkaline earth-metal oxides, such as BaO, SrO, CaO, $Ba_xSr_{1-x}O$ ($0<x<1$), or $Ba_xCa_{1-x}O$ ($0<x<1$). In an embodiment, the alkaline earth-metal compound may be selected from BaO, SrO, and CaO, but embodiments of the present disclosure are not limited thereto.

The rare earth metal compound may be selected from $YbF_3$, $ScF_3$, $ScO_3$, $Y_2O_3$, $Ce_2O_3$, $GdF_3$, and $TbF_3$. In an embodiment, the rare earth metal compound may be selected from $YbF_3$, $ScF_3$, $TbF_3$, $Ybl_3$, $Scl_3$, and $Tbl_3$, but embodiments of the present disclosure are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. While not wishing to be bound by a particular theory, it is understood that when the thickness of the electron injection layer is within the range described above, the electron injection layer may have satisfactory electron injection characteristics without a substantial increase in driving voltage.

Second Electrode 19

The second electrode 19 may be disposed on the organic layer 10A having such a structure. The second electrode 19 may be a cathode that is an electron injection electrode, and in this regard, a material for forming the second electrode 19 may be a material having a low work function, and such a material may be metal, alloy, an electrically conductive compound, or a combination thereof.

The second electrode 19 may include at least one selected from lithium (Li), silver (Si), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 19 may be a transmissive electrode, a semi-transmissive electrode, or a reflective electrode.

The second electrode 19 may have a single-layered structure, or a multi-layered structure including two or more layers.

Figure 6:
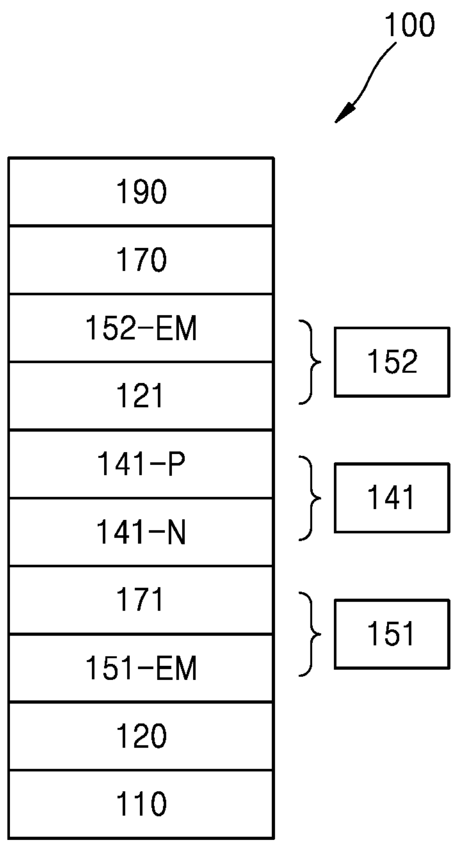
FIG. 6 is a schematic view of an organic light-emitting device 100 according to an embodiment.

Description of FIG. 6

FIG. 6 is a schematic view of an organic light-emitting device 100 according to an embodiment.

The organic light-emitting device 100 of FIG. 6 includes a first electrode 110, a second electrode 190 facing the first electrode 110, and a first light-emitting unit 151 and a second light-emitting unit 152 disposed between the first electrode 100 and the second electrode 190. A charge-generation layer 141 may be disposed between the first light-emitting unit 151 and the second light-emitting unit 152, and the charge-generation layer 141 may include an n-type charge-generation layer 141-N and a p-type charge-generation layer 141-P. The charge-generation layer 141 is a layer serving to generate charges and supply the generated charges to the neighboring light-emitting unit, and may include a known material.

The first light-emitting unit 151 may include a first emission layer 151-EM, and the second light-emitting unit 152 may include a second emission layer 152-EM. A maximum emission wavelength of light emitted by the first light-emitting unit 151 may be different from a maximum emission wavelength of light emitted by the second light-emitting unit 152. For example, mixed light of the light emitted by the first light-emitting unit 151 and the light emitted by the second light-emitting unit 152 may be white light, but embodiments of the present disclosure are not limited thereto.

A hole transport region 120 may be disposed between the first light-emitting unit 151 and the first electrode 110, and the second light-emitting unit 152 may include a first hole transport region 121 disposed toward the first electrode 110.

An electron transport region 170 may be disposed between the second light-emitting unit 152 and the second electrode 190, and the first light-emitting unit 151 may include a first electron transport region 171 disposed between the charge-generation layer 141 and a first emission layer 151-EM.

The first emission layer 151-EM may include an electron transport host, a hole transport host, and a dopant, the dopant may include an organometallic compound, the organometallic compound may not include iridium, and the organic light-emitting device 100 may satisfy a condition of LUMO(dopant)−LUMO(host-E)≥0.15 eV and LUMO(host-E)−HOMO(host-H)>T1(dopant). Here, LUMO(dopant) indicates a LUMO energy level (eV) of a dopant in the first emission layer 151-EM, LUMO(host-E) indicates a LUMO energy level (eV) of an electron transport host in the first emission layer 151-EM, HOMO(host-H) indicates a HOMO energy level (eV) of a hole transport host in the first emission layer 151-EM, and T1(dopant) indicates a triplet energy level (eV) of a dopant in the first emission layer 151-EM. The meaning and the measurements of the parameters are the same as described above.

A second emission layer 152-EM may include an electron transport host, a hole transport host, and a dopant, the dopant may include an organometallic compound, wherein the organometallic compound may not include iridium, and the organic light-emitting device 100 may satisfy a condition of LUMO(dopant)−LUMO(host-E)≥0.15 eV and LUMO(host-E)−HOMO(host-H)>T1(dopant). Here, LUMO(dopant) indicates a LUMO energy level (eV) of a dopant in the second emission layer 152-EM, LUMO(host-E) indicates a LUMO energy level (eV) of an electron transport host in the second emission layer 152-EM, HOMO(host-H) indicates a HOMO energy level (eV) of a hole transport host in the second emission layer 152-EM, and T1(dopant) indicates a triplet energy level (eV) of a dopant in the second emission layer 152-EM. The meaning and the measurements of the parameters are the same as described above.

As described above, the first emission layer 151-EM and the second emission layer 152-EM of the organic light-emitting device 100 may each include an iridium-free organometallic compound. When the condition of LUMO(dopant)−LUMO(host-E)≥0.15 eV and LUMO(host-E)−HOMO(host-H)>T1(dopant) is satisfied, the dopant in the first emission layer 151-EM and the second emission layer 152-EM is less likely to be anionized, and even if the dopant in the first emission layer 151-EM and the second emission layer 152-EM is cationized, the dopant may have sufficiently high decomposition energy, and accordingly, the dopant in the first emission layer 151-EM and the second emission layer 152-EM may be substantially prevented from being decomposed due to charges and/or excitons. In this regard, the organic light-emitting device 100 may be prevented from deterioration, resulting in high efficiency, high luminance, low roll-off ratios, and/or long lifespan.

In FIG. 6, the first electrode 110 and the second electrode 190 are each the same as described in connection with the first electrode 11 and the second electrode 19 of FIG. 1.

In FIG. 6, the first emission layer 151-EM and the second emission layer 152-EM are each the same as described in connection with the emission layer 15 of FIG. 1.

In FIG. 6, the hole transport region 120 and the first hole transport region 121 are each the same as described in connection with the hole transport region 12 of FIG. 1.

In FIG. 6, the electron transport region 170 and the first electron transport region 171 are each the same as described in connection with the electron transport region 17 of FIG. 1.

Hereinabove, referring to FIG. 6, the organic light-emitting device 100 in which the first light-emitting unit 151 and the second light-emitting unit 152 both satisfy a condition of LUMO(dopant)−LUMO(host-E)≥0.15 eV and LUMO(host-E)−HOMO(host-H)>T1(dopant), wherein the dopant includes an iridium-free organometallic compound has been described. However, the organic light-emitting device of FIG. 6 may be subjected to various modifications that at least one of the first light-emitting unit 151 and the second light-emitting unit 152 of the organic light-emitting device of FIG. 6 may be replaced by a random light-emitting unit, or that three or more light-emitting units may be included.

Figure 7:
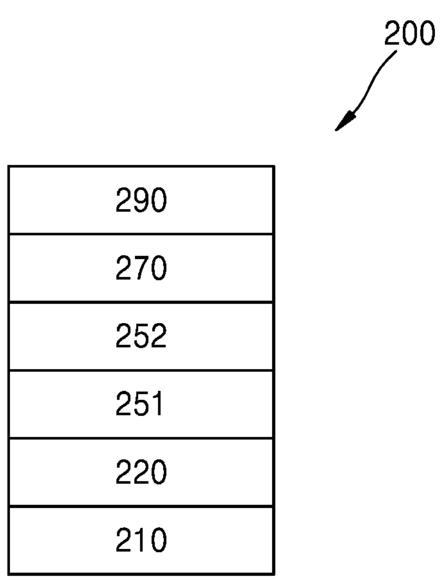
FIG. 7 is a schematic view of an organic light-emitting device 200 according to an embodiment.

Description of FIG. 7

FIG. 7 is a schematic view of an organic light-emitting device 200 according to an embodiment.

The organic light-emitting device 200 includes a first electrode 210, a second electrode 290 facing the first electrode 210, and a first emission layer 251 and a second emission layer 252 that are stacked between the first electrode 210 and the second electrode 290.

A maximum emission wavelength of light emitted by the first emission layer 251 may be different from a maximum emission wavelength of light emitted by the second emission layer 252. For example, mixed light of the light emitted by the first emission layer 251 and the light emitted by the second emission layer 252 may be white light, but embodiments of the present disclosure are not limited thereto.

In an embodiment, a hole transport region 220 may be disposed between the first emission layer 251 and the first electrode 210, and an electron transport region 270 may be disposed between the second emission layer 252 and the second electrode 290.

The first emission layer 25 may include an electron transport host, a hole transport host, and a dopant, the dopant may include an organometallic compound, and the organometallic compound may not include iridium, and the organic light-emitting device 200 may satisfy a condition of LUMO(dopant)−LUMO(host-E)≥0.15 eV and LUMO(host-E)−HOMO(host-H)>T1(dopant). Here, LUMO(dopant) indicates a LUMO energy level (eV) of a dopant in the first emission layer 251, LUMO(host-E) indicates a LUMO energy level (eV) of an electron transport host in the first emission layer 251, HOMO(host-H) indicates a HOMO energy level (eV) of a hole transport host in the first emission layer 251, and T1(dopant) indicates a triplet energy level (eV) of a dopant in the first emission layer 251. The meaning and the measurements of the parameters are the same as described above.

The second emission layer 252 may include an electron transport host, a hole transport host, and a dopant, the dopant may include an organometallic compound, and the organometallic compound may not include iridium, and the organic light-emitting device 200 may satisfy a condition of LUMO(dopant)−LUMO(host-E)≥0.15 eV and LUMO(host-E)−HOMO(host-H)>T1(dopant). Here, LUMO(dopant) indicates a LUMO energy level (eV) of a dopant in the second emission layer 252, LUMO(host-E) indicates a LUMO energy level (eV) of an electron transport host in the second emission layer 252, HOMO(host-H) indicates a HOMO energy level (eV) of a hole transport host in the second emission layer 252, and T1(dopant) indicates a triplet energy level (eV) of a dopant in the second emission layer 252. The meaning and the measurements of the parameters are the same as described above.

As described above, the first emission layer 251 and the second emission layer 252 of the organic light-emitting device 200 may each include an iridium-free organometallic compound. By satisfying the condition of LUMO(dopant)−LUMO(host-E)≥0.15 eV and LUMO(host-E)−HOMO(host-H)>T1(dopant), the dopant in the first emission layer 251 and the second emission layer 252 is less likely to be anionized, and even if the dopant in the first emission layer 251 and the second emission layer 252 is cationized, the dopant may have sufficiently high decomposition energy, accordingly, the dopant in the first emission layer 251 and the second emission layer 252 may be substantially prevented from being decomposed due to charges and/or excitons. In this regard, the organic light-emitting device 200 may be prevented from deterioration, resulting in high efficiency, high luminance, low roll-off ratios, and/or long lifespan.

In FIG. 7, the first electrode 210, the hole transport region 220, and the second electrode 290 are each the same as described in connection with the first electrode 11, the hole transport region 12, and the second electrode 19 of FIG. 1.

In FIG. 7, the first emission layer 251 and the second emission layer 252 are each the same as described in connection with the emission layer 15 of FIG. 1.

In FIG. 7, the electron transport region 270 is the same as described in connection with the electron transport region 17 of FIG. 1.

Hereinabove, referring to FIG. 7, the organic light-emitting device 200 in which the first emission layer 251 and the second emission layer 252 both satisfy a condition of LUMO(dopant)−LUMO(host-E)≥0.15 eV and LUMO(host-E)−HOMO(host-H)>T1(dopant), wherein the dopant includes an iridium-free organometallic compound has been described. However, the organic light-emitting device of FIG. 7 may be subjected to various modifications that one of the first emission layer 251 and the second emission layer 252 may be replaced by a known layer, that three or more emission layers may be included, or that an intermediate layer may be further disposed between neighboring layers of the emission layer.

Description of Terms

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by $-OA_{101}$ (wherein $A_{101}$ is the $C_1$-$C_{60}$ alkyl group), and non-limiting examples thereof include a methoxy group, an ethoxy group, and an isopropyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a heterocyclic aromatic system having 6 to 60 carbon atoms, and the term "$C_6$-$C_{60}$ arylene group" as used herein refers to a divalent group having a heterocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), and a $C_6$-$C_{60}$ arylthio group as used herein indicates —$SA_{103}$ (wherein $A_{103}$ is the $C_6$-$C_{60}$ aryl group), and the term "$C_7$-$C_{60}$ arylalkyl group" as used herein indicates -$A_{104}A_{105}$ (wherein $A_{104}$ is the $C_6$-$C_{59}$ aryl group and $A_{105}$ is the $C_1$-$C_{53}$ alkyl group).

The term "$C_2$-$C_{60}$ heteroaryloxy group" as used herein refers to —$OA_{106}$ (wherein $A_{106}$ is the $C_2$-$C_{60}$ heteroaryl group), and the term "$C_2$-$C_{60}$ heteroarylthio group" as used herein indicates —$SA_{107}$ (wherein $A_{107}$ is the $C_2$-$C_{60}$ heteroaryl group).

The term "$C_3$-$C_{60}$ heteroarylalkyl group" as used herein refers to -$A_{108}A_{109}$ ($A_{109}$ is a $C_2$-$C_{59}$ heteroaryl group, and $A_{108}$ is a $C_1$-$C_{58}$ alkylene group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_1$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_2$-$C_{60}$ heteroaryloxy group, the substituted $C_2$-$C_{60}$ heteroarylthio group, the substituted $C_3$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(═O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(═O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(═O)($Q_{38}$)($Q_{39}$), wherein $Q_1$ to $Q_9$, $Q_{11}$ to $Q_{19}$, $Q_{21}$ to $Q_{29}$ and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a, $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$—$C_{60}$ arylalkyl group, a $C_1$-$C_{60}$ heteroaryl group, a $C_2$-$C_{60}$ heteroaryloxy group, a $O_2$—$C_{60}$ heteroarylthio group, a $C_3$-$C_{60}$ heteroarylalkyl group, a monovalent non-aromatic condensed polycyclic group, and a monovalent non-aromatic condensed heteropolycyclic group.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{30}$ alkyl" refers to a $C_1$-$C_{30}$ alkyl group substituted with $C_6$-$C_{30}$ aryl group, the total number of carbon atoms in the resulting aryl substituted alkyl group is $C_7$-$C_{60}$.

The terms "a biphenyl group, a terphenyl group, and a tetraphenyl group" as used herein each refer to a monovalent group having two, three, or four phenyl groups linked via a single bond.

The terms "a phenyl group containing a cyano group, a biphenyl group containing a cyano group, a terphenyl group containing a cyano group, and a tetraphenyl group containing a cyano group" as used herein each refer to a phenyl group, a biphenyl group, a terphenyl group, and a tetraphenyl group, each substituted with at least one cyano group. In "a phenyl group containing a cyano group, a biphenyl group containing a cyano group, a terphenyl group containing a cyano group, and a tetraphenyl group containing a cyano group", a cyano group may be substituted at a random position of the phenyl group, and "a phenyl group containing a cyano group, a biphenyl group containing a cyano group, a terphenyl group containing a cyano group, and a tetraphenyl group containing a cyano group" may further include a substituent in addition to a cyano group. For example, 'a phenyl group substituted with a cyano group' and 'a phenyl group substituted with a methyl group' all belong to "a phenyl group containing a cyano group".

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1: Synthesis of Compound 3-170

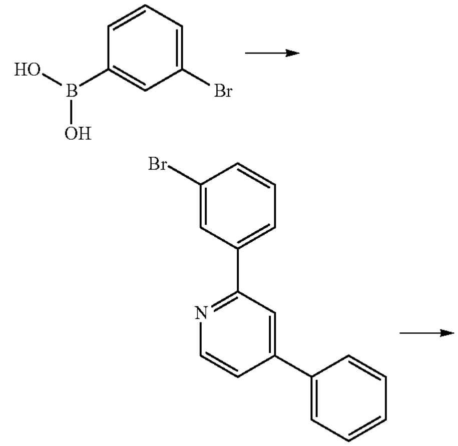

A

-continued

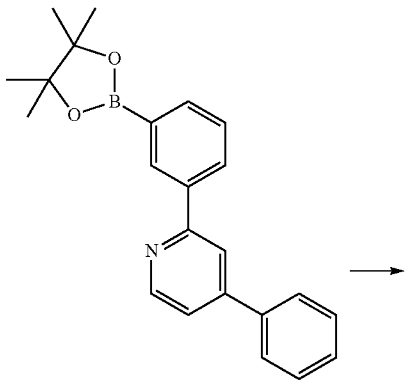

B

-continued

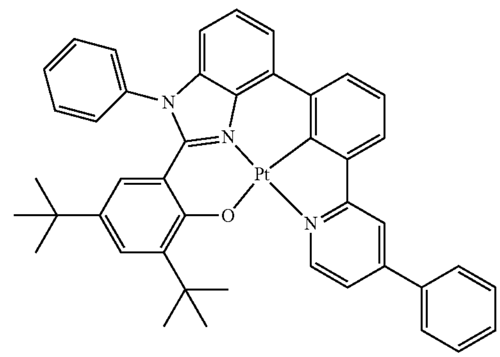

3-170

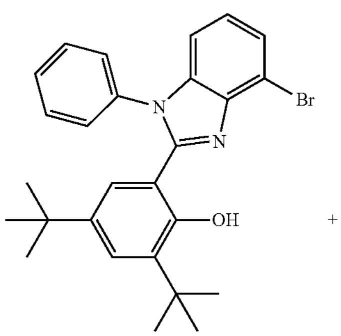

C

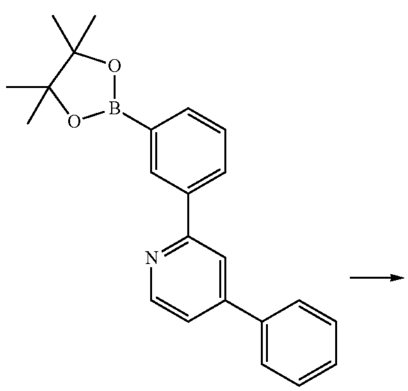

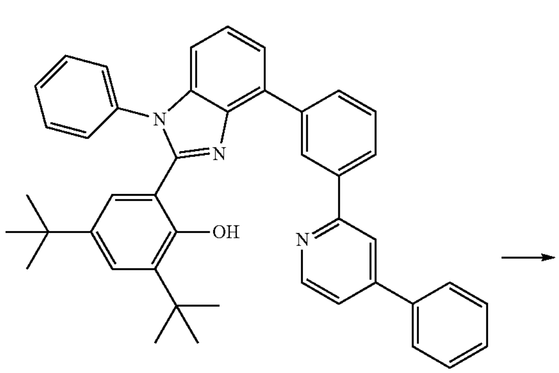

D

Synthesis of Intermediate A (2-(3-bromophenyl)-4-phenylpyridine)

3 grams (g) (13 millimoles, mmol) of 2-bromo-4-phenylpyridine, 3.1 g (1.2 equivalents, equiv.) of (3-bromophenyl)boronic acid, 1.1 g (0.9 mmol, 0.07 equiv.) of tetrakis (triphenylphosphine)palladium(0), and 3.4 g (32 mmol, 3 equiv.) of sodium carbonate were mixed with 49 milliliters (mL) (0.6 molar, M) of a solvent in which tetrahydrofuran (THF) and distilled water ($H_2O$) were mixed at a volume ratio of 3:1, The reaction mixture was then refluxed for 12 hours. The reaction product obtained therefrom was cooled to room temperature, and the precipitate was filtered to obtain a filtrate. The filtrate was washed with ethyl acetate (EA)/$H_2O$, and the crude product was purified by column chromatography (while increasing a rate of MC(methylene chloride)/Hex(hexane) to between 25% and 50%) to obtain 3.2 g (yield: 80%) of Intermediate A. The obtained compound was identified by mass spectroscopy and HPLC analysis.

HRMS (MALDI) calcd for $C_{17}H_{12}BrN$: m/z 309.0153, Found: 309.0155.

Synthesis of Intermediate B (4-phenyl-2-(3-(4,4,5,5-tetramethyl-1,3,2-dioxaborolan-2-yl)phenyl)pyridine)

3.2 g (0.01 mmol) of Intermediate A and 3.9 g (0.015 mol, 1.5 equiv.) of bispinacolatodiboron were added to a flask. 2.0 g (0.021 mol, 2 equiv.) of potassium acetate, 0.42 g (0.05 equiv.) of $PdCl_2$(dppf), and 34 mL of toluene were added thereto. The resultant mixture was then refluxed at a temperature of 100° C. overnight. The reaction product obtained therefrom was cooled to room temperature, and the precipitate was filtered therefrom to obtain a filtrate. The filtrate was washed with EA/$H_2O$, and the crude product was purified by column chromatography to obtain 2.4 g (yield: 65%) of Intermediate B. The obtained compound was identified by mass spectroscopy and HPLC analysis.

HRMS (MALDI) calcd for $C_{23}H_{24}BNO_2$: m/Z 357.1900, Found: 357.1902.

Synthesis of Intermediate D (2,4-di-tert-butyl-6-(1-phenyl-4-(3-(4-phenylpyridin-2-yl)phenyl)-1H-benzo[d]imidazol-2-yl)phenol)

2.7 g (0.006 mol, 1 equiv.) of Intermediate C (2-(4-bromo-1-phenyl-1H-benzo[d]imidazol-2-yl)-4,6-di-tert-butylphenol), 2.4 g (0.007 mol, 1.2 equiv.) of Intermediate B, 0.39 g (0.001 mol, 0.07 equiv.) of tetrakis(triphenylphosphine) palladium(0), and 2.0 g (0.017 mol, 3 equiv.) of potassium carbonate were mixed with 20 mL of a solvent, in which THF and distilled water ($H_2O$) were mixed at a volume ratio of 3:1, and the mixture was refluxed for 12 hours. The reaction product obtained therefrom was cooled to room temperature, and the precipitate was filtered therefrom to obtain a filtrate. The filtrate was then washed with EA/$H_2O$, and the crude product was purified by column chromatography (while increasing a rate of EA/Hex to between 20% and 35%) to obtain 2.4 g (yield: 70%) of Intermediate D. The obtained compound was identified by mass spectroscopy and HPLC analysis, HRMS (MALDI) calcd for $C_{44}H_{41}BN_3O$: m/z 627.3250, Found: 627.3253.

Synthesis of Compound 3-170

2.4 g (3.82 mmol) of Intermediate D and 1.9 g (4.6 mmol, 1.2 equiv.) of $K_2PtCl_4$ were mixed with 55 mL of a solvent in which 50 mL of AcOH and 5 mL of $H_2O$ were mixed, and the mixture was refluxed for 16 hours. The reaction product obtained therefrom was cooled to room temperature, and the precipitate was filtered therefrom. The precipitate was dissolved again in MC and washed with $H_2O$. The crude product was purified by column chromatography (MC 40%, EA 1%, Hex 59%) to obtain 1.2 g (purity: 99% or more) of Compound 3-170 (actual synthesis yield: 70%). The obtained compound was identified by mass spectroscopy and HPLC analysis.

HRMS (MALDI) calcd for $C_{44}H_{39}N_3OPt$: m/z 820.2741, Found: 820.2744.

Evaluation Example 1

LUMO energy levels, HOMO energy levels, and/or $T_1$ energy levels of the following Compounds of Table 2 were evaluated by the methods shown in Table 1, and the results are shown in Table 2.

TABLE 1

| | |
|---|---|
| LUMO energy level evaluation method | 1) A potential (volts, V)-current (milliamperes, mA) graph of each compound is obtained using differential pulse voltammetry (DPV) (electrolyte: 0.1M $Bu_4NPF_6$ in dimethylformamide, pulse height: 50 millivolts (mV), pulse width: 1 sec, step height: 10 mV, step width: 2 seconds (sec), scan rate: 5 millivolts per second (mV/sec), reference electrode: Ag/$AgNO_3$), to evaluate a reduction peak potential of the graph, i.e., $E_{peak}$ (electron volts, eV)] (when a LUMO energy range is beyond a solvent widow, measurement is made after changing a solvent)<br>2) $E_{peak}$ (eV) is applied to an equation of LUMO (eV) = −4.8 − ($E_{peak}$ − $E_{peak}$ (Ferrocene)) to evaluate a LUMO energy level (eV) of each compound |
| HOMO energy level evaluation method | 1) A potential (V)-current (mA) graph of each compound is obtained using differential pulse voltammetry (DPV) (electrolyte: 0.1M $Bu_4NPF_6$ in MC, pulse height: 50 mV, pulse width: 1 sec, step height: 10 mV, step width: 2 sec, scan rate: 5 mV/sec, reference electrode: Ag/$AgNO_3$), to evaluate an oxidation peak potential of the graph, i.e., $E_{peak}$ (eV) (when a HOMO energy range is beyond a solvent widow, measurement is made after changing a solvent)<br>2) $E_{peak}$ (eV) is applied to an equation of HOMO (eV) = −4.8 − ($E_{peak}$ − $E_{peak}$ (Ferrocene)), to evaluate a HOMO energy level (eV) of each compound |
| $T_1$ energy level evaluation method | A mixture of 2-MeTHF and each compound (each compound is dissolved in 3 mL of 2-MeTHF to have a concentration of the compound of 10 micromolar, μM) is added to a quartz cell, and a cryostat (Oxford, DN) containing liquid nitrogen (77 Kelvins, K) is added thereto to measure a phosphorescence spectrum using an emission measuring device (PTI, Quanta Master 400), and a triplet energy level of the compound is calculated by a peak wavelength of the phosphorescence spectrum |

TABLE 2

| | Compound | Actual measurement value of LUMO energy level (eV) | Actual measurement value of HOMO energy level (eV) | Actual measurement value of $T_1$ energy level (eV) |
|---|---|---|---|---|
| Electron transport host | H-E2 | −2.77 | — | — |
| | H-E3 | −2.81 | — | — |
| | H-E4 | −2.91 | — | — |
| | H-EA | −2.70 | — | — |
| | H-EB | −2.80 | — | — |
| Hole transport host | H-H1 | −2.1 | −5.4 | — |
| | H-HA | −2.20 | −5.54 | — |
| | H-HB | −2.10 | −5.30 | — |
| Pt dopant | 3-170 | −2.61 | −5.42 | 2.45 |
| | Pt1 | −2.50 | −5.5 | 2.6 |
| Ir dopant | $Ir(ppy)_3$ | −2.2 | −5.2 | 2.55 |

TABLE 2-continued

| Compound | Actual measurement value of LUMO energy level (eV) | Actual measurement value of HOMO energy level (eV) | Actual measurement value of $T_1$ energy level (eV) |
|---|---|---|---|
| 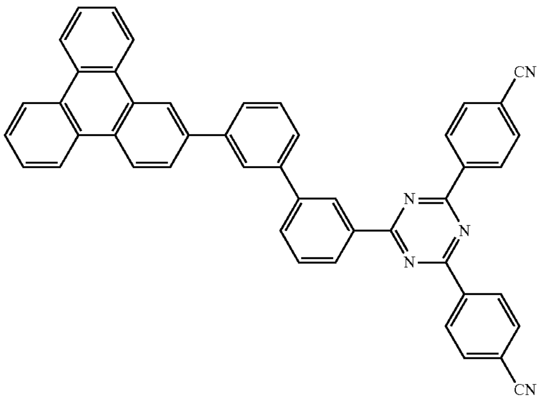 H-E2 | | | |
| 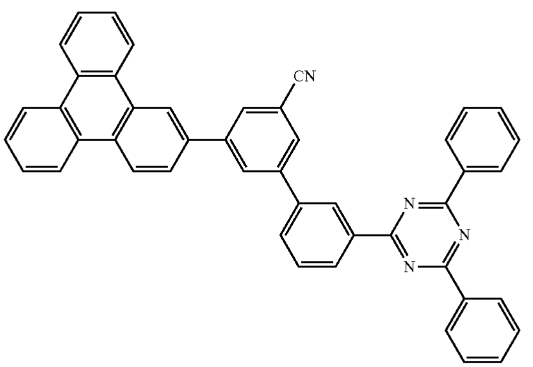 H-E3 | | | |
| 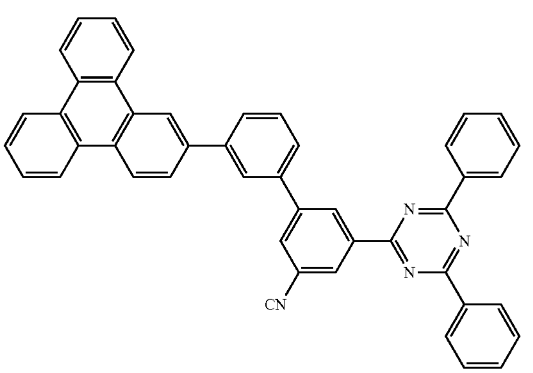 H-E2 | | | |

TABLE 2-continued

| Compound | Actual measurement value of LUMO energy level (eV) | Actual measurement value of HOMO energy level (eV) | Actual measurement value of $T_1$ energy level (eV) |
|---|---|---|---|
| 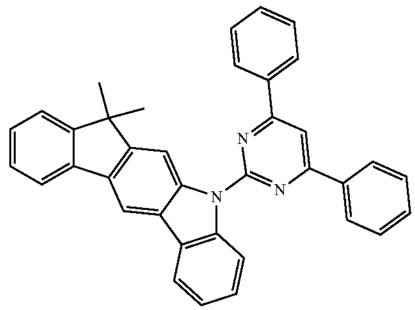 H-EA | | | |
| 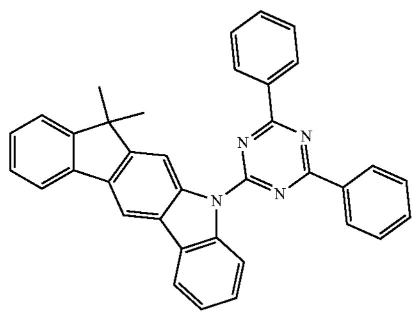 H-EB | | | |
| 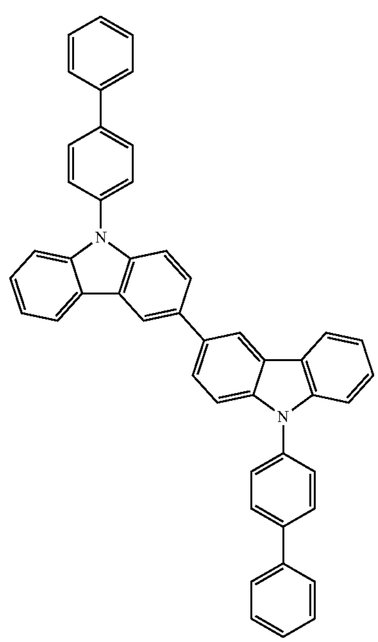 H-H1 | | | |

TABLE 2-continued

| Compound | Actual measurement value of LUMO energy level (eV) | Actual measurement value of HOMO energy level (eV) | Actual measurement value of $T_1$ energy level (eV) |
|---|---|---|---|
| 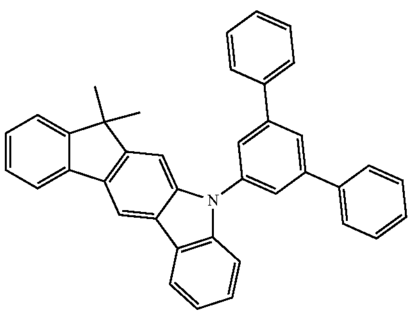 H-HA | | | |
| 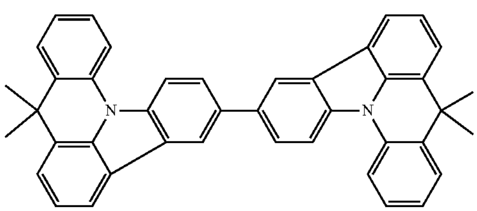 H-HB | | | |
| 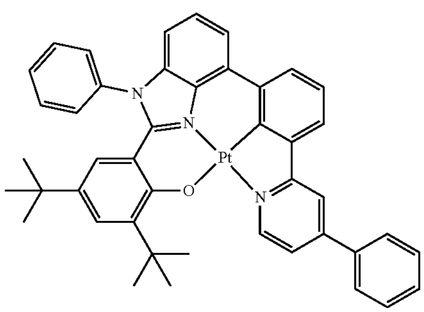 3-170 | | | |
| 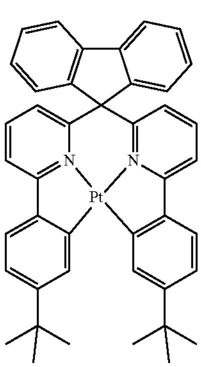 Pt1 | | | |

TABLE 2-continued

| Compound | Actual measurement value of LUMO energy level (eV) | Actual measurement value of HOMO energy level (eV) | Actual measurement value of $T_1$ energy level (eV) |
|---|---|---|---|
| 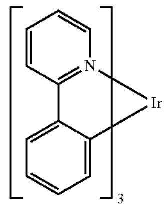 $Ir(ppy)_3$ | | | |

Example 1

An ITO glass substrate was cut to a size of 50 mm×50 mm×0.5 mm (mm=millimeters), sonicated with acetone, iso-propyl alcohol, and pure water each for 15 minutes, and then cleaned by exposure to ultraviolet (UV) rays and ozone for 30 minutes.

Then, F6-TCNNQ was deposited on an ITO electrode (anode) of the ITO glass substrate to form a hole injection layer having a thickness of 100 Å, and HT1 was deposited on the hole injection layer to form a hole transport layer having a thickness of 1,260 Å, thereby forming a hole transport region.

Then, H—H1 (a hole transport host) and H-E2 (an electron transport host), which are served as a host (a weight ratio of the hole transport host to the electron transport host was 5:5), and Compound 3-170 served as a dopant were co-deposited (a weight ratio of the host to the dopant was 90:10) on the hole transport region to form an emission layer having a thickness of 400 Å.

Then, Compound ET1 and Liq were co-deposited at a weight ratio of 5:5 on the emission layer, to form an electron transport layer having a thickness of 360 Å, LiF was deposited on the electron transport layer to form an electron injection layer having a thickness of 5 Å, and Al was vacuum-deposited on the electron injection layer to form a second electrode (cathode) having a thickness of 800 Å, thereby completing the manufacture of an organic light-emitting device having a structure of ITO/F6-TCNNQ (100 Å)/HT1 (1,260 Å)/(H-H1+H-E2): Compound 3-170 (10 wt %) (400 Å)/ET1: Liq (50 wt %) (360 Å)/LiF (5 Å)/Al (800 Å).

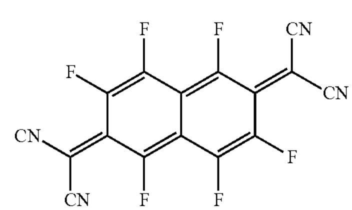

F6—TCNNQ

-continued

HT1

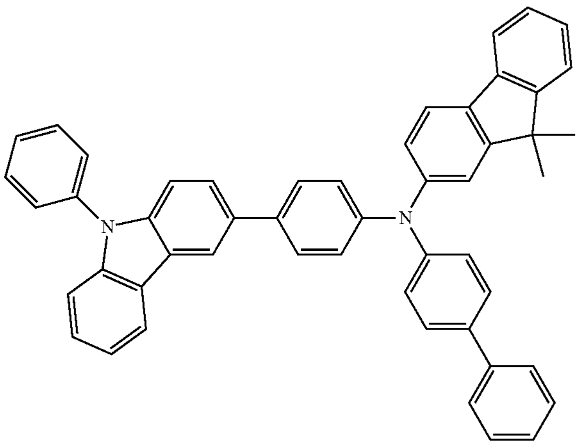

H-H1

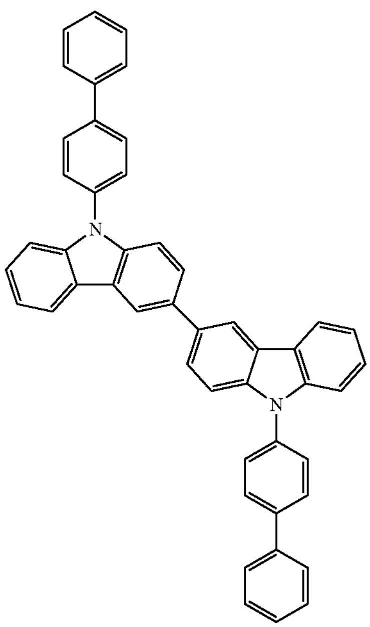

H-E2

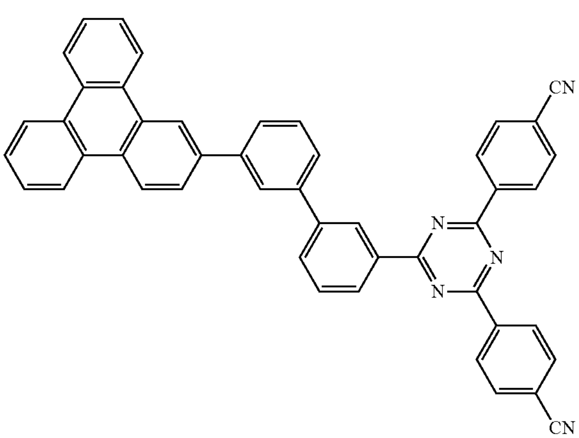

-continued 3-170

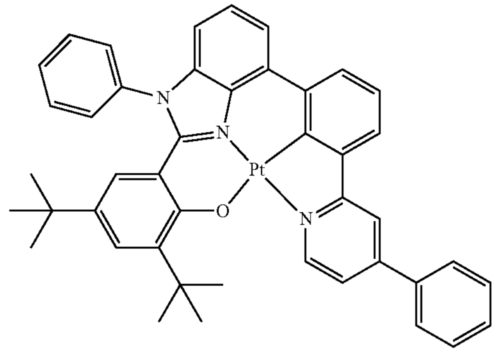

ET1

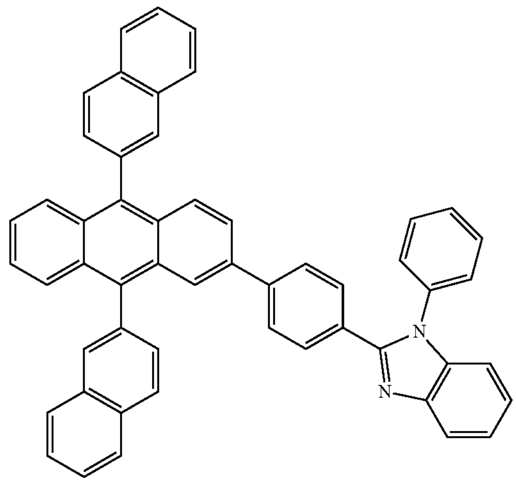

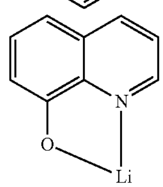

Liq

Examples 2 and 3 and Comparative Examples A and B

Organic light-emitting devices were manufactured in the same manner as in Example 1, except that Compounds shown in Table 3 were each used in forming an emission layer.

Evaluation Example 2

External quantum efficiency (EQE) and lifespan ($T_{95}$) of the organic light-emitting devices manufactured according to Examples 1 to 3 and Comparative Examples A and B were evaluated, and evaluation results are shown in Table 4. The evaluation was performed by using a current-voltage meter (Keithley 2400) and a luminance meter (Minolta Cs-1000A), and lifespan ($T_{95}$) (at 6,000 nit) indicates an amount of time (hours, hr) that lapsed when luminance was 95% of initial luminance (100%).

TABLE 3

| | Electron transport host | Hole transport host | Dopant | LUMO (dopant) − LUMO (host-E) | LUMO (host-E) − HOMO (host-H) | T1 (dopant) |
|---|---|---|---|---|---|---|
| Example 1 | H-E2 | H-H1 | 3-170 | 0.16 | 2.63 | 2.45 |
| Example 2 | H-E3 | H-H1 | 3-170 | 0.2 | 2.59 | 2.45 |
| Example 3 | H-E4 | H-H1 | 3-170 | 0.3 | 2.49 | 2.45 |
| Comparative Example A | H-EA | H-HA | $Ir(ppy)_3$ | 0.5 | 2.84 | 2.55 |
| Comparative Example B | H-EB | H-HB | Pt1 | 0.3 | 2.5 | 2.6 |

TABLE 4

| | Driving voltage (V) | EQE (%) | Lifespan ($T_{95}$) (hr) |
|---|---|---|---|
| Example 1 | 4.0 | 24 | 650 |
| Example 2 | 3.99 | 23.5 | 790 |
| Example 3 | 3.78 | 24 | 1000 |
| Comparative Example A | 4.5 | 18 | 200 |
| Comparative Example B | 5.0 | 10 | 50 |

Referring to Table 4, it was confirmed that the organic light-emitting devices of Examples 1 to 3 had excellent driving voltage, external quantum efficiency and lifespan characteristics compared to those of Comparative Examples A and B.

As described above, the organic light-emitting device that satisfies certain parameters and includes an iridium-free organometallic compound may show excellent driving voltage, external quantum efficiency and lifespan characteristics.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. An organic light-emitting device comprising:

a first electrode, a second electrode facing the first electrode, and an organic layer disposed between the first electrode and the second electrode, wherein the organic layer comprises an emission layer, and the emission layer comprises an electron transport host, a hole transport host, and a dopant, wherein the electron transport host comprises a triphenylene group and a triazine group, and the hole transport host comprises a carbazole group, the dopant comprises an organometallic compound, and the organometallic compound does not comprise iridium, the organic light-emitting device satisfies a condition of LUMO(dopant)−LUMO(host-E)≥0.15 eV and LUMO (host-E)−HOMO(host-H)>T1(dopant), wherein LUMO(dopant) indicates a lowest unoccupied molecular orbital (LUMO) energy level (expressed in electron volts) of the dopant in the emission layer, LUMO(host-E) indicates a LUMO energy level (expressed in electron volts) of the electron transport host in the emission layer, HOMO(host-H) indicates a highest occupied molecular orbital (HOMO) energy level (expressed in electron volts) of the hole transport host in the emission layer, and T1(dopant) indicates a triplet energy level (expressed in electron volts) of the dopant in the emission layer, LUMO(dopant), LUMO(host-E), and HOMO(host-H) each indicate a negative value measured by differential pulse voltammetry using ferrocene as a reference material, and T1(dopant) is a value calculated from a peak wavelength of a phosphorescence spectrum of the dopant measured using a luminescence measuring device.

2. The organic light-emitting device of claim 1, wherein the organic light-emitting device satisfies a condition of 0.15 eV≤LUMO(dopant)−LUMO(host-E)≤0.6 electron volts.

3. The organic light-emitting device of claim 1, wherein the organic light-emitting device satisfies a condition of 0 electron volts<[LUMO(host-E)−HOMO(host-H)]−T1(dopant)≤0.5 electron volts.

4. The organic light-emitting device of claim 1, wherein the organic light-emitting device satisfies a condition of LUMO(dopant)<LUMO(host-H), wherein LUMO(host-H) indicates a LUMO energy level (expressed in electron volts) of the hole transport host in the emission layer, which is a negative value measured by differential pulse voltammetry using ferrocene as a reference material.

5. The organic light-emitting device of claim 1, wherein the organic light-emitting device satisfies a condition of LUMO(host-E)<LUMO(host-H), wherein LUMO(host-H) indicates a LUMO energy level (expressed in electron volts) of the hole transport host in the emission layer, which is a negative value measured by differential pulse voltammetry using ferrocene as a reference material.

6. The organic light-emitting device of claim 1, wherein the organic light-emitting device satisfies a condition of LUMO(host-E)<LUMO(dopant)<LUMO(host-H), wherein LUMO(host-H) indicates a LUMO energy level (expressed in electron volts) of the hole transport host in the emission layer, which is a negative value measured by differential pulse voltammetry using ferrocene as a reference material.

7. The organic light-emitting device of claim 1, wherein the organic light-emitting device satisfies a condition of HOMO(host-E)<HOMO(host-H).

8. The organic light-emitting device of claim 1, wherein the dopant is an organometallic compound including platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), palladium (Pd), silver (Ag), or gold (Au).

9. The organic light-emitting device of claim 1, wherein the dopant is an organometallic compound having a square-planar coordination structure.

10. The organic light-emitting device of claim 1, wherein the dopant satisfies a condition of T1(dopant)≤$E_{gap}$(dopant)>T1(dopant)+0.5 electron volts, wherein $E_{gap}$(dopant) is a difference between HOMO (dopant) and LUMO(dopant) of the dopant, and HOMO(dopant) indicates a HOMO energy level of the dopant, which is a negative value measured by differential pulse voltammetry using ferrocene as a reference material.

11. The organic light-emitting device of claim 1, wherein the organic light-emitting device satisfies a condition of −2.8 electron volts ≤LUMO(dopant)≤−2.3 electron volts and −6.0 electron volts ≤HOMO(dopant)≤−4.5 electron volts, wherein HOMO(dopant) indicates a HOMO energy level of the dopant, which is a negative value measured by differential pulse voltammetry using ferrocene as a reference material.

12. The organic light-emitting device of claim 1, wherein the dopant comprises a metal M and an organic ligand, and the metal M and the organic ligand form one, two, or three cyclometalated rings.

13. The organic light-emitting device of claim 1, wherein the dopant comprises a metal M and a tetradentate organic ligand capable of forming three or four cyclometalated rings with the metal M, the metal M is platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), palladium (Pd), silver (Ag), or gold (Au), and the tetradentate organic ligand comprises a benzimidazole group and a pyridine group.

14. The organic light-emitting device of claim 1, wherein the electron transport host further comprises at least one electron transport moiety selected from a cyano group, a π electron-depleted nitrogen-containing cyclic group, and groups represented by the following formulae:

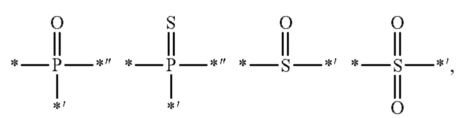

wherein *, *', and *" in the formulae above each indicate a binding site to a neighboring atom.

15. The organic light-emitting device of claim 1, wherein the electron transport host has a lowest anion decomposition energy of 2.5 electron volts or more.

16. The organic light-emitting device of claim 1, further comprising a hole transport region disposed between the first electrode and the emission layer, wherein the hole transport region comprises an amine-containing compound.

17. An organic light-emitting device comprising:

a first electrode, a second electrode facing the first electrode, light-emitting units in a number of m that are stacked between the first electrode and the second electrode, wherein the light-emitting units comprise at least one emission layer, and charge-generation layers in a number of m−1 that are disposed between two neighboring light-emitting units selected from the light-emitting units in the number of m, wherein the charge-generation layers include an n-type charge-generation layer and a p-type charge-generation layer, wherein m is an integer greater than or equal to 2, a maximum emission wavelength of light emitted by at least one of the light-emitting units in the number of m is different from a maximum emission wavelength of light emitted by at least one of the other light-emitting units, the emission layer comprises an electron transport host, a hole transport host, and a dopant, wherein the electron transport host comprises a triphenylene group and a triazine group, and the hole transport host comprises a carbazole group, the dopant comprises an organometallic compound, provided that the organometallic compound does not comprise iridium, and the organic light-emitting device satisfies a condition of LUMO(dopant)−LUMO(host-E)≥0.15 electron volts and LUMO(host-E)−HOMO(host-H)>T1(dopant), wherein LUMO(dopant) indicates a LUMO energy level (expressed in electron volts) of the dopant in the emission layer, LUMO(host-E) indicates a LUMO energy level (expressed in electron volts) of the electron transport host in the emission layer, HOMO(host-H) indicates a HOMO energy level (expressed in electron volts) of the hole transport host in the emission layer, T1(dopant) indicates a triplet energy level (expressed in electron volts) of the dopant in the emission layer, LUMO(dopant), LUMO(host-E), and HOMO(host-H) each indicate a negative value measured by differential pulse voltammetry using ferrocene as a reference material, and T1(dopant) indicates a value calculated from a peak wavelength of a phosphorescence spectrum of the dopant measured using a luminescence measuring device.

18. An organic light-emitting device comprising:

a first electrode, a second electrode facing the first electrode, and light-emitting units in a number of m that are stacked between the first electrode and the second electrode, wherein m is an integer of greater than or equal to 2, a maximum emission wavelength of light emitted by at least one of the light-emitting units in the number of m is different from a maximum emission wavelength of light emitted by at least one of the other light-emitting units, the emission layer includes an electron transport host, a hole transport host, and a dopant, wherein the electron transport host comprises a triphenylene group and a triazine group, and the hole transport host comprises a carbazole group, the dopant includes an organometallic compound, provided that the organometallic compound does not include iridium, and the organic light-emitting device satisfies a condition of LUMO(dopant)−LUMO(host-E)≥0.15 electron volts and LUMO(host-E)−HOMO(host-H)>T1 (dopant), wherein LUMO(dopant) indicates a LUMO energy level (expressed in electron volts) of the dopant in the emission layer, LUMO(host-E) indicates a LUMO energy level (expressed in electron volts) of the electron transport host in the emission layer, HOMO(host-H) indicates a HOMO energy level (expressed in electron volts) of the hole transport host in the emission layer, T1(dopant) indicates a triplet energy level (expressed in electron volts) of the dopant in the emission layer, LUMO(dopant), LUMO(host-E), and HOMO(host-H) each indicate a negative value measured by differential pulse voltammetry using ferrocene as a reference material, and T1(dopant) indicates a value calculated from a peak wavelength of a phosphorescence spectrum of the dopant measured using a luminescence measuring device.

* * * * *